US011802136B2

(12) United States Patent
Chen et al.

(10) Patent No.: US 11,802,136 B2
(45) **Date of Patent: *Oct. 31, 2023**

(54) ORGANIC ELECTROLUMINESCENT MATERIALS AND DEVICES

(71) Applicant: Universal Display Corporation, Ewing, NJ (US)

(72) Inventors: Hsiao-Fan Chen, Lawrence Township, NJ (US); Morgan C. Macinnis, Yardley, PA (US); Nicholas J. Thompson, New Hope, PA (US); Tyler Fleetham, Newtown, PA (US); Jason Brooks, Philadelphia, PA (US); Scott Beers, Flemington, NJ (US); Peter Wolohan, Princeton Junction, NJ (US); Sean Michael Ryno, Yardley, PA (US); Ivan Milas, Summit, NJ (US); Charles J. Stanton, III, Wilmington, DE (US); Olexandr Tretyak, Newark, DE (US); Raghupathi Neelarapu, Newark, DE (US); Katarina Rohlfing, Wilmington, DE (US); Douglas Williams, Mullica Hill, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 744 days.

This patent is subject to a terminal disclaimer.

(21) Appl. No.: 16/718,355

(22) Filed: Dec. 18, 2019

(65) Prior Publication Data

US 2020/0140471 A1 May 7, 2020

Related U.S. Application Data

(63) Continuation-in-part of application No. 16/211,332, filed on Dec. 6, 2018, which is a continuation-in-part of application No. 15/967,732, filed on May 1, 2018.

(Continued)

(51) Int. Cl.

| | |
|---|---|
| ***H10K 50/11*** | (2023.01) |
| ***C07F 15/00*** | (2006.01) |

(Continued)

(52) U.S. Cl.

CPC ....... *C07F 15/0086* (2013.01); *H10K 85/346* (2023.02); *H10K 99/00* (2023.02); *H10K 50/11* (2023.02); *H10K 2101/10* (2023.02)

(58) Field of Classification Search

CPC ...... C09K 11/06; H01L 51/5012; H10K 50/11

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| CN | 106117269 | 11/2016 |
| CN | 108299505 | 7/2018 |

(Continued)

OTHER PUBLICATIONS

Extended European Search Report dated Jun. 19, 2020 for corresponding EP Application No. 20165219.5.

(Continued)

*Primary Examiner* — Sean M DeGuire

(74) *Attorney, Agent, or Firm* — DUANE MORRIS LLP

(57) ABSTRACT

A compound having the following formula

Formula I

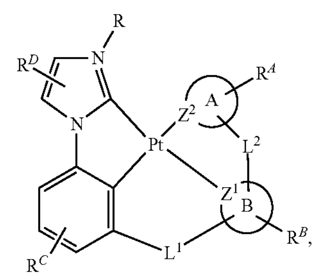

is disclosed. The compound is useful as an emitter in OLED applications.

20 Claims, 2 Drawing Sheets

Related U.S. Application Data

(60) Provisional application No. 62/945,273, filed on Dec. 9, 2019, provisional application No. 62/898,219, filed on Sep. 10, 2019, provisional application No. 62/897,667, filed on Sep. 9, 2019, provisional application No. 62/859,919, filed on Jun. 11, 2019, provisional application No. 62/834,666, filed on Apr. 16, 2019, provisional application No. 62/823,922, filed on Mar. 26, 2019, provisional application No. 62/524,080, filed on Jun. 23, 2017, provisional application No. 62/524,086, filed on Jun. 23, 2017.

(51) Int. Cl.

| | |
|---|---|
| ***H10K 85/30*** | (2023.01) |
| ***H10K 99/00*** | (2023.01) |
| *H10K 101/10* | (2023.01) |

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2012/0302753 | A1 | 11/2012 | Li |
| 2013/0026909 | A1* | 1/2013 | Zeng .................. H01L 51/0094 313/504 |
| 2013/0306940 | A1 | 11/2013 | Zeng |
| 2014/0027733 | A1 | 1/2014 | Zeng |
| 2015/0105556 | A1* | 4/2015 | Li .......................... C09K 11/06 546/4 |
| 2015/0295189 | A1 | 10/2015 | Brooks |
| 2015/0295190 | A1 | 10/2015 | Chen |
| 2016/0072082 | A1 | 3/2016 | Brooks |
| 2017/0183368 | A1 | 6/2017 | Hara |
| 2018/0090691 | A1 | 3/2018 | Brooks |
| 2018/0219161 | A1 | 8/2018 | Li |
| 2018/0305384 | A1 | 10/2018 | Chen |
| 2018/0370978 | A1 | 12/2018 | Wolohan |
| 2018/0375036 | A1 | 12/2018 | Chen |
| 2020/0168811 | A1 | 5/2020 | Wolohan |

FOREIGN PATENT DOCUMENTS

| | | |
|---|---|---|
| EP | 0650955 | 5/1995 |
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| JP | 2012-144455 | 8/2012 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072092 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |

(56) References Cited

FOREIGN PATENT DOCUMENTS

| | | |
|---|---|---|
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2012/162488 | 11/2012 |

OTHER PUBLICATIONS

Marie-Paule Van Den Eede et al: "Controlled Polymerization of a Cyclopentadithiophene-Phenylene Alternating Copolymer", Macromolecules, vol. 51, No. 21, Nov. 13, 2018 (Nov. 13, 2018), pp. 9043-9051, XP55702090, Washington, DC, United States ISSN: 0024-9297, DOI: 10.1021/acs.macromol.8b01820 *Figure 1 [Pd-PEPPSI-(Anisole)C12]*.

Joydev Dinda et al: ")-NHC", New Journal of Chemistry, vol. 37, No. 2, Jan. 1, 2013 (Jan. 1, 2013), pp. 431-438, XP55702144,GB ISSN: 1144-0546, DOI: 10.1039/C2NJ40740J *the whole document*.

Fleetham, T., et al., "Efficient "Pure" Blue OLEDs Employing Tetradentate Pt Complexes with a Narrow Spectral Bandwidth," Adv. Mater., Nov. 2014, pp. 7116-7121, vol. 26, No. 41. DOI: 10.1002/adma.201401759.

Adachi, Chihaya et al., "Organic Electroluminescent Device Having a Hole Conductor as an Emitting Layer," Appl. Phys. Lett, 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota, Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

(56) References Cited

OTHER PUBLICATIONS

Sotoyama, Wataru et al., "Efficient Organic Light-Emitting Diodes with Phosphorescent Platinum Complexes Containing N∧C∧N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e), to U.S. Provisional Application No. 62/945,273, filed on Dec. 9, 2019, to U.S. Provisional Application No. 62/898,219, filed on Sep. 10, 2019, to U.S. Provisional Application No. 62/897,667, filed on Sep. 9, 2019, to U.S. Provisional Application No. 62/859,919, filed on Jun. 11, 2019, to U.S. Provisional Application No. 62/834,666, filed on Apr. 16, 2019, to U.S. Provisional Application No. 62/823,922, filed on Mar. 26, 2019. This application is also a continuation-in-part of the co-pending U.S. patent application Ser. No. 16/211,332, filed on Dec. 6, 2018, which is a continuation-in-part of the co-pending U.S. patent application Ser. No. 15/967,732, filed on May 1, 2018, which claims priority under 35 U.S.C. § 119(e) to U.S. Provisional Applications No. 62/524,080, filed Jun. 23, 2017, and No. 62/524,086, filed Jun. 23, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

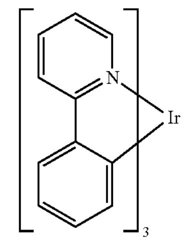

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

Tetradentate platinum complexes comprising an imidazole/benzimidazole carbene are disclosed. These platinum carbenes with the specific substituents disclosed herein are novel and provides phosphorescent emissive compounds that exhibit physical properties that can be tuned, such as sublimation temperature, emission color, and device stability. These compounds are useful in OLED applications.

A compound having the following formula

Formula I

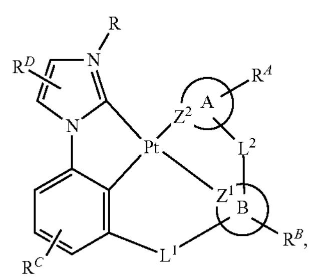

is disclosed. The variables in Formula I are defined in detail below.

An OLED comprising the compound having the Formula I in one of its organic layers is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
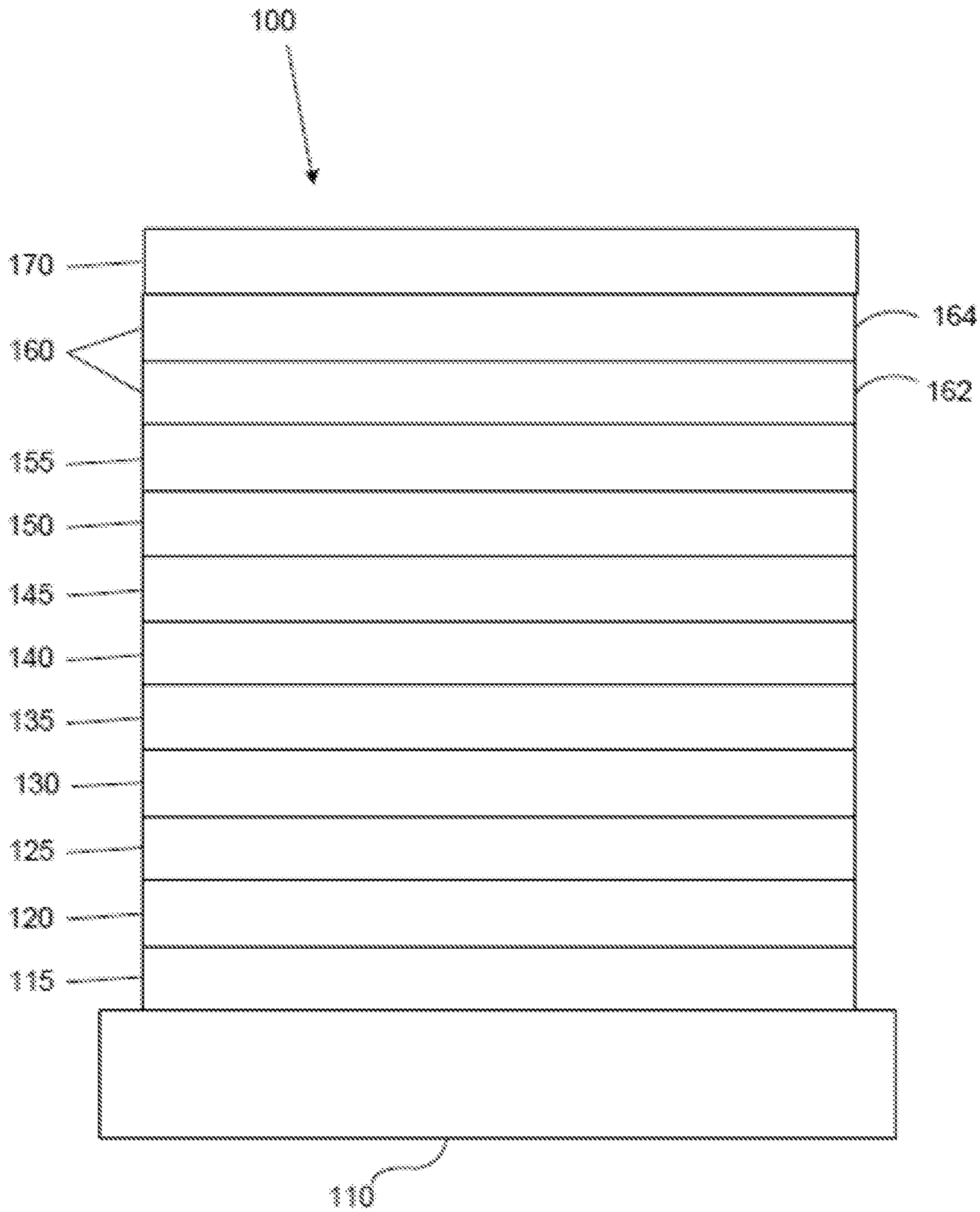
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
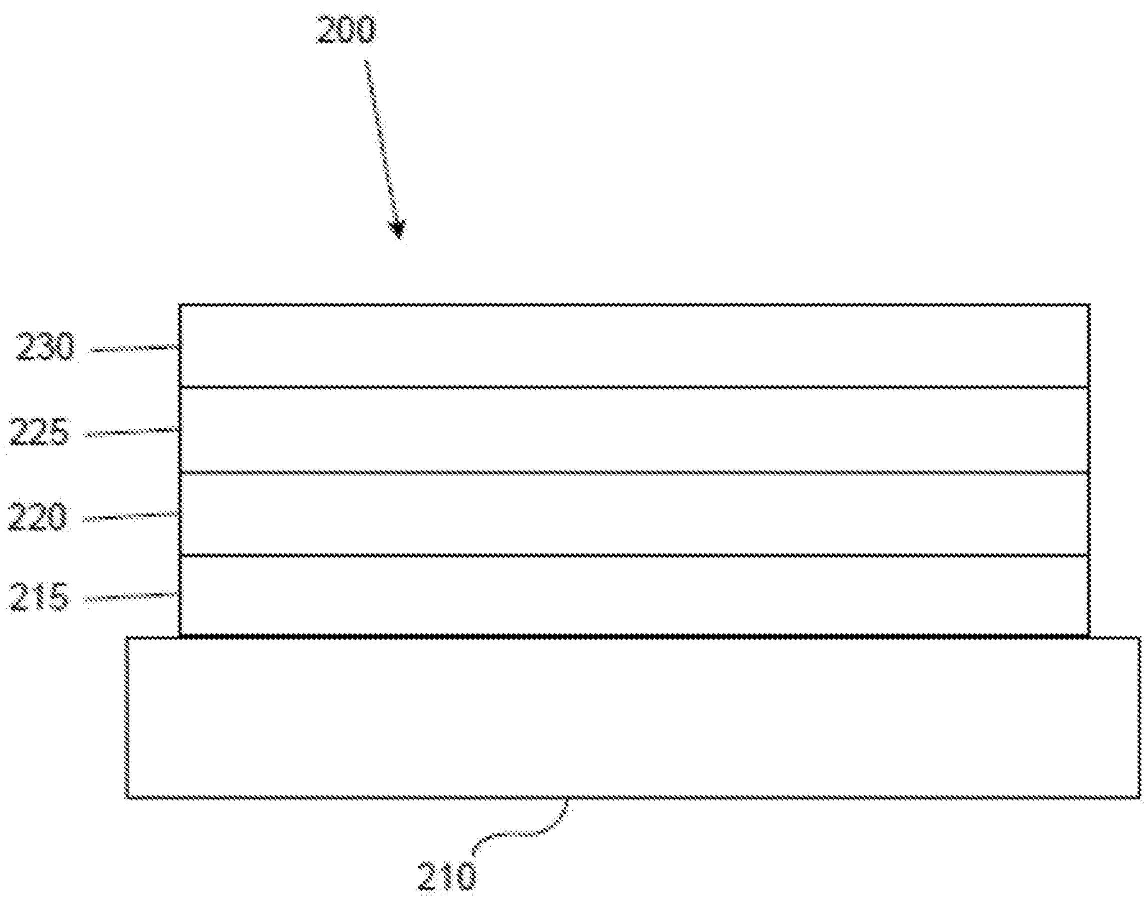
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—R or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

A compound having the following formula

Formula I

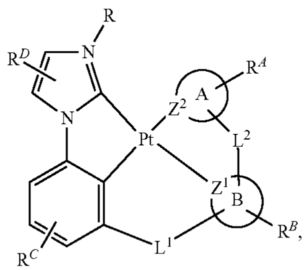

is disclosed. In Formula I, A and B are each independently a 5- or 6-membered aromatic ring; $Z^1$ and $Z^2$ are each independently selected from the group consisting of C and N; $L^1$ and $L^2$ are each independently selected from the group consisting of a direct bond, BR', NR', PR', O, S, Se, C═O, S═O, $SO_2$, CR'R", SiR'R", GeR'R", alkyl, cycloalkyl, and combinations thereof; $R^A$, $R^B$, $R^C$, and $R^D$, each represents mono to a maximum allowable substitutions, or no substitution; each of R', R", $R^A$, $R^B$, $R^C$, and $R^D$ is independently selected from the group consisting of hydrogen, deuterium, halide, alkyl, cycloalkyl, fluorinated alkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; R is selected from the group consisting of deuterium, alkyl, cycloalkyl, heteroalkyl, arylalkyl, silyl, aryl, heteroaryl, and combinations thereof; any substitutions in $R^A$, $R^B$, $R^C$, and $R^D$ may be joined or fused into a ring; $R^A$ or $R^B$ may be fused with $L^2$ to form a ring; wherein at least one of the following conditions (a), (b), and (c) is true:

(a) at least one of $R^A$ and $R^C$ is present and is a 5- or 6-membered aromatic ring attached to a carbon atom;
(b) $R^A$ is present and is an alkyl or cycloalkyl attached to a carbon atom, and each $R^C$ is independently H or aryl; and
(c) both $R^A$ and $R^C$ are present and are an alkyl or cycloalkyl attached to a carbon atom, and R has a molecular weight equal to or greater than 16.0 grams per mole.

In some embodiments of the compound, each of R', R", $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

In some embodiments, $R^A$ is a 6-membered aromatic ring. In some embodiments, $R^C$ is a 6-membered aromatic ring.

In some embodiments, $Z^2$ is N, and A is selected from the group consisting of pyridine, pyrazole, imidazole, and triazole. In some embodiments, $Z^1$ is C, and A is benzene. In some embodiments, $Z^1$ is N, $Z^2$ is C. In some further embodiment, both $Z^1$ and $Z^2$ is C, and one of them is carbene carbon.

In some embodiments of the compound, $R^A$ contains substituents selected from the group consisting of hydrogen, deuterium, alkyl, cycloalkyl, partially or fully fluorinated alkyl or cycloalkyl, and combinations thereof.

In some embodiments of the compound where $R^A$ is a 6-membered aromatic ring, $R^C$ contains substituents selected from the group consisting of hydrogen, deuterium, alkyl, cycloalkyl, partially or fully fluorinated alkyl or cycloalkyl, and combinations thereof.

In some embodiments of the compound, two adjacent $R^D$ substituents are joined to form a fused 6-membered aromatic ring. In some embodiments of the compound, $L^1$ is an oxygen atom. In some embodiments of the compound, $L^2$ is NAr; and Ar is a 6-membered aromatic group.

In some embodiments of the compound, R is a 6-membered aromatic ring. In some embodiments of the compound, R is an alkyl group. In some embodiments of the compound, at least one of $R^A$ and $R^C$ is a tert-butyl group.

In some embodiments of the compound, the compound is selected from the group consisting of:

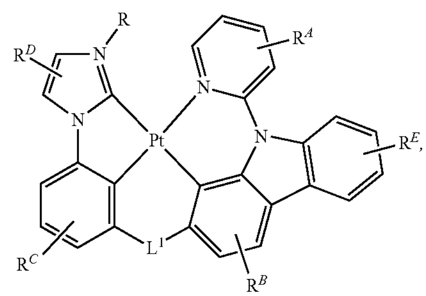

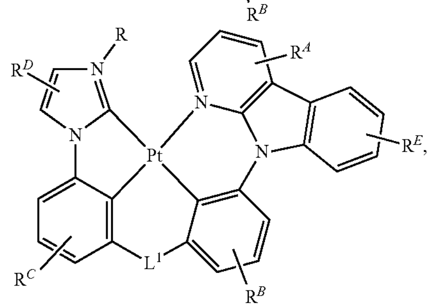

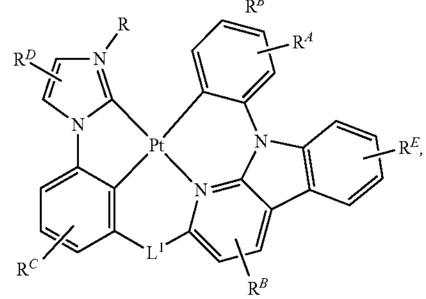

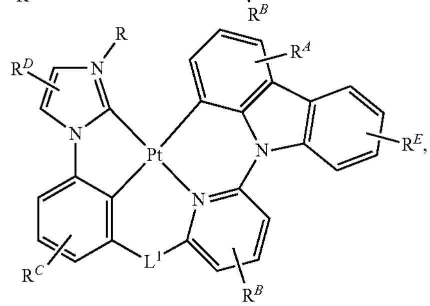

-continued

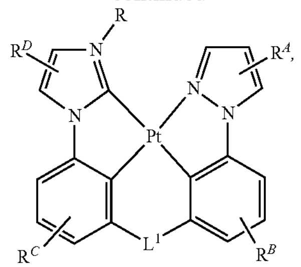

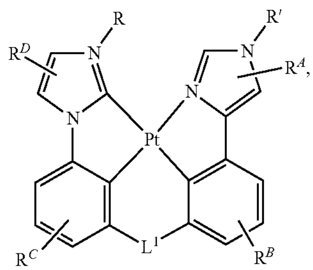

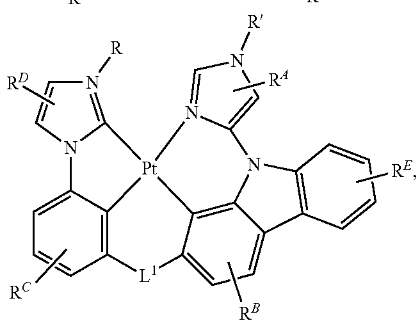

-continued

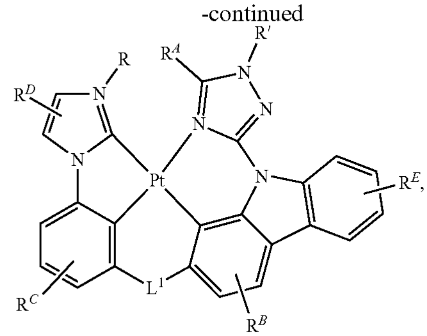

and

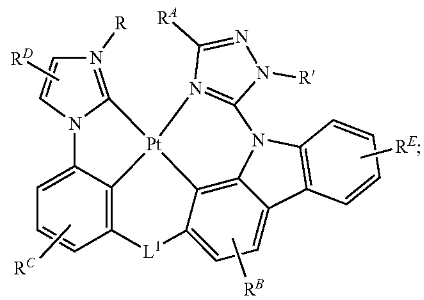

and wherein R' is selected from the group consisting of deuterium, alkyl, cycloalkyl, heteroalkyl, arylalkyl, silyl, aryl, heteroaryl, and combinations thereof.

In some embodiments of the compound, the compound is selected from the group consisting of Compound x having the formula $Pt(L_{Ay})(L_{Bz})$, wherein x is an integer defined by $x=212190(z-1)+y$, wherein y is an integer from 1 to 212190 and z is an integer from 1 to 40673, wherein each $L_{Ay}$ has the structure as defined below:

| $L_{Ay}$ | Structure of $L_{Ay}$ | $Ar^1$, $R^1$ | y |
|---|---|---|---|
| $L_{A1}$ to $L_{A9900}$ have the structure | 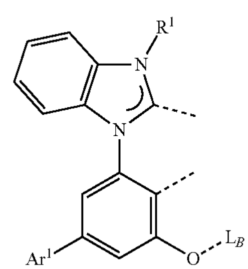 | wherein $Ar^1$ = Ai and $R^1$ = Rk, wherein i is an integer from 1 to 30 and k is an integer from 1 to 330, and | wherein, $y = 330(i - 1) + k$ |
| $L_{A9901}$-$L_{A19800}$ have the structure | 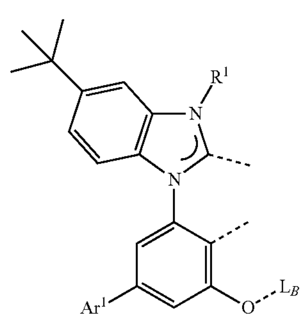 | wherein $Ar^1$ = Ai and $R^1$ = Rk, wherein i is an integer from 1 to 30 and k is an integer from 1 to 330, and | wherein, $y = 330(i - 1) + k + 9900$ |

-continued

| | | | |
|---|---|---|---|
| $L_{A19801}$-$L_{A29700}$ have the structure | 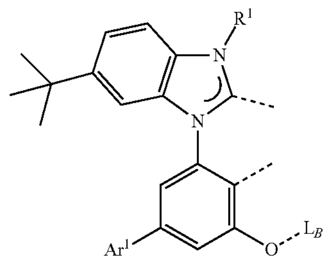 | wherein $Ar^1$ = Ai and $R^1$ = Rk, wherein i is an integer from 1 to 30 and k is an integer from 1 to 330, and | wherein, y = 330(i − 1) + k + 19800 |
| $L_{A29701}$-$L_{A36900}$ have the structure | 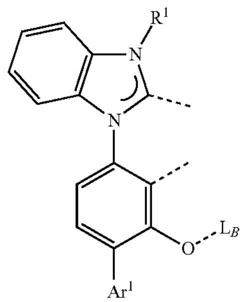 | wherein $Ar^1$ = Ai and $R^1$ = Rk, wherein i is an integer from 1 to 30 and k is an integer from 1 to 330, and | wherein, y = 330(i − 1) + k + 29700 |
| $L_{A39601}$-$L_{A49500}$ have the structure | 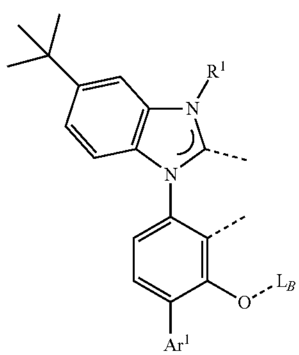 | wherein $Ar^1$ = Ai and $R^1$ = Rk, wherein i is an integer from 1 to 30 and k is an integer from 1 to 330, and | wherein, y = 330(i − 1) + k + 39600 |
| $L_{A49501}$-$L_{A59400}$ have the structure | 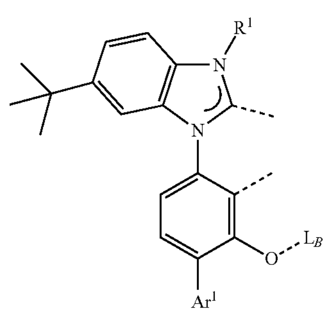 | wherein $Ar^1$ = Ai and $R^1$ = Rk, wherein i is an integer from 1 to 30 and k is an integer from 1 to 330, and | wherein, y = 330(i − 1) + k + 49500 |
| $L_{A59401}$-$L_{A69300}$ have the structure | 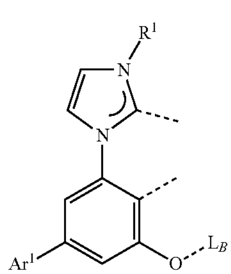 | wherein $Ar^1$ = Ai and $R^1$ = Rk, wherein i is an integer from 1 to 30 and k is an integer from 1 to 330, and | wherein, y = 330(i − 1) + k + 59400 |

-continued

| | | | |
|---|---|---|---|
| $L_{A69301}$-$L_{A79200}$ have the structure | 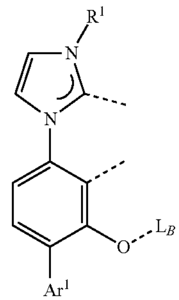 | wherein $Ar^1$ = Ai and $R^1$ = Rk, wherein i is an integer from 1 to 30 and k is an integer from 1 to 330, and | wherein, y = 330(i − 1) + k + 69300 |
| $L_{A79201}$ to $L_{A79530}$ have the structure | 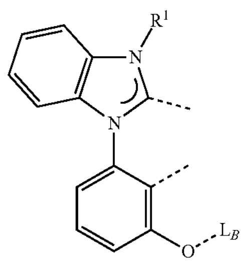 | wherein $R^1$ = Rk, wherein k is an integer from 1 to 330, and | wherein, y = k + 79200 |
| $L_{A79531}$-$L_{A79860}$ have the structure | 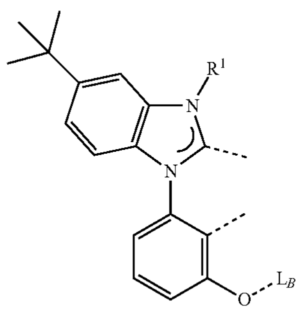 | wherein $R^1$ = Rk, wherein k is an integer from 1 to 330, and | wherein, y = k + 79530 |
| $L_{A79861}$-$L_{A80190}$ have the structure | 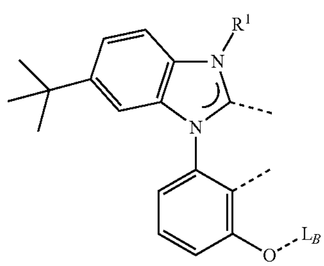 | wherein $R^1$ = Rk, wherein k is an integer from 1 to 330, and | wherein, y = k + 79860 |
| $L_{A80191}$-$L_{A80520}$ have the structure | 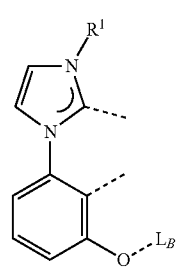 | wherein $R^1$ = Rk, wherein k is an integer from 1 to 330, and | wherein, y = k + 80190 |

-continued

| | | | |
|---|---|---|---|
| $L_{A80521}$ to $L_{A90420}$ have the structure | 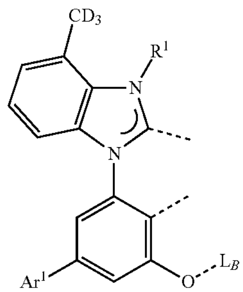 | wherein $Ar^1$ = Ai and $R^1$ = Rk, wherein i is an integer from 1 to 30 and k is an integer from 1 to 330, and | wherein, y = 330(i − 1) + k + 80520 |
| $L_{A90421}$ to $L_{A100320}$ have the structure | 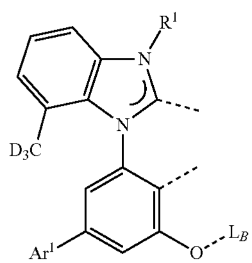 | wherein $Ar^1$ = Ai and $R^1$ = Rk, wherein i is an integer from 1 to 30 and k is an integer from 1 to 330, and | wherein, y = 330(i − 1) + k + 90420 |
| $L_{A100321}$ to $L_{A110220}$ have the structure | 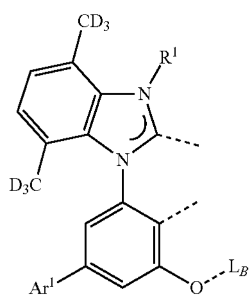 | wherein $Ar^1$ = Ai and $R^1$ = Rk, wherein i is an integer from 1 to 30 and k is an integer from 1 to 330, and | wherein, y = 330(i − 1) + k + 100320 |
| $L_{A110221}$ to $L_{A120120}$ have the structure | 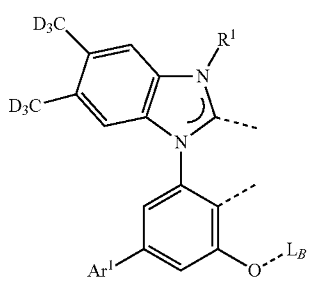 | wherein $Ar^1$ = Ai and $R^1$ = Rk, wherein i is an integer from 1 to 30 and k is an integer from 1 to 330, and | wherein, y = 330(i − 1) + k + 110220 |
| $L_{A120121}$ to $L_{A130020}$ have the structure | 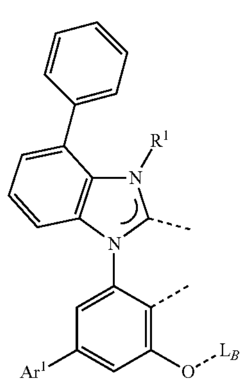 | wherein $Ar^1$ = Ai and $R^1$ = Rk, wherein i is an integer from 1 to 30 and k is an integer from 1 to 330, and | wherein, y = 330(i − 1) + k + 120120 |

-continued

| | | | |
|---|---|---|---|
| $L_{A130021}$ to $L_{A139920}$ have the structure | 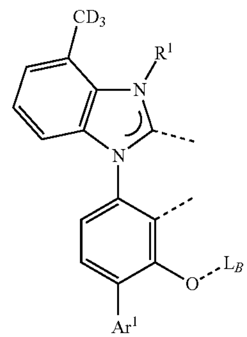 | wherein $Ar^1$ = Ai and $R^1$ = Rk, wherein i is an integer from 1 to 30 and k is an integer from 1 to 330, and | wherein, y = 330(i − 1) + k + 130020 |
| $L_{A139921}$ to $L_{A149820}$ have the structure | 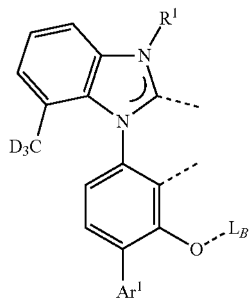 | wherein $Ar^1$ = Ai and $R^1$ = Rk, wherein i is an integer from 1 to 30 and k is an integer from 1 to 330, and | wherein, y = 330(i − 1) + k + 139920 |
| $L_{A149821}$ to $L_{A159720}$ have the structure | 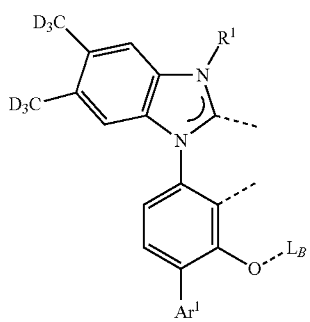 | wherein $Ar^1$ = Ai and $R^1$ = Rk, wherein i is an integer from 1 to 30 and k is an integer from 1 to 330, and | wherein, y = 330(i − 1) + k + 149820 |
| $L_{A159721}$ to $L_{A169620}$ have the structure | 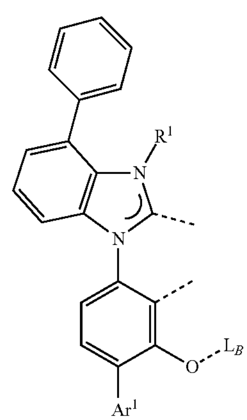 | wherein $Ar^1$ = Ai and $R^1$ = Rk, wherein i is an integer from 1 to 30 and k is an integer from 1 to 330, and | wherein, y = 330(i − 1) + k + 159720 |

-continued

| | | | |
|---|---|---|---|
| $L_{A169621}$ to $L_{A169950}$ have the structure | 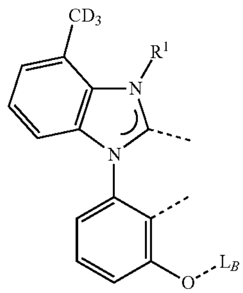 | wherein $R^1 = Rk$, wherein k is an integer from 1 to 330, and | wherein, y = k + 169620 |
| $L_{A169551}$ to $L_{A170280}$ have the structure | 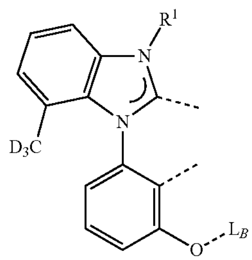 | wherein $R^1 = Rk$, wherein k is an integer from 1 to 330, and | wherein, y = k + 169950 |
| $L_{A170281}$ to $L_{A170610}$ have the structure | 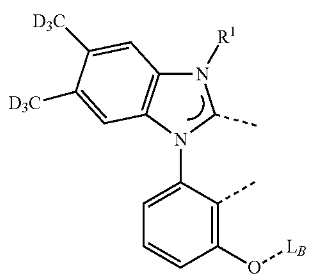 | wherein $R^1 = Rk$, wherein k is an integer from 1 to 330, and | wherein, y = k + 170280 |
| $L_{A170610}$ to $L_{A170940}$ have the structure | 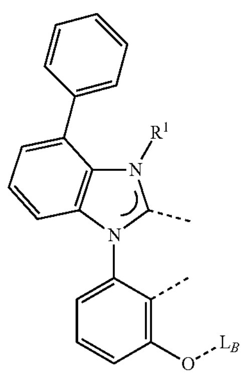 | wherein $R^1 = Rk$, wherein k is an integer from 1 to 330, and | wherein, y = k + 170610 |
| $L_{A170941}$ to $L_{A171270}$ have the structure | 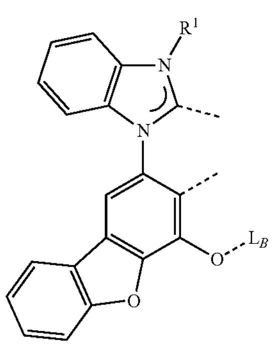 | wherein $R^1 = Rk$, wherein k is an integer from 1 to 330, and | wherein, y = k + 170940 |

-continued

| | | | |
|---|---|---|---|
| $L_{A171271}$ to $L_{A171600}$ have the structure | 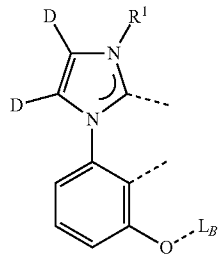 | wherein $R^1$ = Rk, wherein k is an integer from 1 to 330, and | wherein y = k + 171270 |
| $L_{A171601}$ to $L_{A181500}$ have the structure | 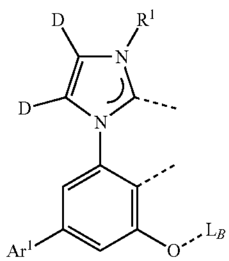 | wherein $Ar^1$ = Ai and $R^1$ = Rk, wherein i is an integer from 1 to 30 and K is an integer from 1 to 330, and | wherein y = 330(i − 1) + k + 171600 |
| $L_{A181501}$ to $L_{A191400}$ have the structure | 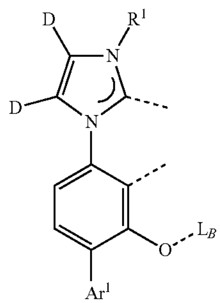 | wherein $Ar^1$ = Ai and $R^1$ = Rk, wherein i is an integer from 1 to 30 and K is an integer from 1 to 330, and | wherein y = 330(i − 1) + k + 181500 |
| $L_{A191401}$ to $L_{A191730}$ have the structure | 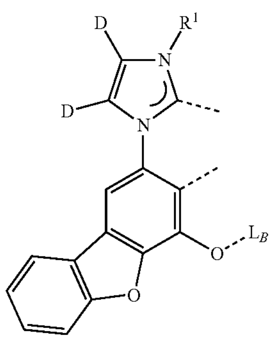 | wherein $R^1$ = Rk, wherein k is an integer from 1 to 330, and | wherein, y = k + 191400 |
| $L_{A19173}$ to $L_{A192060}$ have the structure | 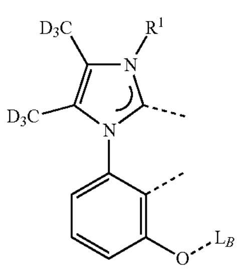 | wherein $R^1$ = Rk, wherein k is an integer from 1 to 330, and | wherein, y = k + 191730 |

-continued

| | | | |
|---|---|---|---|
| $L_{A192061}$ to $L_{A201960}$ have the structure | 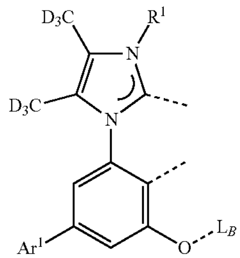 | wherein $Ar^1$ = Ai and $R^1$ = Rk wherein i is an integer from 1 to 30 and k is an integer from 1 to 330, and | wherein, y = 330(i − 1) + k + 192060 |
| $L_{A201961}$ to $L_{A211860}$ have the structure | 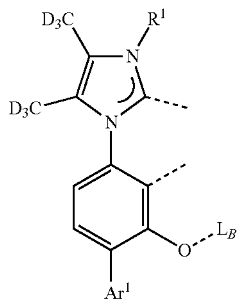 | wherein $Ar^1$ = Ai and $R^1$ = Rk wherein i is an integer from 1 to 30 and k is an integer from 1 to 330, and | wherein, y = 330(i − 1) + k + 201960 |
| $L_{A211861}$ to $L_{A212190}$ have the structure | 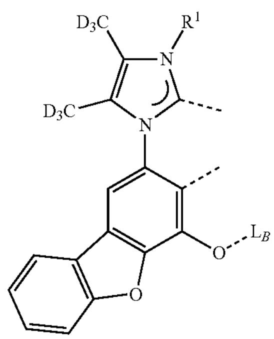 | wherein $R^1$ = Rk, wherein k is an integer from 1 to 330, and | wherein, y = k + 211860 |

| $L_{Bz}$ | $L_{Bz}$ structure | $Ar^2$, $Ar^3$, $R^2$ | z |
|---|---|---|---|
| wherein $L_{B1}$-$L_{B30}$ have the structure | 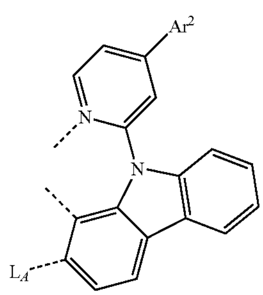 | wherein $Ar^2$ = Aj, wherein j is an integer from 1 to 30, and | z = j |
| wherein $L_{B31}$ have the structure | 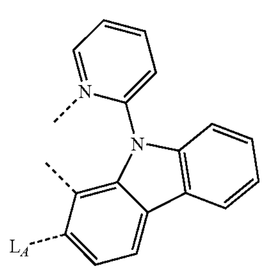 | | z = 31 |

-continued

| | | | |
|---|---|---|---|
| wherein $L_{B32}$-$L_{B931}$ have the structure | 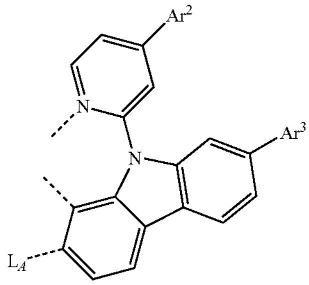 | wherein $Ar^2$ = Aj and $Ar^3$ = Am, wherein j is an integer from 1 to 30 and m is an integer from 1 to 30, and | z = 30(j − 1) + m + 31 |
| wherein $L_{B932}$-$L_{B961}$ have the structure | 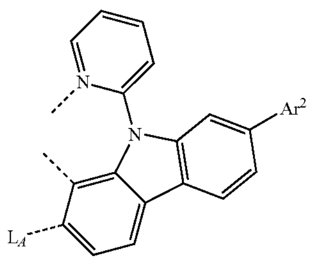 | wherein $Ar^2$ = Aj, wherein j is an integer from 1 to 30, and | z = j + 931 |
| wherein $L_{B962}$-$L_{B1861}$ have the structure | 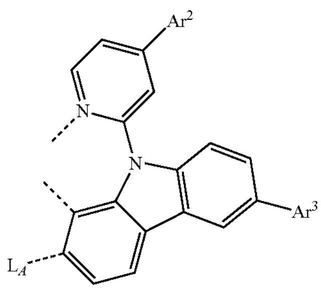 | wherein $Ar^2$ = Aj and $Ar^3$ = Am, wherein j is an integer from 1 to 30 and m is an integer from 1 to 30, and | z = 30(j − 1) + m + 961 |
| wherein $L_{B1862}$-$L_{B1891}$ have the structure | 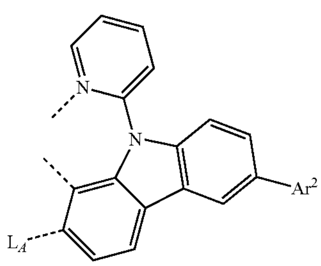 | wherein $Ar^2$ = Aj, wherein j is an integer from 1 to 30, and | z = j + 1861 |
| wherein $L_{B1892}$-$L_{B1921}$ have the structure | 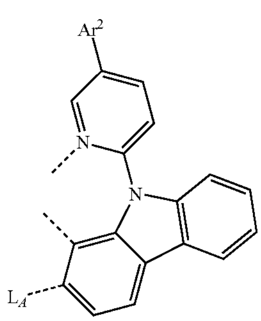 | wherein $Ar^2$ = Aj, wherein j is an integer from 1 to 30, and | z = j + 1891 |

-continued

| | | | |
|---|---|---|---|
| wherein $L_{B1922}$-$L_{B2821}$ have the structure | 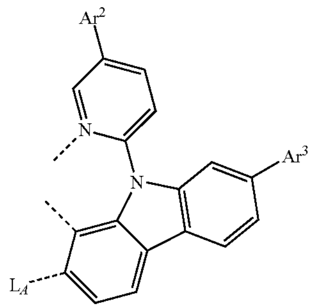 | wherein $Ar^2$ = Aj and $Ar^3$ = Am, wherein j is an integer from 1 to 30 and m is an integer from 1 to 30, and | z = 30(j − 1) + m + 1921 |
| wherein $L_{B2822}$-$L_{B3721}$ have the structure | 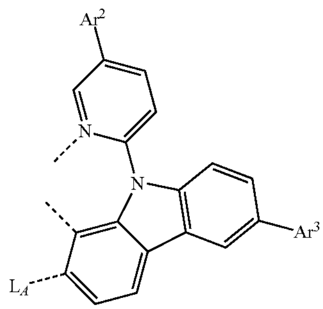 | wherein $Ar^2$ = Aj and $Ar^3$ = Am, wherein j is an integer from 1 to 30 and m is an integer from 1 to 30, and | z = 30(j − 1) + m + 2821 |
| wherein $L_{B3722}$-$L_{B4621}$ have the structure | 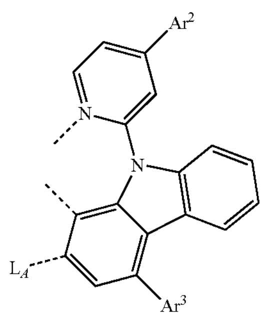 | wherein $Ar^2$ = Aj and $Ar^3$ = Am, wherein j is an integer from 1 to 30 and m is an integer from 1 to 30, and | z = 30(j − 1) + m + 3721 |
| wherein $L_{B4622}$-$L_{B4651}$ have the structure | 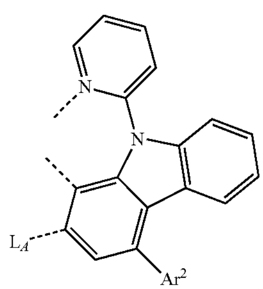 | wherein $Ar^2$ = Aj, wherein j is an integer from 1 to 30, and | z = j + 4621 |
| wherein $L_{B4652}$-$L_{B5551}$ have the structure | 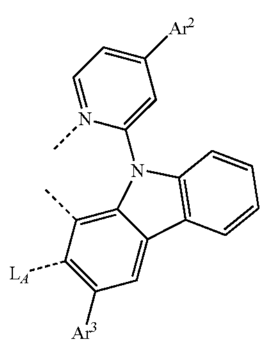 | wherein $Ar^2$ = Aj and $Ar^3$ = Am, wherein j is an integer from 1 to 30 and m is an integer from 1 to 30, and | z = 30(j − 1) + m + 4651 |

-continued

| | | | |
|---|---|---|---|
| wherein $L_{B5552}$-$L_{B5581}$ have the structure | 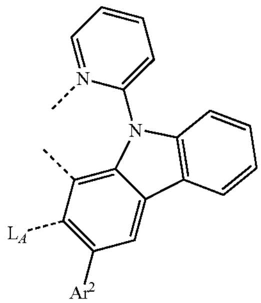 | wherein $Ar^2$ = Aj, wherein j is an integer from 1 to 30, and | z = j + 5551 |
| wherein $L_{B5582}$-$L_{B6481}$ have the structure | 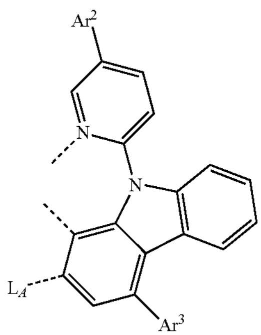 | wherein $Ar^2$ = Aj and $Ar^3$ = Am, wherein j is an integer from 1 to 30 and m is an integer from 1 to 30, and | z = 30(j − 1) + m + 5581 |
| wherein $L_{B6482}$-$L_{B7381}$ have the structure | 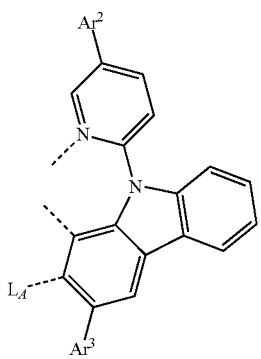 | wherein $Ar^2$ = Aj and $Ar^3$ = Am, wherein j is an integer from 1 to 30 and m is an integer from 1 to 30, and | z = 30(j − 1) + m + 6481 |
| wherein $L_{B7382}$ have the structure | 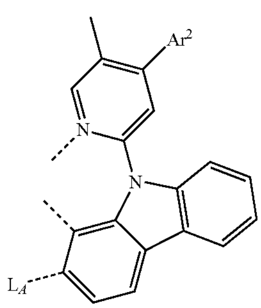 | | z = 7382 |
| wherein $L_{B7383}$-$L_{B7412}$ have the structure | 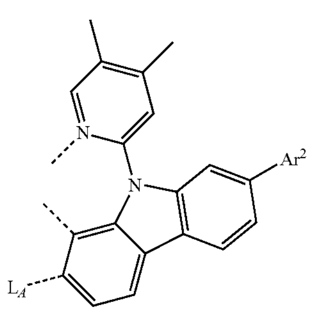 | wherein $Ar^2$ = Aj, wherein j is an integer from 1 to 30, and | z = j + 7382 |

-continued

| | | | |
|---|---|---|---|
| wherein $L_{B7413}$-$L_{B7442}$ have the structure | 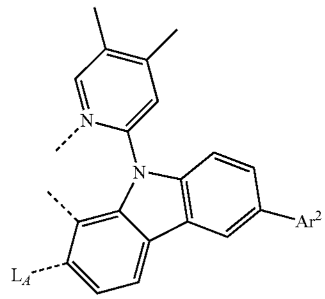 | wherein $Ar^2 = Aj$, wherein j is an integer from 1 to 30, and | z = j + 7412 |
| wherein $L_{B7443}$-$L_{B7472}$ have the structure | 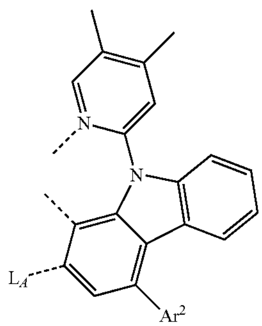 | wherein $Ar^2 = Aj$, wherein j is an integer from 1 to 30, and | z = j + 7442 |
| wherein $L_{B7473}$-$L_{B7502}$ have the structure | 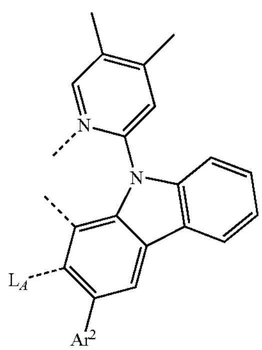 | wherein $Ar^2 = Aj$, wherein j is an integer from 1 to 30, and | z = j + 7472 |
| wherein $L_{B7503}$ have the structure | 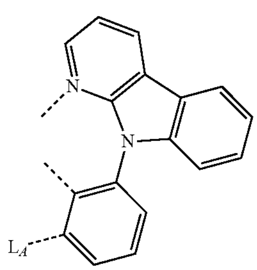 | | z = 7503 |
| wherein $L_{B7504}$-$L_{B7533}$ have the structure | 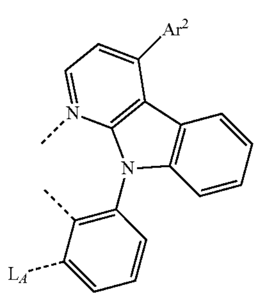 | wherein $Ar^2 = Aj$, wherein j is an integer from 1 to 30, and | z = j + 7503 |

-continued

| | | | |
|---|---|---|---|
| wherein $L_{B7534}$-$L_{B8433}$ have the structure | 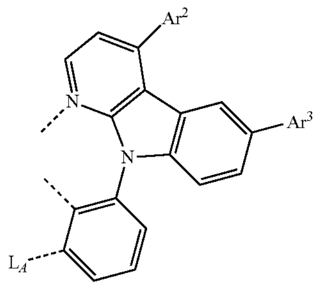 | wherein $Ar^2$ = Aj and $Ar^3$ = Am, wherein j is an integer from 1 to 30 and m is an integer from 1 to 30, and | z = 30(j − 1) + m + 7533 |
| wherein $L_{B8434}$-$L_{B8463}$ have the structure | 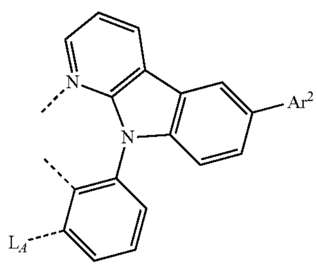 | wherein $Ar^2$ = Aj, wherein j is an integer from 1 to 30, and | z = j + 8433 |
| wherein $L_{B8464}$-$L_{B9363}$ have the structure | 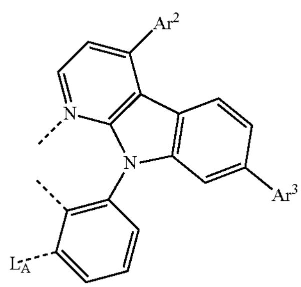 | wherin $Ar^2$ = Aj and $Ar^3$ = Am, wherein j is an integer from 1 to 30 and m is an integer from 1 to 30, and | z = 30(j − 1) + m + 8463 |
| wherein $L_{B9364}$-$L_{B9393}$ have the structure | 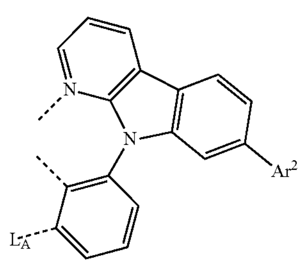 | wherein $Ar^2$ = Aj, wherein j is an integer from 1 to 30, and | z = j + 9363 |
| wherein $L_{B9394}$-$L_{B9423}$ have the structure | 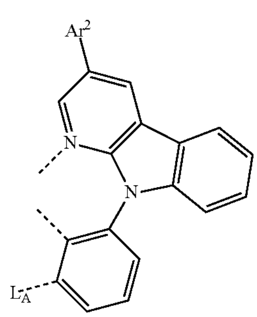 | wherein $Ar^2$ = Aj, wherein j is an integer from 1 to 30, and | z = j + 9393 |

-continued

| | | | |
|---|---|---|---|
| wherein $L_{B9424}$-$L_{B10323}$ have the structure | 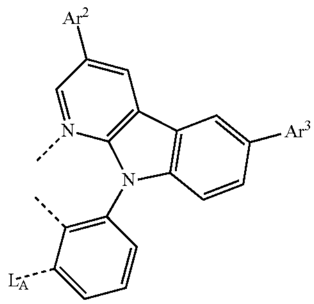 | wherein $Ar^2$ = Aj and $Ar^3$ = Am, wherein j is an integer from 1 to 30 and m is an integer from 1 to 30, and | z = 30(j − 1) + m + 9423 |
| wherein $L_{B10324}$-$L_{B11223}$ have the structure | 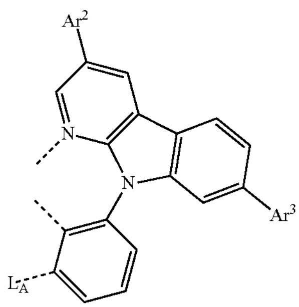 | wherein $Ar^2$ = Aj and $Ar^3$ = Am, wherein j is an integer from 1 to 30 and m is an integer from 1 to 30, and | z = 30(j − 1) + m + 10323 |
| wherein $L_{B11224}$-$L_{B11253}$ have the structure | 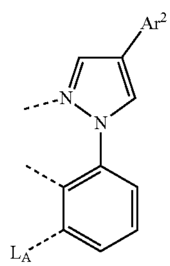 | wherein $Ar^2$ = Aj, wherein j is an integer from 1 to 30. and | z = j + 11223 |
| wherein $L_{B11254}$ have the structure | 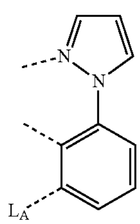 | | z = 11254 |
| wherein $L_{B11255}$-$L_{B11284}$ have the structure | 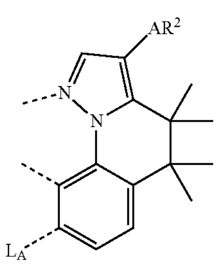 | wherein $Ar^2$ = Aj, wherein j is an integer from 1 to 30, and | z = j + 11254 |
| wherein $L_{B11285}$ have the structure | 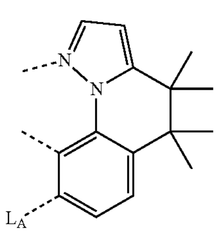 | | z = 11285 |

-continued

| | | | |
|---|---|---|---|
| wherein $L_{B11286}$-$L_{B12185}$ have the structure | 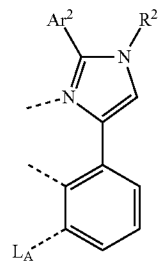 | wherein $Ar^2$ = Aj and $R^2$ = Rl, wherein j is an integer from 1 to 30 and l is an integer from 1 to 30, and | z = 30(j − 1) + l + 11285 |
| wherein $L_{B12186}$-$L_{B12215}$ have the structure | 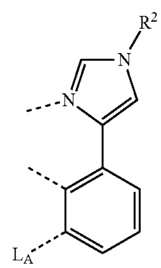 | wherein $R^2$ = Rl, wherein l is an integer from 1 to 30, and | z = l + 12185 |
| wherein $L_{B12216}$-$L_{B13115}$ have the structure | 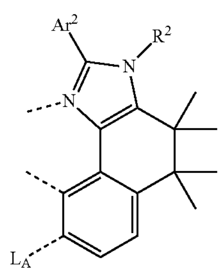 | wherein $Ar^2$ = Aj and $R^2$ = Rl, wherein j is an integer from 1 to 30 and l is an integer from 1 to 30, and | z = 30(j − 1) + l + 12215 |
| wherein $L_{B13116}$-$L_{B13145}$ have the structure | 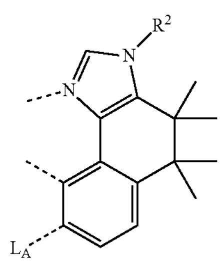 | wherein $R^2$ = Rl, wherein l is an integer from 1 to 30, and | z = l + 13115 |
| wherein $L_{B13146}$-$L_{B14045}$ have the structure | 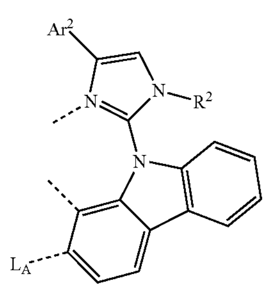 | wherein $Ar^2$ = Aj and $R^2$ = Rl, wherein j is an integer from 1 to 30 and l is an integer from 1 to 30, and | z = 30(j − 1) + l + 13145 |
| wherein $L_{B14046}$-$L_{B14075}$ have the structure | 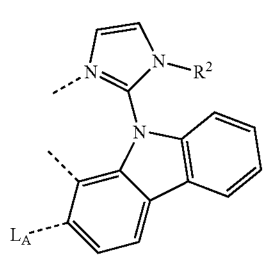 | wherein $R^2$ = Rl, wherein l is an integer from 1 to 30, and | z = l + 14045 |

-continued

| | | | |
|---|---|---|---|
| wherein $L_{B14076}$-$L_{B14975}$ have the structure | 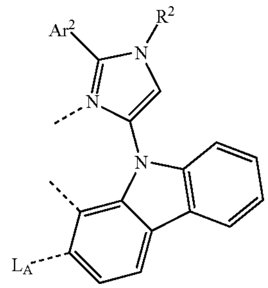 | wherein $Ar^2$ = Aj and $R^2$ = Rl, wherein j is an integer from 1 to 30 and l is an integer from 1 to 30, and | z = 30(j − 1) + l + 14075 |
| wherein $L_{B14976}$-$L_{B15005}$ have the structure | 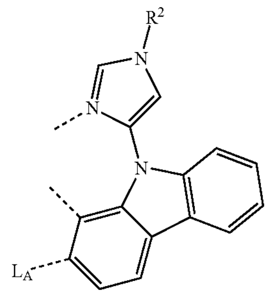 | wherein $R^2$ = Rl, wherein l is an integer from 1 to 30, and | z = l + 14975 |
| wherein $L_{B15006}$-$L_{B15905}$ have the structure | 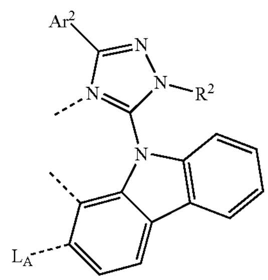 | wherein $Ar^2$ = Aj and $R^2$ = Rl, where j is an integer from 1 to 30 and l is an integer from 1 to 30, and | z = 30(j − 1) + l + 15005 |
| wherein $L_{B15906}$-$L_{B15935}$ have the structure | 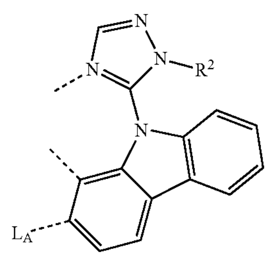 | wherein $R^2$ = Rl, wherein l is an integer from 1 to 30, and | z = l + 15905 |
| wherein $L_{B15936}$-$L_{B16835}$ have the structure | 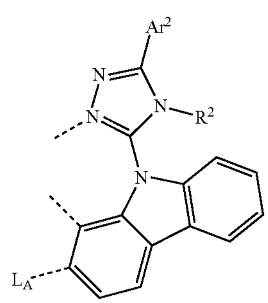 | wherein $Ar^2$ = Aj and $R^2$ = Rl, wherein j is an integer from 1 to 30 and l is an integer from 1 to 30, and | z = 30(j − 1) + l + 15935 |

-continued

| | | | |
|---|---|---|---|
| wherein $L_{B16836}$-$L_{B16865}$ have the structure | 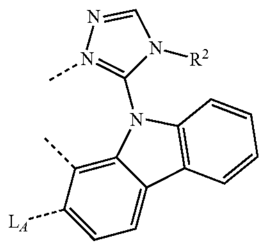 | wherein $R^2$ = Rl, wherein l is an integer from 1 to 30, and | z = l + 16835 |
| wherein $L_{B16866}$-$L_{B17765}$ have the structure | 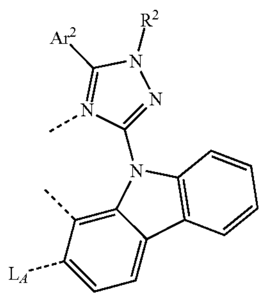 | wherein $Ar^2$ = Aj and $R^2$ = Rl, wherein j is an integer from 1 to 30 and l is an integer from 1 to 30, and | z = 30(j − 1) + l + 16865 |
| wherein $L_{B17766}$-$L_{B17795}$ have the structure | 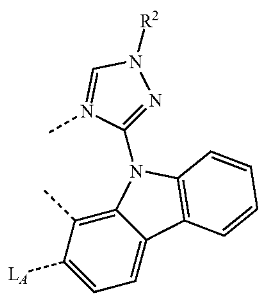 | wherein $R^2$ = Rl, wherein l is an integer from 1 to 30, and | z = l + 17765 |
| wherein $L_{B17796}$-$L_{B17825}$ have the structure | 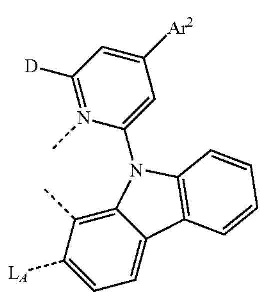 | wherein $Ar^2$ = Aj, wherein j is an integer from 1 to 30, and | z = j + 17795 |
| wherein $L_{B17826}$ have the structure | 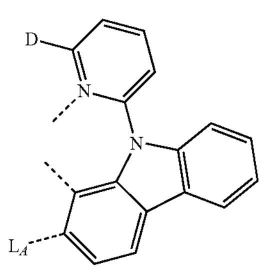 | | z = 17826 |

-continued

| | | | |
|---|---|---|---|
| wherein $L_{B17827}$-$L_{B18726}$ have the structure | 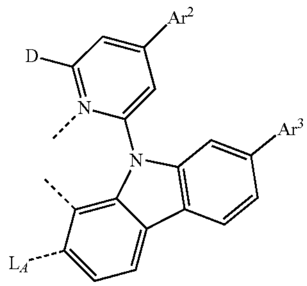 | wherein $Ar^2$ = Aj and $Ar^3$ = Am, wherein j is an integer from 1 to 30 and m is an integer from 1 to 30, and | z = 30(j − 1) + m + 17826 |
| wherein $L_{B18727}$-$L_{B18756}$ have the structure | 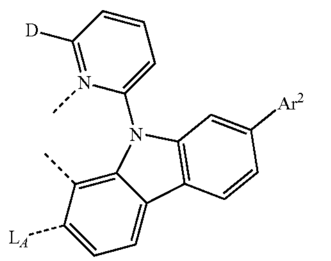 | wherein $Ar^2$ = Aj, wherein j is an integer from 1 to 30, and | z = 18726 |
| wherein $L_{B18757}$-$L_{B19656}$ have the structure | 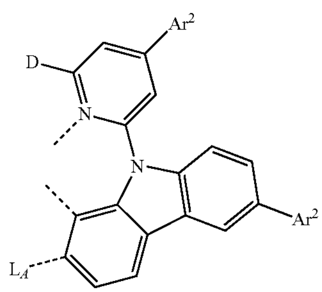 | wherein $Ar^2$ = Aj and $Ar^3$ = Am, wherein j is an integer from 1 to 30 and m is an integer from 1 to 30, and | z = (j − 1) + m + 18756 |
| wherein $L_{B19657}$-$L_{B19686}$ have the structure | 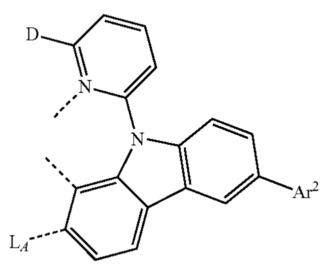 | wherein $Ar^2$ = Aj, wherein j is an integer from 1 to 30, and | z = j + 19656 |
| wherein $L_{B19687}$-$L_{B19716}$ have the structure | 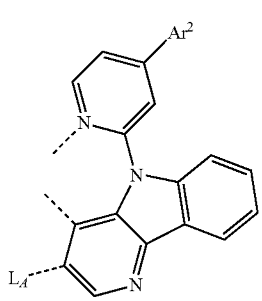 | wherein $Ar^2$ = Aj, wherein j is an integer from 1 to 30, and | z = j + 19686 |

-continued

| | | | |
|---|---|---|---|
| wherein $L_{B19717}$ have the structure | 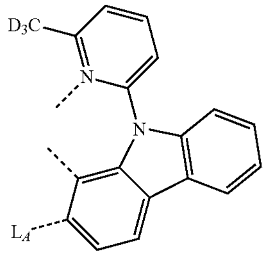 | | z = 19717 |
| wherein $L_{B19718}$-$L_{B20617}$ have the structure | 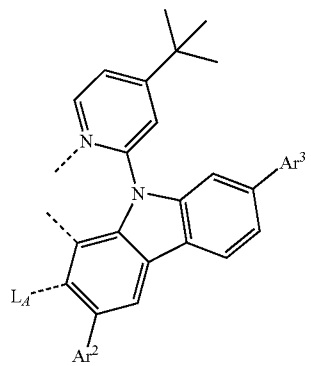 | wherein $Ar^2$ = Aj and $Ar^3$ = Am, wherein j is an integer from 1 to 30 and m is an integer from 1 to 30, and | z = 30(j − 1) + m + 19717 |
| wherein $L_{B20618}$-$L_{B20647}$ have the structure | 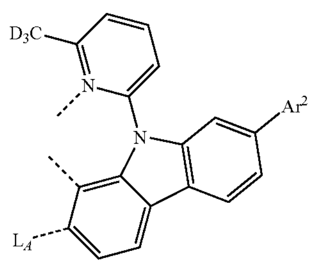 | wherein $Ar^2$ = Aj, wherein j is an integer from 1 to 30, and | z = j + 20617 |
| wherein $L_{B20648}$-$L_{B21547}$ have the structure | 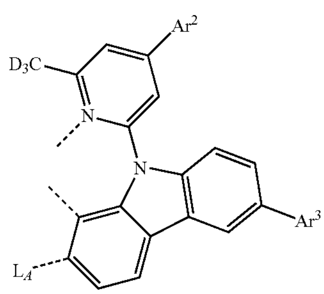 | wherein $Ar^2$ = Aj and $Ar^3$ = Am, wherein j is an integer from 1 to 30 and m is an integer from 1 to 30, and | z = 30(j − 1) + m + 20647 |
| wherein $L_{B21548}$-$L_{B21577}$ have the structure | 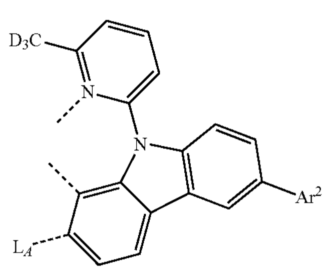 | wherein $Ar^2$ = Aj, wherein j is an integer from 1 to 30, and | z = j + 21547 |

-continued

| | | | |
|---|---|---|---|
| wherein $L_{B21578}$-$L_{B22477}$ have the structure | 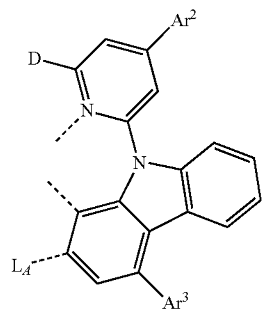 | wherin $Ar^2$ = Aj and $Ar^3$ = Am, wherein j is an integer from 1 to 30 and m is an integer from 1 to 30, and | z = 30(j − 1) + m + 21577 |
| wherein $L_{B22478}$-$L_{B22507}$ have the structure | 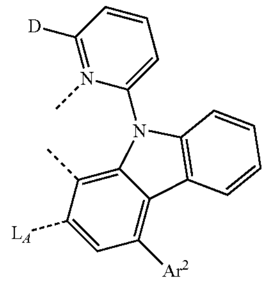 | wherein $Ar^2$ = Aj, wherein j is an integer from 1 to 30, and | z = j + 22477 |
| wherein $L_{B22508}$-$L_{B23407}$ have the structure | 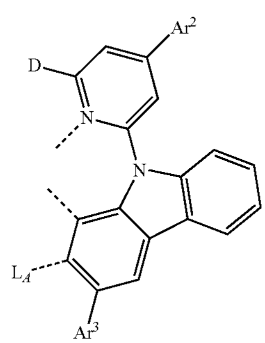 | wherein $Ar^2$ = Aj and $Ar^3$ = Am, wherein j is an integer from 1 to 30 and m is an integer from 1 to 30, and | z = 30(j − 1) + m + 22507 |
| wherein $L_{B23408}$-$L_{B23437}$ have the structure | 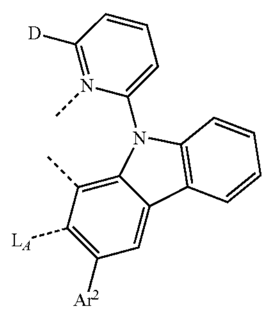 | wherein $Ar^2$ = Aj, wherein j is an integer from 1 to 30, and | z = j + 23407 |
| wherein $L_{B23438}$-$L_{B24337}$ have the structure | 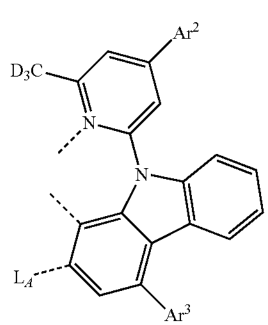 | wherein $Ar^2$ = Aj and $Ar^3$ = Am, wherein j is an integer from 1 to 30 and m is an integer from 1 to 30, and | z = 30(j − 1) + m + 23437 |

-continued

| | | | |
|---|---|---|---|
| wherein $L_{B24338}$-$L_{B24367}$ have the structure | 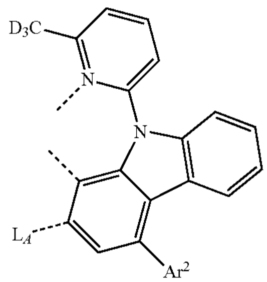 | wherein $Ar^2$ = Aj, wherein j is an integer from 1 to 30, and | z = j + 24337 |
| wherein $L_{B24368}$-$L_{B25267}$ have the structure | 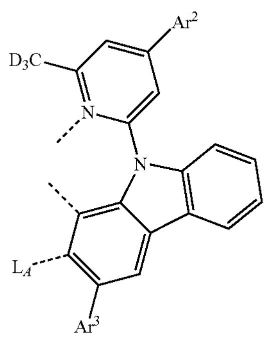 | wherein $Ar^2$ = Aj and $Ar^3$ = Am, wherein j is an integer from 1 to 30 and m is an integer from 1 to 30, and | z = 30(j − 1) + m + 24367 |
| wherein $L_{B25268}$-$L_{B25297}$ have the structure | 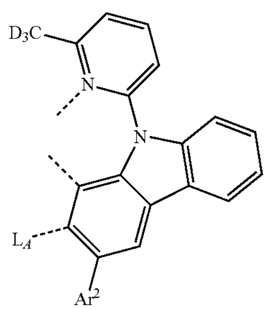 | wherein $Ar^2$ = Aj, wherein j is an integer from 1 to 30, and | z = j + 25267 |
| wherein $L_{B25298}$-$L_{B25327}$ have the structure | 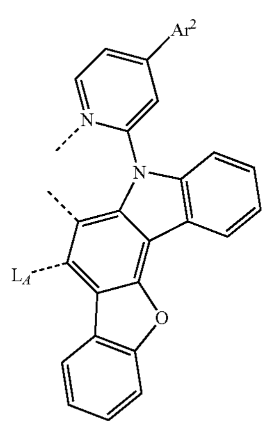 | wherein $Ar^2$ = Aj, wherein j is an integer from 1 to 30, and | z = j + 25297 |

-continued

| | | | |
|---|---|---|---|
| wherein $L_{B25328}$-$L_{B25357}$ have the structure | 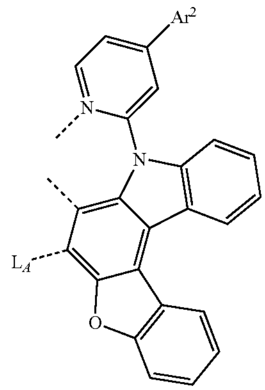 | wherein $Ar^2$ = Aj, wherein j is an integer from 1 to 30, and | z = j + 25327 |
| wherein $L_{B25358}$-$L_{B25387}$ have the structure | 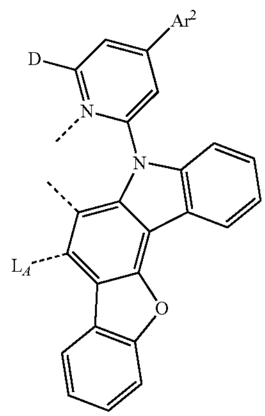 | wherein $Ar^2$ = Aj, wherein j is an integer from 1 to 30, and | z = j + 25357 |
| wherein $L_{B25388}$-$L_{B25417}$ have the structure | 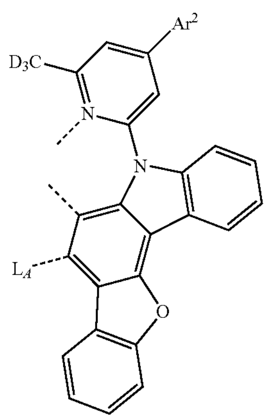 | wherein $Ar^2$ = Aj, wherein j is an integer from 1 to 30, and | z = j + 25387 |
| wherein $L_{B25418}$-$L_{B25447}$ have the structure | 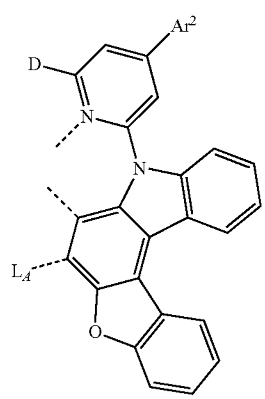 | wherein $Ar^2$ = Aj, wherein j is an integer from 1 to 30, and | z = j + 25417 |

-continued
| | | | |
|---|---|---|---|
| wherein $L_{B25448}$-$L_{B25477}$ have the structure | 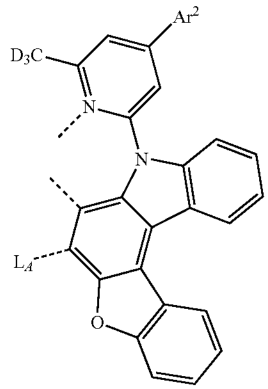 | wherein $Ar^2$ = Aj, wherein j is an integer from 1 to 30, and | z = j + 25447 |
| wherein $L_{B25478}$ have the structure | 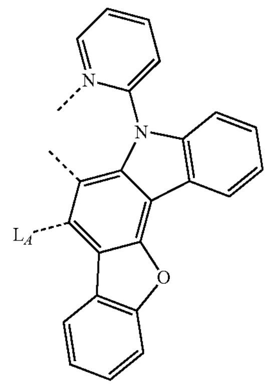 | | z = 25478 |
| wherein $L_{B25479}$ have the structure | 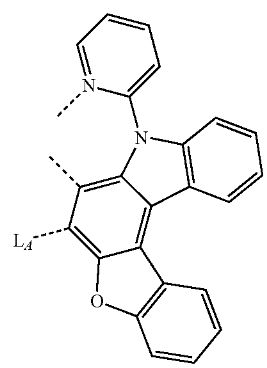 | | z = 25479 |
| wherein $L_{B25480}$ have the structure | 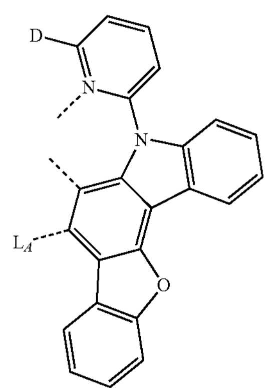 | | z = 25480 |

-continued
| | | | |
|---|---|---|---|
| wherein $L_{B25481}$ have the structure | 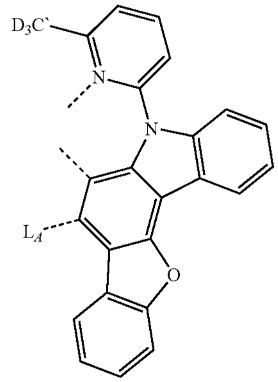 | | z = 25481 |
| wherein $L_{B25482}$ have the structure | 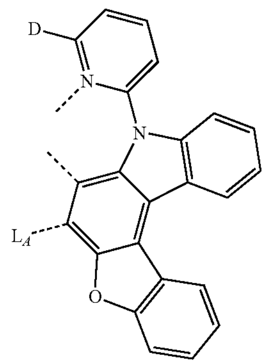 | | z = 25482 |
| wherein $L_{B25483}$ have the structure | 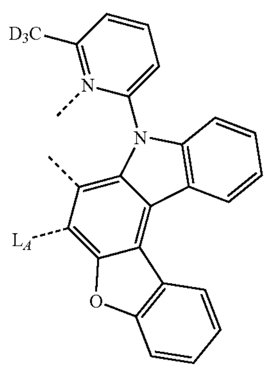 | | z = 25483 |
| wherein $L_{B25484}$-$L_{B27583}$ have the structure | 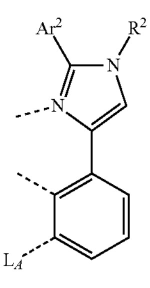 | wherein $Ar^2$ = Aj and $R^2$ = Rl, wherein j is an integer from 1 to 30 and l is an integer from 31 to 100, and | z = 70(j − 1) + (l − 30) + 25483 |
| wherein $L_{B27584}$-$L_{B27653}$ have the structure | 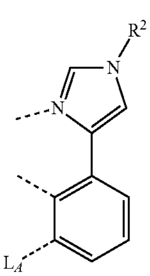 | wherein $R^2$= Rl, wherein l is an integer from 31 to 100, and | z = (l − 30) + 27583 |

-continued

| | | | |
|---|---|---|---|
| wherein $L_{B27654}$-$L_{B29753}$ have the structure | 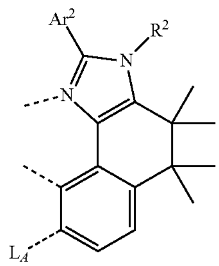 | wherein $Ar^2$ = Aj and $R^2$ = Rl, wherein j is an integer from 1 to 30 and l is an integer from 31 to 100, and | z = 70(j − 1) + (l − 30) + 27653 |
| wherein $L_{B29754}$-$L_{B29823}$ have the structure | 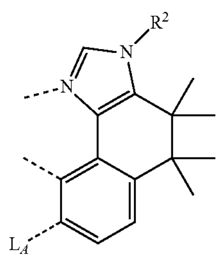 | wherein $R^2$ = Rl, wherein l is an integer from 31 to 100, and | z = (l − 30) + 29753 |
| wherein $L_{B29824}$-$L_{B31923}$ have the structure | 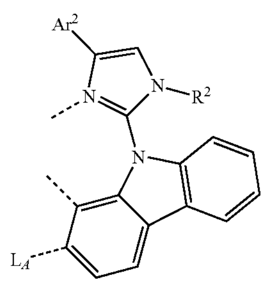 | wherein $Ar^2$ = Aj and $R^2$ = Rl, wherein j is an integer from 1 to 30 and l is an integer from 31 to 100, and | z = 70(j − 1) + (l − 30) + 29823 |
| wherein $L_{B31924}$-$L_{B31993}$ have the structure | 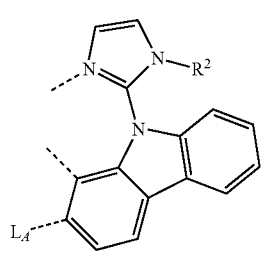 | wherein $R^2$ = Rl, wherein l is an integer from 31 to 100, and | z = (l − 30) + 31923 |
| wherein $L_{B31994}$-$L_{B34093}$ have the structure | 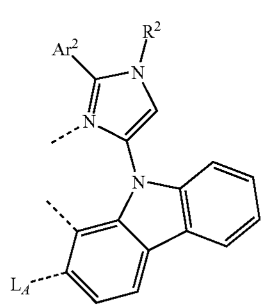 | wherein $Ar^2$ = Aj and $R^2$ = Rl, wherein j is an integer from 1 to 30 and l is an integer from 31 to 100, and | z = 70(j − 1) + (l − 30) + 31993 |

-continued

| | | | |
|---|---|---|---|
| wherein $L_{B34094}$-$L_{B34163}$ have the structure | 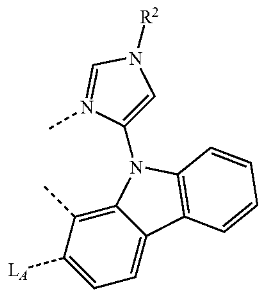 | wherein $R^2$ = Rl, wherein l is an integer from 31 to 100, and | z = l + 34093 |
| wherein $L_{B34164}$-$L_{B36263}$ have the structure | 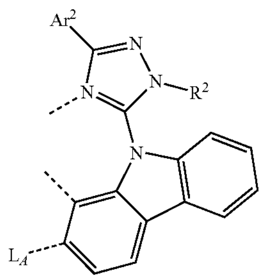 | wherein $Ar^2$ = Aj and $R^2$ = Rl, wherein j is an integer from 1 to 30 and l is an integer from 31 to 100, and | z = 70(j − 1) + (l − 30) + 34163 |
| wherein $L_{B36264}$-$L_{B36333}$ have the structure | 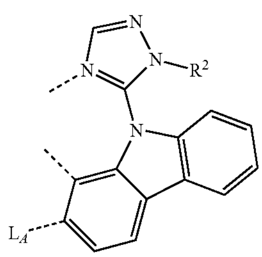 | wherein $R^2$ = Rl, wherein l is an integer from 31 to 100, and | z = l + 36263 |
| wherein $L_{B36334}$-$L_{B38433}$ have the structure | 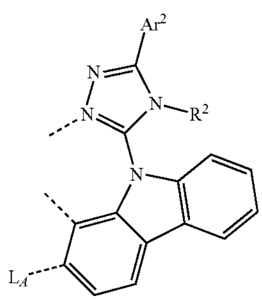 | wherein $Ar^2$ = Aj and $R^2$ = Rl, wherein j is an integer from 1 to 30 and l is an integer from 31 to 100, and | z = 70(j − 1) + (l − 30) + 36333 |
| wherein $L_{B38434}$-$L_{B38503}$ have the structure | 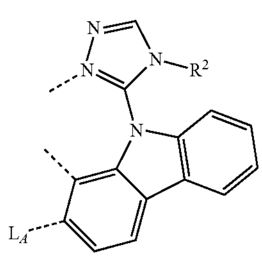 | wherein $R^2$ = Rl, wherein l is an integer from 31 to 100, and | z = l + 38433 |

-continued
| | | | |
|---|---|---|---|
| wherein $L_{B38504}$-$L_{B40603}$ have the structure | 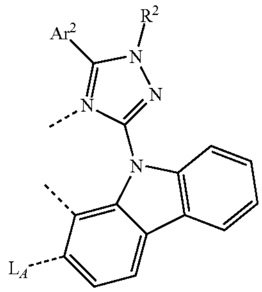 | wherein $Ar^2$ = Aj and $R^2$ = Rl, wherein j is an integer from 1 to 30 and l is an integer from 31 to 100, and | z = 70(j − 1) + (l − 30) + 38503 |
| wherein $L_{B40604}$-$L_{B40673}$ have the structure | 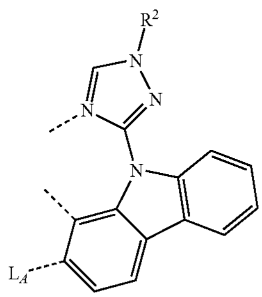 | wherein $R^2$ = Rl, wherein l is an integer from 31 to 100, and | z = l + 40603 |
wherein A1 to A30 have the following structures:
A1
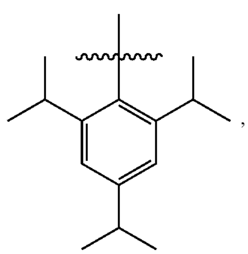
A2
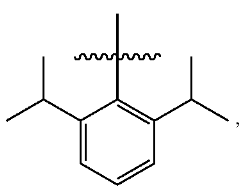
A3
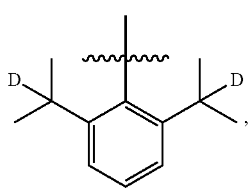
A4
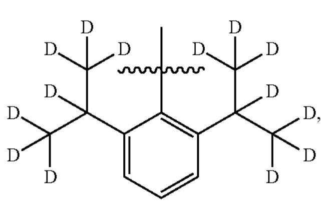
-continued
A5
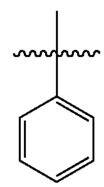
A6
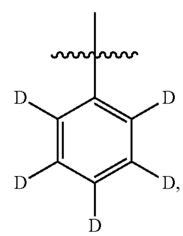
A7
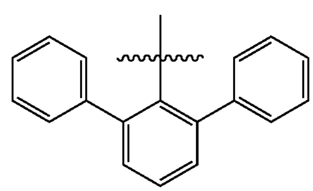
A8
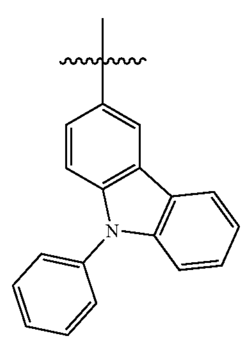

-continued
A9
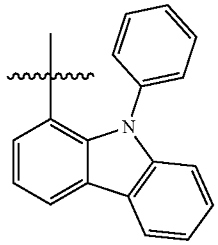
A10
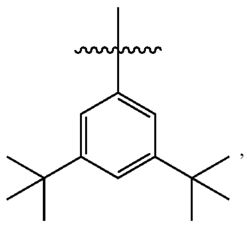
A11
Me,
A12
iPr,
A13
tBu,
A14
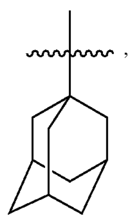
A15
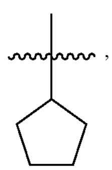
A16
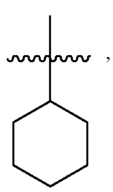
A17
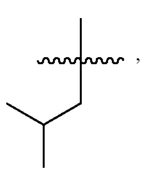
A18
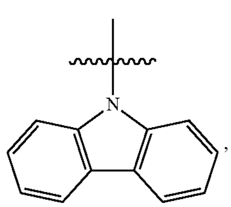
-continued
A19
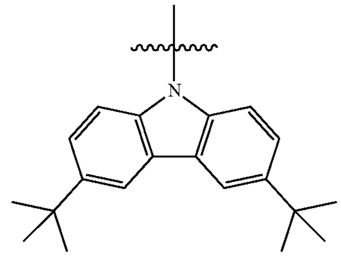
A20
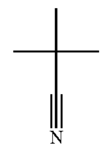
A21
$CD_3$,
A22
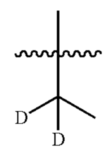
A23
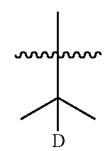
A24
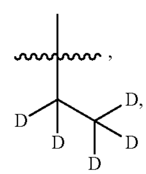
A25
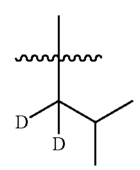
A26
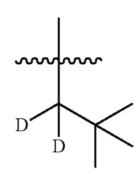
A27
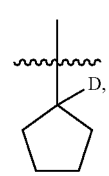

-continued
A28
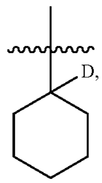
A29
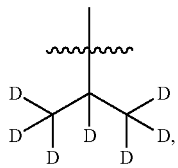
A30
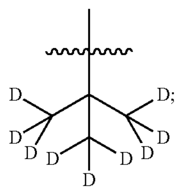
and
wherein R1 to R330 have the following structures:
R1
Me,
R2
iPr,
R3
tBu,
R4
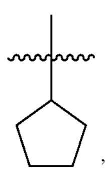
R5
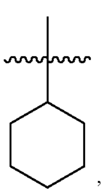
R6
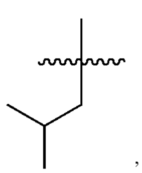
R7
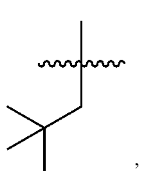
-continued
R8
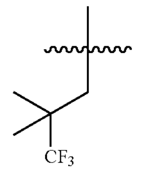
R9
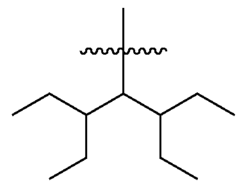
R10
$CD_3$
R11
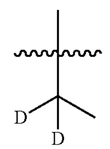
R12
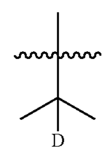
R13
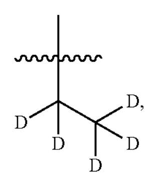
R14
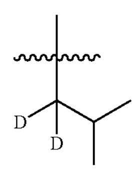
R15
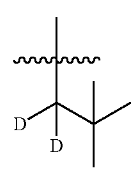
R16
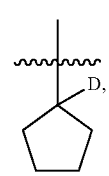
R17
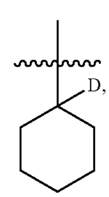

R18
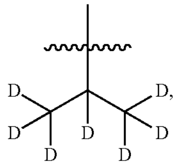
R19
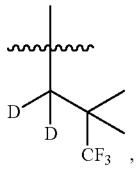
R20
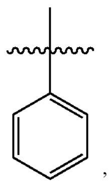
R21
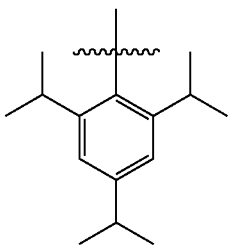
R22
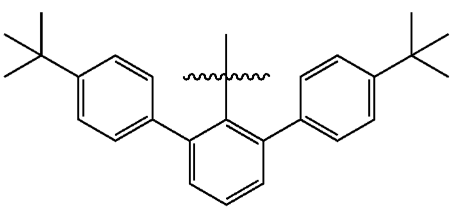
R23
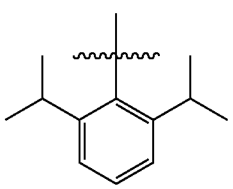
R24
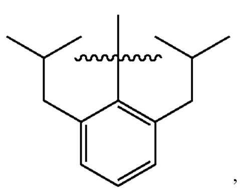
R25
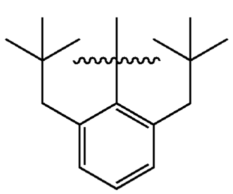
R26
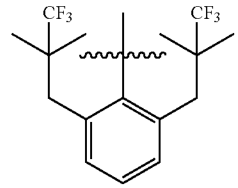
R27
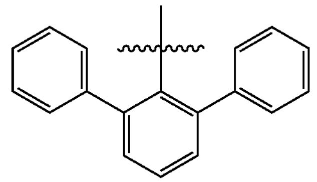
R28
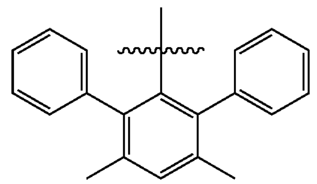
R29
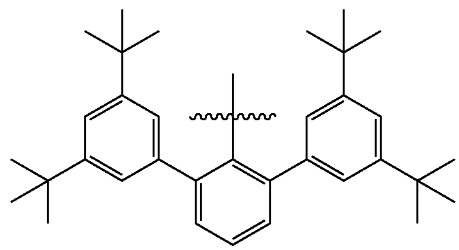
R30
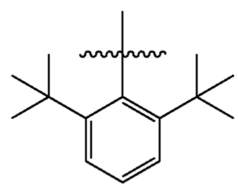
R31
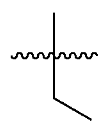
R32
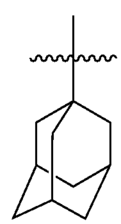
R33
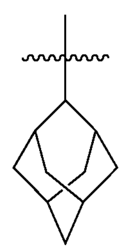

-continued
R34
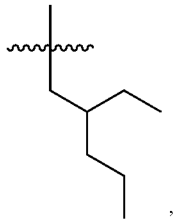
R35
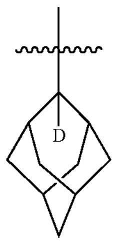
R36
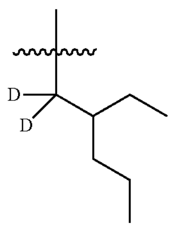
R37
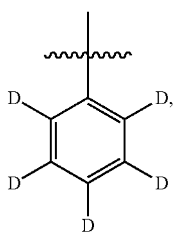
R38
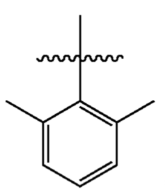
R39
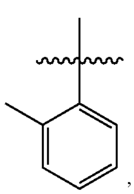
R40
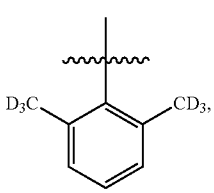
-continued
R41
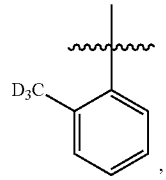
R42
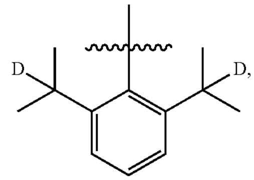
R43
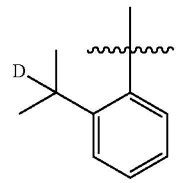
R44
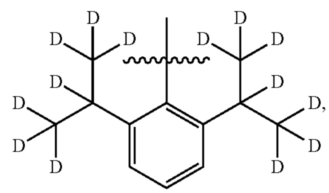
R45
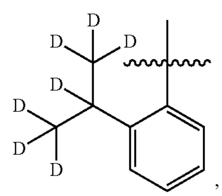
R46
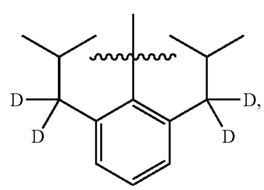
R47
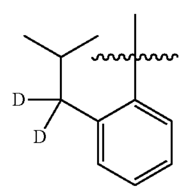
R48
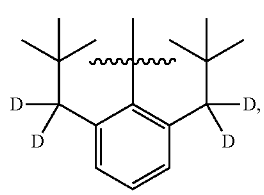

-continued
R49
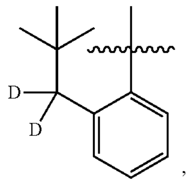
R50
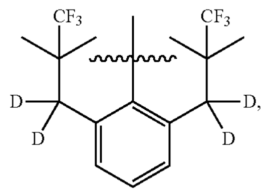
R51
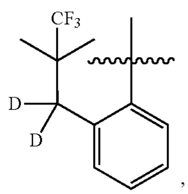
R52
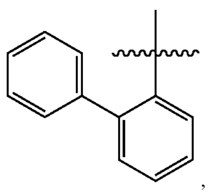
R53
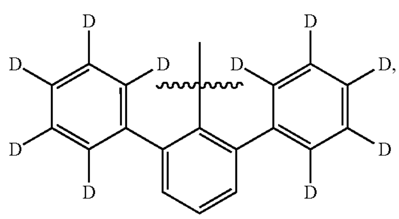
R54
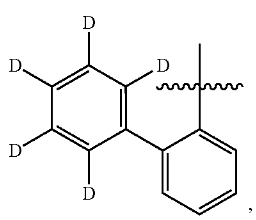
R55
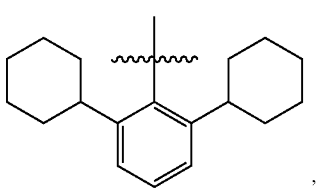
R56
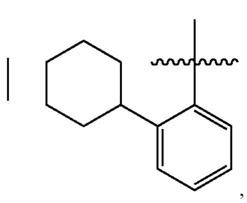
-continued
R57
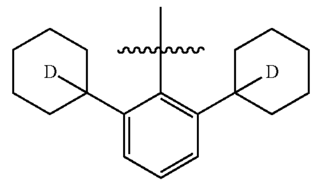
R58
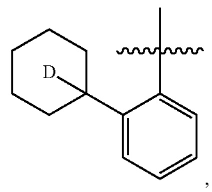
R59
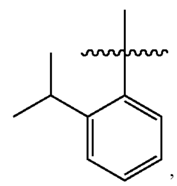
R60
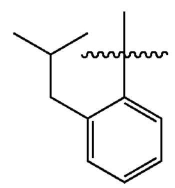
R61
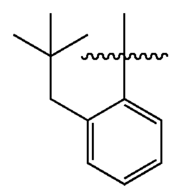
R62
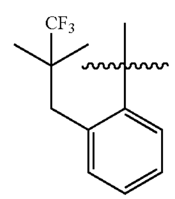
R63
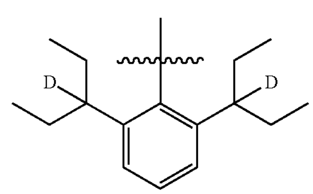
R64
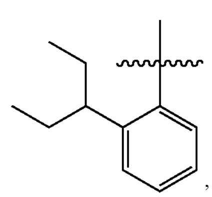

-continued
R65
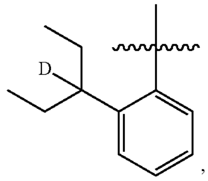
R66
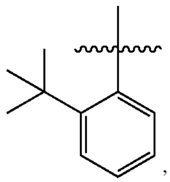
R67
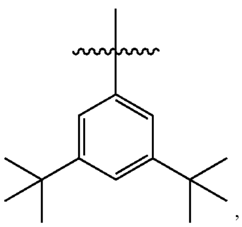
R68
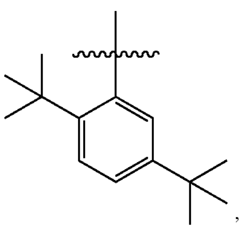
R69
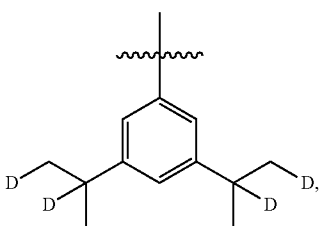
R70
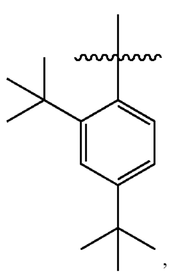
R71
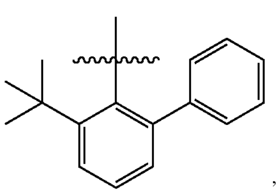
-continued
R72
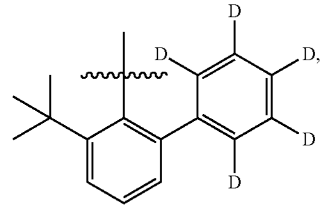
R73
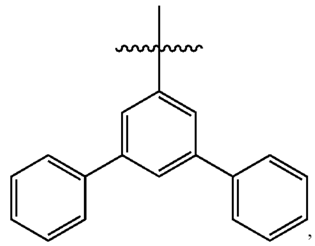
R74
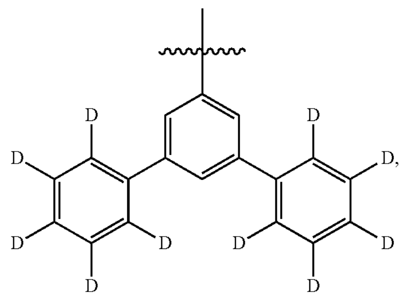
R75
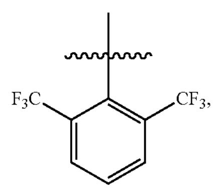
R76
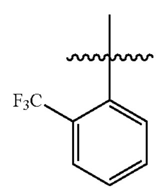
R77
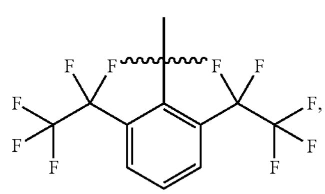
R78
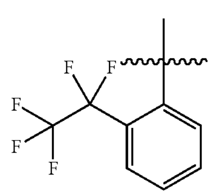

-continued
R79
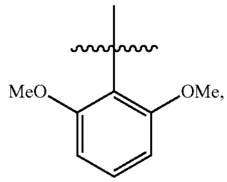
R80
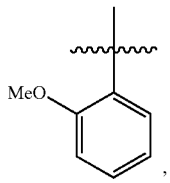
R81
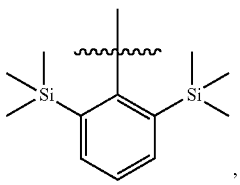
R82
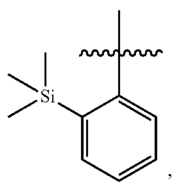
R83
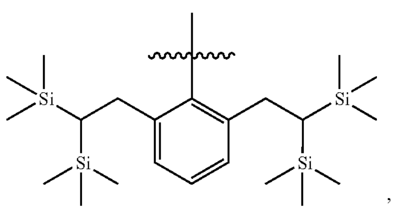
R84
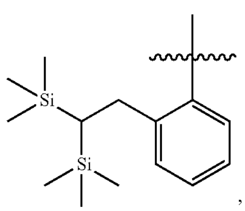
R85
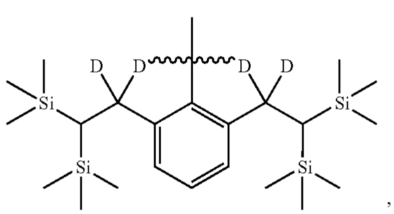
R86
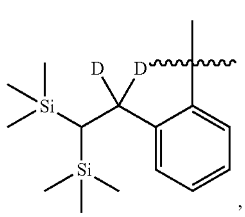
-continued
R87
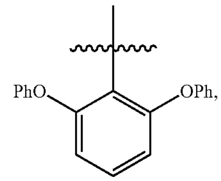
R88
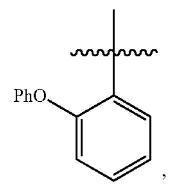
R89
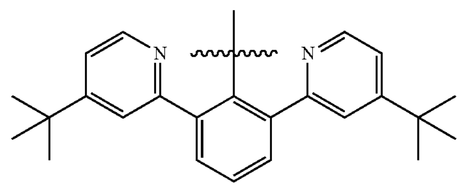
R90
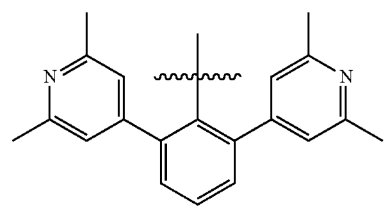
R91
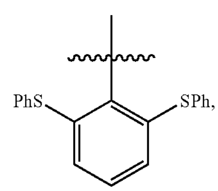
R92
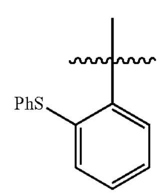
R93
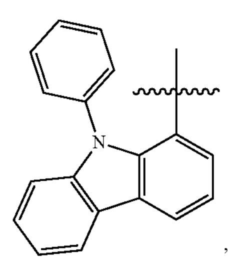

-continued
R94
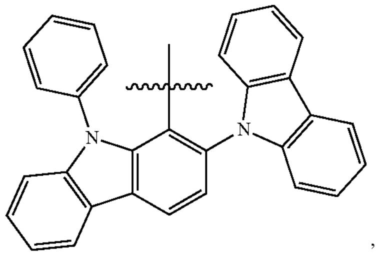
R95
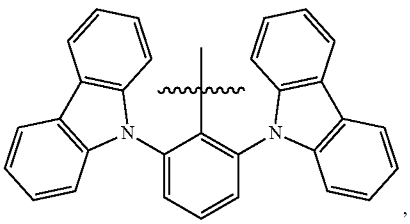
R96
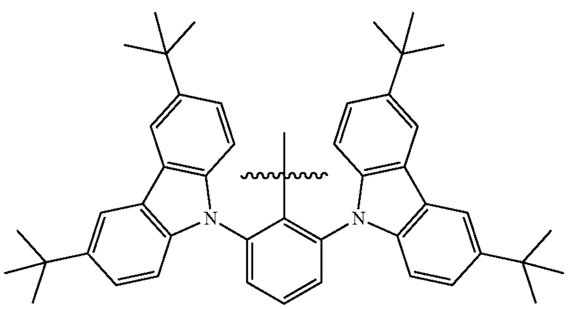
R97
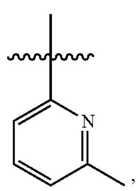
R98
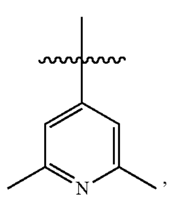
R99
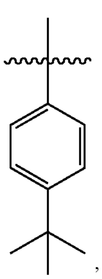
-continued
R100
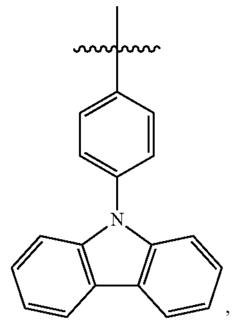
R101
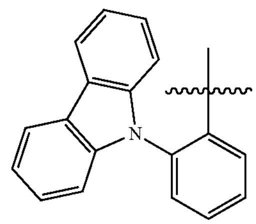
R102
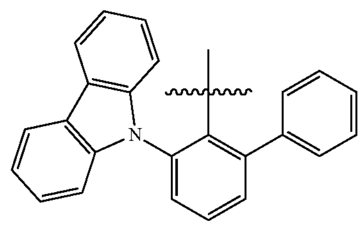
R103
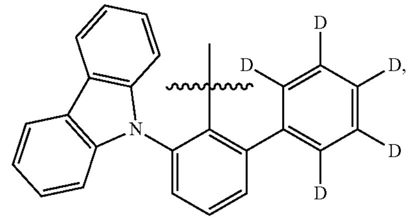
R104
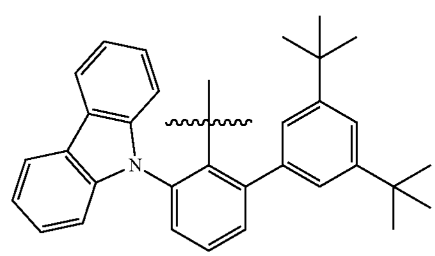
R105
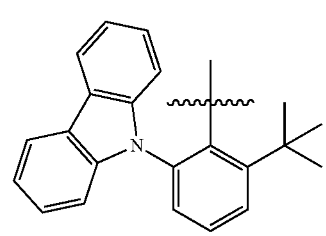

-continued
R106
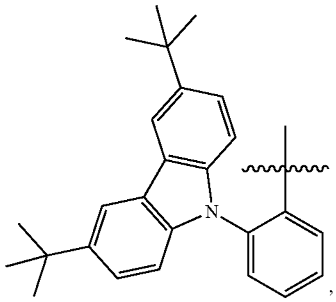
R107
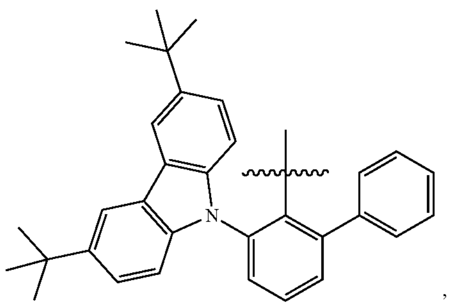
R108
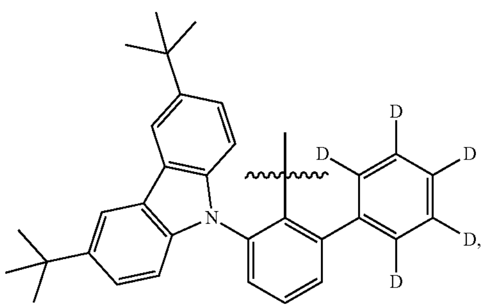
R109
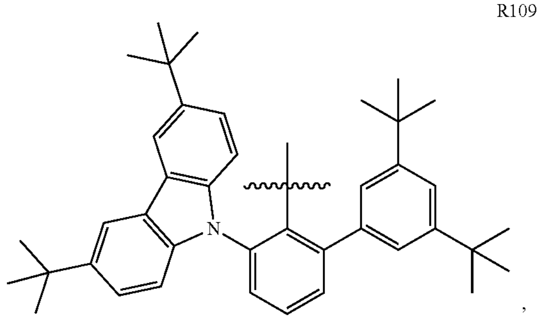
R110
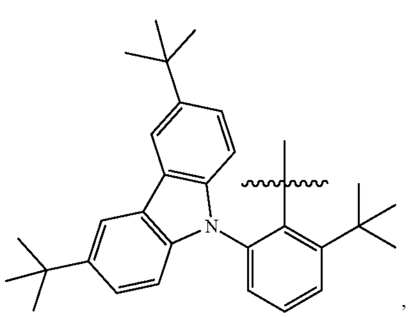
-continued
R111
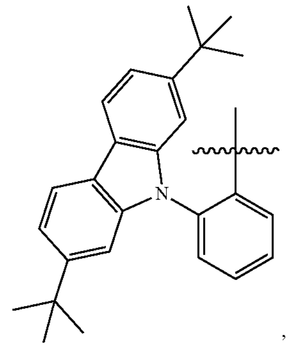
R112
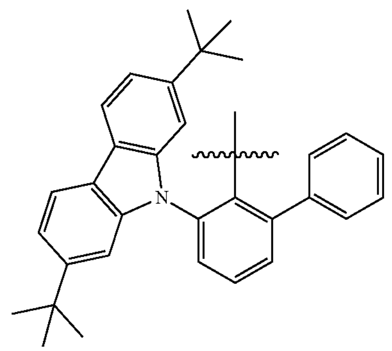
R113
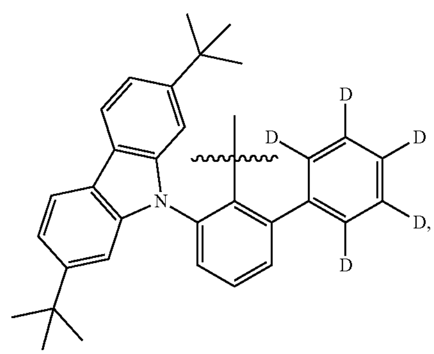
R114
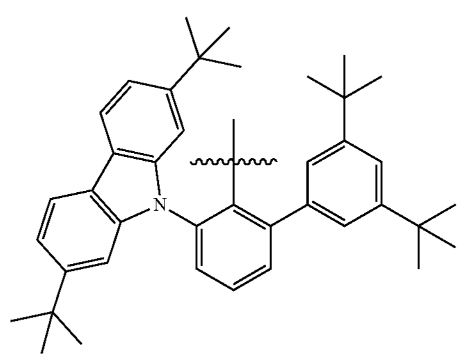

-continued
R115
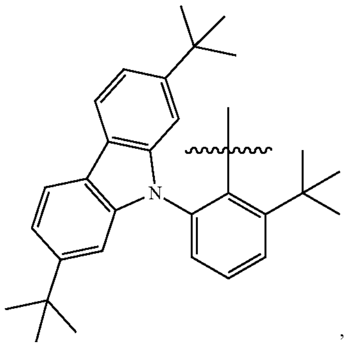
,
R116
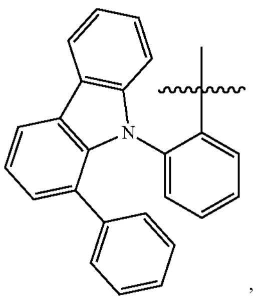
,
R117
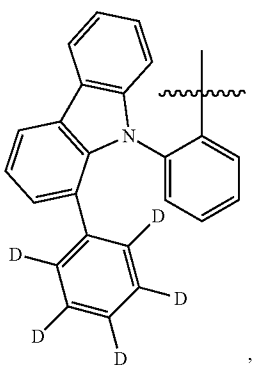
,
R118
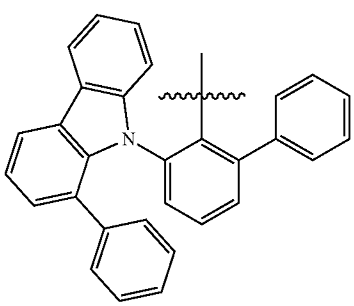
,
-continued
R119
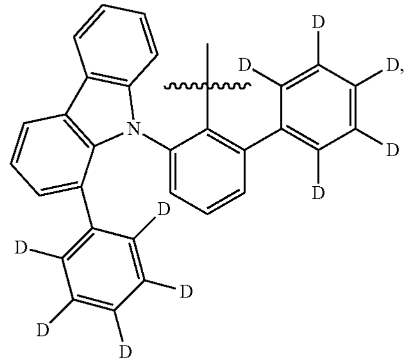
R120
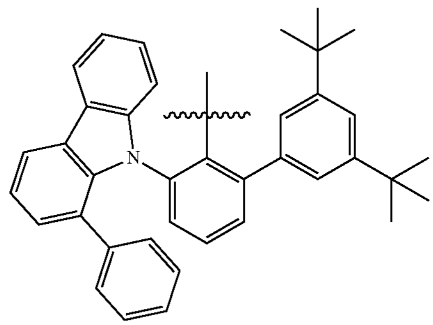
,
R121
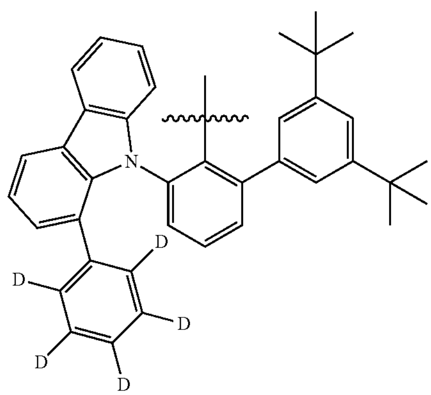
,
R122
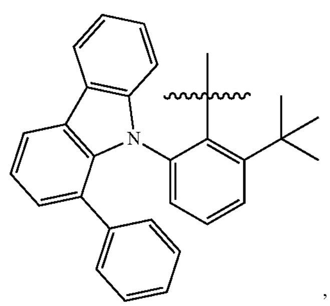
, -continued
R123
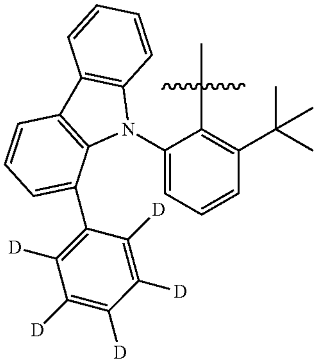
,
R124
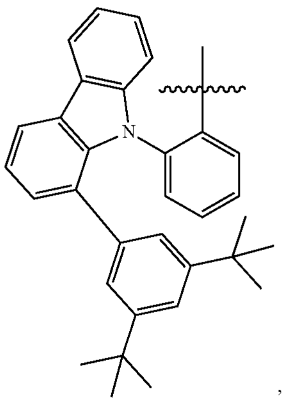
,
R125
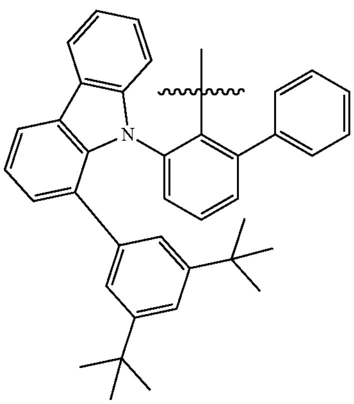
,
R126
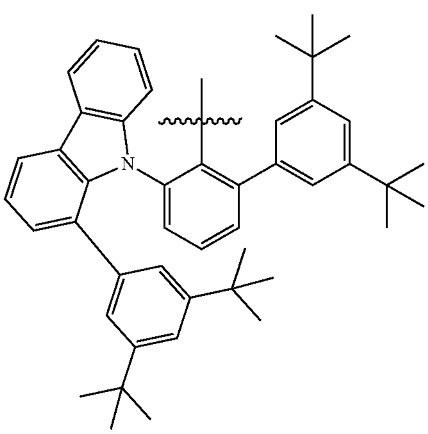
,
-continued
R127
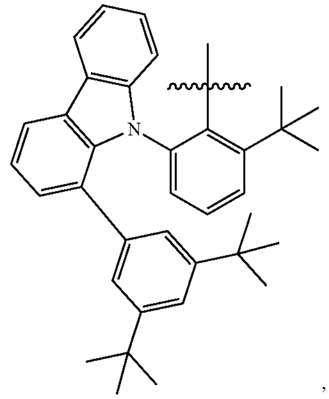
,
R128
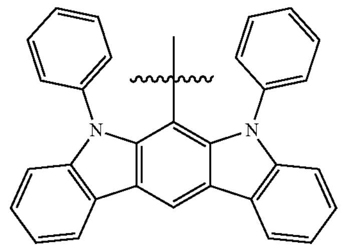
,
R129
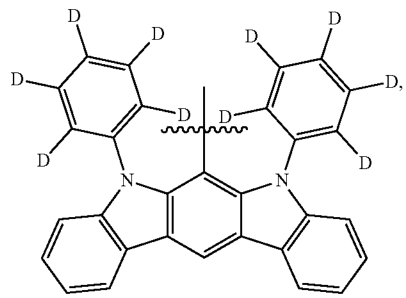
R130
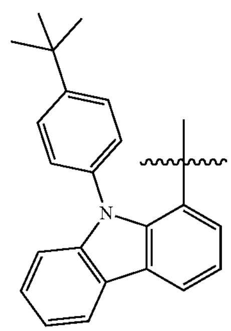
,
R131
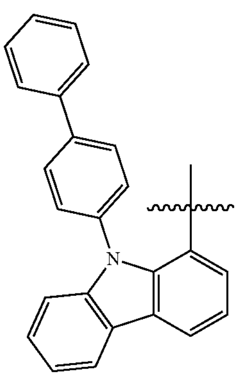
, R132
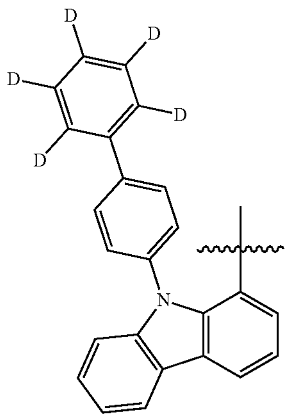
,
R133
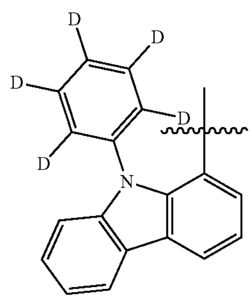
,
R134
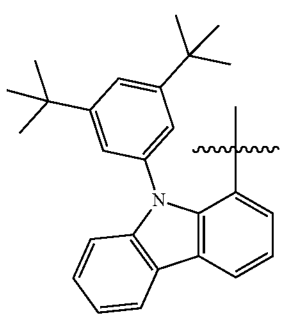
,
R135
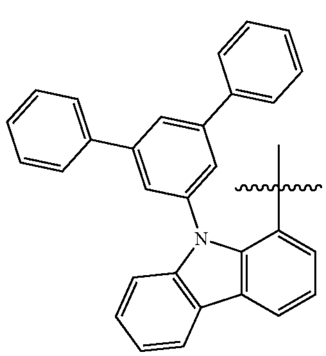
,
R136
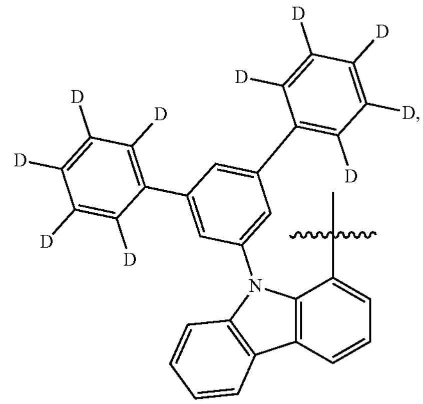
R137
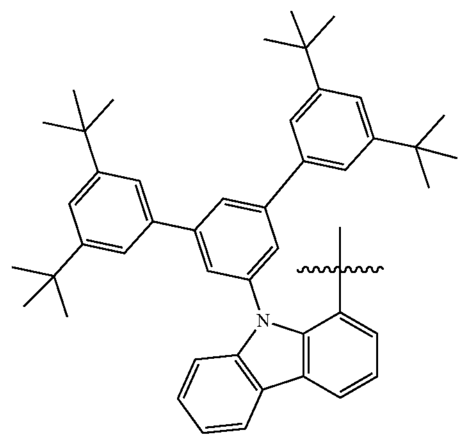
,
R138
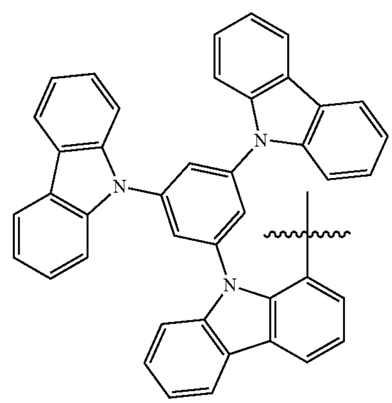
,
R139
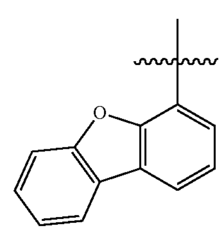
,
R140
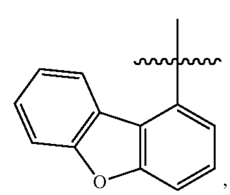
, -continued
R141
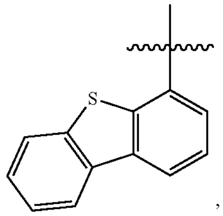
R142
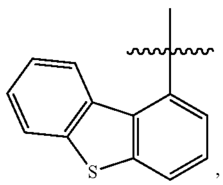
R143
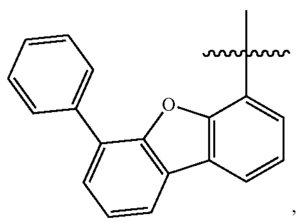
R144
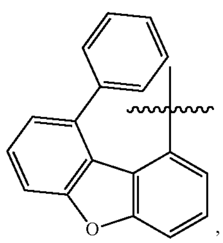
R145
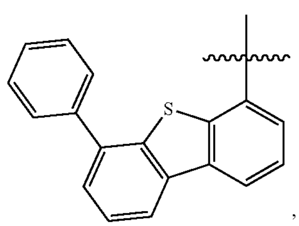
R146
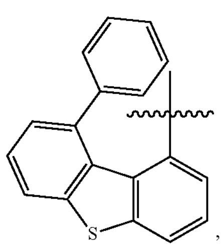
R147
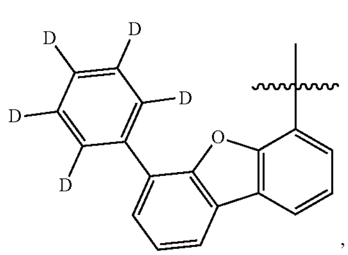
-continued
R148
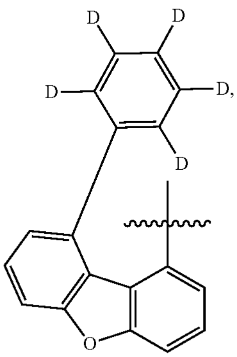
R149
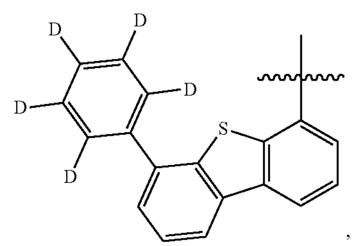
R150
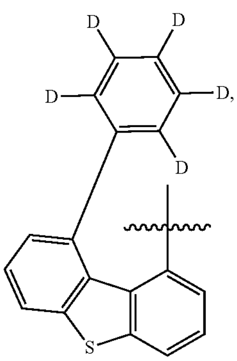
R151
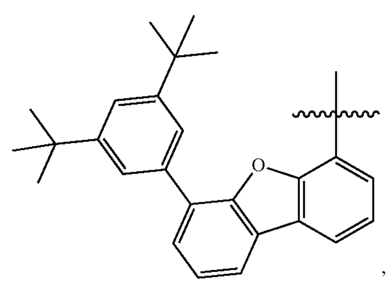
R152
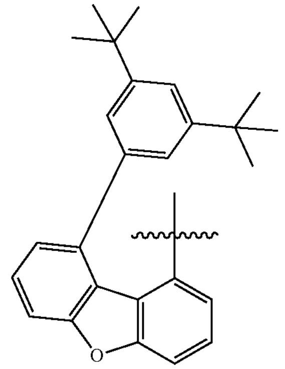

R153
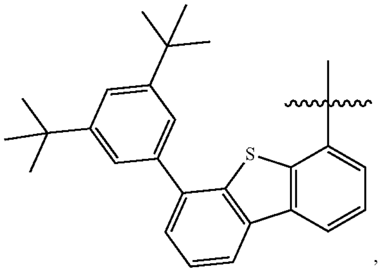
R154
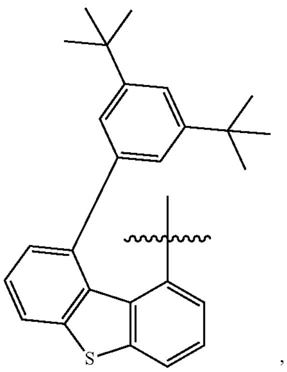
R155
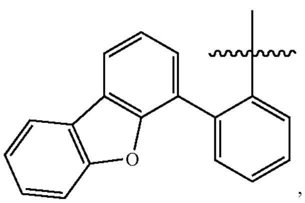
R156
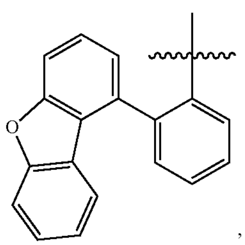
R157
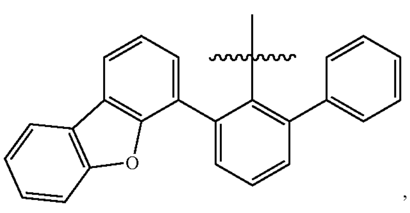
R158
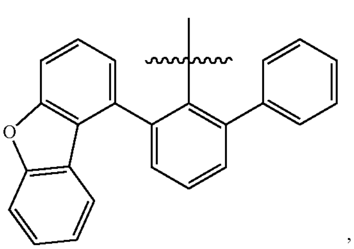
R159
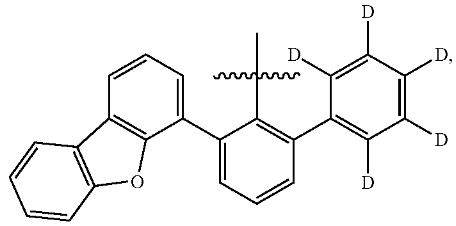
R160
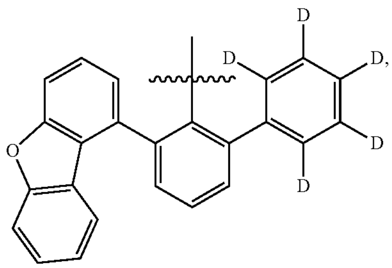
R161
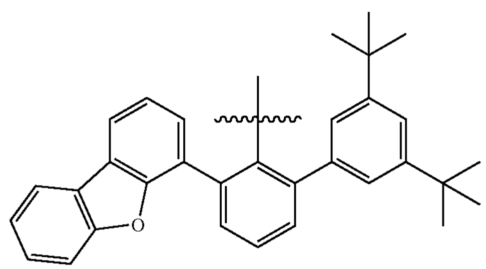
R162
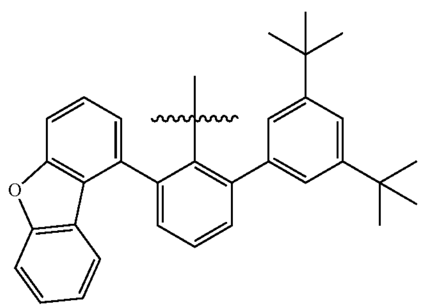
R163
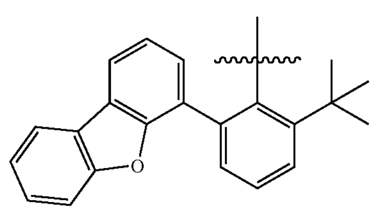
R164
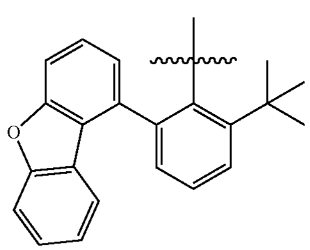

-continued
R165
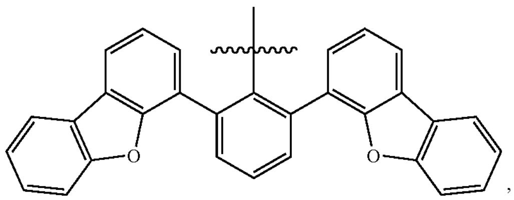
R166
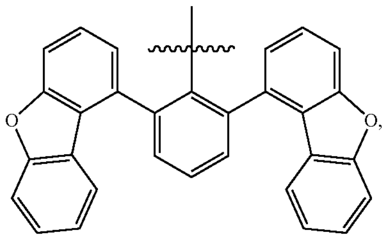
R167
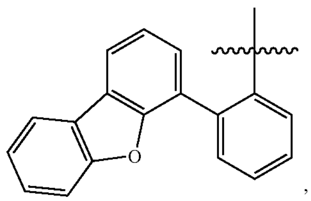
R168
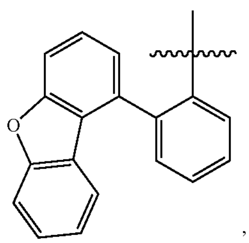
R169
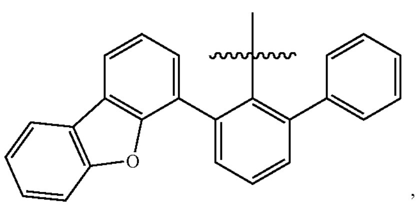
R170
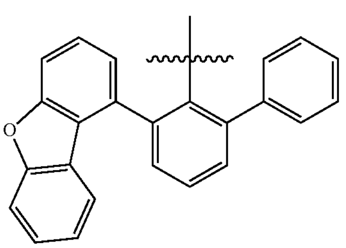
R171
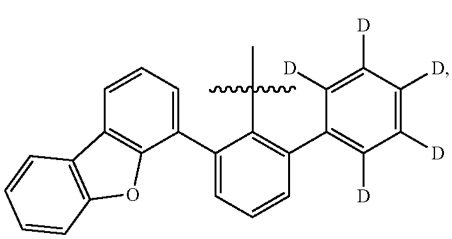
-continued
R172
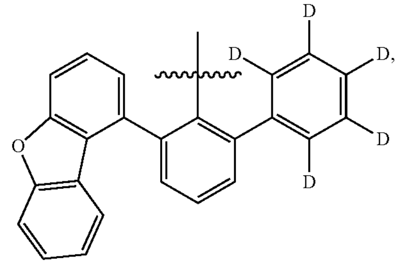
R173
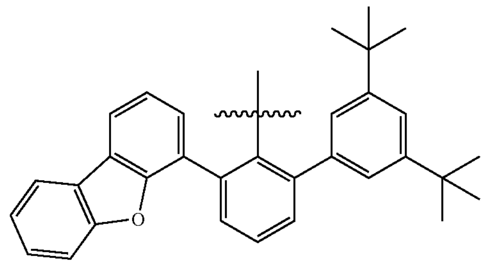
R174
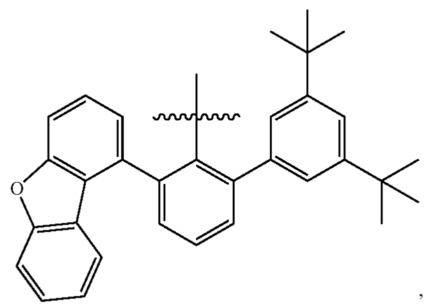
R175
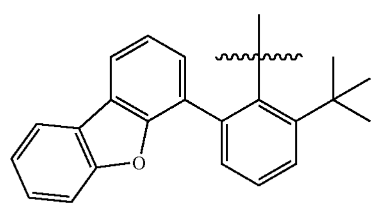
R176
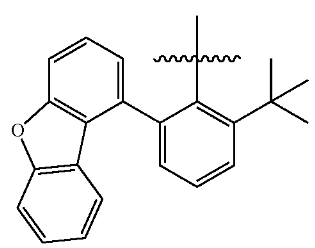
R177
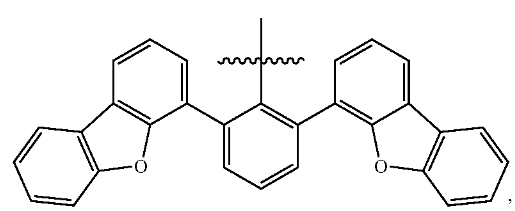

-continued
R178
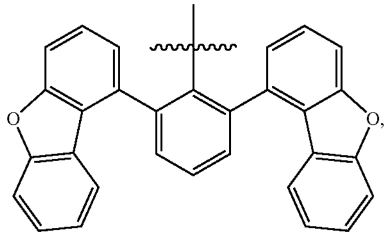
R179
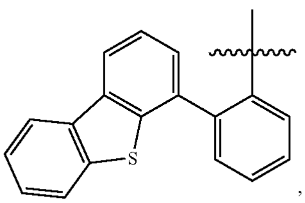
R180
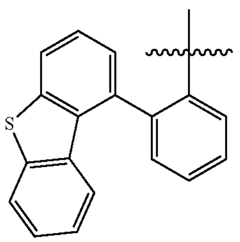
R181
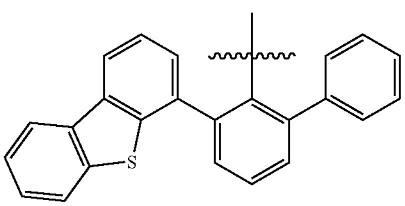
R182
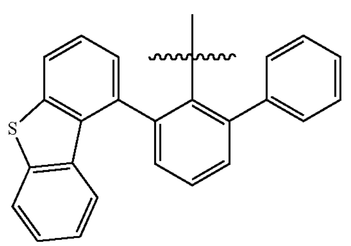
R183
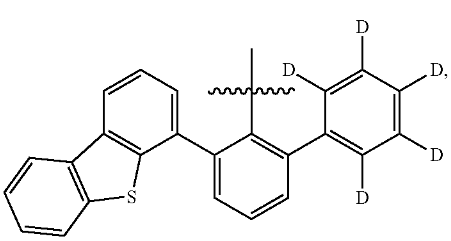
-continued
R184
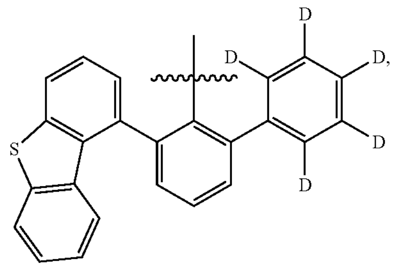
R185
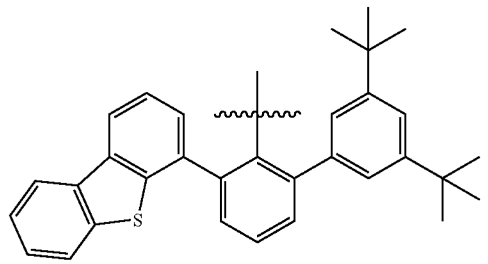
R186
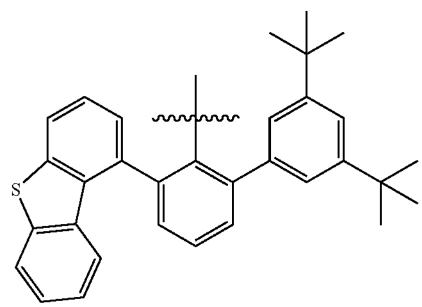
R187
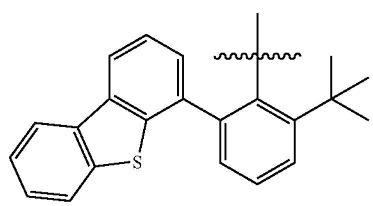
R188
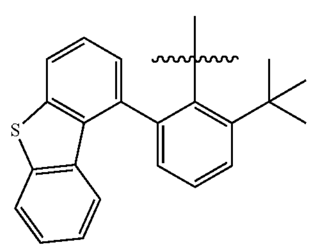
R189
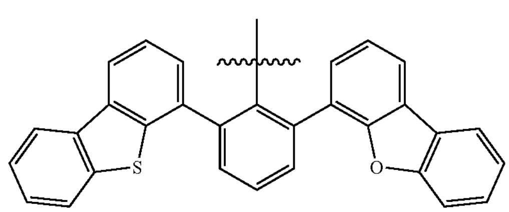

-continued
R190
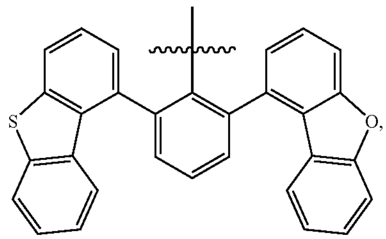
R191
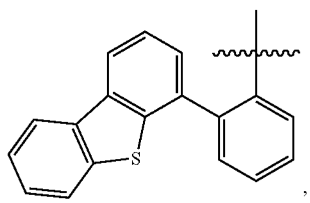
R192
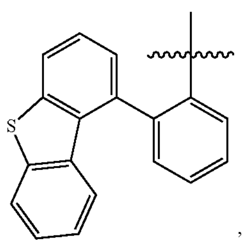
R193
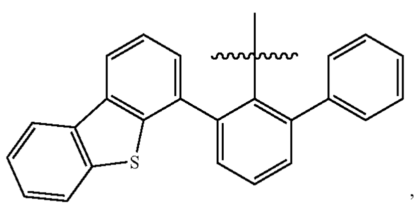
R194
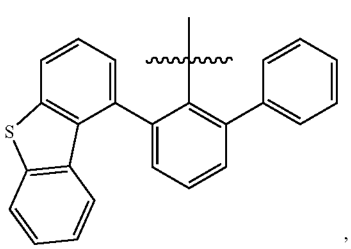
R195
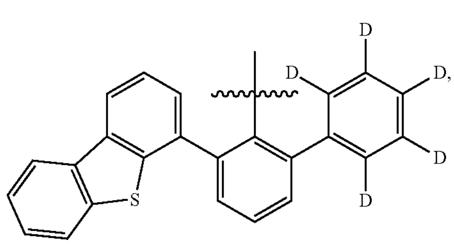
-continued
R196
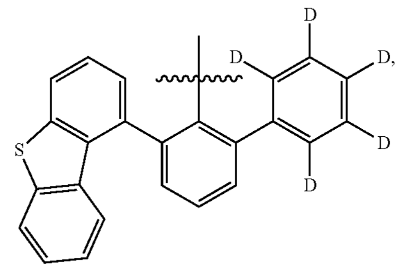
R197
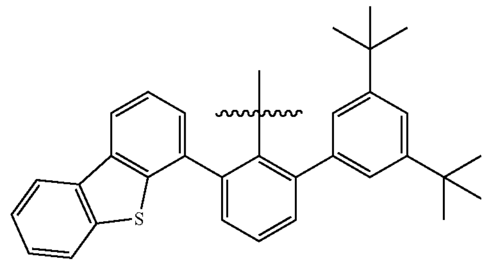
R198
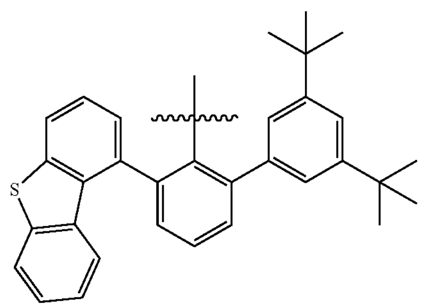
R199
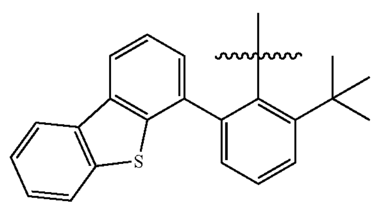
R200
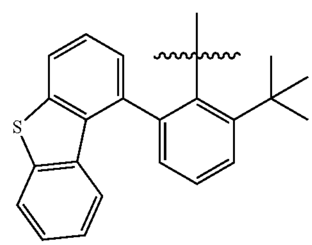
R201
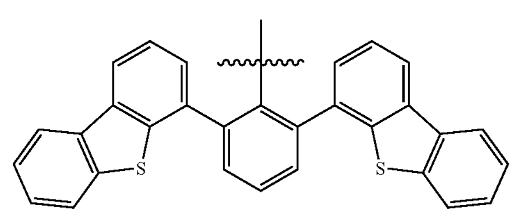

-continued
R202
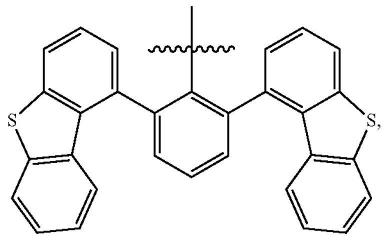
R203
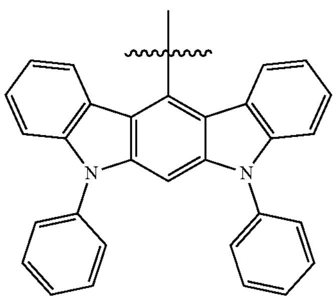
,
R204
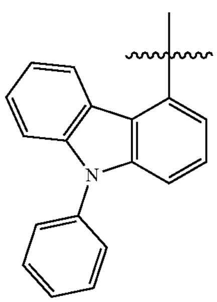
,
R205
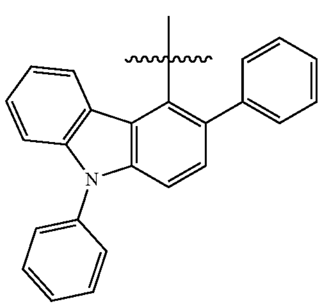
,
R206
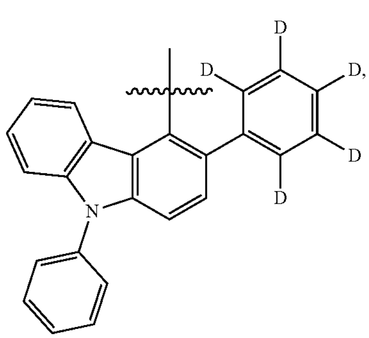
-continued
R207
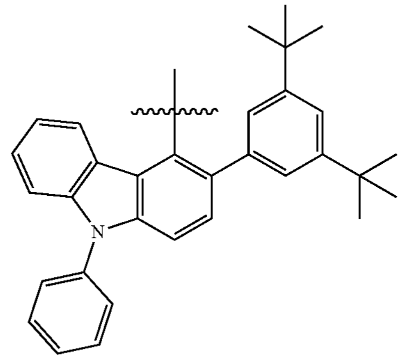
,
R208
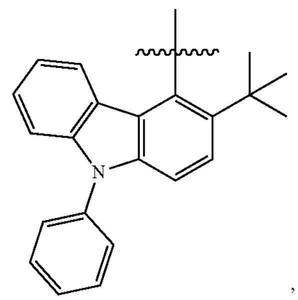
,
R209
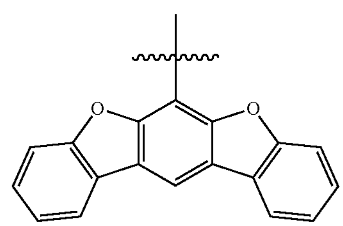
,
R210
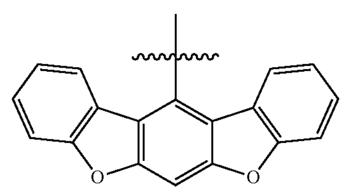
,
R211
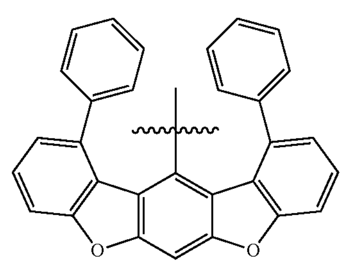
,
R212
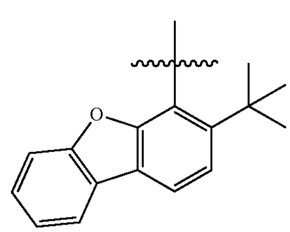
, -continued
R213
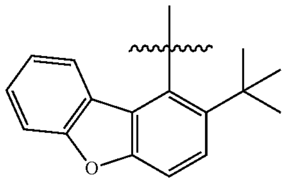
,
R214
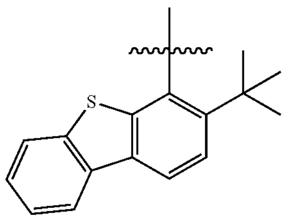
,
R215
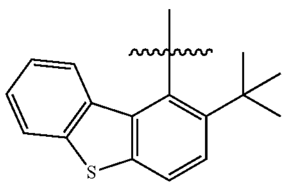
,
R216
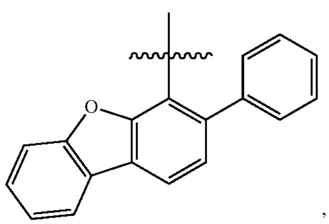
,
R217
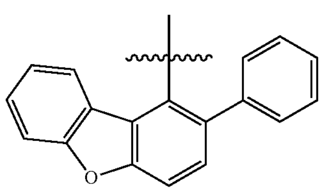
,
R218
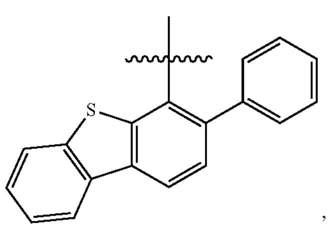
,
R219
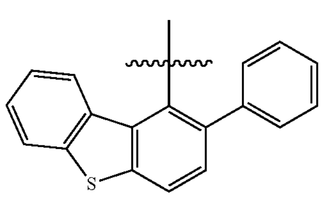
,
-continued
R220
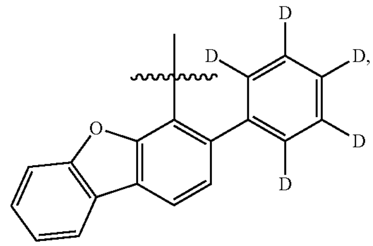
R221
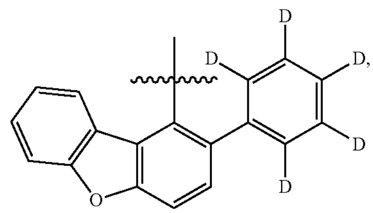
R222
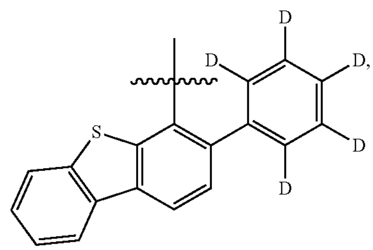
R223
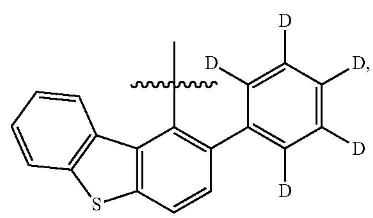
R224
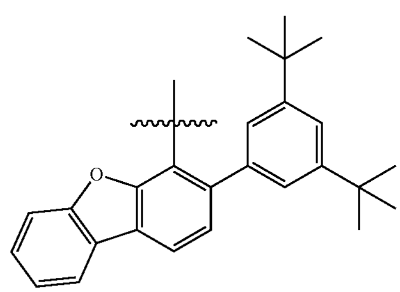
,
R225
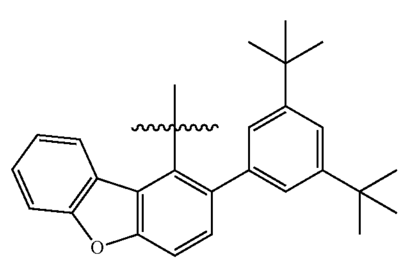
, -continued
R226
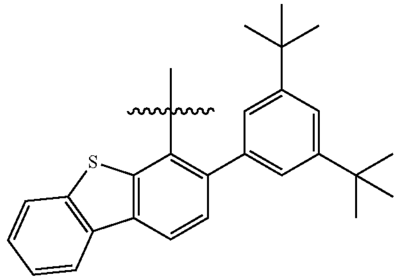
,
R227
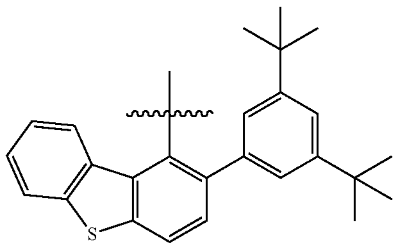
,
R228
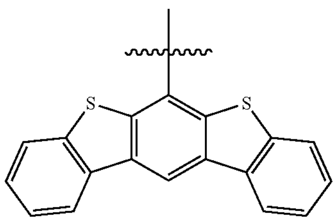
,
R229
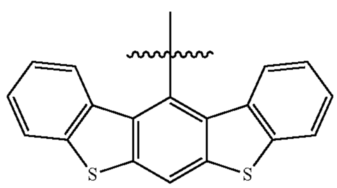
,
R230
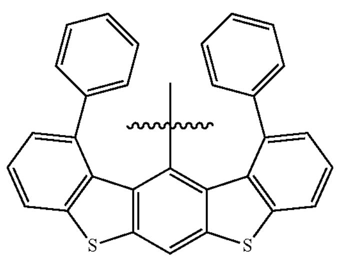
,
R231
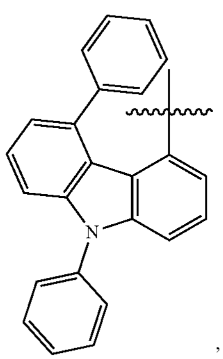
,
-continued
R232
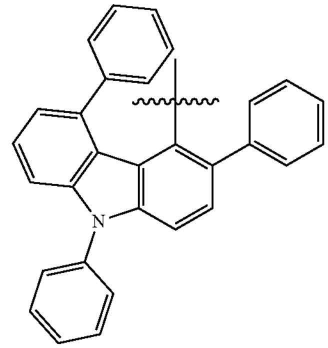
,
R233
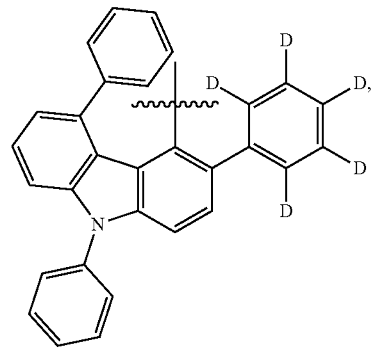
R234
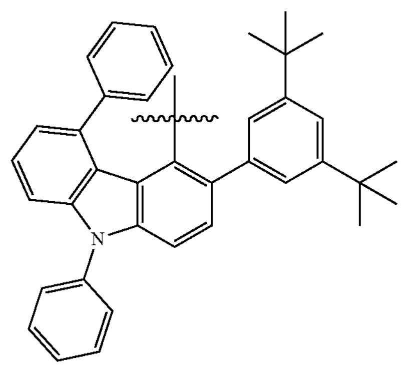
,
R235
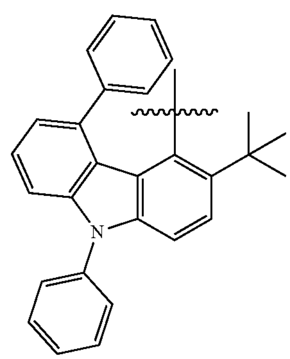
, -continued
R236
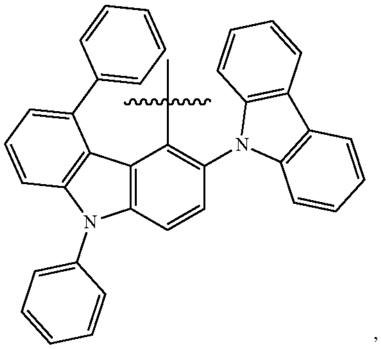
R237
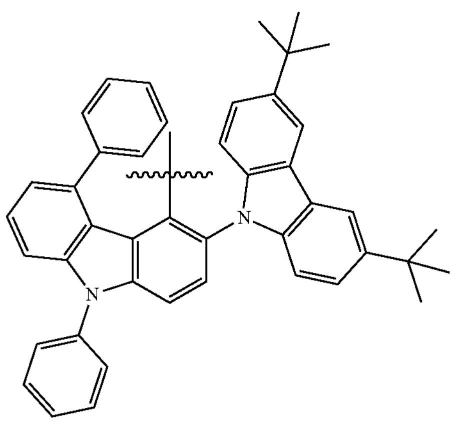
R238
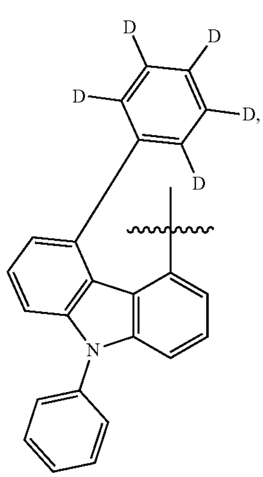
-continued
R239
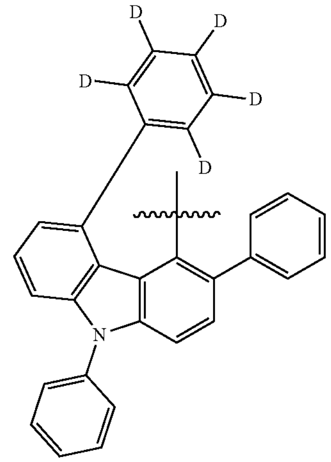
R240
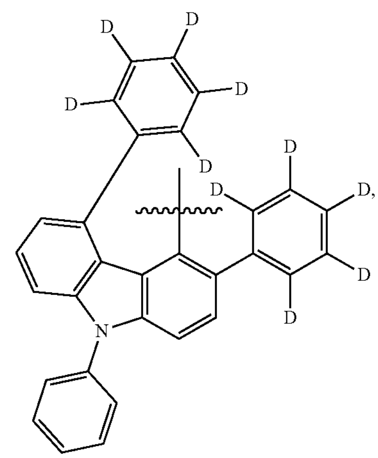
R241
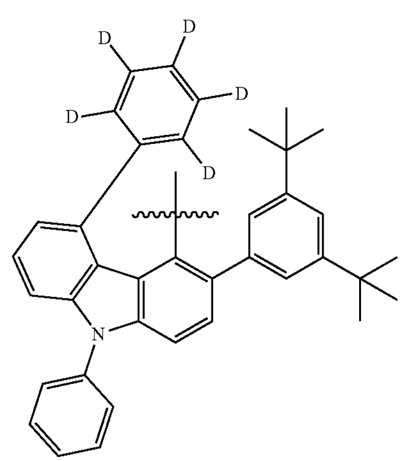

-continued
R242
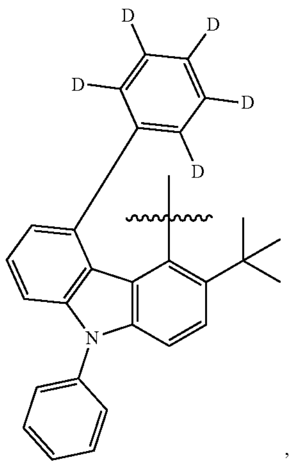
,
R243
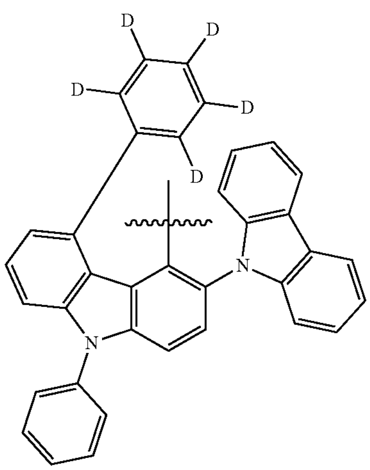
,
R244
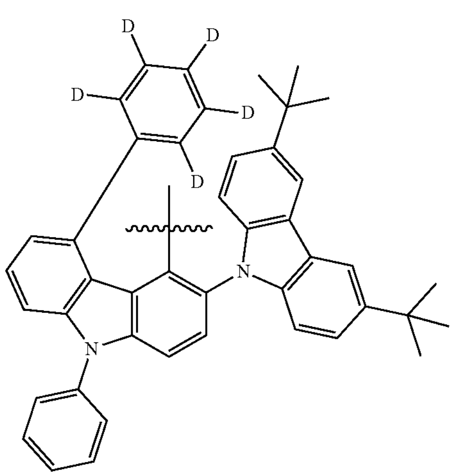
,
-continued
R245
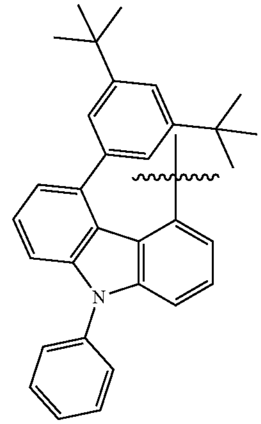
,
R246
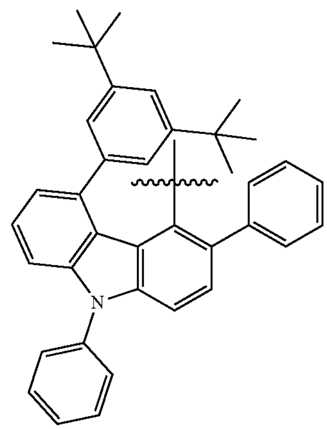
,
R247
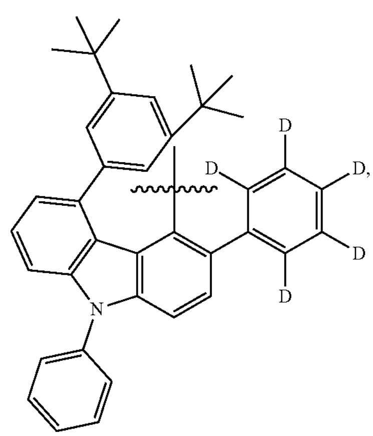

-continued
R248
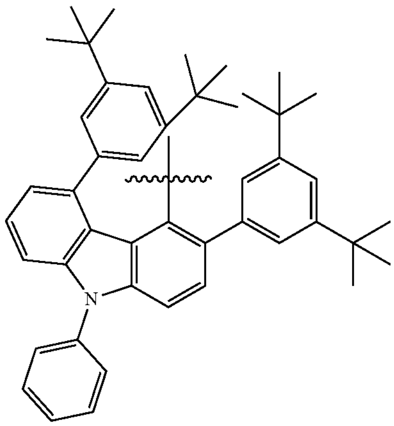
,
R249
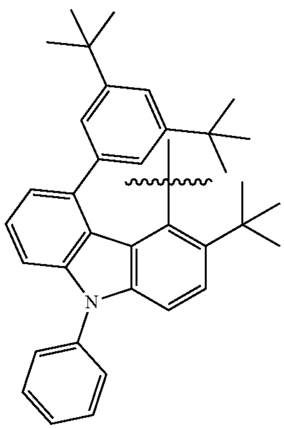
,
R250
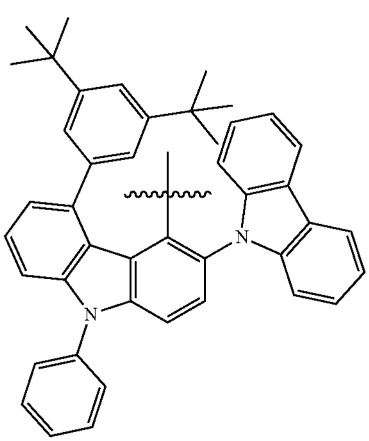
,
-continued
R251
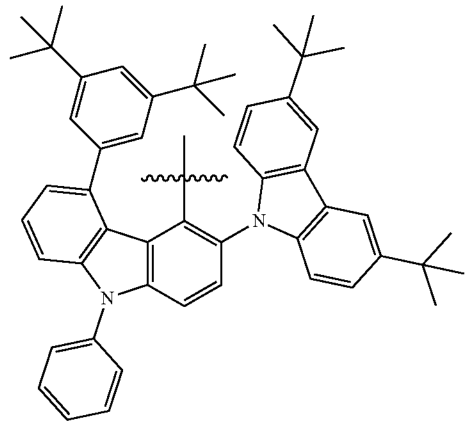
,
R252
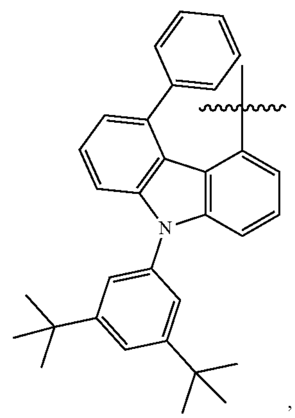
,
R253
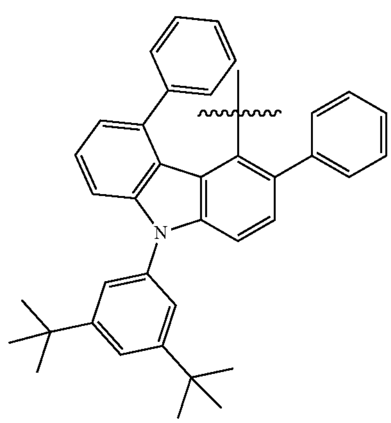
, -continued
R254
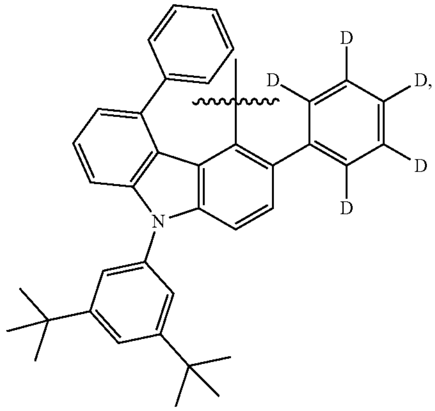
R255
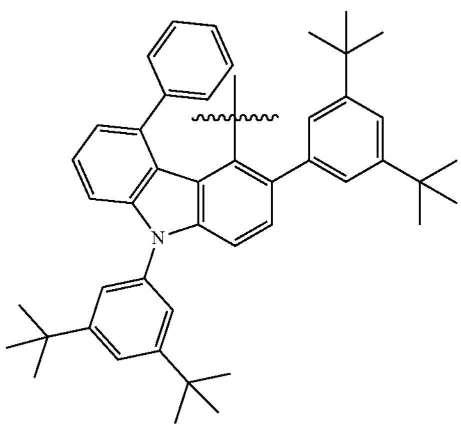
,
R256
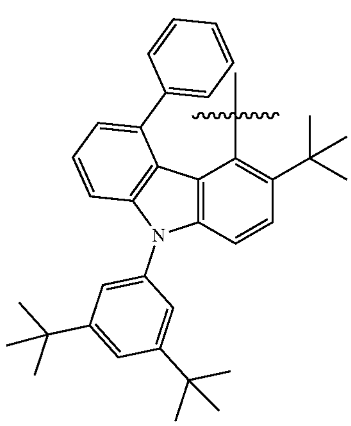
,
-continued
R257
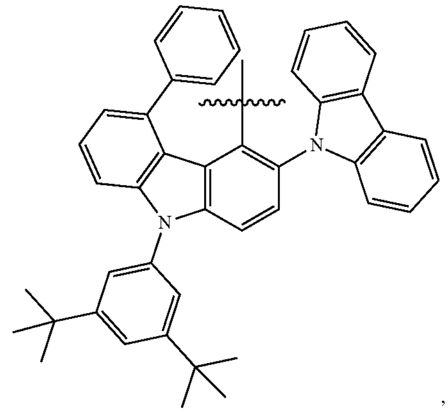
,
R258
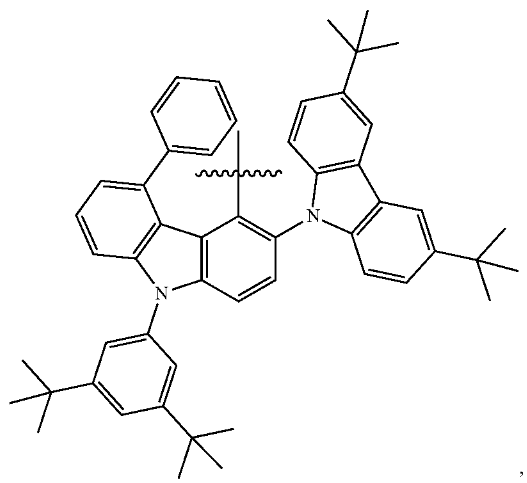
,
R259
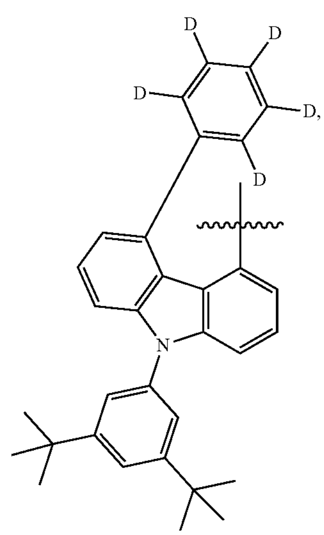

-continued
R260
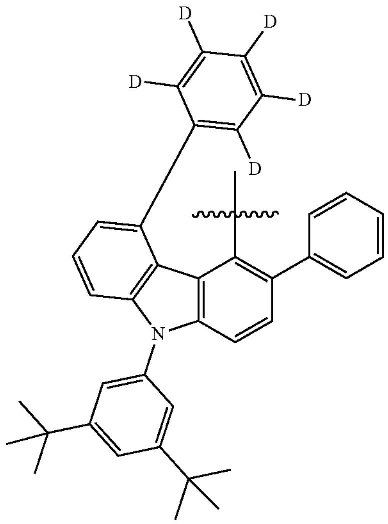
,
R261
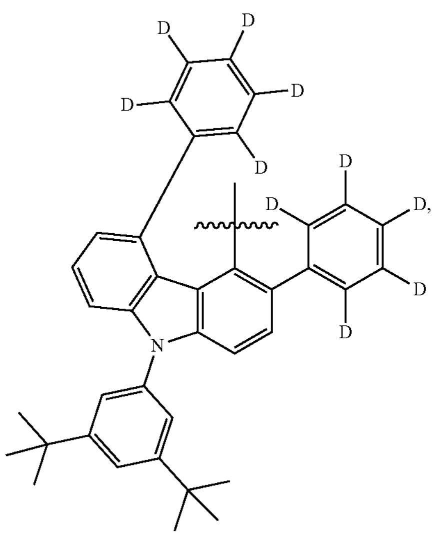
R262
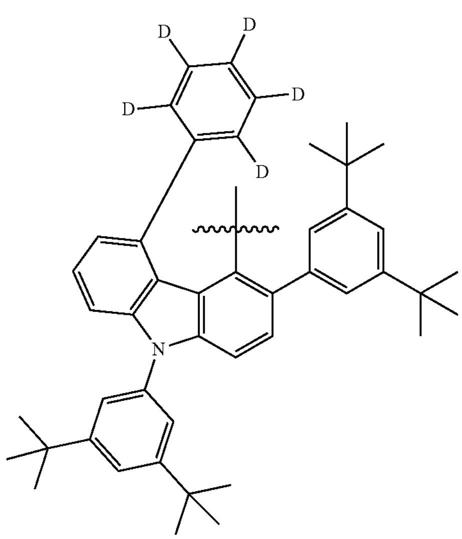
,
-continued
R263
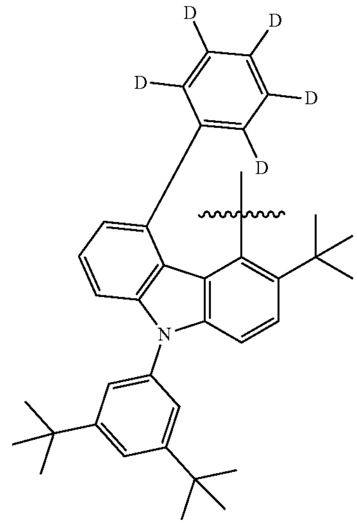
,
R264
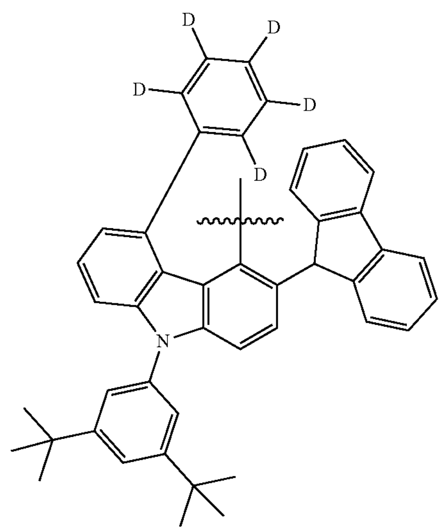
,
R265
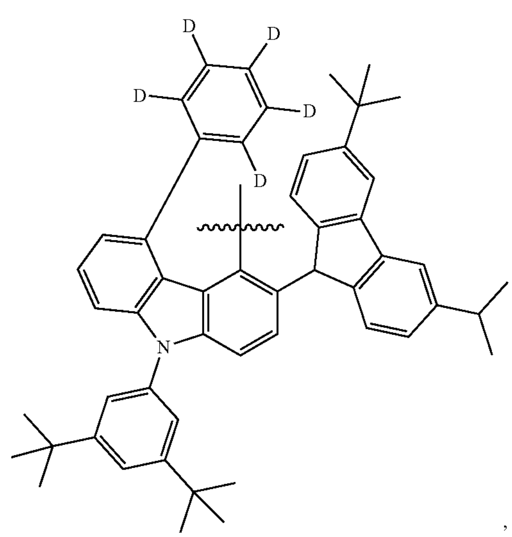
, -continued
R266
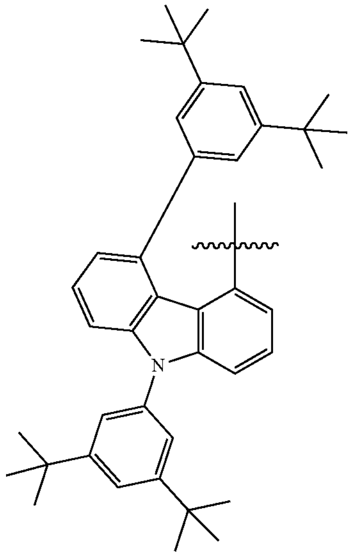
,
R267
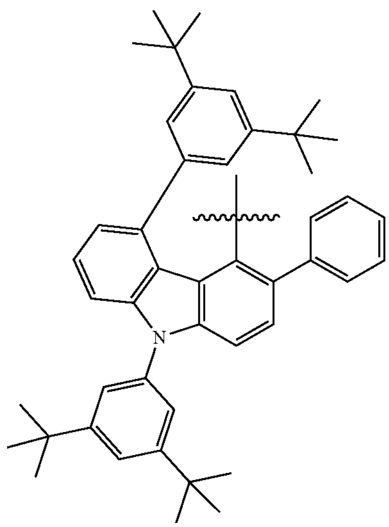
,
R268
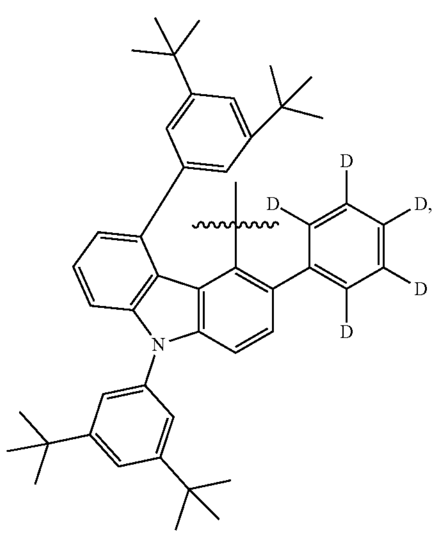
-continued
R269
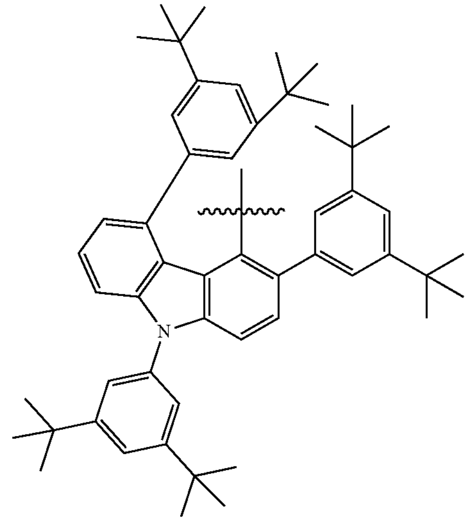
,
R270
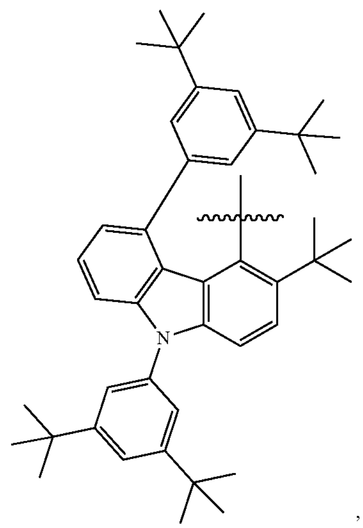
,
R271
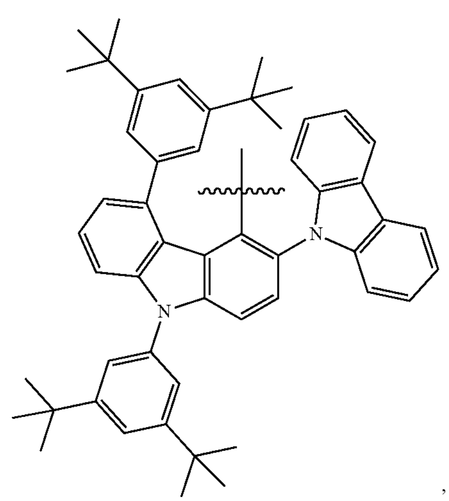
, -continued
R272
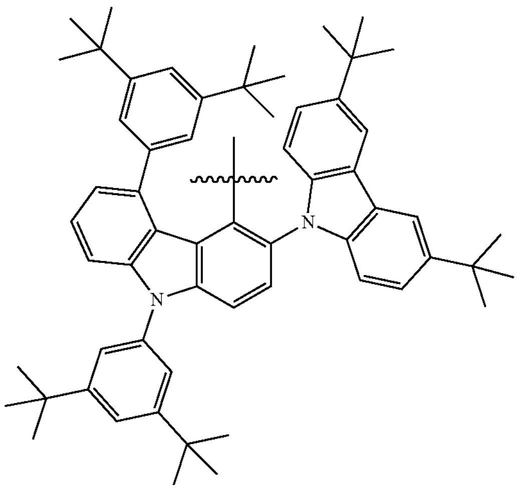
,
R273
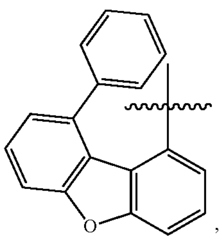
,
R274
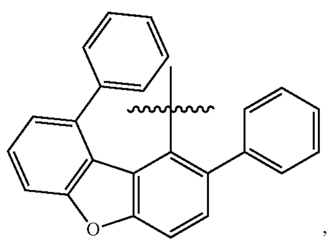
,
R275
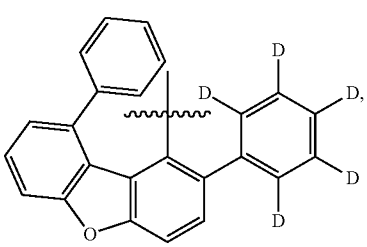
R276
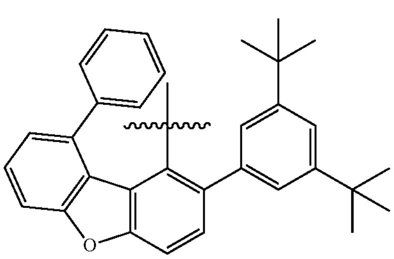
,
-continued
R277
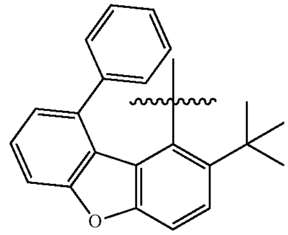
,
R278
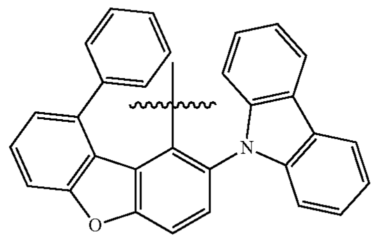
,
R279
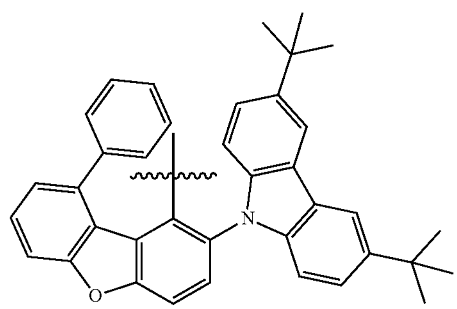
,
R280
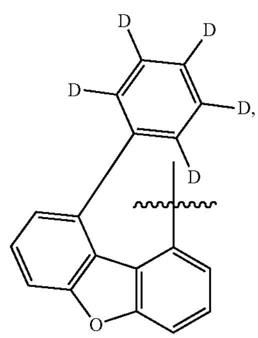
R281
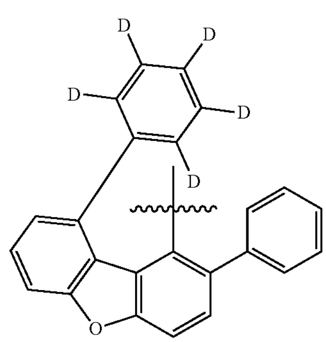
, -continued
R282
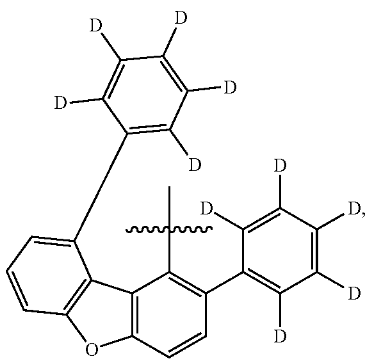
R283
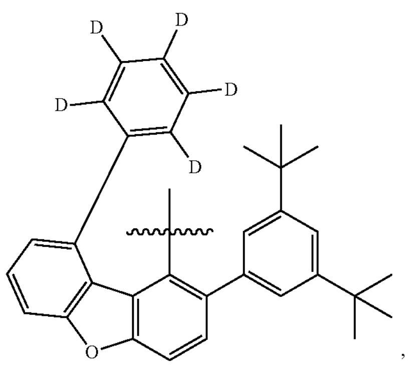
R284
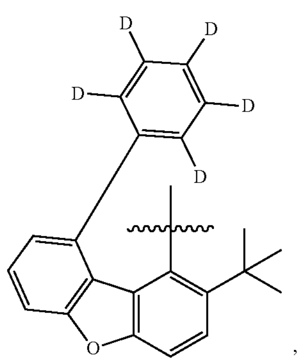
R285
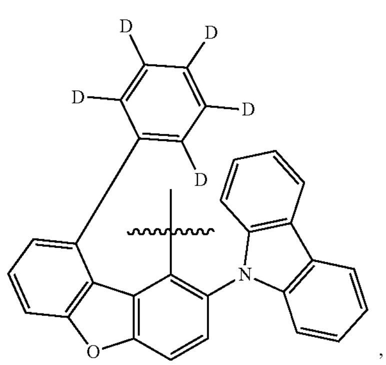
-continued
R286
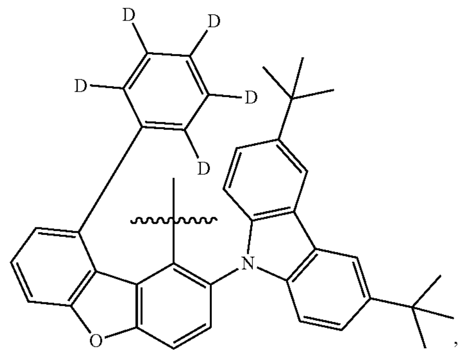
R287
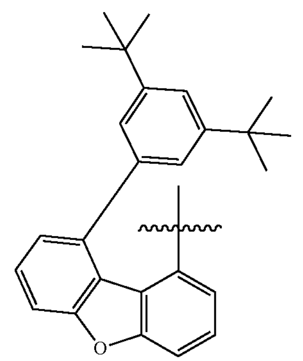
R288
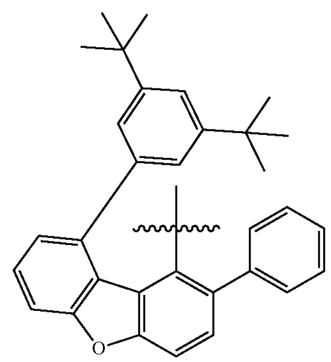
R289
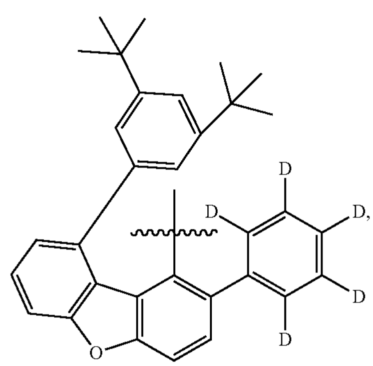

-continued
R290
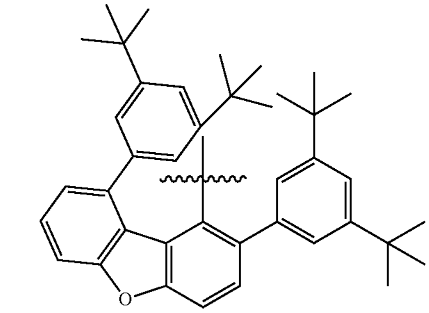
,
R291
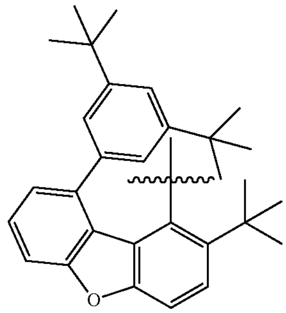
,
R292
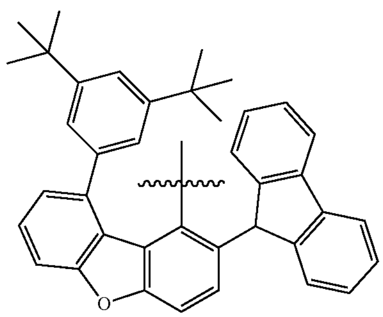
,
R293
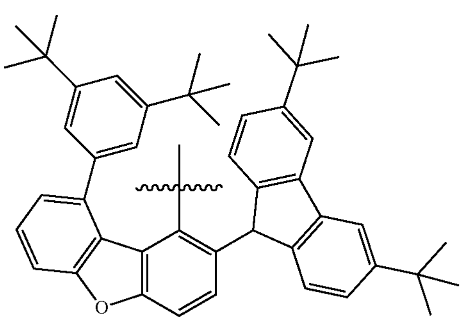
,
R294
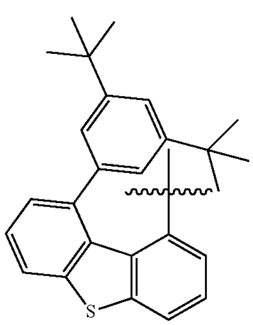
,
R295
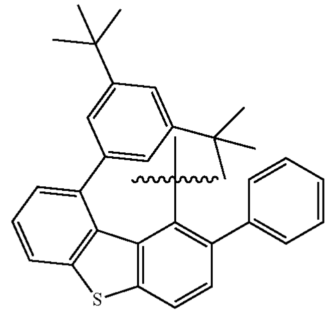
,
R296
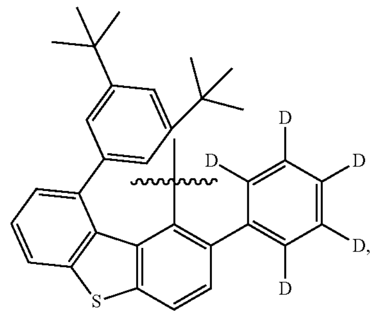
R297
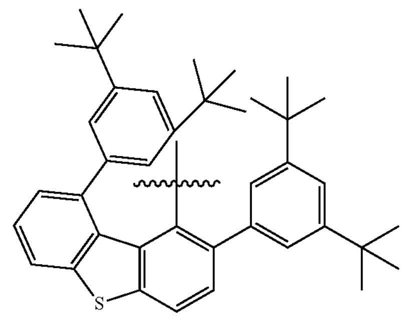
,
R298
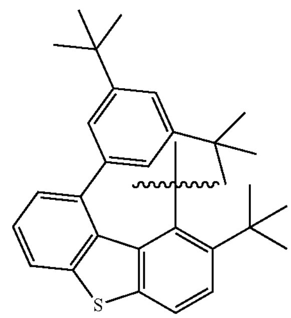
,
R299
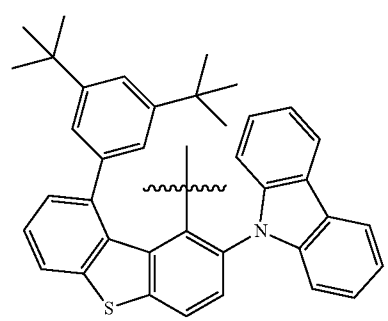
, -continued
R300
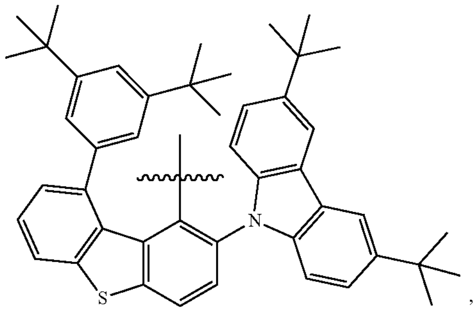
R301
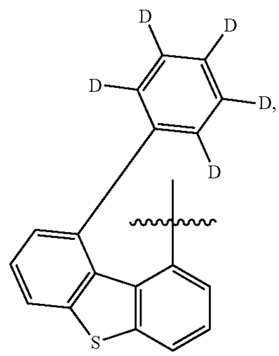
R302
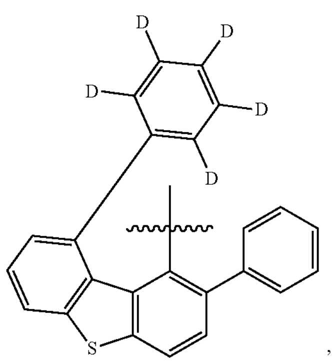
R303
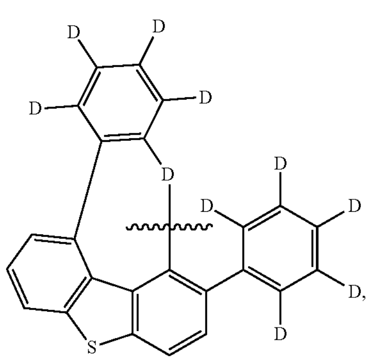
-continued
R304
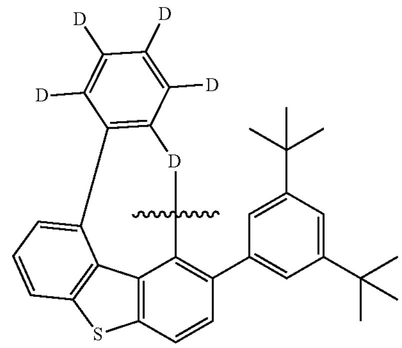
R305
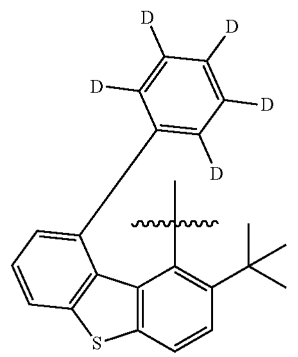
R306
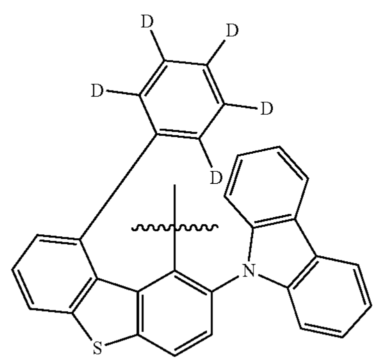
R307
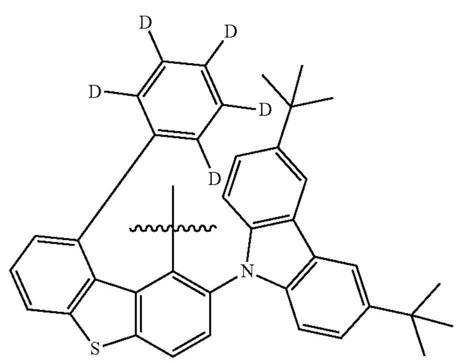

-continued
R308
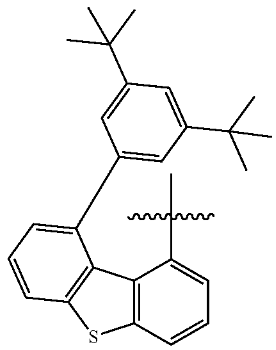
,
R309
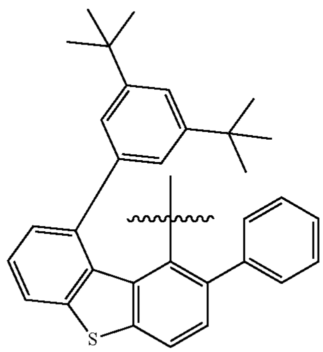
,
R310
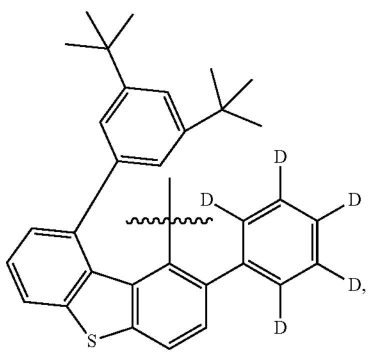
R311
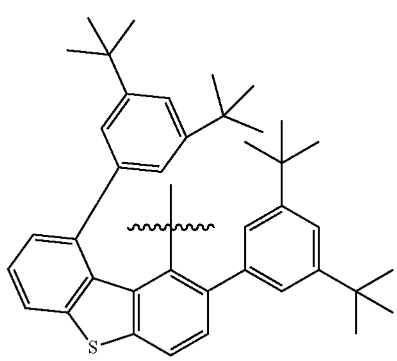
,
-continued
R312
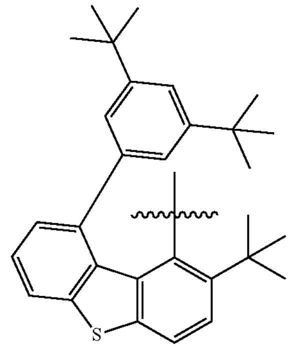
,
R313
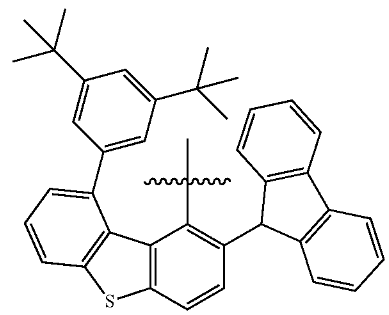
,
R314
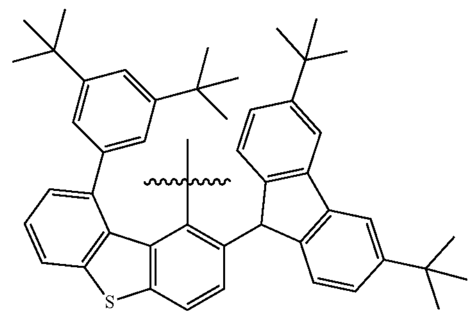
,
R315
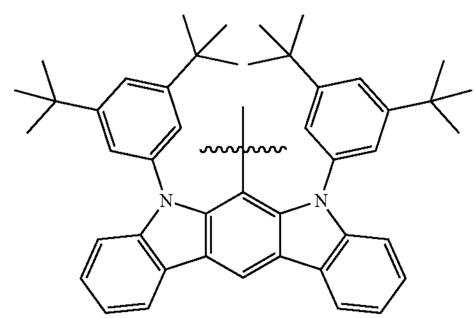
,
R316
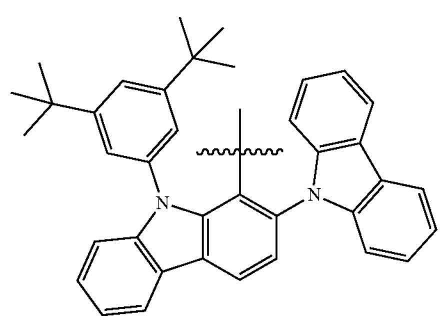
, -continued
R317
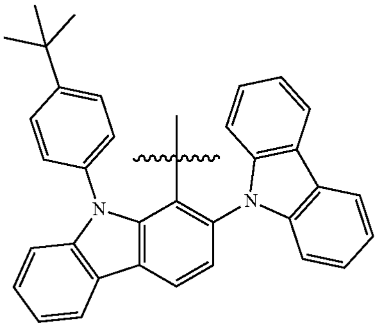
,
R318
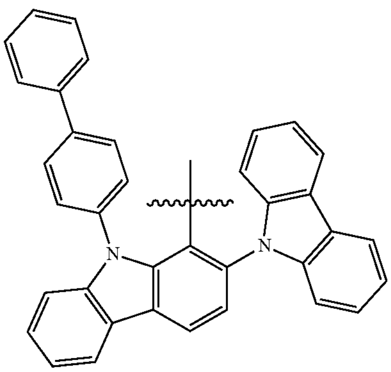
,
R319
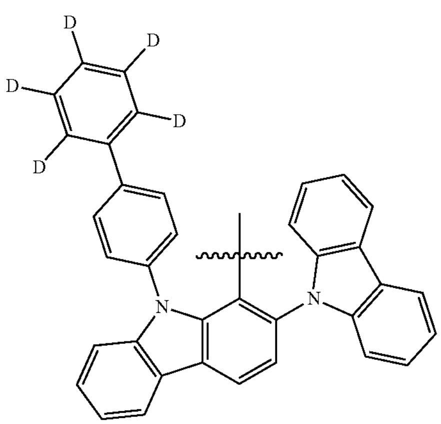
,
R320
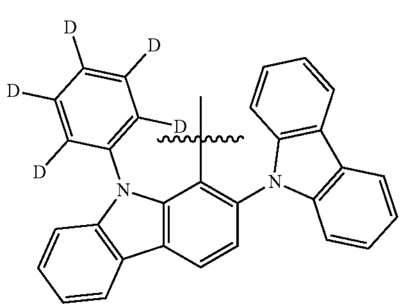
,
-continued
R321
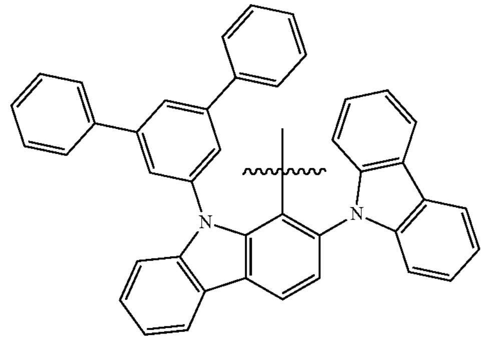
,
R322
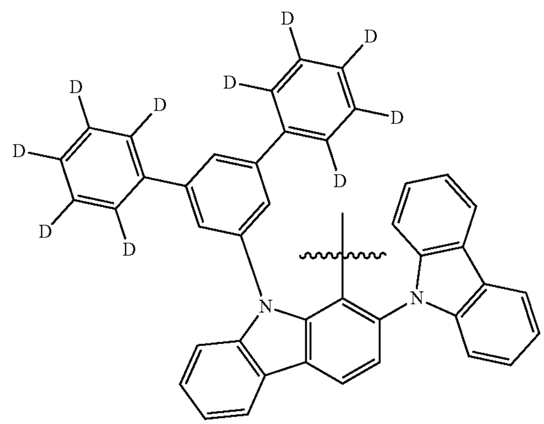
,
R323
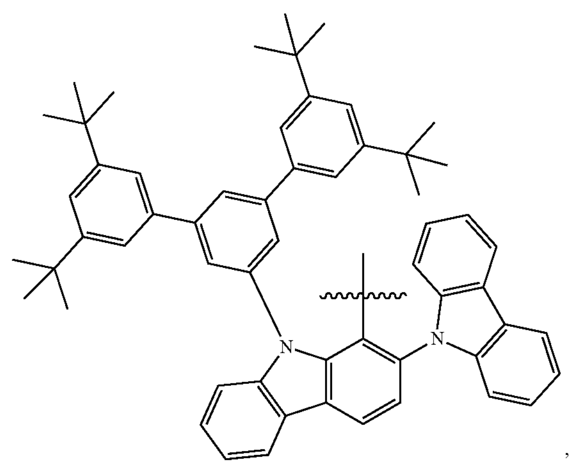
,
R324
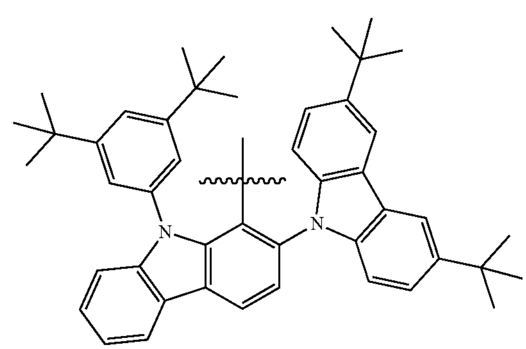
, -continued
R325
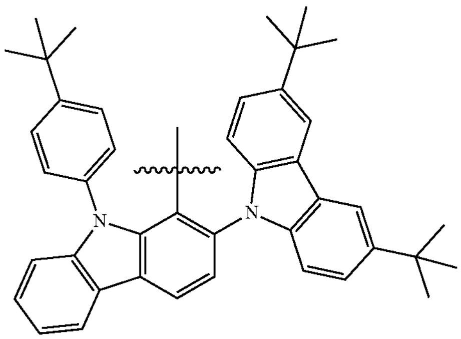
,
R326
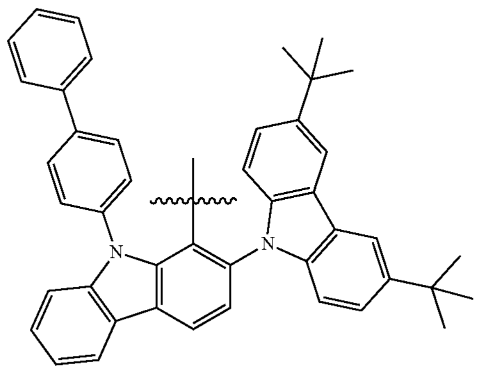
,
R327
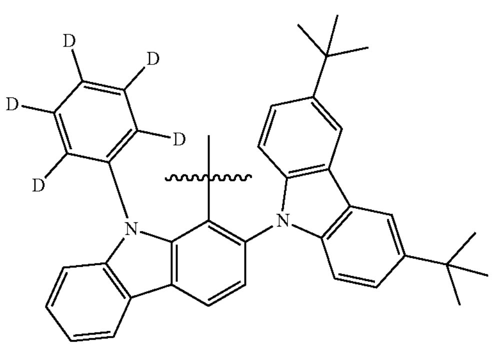
,
R328
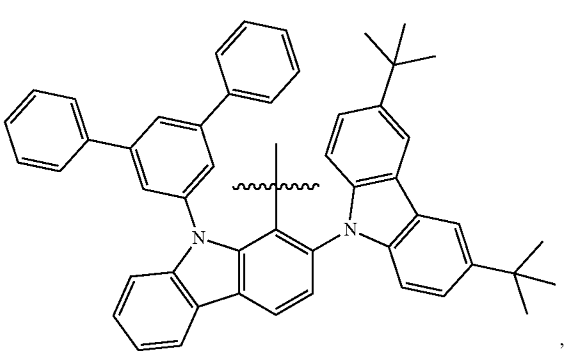
,
-continued
R329
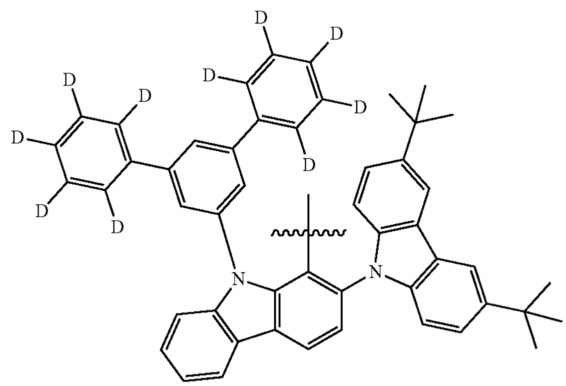
,
R330
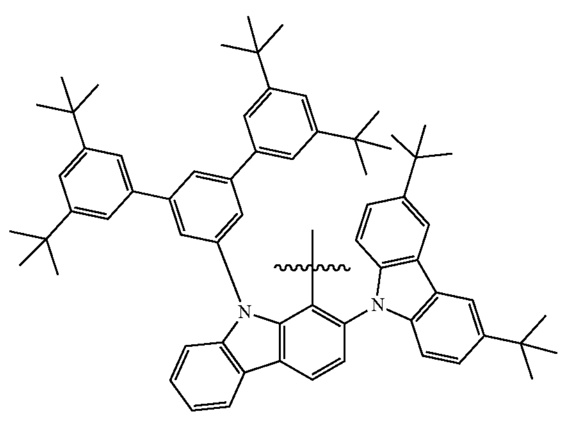
.
In one embodiment, when k=1 in the formulas for $L_{Ay}$ listed above, i is an integer from 1 to 10, or j is an integer from 1 to 10.
In some embodiments, A1, A2, A3, A5, A6, A7, A8, A9, A10, A11, A12, A13, A18, A19, A20, A21, and A23 are preferred. In some embodiments, R1, R10, R20, R22, R27, R28, R29, R37, R53, R66, R67, R68, R69, R70, R71, R72, R73, R74, R79, R87, R89, R90, R93, R94, R95, R96, R100, R101, R102, R103, R105, R116, R123, R128, R133, R134, R135, R136, R137, R138, R165, R166, R169, R170, R175, R176, R177, R178, R204, R211, R231, R232, R236, R252, R257, R273, R274, R276, R278, R287, R288, R292, R316, R322, R323 are preferred.

In some embodiments, the compound is disclosed from the group consisting of:
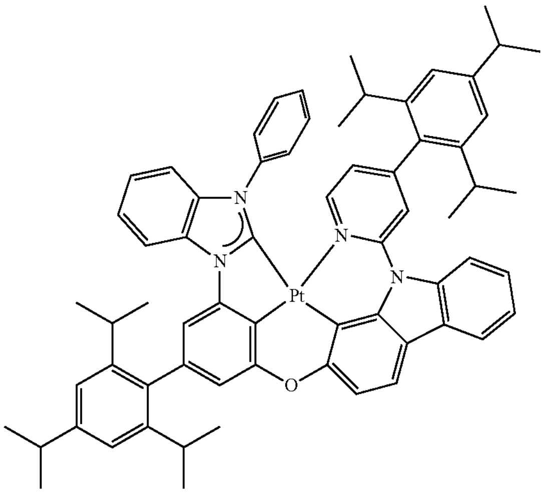
,
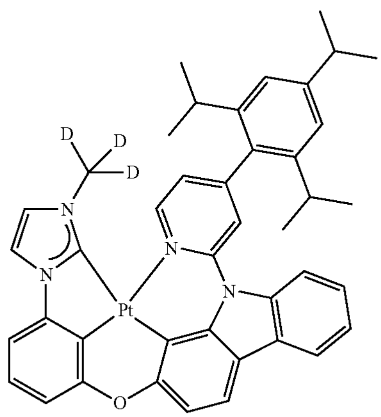
,
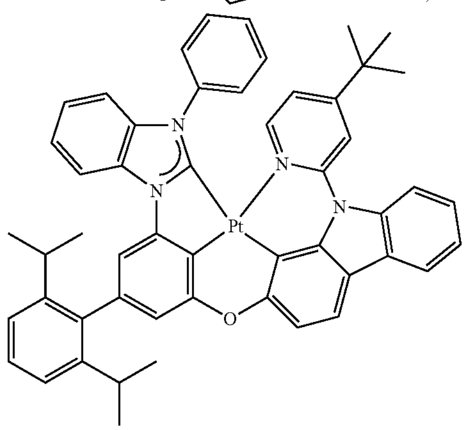
,
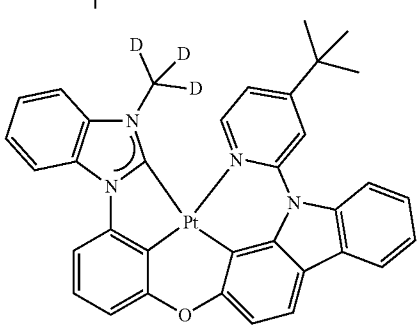
,
-continued
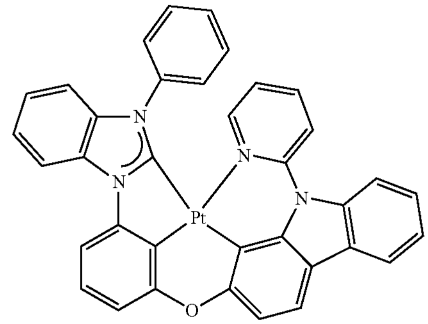
,
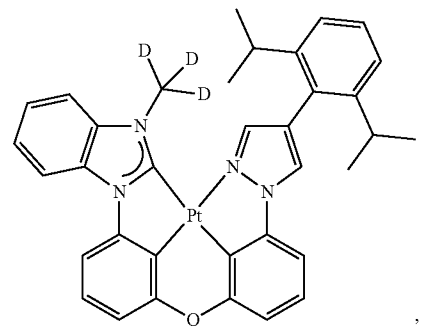
,
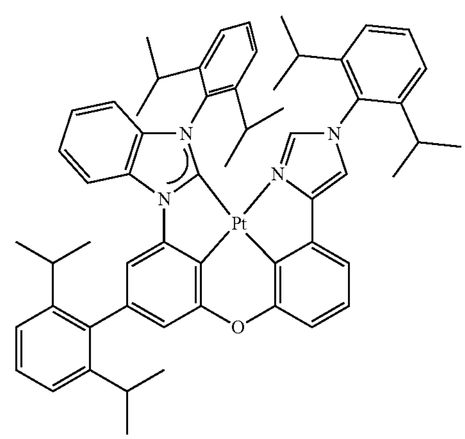
,
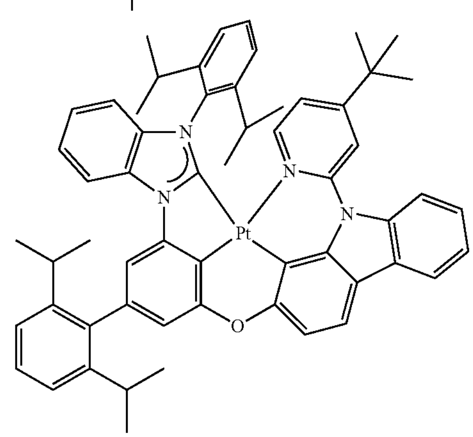
, -continued
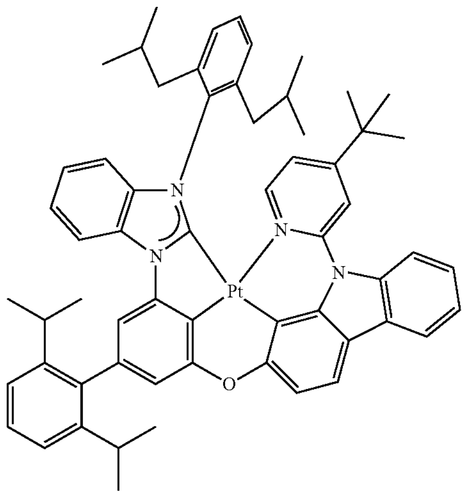
,
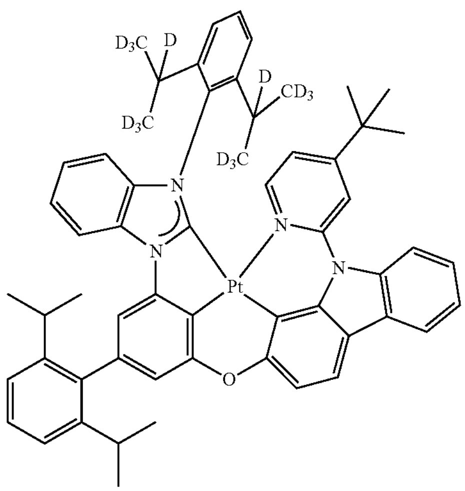
,
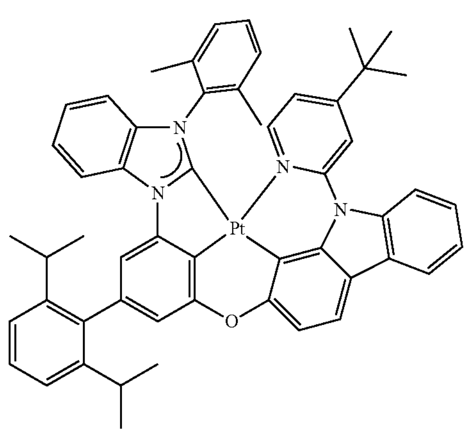
,
-continued
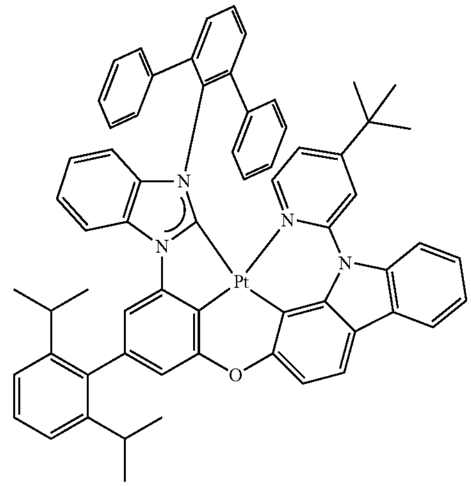
,
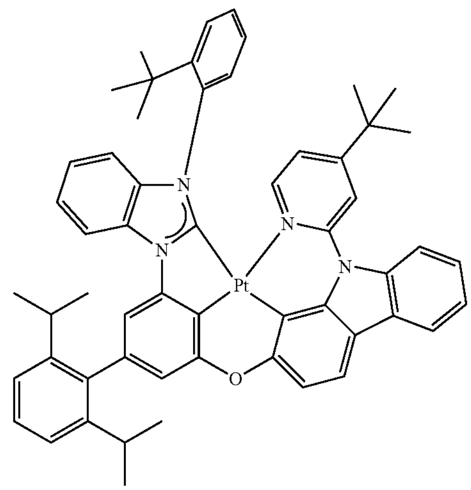
,
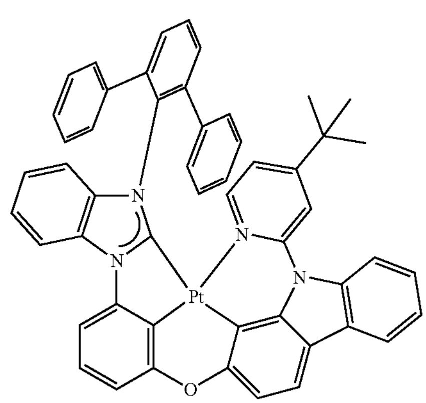
, -continued
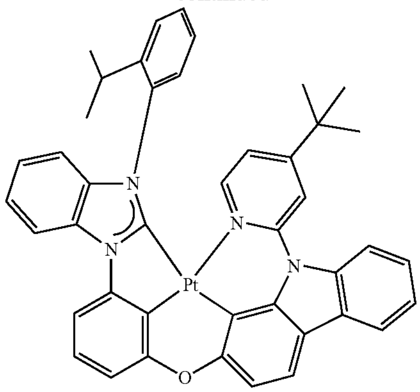
,
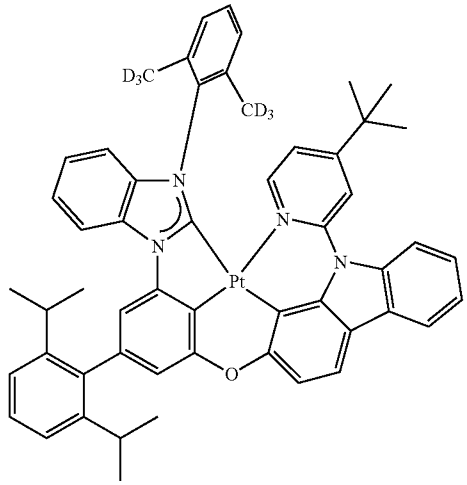
,
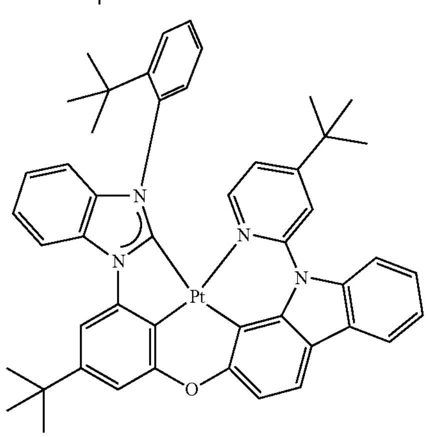
,
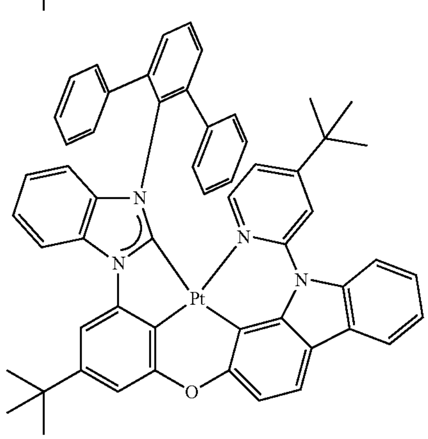
,
-continued
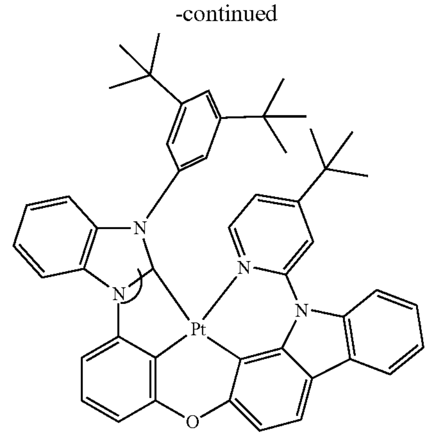
,
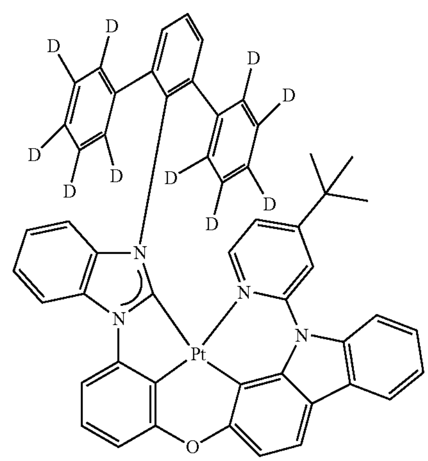
,
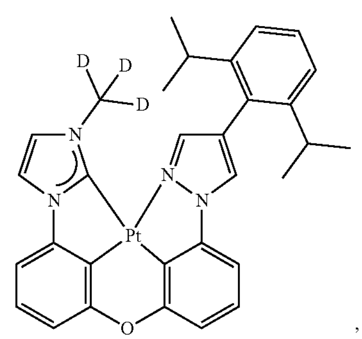
,
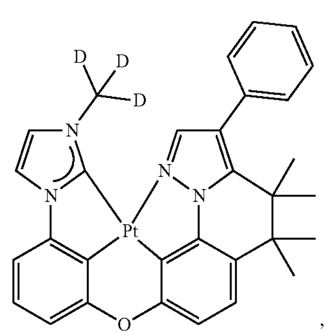
, -continued
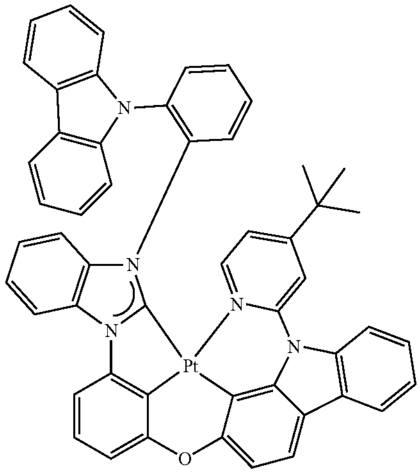
,
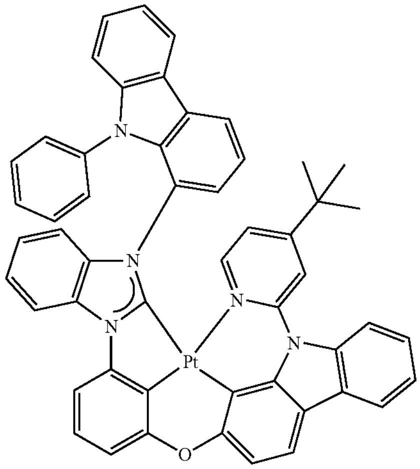
,
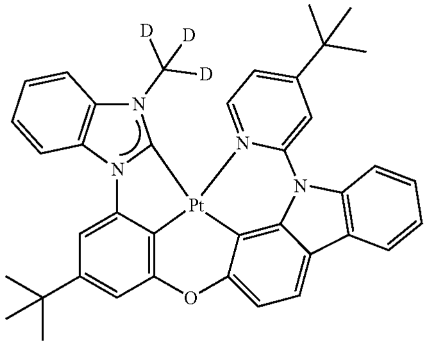
,
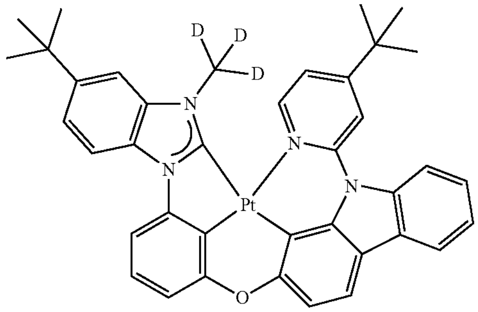
,
-continued
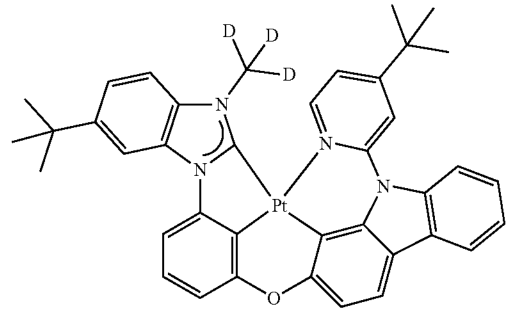
,
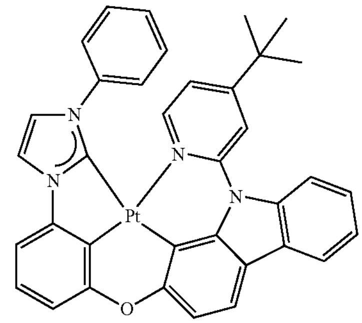
,
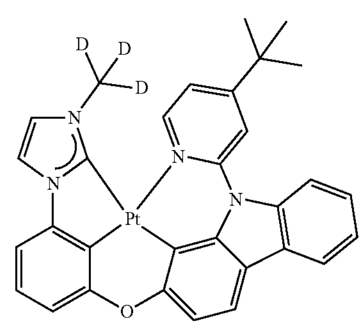
,
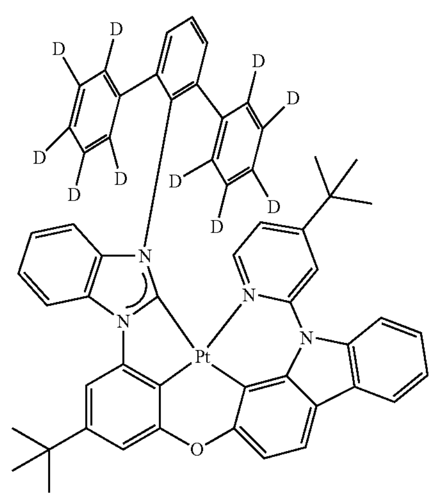
, -continued
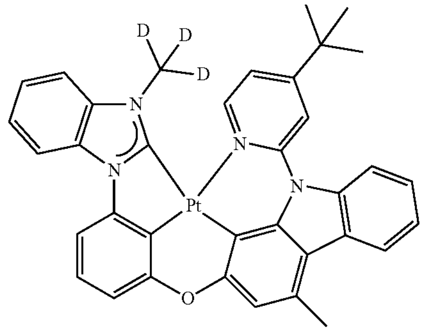
,
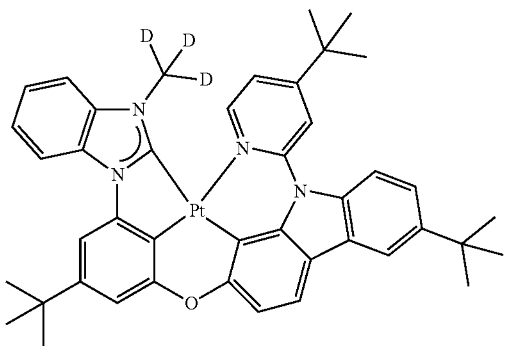
,
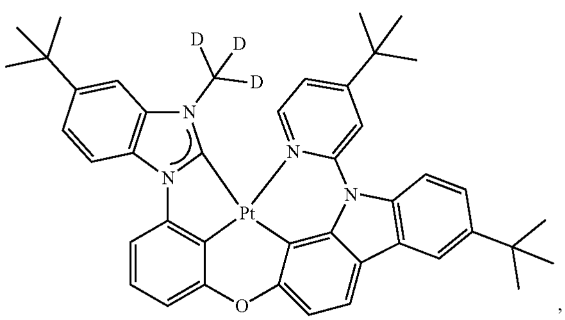
,
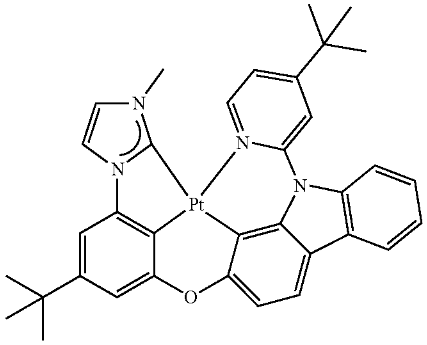
,
-continued
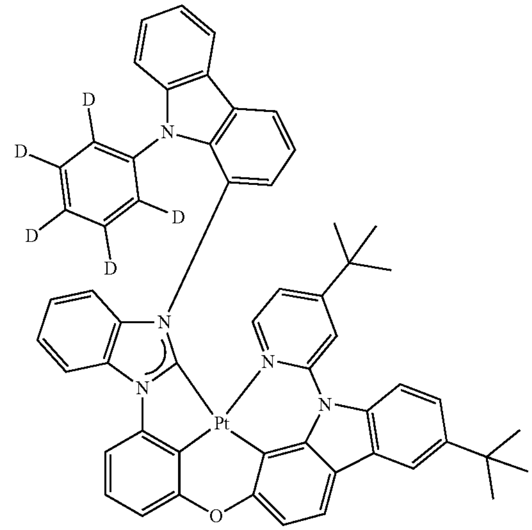
,
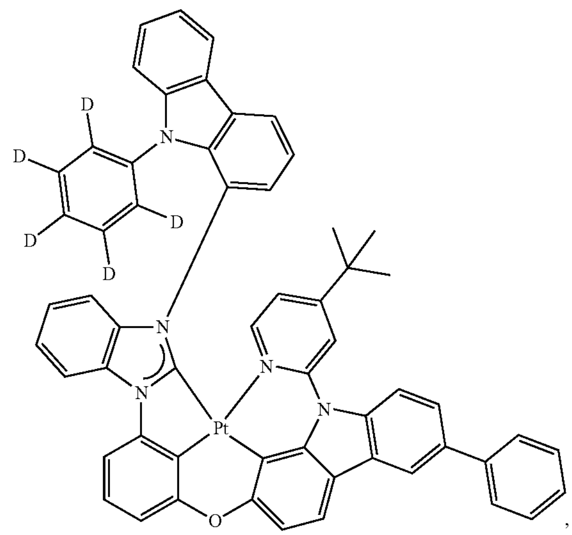
,
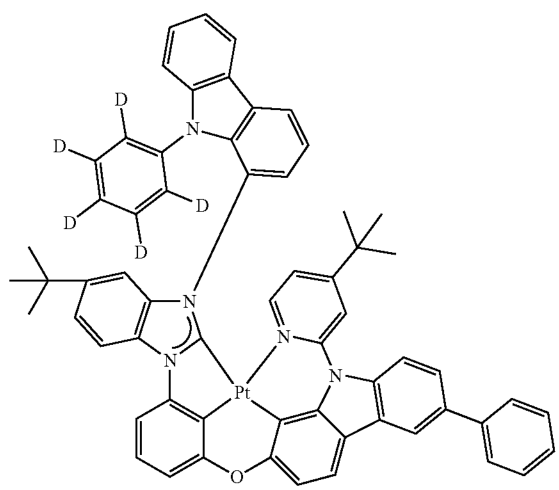
, -continued
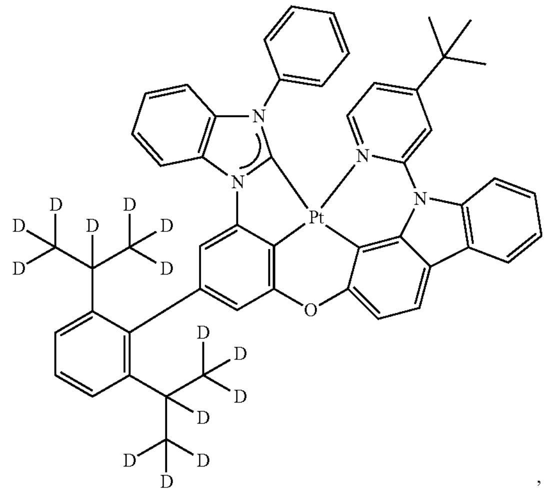
,
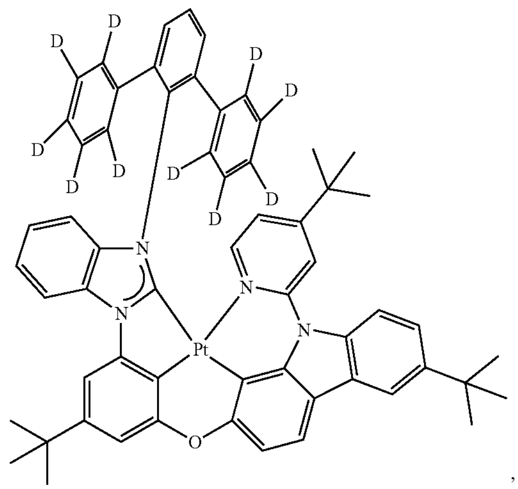
,
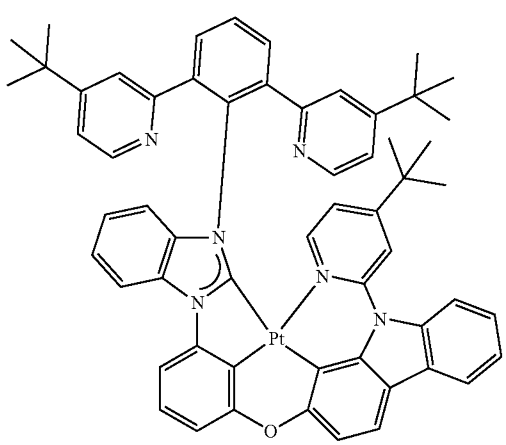
,
-continued
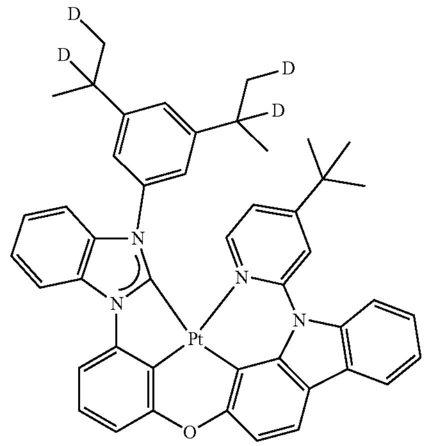
,
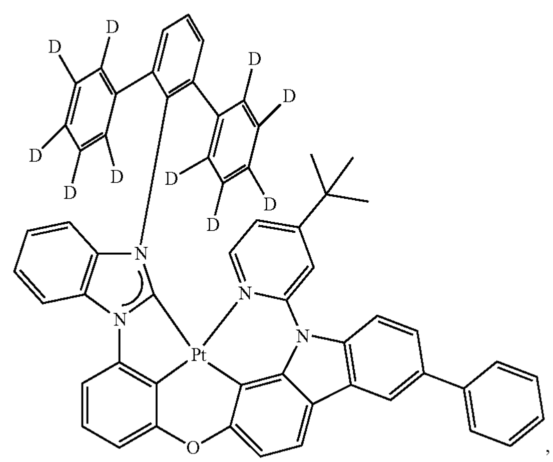
,
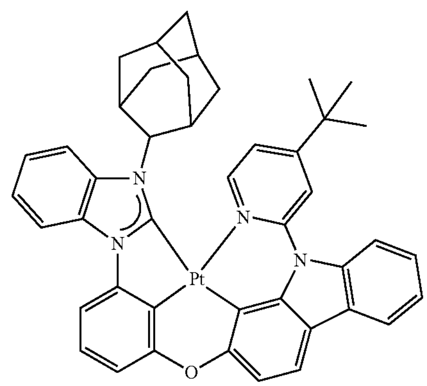
,
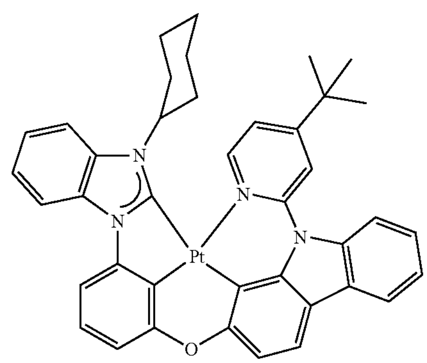
, -continued
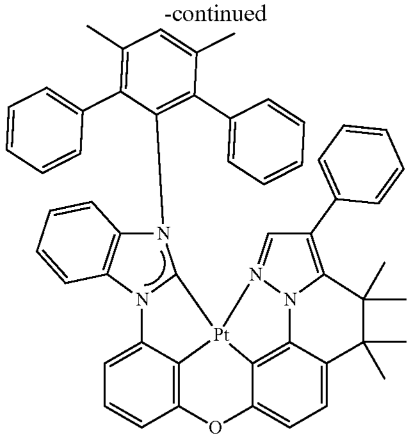
,
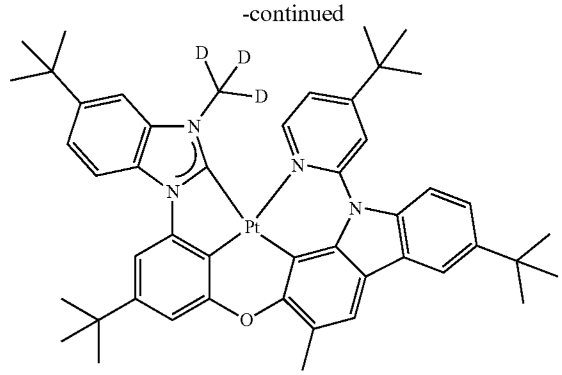
,
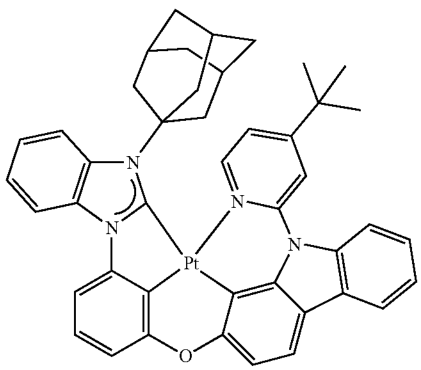
,
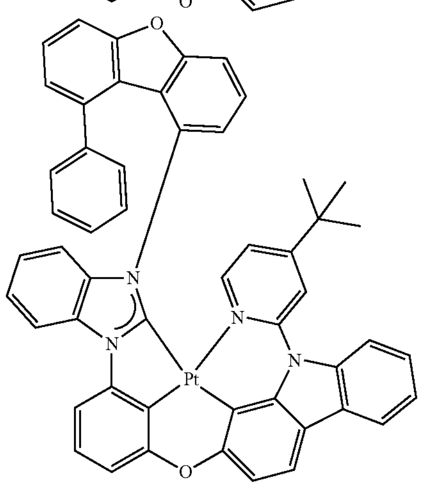
,
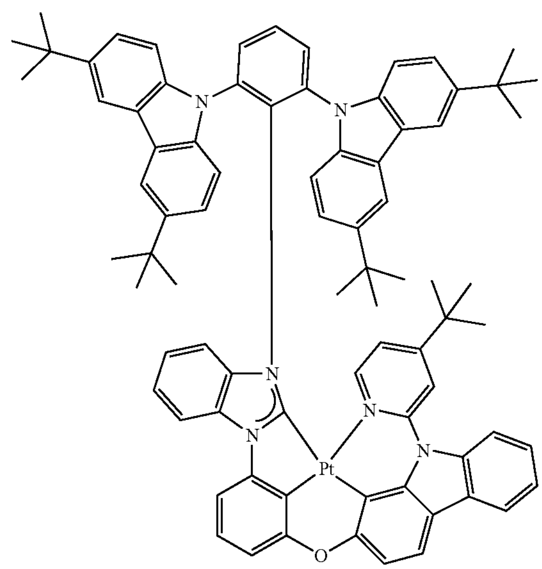
,
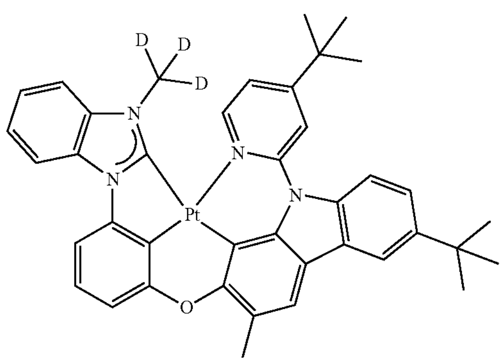
,
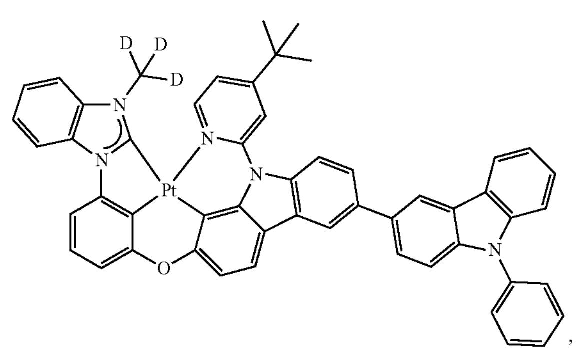
, -continued
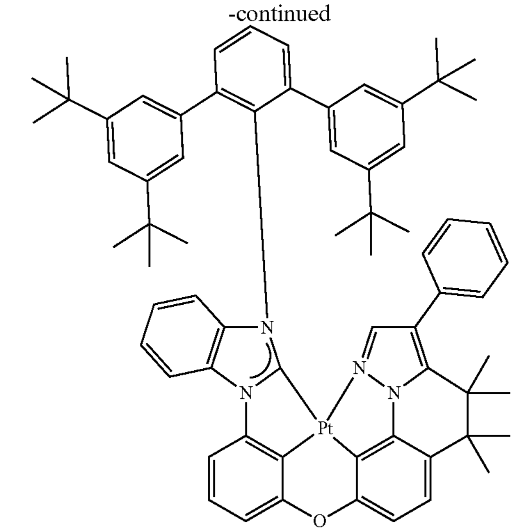
,
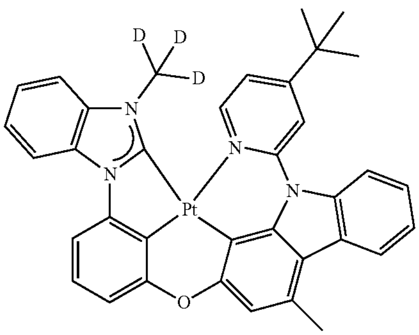
,
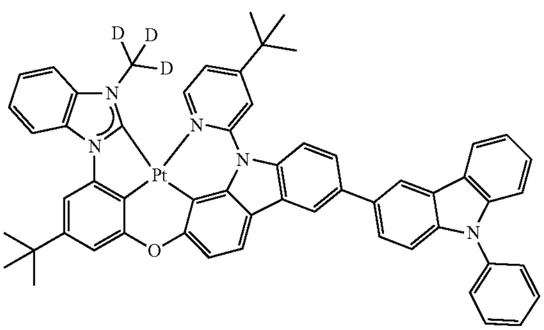
,
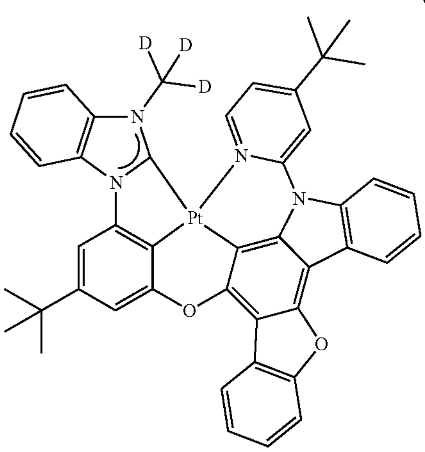
,
-continued
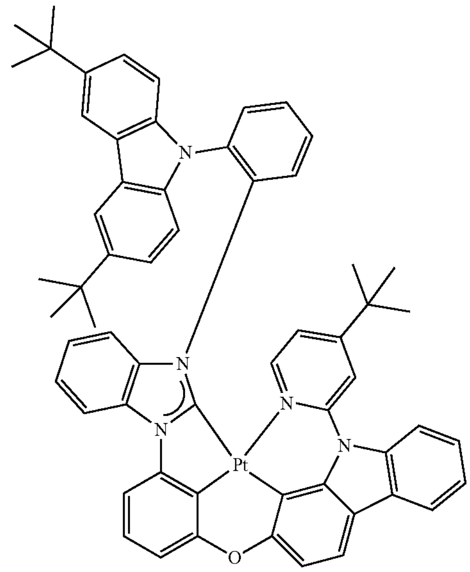
,
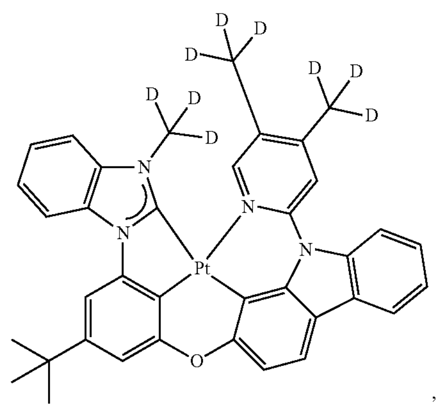
,
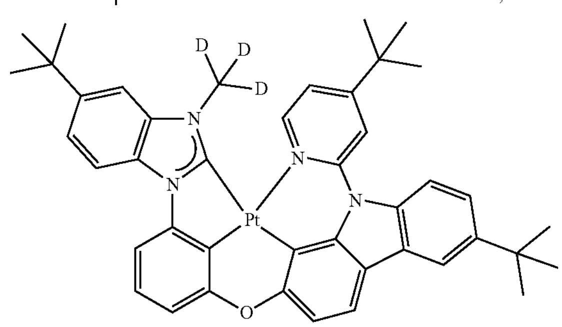
,
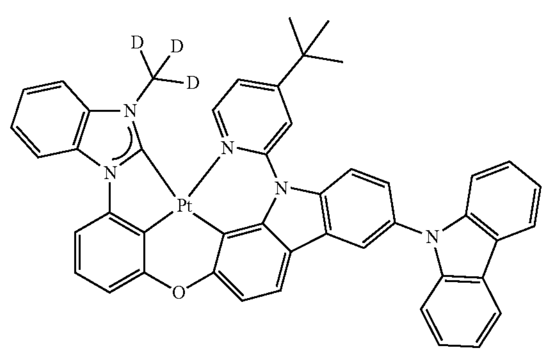
, -continued
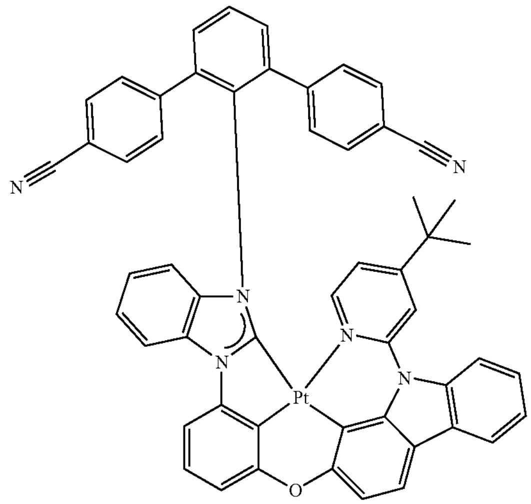
,
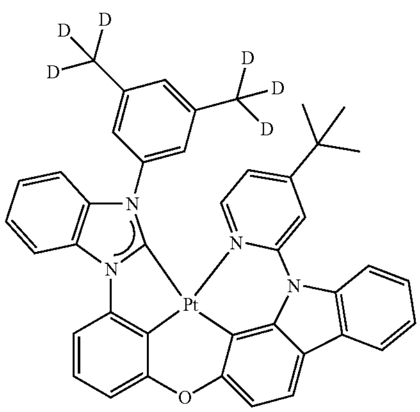
,
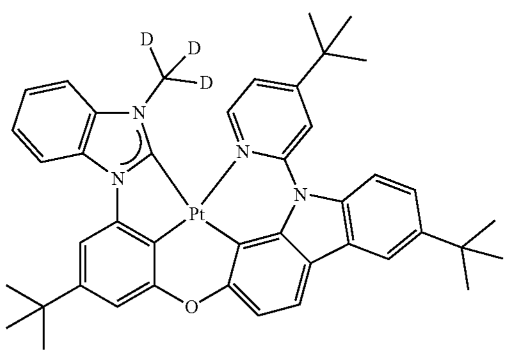
,
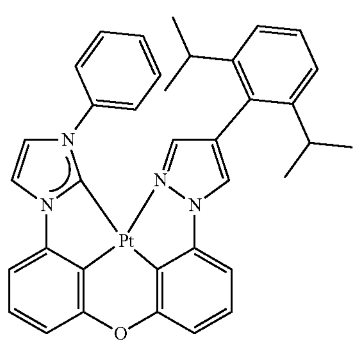
,
-continued
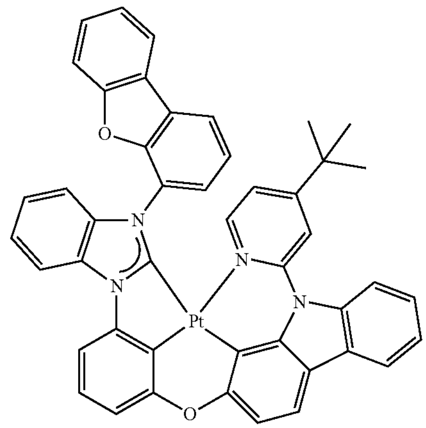
,
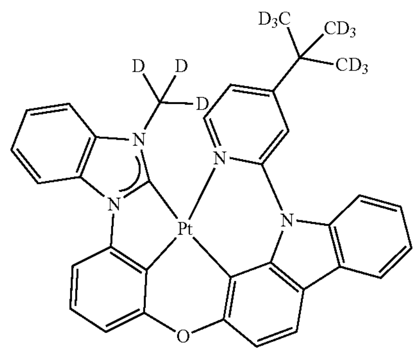
,
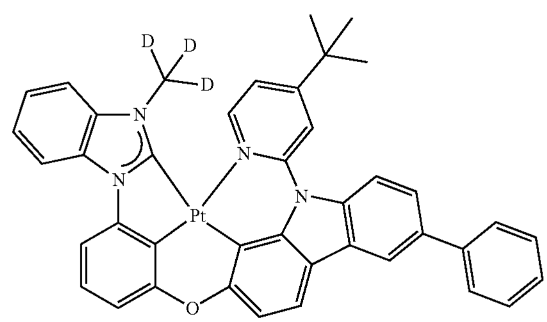
,
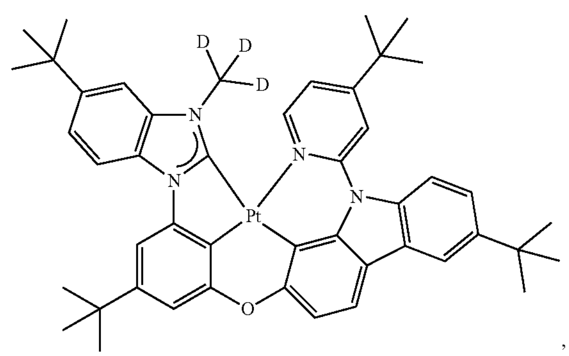
, -continued
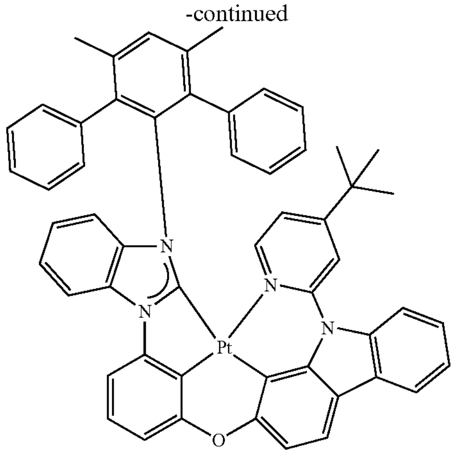
,
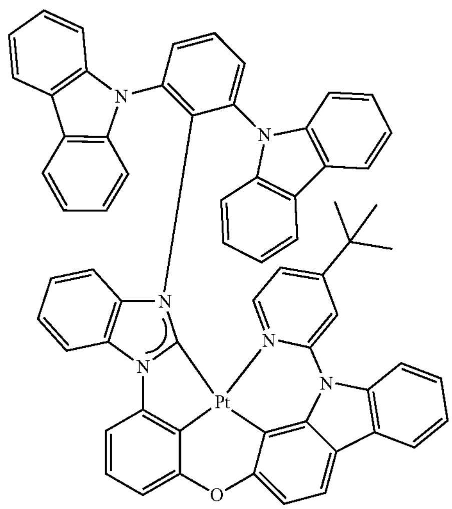
,
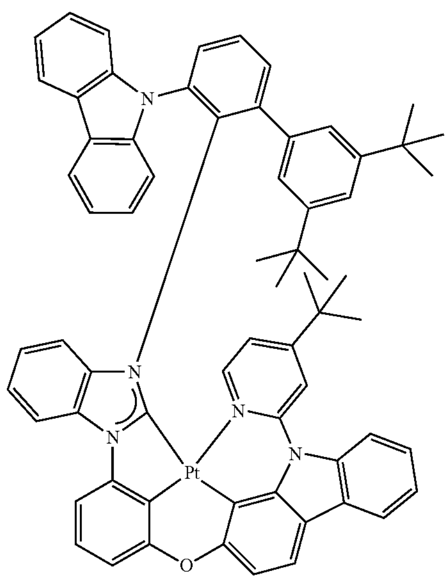
,
-continued
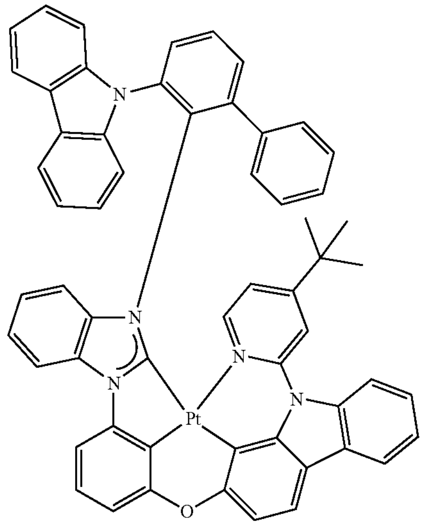
,
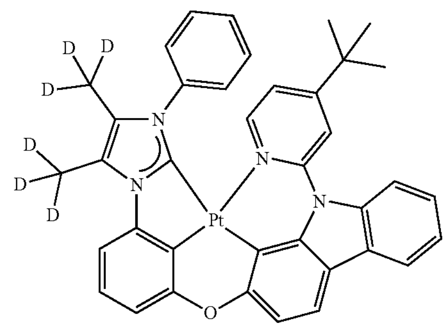
,
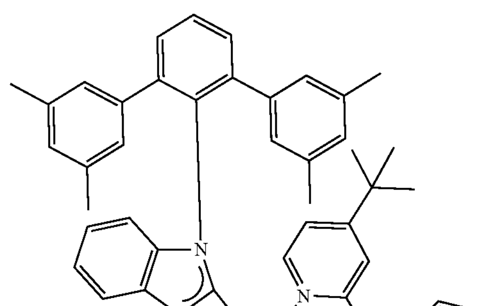
, -continued
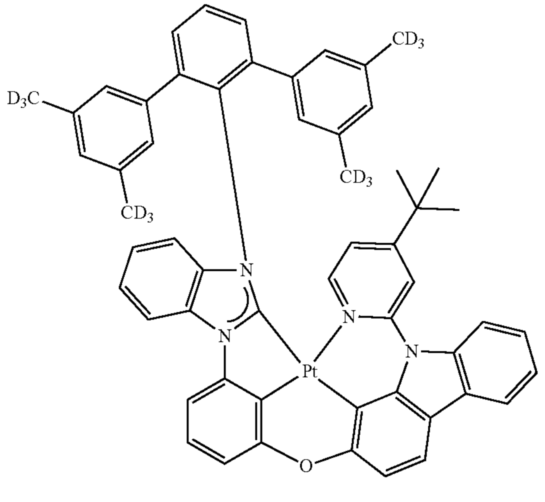
,
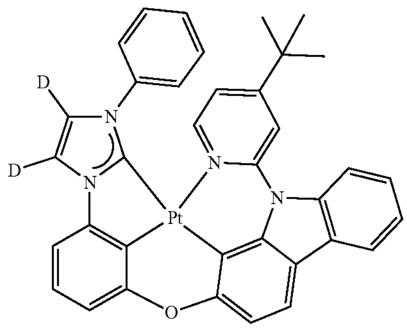
,
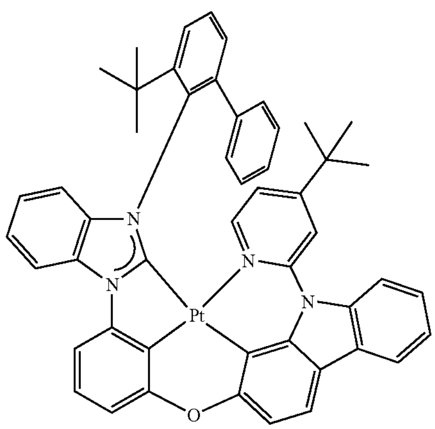
,
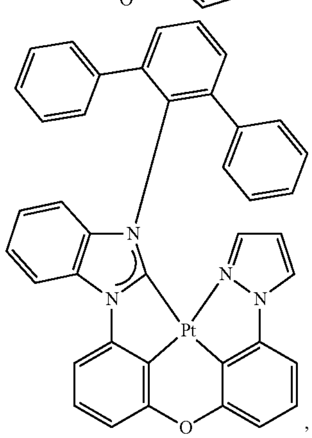
,
-continued
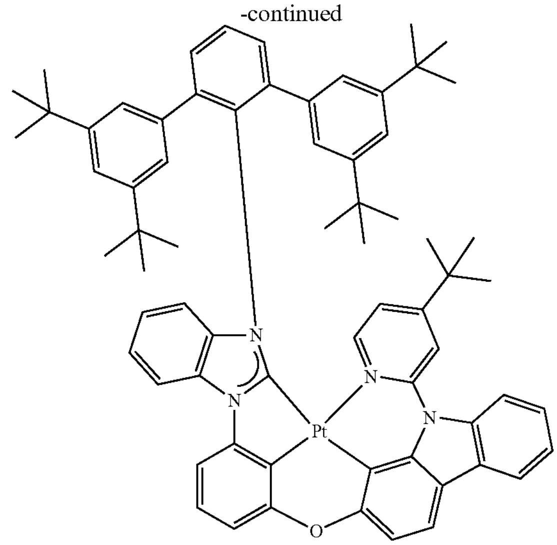
,
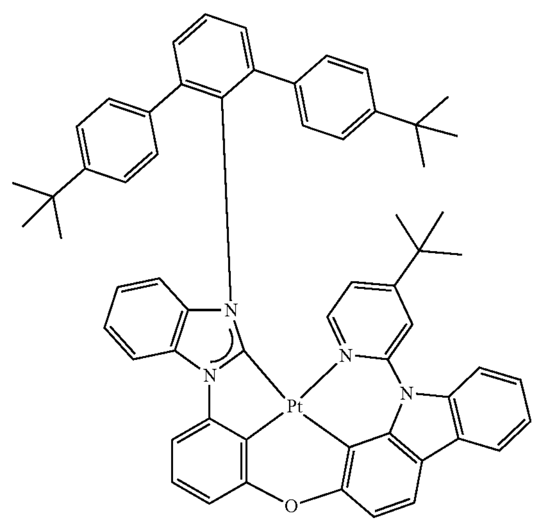
,
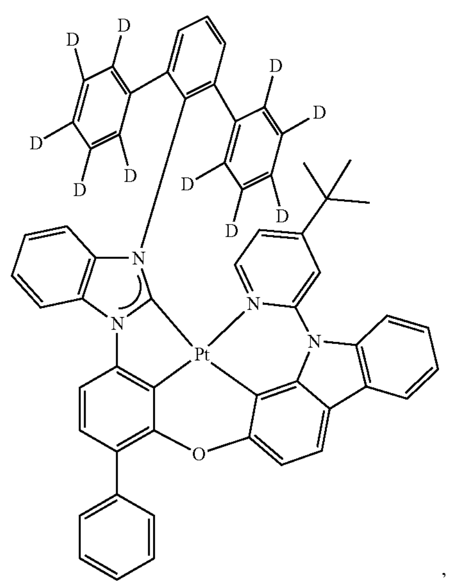
, -continued
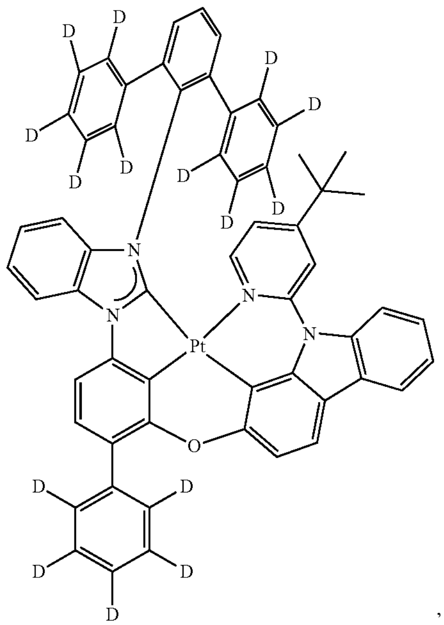
,
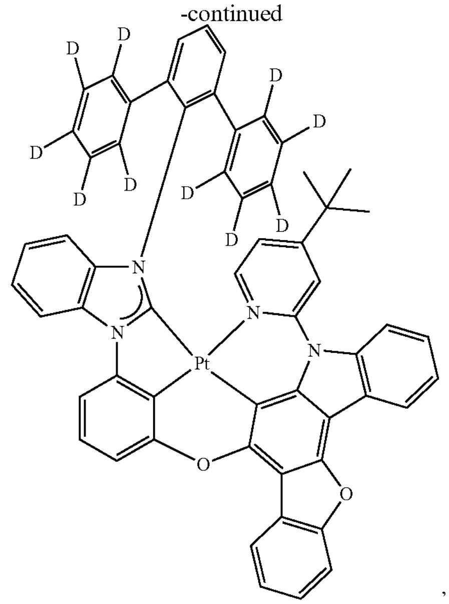
,
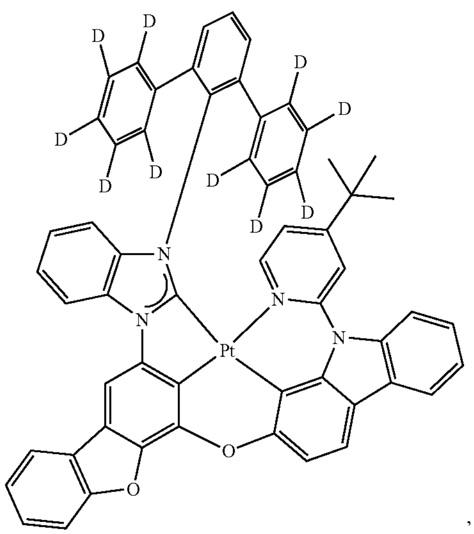
,
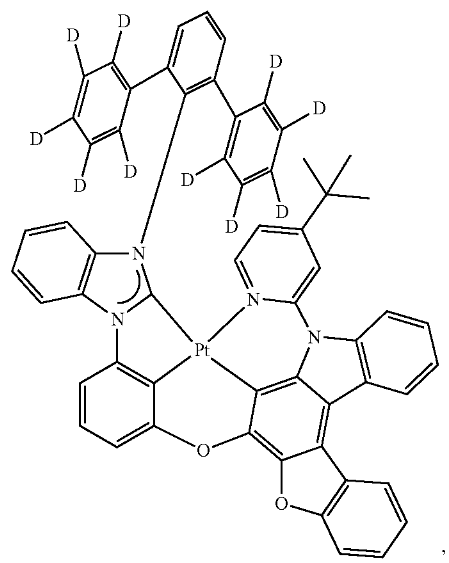
,
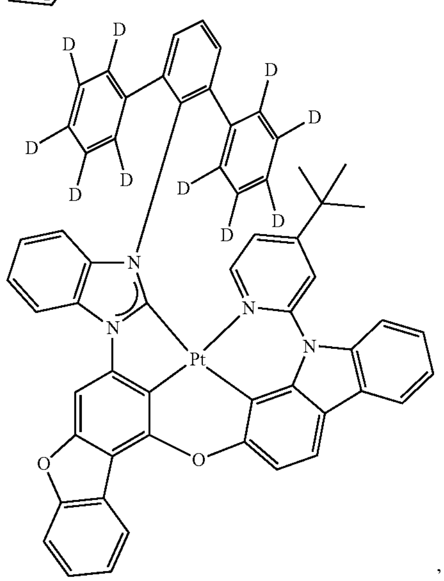
,
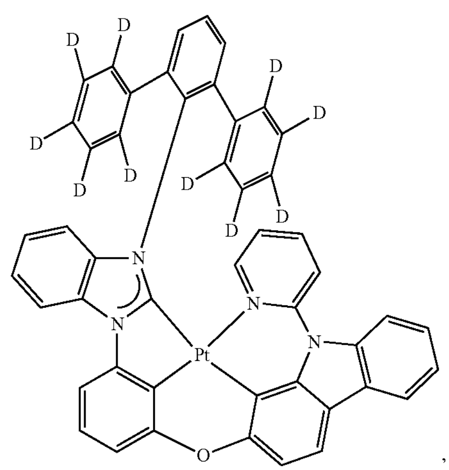
, -continued
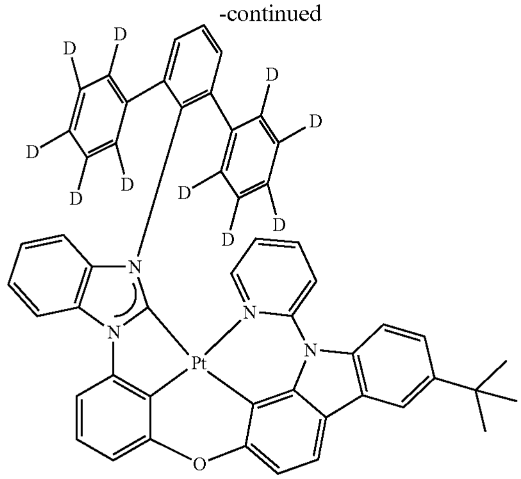
,
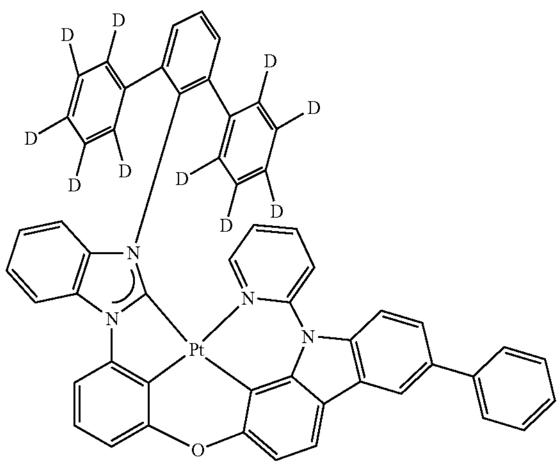
,
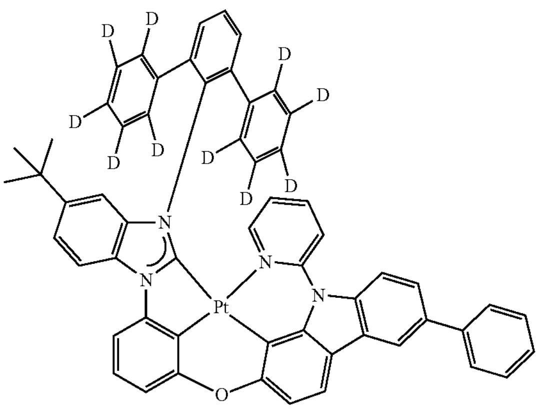
,
-continued
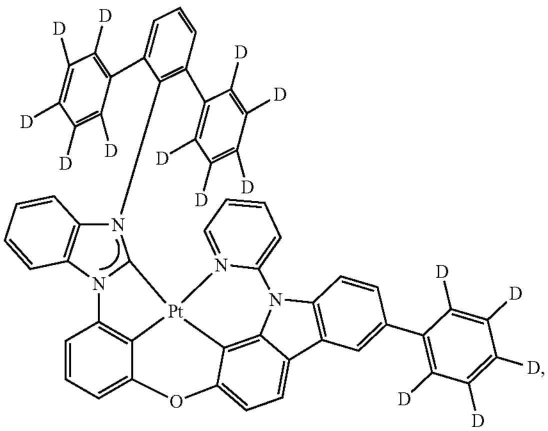
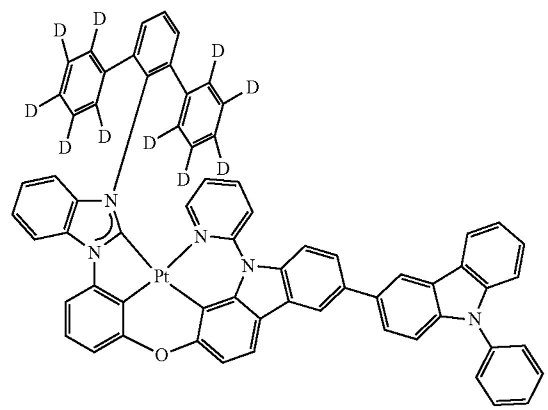
,
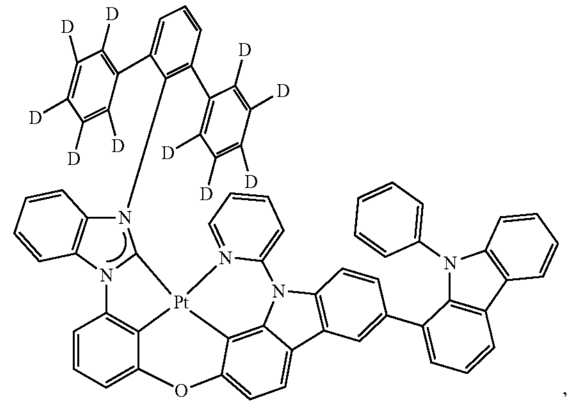
,
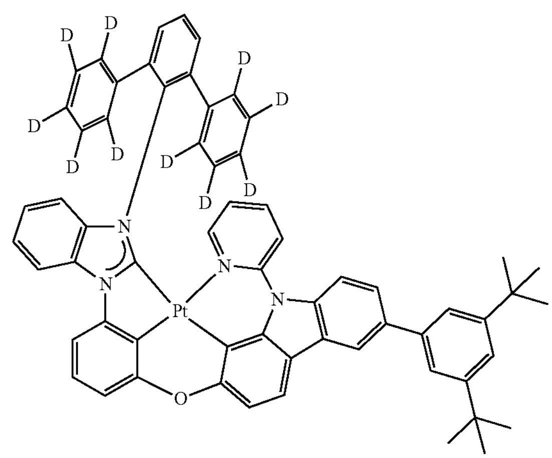
, -continued
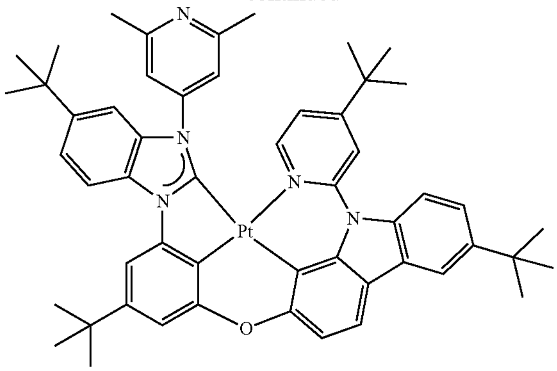
,
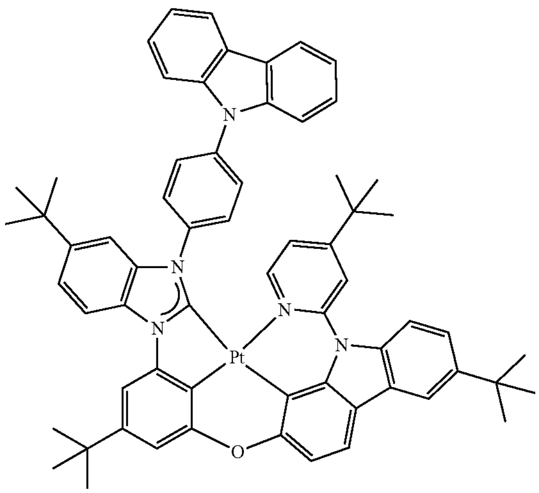
,
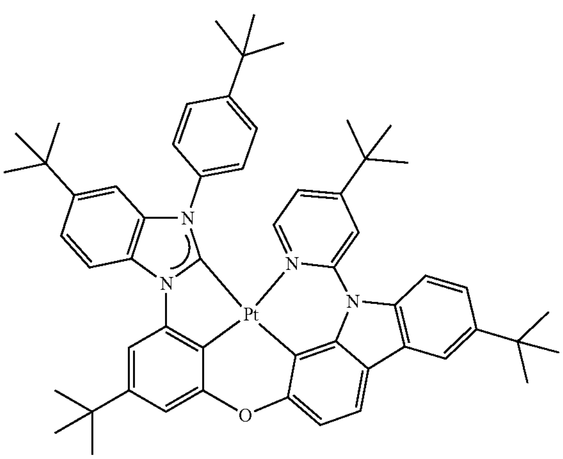
,
-continued
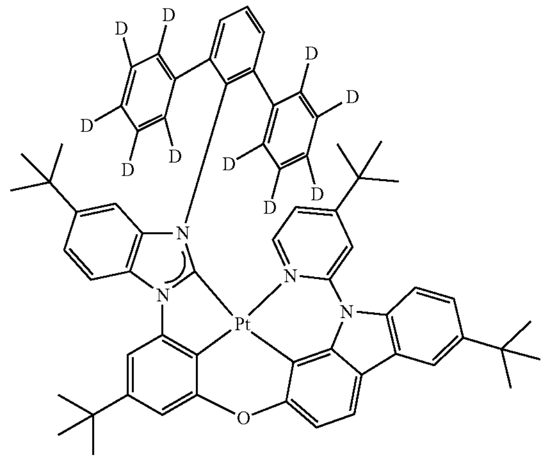
,
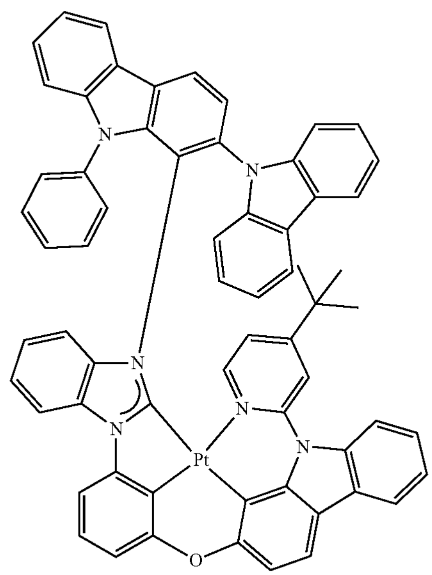
,
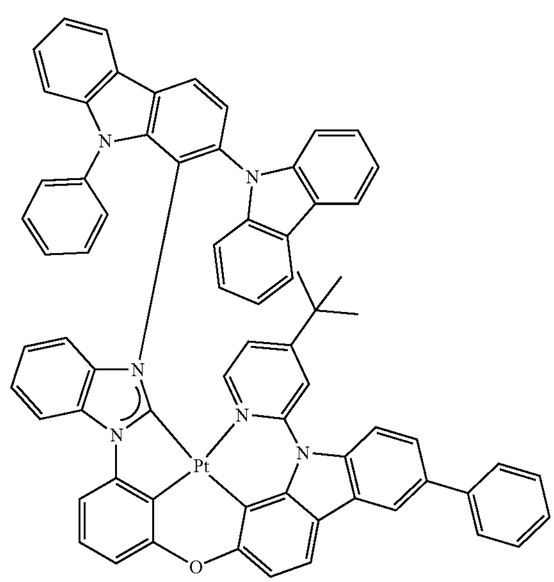
, -continued
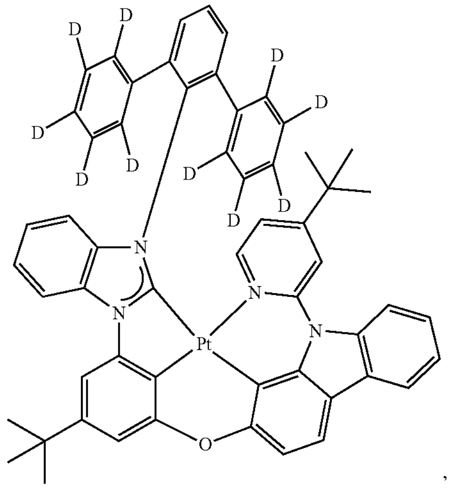
,
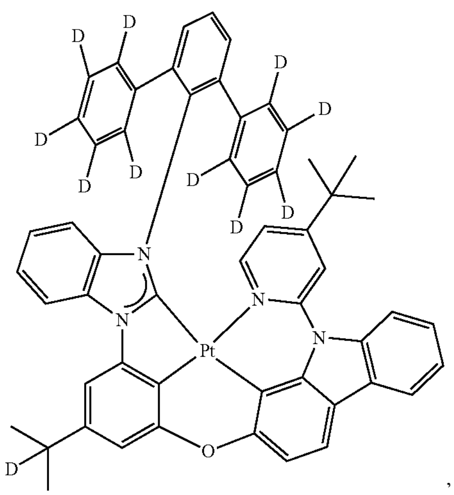
,
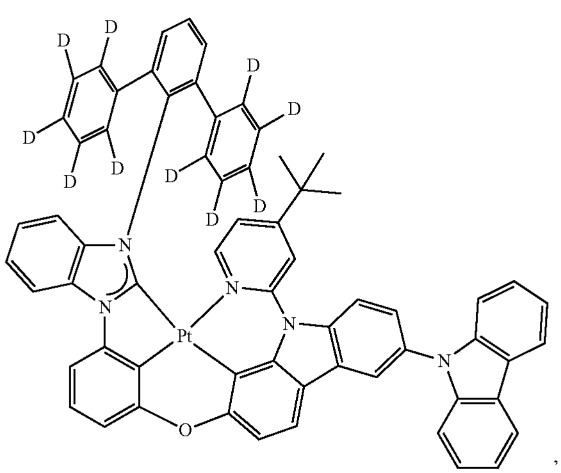
,
-continued
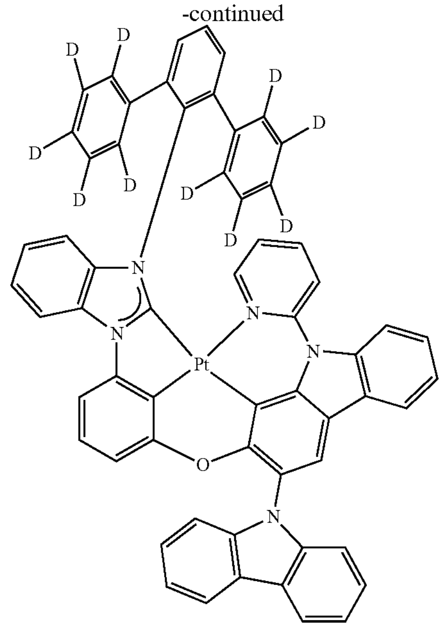
,
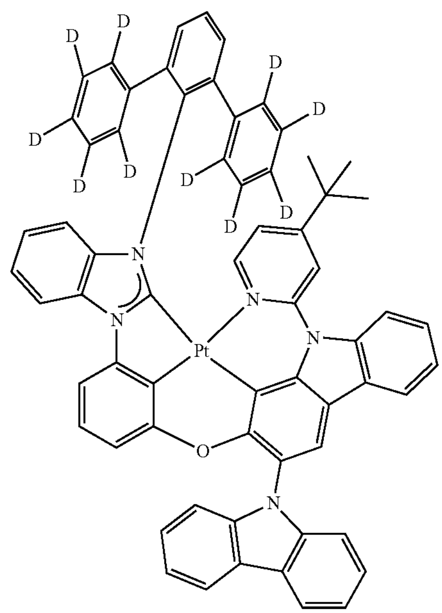
,
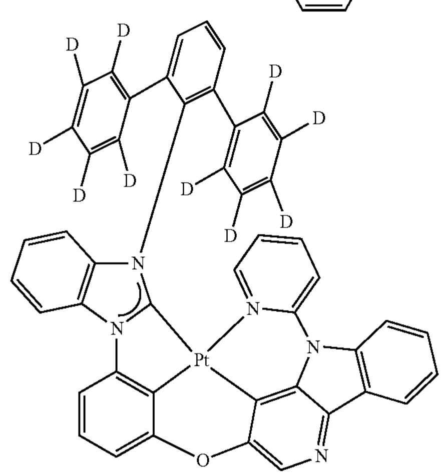
, -continued
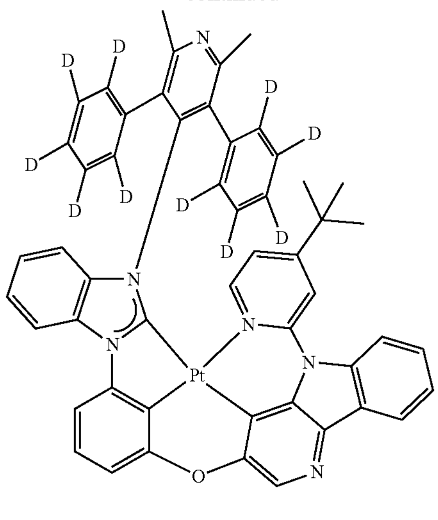
,
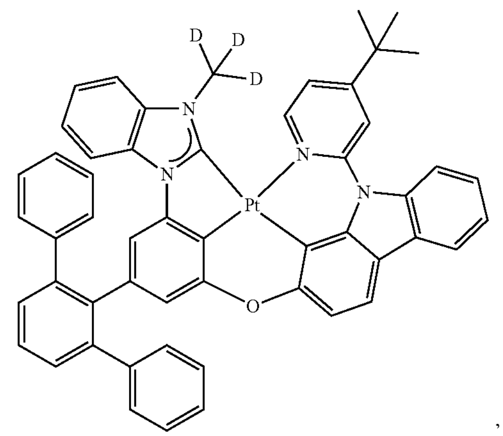
,
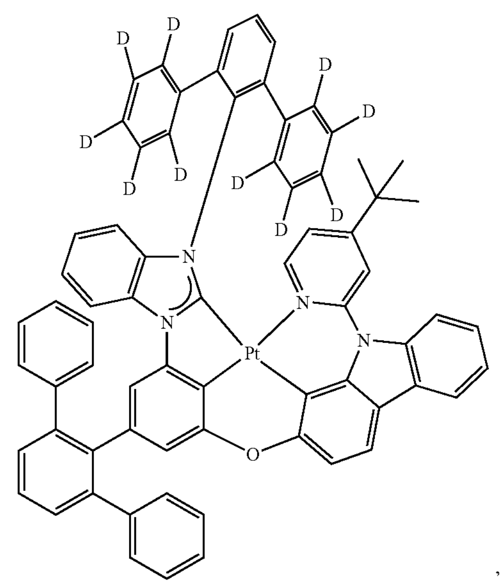
,
-continued
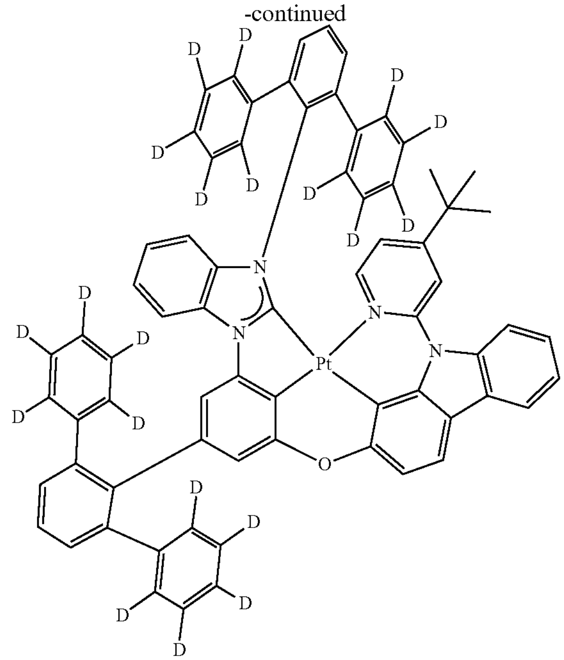
,
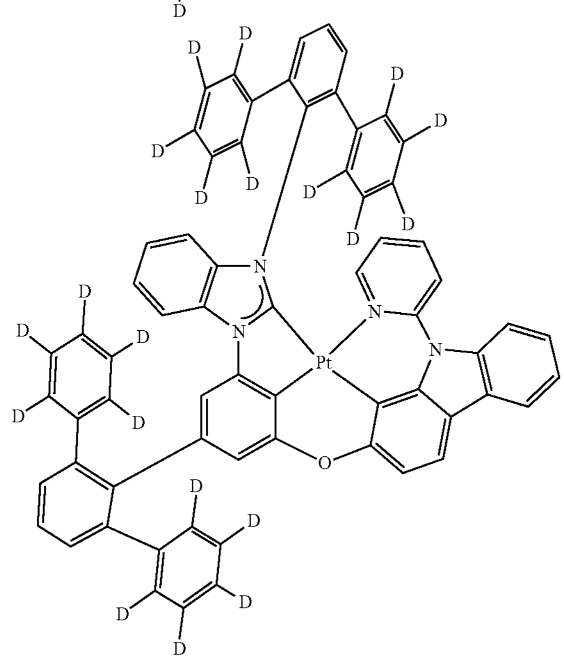
,
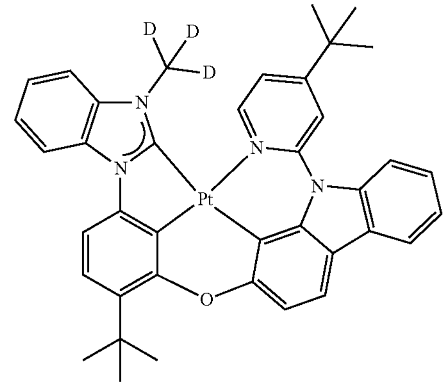
, -continued
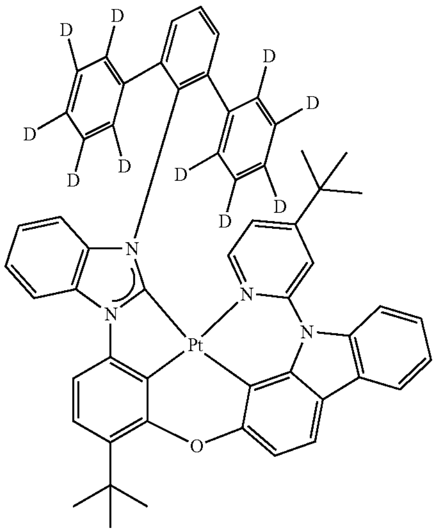
,
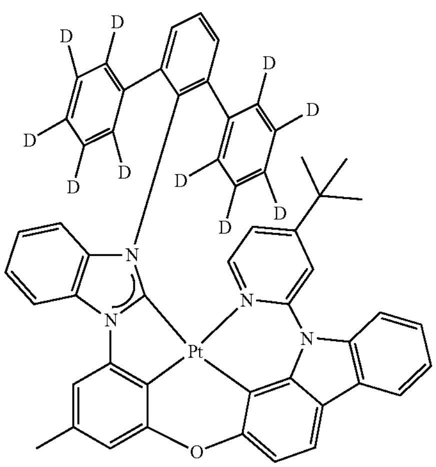
,
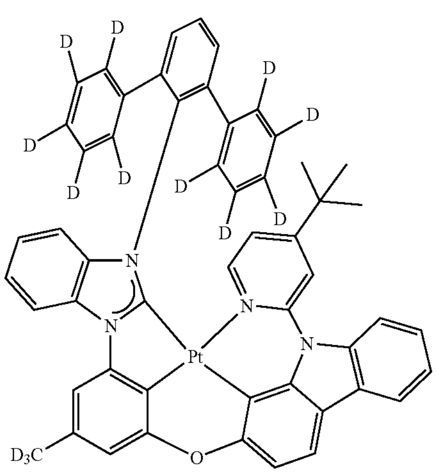
,
-continued
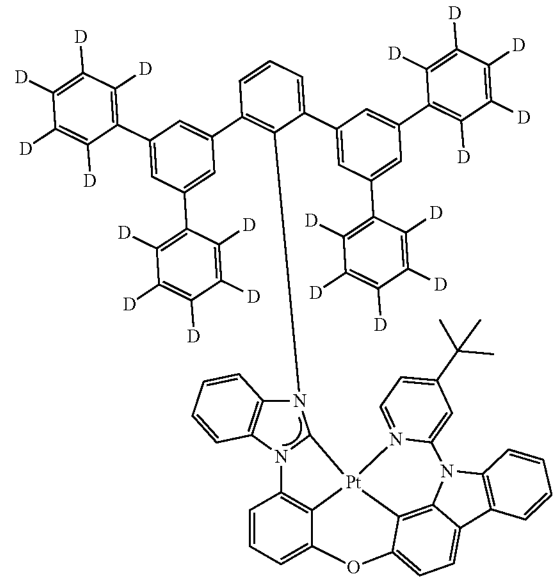
,
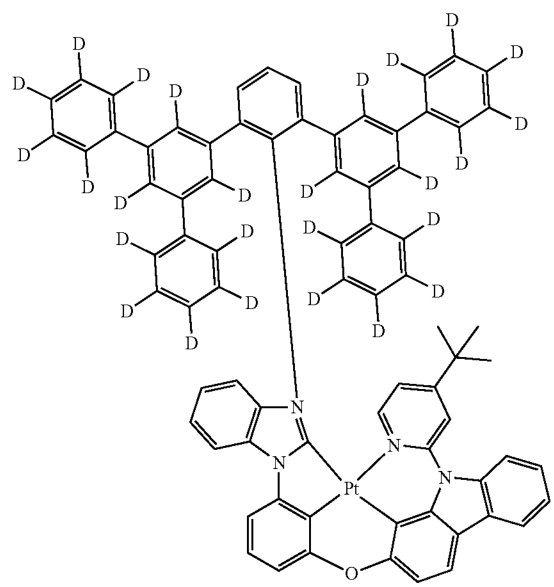
,
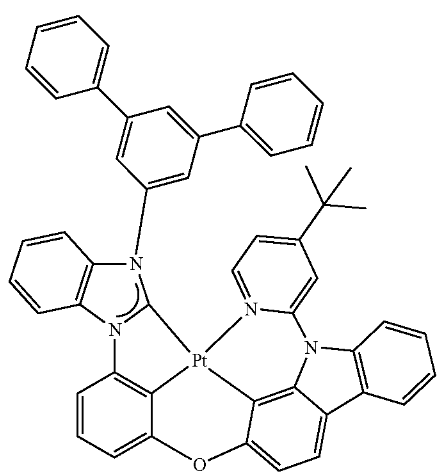
, -continued
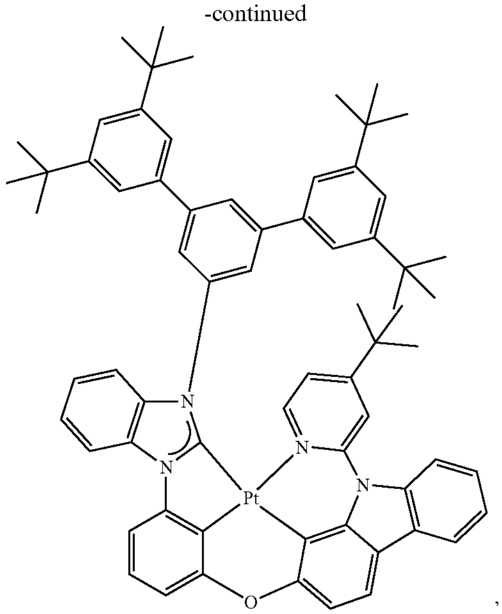
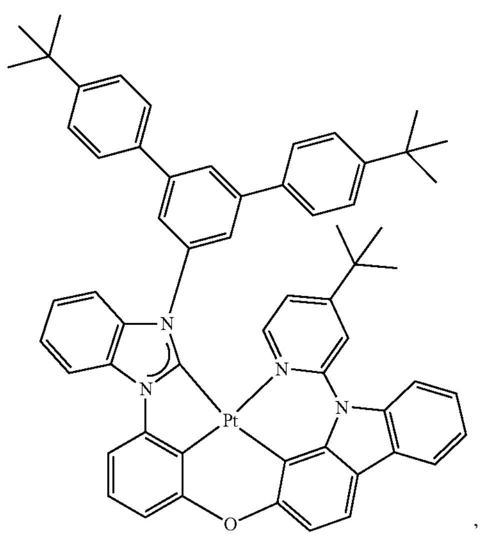
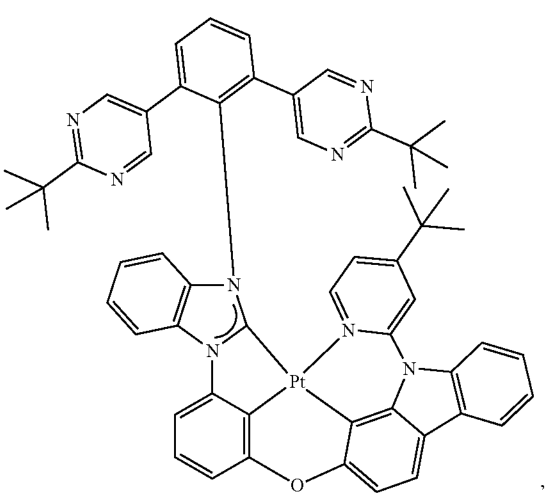
-continued
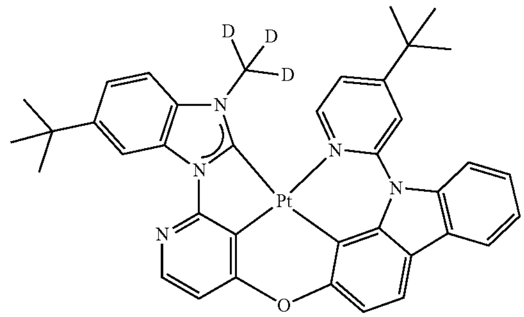
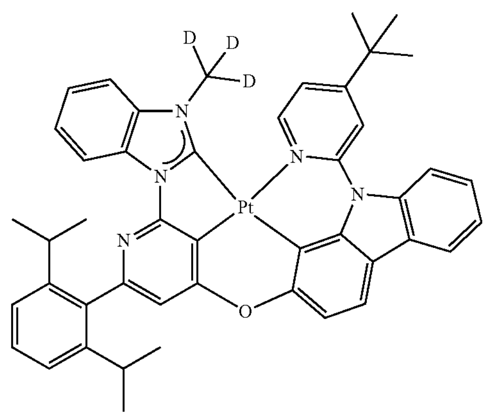
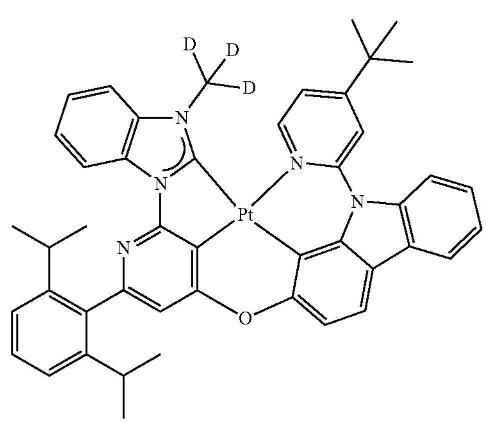

-continued
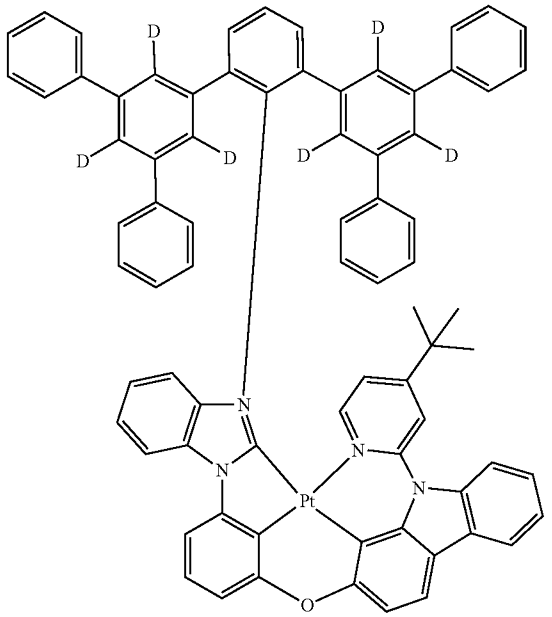
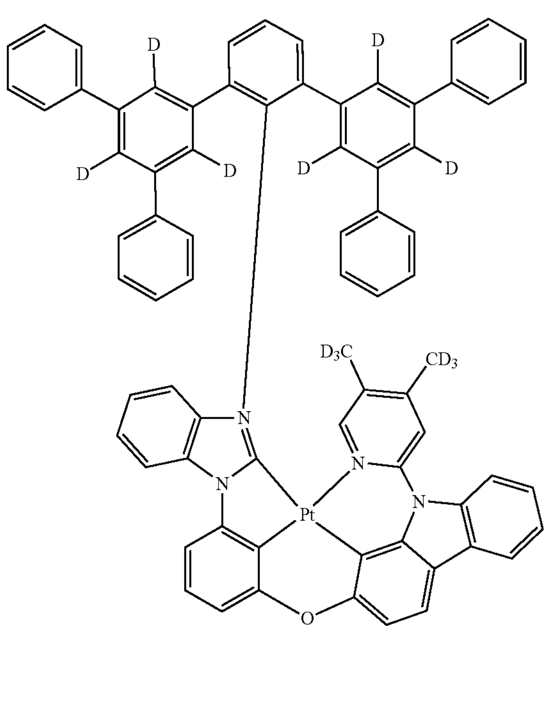
-continued
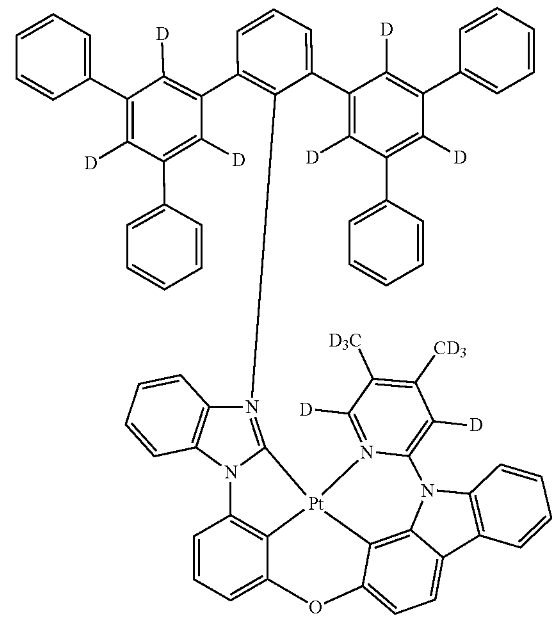
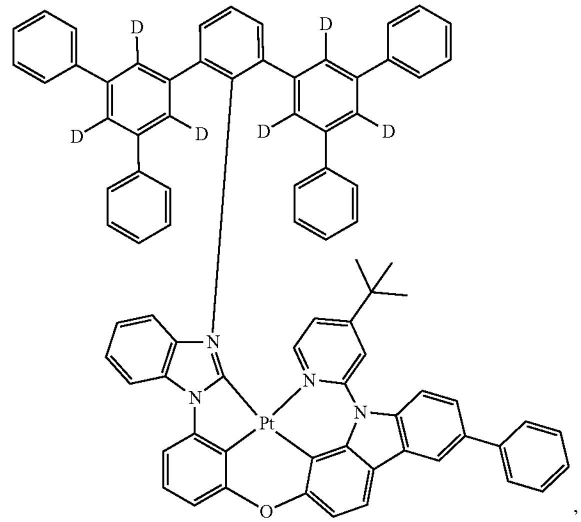
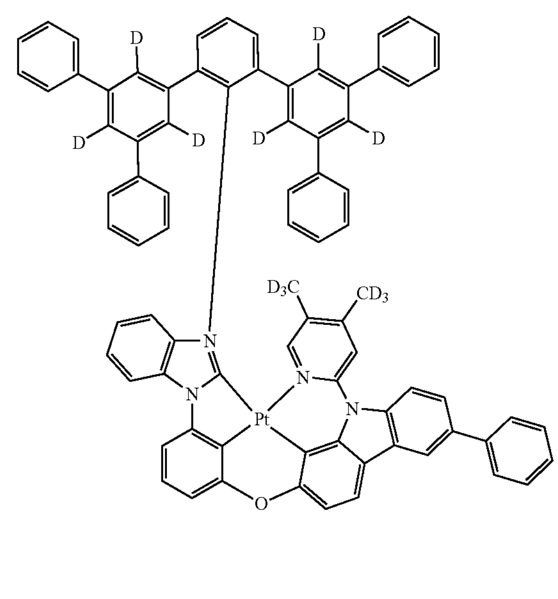

-continued
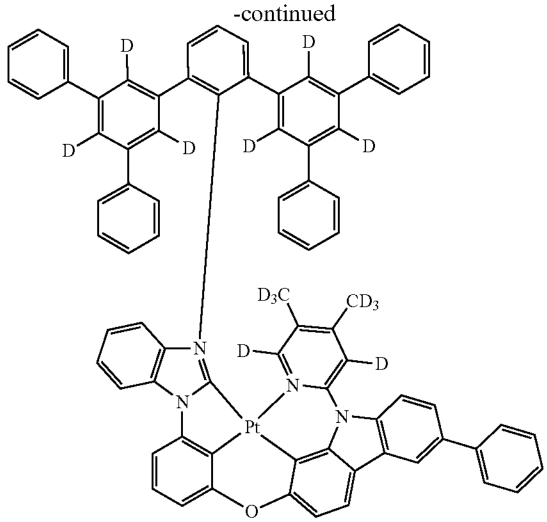
,
-continued
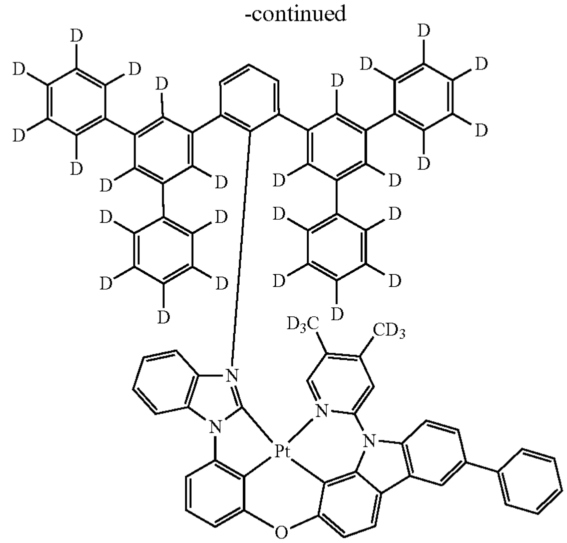
,
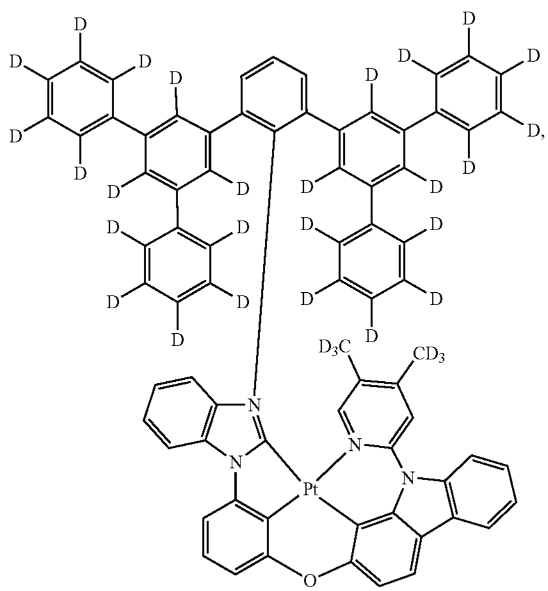
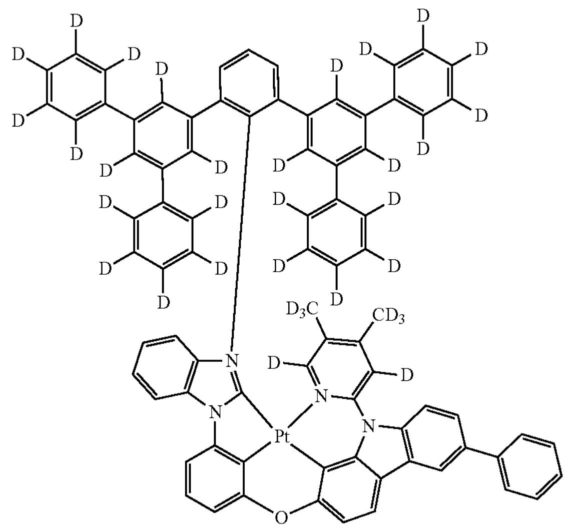
,
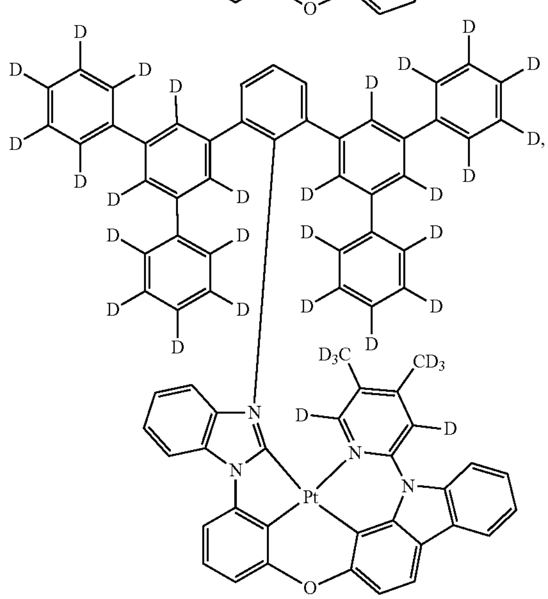
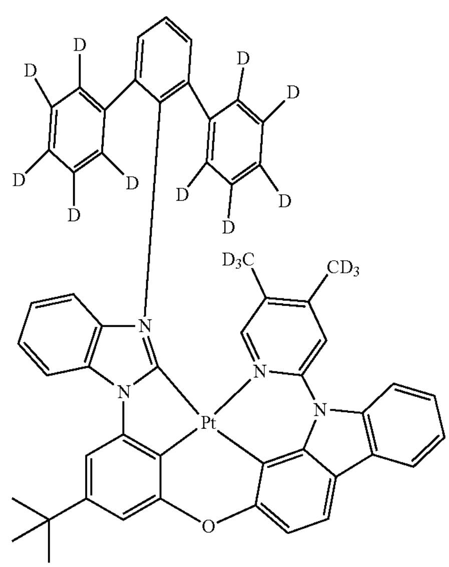
, -continued
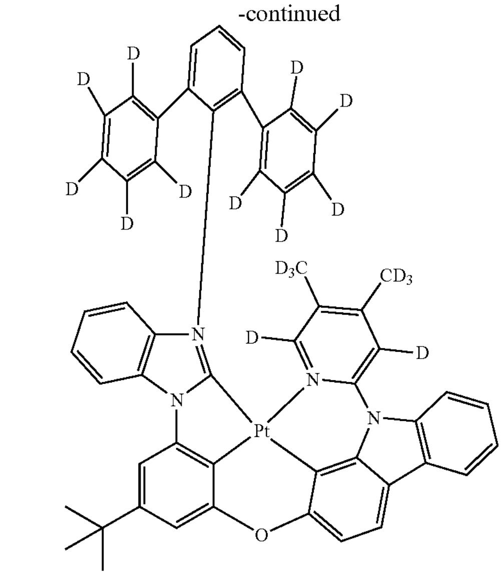
,
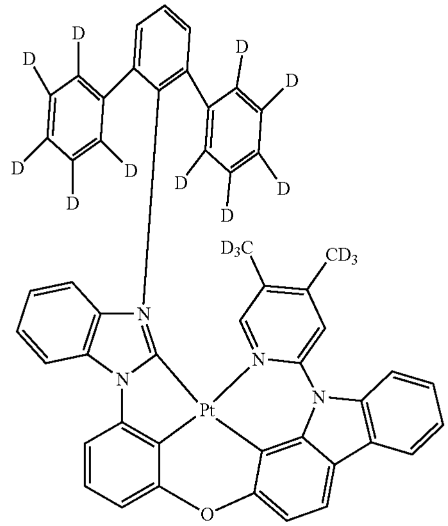
,
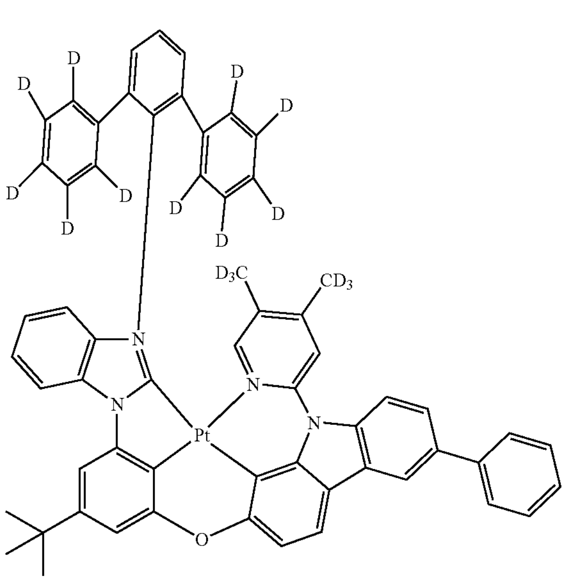
,
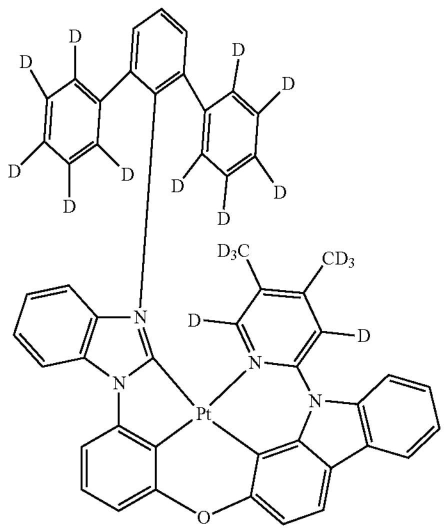
,
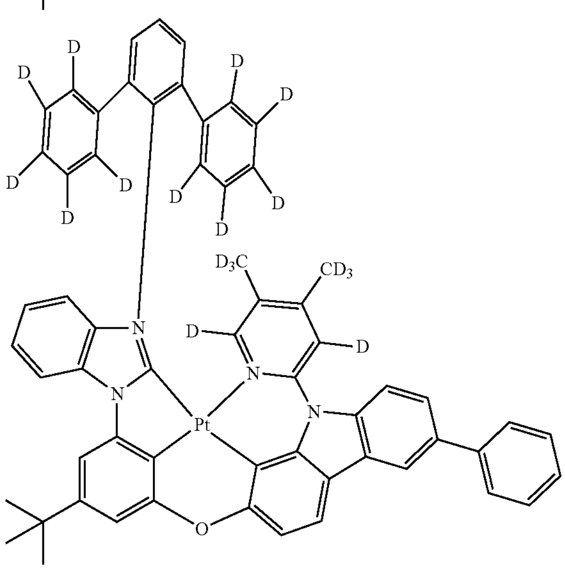
,
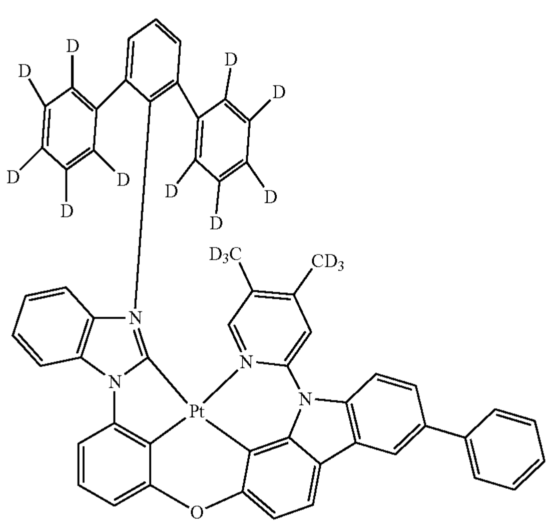
, -continued
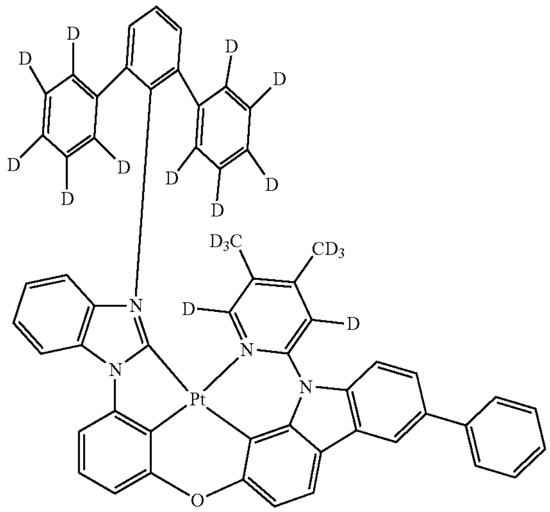
,
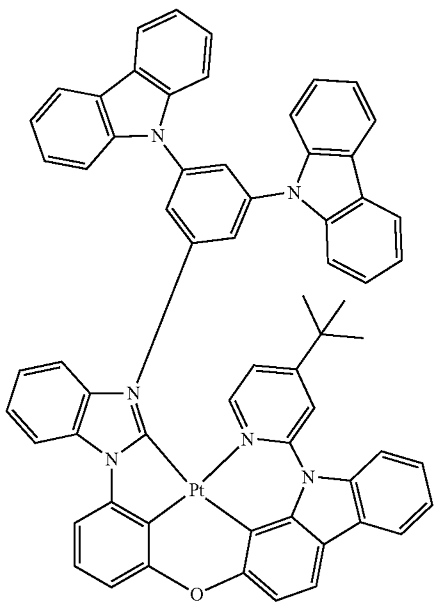
,
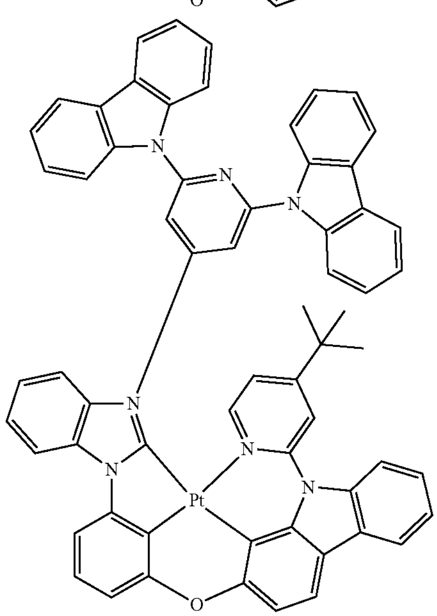
,
-continued
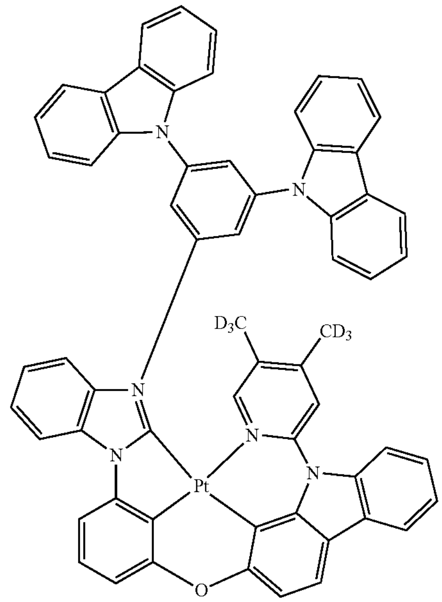
,
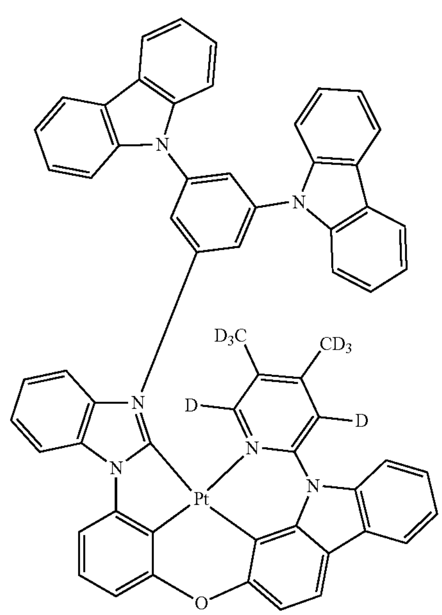
, -continued
-continued
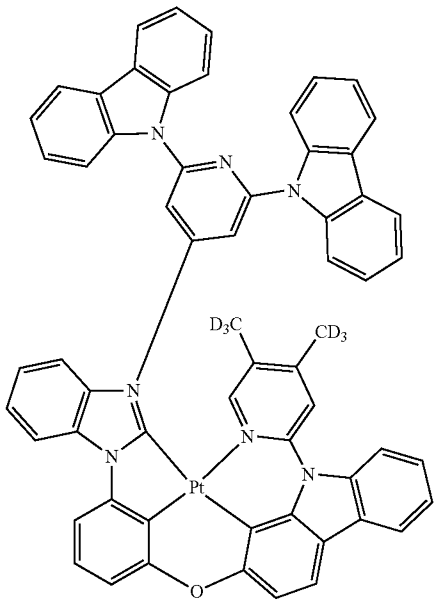
,
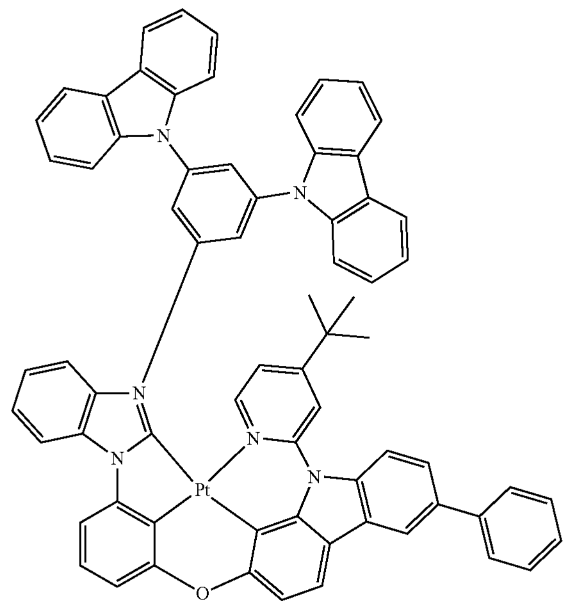
,
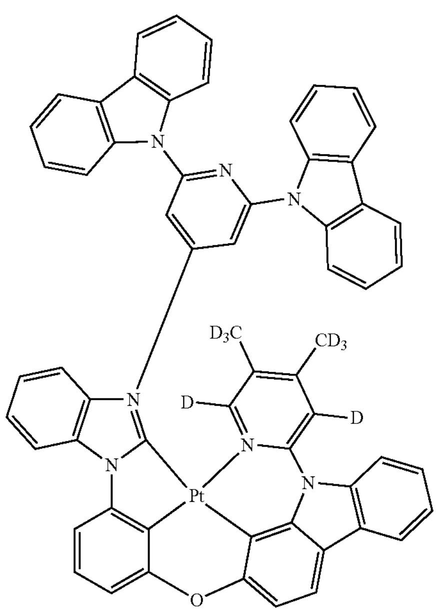
,
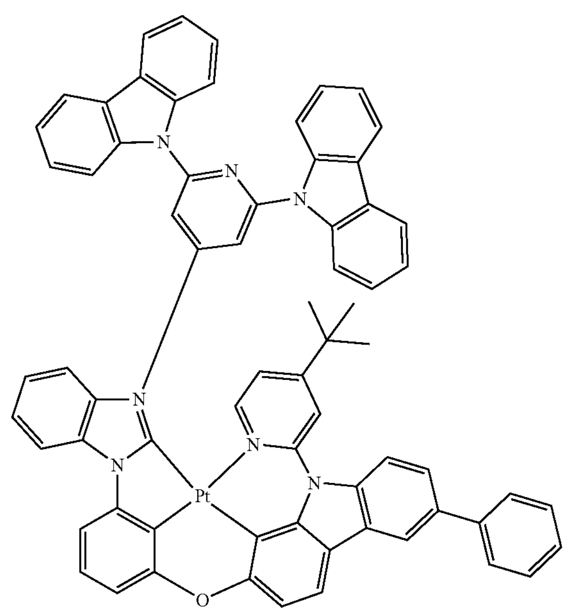
, -continued
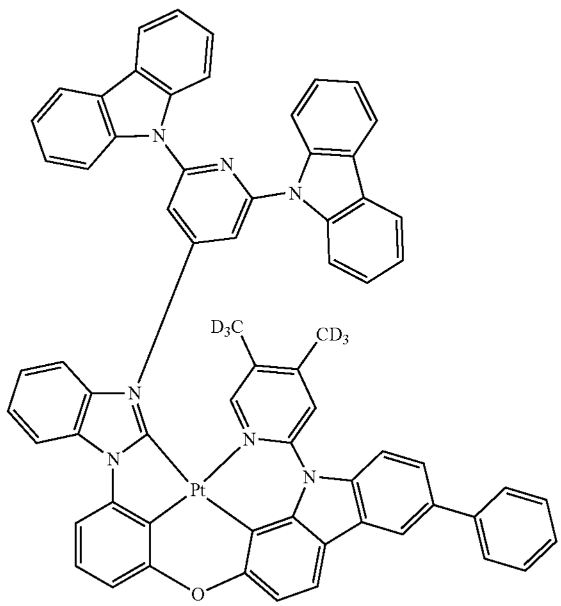
,
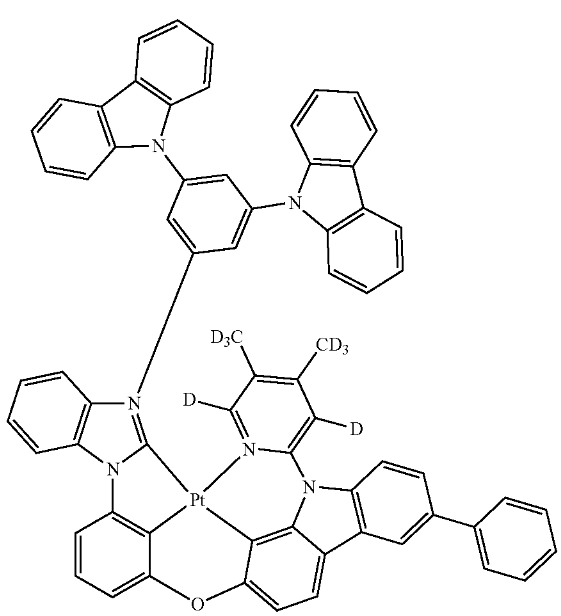
-continued
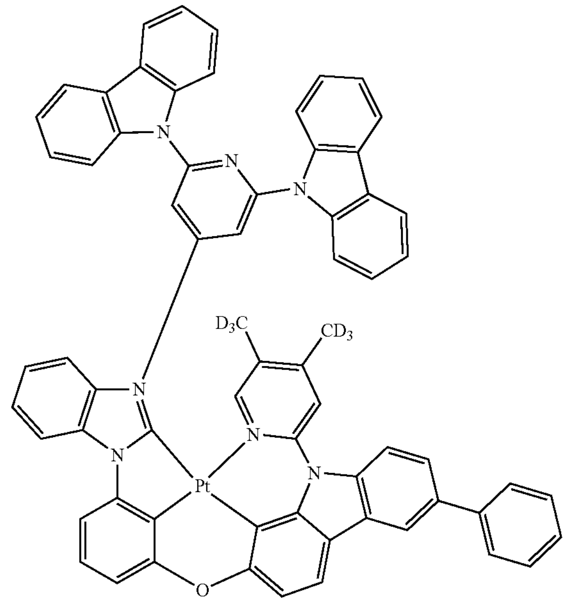
,
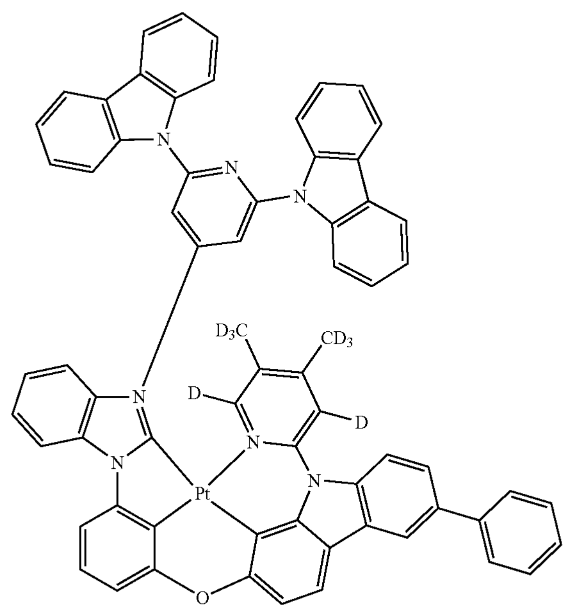
,
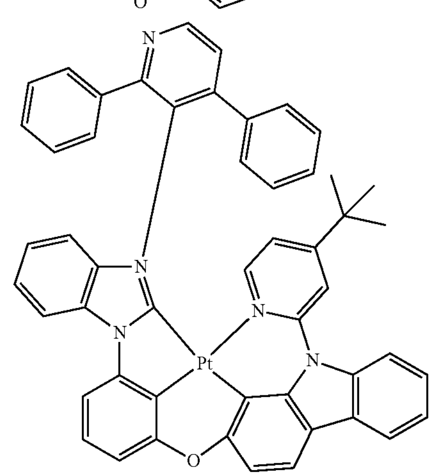
,

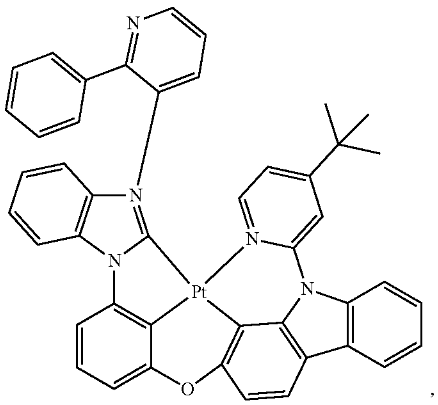
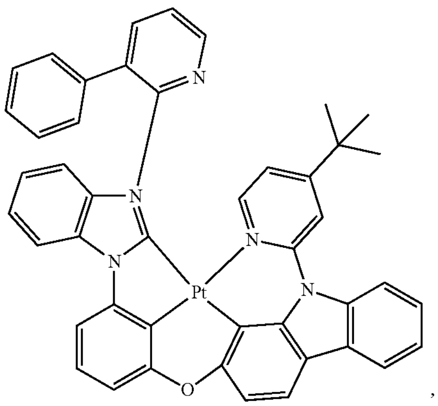
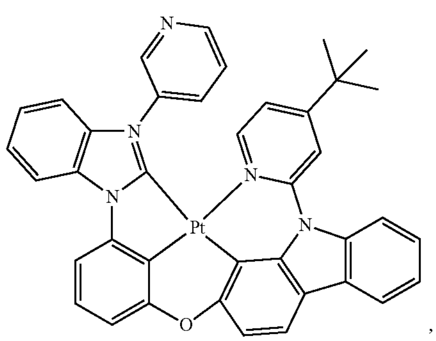
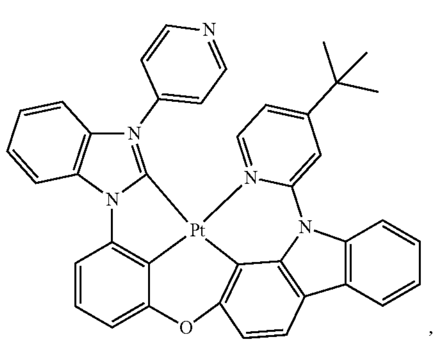
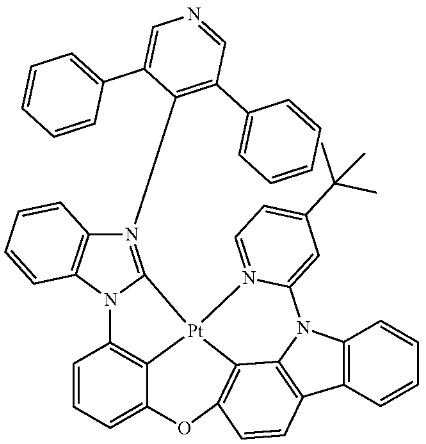
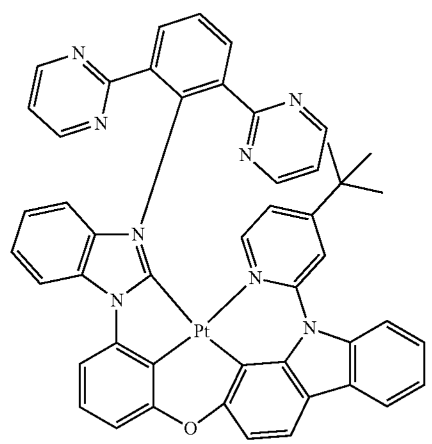
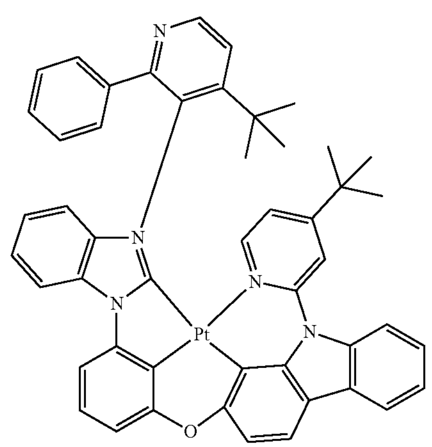

-continued

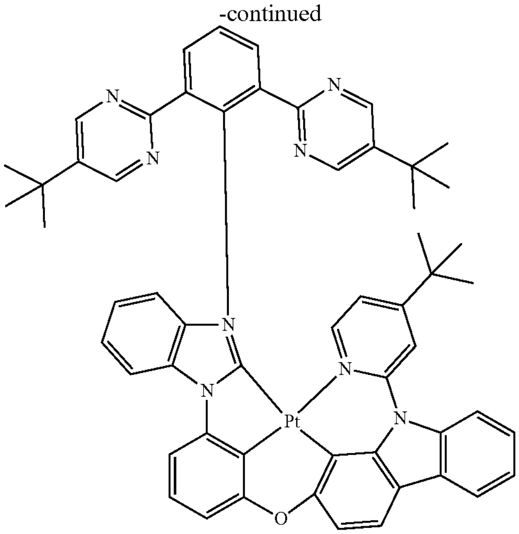

,

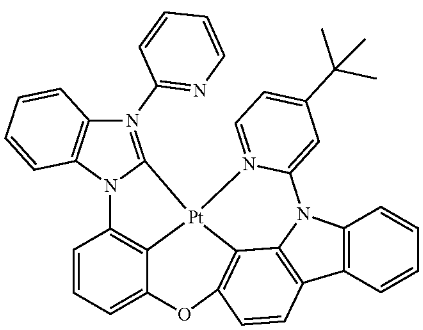

,

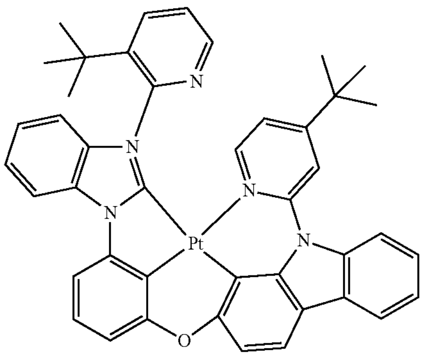

,

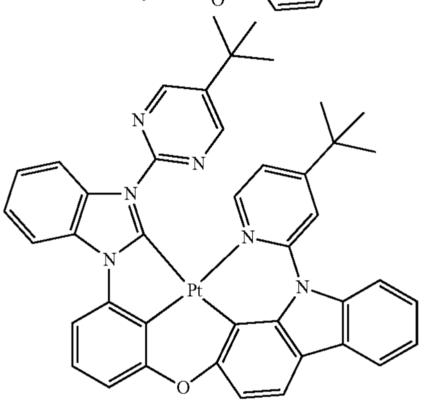

, and

-continued

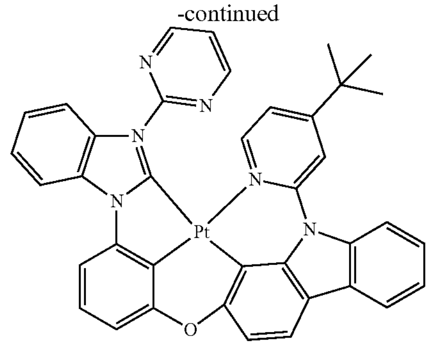

.

An organic light emitting device (OLED) is also disclosed. The OLED comprises: an anode; a cathode; and an organic layer, disposed between the anode and the cathode, comprising a compound having the formula:

Formula I

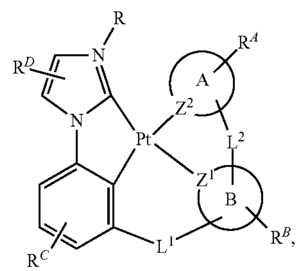

wherein Formula I is defined as provided above.

In some embodiments of the OLED, each of R', R", $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

A consumer product comprising the OLED is also disclosed, wherein the organic layer in the OLED comprises the compound having the Formula I.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, published on Mar. 14, 2019 as U.S.

patent application publication No. 2019/0081248, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others).

When there are more than one ligand coordinated to a metal, the ligands can all be the same in some embodiments. In some other embodiments, at least one ligand is different from the other ligand(s). In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

In some embodiments, the compound of the present disclosure is neutrally charged.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound, for example, a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the Host Group consisting of:

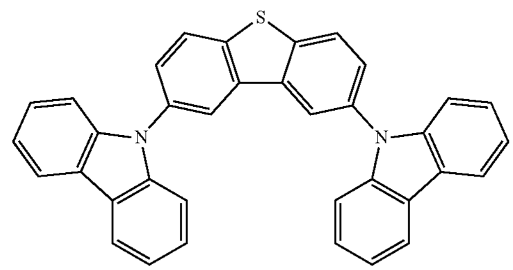
,

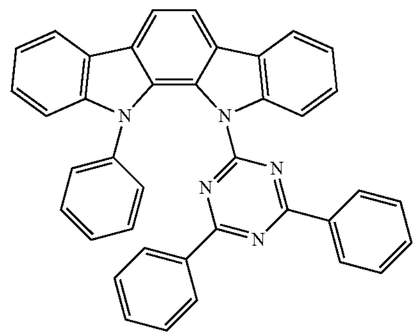
,

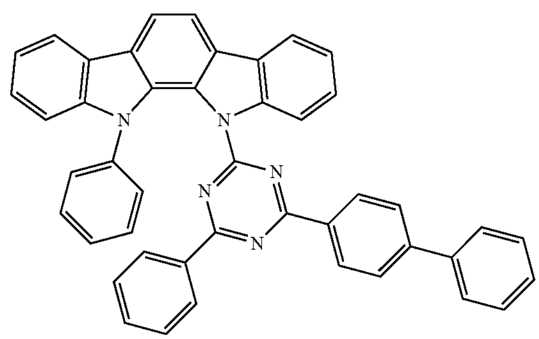
,

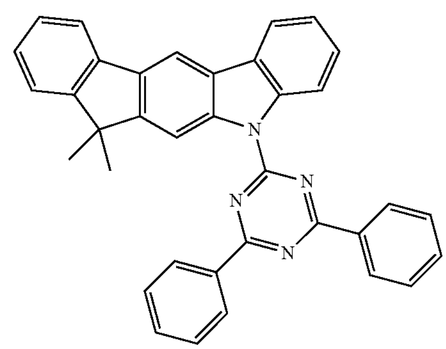
,

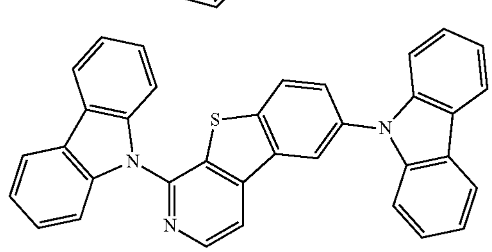
,

-continued
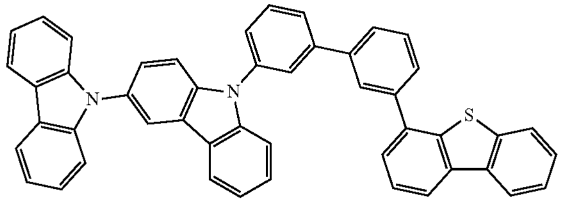
,
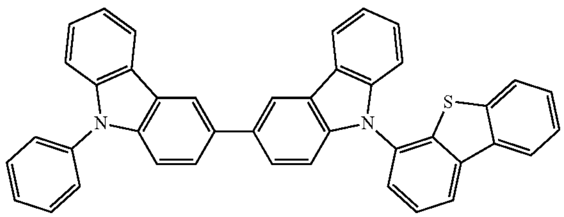
,
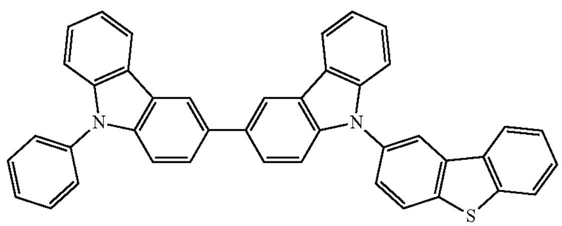
,
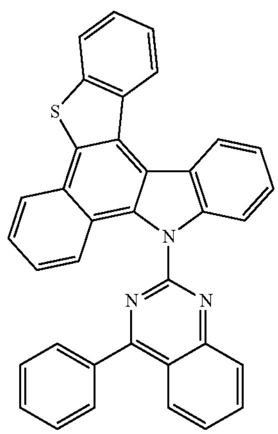
,
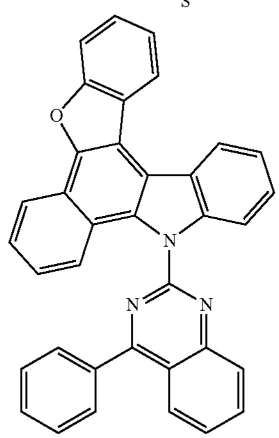
,
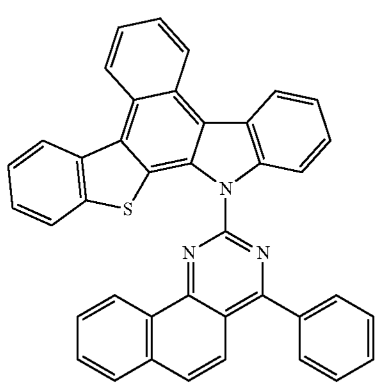
,
-continued
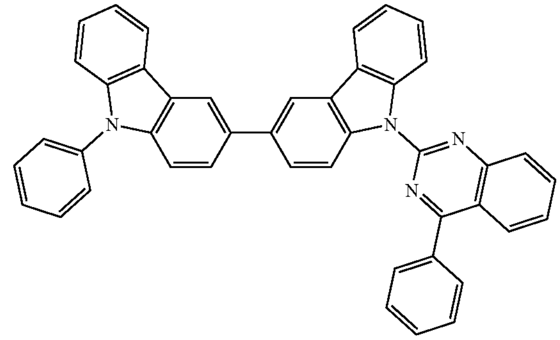
,
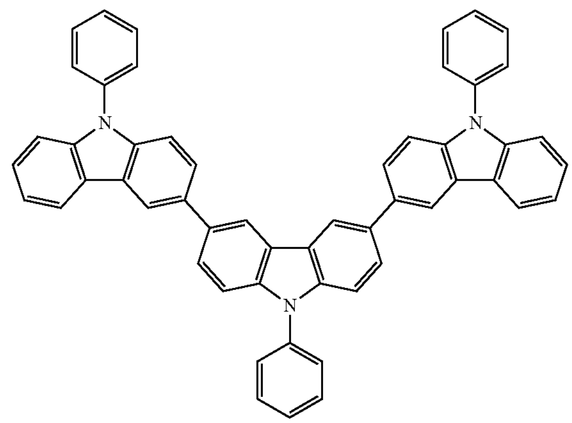
,
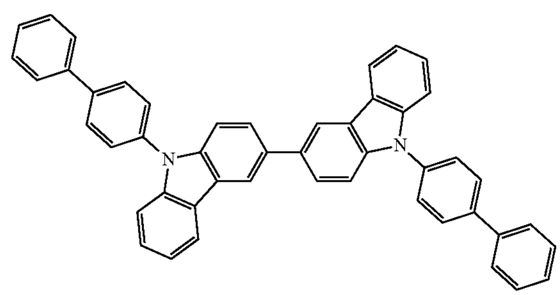
,
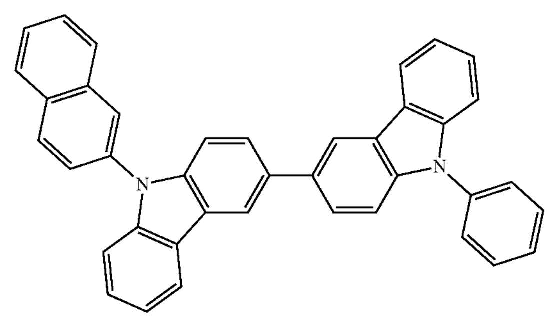
,
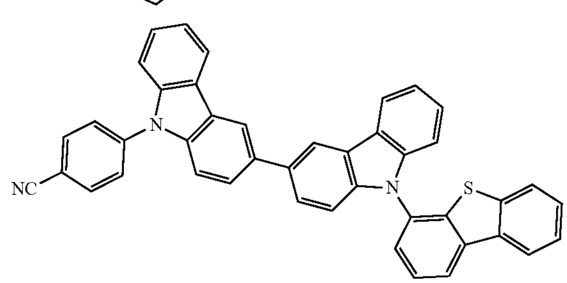
, -continued

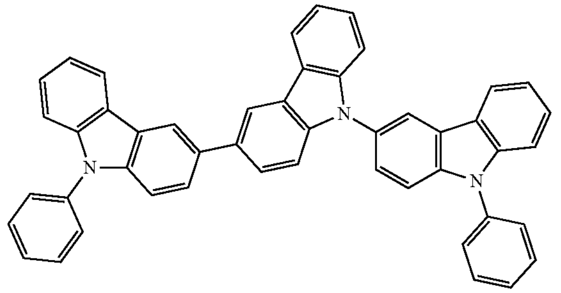

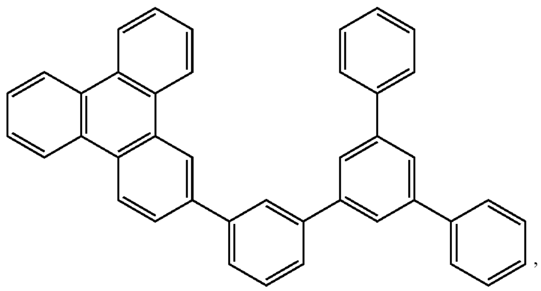

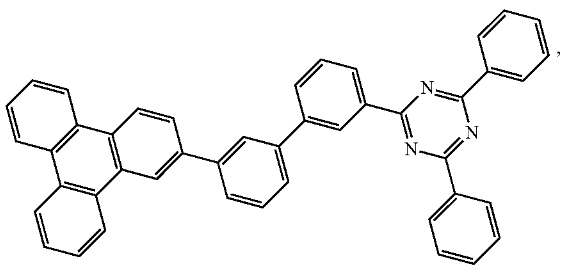

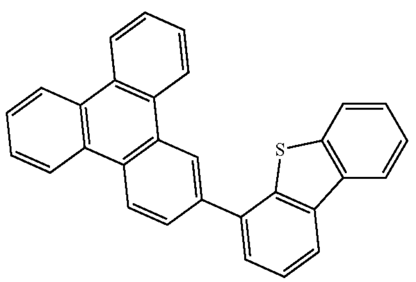

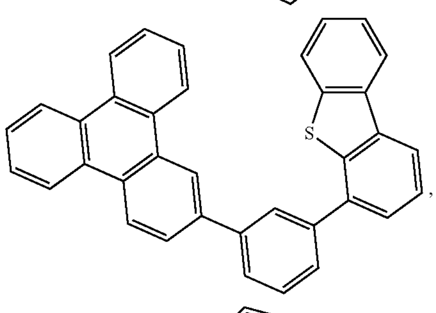

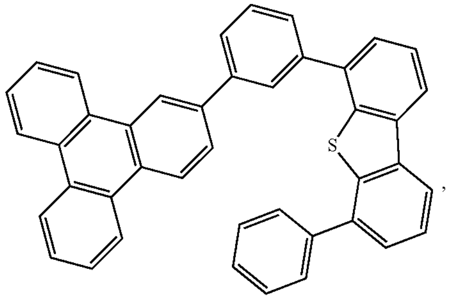

-continued

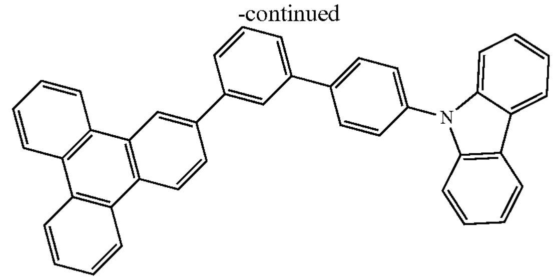

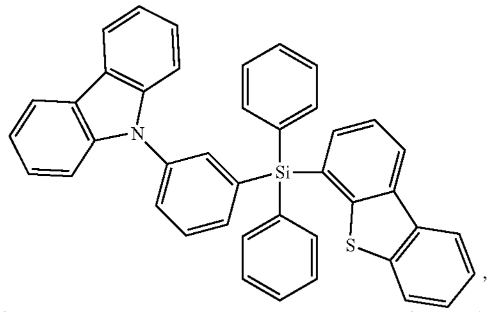

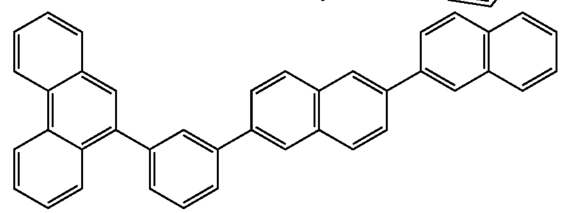

and combinations thereof.

Additional information on possible hosts is provided below.

An emissive region in an OLED is also disclosed. The emissive region comprises a compound having the formula:

Formula I

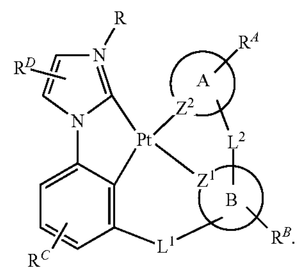

In Formula I, A and B are each independently a 5- or 6-membered aromatic ring; $Z^1$ and $Z^2$ are each independently selected from the group consisting of C and N; $L^1$ and $L^2$ are each independently selected from the group consisting of a direct bond, BR', NR', PR', O, S, Se, C═O, S═O, $SO_2$, CR'R", SiR'R", GeR'R", alkyl, cycloalkyl, and combinations thereof; $R^A$, $R^B$, $R^C$, and $R^D$, each represents mono to a maximum allowable substitutions, or no substitution; each of R', R", $R^A$, $R^B$, $R^C$, and $R^D$ is independently selected from the group consisting of hydrogen, deuterium, halide, alkyl, cycloalkyl, fluorinated alkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; R is selected from the group consisting of deuterium, alkyl, cycloalkyl, heteroalkyl, arylalkyl, silyl, aryl, heteroaryl, and combinations thereof; any substitutions in $R^A$, $R^B$, $R^C$, and $R^D$ may be joined or fused into a ring; $R^A$ or $R^B$ may be fused with $L^2$ to form a ring;

wherein at least one of the following conditions (a), (b), and (c) is true:

(a) at least one of $R^A$ and $R^C$ is present and is a 5- or 6-membered aromatic ring attached to a carbon atom;

(b) $R^A$ is present and is an alkyl or cycloalkyl attached to a carbon atom, and each $R^C$ is independently H or aryl; and (c) both $R^A$ and $R^C$ are present and are an alkyl or cycloalkyl attached to a carbon atom, and R has a molecular weight equal to or greater than 16.0 grams per mole.

In some embodiments of the emissive region, each of R', R", $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

In some embodiments of the emissive region, the compound is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

In some embodiments of the emissive region, the emissive region further comprises a host, wherein the host is selected from the group consisting of:

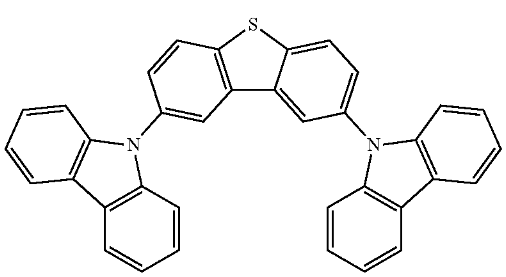

,

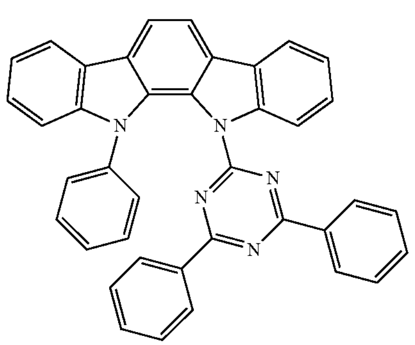

,

-continued

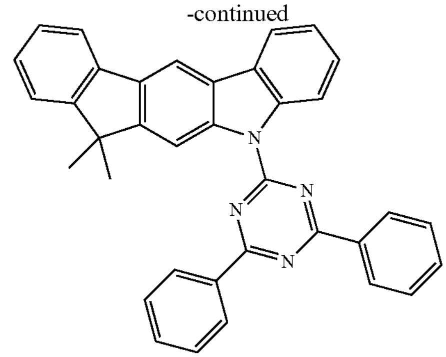

,

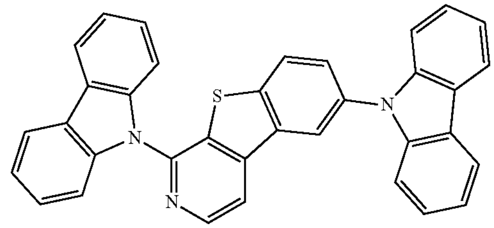

,

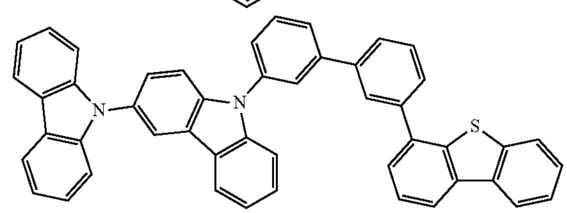

,

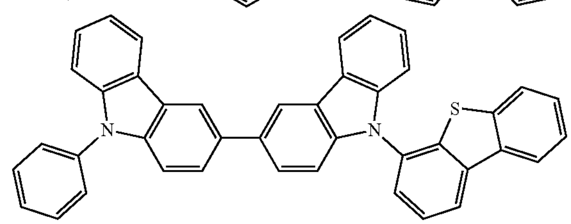

,

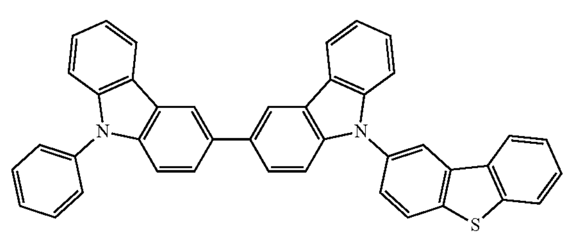

,

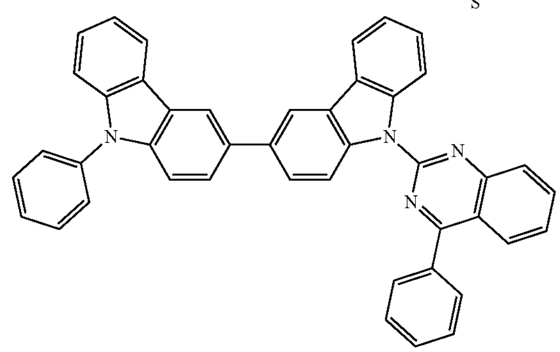

,

-continued
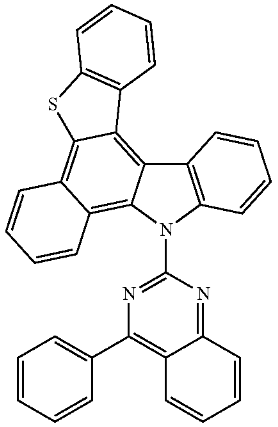
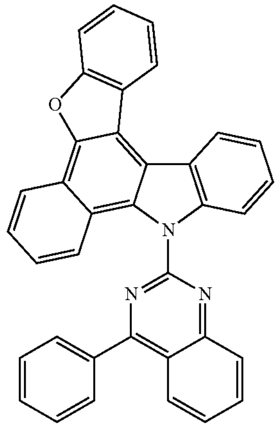
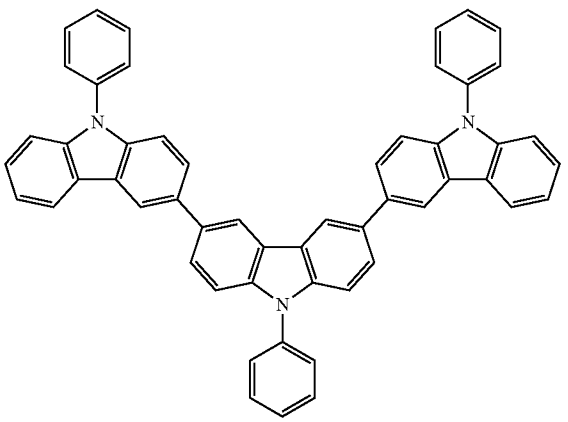
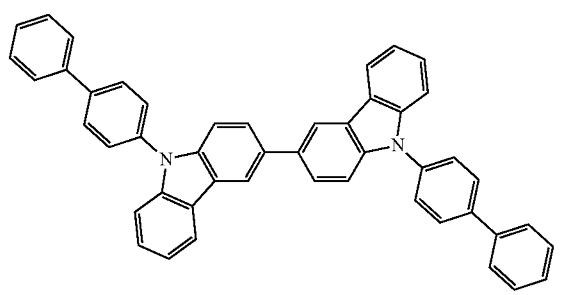
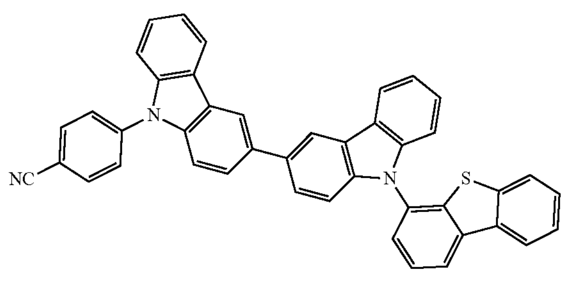
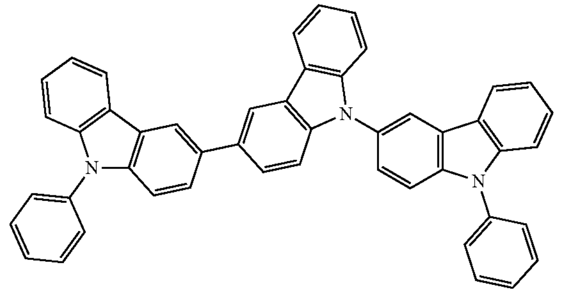
-continued
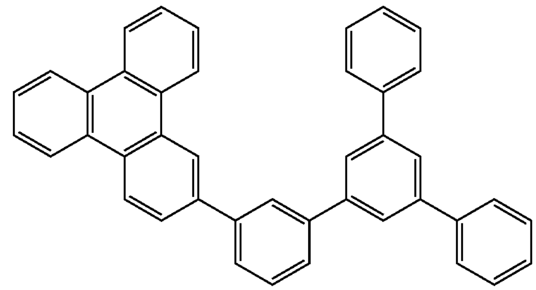
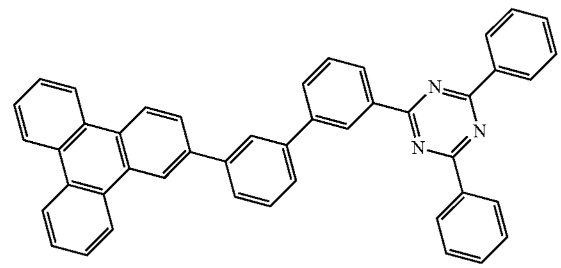
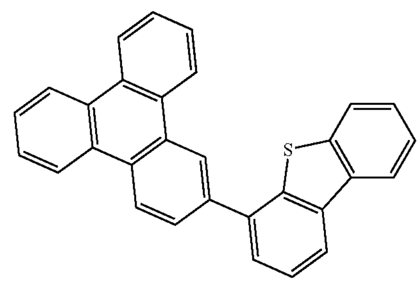
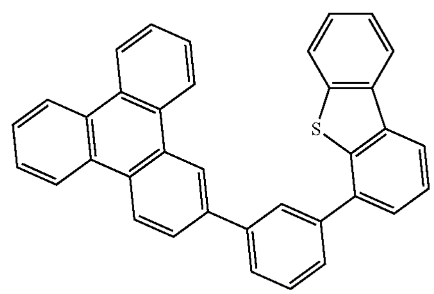
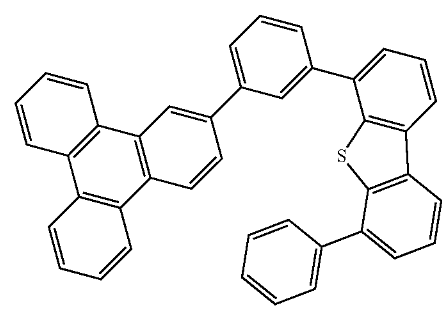
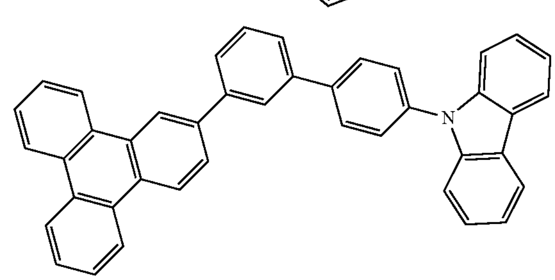

-continued

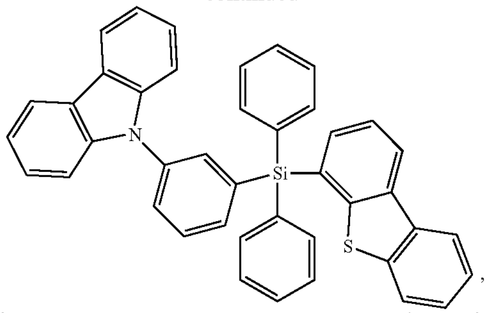

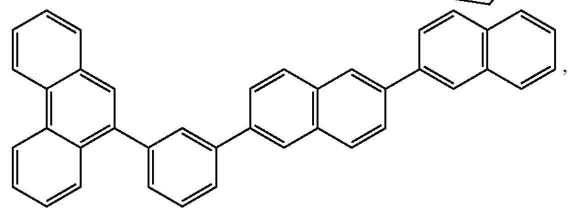

and combinations thereof.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound is can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

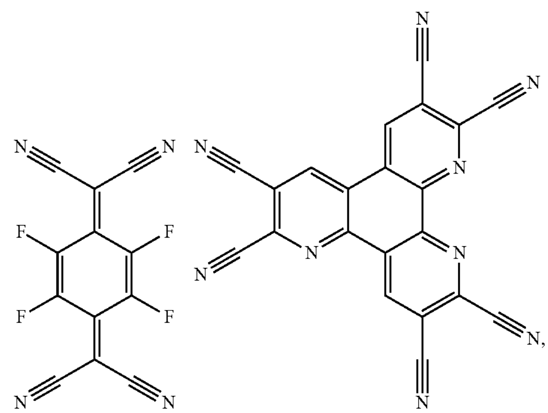

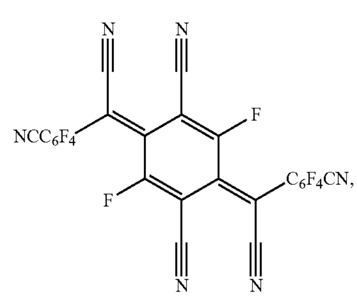

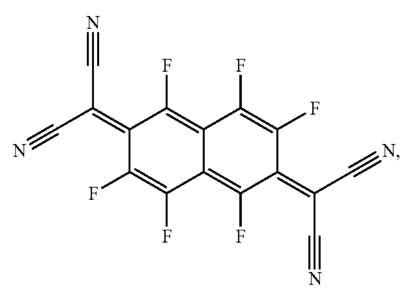

-continued

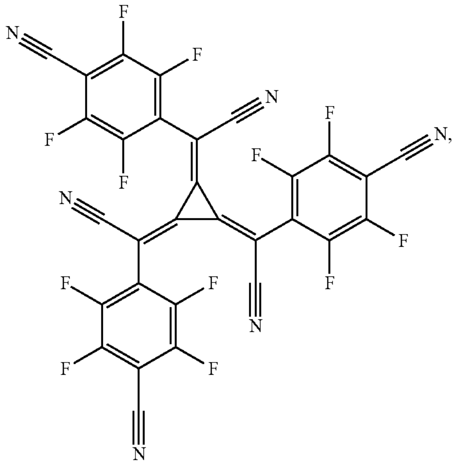

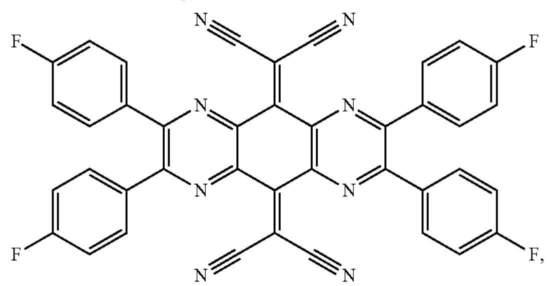

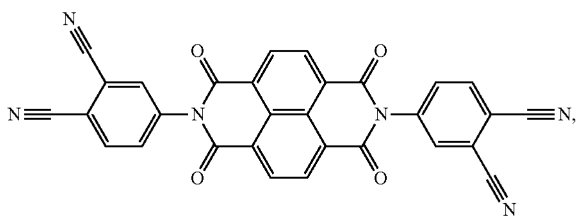

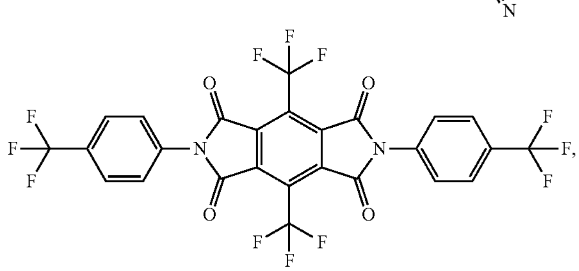

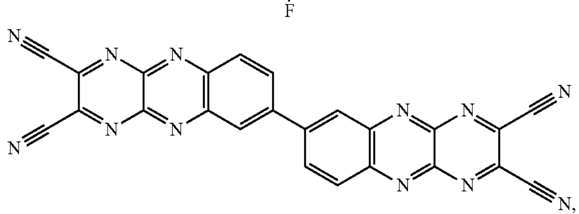

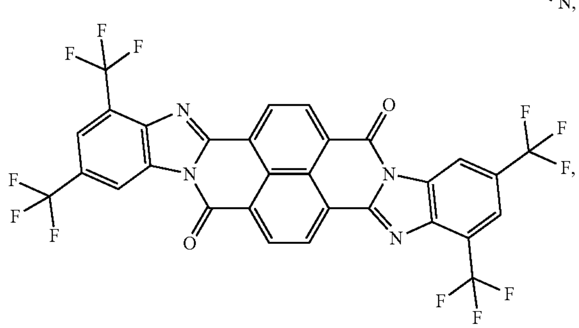

-continued

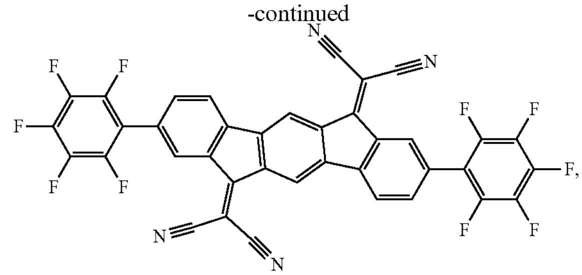

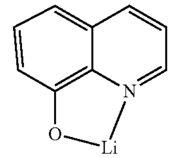

, and

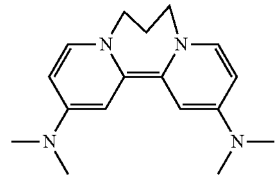

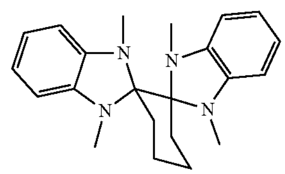

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

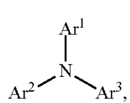

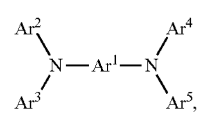

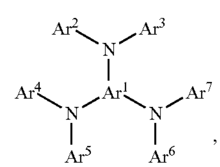

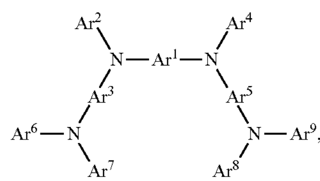

and

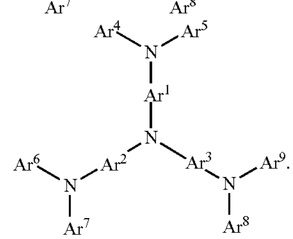

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

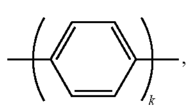,
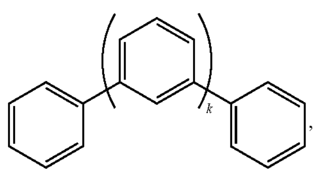,

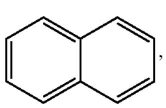,
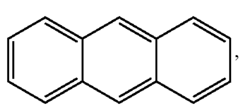,

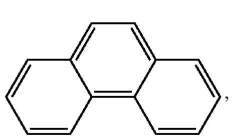,
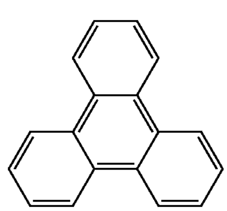,

-continued

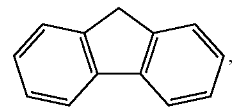, and 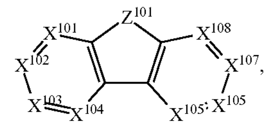

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

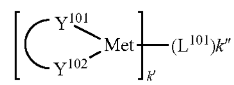

wherein Met is a metal, which can have an atomic weight greater than 40; ($Y^{101}$—$Y^{102}$) is a bidentate ligand, $Y^{101}$ and $Y^{102}$ are independently selected from C, N, O, P, and S; $L^{01}$ is an ancillary ligand; k' is an integer value from 1 to the maximum number of ligands that may be attached to the metal; and k'+k" is the maximum number of ligands that may be attached to the metal.

In one aspect, ($Y^{101}$—$Y^{102}$) is a 2-phenylpyridine derivative. In another aspect, ($Y^{101}$—$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

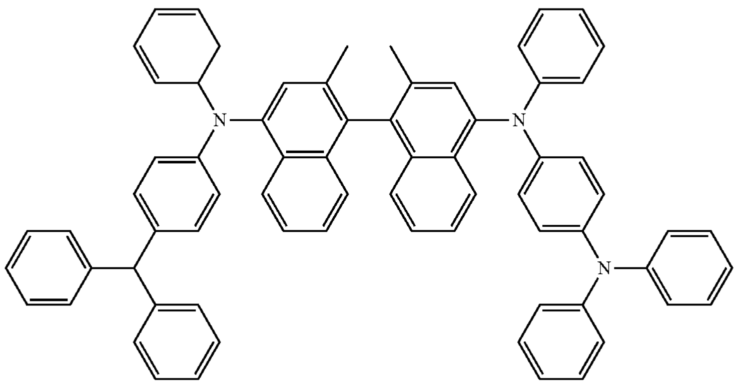
,
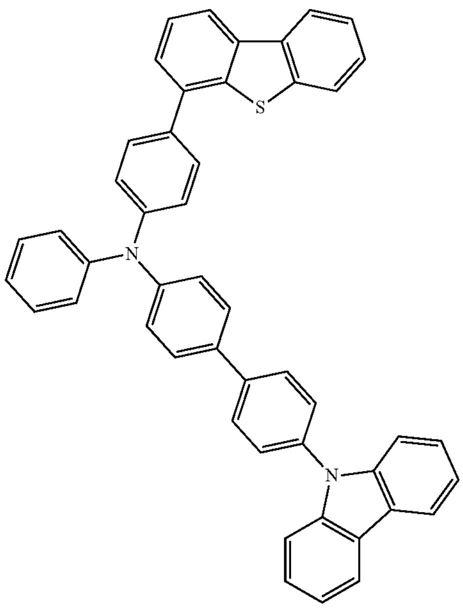
,
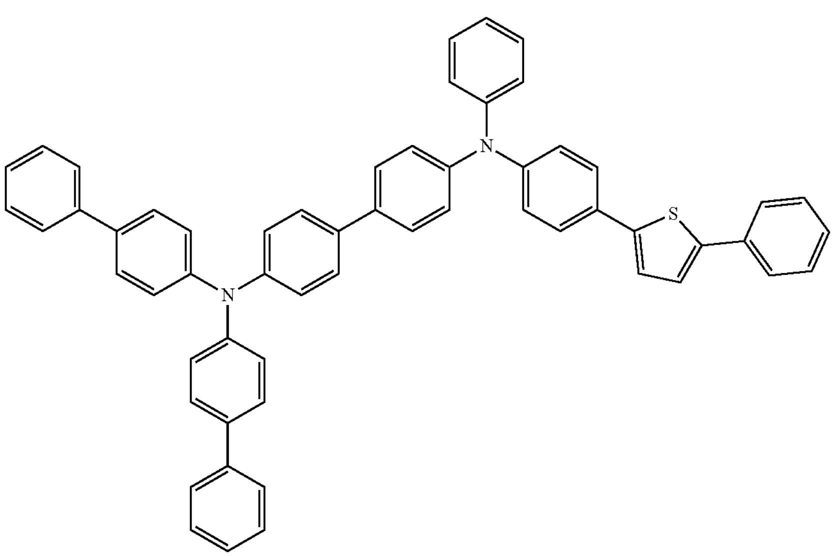
,

-continued
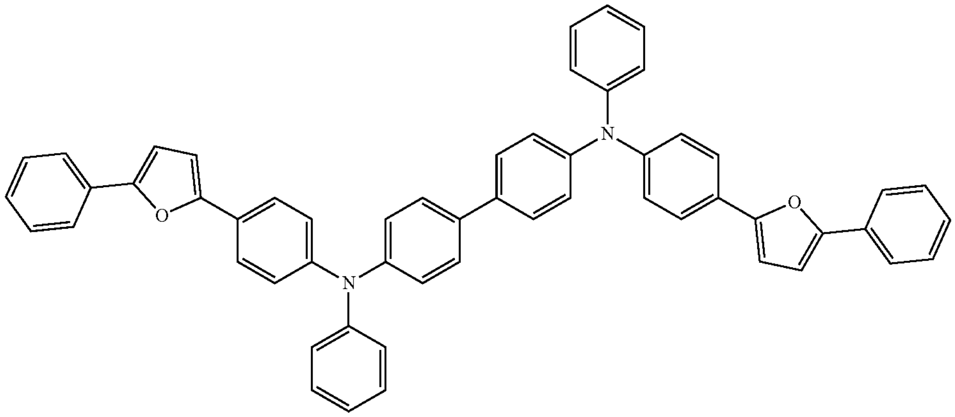
,
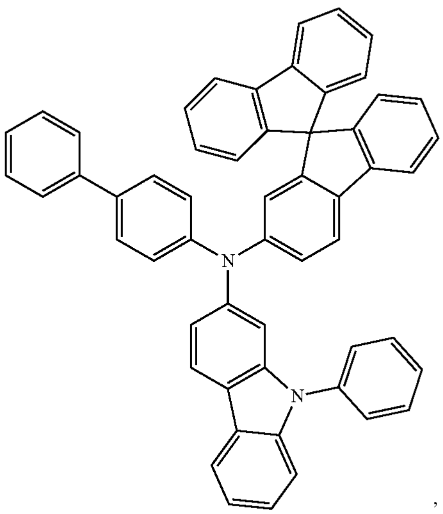
,
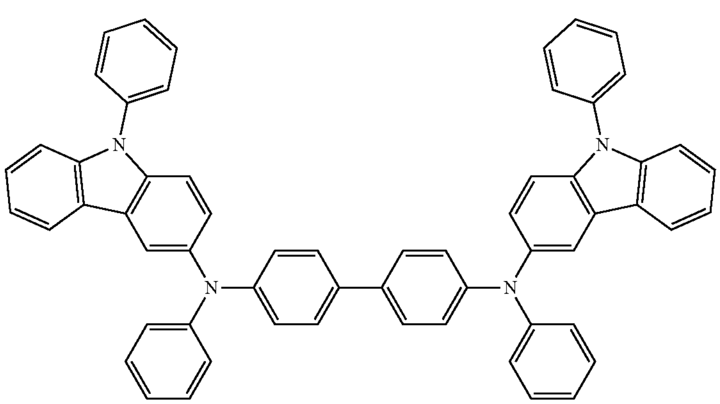
,

-continued
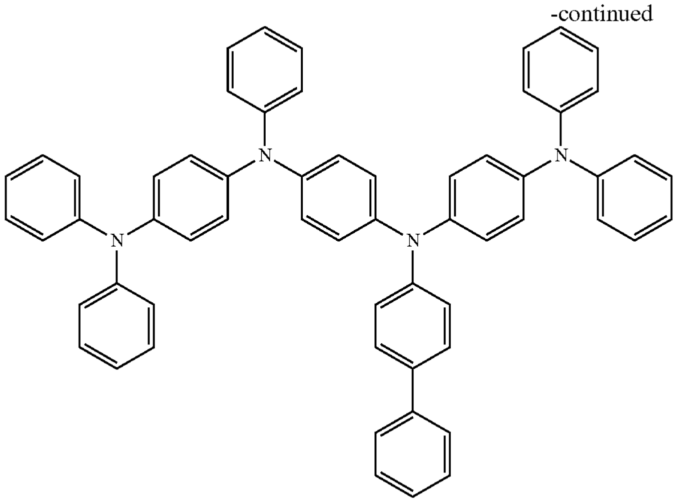
,
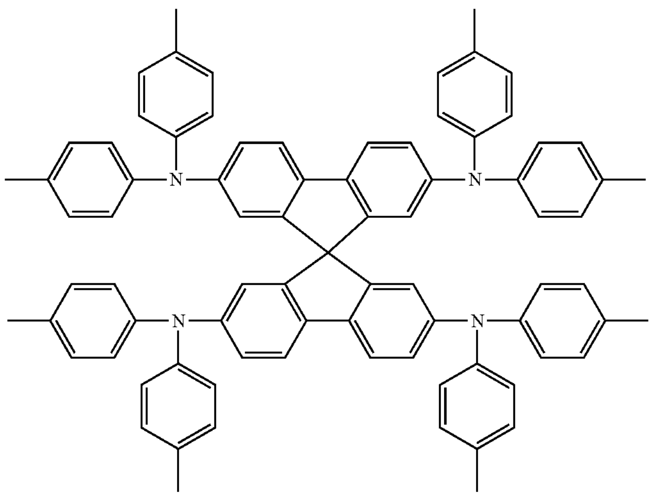
,
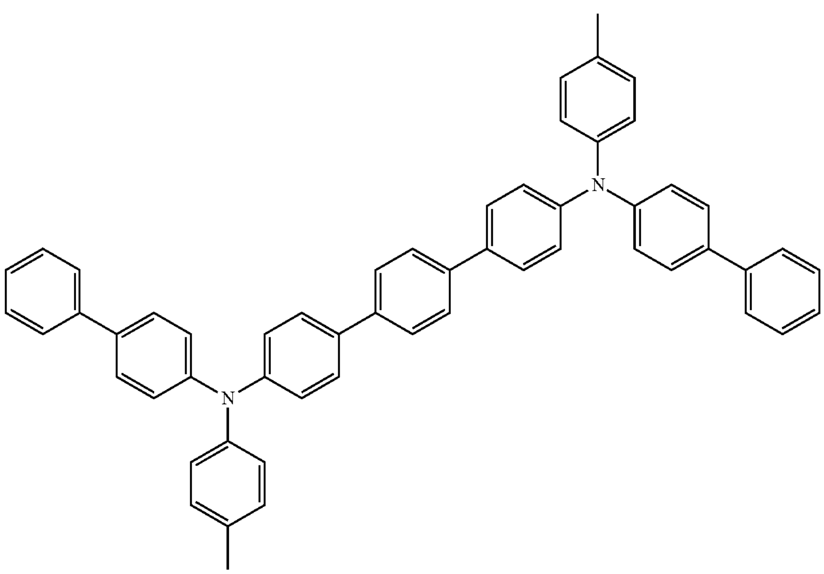
,

-continued
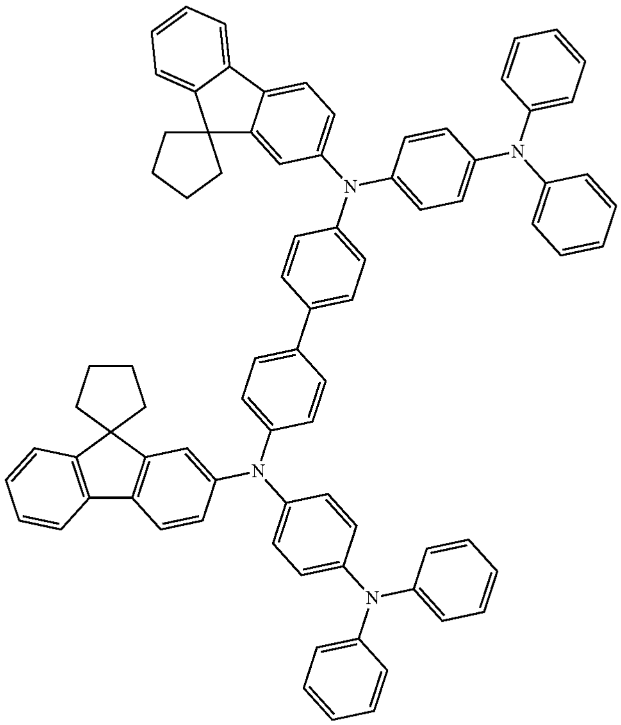
,
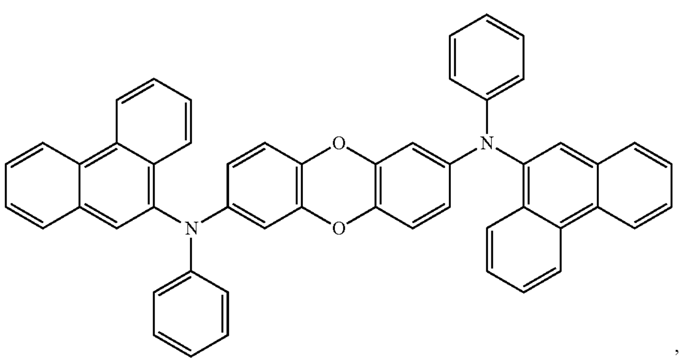
,
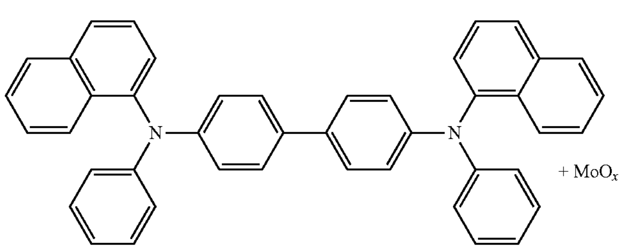
+ $MoO_x$
,

-continued
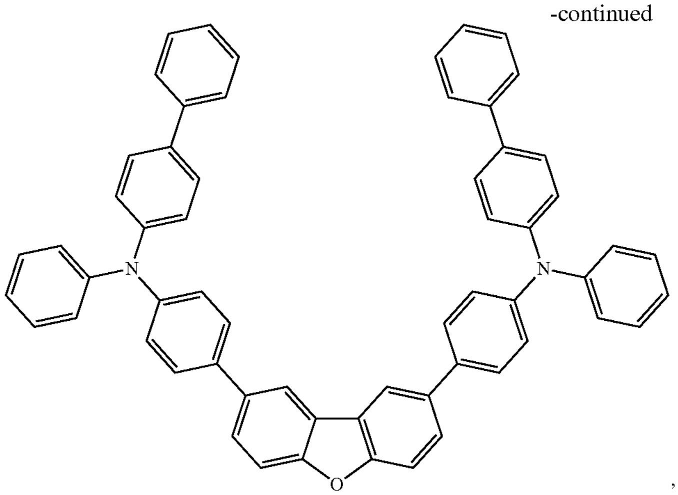
,
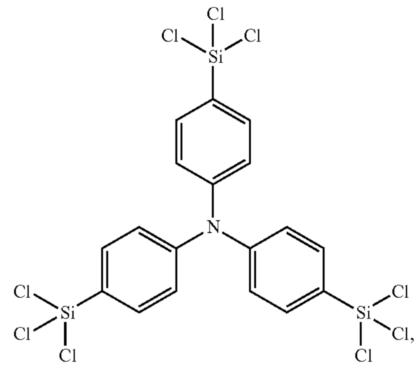
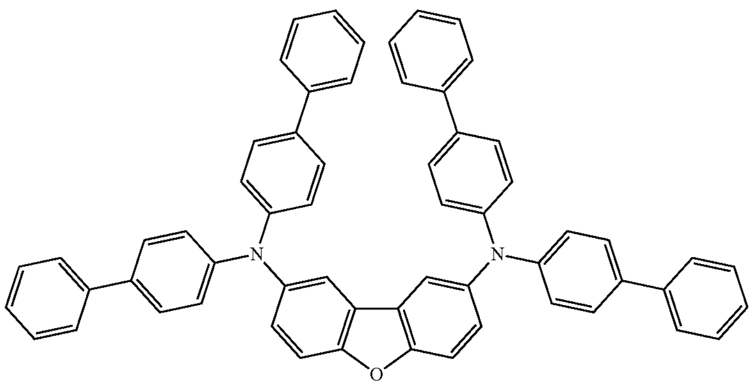
,
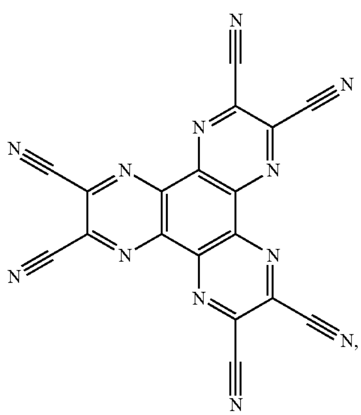
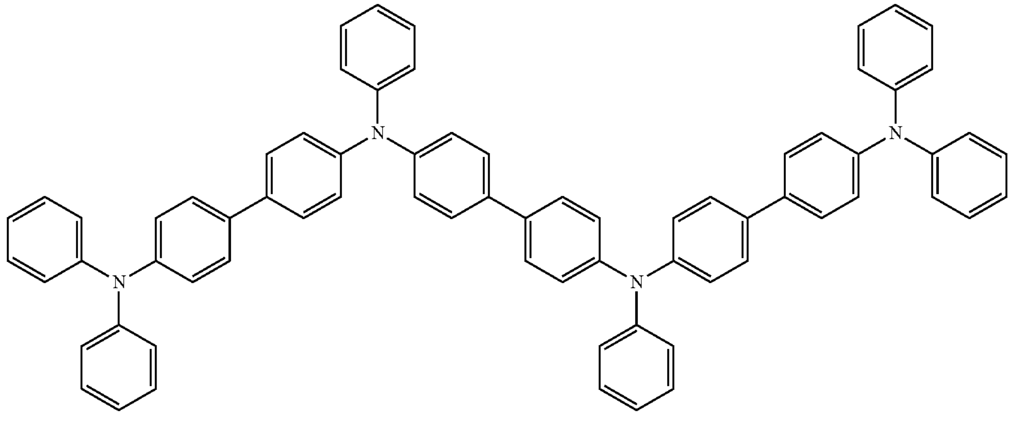
,

-continued
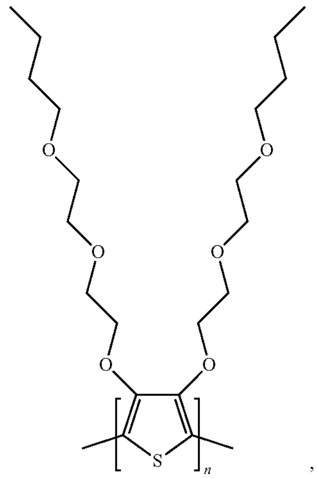
,
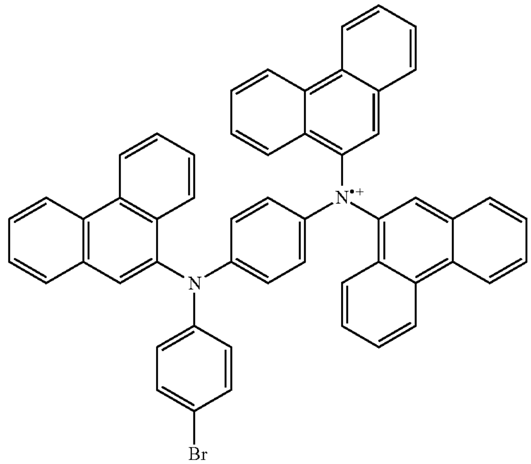
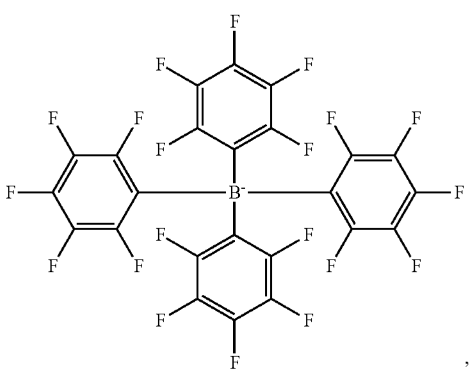
,
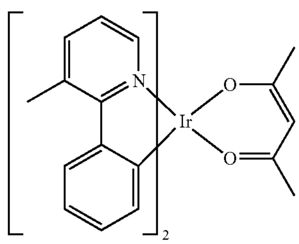
,
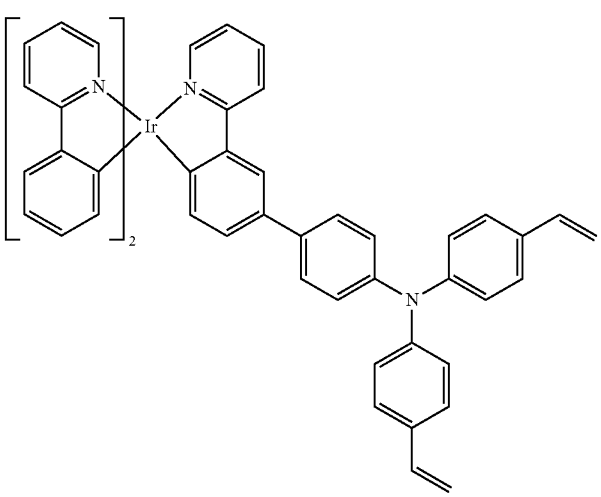
,

-continued
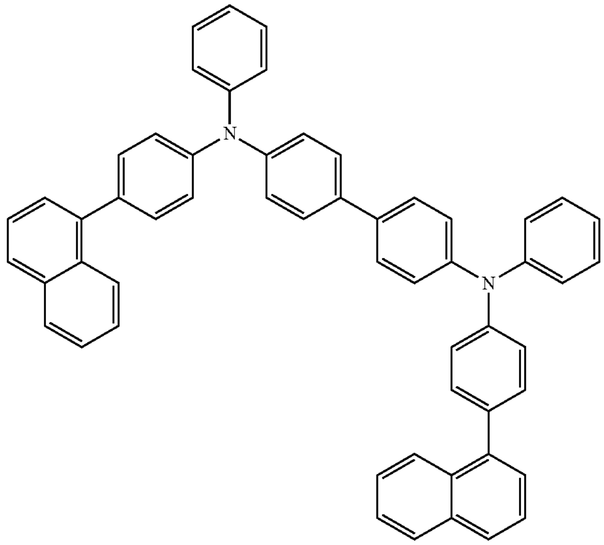
,
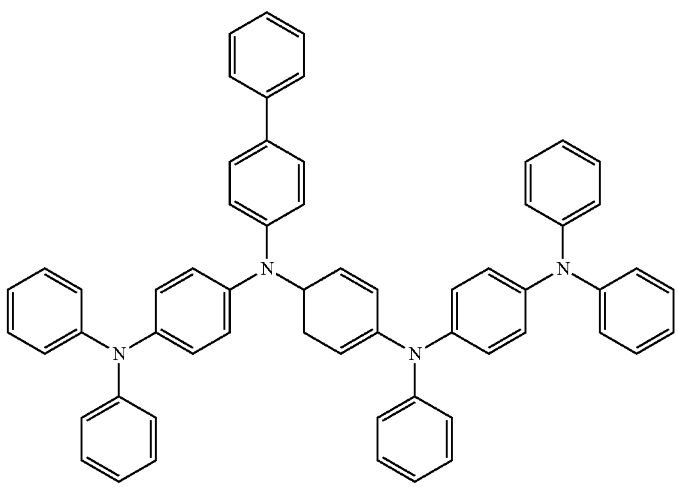
,
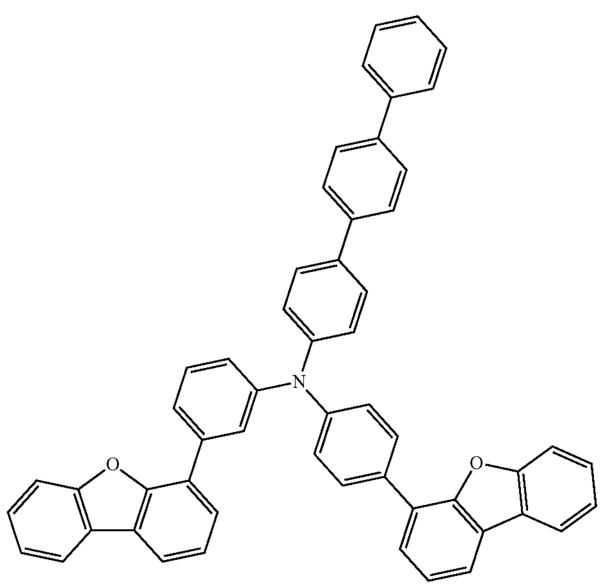
,

-continued
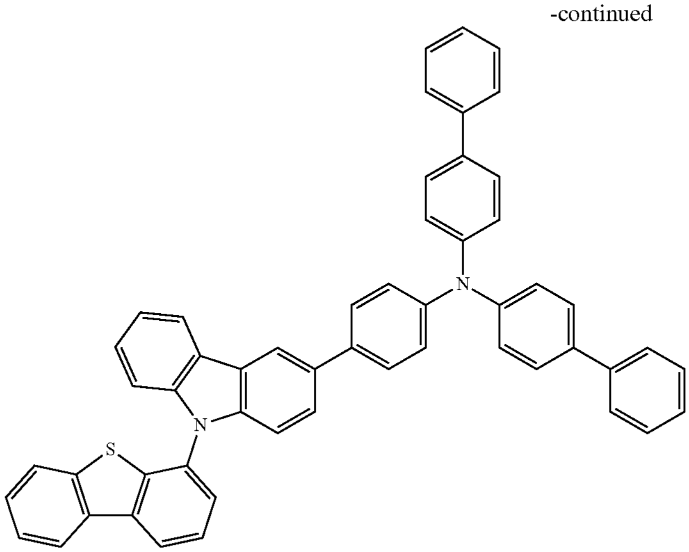
,
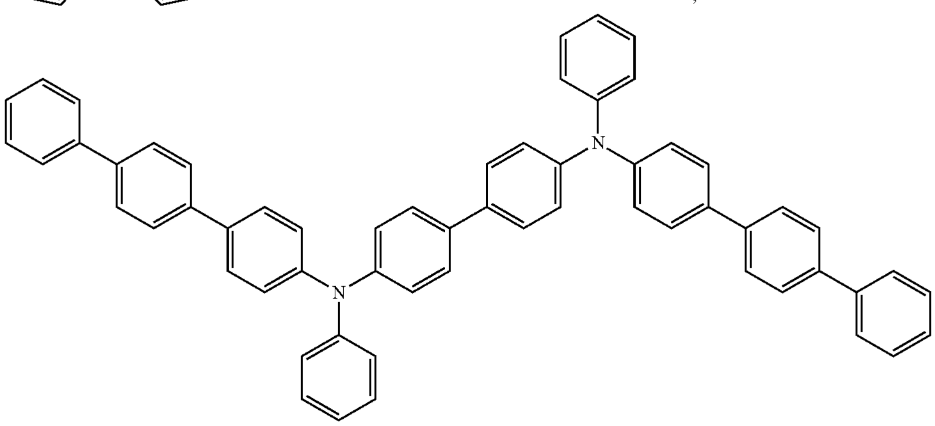
,
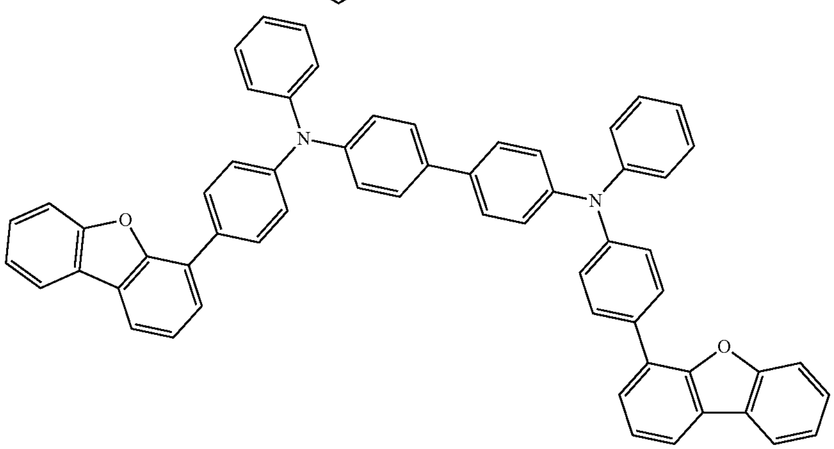
,
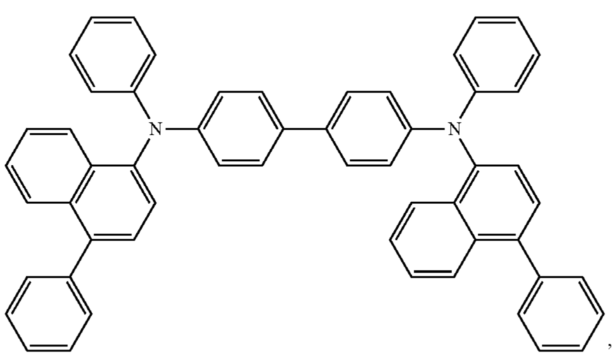
,

-continued
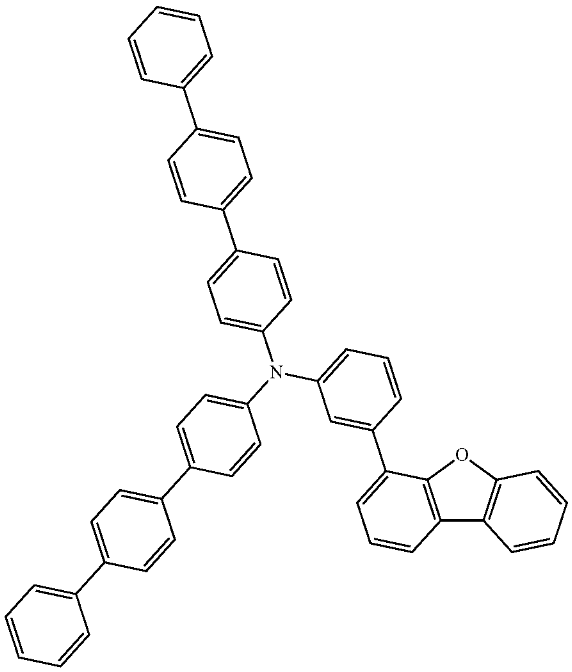
,
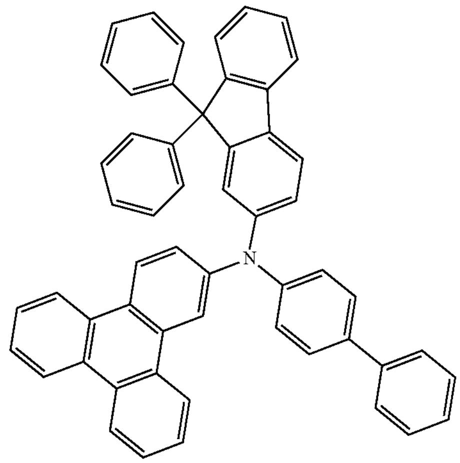
,
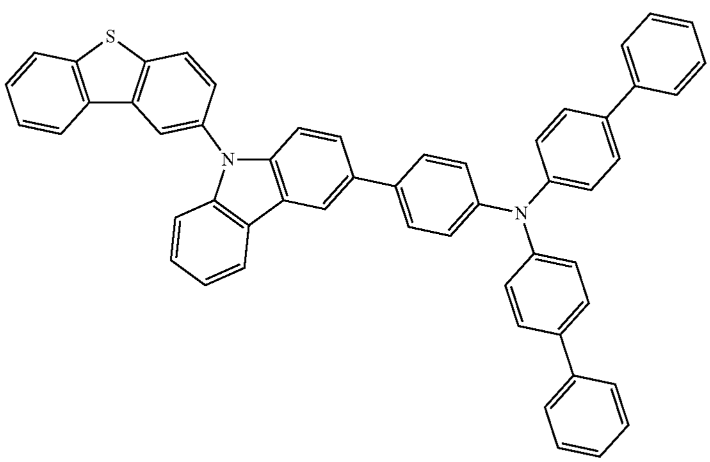
,
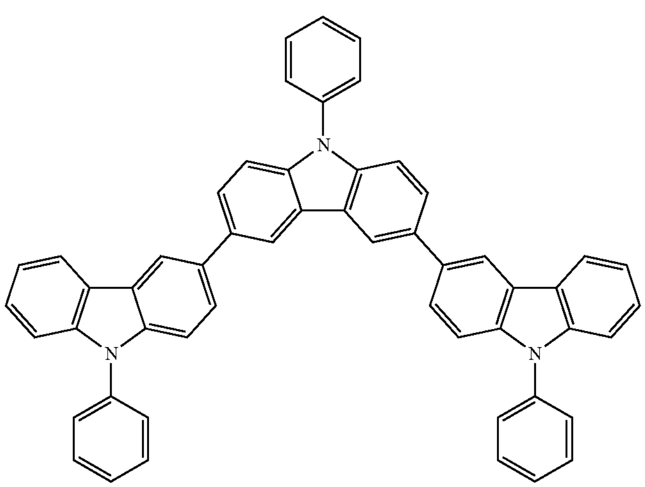
,
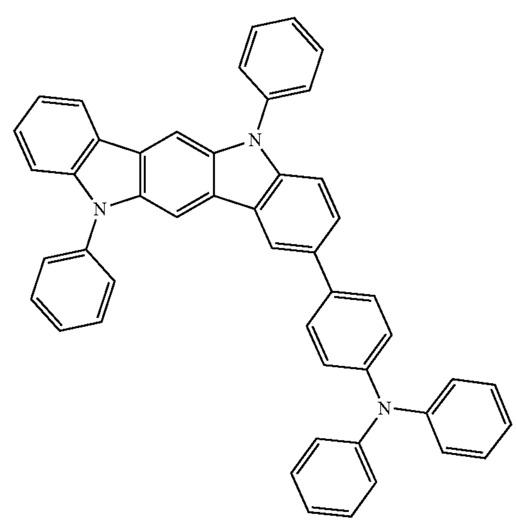
, -continued
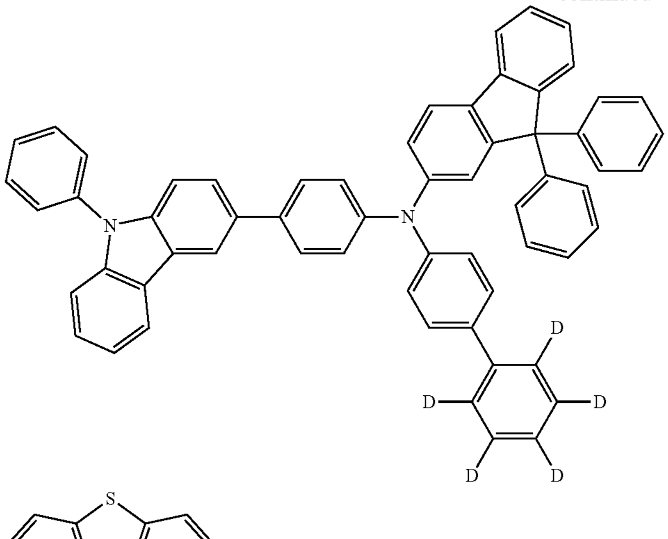
,
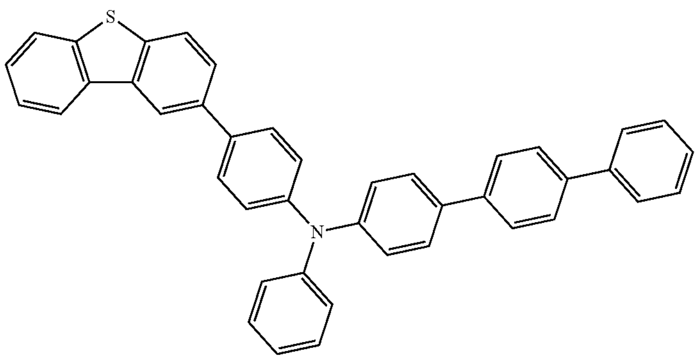
,
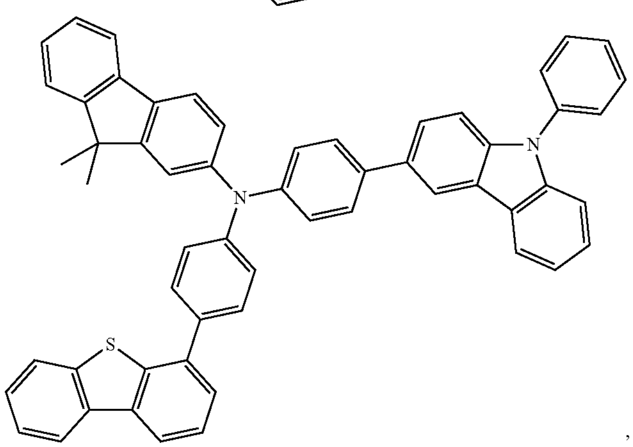
,
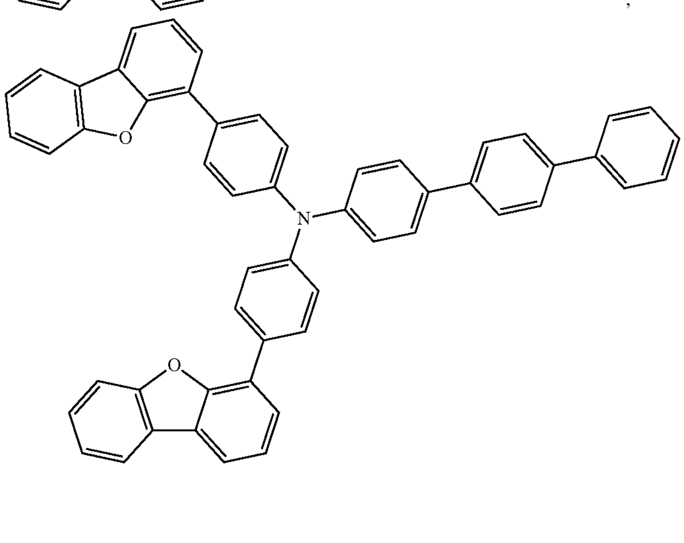
, -continued
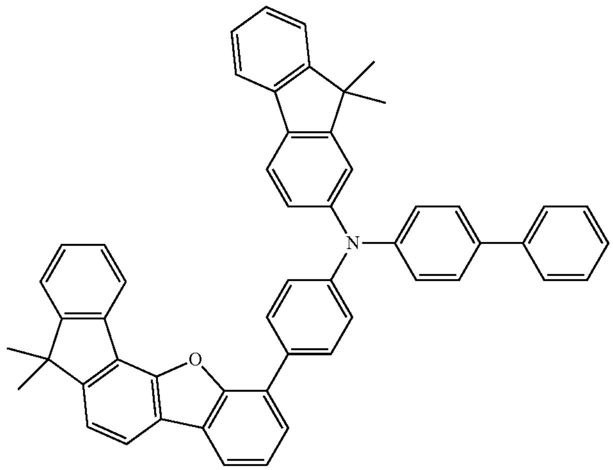
,
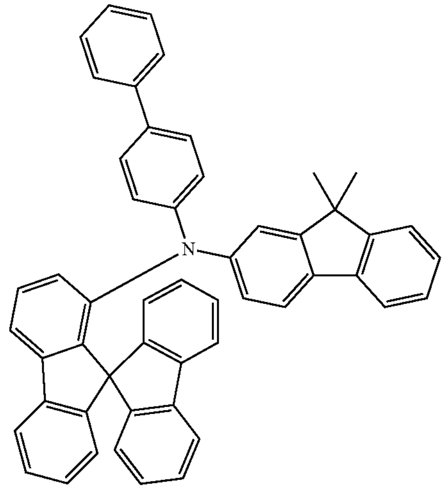
,
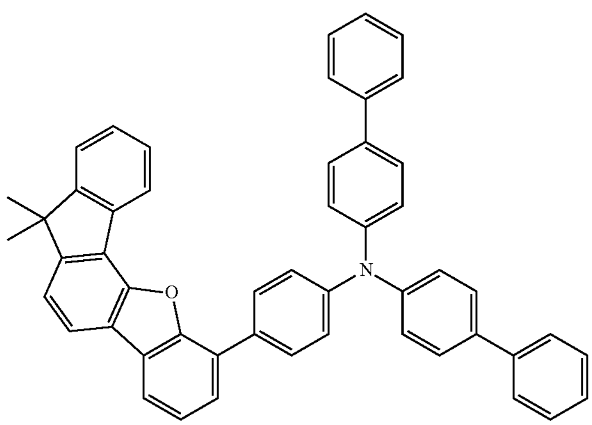
,
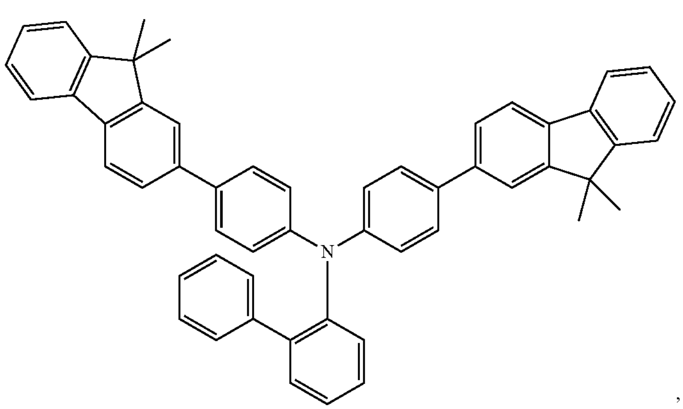
, -continued
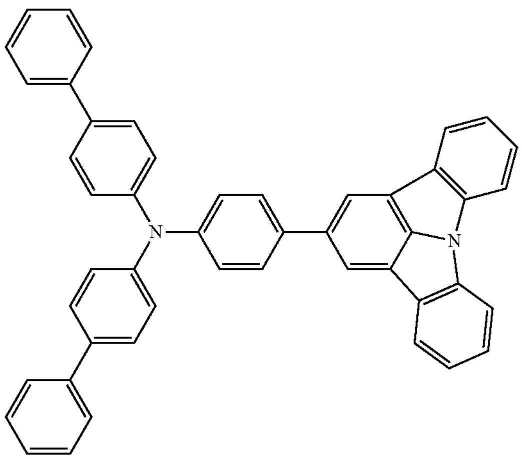
,
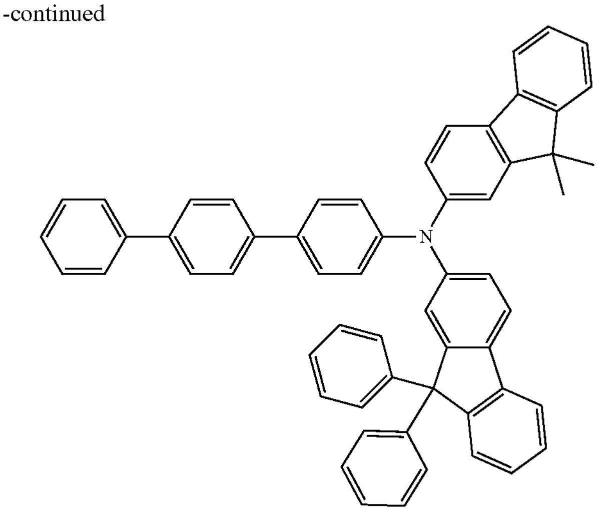
,
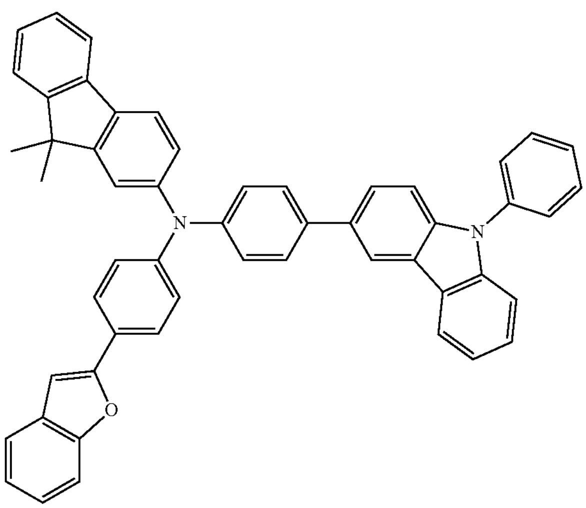
,
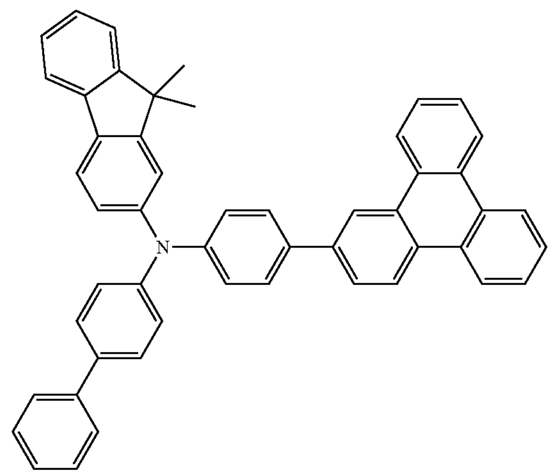
,
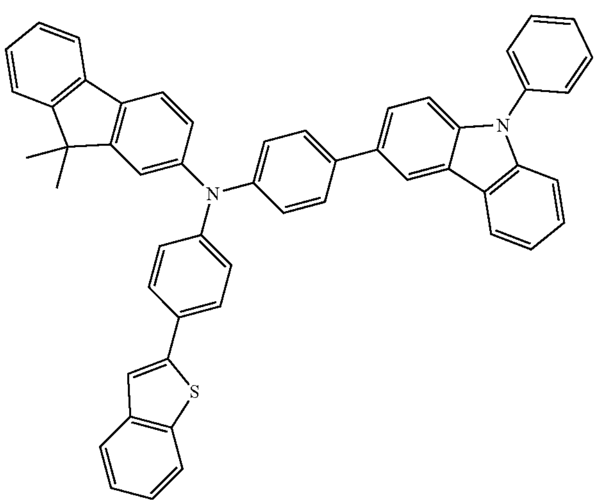
, -continued
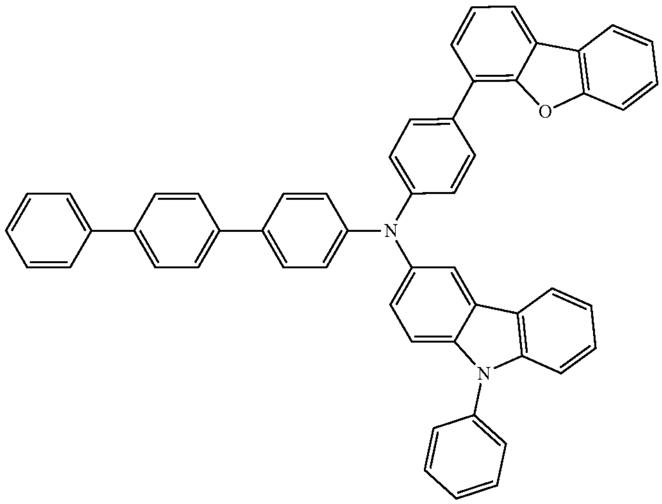
,
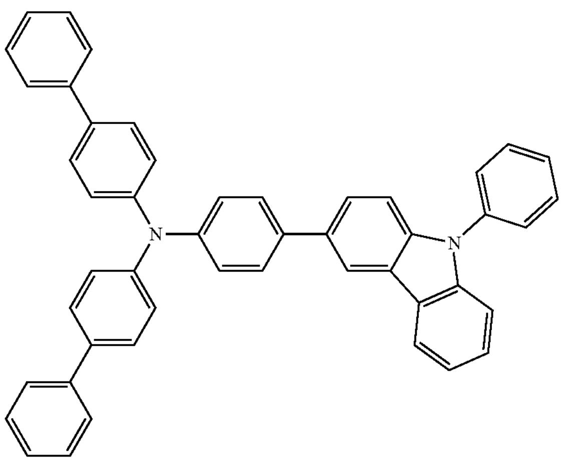
,
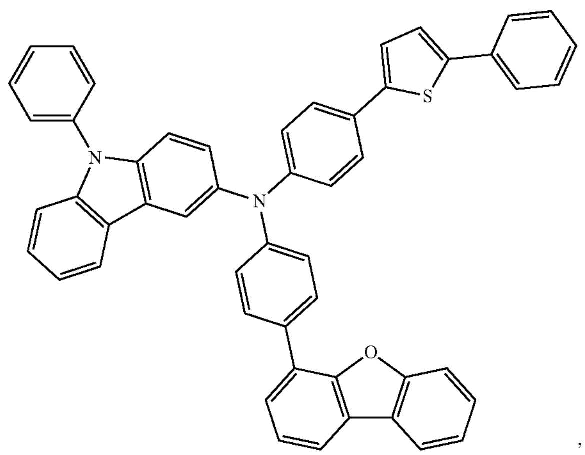
,
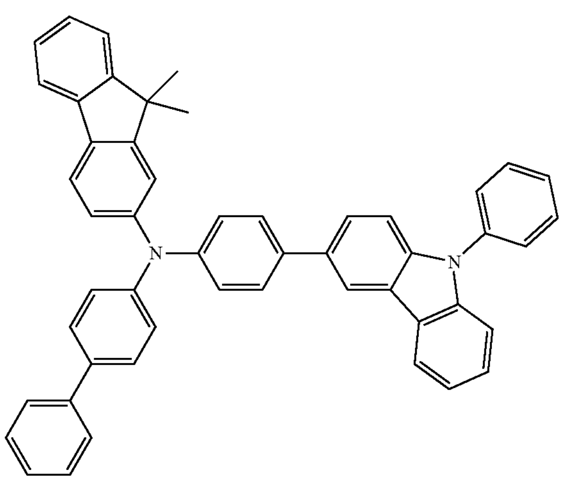
,
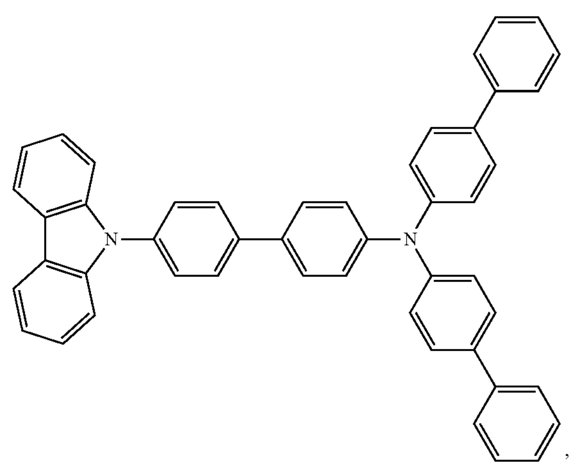
, -continued
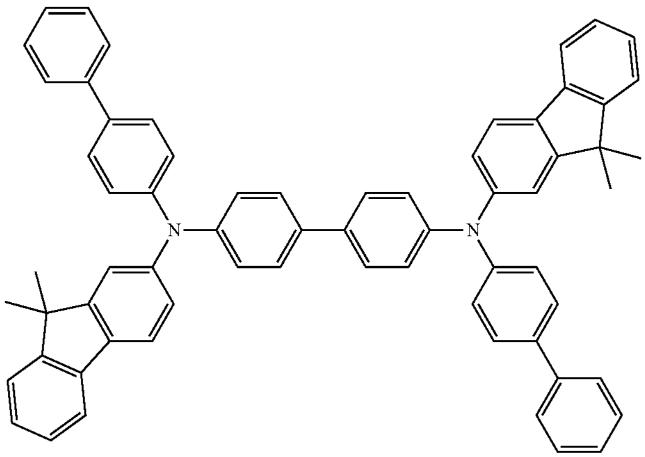
,
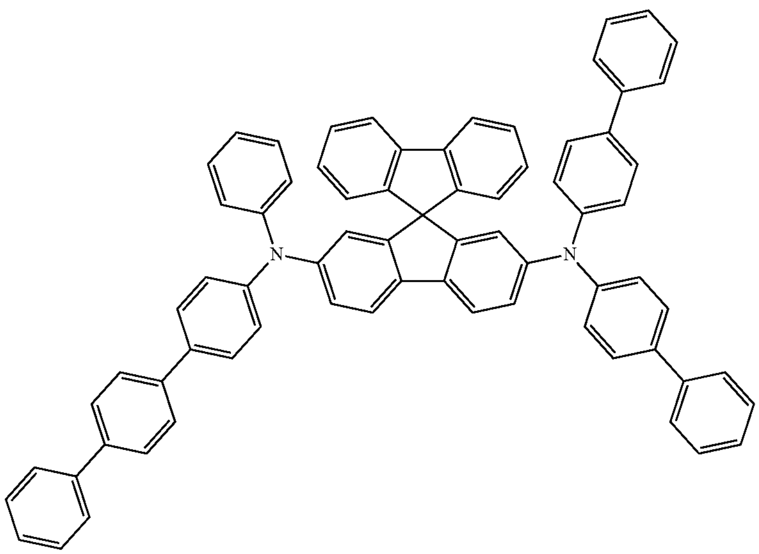
,
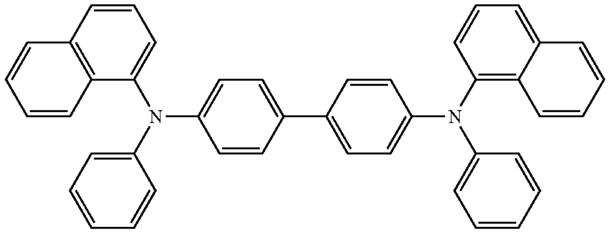
,
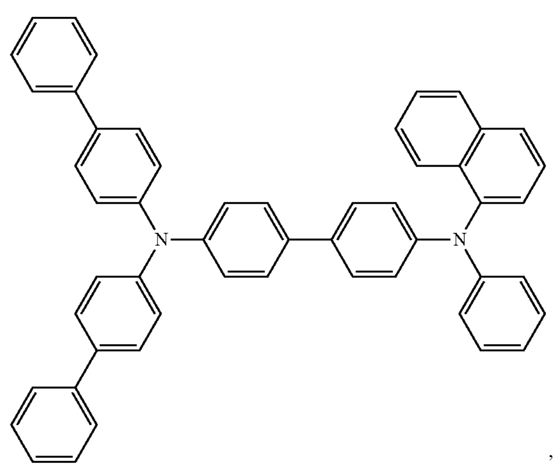
, -continued
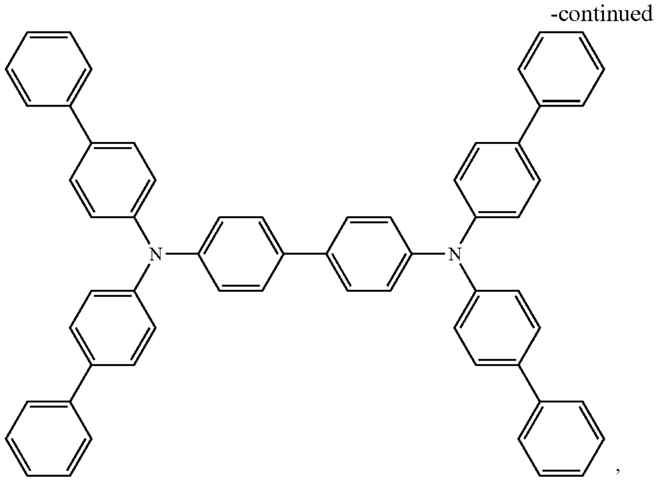
,
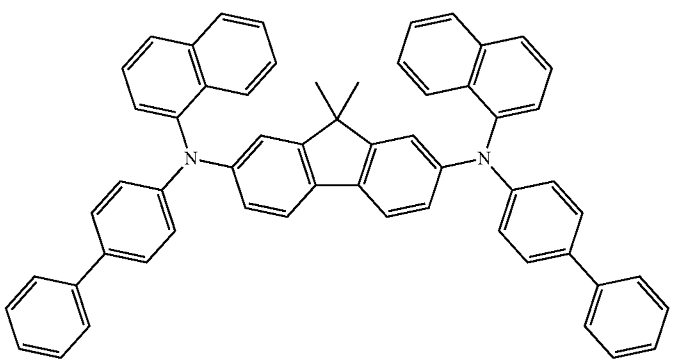
,
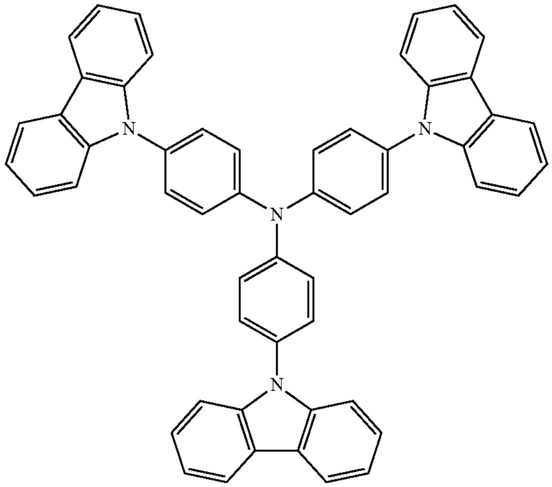
,
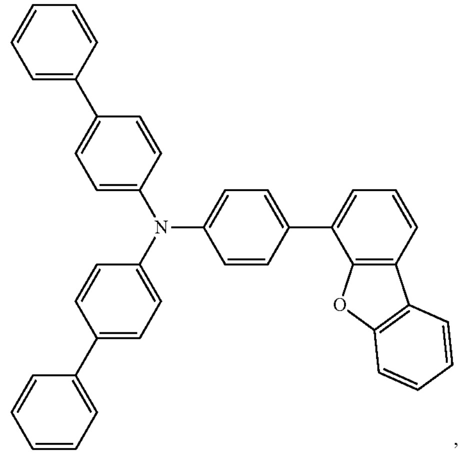
, -continued

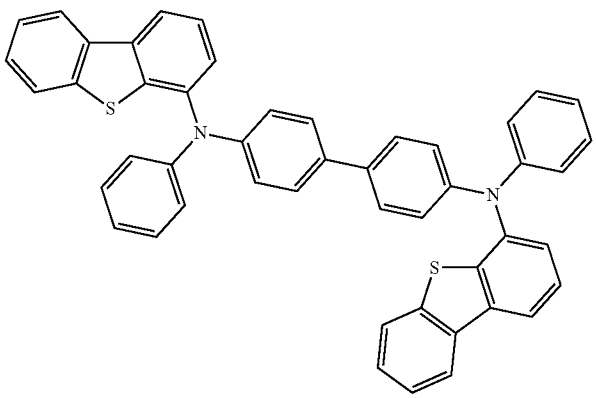

,

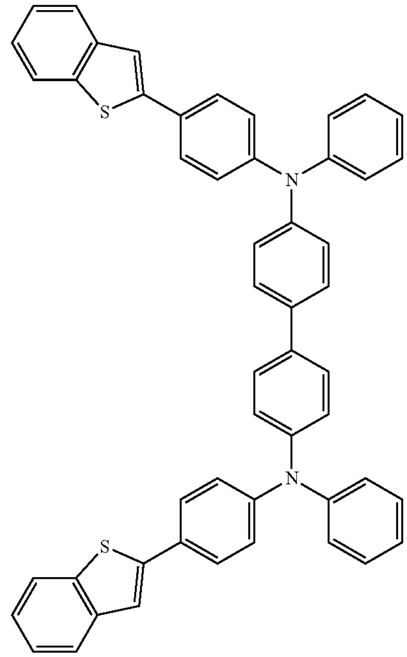

, and

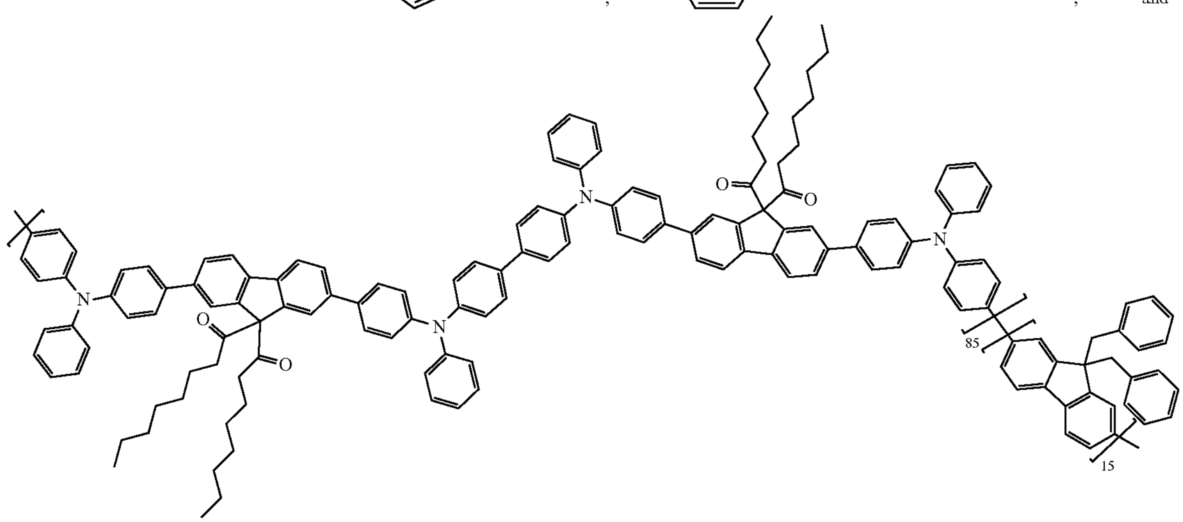

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

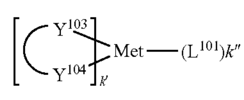

wherein Met is a metal; ($Y^{103}$—$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

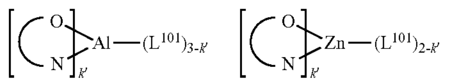

wherein (O—N) is a bidentate ligand, having metal coordinated to atoms O and N.

In another aspect, Met is selected from Ir and Pt. In a further aspect, ($Y^{103}$—$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

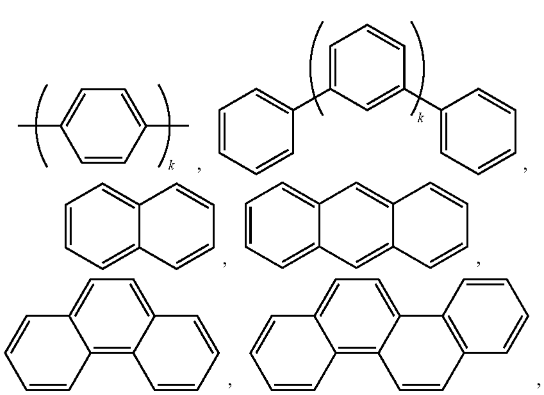

-continued

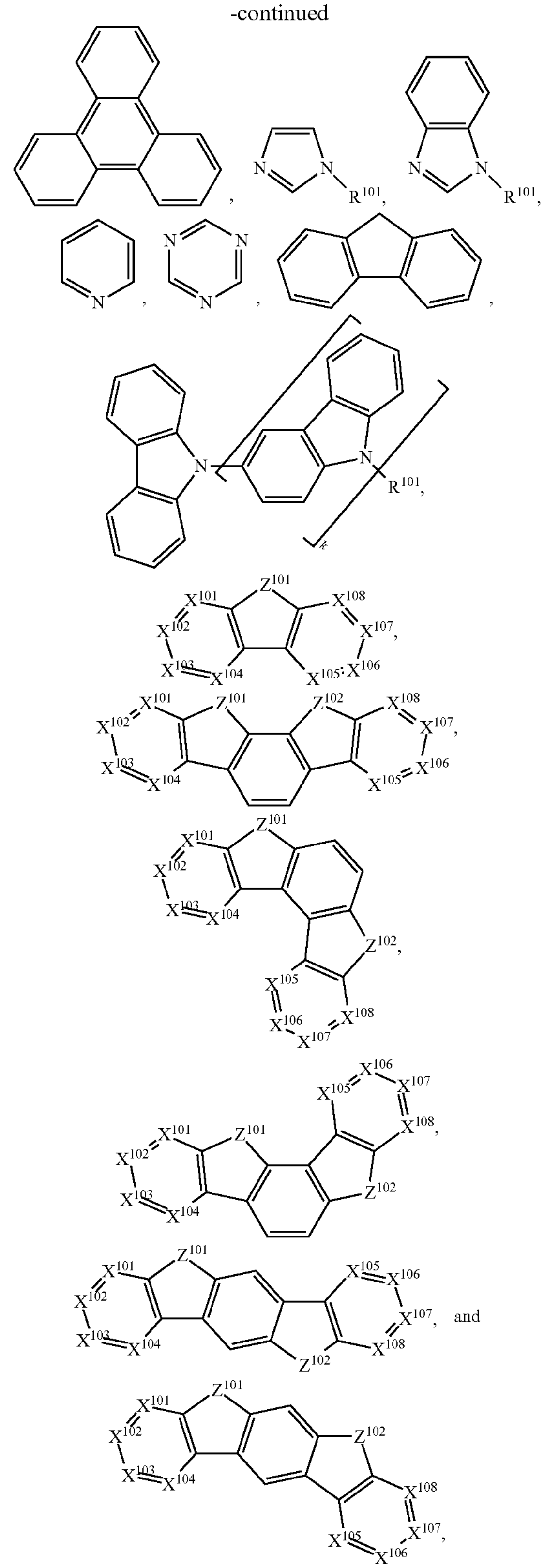

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

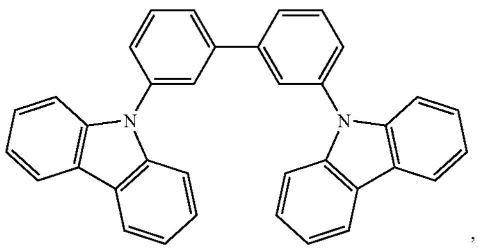

,

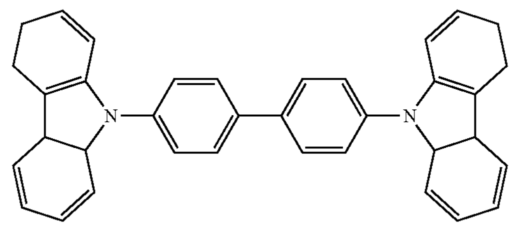

,

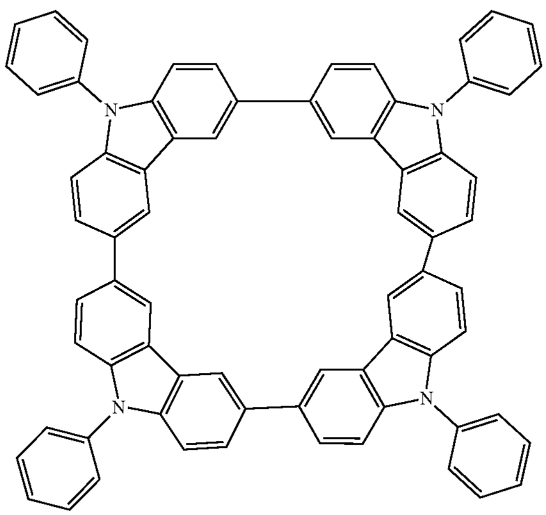

,

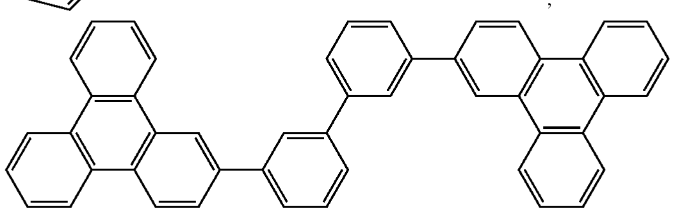

,

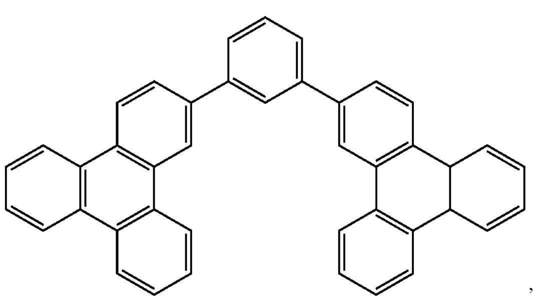

,

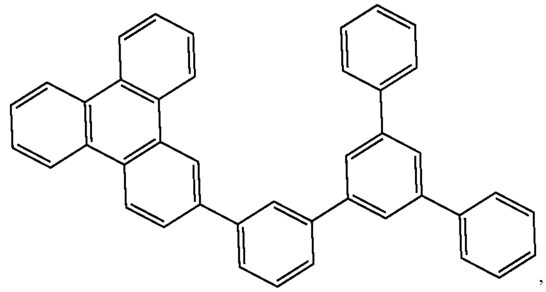

,

-continued
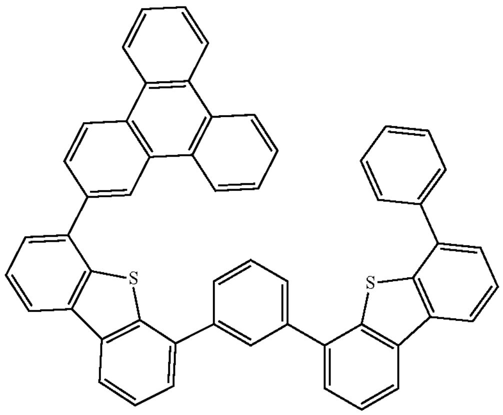
,
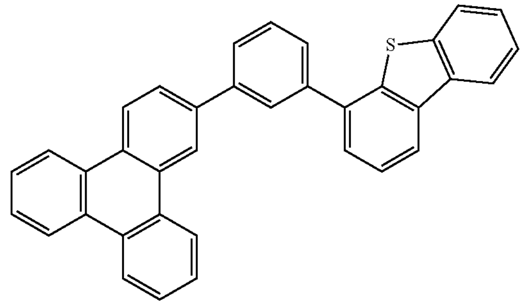
,
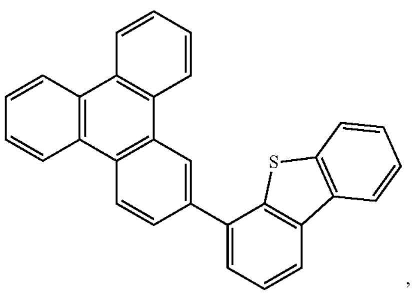
,
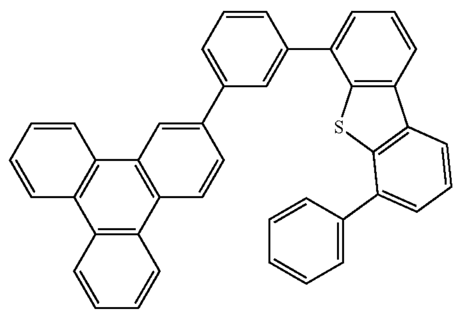
,
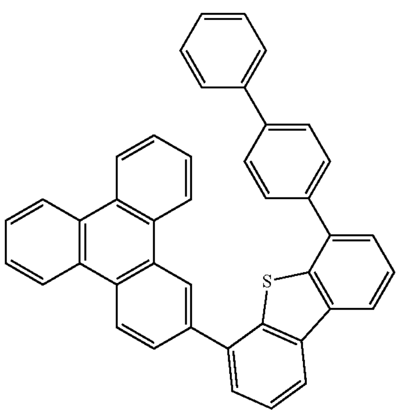
,
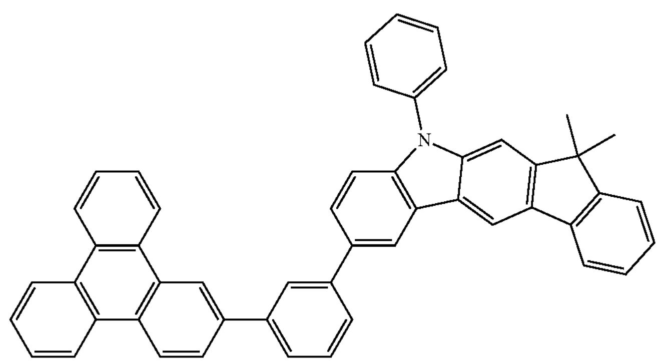
,
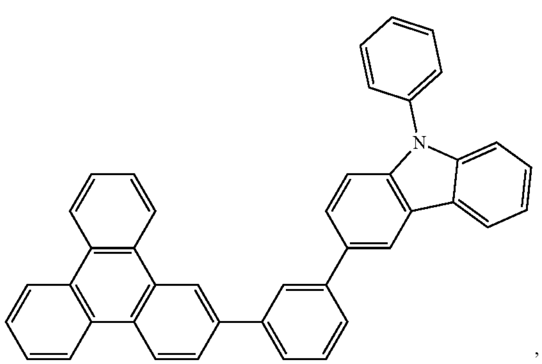
,
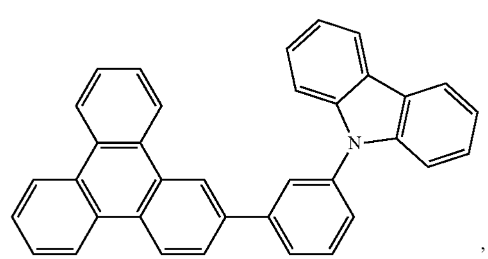
, -continued
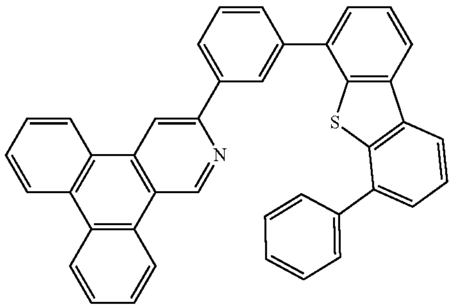
,
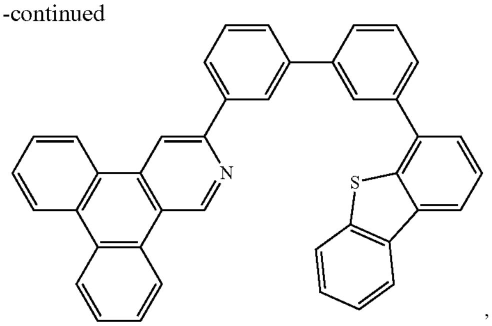
,
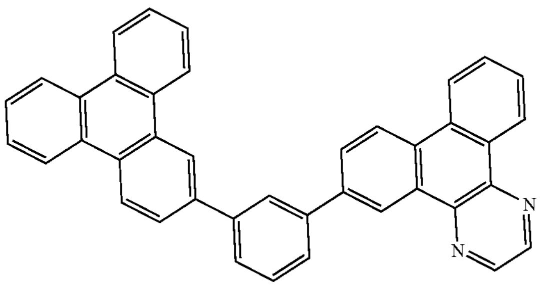
,
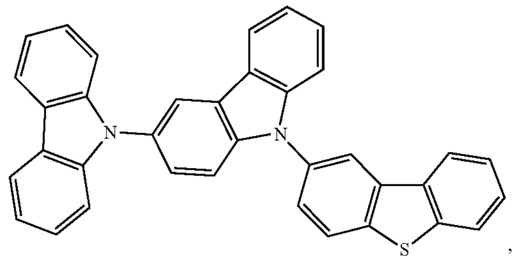
,
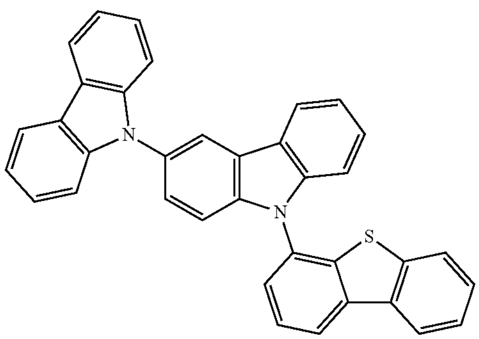
,
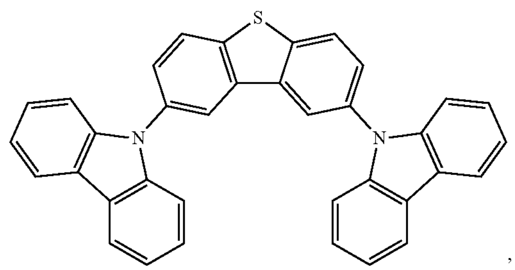
,
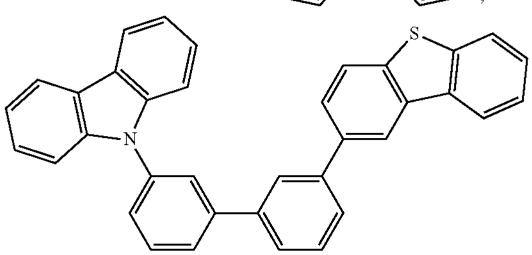
,
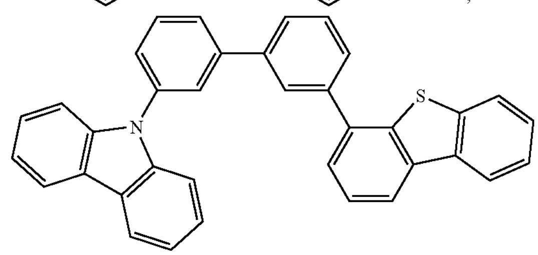
,
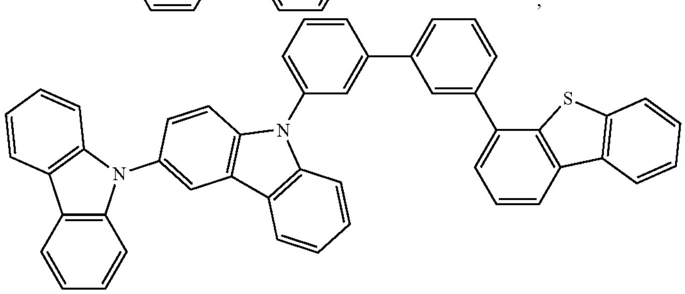
,
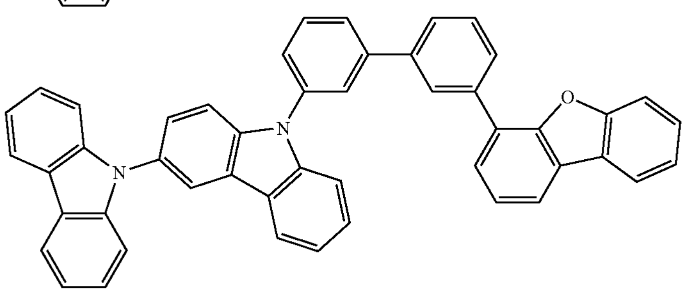
, -continued
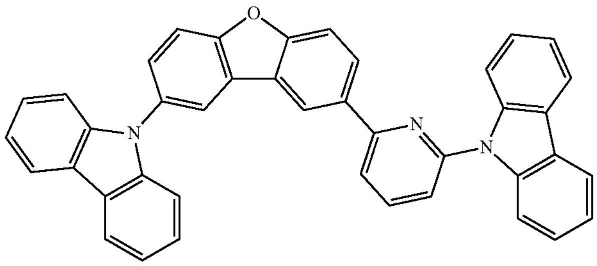
,
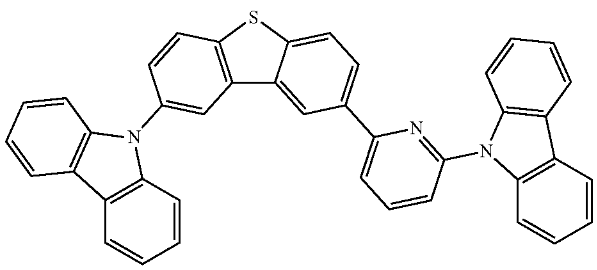
,
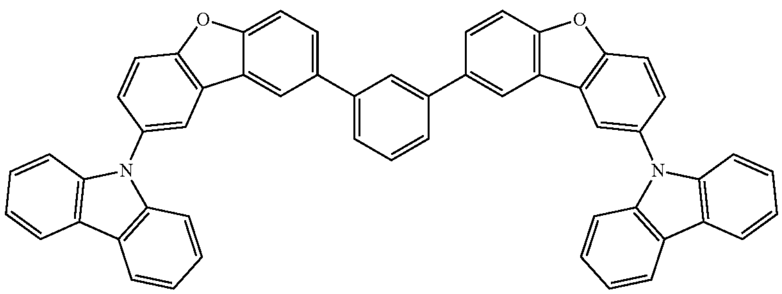
,
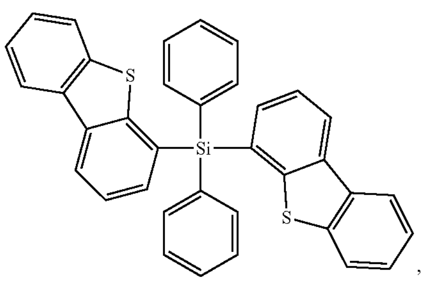
,
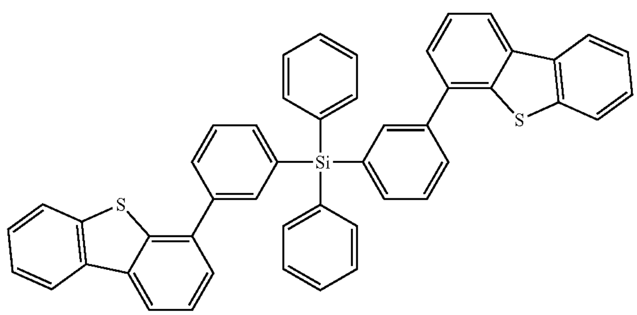
,
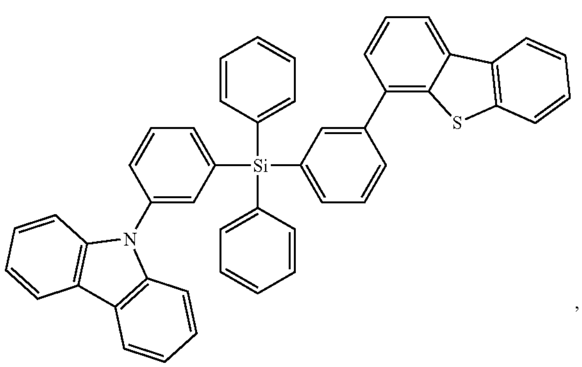
, -continued
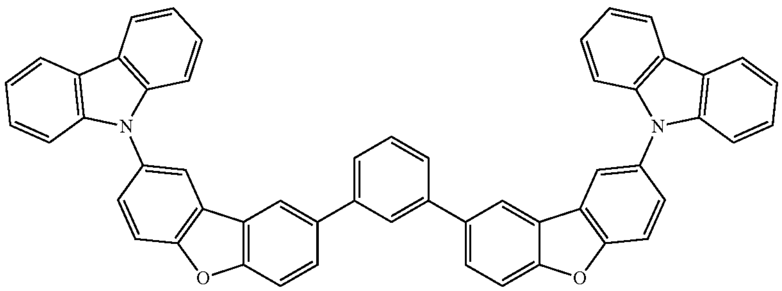
,
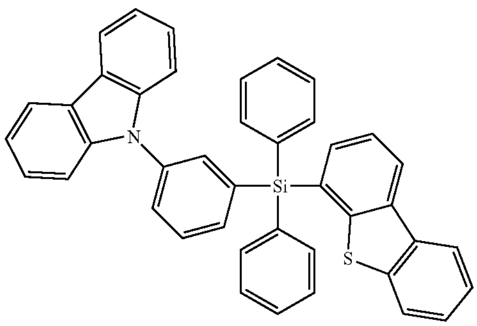
,
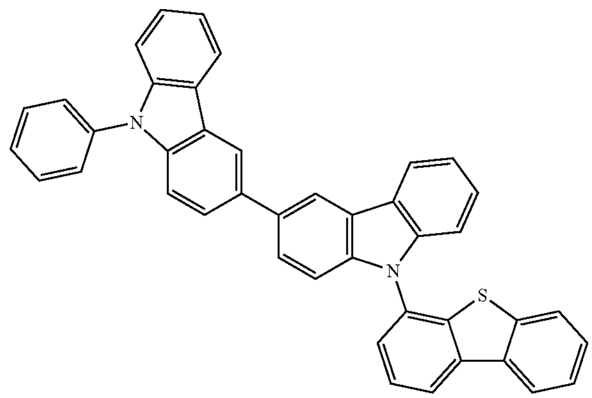
,
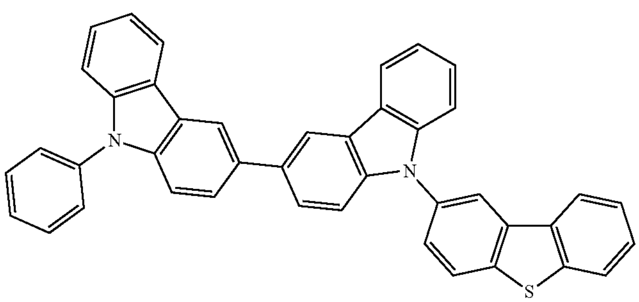
,
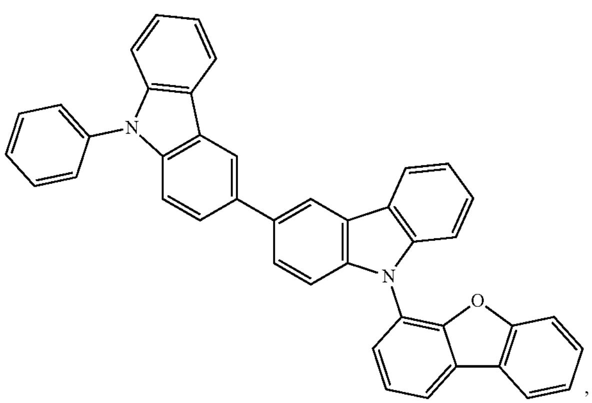
, -continued
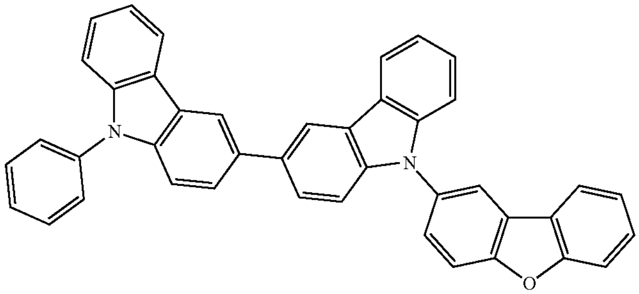
,
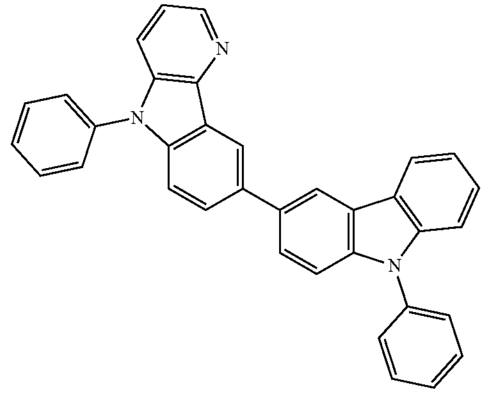
,
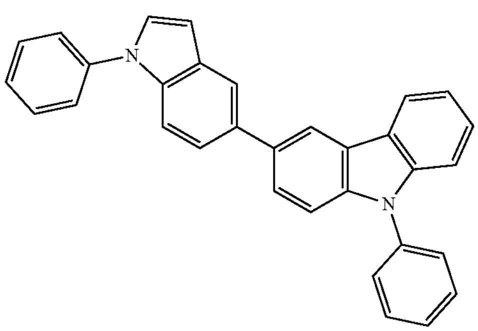
,
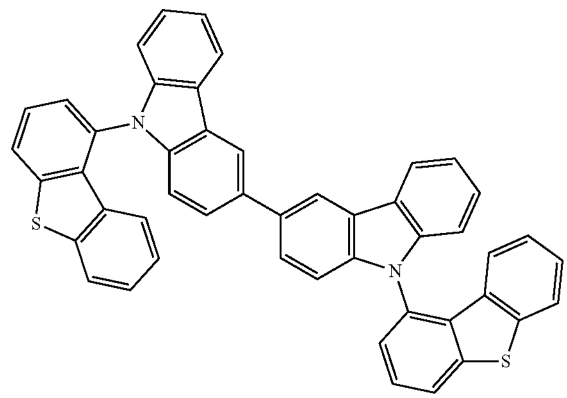
,
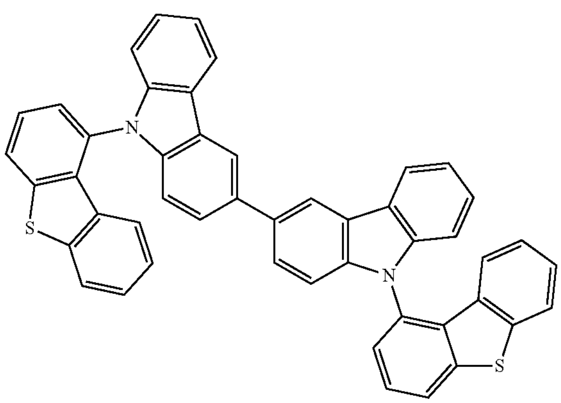
,
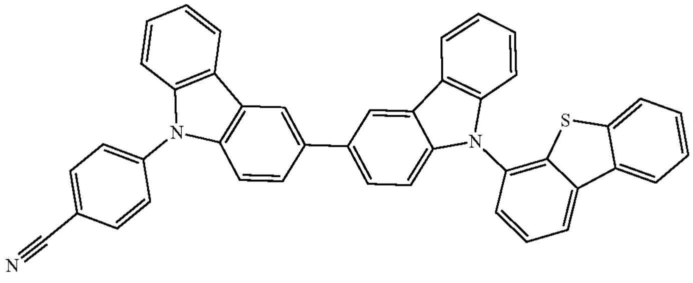
, -continued
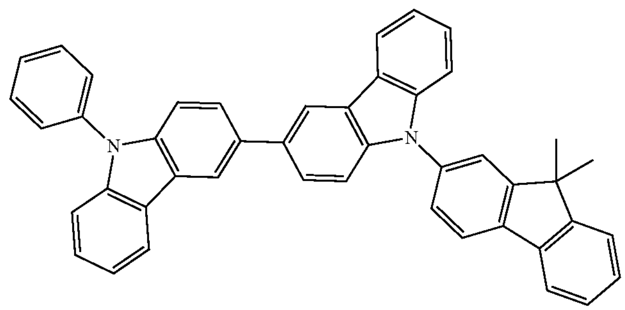
,
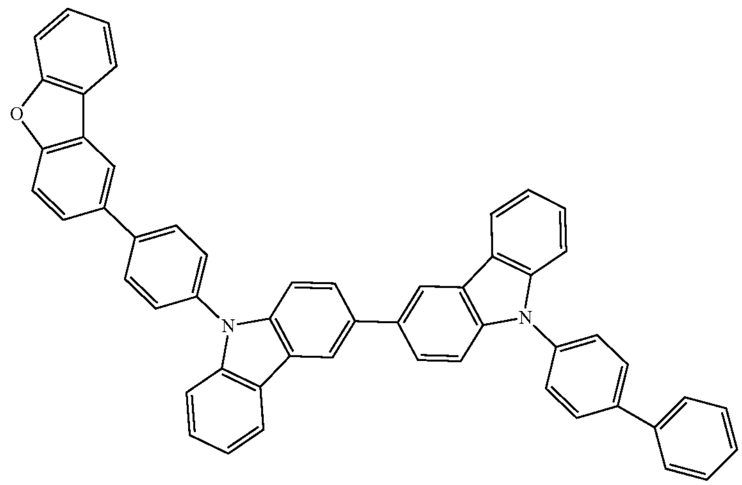
,
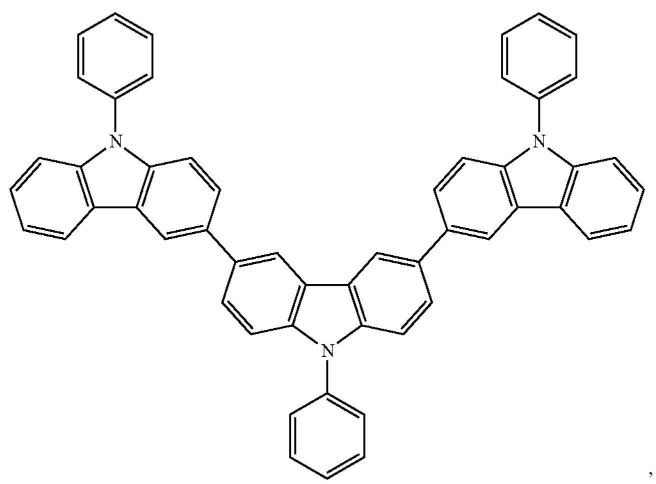
,
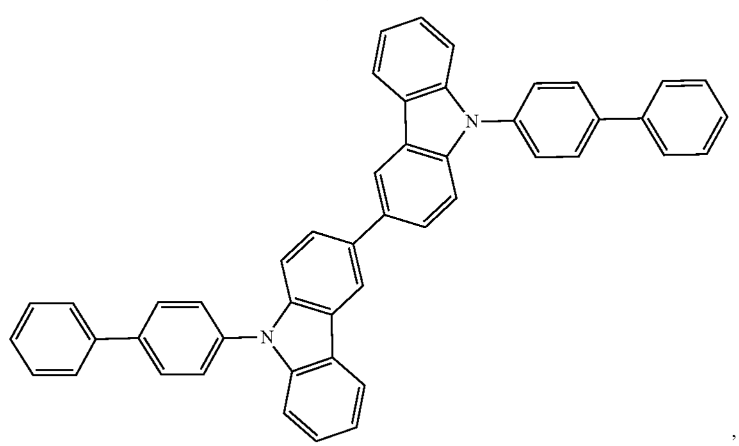
, -continued
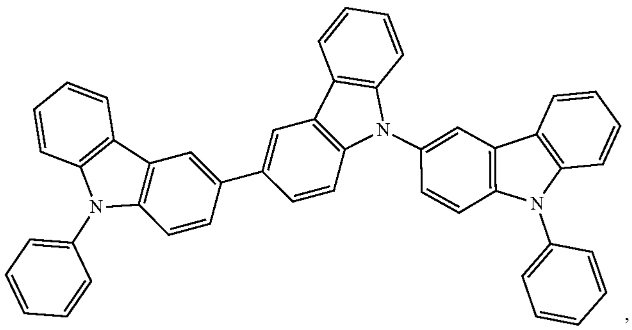
,
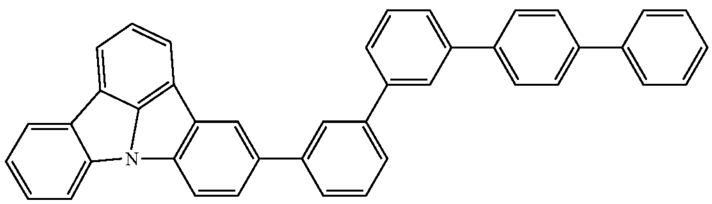
,
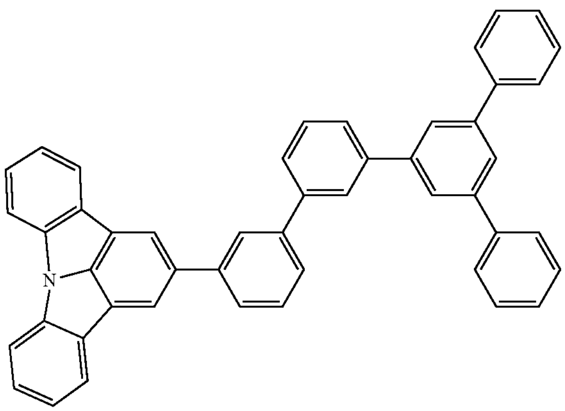
,
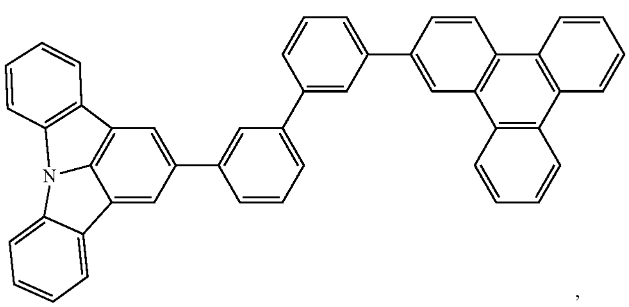
,
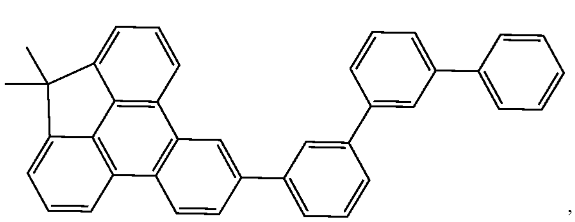
,
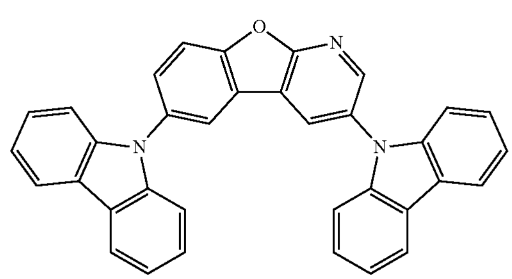
, -continued
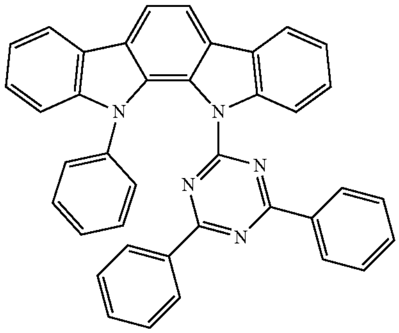
,
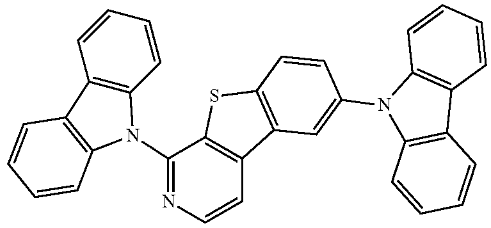
,
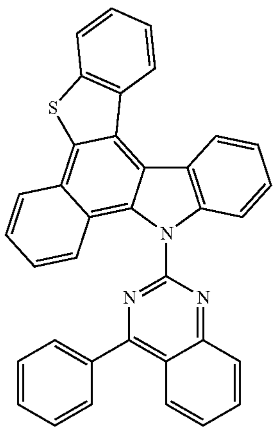
,
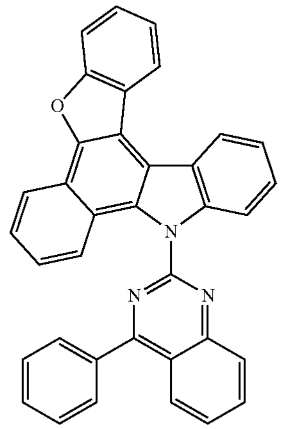
,
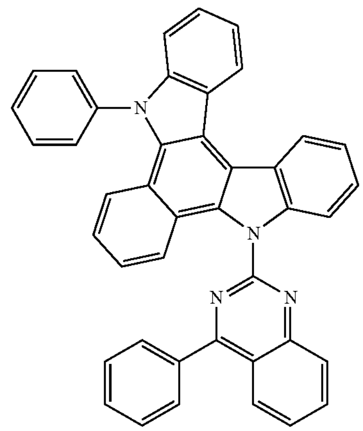
, ,
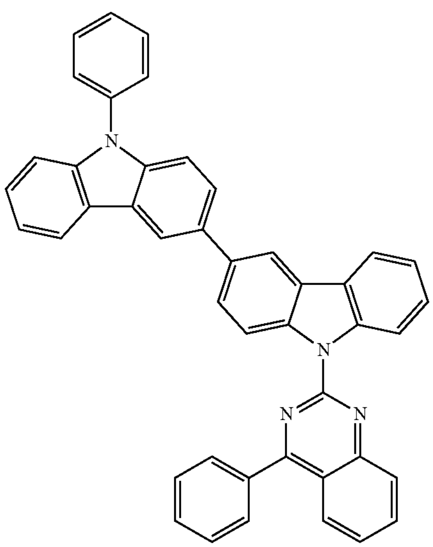
,
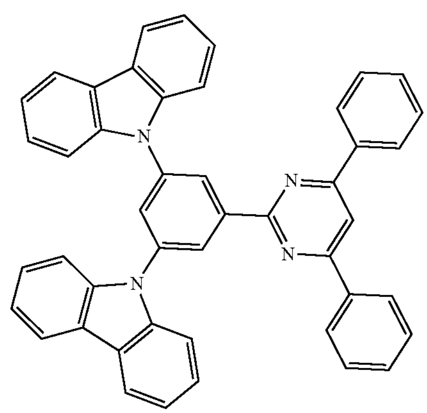
,
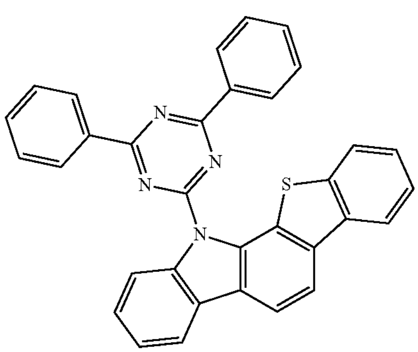
,
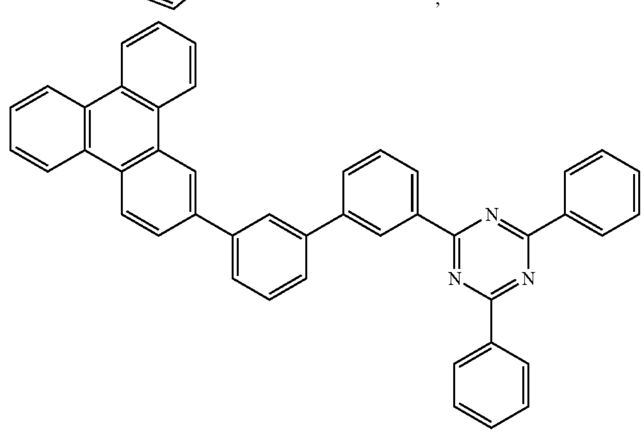
, -continued
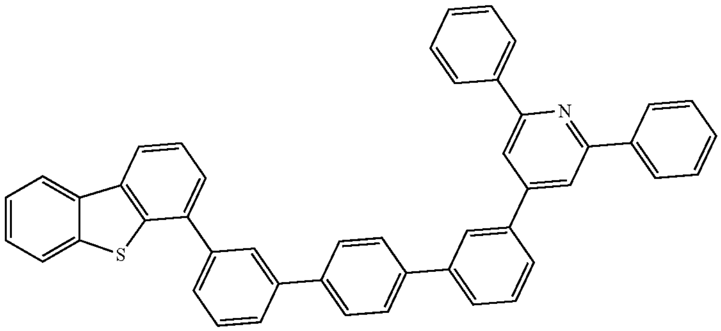
,
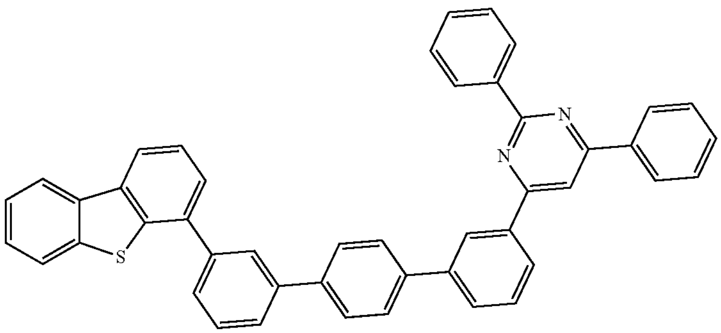
,
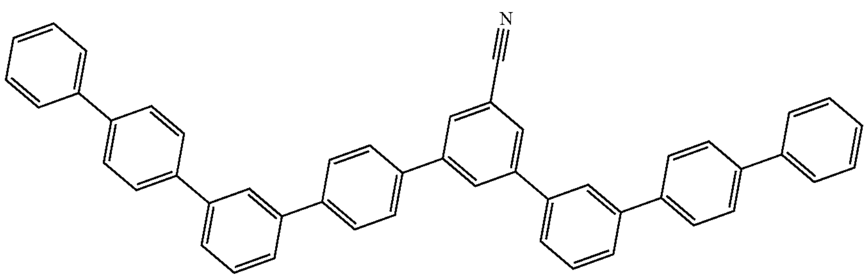
,
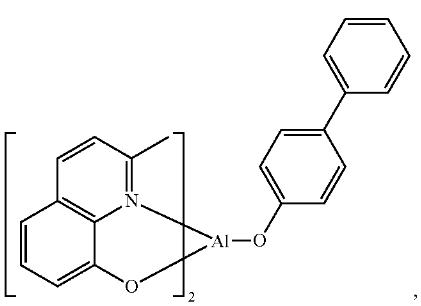
,
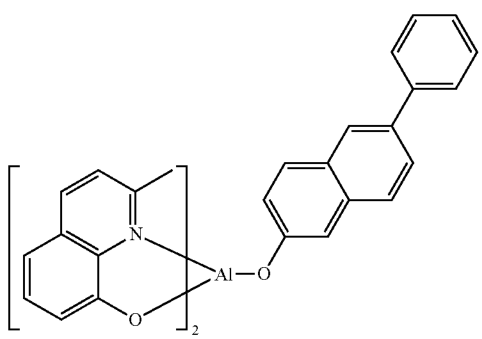
,
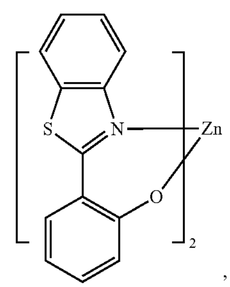
,
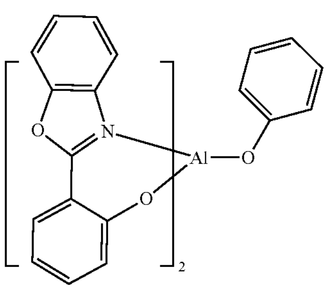
,
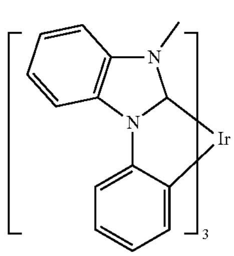
,
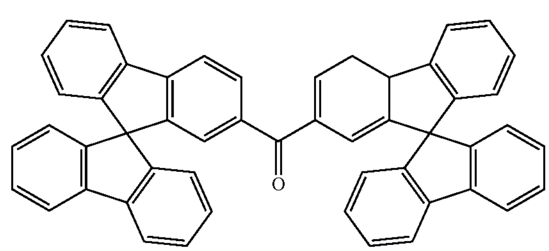
, -continued

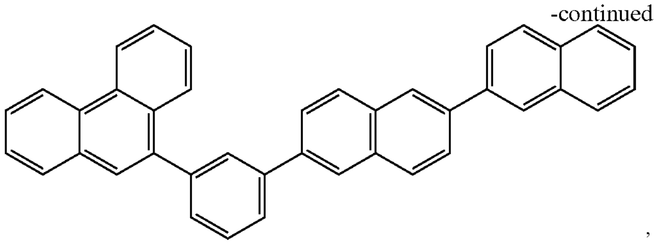

,

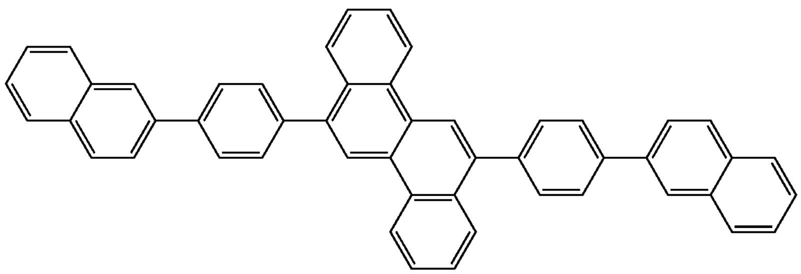

, and

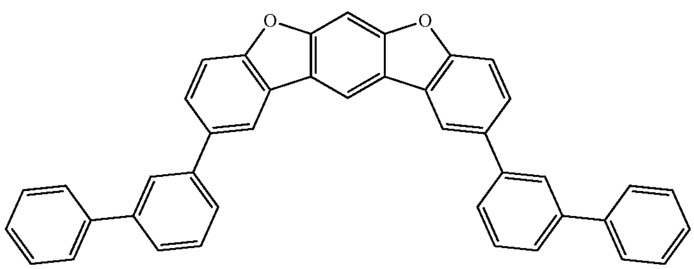

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
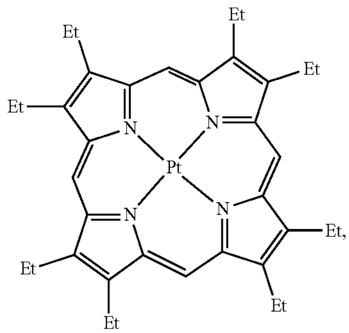
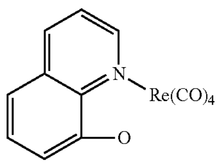
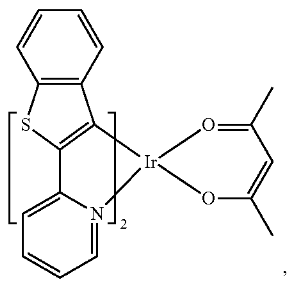
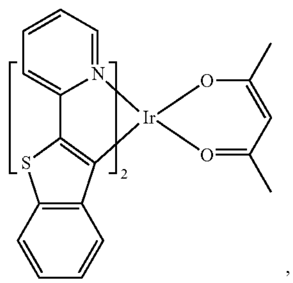
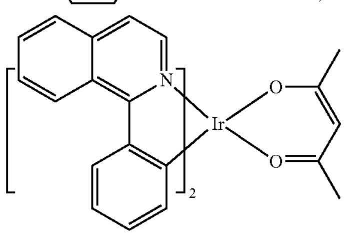
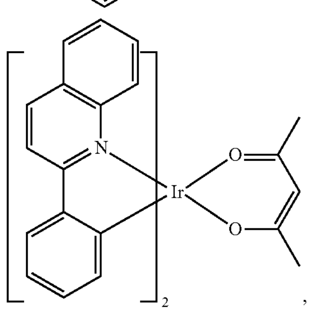
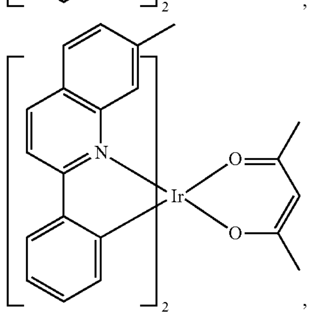
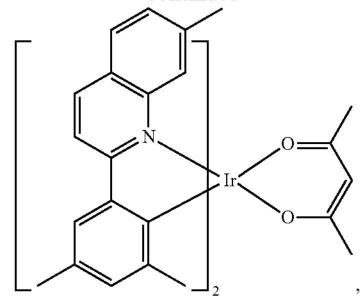
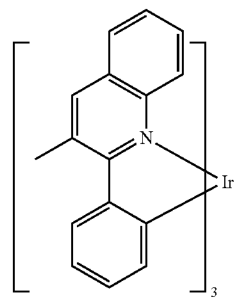
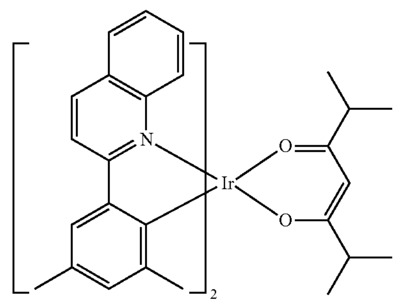
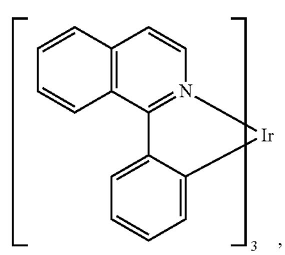
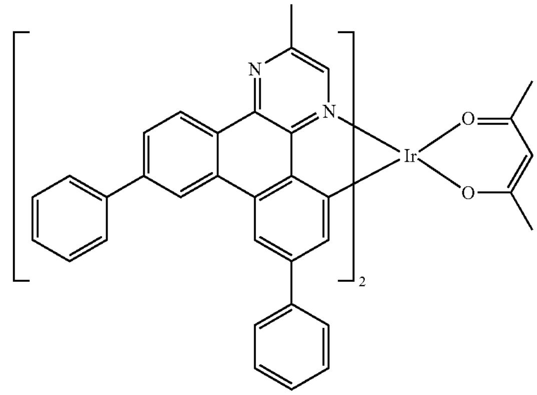

-continued
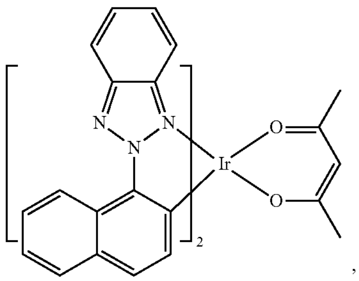
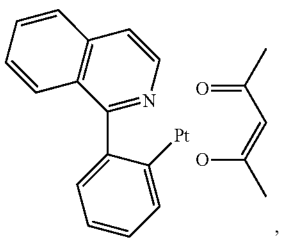
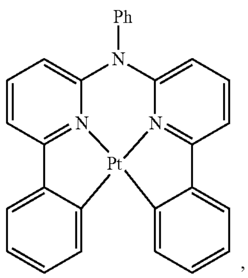
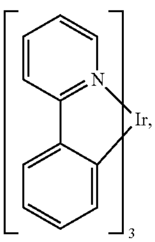
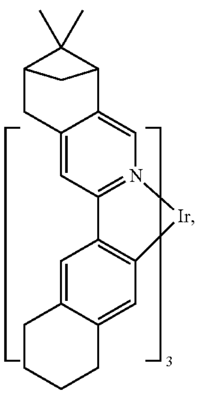
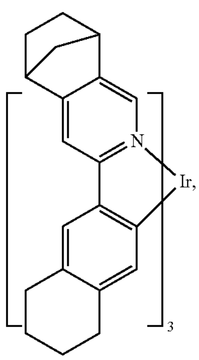
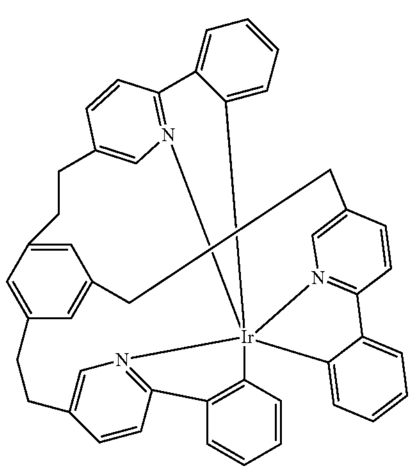
-continued
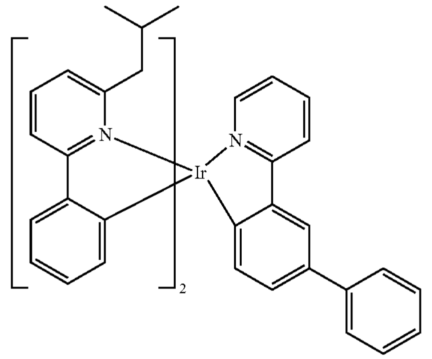
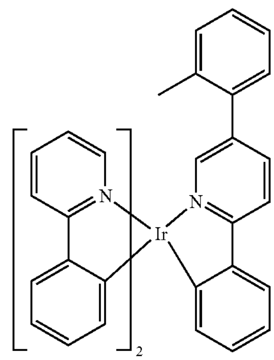
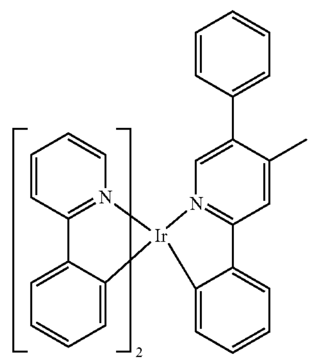
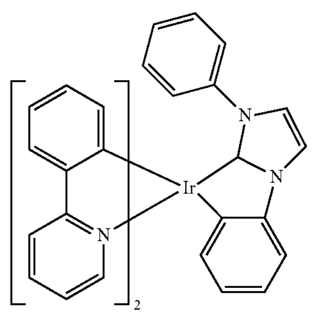
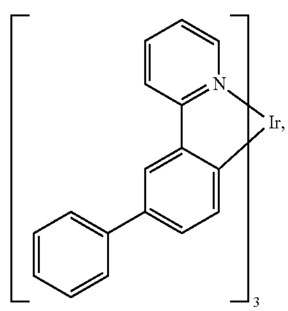
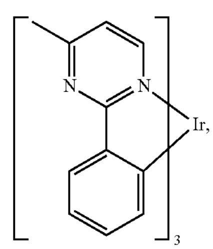

-continued
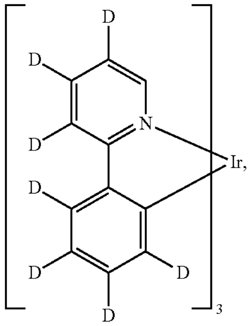
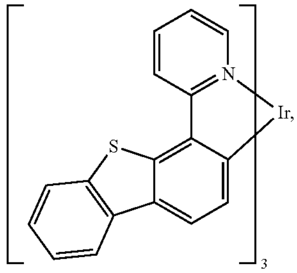
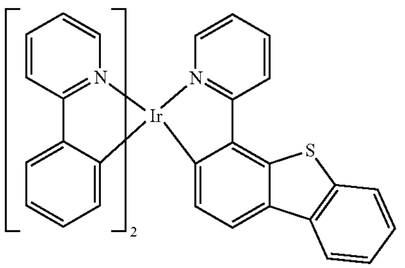
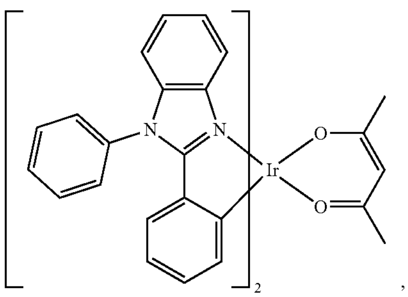
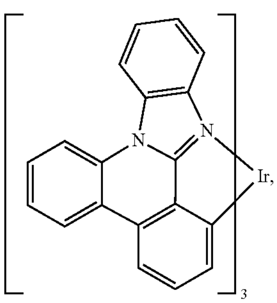
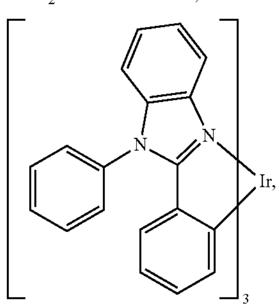
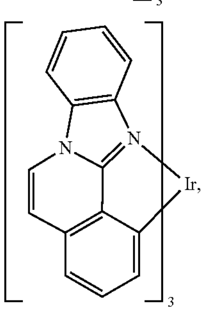
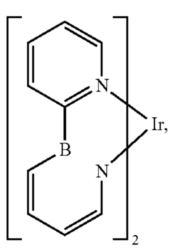
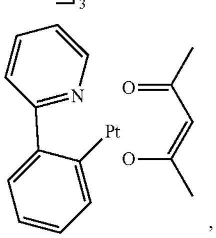
-continued
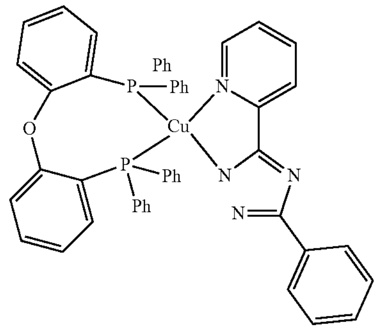
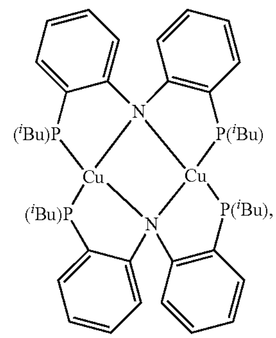
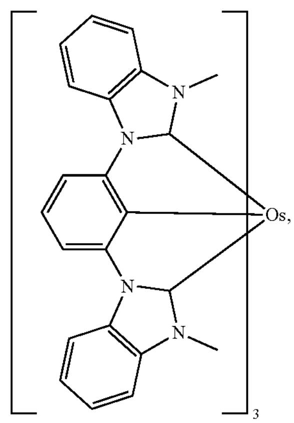
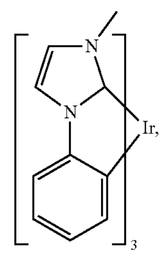
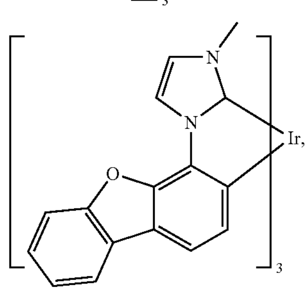
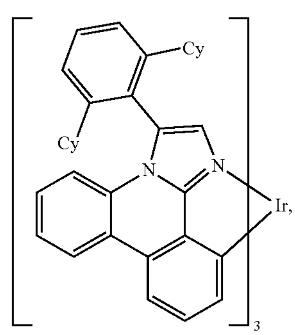

-continued
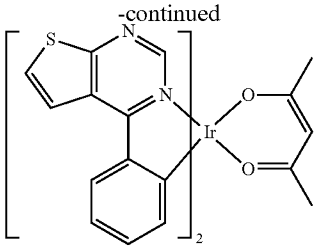
,
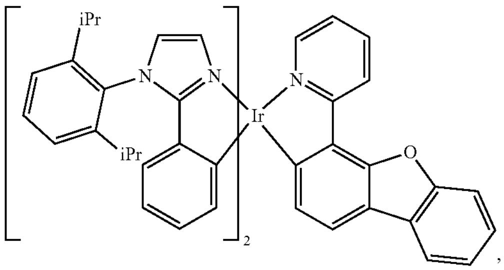
,
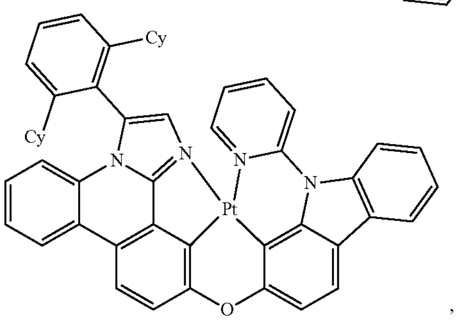
,
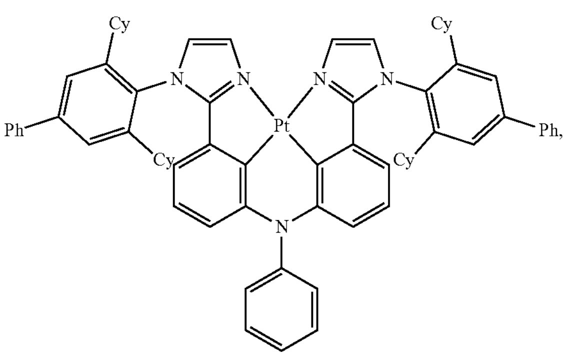
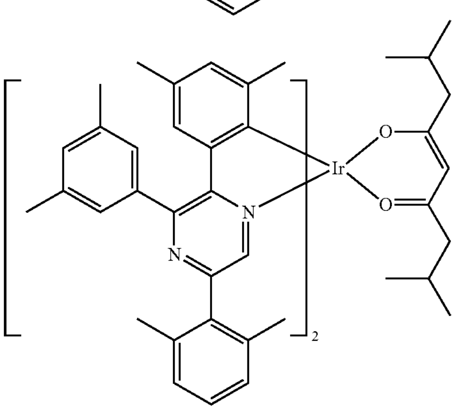
,
-continued
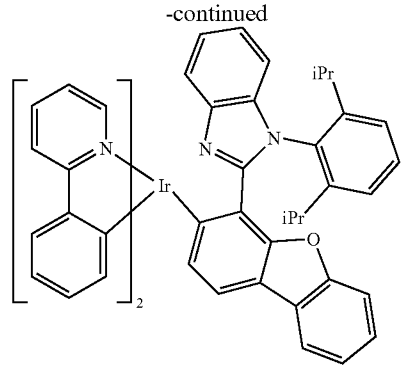
,
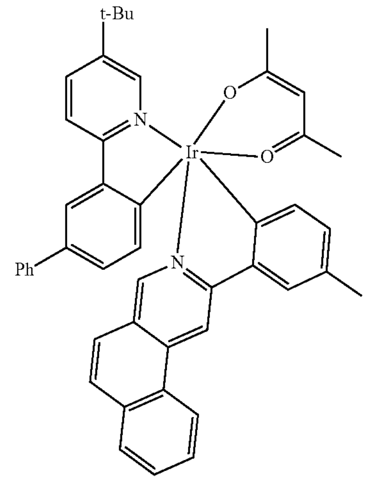
,
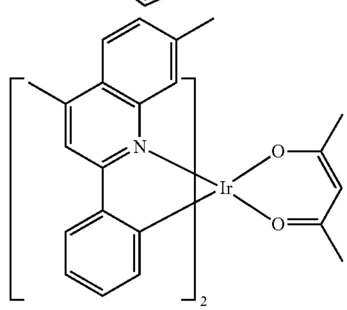
,
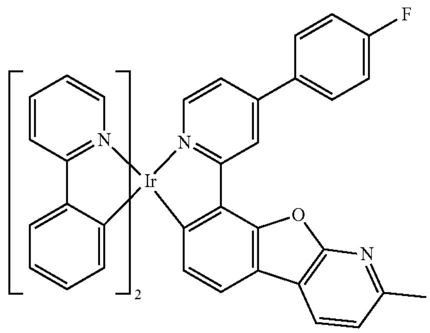
,
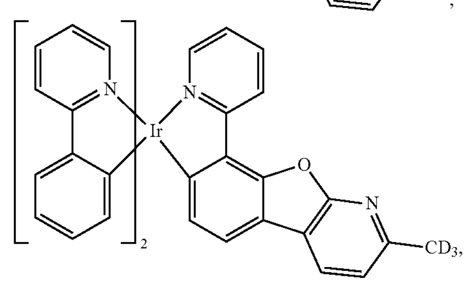

-continued
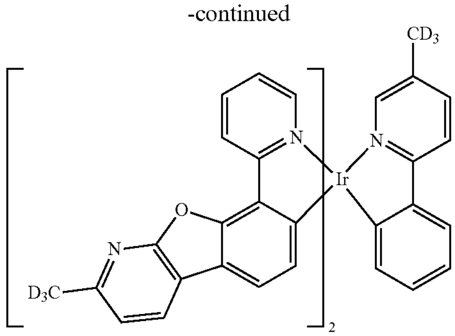
,
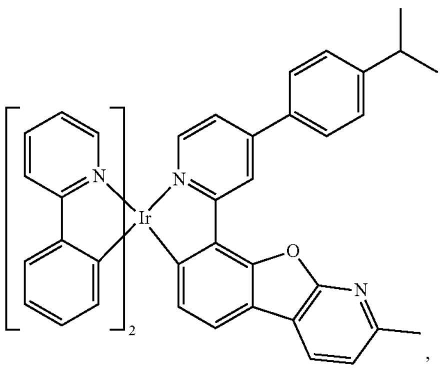
,
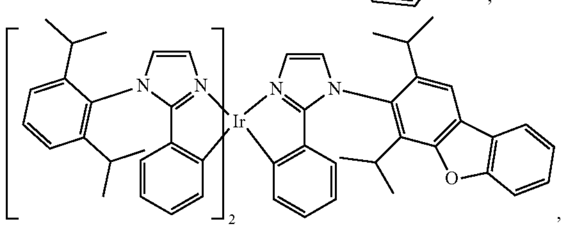
,
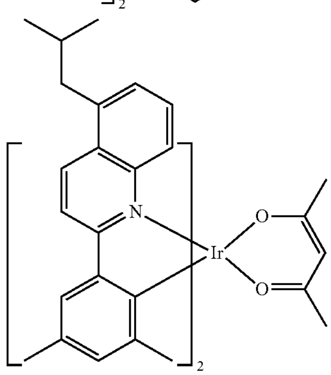
,
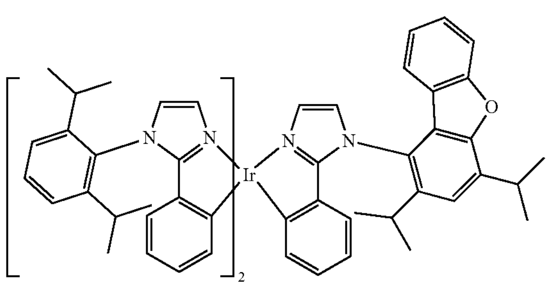
,
-continued
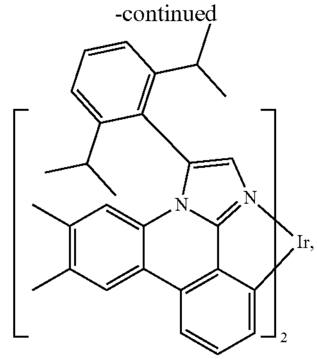
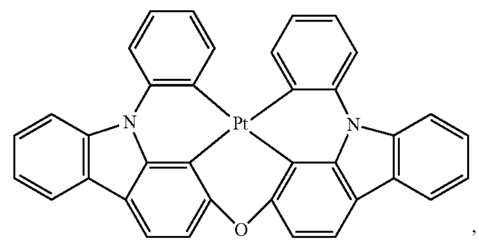
,
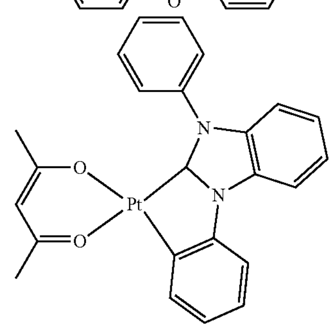
,
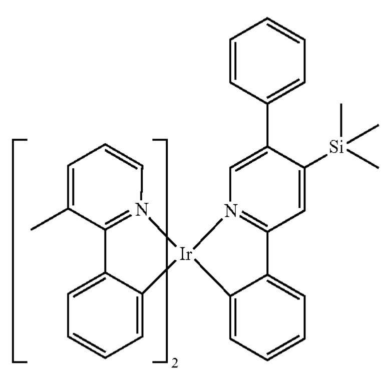
,
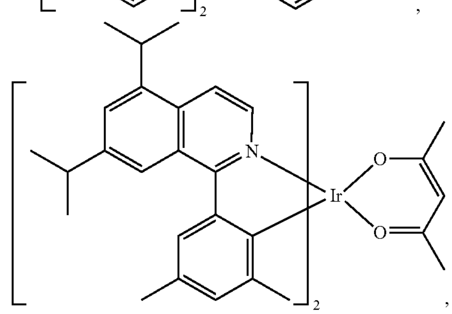
, -continued
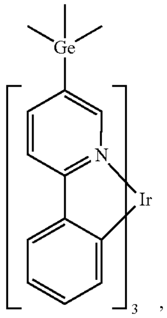
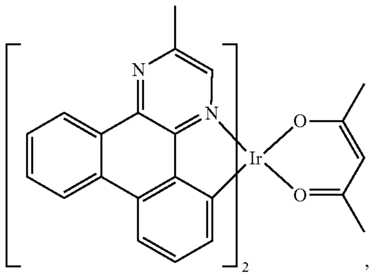
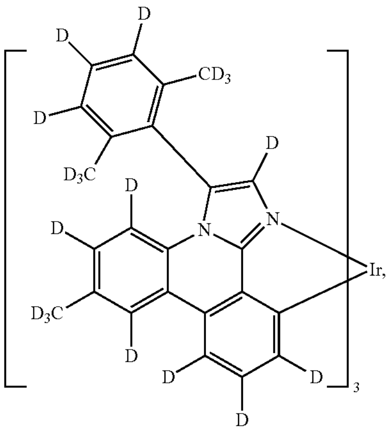
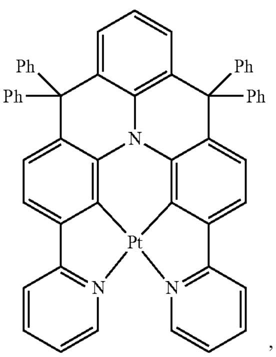
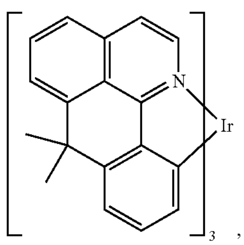
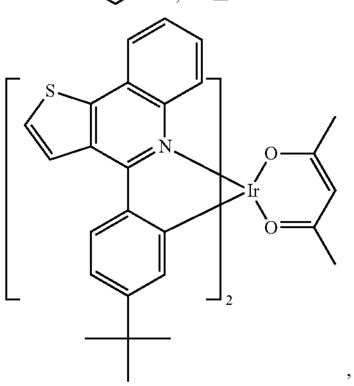
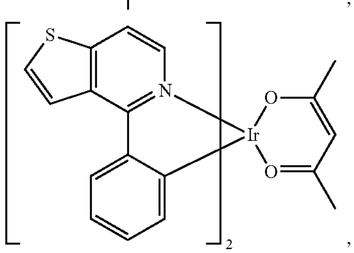
-continued
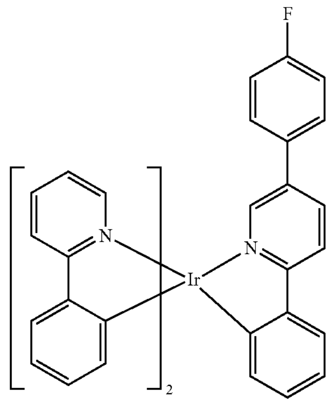
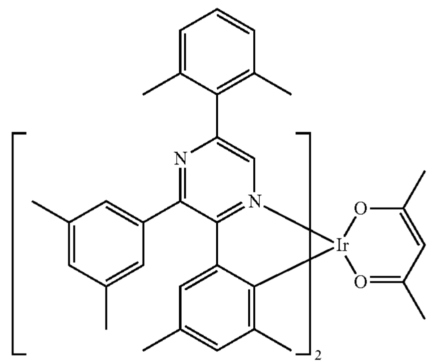
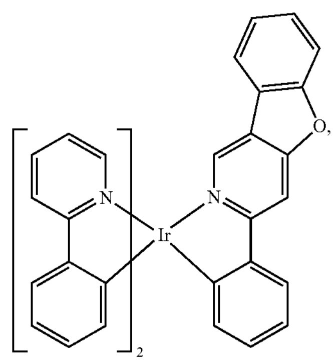
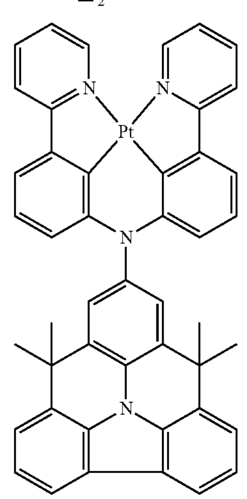

-continued
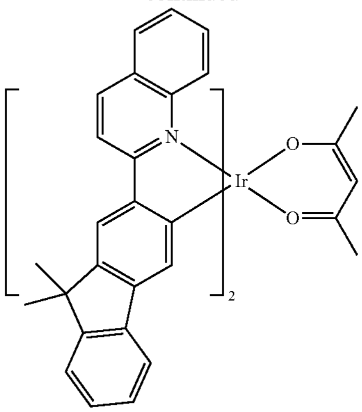
,
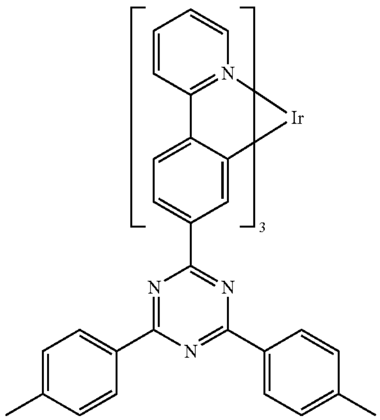
,
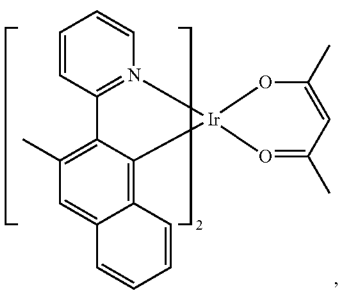
,
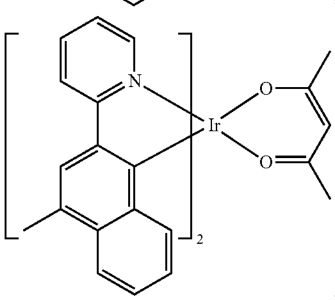
,
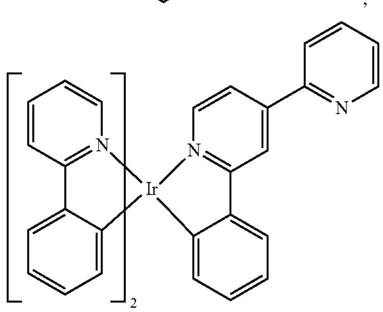
,
-continued
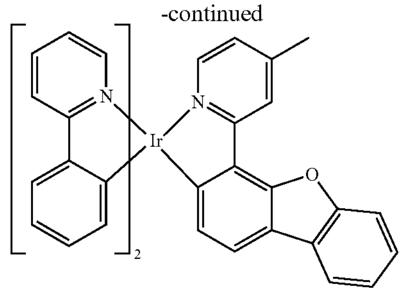
,
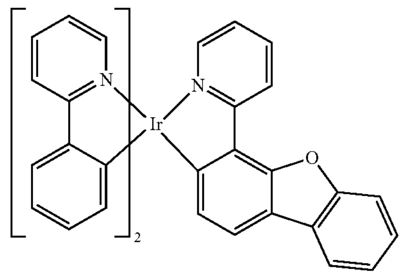
,
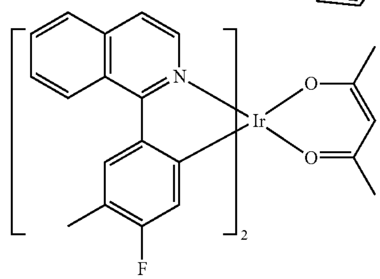
,
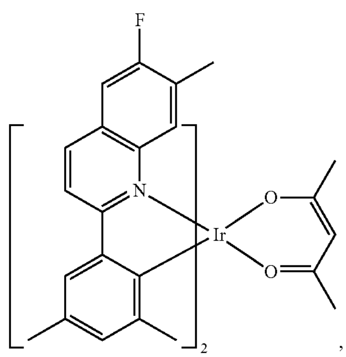
,
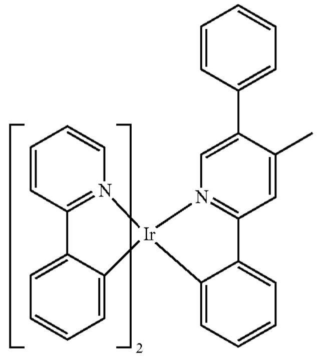
, -continued
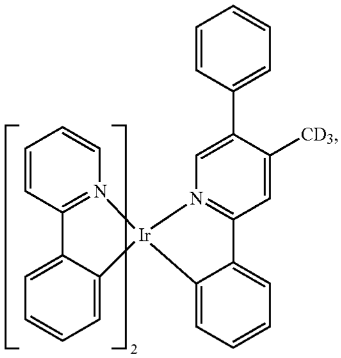
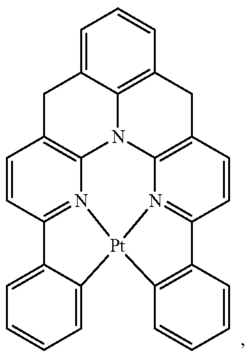
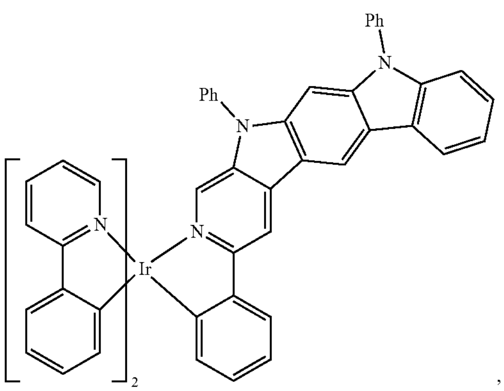
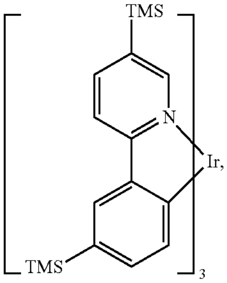
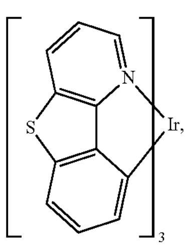
-continued
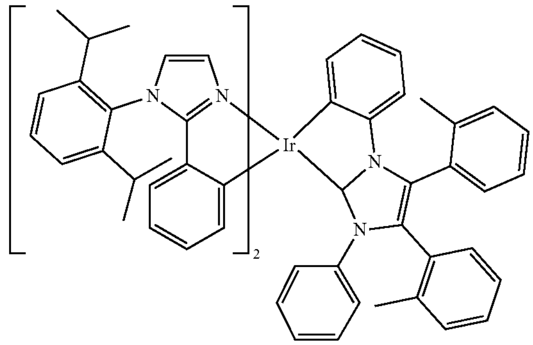
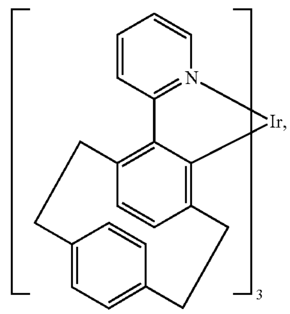
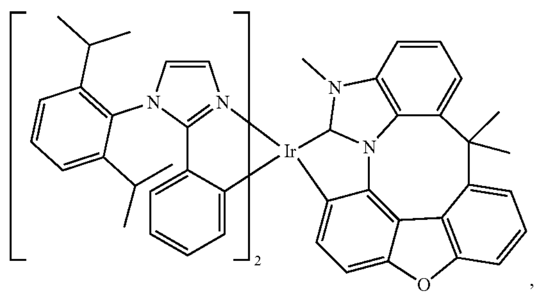
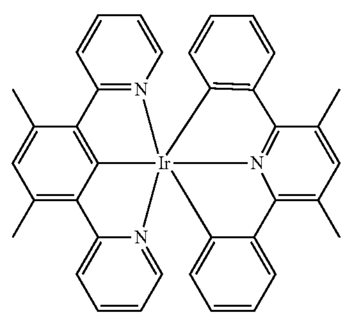
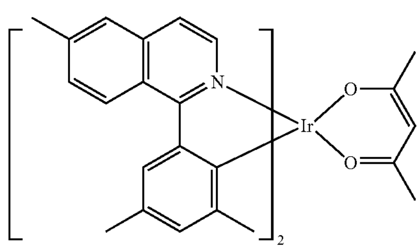

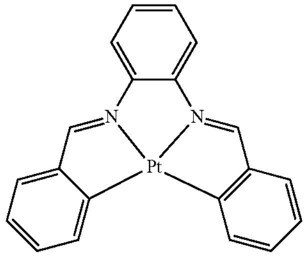
,
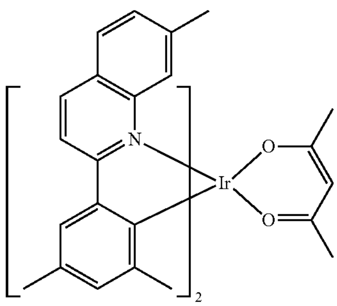
,
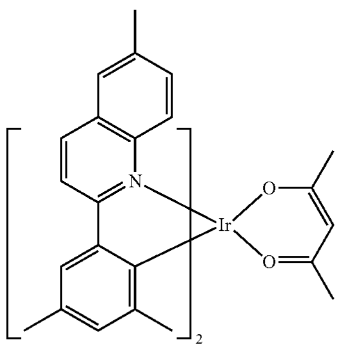
,
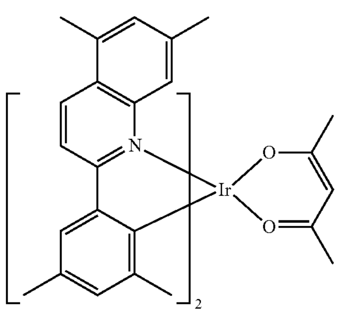
,
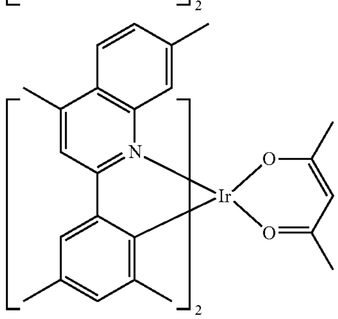
,
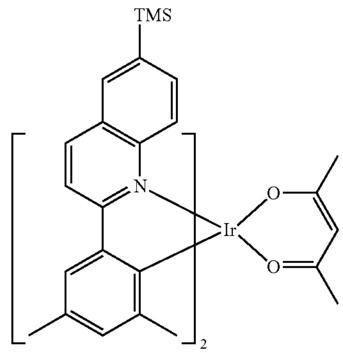
TMS
,
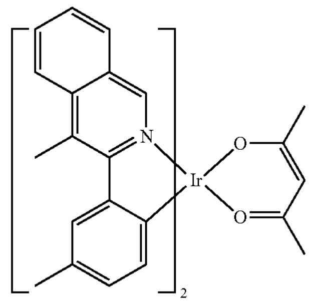
,
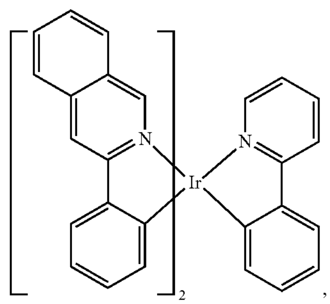
,
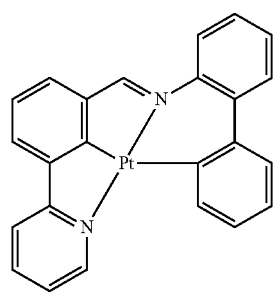
,
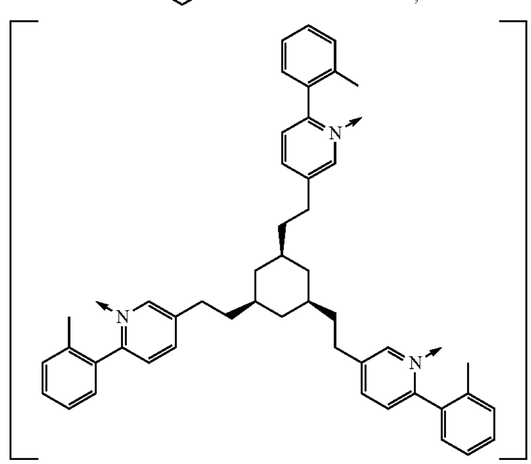
,

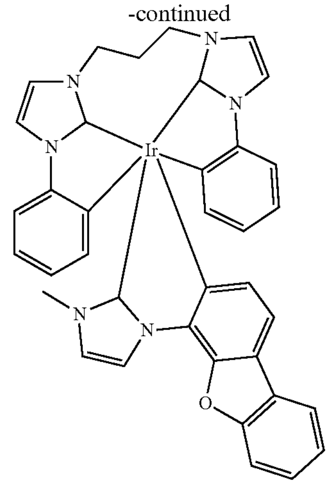
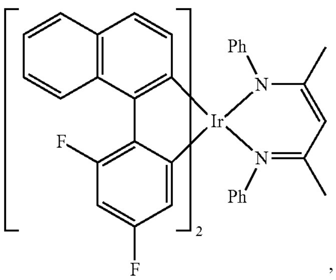
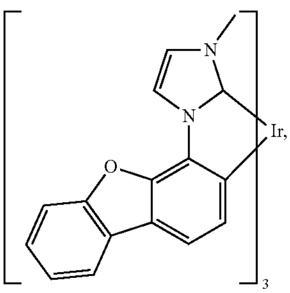
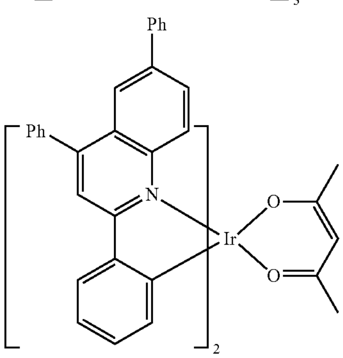
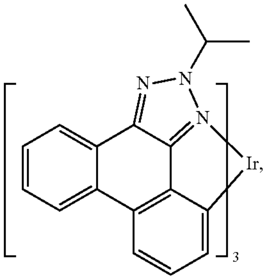
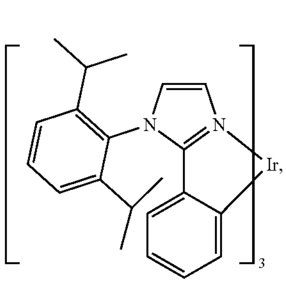
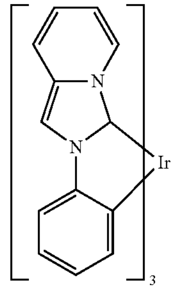
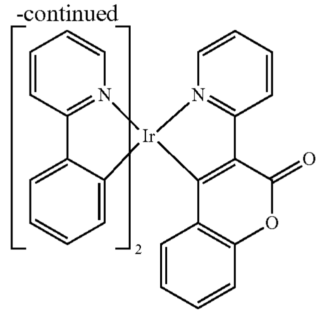
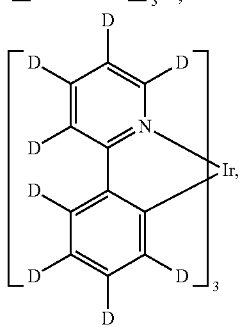
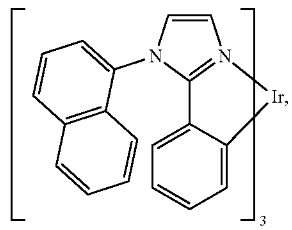
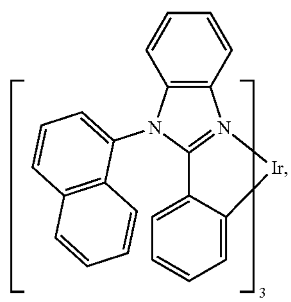
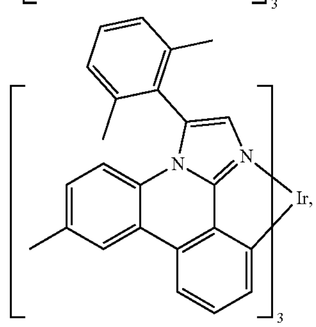
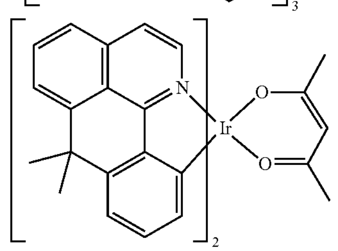
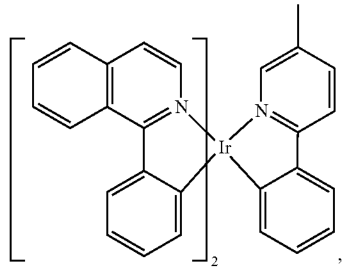

-continued

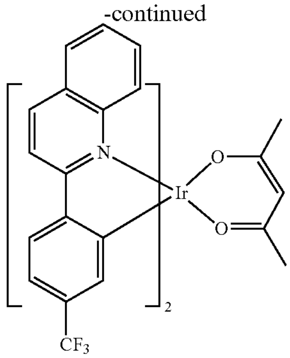

,

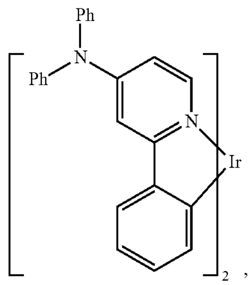

, and

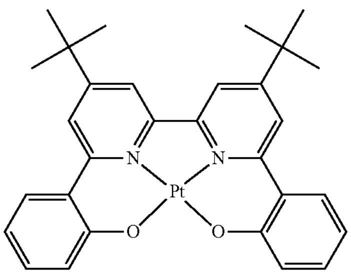

.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

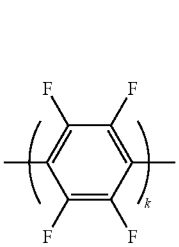

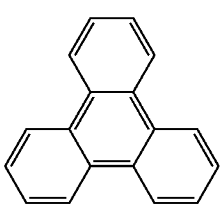

-continued

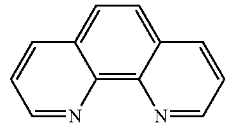

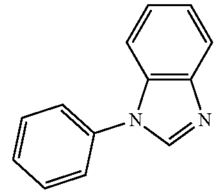

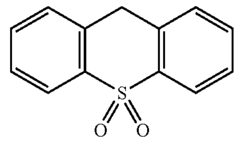

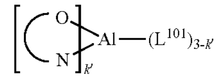

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

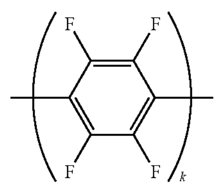

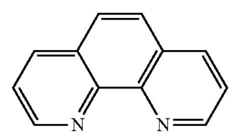

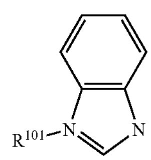

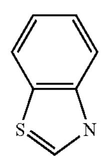

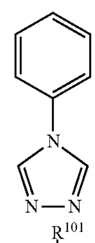

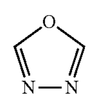

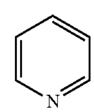

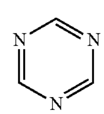

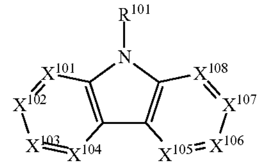

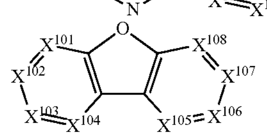

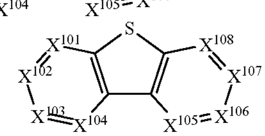

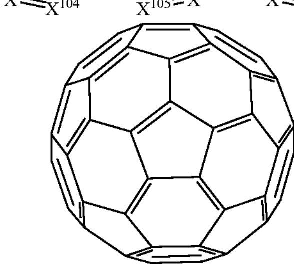

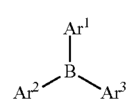

wherein $R^{101}$ is selected from the group consisting of hydrogen, deuterium, halide, alkyl, cycloalkyl heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

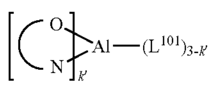

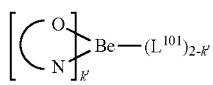

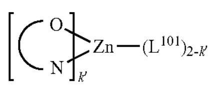

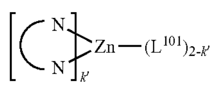

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

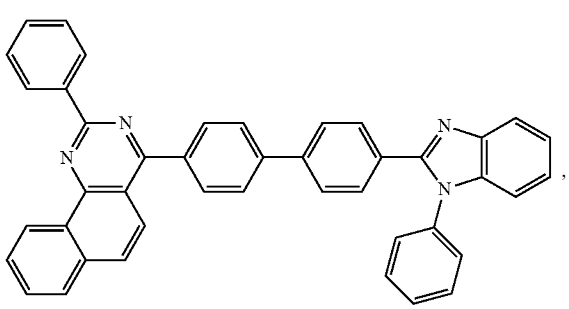

-continued

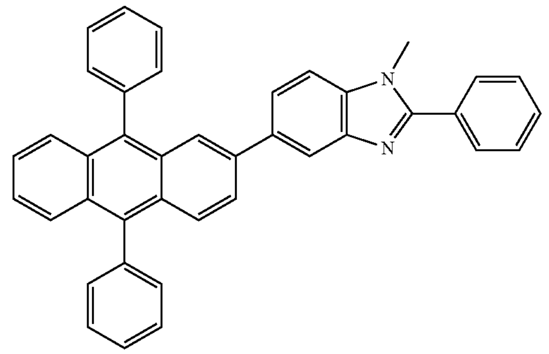

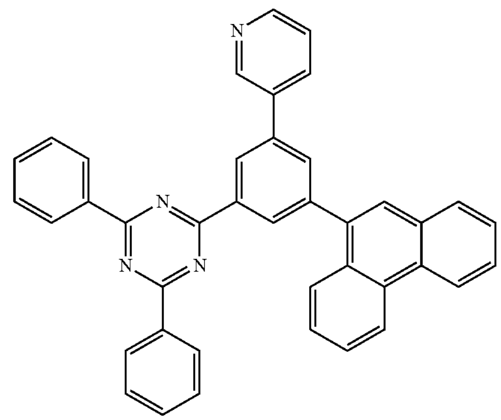

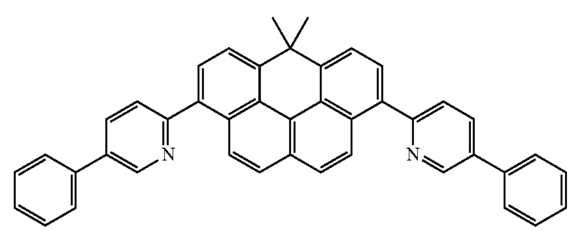

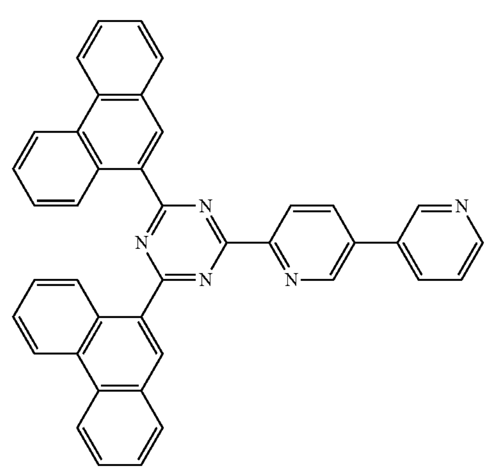

-continued
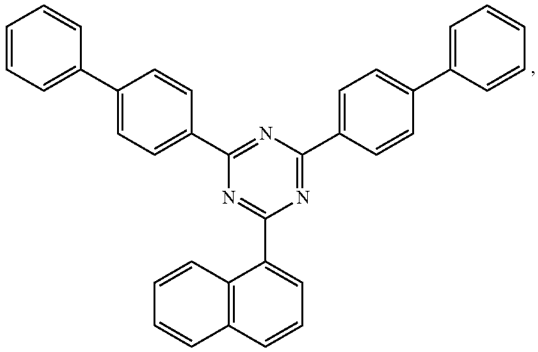
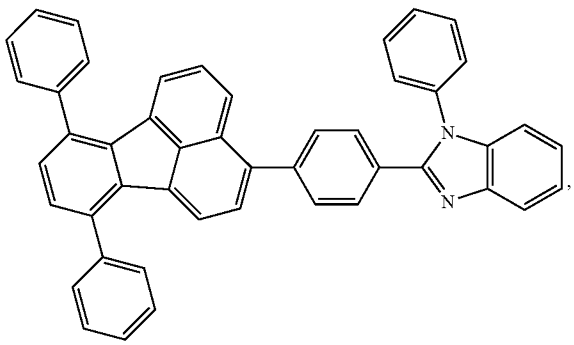
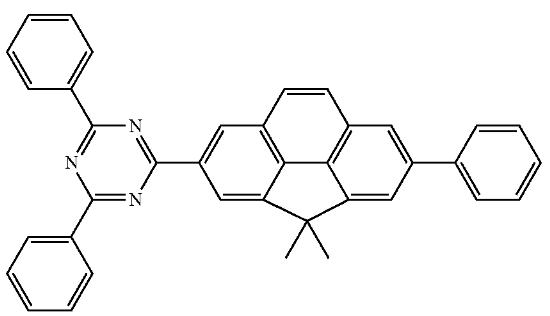
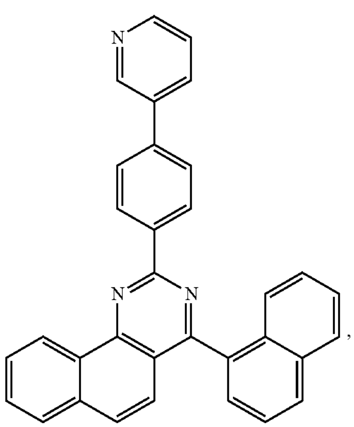
-continued
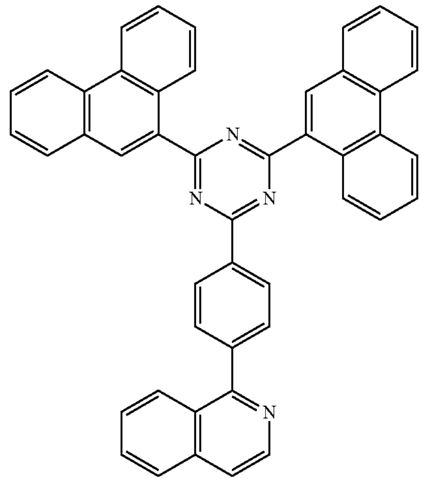
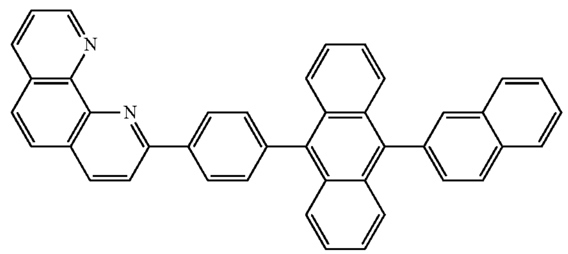
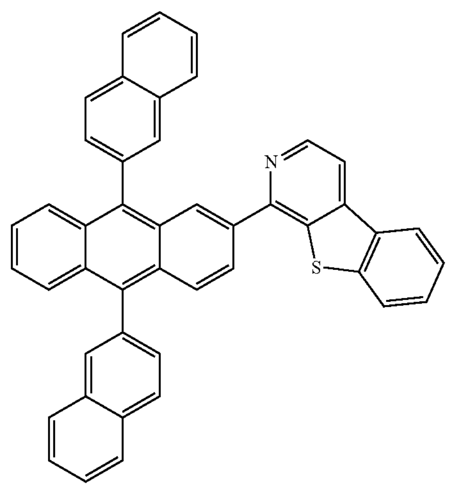
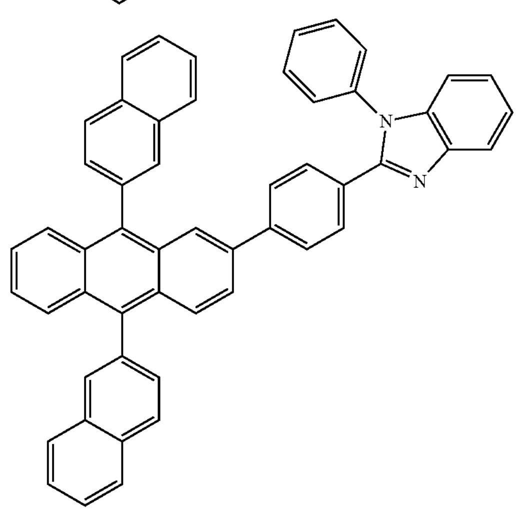

-continued
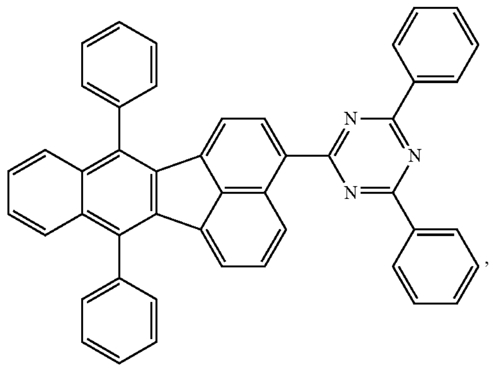
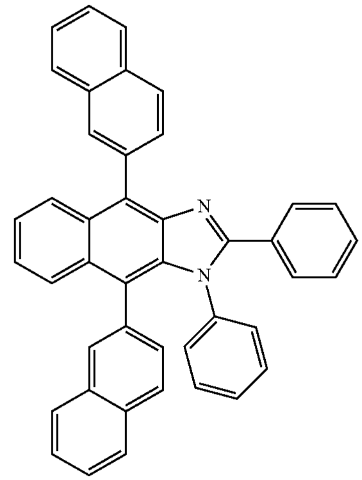
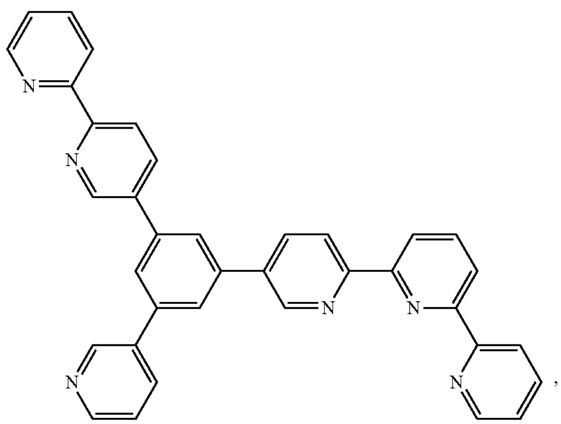
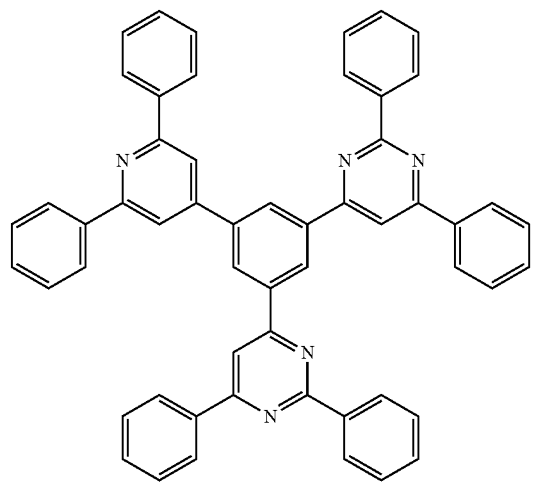
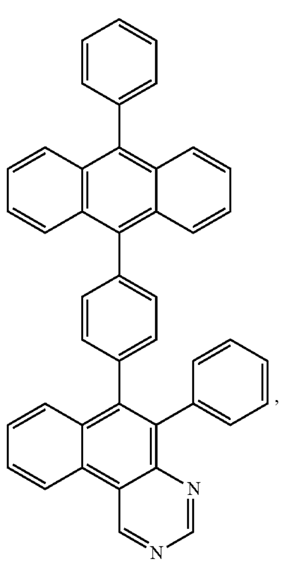
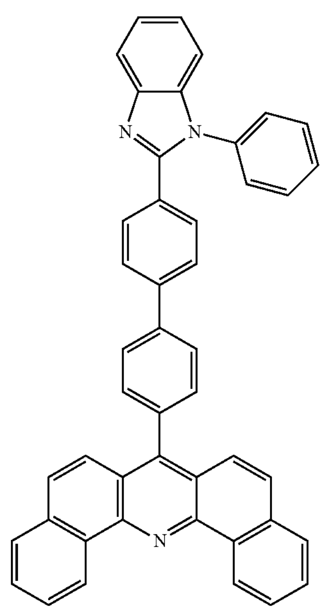
-continued -continued
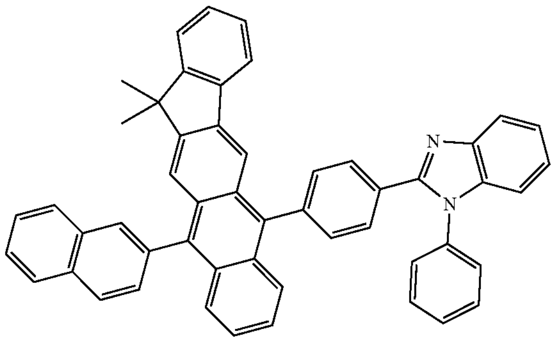
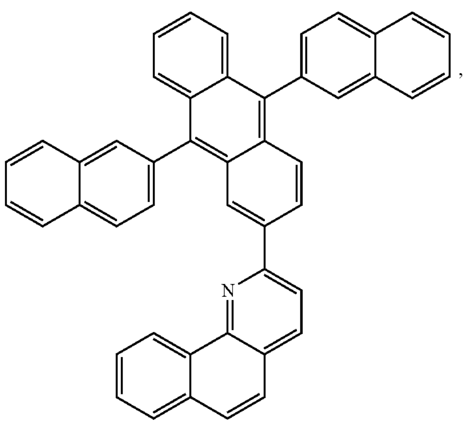
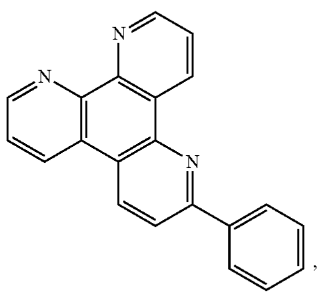
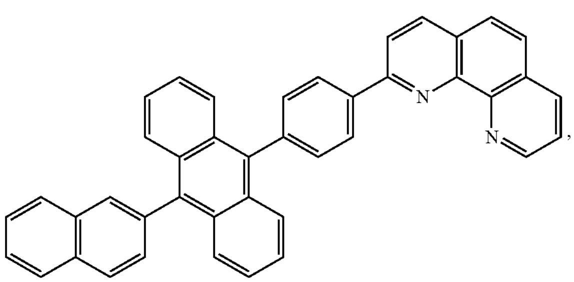
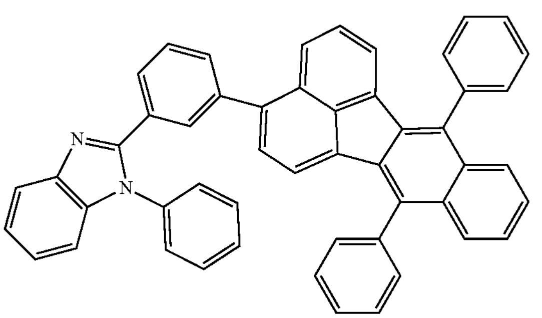
-continued
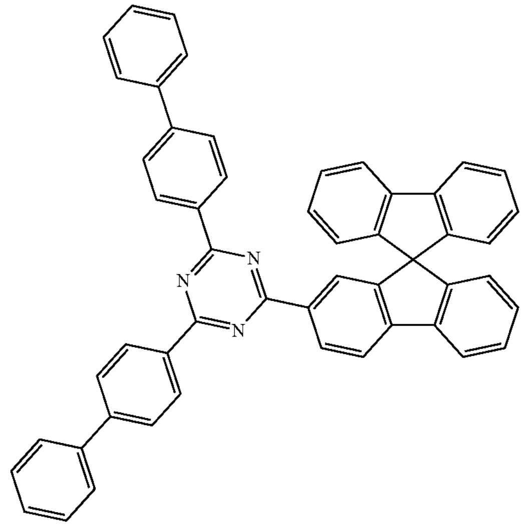
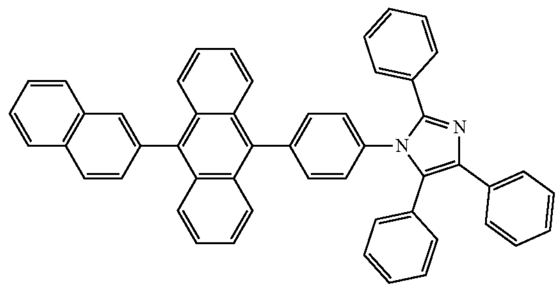
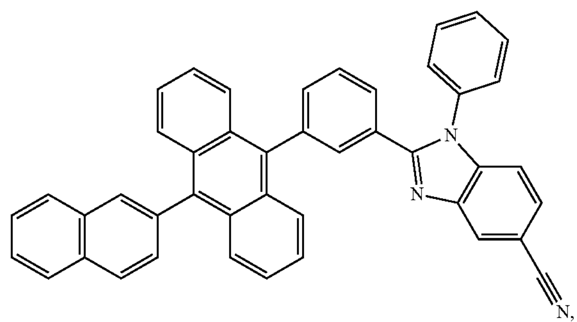
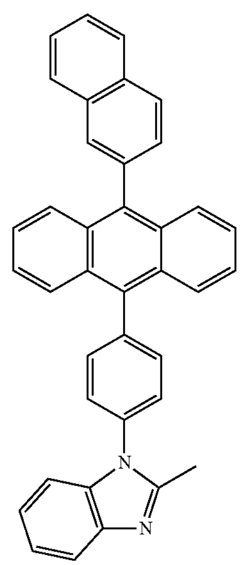

-continued

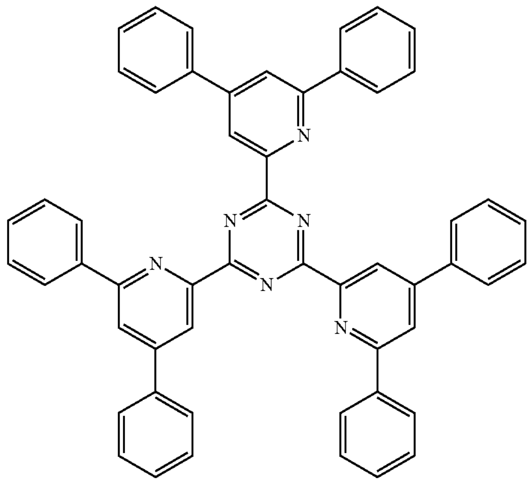
,

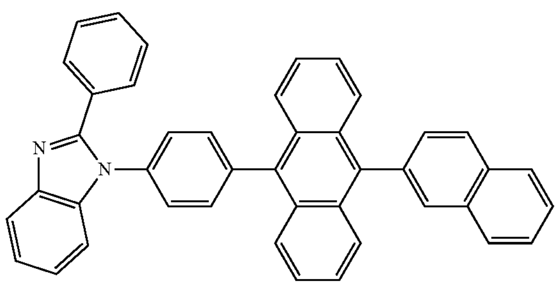
,

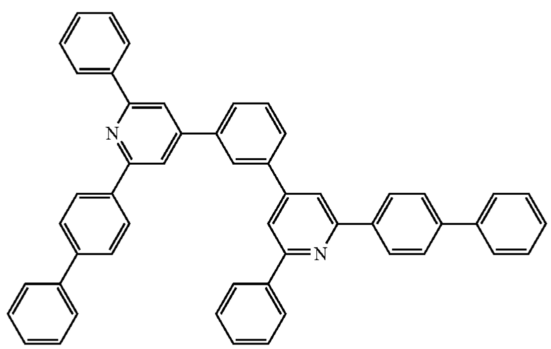
,

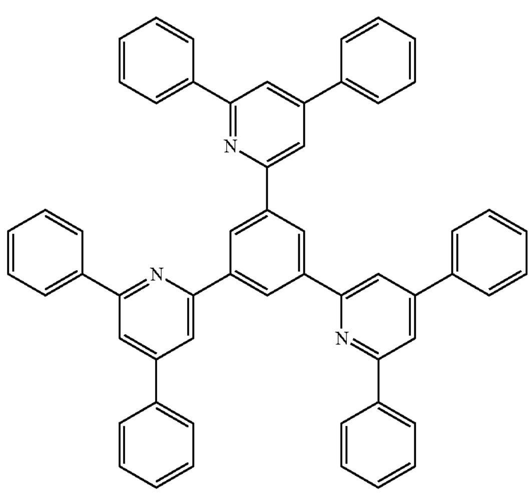
,

-continued

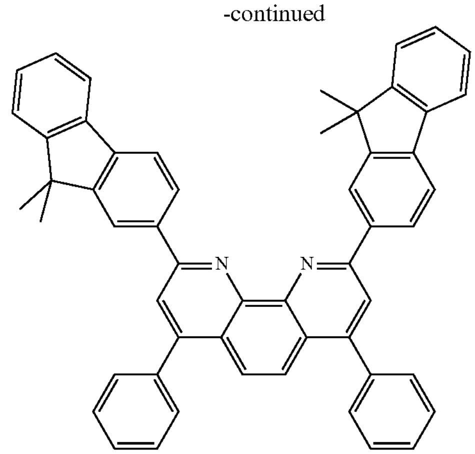
, and

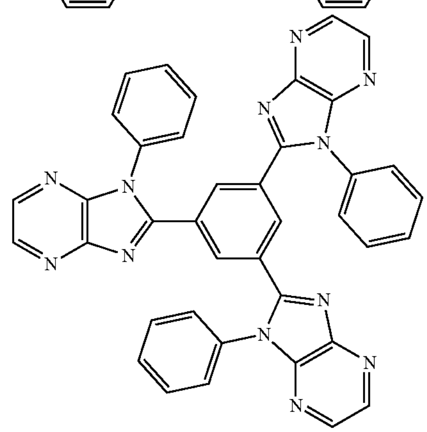
.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Synthesis of Compound 20

Synthesis of 2-fluoro-4-(2,4,6-triisopropylphenyl)pyridine

A mixture of (2,4,6-triisopropylphenyl)boronic acid (8.46 g, 34.1 mmol), SPhos-Pd-G2 (0.818 g, 1.136 mmol), SPhos (0.467 g, 1.136 mmol), and potassium phosphate (18.09 g, 85 mmol) was vacuum and back-filled with nitrogen.

4-bromo-2-fluoropyridine (2.92 ml, 28.4 mmol), toluene (80 ml), and water (16 ml) were added to the reaction mixture and refluxed for 18 hrs then partitioned between ethyl acetate (EA) and brine and collected the organic portion. The aqueous layer was extracted with dichloromethane (DCM) and the combined organic extracts were dried with $MgSO_4$ and coated on celite. The product was chromatographed on silica (EA/Hep=1/6) and obtained white solid product (84% yield).

Synthesis of 2-bromo-9-(4-(2,4,6-triisopropylphenyl)pyridin-2-yl)-9H-carbazole

A mixture of 2-bromo-9H-carbazole (3 g, 12.19 mmol), 2-fluoro-4-(2,4,6-triisopropylphenyl)pyridine (4.02 g, 13.41 mmol), and potassium carbonate (5.05 g, 36.6 mmol) in DMSO (60 ml) was heated at 150° C. for 48 hrs. The reaction mixture was cooled down and water (80 mL) was added. The solid product was collected by filtration and washed with water. The solid was triturated in EA/MeOH (1/10) and filtered. The off-white solid was dried in the vacuum oven (89% yield).

Synthesis of 3'-chloro-2,4,6-triisopropyl-5'-methoxy-1,1'-biphenyl

A mixture of (3-chloro-5-methoxyphenyl)boronic acid (5 g, 26.8 mmol), $Pd(PPh_3)_4$ (1.240 g, 1.073 mmol), and sodium carbonate (5.69 g, 53.6 mmol) was vacuum and back-filled with nitrogen. 2-bromo-1,3,5-triisopropylbenzene (6.80 ml, 26.8 mmol), Dioxane (75 ml), and water (15 ml) were added to the reaction mixture and refluxed for 18 hrs. The mixture was cooled down, most of dioxane was evaporated and extracted with DCM/brine. The product was chromatographed on silica (DCM/Hep=1/3) and the solvent was evaporated to afford a off-white solid product (66% yield).

Synthesis of 5-chloro-2',4',6'-triisopropyl-[1,1'-biphenyl]-3-ol tribromoborane (29.8 ml, 29.8 mmol) was added to a solution of 3'-chloro-2,4,6-triisopropyl-5'-methoxy-1,1'-biphenyl (3.43 g, 9.94 mmol) under nitrogen in dry DCM (30 ml) at 0° C. and stirred at room temperature (R.T.) for 5 hrs. The reaction was quenched with water slowly. After removing DCM, the white solid was stirred in water/MeOH (10/1) for 3 hrs and filtered (96% yield).

Synthesis of 2-((5-chloro-2',4',6'-triisopropyl-[1,1'-biphenyl]-3-yl)oxy)-9-(4-(2,4,6-triisopropylphenyl)pyridin-2-yl)-9H-carbazole A mixture of 5-chloro-2',4',6'-triisopropyl-[1,1'-biphenyl]-3-ol (1.322 g, 4.00 mmol), 2-bromo-9-(4-(2,4,6-triisopropylphenyl)pyridin-2-yl)-9H-carbazole (2 g, 3.81 mmol), copper(I) iodide (0.145 g, 0.761 mmol), picolinic acid (0.187 g, 1.522 mmol), and potassium phosphate (1.616 g, 7.61 mmol) was vacuum and back-filled with nitrogen. DMSO (20 ml) was added to the reaction mixture and heated at 140° C. for 18 hrs. The mixture was cooled down and water (30 mL) was added. The resulting solid was collected by filtration and washed with water and dissolved in DCM. The product was chromatographed on silica (DCM/Hep=3/1) and the solvent was evaporated to obtain the product (77% yield).

Synthesis of N1-phenyl-N2-(2',4',6'-triisopropyl-5-((9-(4-(2,4,6-triisopropylphenyl)pyridin-2-yl)-9H-carbazol-2-yl)oxy)-[1,1'-biphenyl]-3-yl)benzene-1,2-diamine A mixture of N1-phenylbenzene-1,2-diamine (0.591 g, 3.21 mmol), 2-((5-chloro-2',4',6'-triisopropyl-[1,1'-biphenyl]-3-yl)oxy)-9-(4-(2,4,6-triisopropylphenyl)pyridin-2-yl)-9H-carbazole (2.26 g, 2.91 mmol), (allyl)PdCl-dimer (0.032 g, 0.087 mmol), cBRIDP (0.123 g, 0.350 mmol), and sodium 2-methylpropan-2-olate (0.700 g, 7.29 mmol) was vacuumed and back-filled with nitrogen several times. Toluene (15 ml) was added to the reaction mixture and refluxed for 3 hrs. The reaction mixture was coated on celite and chromatographed on silica (DCM/Hep=2/1) to afford product (75% yield).

Synthesis of 3-phenyl-1-(2',4',6'-triisopropyl-5-((9-(4-(2,4,6-triisopropylphenyl)pyridin-2-yl)-9H-carbazol-2-yl)oxy)-[1,1'-biphenyl]-3-yl)-1H-benzo[d]imidazol-3-ium chloride N1-phenyl-N2-(2',4',6'-triisopropyl-5-((9-(4-(2,4,6-triisopropylphenyl)pyridin-2-yl)-9H-carbazol-2-yl)oxy)-[1,1'-biphenyl]-3-yl)benzene-1,2-diamine (2 g, 2.166 mmol) was dissolved in triethoxymethane (18.01 ml, 108 mmol) and hydrogen chloride (0.213 ml, 2.60 mmol) was added. The reaction mixture was heated at 80° C. for 18 hrs. About half the amount of triehoxymethane was removed by distillation under vacuum until solid appeared. The solid was washed with diethyl ether and filtered (89% yield).

Synthesis of Compound 20

A mixture of 3-phenyl-1-(2',4',6'-triisopropyl-5-((9-(4-(2,4,6-triisopropylphenyl)pyridin-2-yl)-9H-carbazol-2-yl)oxy)-[1,1'-biphenyl]-3-yl)-1H-benzo[d]imidazol-3-ium chloride (1.83 g, 1.887 mmol) and silver oxide (0.219 g, 0.944 mmol) was stirred in 1,2-dichloroethane (25 ml) at R.T. for 18 hrs. After removing 1,2-dichloroethane, $Pt(COD)Cl_2$ (0.706 g, 1.887 mmol) was added and the reaction mixture was vacuumed and back-filled with nitrogen. 1,2-dichlorobenzene (25 ml) was added and heated at 190° C. for 48 hrs. The solvent was removed and coated on celite and chromatographed on silica (DCM/Hep=1/1). The product was triturated in MeOH (81% yield).

Synthesis of Compound 80200

Synthesis 2-(3-(1H-imidazol-1-yl)phenoxy)-9-(4-(2,4,6-triisopropylphenyl)pyridin-2-yl)-9H-carbazole A mixture of 3-(1H-imidazol-1-yl)phenol (0.274 g, 1.708 mmol), 2-bromo-9-(4-(2,4,6-triisopropylphenyl)pyridin-2-yl)-9H-carbazole (0.88 g, 1.674 mmol), copper(I) iodide (0.064 g, 0.335 mmol), picolinic acid (0.082 g, 0.670 mmol), and potassium phosphate (0.711 g, 3.35 mmol) was vacuumed and back-filled with nitrogen several times. DMSO (10 ml) was added to the reaction mixture and heated at 140° C. for 18 hrs. The mixture was cooled down and water (15 mL) was added. The resulting solid was collected by filtration and dissolved in DCM and dried with $MgSO_4$. The product was chromatographed on silica (DCM/EA=3/1) to afford product (63% yield).

Synthesis of 3-(methyl-d3)-1-(3-((9-(4-(2,4,6-triisopropylphenyl)pyridin-2-yl)-9H-carbazol-2-yl)oxy)phenyl)-1H-imidazol-3-ium iodide 2-(3-(1H-imidazol-1-yl)phenoxy)-9-(4-(2,4,6-triisopropylphenyl)pyridin-2-yl)-9H-carbazole (622 mg, 1.028 mmol) was dissolved in EA (10 ml) and iodomethane-d3 (0.320 ml, 5.14 mmol) was added. The reaction mixture was stirred at R.T. for 3 days. The resulting off-white solid was collected by filtration and washed with EA and diethyl ether and dried under vacuum. (77% yield).

Synthesis of Compound 80200

A mixture of 3-(methyl-d3)-1-(3-((9-(4-(2,4,6-triisopropylphenyl)pyridin-2-yl)-9H-carbazol-2-yl)oxy)phenyl)-1H-imidazol-3-ium iodide (0.59 g, 0.787 mmol) and silver oxide (0.091 g, 0.393 mmol) was stirred in 1,2-dichloroethane (12 ml) at R.T. for 18 hrs. After removing 1,2-dichloroethane, $Pt(COD)Cl_2$ (0.294 g, 0.787 mmol) was added and the reaction mixture was vacuumed and back-filled with nitrogen. 1,2-dichlorobenzene (12 ml) was added and heated at 190° C. for 24 hrs. The solvent was removed and coated on celite and chromatographed on silica (DCM/Hep=2/1). The product was triturated in MeOH and dried in the vacuum oven (57% yield).

Synthesis of Compound 2546630

Synthesis of 2-bromo-9-(4-(tert-butyl)pyridin-2-yl)-9H-carbazole

A mixture of 2-bromo-4-(tert-butyl)pyridine (5.65 g, 26.4 mmol), 2-bromo-9H-carbazole (5 g, 20.32 mmol), copper(I) iodide (1.548 g, 8.13 mmol), 1-methyl-1H-imidazole (1.612 ml, 20.32 mmol), and lithium 2-methylpropan-2-olate (3.25 g, 40.6 mmol) was vacuumed and back-filled with nitrogen several times. Toluene (60 ml) was added to the reaction mixture and heated at reflux for 4 hrs. The mixture was cooled down and partitioned between EA and water with ~30 mL 30% $NH_4OH$(aq). The organic layer was separated and the aqueous layer was extracted with DCM. Chromatographed on silica (DCM) (89% yield).

Synthesis of 9-(4-(tert-butyl)pyridin-2-yl)-2-((5-chloro-2',6'-diisopropyl-[1,1'-biphenyl]-3-yl)oxy)-9H-carbazole A mixture of 2-bromo-9-(4-(tert-butyl)pyridin-2-yl)-9H-carbazole (1.5 g, 3.95 mmol), copper(I) iodide (0.151 g, 0.791 mmol), picolinic acid (0.195 g, 1.582 mmol), and potassium carbonate (1.679 g, 7.91 mmol) was vacuum and back-filled with nitrogen. 5-chloro-2',6'-diisopropyl-[1,1'-biphenyl]-3-ol (1.199 g, 4.15 mmol) and DMSO (15 ml) was added to the reaction mixture and heated at 140° C. for 18 hrs. The mixture was cooled down and water (20 mL) was added. The resulting solid was collected by filtration and washed with water and dissolved in DCM. The product was coated on celite and chromatographed on silica (DCM/Hep=4/1) (82% yield).

Synthesis 3'-chloro-2,6-diisopropyl-5'-methoxy-1,1'-biphenyl

A mixture of (3-chloro-5-methoxyphenyl)boronic acid (6 g, 32.2 mmol), $Pd(PPh_3)_4$ (1.488 g, 1.288 mmol), and sodium carbonate (6.82 g, 64.4 mmol) was vacuum and back-filled with nitrogen. 2-bromo-1,3-diisopropylbenzene (6.63 ml, 32.2 mmol), dioxane (75 ml), and water (15 ml) were added to the reaction mixture and refluxed for 16 hrs. The mixture was cooled down and dioxane was removed and extracted with DCM/brine. The product was chromatographed on silica (DCM/Hep=2/3) to obtain a colorless liquid which solidified under vacuum (67% yield).

Synthesis of 5-chloro-2',6'-diisopropyl-[1,1'-biphenyl]-3-ol tribromoborane (42.9 ml, 42.9 mmol) was added to a solution of 3'-chloro-2,6-diisopropyl-5'-methoxy-1,1'-biphenyl (6.5 g, 21.46 mmol) under nitrogen in dry dichloromethane (40 ml) at 0° C. and stirred at R.T. for 5 hrs. The reaction mixture was quenched in an ice bath until some solid appeared. After removing DCM, the resulting white solid was stirred in water for 1 hr and filtered. The product was dried in the vacuum oven for 18 h (100% yield).

Synthesis N1-(5-((9-(4-(tert-butyl)pyridin-2-yl)-9H-carbazol-2-yl)oxy)-2',6'-diisopropyl-[1,1'-biphenyl]-3-yl)-N2-phenylbenzene-1,2-diamine A mixture of N1-phenylbenzene-1,2-diamine (0.327 g, 1.774 mmol), 9-(4-(tert-butyl)pyridin-2-yl)-2-((5-chloro-2',6'-diisopropyl-[1,1'-biphenyl]-3-yl)oxy)-9H-carbazole (0.947 g, 1.613 mmol), (allyl)PdCl-dimer (0.018 g, 0.048 mmol), cBRIDP (0.068 g, 0.194 mmol), and sodium 2-methylpropan-2-olate (0.387 g, 4.03 mmol) was vacuumed and back-filled with nitrogen several times. Toluene (10 ml) was added to the reaction mixture and refluxed for 3 hrs. The reaction mixture was coated on celite and chromatographed on silica (DCM/Hep=5/1 to 8/1) (75% yield).

Synthesis 1-(5-((9-(4-(tert-butyl)pyridin-2-yl)-9H-carbazol-2-yl)oxy)-2',6'-diisopropyl-[1,1'-biphenyl]-3-yl)-3-phenyl-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-phenylbenzene-1,2-diamine (0.89 g, 1.211 mmol) was dissolved in triethoxymethane (10.07 ml, 60.5 mmol) and hydrogen chloride (0.119 ml, 1.453 mmol) was added. The reaction mixture was heated at 80° C. for 16 hrs. The mixture was cooled down and the solid was washed with diethyl ether and filtered and dried in the vacuum oven (85% yield).

Synthesis of Compound 2546630

A mixture of 1-(5-((9-(4-(tert-butyl)pyridin-2-yl)-9H-carbazol-2-yl)oxy)-2',6'-diisopropyl-[1,1'-biphenyl]-3-yl)-3-phenyl-1H-benzo[d]imidazol-3-ium chloride (0.8 g, 1.024 mmol) and silver oxide (0.119 g, 0.512 mmol) was stirred in 1,2-dichloroethane (10 ml) at R.T. for 16 hrs. After removing 1,2-dichloroethane, $Pt(COD)Cl_2$ (0.383 g, 1.024 mmol) was added and the reaction mixture was vacuumed and back-filled with nitrogen. 1,2-dichlorobenzene (10 ml) was added and heated at 190° C. for 5 days. The solvent was removed and coated on celite and chromatographed on silica (DCM/Hep=1/1). The product was triturated in MeOH and dried in the vacuum oven (62% yield).

Synthesis of Compound 2625490

Synthesis of 9-(4-(tert-butyl)pyridin-2-yl)-2-methoxy-9H-carbazole

A mixture of 4-(tert-butyl)-2-chloropyridine (1.720 g, 10.14 mmol), 2-methoxy-9H-carbazole (2 g, 10.14 mmol), (allyl)PdCl-dimer (0.074 g, 0.203 mmol), and cBRIDP (0.286 g, 0.811 mmol) was vacuumed and back-filled with nitrogen several times. Toluene (30 ml) was added and the reaction mixture was refluxed for 4 hrs, partitioned between EA/water and extracted. The aqueous layer was extracted with DCM, then coated on celite and chromatographed on silica (DCM/EA=30/1) (81% yield).

Synthesis of 9-(4-(tert-butyl)pyridin-2-yl)-9H-carbazol-2-ol 9-(4-(tert-butyl)pyridin-2-yl)-2-methoxy-9H-carbazole (2.72 g, 8.23 mmol) was heated in hydrogen bromide (46.6 ml, 412 mmol) at 140° C. (oil temp) for 1 hr. The mixture was cooled down and partitioned between DCM and water and extracted with DCM. The DCM layer was washed with $NaHCO_3$(sat). Evaporation of organic solvent to obtain light yellow solid (86% yield).

Synthesis of 9-(4-(tert-butyl)pyridin-2-yl)-9H-carbazol-2-ol

A mixture of 1H-benzo[d]imidazole (3 g, 25.4 mmol), 1-bromo-3-iodobenzene (3.89 ml, 30.5 mmol), copper(I) iodide (0.484 g, 2.54 mmol), 1,10-phenanthroline (0.458 g, 2.54 mmol), and potassium carbonate (4.21 g, 30.5 mmol) was heated in DMF (70 ml) at 150° C. for 16 hrs. The mixture was cooled down and poured in cold water and extracted with DCM (insoluble salts were removed by filtration). Chromatographed on silica (EA/DCM=2/1) to obtain pale yellow tacky oil which solidified under vacuum for 18 h (59% yield).

Synthesis of 2-(3-(1H-benzo[d]imidazol-1-yl)phenoxy)-9-(4-(tert-butyl)pyridin-2-yl)-9H-carbazole A mixture of 1-(3-bromophenyl)-1H-benzo[d]imidazole (1.295 g, 4.74 mmol), 9-(4-(tert-butyl)pyridin-2-yl)-9H-carbazol-2-ol (1.5 g, 4.74 mmol), copper(I) iodide (0.181 g, 0.948 mmol), picolinic acid (0.233 g, 1.896 mmol), and potassium phosphate (2.013 g, 9.48 mmol) was vacuumed and back-filled with nitrogen several times. DMSO (15 ml) was added to the reaction mixture and heated at 140° C. for 16 hrs. The mixture was cooled down and water (20 mL) was added. The resulting solid was collected by filtration and dissolved in DCM and dried with $MgSO_4$. Chromatographed on silica (EA/DCM=1/1) (71% yield).

Synthesis of 1-(3-((9-(4-(tert-butyl)pyridin-2-yl)-9H-carbazol-2-yl)oxy)phenyl)-3-(methyl-d3)-1H-benzo[d]imidazol-3-ium iodide A mixture of 2-(3-(1H-benzo[d]imidazol-1-yl)phenoxy)-9-(4-(tert-butyl)pyridin-2-yl)-9H-carbazole (0.75 g, 1.475 mmol) and iodomethane-d3 (0.459 ml, 7.37 mmol) was refluxed in Acetonitrile (15 ml) for 3 days. The solvent was removed and triturated in EA (100% yield).

Synthesis of Compound 2625490

A mixture of 1-(3-((9-(4-(tert-butyl)pyridin-2-yl)-9H-carbazol-2-yl)oxy)phenyl)-3-(methyl-d3)-1H-benzo[d]imidazol-3-ium iodide (1 g, 1.530 mmol) and silver oxide (0.177 g, 0.765 mmol) was stirred in 1,2-dichloroethane (15 ml) at R.T. for 16 hrs. After removing 1,2-dichloroethane, $Pt(COD)Cl_2$ (0.572 g, 1.530 mmol) was added and the reaction mixture was vacuumed and back-filled with nitrogen. 1,2-dichlorobenzene (15 ml) was added and heated at 190° C. for 3 days. The solvent was removed and coated on celite and chromatographed on silica (DCM/Hep=2/1). The product was triturated in MeOH and dried in the vacuum oven (7% yield).

Synthesis of Compound 6444920

Synthesis of 2-bromo-9-(pyridin-2-yl)-9H-carbazole

A mixture of 2-bromo-9H-carbazole (8 g, 32.5 mmol), 2-fluoropyridine (5.59 ml, 65.0 mmol), and potassium carbonate (13.48 g, 98 mmol) in DMSO (80 ml) was heated at 140° C. for 16 hrs. The mixture was cooled down, then the reaction mixture was extracted with EA and water and the organic portion was washed with brine and concentrated. The product solidified under vacuum (100% yield).

Synthesis of 2-(3-chlorophenoxy)-9-(pyridin-2-yl)-9H-carbazole

A mixture of 2-bromo-9-(pyridin-2-yl)-9H-carbazole (2.05 g, 6.34 mmol), copper(I) iodide (0.242 g, 1.269 mmol), picolinic acid (0.312 g, 2.54 mmol), and potassium carbonate (2.69 g, 12.69 mmol) was vacuum and back-filled with nitrogen. 3-chlorophenol (0.703 ml, 6.66 mmol) and DMSO (30 ml) was added to the reaction mixture and heated at 140° C. for 16 hrs. The mixture was cooled down and partitioned between EA and water and extracted with EA. The organic extracts were washed with brine and concentrated, then chromatographed on silica (DCM) (75% yield).

Synthesis of N1-phenyl-N2-(3-((9-(pyridin-2-yl)-9H-carbazol-2-yl)oxy)phenyl)benzene-1,2-diamine A mixture of N1-phenylbenzene-1,2-diamine (0.820 g, 4.45 mmol), 2-(3-chlorophenoxy)-9-(pyridin-2-yl)-9H-carbazole (1.5 g, 4.04 mmol), (allyl)PdCl-dimer (0.044 g, 0.121 mmol), cBRIDP (0.171 g, 0.485 mmol), and sodium 2-methylpropan-2-olate (0.972 g, 10.11 mmol) was vacuumed and back-filled with nitrogen several times. Toluene (15 ml) was added to the reaction mixture and refluxed for 3 hrs. The product was coated on celite and chromatographed on silica (EA/Hep=1/2) (66% yield).

Synthesis of 3-phenyl-1-(3-((9-(pyridin-2-yl)-9H-carbazol-2-yl)oxy)phenyl)-1H-benzo[d]imidazol-3-ium chloride N1-phenyl-N2-(3-((9-(pyridin-2-yl)-9H-carbazol-2-yl)oxy)phenyl)benzene-1,2-diamine (1.4 g, 2.70 mmol) was dissolved in triethoxymethane (22.45 ml, 135 mmol) and hydrogen chloride (0.266 ml, 3.24 mmol) was added. The reaction mixture was heated at 80° C. for 30 min. The mixture was cooled down and diethyl ether (~50 mL, solid appeared) was added to the reaction mixture and stirred for 5 hrs. The product was collected by filtration and was washed with diethyl ether and dried in the vacuum oven (75% yield).

Synthesis of 6444920

A mixture of 3-phenyl-1-(3-((9-(pyridin-2-yl)-9H-carbazol-2-yl)oxy)phenyl)-1H-benzo[d]imidazol-3-ium chloride (1.14 g, 2.017 mmol) and silver oxide (0.234 g, 1.009 mmol) was stirred in 1,2-dichloroethane (25 ml) at R.T. for 16 hrs. After removing 1,2-dichloroethane, $Pt(COD)Cl_2$ (0.755 g, 2.017 mmol) was added and the reaction mixture was vacuumed and back-filled with nitrogen. 1,2-dichlorobenzene (25 ml) was added and heated at 190° C. for 48 hrs. The solvent was removed and coated on celite and chromatographed on silica (DCM/Hep=2/1). The product was triturated in MeOH and dried in the vacuum oven (50% yield).

Synthesis of Compound 2381699770

Synthesis of 1-(3-(3-(4-(2,6-diisopropylphenyl)-1H-pyrazol-1-yl)phenoxy)phenyl)-1H-benzo[d]imidazole A mixture of 1-(3-bromophenyl)-1H-benzo[d]imidazole (0.8 g, 2.93 mmol), 3-(4-(2,6-diisopropylphenyl)-1H-pyrazol-1-yl)phenol (0.939 g, 2.93 mmol), copper(I) iodide (0.112 g, 0.586 mmol), picolinic acid (0.144 g, 1.172 mmol), and potassium phosphate (1.243 g, 5.86 mmol) was vacuumed and back-filled with nitrogen several times. DMSO (12 ml) was added to the reaction mixture and heated at 140° C. for 16 hrs. The mixture was cooled down and water (20 mL) was added. The resulting solid was collected by filtration and dissolved in DCM and dried with $MgSO_4$. The product was coated on celite and chromatographed on silica (EA/DCM=1/4) (66% yield).

Synthesis of 1-(3-(3-(4-(2,6-diisopropylphenyl)-1H-pyrazol-1-yl)phenoxy)phenyl)-3-(methyl-d3)-1H-benzo[d]imidazol-3-ium iodide 1-(3-(3-(4-(2,6-diisopropylphenyl)-1H-pyrazol-1-yl)phenoxy)phenyl)-1H-benzo[d]imidazole (0.987 g, 1.925 mmol) was dissolved in Ethyl acetate (15 ml) and iodomethane-d3 (0.359 ml, 5.78 mmol) was added and the reaction mixture was heated at 60° C. for 16 hrs. White precipitation appeared and it was collected by filtration and dried in the vacuum oven (75% yield).

Synthesis of Compound 2381699770

A mixture of 1-(3-(3-(4-(2,6-diisopropylphenyl)-1H-pyrazol-1-yl)phenoxy)phenyl)-3-(methyl-d3)-1H-benzo[d]imidazol-3-ium iodide (820 mg, 1.247 mmol) and silver oxide (144 mg, 0.623 mmol) was stirred in 1,2-dichloroethane (8 ml) at R.T. for 16 hrs. After removing 1,2-dichloroethane, $Pt(COD)Cl_2$ (467 mg, 1.247 mmol) was added and the reaction mixture was vacuumed and back-filled with nitrogen. 1,2-dichlorobenzene (8 ml) was added and heated at 80° C. for 16 hrs and 190° C. for 7 days. The solvent was removed and coated on celite and chromatographed on silica (DCM/Hep=2/1). The product was triturated in MeOH and dried in the vacuum oven (63% yield).

Synthesis of Compound 2590203683

Synthesis 1-(3-bromophenyl)-2-((2,6-diisopropylphenyl)amino)ethan-1-one

A mixture of 2-bromo-1-(3-bromophenyl)ethan-1-one (3 g, 10.79 mmol) and 2,6-diisopropylaniline (4.02 g, 22.67 mmol) was stirred in Ethanol (15 ml) at R.T. for 2 days. EtOH was removed and triturated in diethyl ether. The white solid (salt) was removed by filtration. The filtrate was concentrated and chromatographed on silica (THF/Hep=1/20). Obtained yellow oil. (74% yield).

Synthesis of 4-(3-bromophenyl)-1-(2,6-diisopropylphenyl)-1H-imidazole

A mixture of 1-(3-bromophenyl)-2-((2,6-diisopropylphenyl)amino)ethan-1-one (2.3 g, 6.14 mmol), formaldehyde, 37% in water (0.503 ml, 6.76 mmol), and ammonium acetate (4.74 g, 61.4 mmol) was heated in Acetic Acid (20 ml) at reflux for 18 h. The mixture was cooled down and partitioned between EA and brine and extracted with EA. The organic extract was basified with $Na_2CO_3$(sat) until basic. Coated on celite and chromatographed on silica (EA/Hep=1/3) (20% yield).

Synthesis of 4-(3-((5-chloro-2',6'-diisopropyl-[1,1'-biphenyl]-3-yl)oxy)phenyl)-1-(2,6-diisopropylphenyl)-1H-imidazole A mixture of 4-(3-bromophenyl)-1-(2,6-diisopropylphenyl)-1H-imidazole (0.8 g, 2.087 mmol), copper(I) iodide (0.079 g, 0.417 mmol), picolinic acid (0.103 g, 0.835 mmol), and potassium carbonate (0.886 g, 4.17 mmol) was vacuum and back-filled with nitrogen. 5-chloro-2',6'-diisopropyl-[1,1'-biphenyl]-3-ol (0.633 g, 2.191 mmol) and DMSO (15 ml) was added to the reaction mixture and heated at 140° C. for 16 hrs. The mixture was cooled down and added water (20 mL). The resulting solid was collected by filtration and washed with water and dissolved in DCM. The product was coated on celite and chromatographed on silica (DCM/Hep=3/1 to 5/1) (71% yield).

Synthesis of 2,6-diisopropyl-N-(2-nitrophenyl)aniline

A mixture of (allyl)PdCl-dimer (0.125 g, 0.342 mmol) and cBRIDP (0.482 g, 1.366 mmol) was vacuumed and back-filled with nitrogen. Toluene (10 ml) was added and refluxed for 3 minutes. The pre-formed catalyst was transferred to a mixture of 1-bromo-2-nitrobenzene (2.3 g, 11.39 mmol), 2,6-diisopropylaniline (2.58 ml, 13.66 mmol), and sodium 2-methylpropan-2-olate (2.74 g, 28.5 mmol) in Toluene (10 ml) and the reaction was refluxed for 2 hrs. The mixture was cooled down and coated on celite and chromatographed on silica (120 g×2, EA/Hep=1/9) (40% yield).

Synthesis of N1-(2,6-diisopropylphenyl)benzene-1,2-diamine 2,6-diisopropyl-N-(2-nitrophenyl)aniline (1.37 g, 4.59 mmol) was dissolved in ethanol (40 ml) and palladium or charcoal on dry basis (0.489 g, 0.459 mmol) was added. The reaction mixture was vacuumed and back-filled with a hydrogen balloon several times and stirred at R.T. for 16 hrs. Filtered through celite and washed with EA and concentrated to give product (93% yield).

Synthesis of N1-(2,6-diisopropylphenyl)-N2-(5-(3-(1-(2,6-diisopropylphenyl)-1H-imidazol-4-yl)phenoxy)-2',6'-diisopropyl-[1,1'-biphenyl]-3-yl)benzene-1,2-diamine A mixture of N1-(2,6-diisopropylphenyl)benzene-1,2-diamine (0.363 g, 1.353 mmol), 4-(3-((5-chloro-2',6'-diisopropyl-[1,1'-biphenyl]-3-yl)oxy)phenyl)-1-(2,6-diisopropylphenyl)-1H-imidazole (0.8 g, 1.353 mmol), (allyl)PdCl-dimer (0.015 g, 0.041 mmol), cBRIDP (0.057 g, 0.162 mmol), and sodium 2-methylpropan-2-olate (0.325 g, 3.38 mmol) was vacuumed and back-filled with nitrogen several times. Toluene (10 ml) was added to the reaction mixture and refluxed for 2 hrs. Coated on celite and chromatographed on silica (DCM/Hep=5/1) (69% yield).

Synthesis of 3-(2,6-diisopropylphenyl)-1-(5-(3-(1-(2,6-diisopropylphenyl)-1H-imidazol-4-yl)phenoxy)-2',6'-diisopropyl-[1,1'-biphenyl]-3-yl)-1H-benzo[d]imidazol-3-ium chloride N1-(2,6-diisopropylphenyl)-N2-(5-(3-(1-(2,6-diisopropylphenyl)-1H-imidazol-4-yl)phenoxy)-2',6'-diisopropyl-[1,1'-biphenyl]-3-yl)benzene-1,2-diamine (0.76 g, 0.923 mmol) was dissolved in triethoxymethane (7.68 ml, 46.2 mmol) and hydrogen chloride (0.091 ml, 1.108 mmol) was added. The reaction mixture was heated at 80° C. for 16 hrs. Triethyl orthoformate was removed by distillation under vacuum until solid appeared. The solid was washed with diethyl ether and filtered and dried in the vacuum oven (76% yield).

Synthesis of Compound 2590203683

A mixture of 3-(2,6-diisopropylphenyl)-1-(5-(3-(1-(2,6-diisopropylphenyl)-1H-imidazol-4-yl)phenoxy)-2',6'-diisopropyl-[1, 1'-biphenyl]-3-yl)-1H-benzo[d]imidazol-3-ium chloride (0.6 g, 0.690 mmol) and silver oxide (0.080 g, 0.345 mmol) was stirred in 1,2-dichloroethane (10 ml) at R.T. for 16 hrs. After removing 1,2-dichloroethane, $Pt(COD)Cl_2$ (0.258 g, 0.690 mmol) was added and the reaction mixture was vacuumed and back-filled with nitrogen. 1,2-dichlorobenzene (10 ml) was added and heated at 190° C. for 2 days. The solvent was removed and 1,3-diisopropylbenzene (5 mL) was added and refluxed in a sand bath for 7 days. The solvent was removed and coated on celite and chromatographed on silica (DCM/Hep=1/1). The product was triturated in MeOH and dried in the vacuum oven (52% yield).

Synthesis of Compound 2546633

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisopropylphenyl)benzene-1,2-diamine N1-(2,6-diisopropylphenyl)benzene-1,2-diamine (0.683 g, 2.54 mmol), 9-(4-(tert-butyl)pyridin-2-yl)-2-((5-chloro-2',6'-diisopropyl-[1,1'-biphenyl]-3-yl)oxy)-9H-carbazole (1.358 g, 2.313 mmol), Pd(allyl)Cl (0.025 g, 0.069 mmol), cBRIDP (0.098 g, 0.278 mmol), and sodium 2-methylpropan-2-olate (0.556 g, 5.78 mmol) were added to a 250 mL round-bottom flask with a stirbar. The reaction was cycled onto the line via three vacuum/$N_2$ refill cycles. Anhydrous toluene (15 mL) was added and the reaction was heated to reflux for two hours. Reaction was cooled to r.t. and solvent was removed in vacuo. Coated onto Celite and purified by column chromatography (5:1 DCM:Hep->8:1 DCM:Hep) to give a white solid (80% yield).

Synthesis of 3-(5-((9-(4-(tert-butyl)pyridin-2-yl)-9H-carbazol-2-yl)oxy)-2',6'-diisopropyl-[1,1'-biphenyl]-3-yl)-[1,1'-biphenyl]-3-yl)-1-(2,6-diisopropylphenyl)-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisopropylphenyl)benzene-1,2-diamine (1.3 g, 1.587 mmol) was dissolved in triethoxymethane (13.20 ml, 79 mmol) in a 100 mL round-bottom flask with a stirbar. Hydrogen chloride (0.156 ml, 1.904 mmol) was added to give a color change from dark red to black. The reaction was heated to 80° C. for 18 h. The reaction was cooled to r.t. and the solvent was removed in vacuo to give a sticky solid (99% yield).

Synthesis of Compound 2546633

A mixture of 1-(5-((9-(4-(tert-butyl)pyridin-2-yl)-9H-carbazol-2-yl)oxy)-2',6'-diisopropyl-[1,1'-biphenyl]-3-yl)-3-(2,6-diisopropylphenyl)-1H-benzo[d]imidazol-3-ium chloride (1.37 g, 1.583 mmol) and silver oxide (0.183 g, 0.791 mmol) was stirred in 1,2-dichloroethane (10 mL) at r.t. for 18 h. Removed solvent and added $Pt(COD)Cl_2$ (0.592 g, 1.583 mmol). The reaction mixture was refluxed in 1,2-dichlorobenzene (10 ml) for three nights. Removed solvent and coated on celite. Chromatographed on silica (2:3 DCM:Hep) to give a yellow solid (55% yield).

Synthesis of Compound 2546634

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisobutylphenyl)benzene-1,2-diamine 9-(4-(tert-butyl)pyridin-2-yl)-2-((5-chloro-2',6'-diisopropyl-[1,1'-biphenyl]-3-yl)oxy)-9H-carbazole (0.928 g, 1.580 mmol), N1-(2,6-diisobutylphenyl)benzene-1,2-diamine (0.515 g, 1.738 mmol), Pd(allyl)Cl (0.017 g, 0.047 mmol), cBRIDP (0.067 g, 0.190 mmol), and sodium 2-methylpropan-2-olate (0.380 g, 3.95 mmol) were added to a 250 mL round-bottom flask with a stirbar. The reaction was cycled onto the line via three vacuum/$N_2$ refill cycles. Anhydrous toluene (5 mL) was added and the reaction was heated to reflux. After 2 hr, the reaction was cooled to r.t. and the solvent was removed in vacuo. The reaction was coated onto Celite and purified by column chromatography (5:1 DCM:Hep->8:1 DCM:Hep). Pure fractions were pumped down to give a white foam (49% yield).

Synthesis of 3-(5-((9-(4-(tert-butyl)pyridin-2-yl)-9H-carbazol-2-yl)oxy)-2',6'-diisopropyl-[1,1'-biphenyl]-3-yl)-1-(2,6-diisobutylphenyl)-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisobutylphenyl)benzene-1,2-diamine (651 mg, 0.768 mmol) was dissolved in triethoxymethane (6391 μl, 38.4 mmol) in a 100 mL rbf with a stirbar. hydrogen chloride (76 μl, 0.922 mmol) was added to give a color change from dark to lighter red. The reaction was heated to 80° C. for 18 h. The solvent was removed in vacuo to give a pink solid. Added $Et_2O$ and collected solid by filtration (78% yield).

Synthesis of Compound 2546634

3-(5-((9-(4-(tert-butyl)pyridin-2-yl)-9H-carbazol-2-yl)oxy)-2',6'-diisopropyl-[1,1'-biphenyl]-3-yl)-1-(2,6-diisobutylphenyl)-H-benzo[d]imidazol-3-ium chloride (534 mg, 0.598 mmol) and monosilver(I) monosilver(III) monoxide (69.2 mg, 0.299 mmol) were dissolved in 1,2-dichloroethane (10 ml) and stirred at r.t. for 18 h. The solvent was removed in vacuo and Pt(COD)$Cl_2$ (224 mg, 0.598 mmol) was added along with ortho-dichlorobenzene (10.00 ml). The reaction was heated to reflux. After several days the reaction was cooled to r.t. and the solvent was removed in vacuo. The material was coated onto Celite and purified by column chromatography (3:2 Hep:DCM) to give a yellow solid (45% yield).

Synthesis of Compound 2546654

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(2,6-bis(propan-2-yl-d7)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N1-(2,6-bis(propan-2-yl-d7)phenyl)benzene-1,2-diamine (0.550 g, 1.948 mmol), 9-(4-(tert-butyl)pyridin-2-yl)-2-((5-chloro-2',6'-diisopropyl-[1,1'-biphenyl]-3-yl)oxy)-9H-carbazole (1.04 g, 1.771 mmol), Pd(allyl)Cl (0.019 g, 0.053 mmol), di-tert-butyl(1-methyl-2,2-diphenylcyclopropyl)phosphane (0.075 g, 0.213 mmol), and sodium 2-methylpropan-2-olate (0.426 g, 4.43 mmol) were added to a 250 mL round-bottom flask with a stirbar. The reaction was cycled onto the line via three vacuum/$N_2$ refill cycles. Anhydrous toluene (15 mL) was added and the reaction was heated to reflux for two hours. Reaction was cooled to r.t. and solvent was removed in vacuo. Coated onto Celite and purified by column chromatography (5:1 DCM:Hep->8:1 DCM:Hep) to give a white solid (24% yield).

Synthesis of 1-(2,6-bis(propan-2-yl-d7)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-(2,6-bis(propan-2-yl-d7)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine (0.346 g, 0.415 mmol) was dissolved in triethoxymethane (3.45 ml, 20.76 mmol) in a 100 mL round-bottom flask with a stirbar. Hydrogen chloride (0.041 ml, 0.498 mmol) was added to give a color change from dark red to black. The reaction was heated to 80° C. for 18 h. The reaction was cooled to r.t. and the solvent was removed in vacuo to give a sticky solid. $Et_2O$ was added and the solid was collected by filtration (71% yield).

Synthesis of Compound 2546654

1-(2,6-bis(propan-2-yl-d7)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (260 mg, 0.296 mmol) and monosilver(I) monosilver(III) monoxide (34.2 mg, 0.148 mmol) were added to a 50 mL round-bottom flask with a stirbar. 1,2-dichloroethane (3 ml) was added and the reaction was allowed to stir at r.t. for 18 h. The reaction solvent was removed in vacuo and $Pt(COD)Cl_2$ (111 mg, 0.296 mmol) was added along with ortho-dichlorobenzene (3.00 mL) and the reaction was heated to reflux for two nights. The reaction solvent was removed in vacuo and reaction was coated onto Celite and purified by column chromatography (1:1 DCM:Hep) to give a yellow solid (71% yield).

Synthesis of Compound 2546648

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(5-((9-(4-(tert-butyl)pyridin-2-yl)-9H-carbazol-2-yl)oxy)-2',6'-diisopropyl-[1,1'-biphenyl]-3-yl)-N2-(2,6-dimethylphenyl)benzene-1,2-diamine N1-(2,6-dimethylphenyl)benzene-1,2-diamine (0.768 g, 3.62 mmol), 9-(4-(tert-butyl)pyridin-2-yl)-2-((5-chloro-2',6'-diisopropyl-[1,1'-biphenyl]-3-yl)oxy)-9H-carbazole (1.93 g, 3.29 mmol), Pd(allyl)Cl (0.036 g, 0.099 mmol), di-tert-butyl(1-methyl-2,2-diphenylcyclopropyl)phosphane (0.139 g, 0.394 mmol), and sodium 2-methylpropan-2-olate (0.790 g, 8.22 mmol) were added to a 500 mL round-bottom flask. Anhydrous toluene (30 ml) was added and the reaction was heated to reflux for 18 h. Solvent was removed in vacuo and the material was coated onto Celite and purified by column chromatography (4:1 DCM:Hep) to give an off-white foam (53% yield).

Synthesis of 1-(5-((9-(4-(tert-butyl)pyridin-2-yl)-9H-carbazol-2-yl)oxy)-2',6'-diisopropyl-[1,1'-biphenyl]-3-yl)-3-(2,6-dimethylphenyl)-1H-benzo[d]imidazol-3-ium chloride N1-(5-((9-(4-(tert-butyl)pyridin-2-yl)-9H-carbazol-2-yl)oxy)-2',6'-diisopropyl-[1,12'-biphenyl]-3-yl)-N2-(2,6-dimethylphenyl)benzene-1,2-diamine (1.3 g, 1.704 mmol) was added to a 100 mL round-bottom flask with a stirbar. Triethoxymethane (14.17 ml, 85 mmol) was added followed by hydrogen chloride (0.168 ml, 2.044 mmol). The reaction was heated at 80 deg C. for 18 h. The reaction was cooled to r.t. and heptanes and $Et_2O$ were added to give a white ppt, which was collected by filtration (88% yield).

Synthesis of Compound 2546648

3-(5-((9-(4-(tert-butyl)pyridin-2-yl)-9H-carbazol-2-yl)oxy)-2',6'-diisopropyl-[1,1'-biphenyl]-3-yl)-1-(2,6-dimethylphenyl)-1H-benzo[d]imidazol-3-ium chloride (834 mg, 1.030 mmol) and monosilver(I) monosilver(III) monoxide (119 mg, 0.515 mmol) were added to a 100 mL round-bottom flask with a stirbar. 1,2-dichloroethane (3 ml) was added and the reaction was stirred at r.t. for 18 h. The reaction solvent was removed under vacuum and $Pt(COD)Cl_2$ (385 mg, 1.030 mmol) was added along with ortho-dichlorobenzene (3.00 mL). The reaction was then placed to heat at reflux for four nights. The solvent was removed in vacuo and the reaction was coated onto Celite and purified by column chromatography (1:1 DCM:Hep) to give a yellow solid (69% yield).

Synthesis of Compound 2546637

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-([1,1':3',1"-terphenyl]-2'-yl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N1-([1,1':3',1"-terphenyl]-2'-yl)benzene-1,2-diamine hydrochloride (0.601 g, 1.611 mmol), 9-(4-(tert-butyl)pyridin-2-yl)-2-((5-chloro-2',6'-diisopropyl-[1,1'-biphenyl]-3-yl)oxy)-9H-carbazole (0.946 g, 1.611 mmol), Pd(allyl)Cl (0.018 g, 0.048 mmol), di-tert-butyl(1-methyl-2,2-diphenylcyclopropyl)phosphane (0.068 g, 0.193 mmol), and sodium 2-methylpropan-2-olate (0.542 g, 5.64 mmol) were added to a 500 mL round-bottom flask with a stirbar. The reagents were cycled onto the line via three vacuum/$N_2$ refill cycles. After three hours the reaction was pumped down to dryness and the material was coated onto Celite and purified by column chromatography (3:1 DCM:Hep). Pure fractions were combined and pumped down to give an off-white foam (39% yield).

Synthesis of 1-([1,1':3',1"-terphenyl]-2'-yl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-([1,1':3',1"-terphenyl]-2'-yl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine (0.55 g, 0.620 mmol) was added to a 250 mL round-bottom flask with a stirbar. Triethoxymethane (5.16 ml, 31.0 mmol) was added followed by hydrogen chloride (0.061 ml, 0.744 mmol). The reaction was placed to heat at 80° C. for 18 h. The reaction was cooled to r.t. and heptanes was added giving a ppt. This was collected by filtration and dried in a vacuum oven (76% yield).

Synthesis of Compound 2546637

1-([1,1': 3',1"-terphenyl]-2'-yl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (439 mg, 0.470 mmol) and monosilver(I) monosilver(III) monoxide (54.5 mg, 0.235 mmol) were added to a 100 mL round-bottom flask with a stirbar. 1,2-dichloroethane (3 ml) was added and the reaction was stirred at r.t. for 18 h. The solvent was removed in vacuo and Pt(COD)$Cl_2$ (176 mg, 0.470 mmol) was added along with ortho-dichlorobenzene (3.00 mL). The reaction was heated to reflux for three nights. Cooled to r.t. and the solvent was removed using the Kugelrohr. The compound was coated onto Celite and purified by column chromatography (1:1 Hep:DCM) to give a yellow solid that was triturated with MeOH (52% yield).

Synthesis of Compound 2546676

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(2-(tert-butyl)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N1-(2-(tert-butyl)phenyl)benzene-1,2-diamine (0.336 g, 1.396 mmol), 9-(4-(tert-butyl)pyridin-2-yl)-2-((5-chloro-2',6'-diisopropyl-[1,1'-biphenyl]-3-yl)oxy)-9H-carbazole (0.82 g, 1.396 mmol), Pd(allyl)Cl (0.015 g, 0.042 mmol), di-tert-butyl(1-methyl-2,2-diphenylcyclopropyl)phosphane (0.059 g, 0.168 mmol), and sodium 2-methylpropan-2-olate (0.336 g, 3.49 mmol) were added to a 250 mL round-bottom flask with a stirbar. The reaction was cycled onto the line via three vacuum/$N_2$ refill cycles. Anhydrous toluene (15 ml) was added and the reaction was placed to heat at reflux for 18 h. The reaction was cooled to r.t. and the solvent was removed in vacuo. A FC was run (3:1 DCM:Hep). The pure fractions were combined and dried to give a white foam (63% yield).

Synthesis of 1-(2-(tert-butyl)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-(2-(tert-butyl)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine (697 mg, 0.881 mmol) was added to a 100 mL round-bottom flask with a stirbar. Triethoxymethane (7327 μl, 44.1 mmol) was added along with hydrogen chloride (87 μl, 1.057 mmol). The solution was placed to heat at 80° C. for 18 h. The solvent was removed in vacuo to give a reddish-white solid (99% yield).

Synthesis of Compound 2546676

1-(2-(tert-butyl)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (950 mg, 1.134 mmol) and monosilver(I) monosilver(III) monoxide (131 mg, 0.567 mmol) were added to a 100 mL round-bottom flask with a stirbar. 1,2-dichloroethane (5 ml) was added and the reaction was stirred at r.t. for 18 h. The solvent was removed under vacuum and $Pt(COD)Cl_2$ (424 mg, 1.134 mmol) was added along with ortho-dichlorobenzene (10 ml). The reaction was degassed and heated to reflux for four nights. The reaction was cooled to r.t. and the solvent was removed using the Kugelrohr. The compound was coated onto Celite and purified by column chromatography (1:1 Hep:DCM). The pure fractions were combined and pumped down. The material was dissolved in the minimum amount of DCM and then precipitated using MeOH. The yellow solid was collected on filter paper (62% yield).

Synthesis of Compound 2625507

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a 500 mL round-bottom flask with a stirbar. This was cycled onto the line via three vacuum/$N_2$ refill cycles. Anhydrous DMSO (79 ml) and 3-chlorophenol (1.704 ml, 16.50 mmol) were then added and the reaction was heated to 140° C. for 18 h. The reaction was cooled to r.t. and water was added to give a precipitate. The solid remaining after filtration was dissolved in DCM and washed with brine. The organic layer was dried over $MgSO_4$, filtered, and coated onto Celite. The product was isolated via column chromatography (4:1 DCM:Hep) to give a white foam (76% yield).

Synthesis of N1-([1,1': 3',1"-terphenyl]-2'-yl)-N2-(3-((9-(4-(tert-butyl)pyridin-2-yl)-9H-carbazol-2-yl)oxy)phenyl)benzene-1,2-diamine N1-([1,1': 3',1"-terphenyl]-2'-yl)benzene-1,2-diamine hydrochloride (0.891 g, 2.389 mmol), 9-(4-(tert-butyl)pyridin-2-yl)-2-(3-chlorophenoxy)-9H-carbazole (1.02 g, 2.389 mmol), Pd(allyl)Cl (0.026 g, 0.072 mmol), di-tert-butyl(1-methyl-2,2-diphenylcyclopropyl)phosphane (0.101 g, 0.287 mmol), and sodium 2-methylpropan-2-olate (0.804 g, 8.36 mmol) were added to a 250 mL round-bottom flask with a stirbar and cycled onto the line via three vacuum/$N_2$ refill cycles. Anhydrous toluene (15 mL) was added and the reaction was heated to reflux for 18 h. The solvent was removed in vacuo and the product was isolated via column chromatography (3:1 DCM:Hep) as a white foam (83% yield).

Synthesis of 1-([1,1': 3',1"-terphenyl]-2'-yl)-3-(3-((9-(4-(tert-butyl)pyridin-2-yl)-9H-carbazol-2-yl)oxy)phenyl)-1H-benzo[d]imidazol-3-ium chloride N1-([1,1':3',1"-terphenyl]-2'-yl)-N2-(3-((9-(4-(tert-butyl)pyridin-2-yl)-9H-carbazol-2-yl)oxy)phenyl)benzene-1,2-diamine (1.44 g, 1.981 mmol) was added to a 100 mL round-bottom flask with a stirbar. Triethoxymethane (16.47 ml, 99 mmol) and hydrogen chloride (0.195 ml, 2.377 mmol) were added and the reaction was heated to 80° C. for 18 h. The reaction solvent was removed in vacuo and the compound was isolated as a red-white solid in quantitative yield.

Synthesis of Compound 2625507

1-([1,1': 3',1"-terphenyl]-2'-yl)-3-(3-((9-(4-(tert-butyl)pyridin-2-yl)-9H-carbazol-2-yl)oxy)phenyl)-1H-benzo[d]imidazol-3-ium chloride (1.532 g, 1.981 mmol) and monosilver(I) monosilver(III) monoxide (0.230 g, 0.990 mmol) were added to a 250 mL round-bottom flask with a stirbar. 1,2-dichloroethane (10 ml) was added and the reaction was stirred at r.t. for 18 h. The solvent was removed in vacuo and $Pt(COD)Cl_2$ (0.741 g, 1.981 mmol) and ortho-dichlorobenzene (10 ml) were added and the reaction was heated to reflux for five nights. The solvent was removed using a Kugelrohr apparatus and the compound was isolated via column chromatography (2:1 DCM:Hep) as a yellow solid. It was triturated in MeOH and dried in the vacuum oven (35% yield).

Synthesis of Compound 2625546

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a two-neck round-bottom flask with a stirbar. This was cycled onto the line via three vacuum/$N_2$ refill cycles. Anhydrous dimethyl sulfoxide (79 ml) and 3-chlorophenol (1.704 ml, 16.50 mmol) were then added and the reaction was heated to 140° C. for 18 h. The reaction was cooled to r.t. and water was added to give a precipitate. The solid was collected via filtration, dissolved in DCM, and washed with brine. The organic layer was dried over $MgSO_4$, filtered, and coated onto Celite. FC run (4:1 DCM:Hep). The pure fractions were collected and pumped down to give a sticky white foam (76% yield).

Synthesis of N1-(2-(tert-butyl)phenyl)-N2-(3-((9-(4-(tert-butyl)pyridin-2-yl)-9H-carbazol-2-yl)oxy)phenyl)benzene-1,2-diamine N1-(2-(tert-butyl)phenyl)benzene-1,2-diamine (0.576 g, 2.396 mmol), 9-(4-(tert-butyl)pyridin-2-yl)-2-(3-chlorophenoxy)-9H-carbazole (1.023 g, 2.396 mmol), Pd(allyl)Cl (0.026 g, 0.072 mmol), di-tert-butyl(1-methyl-2,2-diphenylcyclopropyl)phosphane (0.101 g, 0.288 mmol), and sodium 2-methylpropan-2-olate (0.576 g, 5.99 mmol) were added to a two-neck flask with a stirbar. The reagents were cycled onto the line via three vacuum/$N_2$ refill cycles. Anhydrous toluene (15 ml) was added and the reaction was heated to reflux. After 3 hrs, the solvent was removed in vacuo and a FC was run (3:1 DCM:Hep). The material was isolated as an off-white foam (69% yield).

Synthesis of 1-(2-(tert-butyl)phenyl)-3-(3-((9-(4-(tert-butyl)pyridin-2-yl)-9H-carbazol-2-yl)oxy)phenyl)-1H-benzo[d]imidazol-3-ium chloride N1-(2-(tert-butyl)phenyl)-N2-(3-((9-(4-(tert-butyl)pyridin-2-yl)-9H-carbazol-2-yl)oxy)phenyl)benzene-1,2-diamine (1.05 g, 1.664 mmol) was added to a 100 mL round-bottom flask with a stirbar. Triethoxymethane (13.84 ml, 83 mmol) was added to give a clear green solution. Addition of conc. hydrogen chloride (0.164 ml, 1.997 mmol) resulted in an immediate color change to orange. The solution was placed to heat at 80° C. for 18 h. The solvent was removed in vacuo to give a red-white solid (99% yield).

Synthesis of Compound 2625546

1-(2-(tert-butyl)phenyl)-3-(3-((9-(4-(tert-butyl)pyridin-2-yl)-9H-carbazol-2-yl)oxy)phenyl)-1H-benzo[d]imidazol-3-ium chloride (1.12 g, 1.654 mmol) and monosilver(I) monosilver(III) monoxide (0.192 g, 0.827 mmol) were added to a 100 mL round-bottom flask with a stirbar. 1,2-dichloroethane (5 ml) was added and the reaction was stirred at r.t. for 18 h. The solvent was removed in vacuo. $Pt(COD)Cl_2$ (0.619 g, 1.654 mmol) was added along with ortho-dichlorobenzene (10 ml). The reaction was placed to heat at reflux. After heating for five nights, the reaction was cooled to r.t. and the solvent was removed on the Kugelrohr. Coated onto Celite and FC run (2:1 DCM:Hep). Isolated a yellow solid (59% yield).

Synthesis of Compound 2546650

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. for 18 h. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(2,6-bis(methyl-d3)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N-(2-(chloro-15-azaneyl)phenyl)-2,6-bis(methyl-d3)aniline (0.807 g, 3.17 mmol), 9-(4-(tert-butyl)pyridin-2-yl)-2-((5-chloro-2',6'-diisopropyl-[1,1'-biphenyl]-3-yl)oxy)-9H-carbazole (1.69 g, 2.88 mmol), Pd(allyl)Cl (0.032 g, 0.086 mmol), di-tert-butyl(1-methyl-2,2-diphenylcyclopropyl)phosphane (0.122 g, 0.345 mmol), and sodium 2-methylpropan-2-olate (0.968 g, 10.07 mmol) were added to a 250 mL round-bottom flask with a stirbar. Anhydrous toluene (30 ml) was added and the reaction was heated to reflux. After 2 hr, the solvent was removed in vacuo and the compound was isolated via column chromatography (4:1 DCM:Hep) as a white solid (23% yield).

Synthesis of 3-(2,6-bis(methyl-d3)phenyl)-1-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-(2,6-bis(methyl-d3)phenyl)-N2-(5-((9-(4-(tert-butyl)pyridin-2-yl)-9H-carbazol-2-yl)oxy)-2',6'-diisopropyl-[1,1'- biphenyl]-3-yl)benzene-1,2-diamine (0.51 g, 0.663 mmol) was added to a 250 mL round-bottom flask with a stirbar. Triethoxymethane (5.52 ml, 33.2 mmol) was then added followed by hydrogen chloride (0.065 ml, 0.796 mmol) and the reaction was heated at 80° C. for 18 h. The reaction was pumped down to dryness to give a reddish white solid in quantitative yield.

Synthesis of Compound 2546650

1-(2,6-bis(methyl-d3)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (580 mg, 0.711 mmol) and monosilver(I) monosilver(III) monoxide (82 mg, 0.356 mmol) were added to a 250 mL round-bottom flask with a stirbar. 1,2-dichloroethane (10 ml) was added and the reaction was stirred at r.t. for 18 h. The solvent was removed in vacuo and Pt(COD)$Cl_2$ (266 mg, 0.711 mmol) and ortho-dichlorobenzene (10.00 ml) were added and the reaction was heated at reflux for five nights. The solvent was then removed in vacuo and the compound was isolated via column chromatography (1:1 Hep:DCM) to give a yellow solid. The solid was triturated with MeOH to give the final complex (43% yield).

Synthesis of Compound 2550306

Synthesis of 2-(3-bromo-5-(tert-butyl)phenoxy)-9-(4-(tert-butyl)pyridin-2-yl)-9H-carbazole A mixture of 1,3-dibromo-5-(tert-butyl)benzene (5.45 g, 18.65 mmol), 9-(4-(tert-butyl)pyridin-2-yl)-9H-carbazol-2-ol (2.95 g, 9.32 mmol), copper(I) iodide (0.355 g, 1.865 mmol), picolinic acid (0.459 g, 3.73 mmol), and potassium phosphate (3.96 g, 18.65 mmol) was vacuumed and back-filled with nitrogen several times. DMSO (20 ml) was added to the reaction mixture and heated at 120° C. for 18 h. Cooled down and added water. The resulting brown solid was collected by filtration and dissolved in DCM, washed with brine, dried over $MgSO_4$, and isolated by column chromatography (2:1 DCM:Hep) to give the final compound (59% yield).

Synthesis of N1-(3-(tert-butyl)-5-((9-(4-(tert-butyl)pyridin-2-yl)-9H-carbazol-2-yl)oxy)phenyl)-N2-(2-(tert-butyl)phenyl)benzene-1,2-diamine N1-(2-(tert-butyl)phenyl)benzene-1,2-diamine (0.506 g, 2.106 mmol), 2-(3-bromo-5-(tert-butyl)phenoxy)-9-(4-(tert-butyl)pyridin-2-yl)-9H-carbazole (1.01 g, 1.915 mmol), Pd(allyl)Cl dimer (0.021 g, 0.057 mmol), di-tert-butyl(1-methyl-2,2-diphenylcyclopropyl)phosphane (0.081 g, 0.230 mmol), and sodium 2-methylpropan-2-olate (0.460 g, 4.79 mmol) were added to a 250 mL round-bottom flask with a stirbar. The reaction was cycled onto the line via three vacuum/N2 refill cycles. Anhydrous toluene (20 ml) was added and the reaction was heated to reflux for 18 h. The solvent was removed in vacuo and the compound was isolated via column chromatography (4:1 DCM:Hep) to give an off-white foam (82% yield).

Synthesis of 3-(3-(tert-butyl)-5-((9-(4-(tert-butyl)pyridin-2-yl)-9H-carbazol-2-yl)oxy)phenyl)-1-(2-(tert-butyl)phenyl)-1H-benzo[d]imidazol-3-ium chloride N1-(3-(tert-butyl)-5-((9-(4-(tert-butyl)pyridin-2-yl)-9H-carbazol-2-yl)oxy)phenyl)-N2-(2-(tert-butyl)phenyl)benzene-1,2-diamine (1.08 g, 1.572 mmol) was added to a 100 mL round-bottom flask with a stirbar. Triethoxymethane (13.08 ml, 79 mmol) was added followed by the addition of hydrogen chloride (0.155 ml, 1.887 mmol). The solution was placed to heat at 80° C. for 18 h. The reaction solvent was removed in vacuo to give the target compound as a reddish-white solid in quantitative yield.

Synthesis of Compound 2550306

3-(3-(tert-butyl)-5-((9-(4-(tert-butyl)pyridin-2-yl)-9H-carbazol-2-yl)oxy)phenyl)-1-(2-(tert-butyl)phenyl)-1H-benzo[d]imidazol-3-ium chloride (1.1 g, 1.500 mmol) and monosilver(I) monosilver(III) monoxide (0.174 g, 0.750 mmol) were added to a 100 mL round-bottom flask with a stirbar. 1,2-dichloroethane (10 ml) was added and the reaction was stirred at r.t. for 18 h. The reaction solvent was removed in vacuo. Ortho-dichlorobenzene (10.00 ml) and Pt(COD)$Cl_2$ (0.561 g, 1.500 mmol) were added and the reaction cycled onto the line via three vacuum/$N_2$ refill cycles. It was placed to heat at reflux for eight days. The reaction was cooled to r.t. and the solvent was removed on the Kugelrohr. The target compound was isolated via column chromatography (1:1 Hep:DCM) as a yellow solid. The yellow solid was triturated in MeOH and dried in the vacuum oven (50% yield).

Synthesis of Compound 2550267

Synthesis of 2-(3-bromo-5-(tert-butyl)phenoxy)-9-(4-(tert-butyl)pyridin-2-yl)-9H-carbazole A mixture of 1,3-dibromo-5-(tert-butyl)benzene (5.45 g, 18.65 mmol), 9-(4-(tert-butyl)pyridin-2-yl)-9H-carbazol-2-ol (2.95 g, 9.32 mmol), copper(I) iodide (0.355 g, 1.865 mmol), picolinic acid (0.459 g, 3.73 mmol), and potassium phosphate (3.96 g, 18.65 mmol) was vacuumed and back-filled with nitrogen several times. DMSO (20 ml) was added to the reaction mixture and heated at 120° C. for 18 h. Cooled down and added water. The resulting brown solid was collected by filtration and dissolved in DCM, washed with brine, dried over $MgSO_4$, and isolated by column chromatography (2:1 DCM:Hep) to give the final compound (59% yield).

Synthesis of N1-([1,1':3',1"-terphenyl]-2'-yl)-N2-(3-(tert-butyl)-5-((9-(4-(tert-butyl)pyridin-2-yl)-9H-carbazol-2-yl)oxy)phenyl)benzene-1,2-diamine N-(2-(chloro-15-azaneyl)phenyl)-[1,1':3',1"-terphenyl]-2'-amine (0.762 g, 2.044 mmol), 2-(3-bromo-5-(tert-butyl)phenoxy)-9-(4-(tert-butyl)pyridin-2-yl)-9H-carbazole (0.98 g, 1.858 mmol), Pd(allyl)Cl dimer (0.020 g, 0.056 mmol), di-tert-butyl(1-methyl-2,2-diphenylcyclopropyl)phosphane (0.079 g, 0.223 mmol), and sodium 2-methylpropan-2-olate (0.625 g, 6.50 mmol) were added to a 250 mL round-bottom flask with a stirbar and cycled onto the line via three vacuum/$N_2$ refill cycles. Anhydrous toluene (20 ml) was added and the reaction was heated to reflux for 18 h. The solvent was then removed in vacuo and the target compound was isolated via column chromatography (4:1 DCM:Hep) as a white foam (82% yield).

Synthesis of 1-([1,1': 3',1"-terphenyl]-2'-yl)-3-(3-(tert-butyl)-5-((9-(4-(tert-butyl)pyridin-2-yl)-9H-carbazol-2-yl)oxy)phenyl)-1H-benzo[d]imidazol-3-ium chloride N1-([1,1':3',1"-terphenyl]-2'-yl)-N2-(3-(tert-butyl)-5-((9-(4-(tert-butyl)pyridin-2-yl)-9H-carbazol-2-yl)oxy)phenyl)

benzene-1,2-diamine (1.2 g, 1.533 mmol) was added to a 100 mL round-bottom flask with a stirbar. Triethoxymethane (12.75 ml, 77 mmol) was added followed by hydrogen chloride (0.151 ml, 1.839 mmol) and the reaction was placed to heat at 80° C. for 18 h. The reaction was cooled to r.t. and heptanes was added to give a sticky solid. The solvent was removed via filtration and the sticky solid was dissolved in DCM and pumped down. Heptanes was added and the material was scraped to give a white powder in (82% yield).

Synthesis of Compound 2550267

1-([1,1': 3',1"-terphenyl]-2'-yl)-3-(3-(tert-butyl)-5-((9-(4-(tert-butyl)pyridin-2-yl)-9H-carbazol-2-yl)oxy)phenyl)-1H-benzo[d]imidazol-3-ium chloride (1.04 g, 1.254 mmol) and monosilver(I) monosilver(III) monoxide (0.145 g, 0.627 mmol) were added to a 250 mL round-bottom flask with a stirbar. 1,2-dichloroethane (10 ml) was added and the reaction was stirred at r.t. After 4 hrs the reaction was pumped down on the rotovap. $Pt(COD)Cl_2$ (0.469 g, 1.254 mmol) and ortho-dichlorobenzene (10.00 ml) were added and the reaction was cycled onto the line via three vacuum/$N_2$ refill cycles. The reaction was heated to reflux for seven days. The solvent was removed on the Kugelrohr and the compound was isolated via column chromatography (1:1 Hep:DCM) as a yellow solid that was then triturated in MeOH and dried in the vacuum oven (29% yield).

Synthesis of Compound 2625547

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a 500 mL round-bottom flask with a stirbar. This was cycled onto the line via three vacuum/$N_2$ refill cycles. Anhydrous DMSO (79 ml) and 3-chlorophenol (1.704 ml, 16.50 mmol) were then added and the reaction was heated to 140° C. for 18 h. The reaction was cooled to r.t. and water was added to give a precipitate. The solid remaining after filtration was dissolved in DCM and washed with brine. The organic layer was dried over $MgSO_4$, filtered, and coated onto Celite. The product was isolated via column chromatography (4:1 DCM:Hep) to give a white foam (76% yield).

Synthesis of N1-(3-((9-(4-(tert-butyl)pyridin-2-yl)-9H-carbazol-2-yl)oxy)phenyl)-N2-(3,5-di-tert-butylphenyl)benzene-1,2-diamine 3,5-di-tert-butyl-N-(2-(chloro-15-azaneyl)phenyl)aniline (0.873 g, 2.62 mmol), 9-(4-(tert-butyl)pyridin-2-yl)-2-(3-chlorophenoxy)-9H-carbazole (1.018 g, 2.384 mmol), Pd(allyl)Cl (0.026 g, 0.072 mmol), di-tert-butyl(1-methyl-2,2-diphenylcyclopropyl)phosphane (0.101 g, 0.286 mmol), and sodium 2-methylpropan-2-olate (0.802 g, 8.35 mmol) were added to a 500 mL round-bottom flask with a stirbar. Anhydrous toluene (23.84 ml) was added and the reaction was heated to reflux for 18 h. The reaction was cooled to r.t. and the solvent was removed in vacuo. The target compound was isolated via column chromatography (4:1 DCM:Hep) as a white foam (67% yield).

Synthesis of 3-(3-((9-(4-(tert-butyl)pyridin-2-yl)-9H-carbazol-2-yl)oxy)phenyl)-1-(3,5-di-tert-butylphenyl)-1H-benzo[d]imidazol-3-ium chloride N1-(3-((9-(4-(tert-butyl)pyridin-2-yl)-9H-carbazol-2-yl)oxy)phenyl)-N2-(3,5-di-tert-butylphenyl)benzene-1,2-diamine (1.1 g, 1.601 mmol) was added to a 100 mL round-bottom flask with a stirbar. Triethoxymethane (13.32 ml, 80 mmol) and hydrogen chloride (0.158 ml, 1.922 mmol) were added and the reaction was heated to 80° C. for 18 h. The reaction was cooled to r.t and the solvent was removed on the Kugelrohr to give an off-white solid (84% yield).

Synthesis of Compound 2625547

3-(3-((9-(4-(tert-butyl)pyridin-2-yl)-9H-carbazol-2-yl)oxy)phenyl)-1-(3,5-di-tert-butylphenyl)-1H-benzo[d]imidazol-3-ium chloride (0.99 g, 1.350 mmol) and monosilver(I) monosilver(III) monoxide (0.156 g, 0.675 mmol) were added to a 250 mL round-bottom flask with a stirbar. 1,2-dichloroethane (10 ml) was added and the reaction was stirred at r.t. for 18 h. The solvent was removed in vacuo and $Pt(COD)Cl_2$ (0.505 g, 1.350 mmol) and ortho-dichlorobenzene (10.00 ml) were added. The reaction was cycled onto the line via three vacuum/$N_2$ refill cycles. The reaction was heated to reflux for three nights. The reaction was cooled to r.t. and the solvent was removed on the Kugelrohr. The compound was isolated via column chromatography (1:1 DCM:Hep) to give a yellow solid that was triturated in MeOH and dried in the vacuum oven (64% yield).

Synthesis of Compound 2625533

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux for 18 h. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a 500 mL round-bottom flask with a stirbar. This was cycled onto the line via three vacuum/$N_2$ refill cycles. Anhydrous DMSO (79 ml) and 3-chlorophenol (1.704 ml, 16.50 mmol) were then added and the reaction was heated to 140° C. for 18 h. The reaction was cooled to r.t. and water was added to give a precipitate. The solid remaining after filtration was dissolved in DCM and washed with brine. The organic layer was dried over $MgSO_4$, filtered, and coated onto Celite. The product was isolated via column chromatography (4:1 DCM:Hep) to give a white foam (76% yield).

Synthesis of N1-([1,1':3',1"-terphenyl]-2'-yl-2,2",3,3",4,4",5,5",6,6"-d10)-N2-(3-((9-(4-(tert-butyl)pyridin-2-yl)-9H-carbazol-2-yl)oxy)phenyl)benzene-1,2-diamine N-(2-(chloro-15-azaneyl)phenyl)-[1,1':3',1"-terphenyl]-2,2",3,3",4,4",5,5",6,6"-d10-2'-amine (1.717 g, 4.48 mmol), 9-(4-(tert-butyl)pyridin-2-yl)-2-(3-chlorophenoxy)-9H-carbazole (1.74 g, 4.08 mmol), Pd(allyl)CL (0.045 g, 0.122 mmol), di-tert-butyl(1-methyl-2,2-diphenylcyclopropyl) phosphane (0.172 g, 0.489 mmol), and sodium 2-methylpropan-2-olate (1.371 g, 14.26 mmol) were added to a 500 mL round-bottom flask with a stirbar. Anhydrous toluene (30 ml) was added and the reaction was heated to reflux for 18 h. The reaction was cooled to r.t. and the solvent was removed in vacuo. The target compound was isolated via column chromatography (4:1 DCM:Hep) as a white solid (83% yield).

Synthesis of 1-([1,1': 3',1"-terphenyl]-2'-yl-2,2",3,3",4,4",5,5",6,6"-d10)-3-(3-((9-(4-(tert-butyl)pyridin-2-yl)-9H-carbazol-2-yl)oxy)phenyl)-1H-benzo[d]imidazol-3-ium chloride N1-([1,1': 3',1"-terphenyl]-2'-yl-2,2",3,3",4,4",5,5 ", 6,6"-d 10)-N2-(3-((9-(4-(tert-butyl)pyridin-2-yl)-9H-carbazol-2-yl)oxy)phenyl)benzene-1,2-diamine (2.5 g, 3.39 mmol) was added to a 100 mL round-bottom flask with a stirbar. Triethoxymethane (28.2 ml, 170 mmol) and hydrogen chloride (0.334 ml, 4.07 mmol) were added and the solution was heated to 80° C. for 18 h. The solvent was removed in vacuo and then heptanes was added. The solution was sonicated in heptanes and the white solid was collected via filtration and dried in the vacuum oven (86% yield).

Synthesis of Compound 2625533

1-([1,1': 3',1"-terphenyl]-2'-yl-2,2",3,3",4,4",5,5",6,6"-d 10)-3-(3-((9-(4-(tert-butyl)pyridin-2-yl)-9H-carbazol-2-yl)oxy)phenyl)-1H-benzo[d]imidazol-3-ium chloride (0.98 g, 1.251 mmol) and monosilver(I) monosilver(III) monoxide (0.145 g, 0.625 mmol) were added to a 250 mL round-bottom flask with a stirbar. 1,2-dichloroethane (10 ml) was added and the reaction was stirred at r.t. The solvent was removed in vacuo and Pt(COD)$Cl_2$ (0.468 g, 1.251 mmol) and ortho-dichlorobenzene (10.00 ml) were added. The reaction was degassed via three vacuum/$N_2$ refill cycles and heated to reflux for three nights. The reaction was cooled to r.t. and the solvent was removed using the Kugelrohr. The target compound was isolated via column chromatography (1:1 DCM:Hep->2:1 DCM:Hep) as a yellow solid. The compound was triturated in MeOH, collected via filtration, and dried in the vacuum oven for 18 h (33% yield).

Synthesis of Compound 2381700760

Synthesis of 1-(3-(3-(1H-imidazol-1-yl)phenoxy)phenyl)-4-(2,6-diisopropylphenyl)-1H-pyrazole 3-(1H-imidazol-1-yl)phenol (0.795 g, 4.96 mmol), 1-(3-bromophenyl)-4-(2,6-diisopropylphenyl)-1H-pyrazole (1.73 g, 4.51 mmol), picolinic acid (0.222 g, 1.805 mmol), copper (I) iodide (0.172 g, 0.903 mmol), and potassium phosphate, tribasic (1.916 g, 9.03 mmol) were added to a 100 mL Schlenk tube with a stirbar. The flask was cycled onto the line via three vacuum/N2 refill cycles. Anhydrous DMSO (45.1 ml) was added and the reaction was heated to 140° C. for 18 h. The reaction was cooled to r.t. and water was added giving a beige precipitate. The solid was collected via filtration and then dissolved in DCM and partitioned with water. The aq layer was extracted with DCM several times. The organic layers were combined and washed with brine. The organic fraction was then dried with $MgSO_4$, filtered, and coated onto Celite. The compound was isolated via column chromatography (2:1 DCM:Hep) to give a white solid (1.39 g, 67%).

Synthesis of 1-(3-(3-(4-(2,6-diisopropylphenyl)-1H-pyrazol-1-yl)phenoxy)phenyl)-3-(methyl-d3)-1H-imidazol-3-ium iodide 1-(3-(3-(1H-imidazol-1-yl)phenoxy)phenyl)-4-(2,6-diisopropylphenyl)-1H-pyrazole (1.39 g, 3.00 mmol) was dissolved in ethyl acetate (10 mL) in a 100 mL Schlenk tube under N2. iodomethane-$d_3$ (0.935 mL, 15.02 mmol) was added via syringe and the reaction was heated to 60° C. for 18 h. A white precipitate formed in the reaction. The reaction was cooled to r.t. and heptanes was added. The solid was collected via filtration and dried in the vacuum oven to give an off-white solid (1.63 g, 89%).

Synthesis of Compound 2381700760

1-(3-(3-(4-(2,6-diisopropylphenyl)-1H-pyrazol-1-yl)phenoxy)phenyl)-3-(methyl-d3)-1H-imidazol-3-ium iodide (0.623 g, 1.025 mmol) and monosilver(I) monosilver(III) monoxide (0.119 g, 0.513 mmol) were added to a 250 mL round-bottom flask with a stirbar. 1,2-dichloroethane (10 ml) was added and the reaction was stirred at r.t. for 18 h. The colorless solution was pumped down to dryness. The compound was dissolved in ortho-dichlorobenzene (10.00 ml) and added to a 100 mL Schlenk tube with a stirbar. Pt(COD)$Cl_2$ (0.384 g, 1.03 mmol) was added to the reaction and the reaction was cycled onto the line via ten vacuum/N2 refill cycles. The reaction was placed to heat at reflux for several days. The reaction was cooled to r.t. and the solvent was removed in vacuo. The reaction was coated onto Celite and isolated by column chromatography (2:1 DCM:Hep) to give a yellow solid (0.53 g, 76%).

Synthesis of Compound 2394432160

Synthesis of 8-(3-(1H-imidazol-1-yl)phenoxy)-4,4,5,5-tetramethyl-3-phenyl-4,5-dihydropyrazolo[1,5-a]quinoline 3-(1H-imidazol-1-yl)phenol (0.481 g, 3.00 mmol), 8-bromo-4,4,5,5-tetramethyl-3-phenyl-4,5-dihydropyrazolo

[1,5-a]quinoline (1.04 g, 2.73 mmol), picolinic acid (0.134 g, 1.091 mmol), copper(I) iodide (0.104 g, 0.545 mmol), and potassium phosphate, tribasic (1.158 g, 5.45 mmol) were added to a 100 mL Schlenk tube with a stirbar. The flask was cycled onto the line via three vacuum/N2 refill cycles. Anhydrous DMSO (27.3 ml) was added and the reaction was heated to 140° C. for 18 h. The reaction was cooled to r.t. and water was added to give a beige precipitate. The precipitate was collected via filtration and dissolved in DCM and partitioned between DCM/water. The aq layer was extracted several times with DCM. The organic layers were combined and washed with brine. The organic fraction was dried with $MgSO_4$, filtered, and coated onto Celite. The product was isolated via column chromatography (1:1 DCM:Hep->1:1 DCM:EtOAc) to give a white solid (0.81 g, 65%).

Synthesis of 3-(methyl-d3)-1-(3-((4,4,5,5-tetramethyl-3-phenyl-4,5-dihydropyrazolo[1,5-a]quinolin-8-yl)oxy)phenyl)-1H-imidazol-3-ium iodide 8-(3-(1H-imidazol-1-yl)phenoxy)-4,4,5,5-tetramethyl-3-phenyl-4,5-dihydropyrazolo[1,5-a]quinoline (0.81 g, 1.759 mmol) was added to a 100 mL Schlenk tube with a stirbar. Ethyl acetate (11.72 ml) was added followed by iodomethane-$d_3$ (0.547 ml, 8.79 mmol). The reaction was placed to heat at 60° C. for 18 h. A white precipitate formed in the reaction. The reaction was cooled to r.t. and heptanes was added. The solid was collected via filtration and dried in the vacuum oven to give an off-white solid (0.89 g, 83%).

Synthesis of Compound 2394432160

3-(methyl-d3)-1-(3-((4,4,5,5-tetramethyl-3-phenyl-4,5-dihydropyrazolo[1,5-a]quinolin-8-yl)oxy)phenyl)-1H-imidazol-3-ium iodide (0.491 g, 0.811 mmol) and monosilver(I) monosilver(III) monoxide (0.094 g, 0.405 mmol) were added to a 250 mL round-bottom flask with a stirbar. 1,2-dichloroethane (10 ml) was added and the reaction was stirred at r.t. for 18 h. The colorless solution was pumped down to dryness. The compound was dissolved in ortho-dichlorobenzene (10.00 ml) and added to a 100 mL Schlenk tube with a stirbar. $Pt(COD)Cl_2$ (0.303 g, 0.811 mmol) was added to the reaction and the reaction was cycled onto the line via ten vacuum/N2 refill cycles. The reaction was placed to heat at reflux for several days. The reaction was cooled to r.t. and the solvent was removed in vacuo. The reaction was coated onto Celite and isolated by column chromatography (2:1 Hep:DCM) to give a yellow solid (0.38 g, 70%).

Synthesis of Compound 2625581

Synthesis of 9-(2-nitrophenyl)-9H-carbazole 2.00 grams, 12.0 mmol of 9H-carbazole, 1.69 grams, 12.0 mmol of 1-fluoro-2-nitrobenzene and 7.79 grams, 24.0 mmol of cesium carbonate were combined in a 250 mL round bottom flask. 60 mL of DMSO was added and this was stirred at 60° C. for 18 hrs. The mixture was diluted with ethyl acetate and water and the layers were separated. The organic layer was washed with water, dried and chromatographed on silica eluted with 6-20% ethyl acetate in heptane to give 3.14 grams (91%) of product as a yellow solid.

Synthesis of 2-(9H-carbazol-9-yl)aniline 3.1 grams of 9-(2-nitrophenyl)-9H-carbazole was dissolved in 200 mL of ethyl acetate. 2 grams of Pd/C 10% was added. A hydrogen balloon was installed and this was stirred for 5 hrs. This was filtered through celite and evaporated to give 2.5 grams (90%) of product.

Synthesis of N-(2-(9H-carbazol-9-yl)phenyl)-2-nitroaniline 2.60 grams, 0.07 mmol of 2-(9H-carbazol-9-yl)aniline, 2.91 grams, 11.7 mmol of 1-iodo-2-nitrobenzene, 0.363 grams, 0.503 mmol of SPhos-Pd-G2 and 1.94 grams, 20.13 mmol of sodium tert-butoxide were combined in a flask. This was evacuated and backfilled with nitrogen. 50 mL of toluene was added and this was refluxed for 22 hrs. The mix was then diluted with ethyl acetate, filtered through celite and chromatographed on silica eluted with 10-15% ethyl acetate in heptane to give 2.90 grams, 76% of product.

Synthesis of N1-(2-(9H-carbazol-9-yl)phenyl)benzene-1,2-diamine 2.90 grams of N-(2-(9H-carbazol-9-yl)phenyl)-2-nitroaniline and 2.00 grams of Pd/C 10% was added and the reaction mixture was hydrogenated by balloon in ethyl acetate to give 2.56 grams of product.

Synthesis of N1-(2-(9H-carbazol-9-yl)phenyl)-N2-(3-((9-(4-(tert-butyl)pyridin-2-yl)-9H-carbazol-2-yl)oxy)phenyl)benzene-1,2-diamine 0.408 grams, 1.17 mmol of N1-(2-(9H-carbazol-9-yl)phenyl)benzene-1,2-diamine, 0.50 grams, 1.06 mmol of 2-(3-bromophenoxy)-9-(4-(tert-butyl)pyridin-2-yl)-9H-carbazole, 12 mg, 0.032 mmol of Pd(allyl)Cl-dimer, 45 mg, 0.27 mmol of cBRIDP and 0.255 grams, 2.65 mmol of sodium tert-butoxide were refluxed in 7 mL of toluene for 5 hrs. The mix was chromatographed on silica eluted with 10% ethyl acetate in heptane to give 0.58 grams, 74% of product.

Synthesis of 3-(2-(9H-carbazol-9-yl)phenyl)-1-(3-((9-(4-(tert-butyl)pyridin-2-yl)-9H-carbazol-2-yl)oxy)phenyl)-1H-benzo[d]imidazol-3-ium chloride 1.20 grams, 1.62 mmol of N1-(2-(9H-carbazol-9-yl)phenyl)-N2-(3-((9-(4-(tert-butyl)pyridin-2-yl)-9H-carbazol-2-yl)oxy)phenyl)benzene-1,2-diamine was stirred in 15 mL of triethylorthoformate. 0.16 mL, 1.95 mmol of hydrochloric acid (37%) was added and this was stirred at 80° C. for 24 h. The product was filtered and washed with heptane to give 1.01 grams, 79% of product.

Synthesis of Compound 2625581

1.0 grams, 1.27 mmol of 3-(2-(9H-carbazol-9-yl)phenyl)-1-(3-((9-(4-(tert-butyl)pyridin-2-yl)-9H-carbazol-2-yl)oxy)phenyl)-1H-benzo[d]imidazol-3-ium chloride and 0.162 grams, 0.70 mmol of silver (I) oxide were stirred in 15 mL of 1,2-dichloroethane for two days. After solvent was evaporated, the crude product was dissolved in 15 mL of o-dichlorobenzene and transferred to a 100 mL Schlenk tube with 0.476 grams, 1.27 mmol of $Pt(COD)Cl_2$ and stirred at reflux for 24 hrs. Evaporation of solvent and chromatography on silica eluted with 60% DCM in heptane to give 750 mg of product (63%).

Synthesis of Compound 2625573

Synthesis of 1-bromo-9-phenyl-9H-carbazole

A mixture of 1-bromo-9H-carbazole (1 g, 4.06 mmol), copper (0.129 g, 2.032 mmol), sodium sulfate (1.731 g, 12.19 mmol), and potassium carbonate (1.685 g, 12.19 mmol) was vacuum and back-filled with nitrogen. iodobenzene (1.364 ml, 12.19 mmol) and 1,2-dichlorobenzene (20 ml) was added to the reaction mixture and heated at reflux for 18 h. Removed solvent and coated on celite. Chromatographed on silica (DCM/Hep=1/3). The product is an off-white oil (97% yield).

Synthesis of N1-(9-phenyl-9H-carbazol-1-yl)benzene-1,2-diamine

A mixture of 1-bromo-9-phenyl-9H-carbazole (1.18 g, 3.66 mmol), benzene-1,2-diamine (0.515 g, 4.76 mmol), $Pd_2(dba)_3$ (0.168 g, 0.183 mmol), and sodium 2-methylpropan-2-olate (0.880 g, 9.16 mmol) was vacuum and back-filled with nitrogen. tri-tert-butylphosphane (14.65 ml, 14.65 mmol) and Toluene (30 ml) were added to the reaction mixture and heated at reflux for 4 h. Cooled down and coated on celite. Chromatographed on silica (EA/Hep=1/2) (70% yield).

Synthesis of N1-(3-((9-(4-(tert-butyl)pyridin-2-yl)-9H-carbazol-2-yl)oxy)phenyl)-N2-(9-phenyl-9H-carbazol-1-yl)benzene-1,2-diamine A mixture of N1-(9-phenyl-9H-carbazol-1-yl)benzene-1,2-diamine (0.778 g, 2.227 mmol), 2-(3-bromophenoxy)-9-(4-(tert-butyl)pyridin-2-yl)-9H-carbazole (1.05 g, 2.227 mmol), (allyl)PdCl-dimer (0.024 g, 0.067 mmol), cBRIDP (0.094 g, 0.267 mmol), and sodium 2-methylpropan-2-olate (0.535 g, 5.57 mmol) was vacuumed and back-filled with nitrogen several times. Toluene (10 ml) was added to the reaction mixture and refluxed for 18 h. Coated on celite and chromatographed on silica (DCM) (82% yield).

Synthesis of 1-(3-((9-(4-(tert-butyl)pyridin-2-yl)-9H-carbazol-2-yl)oxy)phenyl)-3-(9-phenyl-9H-carbazol-1-yl)-1H-benzo[d]imidazol-3-ium chloride N1-(3-((9-(4-(tert-butyl)pyridin-2-yl)-9H-carbazol-2-yl)oxy)phenyl)-N2-(9-phenyl-9H-carbazol-1-yl)benzene-1,2-diamine (1.35 g, 1.825 mmol) was dissolved in triethoxymethane (12.14 ml, 73.0 mmol) and hydrogen chloride (0.180 ml, 2.189 mmol) was added. The reaction mixture was heated at 80° C. for 18 hrs. The solvent was distilled off and the remaining solid was washed with diethyl ether and filtered and dried in the vacuum oven (89% yield).

Synthesis of Compound 2625573

A mixture of 1-(3-((9-(4-(tert-butyl)pyridin-2-yl)-9H-carbazol-2-yl)oxy)phenyl)-3-(9-phenyl-9H-carbazol-1-yl)-1H-benzo[d]imidazol-3-ium chloride (1.1 g, 1.399 mmol) and silver oxide (0.162 g, 0.699 mmol) was stirred in 1,2-dichloroethane (18 ml) at R.T. for 18 hrs. After removing 1,2-dichloroethane, $Pt(COD)Cl_2$ (0.523 g, 1.399 mmol) was added and the reaction mixture was vacuumed and back-filled with nitrogen. 1,2-dichlorobenzene (18 ml) was added and heated at 205° C. for 72 hrs. The solvent was removed and coated on celite and chromatrographed on silica (DCM/Hep=2/1). The product was triturated in MeOH and dried in the vacuum oven (66% yield).

TABLE 1

| | Structure | λmax in PMMA (nm) | PLQY in PMMA (%) | Excited state lifetime at 77K (μs) |
|---|---|---|---|---|
| Compound 20 ($L_{A20}$, $L_{B1}$) | 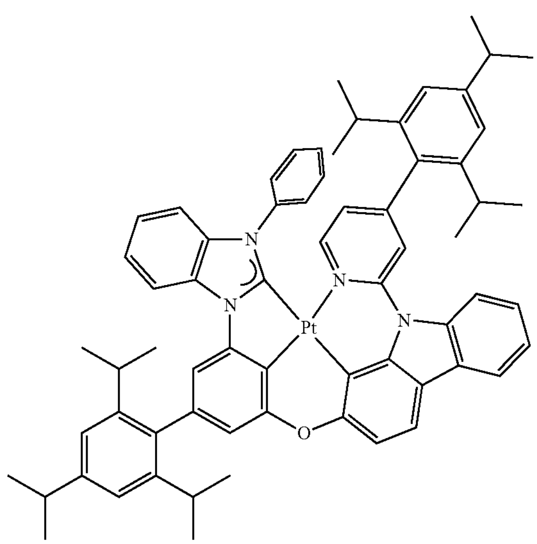 | 458 | 77 | 2.6 |

TABLE 1-continued
| | Structure | λmax in PMMA (nm) | PLQY in PMMA (%) | Excited state lifetime at 77K (μs) |
|---|---|---|---|---|
| Compound 80200 ($L_{A80200}$, $L_{B1}$) | 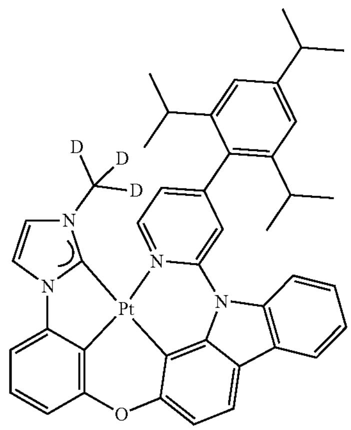 | 453 | 95 | 5.2 |
| Compound 2546630 ($L_{A350}$, $L_{B13}$) | 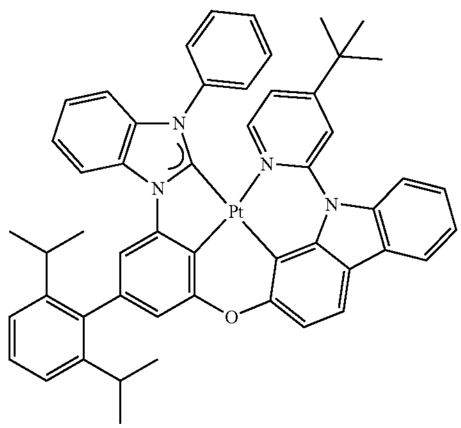 | 455 | 84 | 2.8 |
| Compound 2625490 ($L_{A79210}$, $L_{B13}$) | 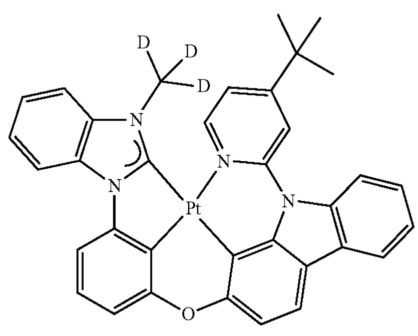 | 449 | 81 | 5.8 |
| Compound 6444920 ($L_{A79220}$, $L_{B31}$) | 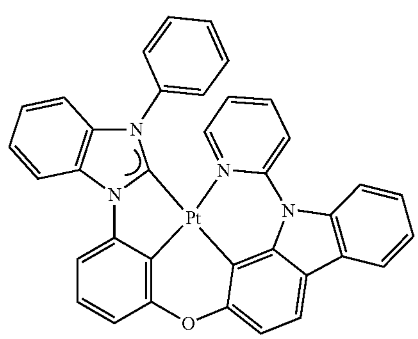 | 455 | 48 | 3.4 |

TABLE 1-continued
| | Structure | λmax in PMMA (nm) | PLQY in PMMA (%) | Excited state lifetime at 77K (μs) |
|---|---|---|---|---|
| Compound 2381699770 ($L_{A79210}$, $L_{B11225}$) | 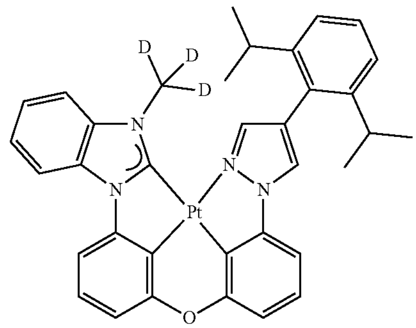 | 459 | 98 | 2.8 |
| Compound 2590203683 ($L_{A353}$, $L_{B12208}$) | 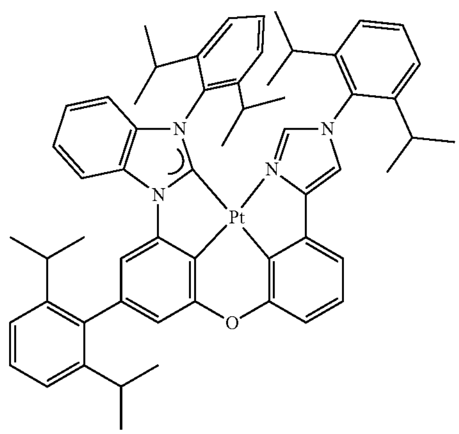 | 470 | 100 | 3.3 |
| Compound 2546633 ($L_{A353}$, $L_{B13}$) | 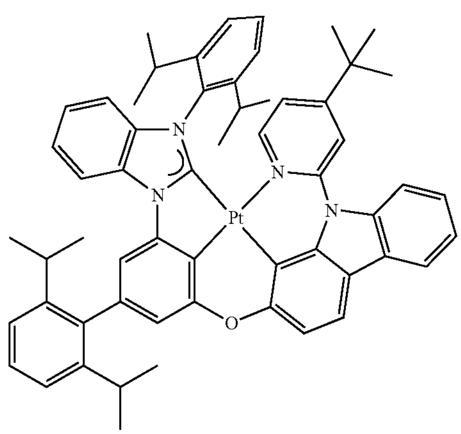 | 455 | 100 | 3.2 |

TABLE 1-continued
| | Structure | λmax in PMMA (nm) | PLQY in PMMA (%) | Excited state lifetime at 77K (μs) |
|---|---|---|---|---|
| Compound 2546634 ($L_{A354}$, $L_{B13}$) | 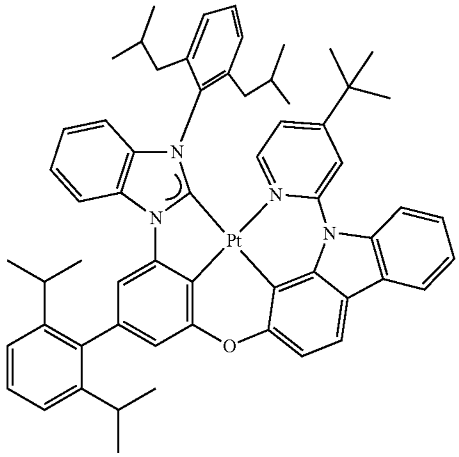 | 455 | 86 | 3.2 |
| Compound 2546654 ($L_{A374}$, $L_{B13}$) | 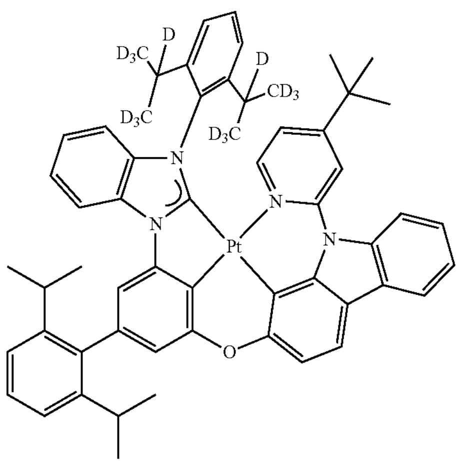  | 455 | 100 | 3.2 |
| Compound 2546648 ($L_{A368}$, $L_{B13}$) | 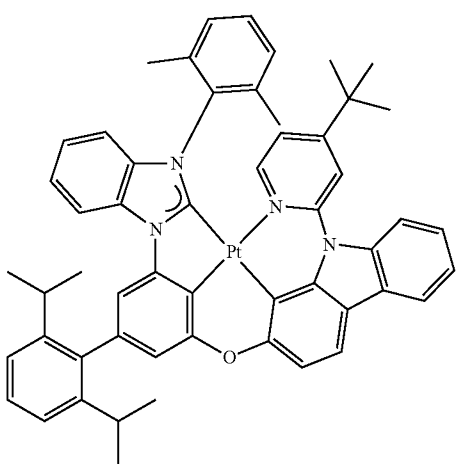 | 454 | 80 | 3.0 |

TABLE 1-continued
| | Structure | λmax in PMMA (nm) | PLQY in PMMA (%) | Excited state lifetime at 77K (μs) |
|---|---|---|---|---|
| Compound 2546637 ($L_{A357}$, $L_{B13}$) | 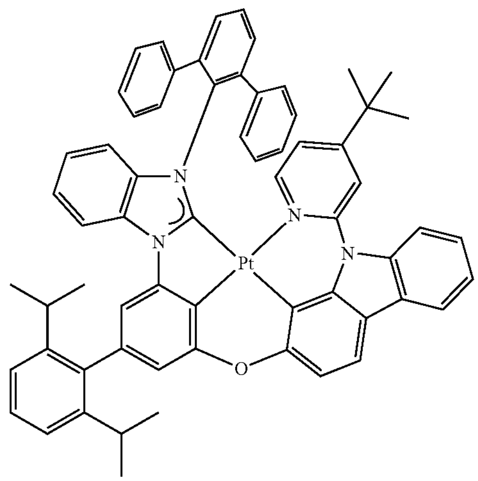 | 458 | 100 | 3.0 |
| Compound 2546676 ($L_{A396}$, $L_{B13}$) | 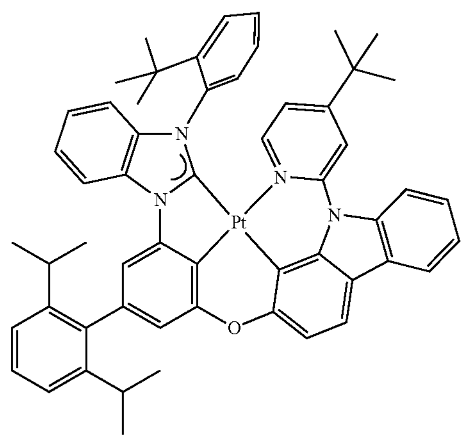 | 452 | 82 | 3.5 |
| Compound 2625507 ($L_{A79227}$, $L_{B13}$) | 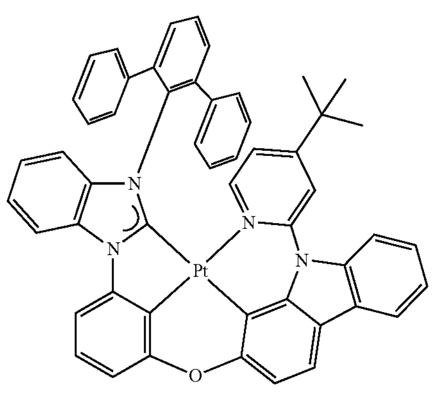 | 455 | 83 | 3.4 |

TABLE 1-continued
| | Structure | λmax in PMMA (nm) | PLQY in PMMA (%) | Excited state lifetime at 77K (μs) |
|---|---|---|---|---|
| Compound 2625546 ($L_{A79266}$, $L_{B13}$) | 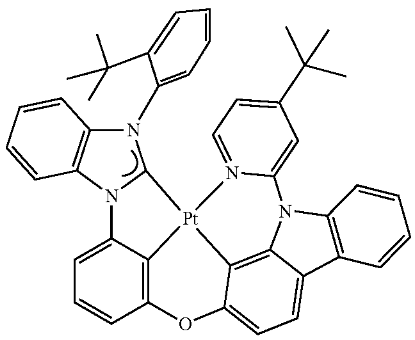 | 448 | 85 | 4.6 |
| Compound 2546650 ($L_{A370}$, $L_{B13}$) | 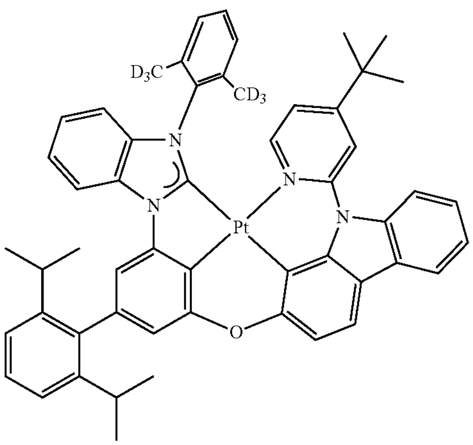 | 454 | 80 | 3.0 |
| Compound 2550306 ($L_{A4026}$, $L_{B13}$) | 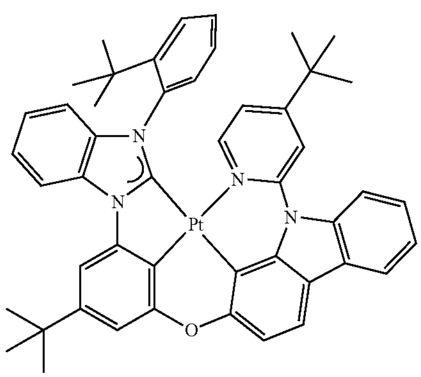 | 452 | 97 | 3.8 |
| Compound 2550267 ($L_{A3987}$, $L_{B13}$) | 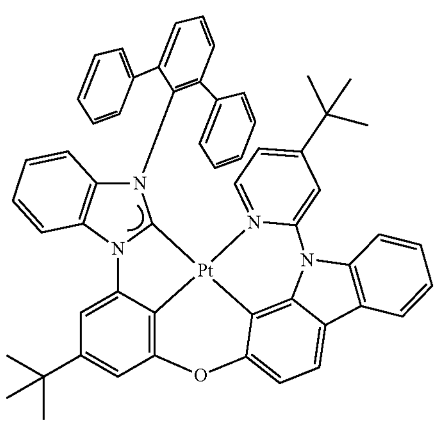 | 461 | 93 | 3.1 |

TABLE 1-continued
| | Structure | λmax in PMMA (nm) | PLQY in PMMA (%) | Excited state lifetime at 77K (μs) |
|---|---|---|---|---|
| Compound 2625547 ($L_{A79267}$, $L_{B13}$) | 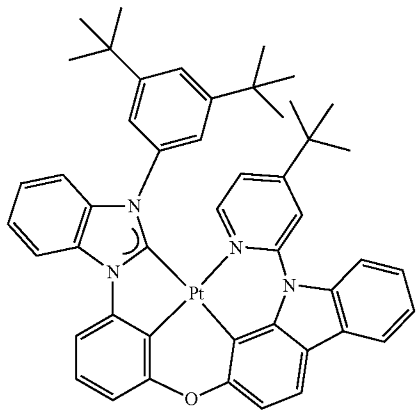 | 452 | 94 | 3.6 |
| Compound 2625533 ($L_{A79253}$, $L_{B13}$) | 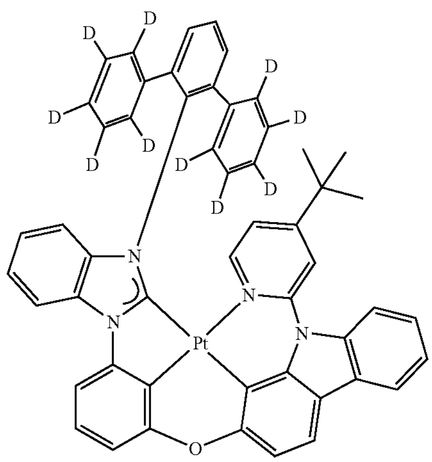 | 455 | 83 | 3.4 |
| Compound 2381700760 ($L_{A80200}$, $L_{B11225}$) | 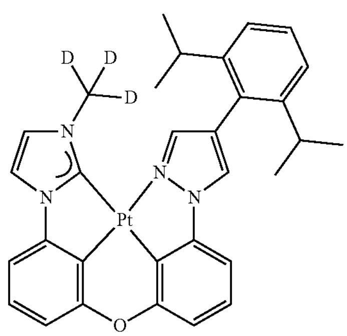 | 452 | 80 | 3.1 |
| Compound 2394432160 ($L_{A80200}$, $L_{B11285}$) | 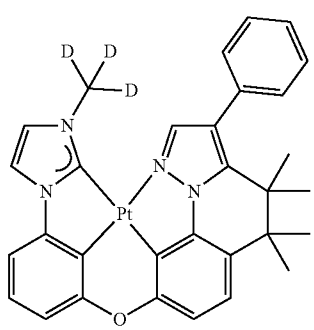 | 449 | 100 | 3.1 |

TABLE 1-continued
| | Structure | λmax in PMMA (nm) | PLQY in PMMA (%) | Excited state lifetime at 77K (μs) |
|---|---|---|---|---|
| Compound 2625581 ($L_{A79301}$, $L_{B13}$) | 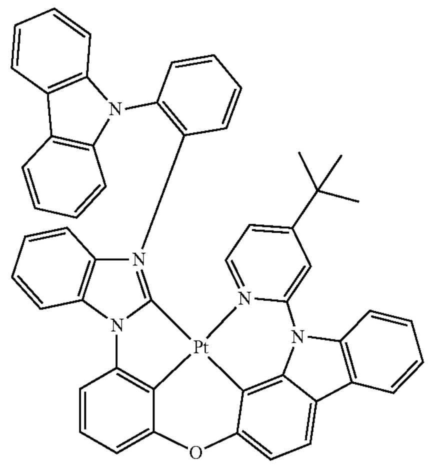 | 458 | 70 | 3.0 |
| Compound 2625573 ($L_{A79293}$, $L_{B13}$) | 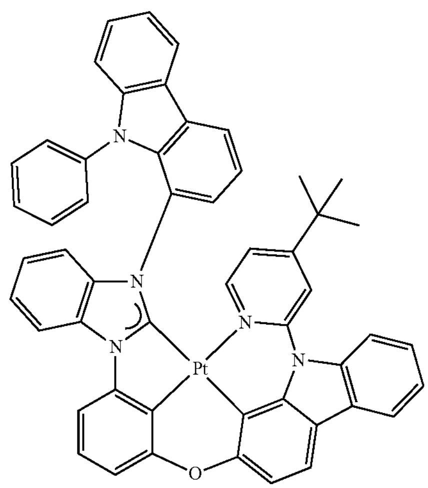 | 451 | 81 | 4.0 |
| Compound 2550250 ($L_{A3970}$, $L_{B13}$) | 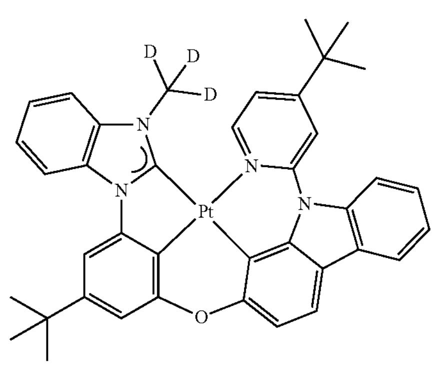 | 452 | 93 | 3.9 |

TABLE 1-continued
| | Structure | λmax in PMMA (nm) | PLQY in PMMA (%) | Excited state lifetime at 77K (μs) |
|---|---|---|---|---|
| Compound 2625820 ($L_{A79540}$, $L_{B13}$) | 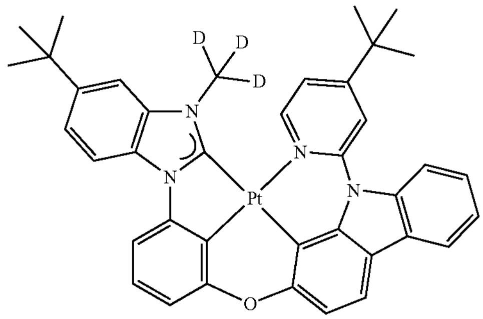 | 450 | 85 | 4.1 |
| Compound 2626490 ($L_{A80210}$, $L_{B13}$) | 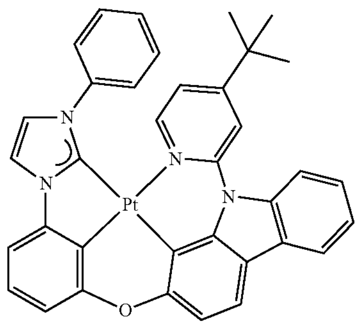 | 447 | 90 | 5.8 |
| Compound 2626480 ($L_{A80200}$, $L_{B13}$) | 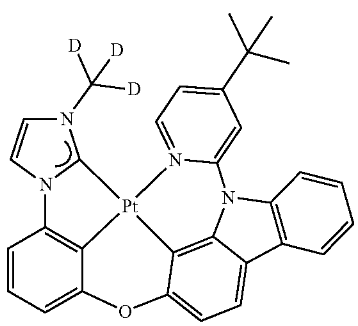 | 446 | 94 | 7.8 |
| Compound 2550293 ($L_{A4013}$, $L_{B13}$) | 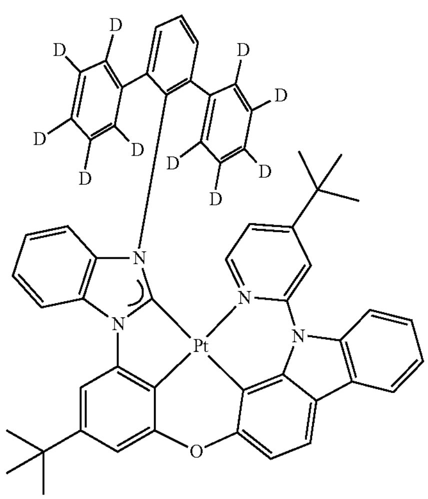 | 460 | 100 | 3.1 |

TABLE 1-continued
| | Structure | λmax in PMMA (nm) | PLQY in PMMA (%) | Excited state lifetime at 77K (μs) |
|---|---|---|---|---|
| Compound 868148500 ($L_{A79210}$, $L_{B4092}$) | 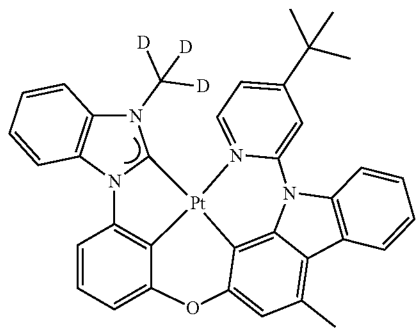 | 450 | 92 | 4.3 |
| Compound 282853240 ($L_{A3970}$, $L_{B1334}$) | 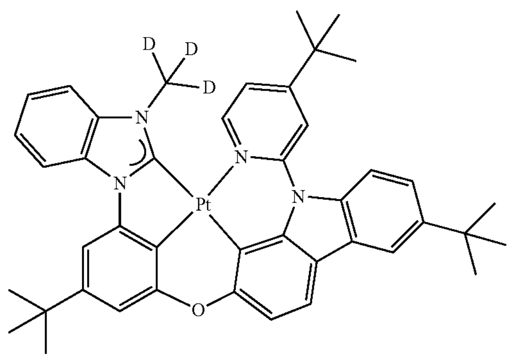 | 454 | 90 | 4.7 |
| Compound 282928810 ($L_{A79540}$, $L_{B1334}$) | 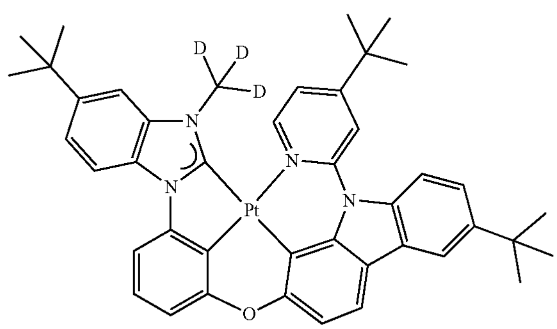 | 452 | 90 | 5.3 |
| Comparative Example | 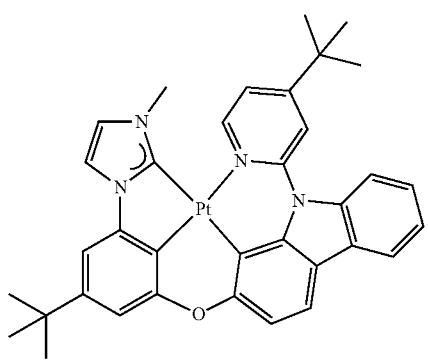 | 447 | 91 | 5.5 |

All compounds listed in Table 1 other than Comparative Example are inventive compounds. Table 1 shows the emission peak, PLQY, and excited state lifetime for the inventive compounds and Comparative Example. All inventive compounds showed higher PLQYs and shorter excited state lifetime (except for Compound 6444920), indicating that they are very efficient emitters, which usually lead to higher device efficiencies. Their emissions in PMMA are in a range of 449-470 nm. Compound 2625490 showed a very deep blue emission of 449 nm which is an excellent candidate for generating saturate blue for display application. Experiments have shown that $R^A$ and $R^C$ play an important role for physical property tuning. For example, when both $Ar^1$ and $Ar^2$=H (Compound 6444920), the complex decomposes before sublimation whereas Compound 20 and 2546630 (as well as other compounds where $Ar^1$ and $Ar^2$ do not equal to H at the same time) sublime cleanly to allow us to evaluate its device performance. These results suggest the physical properties of this family are very sensitive to the ligand structure. The Comparative Example also shows efficient and blue emission property; however, the device based on it is much less efficient.

OLED Device Fabrication:

OLEDs were grown on a glass substrate pre-coated with an indium-tin-oxide (ITO) layer having a sheet resistance of 15-Q/sq. Prior to any organic layer deposition or coating, the substrate was degreased with solvents and then treated with an oxygen plasma for 1.5 minutes with 50 W at 100 mTorr and with ultra violet (UV) ozone for 5 minutes.

The devices in Tables 1 were fabricated in high vacuum ($<10^{-6}$ Torr) by thermal evaporation. The anode electrode was 750 Å of ITO. The device example had organic layers consisting of, sequentially, from the ITO surface, 100 Å thick Compound A (HIL), 250 Å layer of Compound B (HTL), 50 Å of Compound C (EBL), 300 Å of Compound D doped with 10% of Emitter (EML), 50 Å of Compound E (BL), 300 Å of Compound G doped with 35% of Compound F (ETL), 10 Å of Compound G (EIL) followed by 1,000 Å of A1 (Cathode). All devices were encapsulated with a glass lid sealed with an epoxy resin in a nitrogen glove box (<1 ppm of $H_2O$ and $O_2$) immediately after fabrication with a moisture getter incorporated inside the package. The doping percentages are in volume percent.

The structures of the compounds used in the experimental devices are shown below:

Compound A

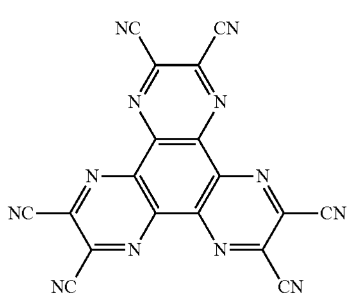

-continued

Compound B

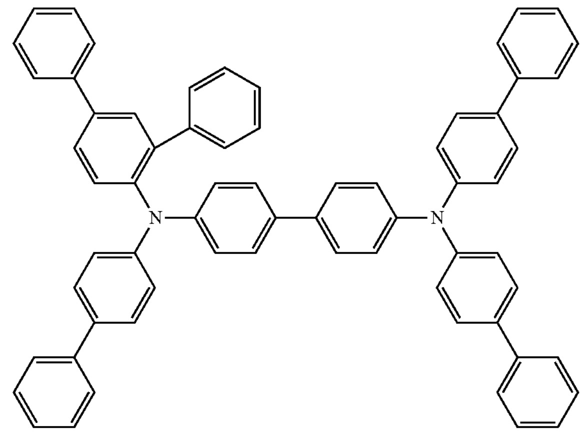

Compound C

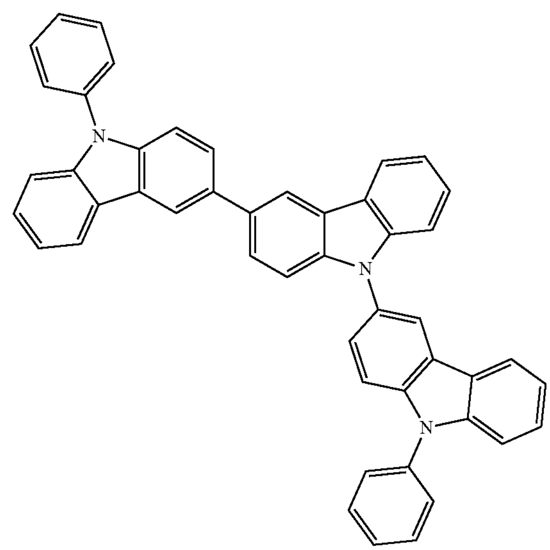

Compound D

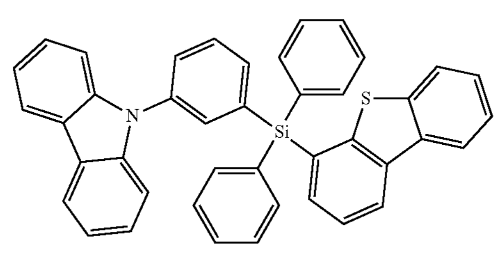

-continued

Compound E

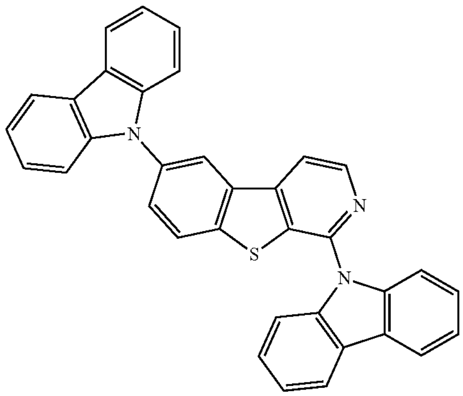

Compound F

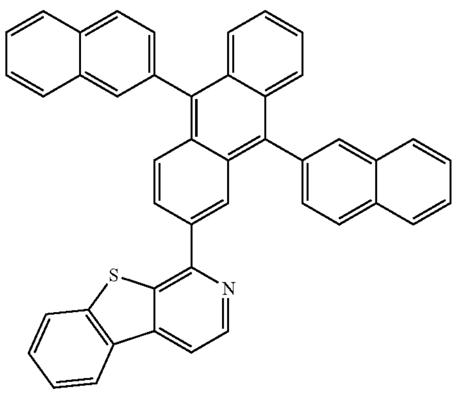

Compound G

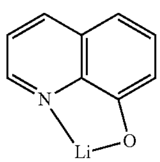

TABLE 2

| Device Data | | | | | | | | |
|---|---|---|---|---|---|---|---|---|
| | | | λ | | at 1,000 nit | | | |
| | 1931 CIE | | max | FWHM | Voltage | LE | EQE | PE |
| Device | X | y | [nm] | [nm] | [a.u.][a] | [a.u.] | [a.u.] | [a.u.] |
| Compound 20 | 0.129 | 0.199 | 468 | 37 | 0.93 | 1.81 | 1.93 | 1.94 |
| Compound 80200 | 0.149 | 0.279 | 475 | 62 | 0.90 | 2.69 | 2.19 | 3.02 |
| Compound 2546630 | 0.133 | 0.193 | 466 | 41 | 0.93 | 1.26 | 1.36 | 1.35 |
| Compound 2625490 | 0.136 | 0.148 | 460 | 40 | 0.88 | 1.20 | 1.53 | 1.36 |
| Compound 2381699770 | 0.318 | 0.319 | 467 | 45 | 0.88 | 3.19 | 2.55 | 3.69 |
| Compound 2590203683 | 0.131 | 0.273 | 473 | 41 | 0.85 | 2.50 | 2.19 | 2.96 |
| Compound 2546633 | 0.132 | 0.144 | 461 | 22 | 0.93 | 1.57 | 2.07 | 1.72 |
| Compound 2546634 | 0.138 | 0.146 | 459 | 35 | 0.85 | 1.37 | 1.74 | 1.60 |
| Compound 2546654 | 0.133 | 0.146 | 461 | 22 | 0.87 | 1.53 | 1.99 | 1.76 |

TABLE 2-continued

| Device Data | | | | | | | | |
|---|---|---|---|---|---|---|---|---|
| | | | λ | | at 1,000 nit | | | |
| | 1931 CIE | | max | FWHM | Voltage | LE | EQE | PE |
| Device | X | y | [nm] | [nm] | [a.u.][a] | [a.u.] | [a.u.] | [a.u.] |
| Compound 2546648 | 0.132 | 0.153 | 462 | 24 | 0.93 | 1.41 | 1.78 | 1.56 |
| Compound 2546637 | 0.130 | 0.194 | 467 | 39 | 0.85 | 2.08 | 2.26 | 2.48 |
| Compound 2546676 | 0.134 | 0.151 | 461 | 39 | 0.90 | 1.20 | 1.52 | 1.33 |
| Compound 2625507 | 0.132 | 0.160 | 463 | 25 | 0.85 | 1.62 | 2.00 | 1.92 |
| Compound 2625546 | 0.137 | 0.118 | 456 | 22 | 1.03 | 1.13 | 1.68 | 1.09 |
| Compound 2546650 | 0.132 | 0.148 | 462 | 25 | 0.90 | 1.31 | 1.68 | 1.48 |
| Compound 2550306 | 0.135 | 0.153 | 460 | 38 | 1.03 | 1.59 | 1.97 | 1.56 |
| Compound 2550267 | 0.131 | 0.209 | 468 | 26 | 0.90 | 1.91 | 1.96 | 2.15 |
| Compound 2625547 | 0.134 | 0.155 | 462 | 37 | 0.93 | 2.00 | 2.48 | 2.15 |
| Compound 2625533 | 0.132 | 0.147 | 462 | 22 | 0.98 | 1.77 | 2.30 | 1.81 |
| Compound 2625581 | 0.134 | 0.238 | 470 | 44 | 0.98 | 1.79 | 1.70 | 1.86 |
| Compound 2625573 | 0.142 | 0.144 | 458 | 24 | 1.08 | 1.18 | 1.50 | 1.09 |
| Compound 2550250 | 0.135 | 0.165 | 462 | 41 | 1.03 | 1.83 | 2.15 | 1.81 |
| Compound 2550293 | 0.134 | 0.228 | 468 | 44 | 0.90 | 2.61 | 2.51 | 2.93 |
| Comparative Example | 0.155 | 0.196 | 457 | 50 | 1.00 | 1.00 | 1.00 | 1.00 |

[a]a.u. = arbitrary units; all data is normalized relative to Comparative Example.

Table 2 shows device data for the inventive compounds, and a Comparative Example. All inventive compounds exhibited lower voltage and higher efficiencies at 1000 nit as compared to those of Comparative Example. Compound 2546633, 2546634, 2625490, 2546650, 2546654, 2625533, 2625546, 2625573 produced a CIE-y less than 0.148 which is comparable or better to that of commercial fluorescent blue. Although the Comparative Example exhibited good deep blue color, its CIE-y is worse than most of inventive compounds. The device based on Comparative Example is much less efficient with a higher voltage.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having the formula:

Formula I

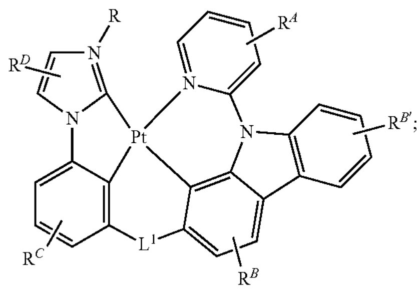

wherein $L^1$ is O;

wherein $R^A$, $R^B$, $R^{B'}$, $R^C$, and $R^D$, each represents mono to a maximum allowable substitutions, or no substitution;

wherein each of $R^A$, $R^C$, and $R^D$ is independently a hydrogen or a substituent selected from the group consisting of deuterium, alkyl, cycloalkyl, aryl, heteroaryl, partially or fully deuterated variants thereof, and partially or fully fluorinated variants thereof, which may be further substituted by one or more alkyl, cycloalkyl, aryl, heteroaryl, partially or fully fluorinated variants thereof, or partially or fully deuterated variants thereof, with the proviso that $R^D$ cannot comprise heteroaryl unless two $R^D$ are joined to form a ring;

wherein each $R^B$ and $R^{B'}$ is independently a hydrogen or a substituent selected from the group consisting of deuterium, alkyl, cycloalkyl, and partially or fully deuterated variants thereof, which may be further substituted by one or more alkyl, cycloalkyl, aryl, or partially or fully deuterated variants thereof;

wherein R is partially or fully deuterated alkyl, or aryl, which may be substituted by one or more substituents selected from the group consisting of deuterium, alkyl, cycloalkyl, heteroalkyl, arylalkyl, silyl, aryl, heteroaryl, and combinations thereof;

wherein any substitutions in $R^A$, $R^B$, $R^{B'}$, $R^C$, and $R^D$ may be joined or fused into a ring;

wherein at least one of $R^A$ and $R^C$ is present and is a 5- or 6-membered aromatic ring, which may be further substituted.

2. The compound of claim 1, wherein each $R^B$ and $R^{B'}$ is independently selected from the group consisting of hydrogen, deuterium, alkyl, cycloalkyl, and partially or fully deuterated variants thereof.

3. The compound of claim 1, wherein two adjacent $R^D$ substituents are joined to form a fused benzene ring.

4. The compound of claim 1, wherein R is 2,6-disubstituted phenyl, wherein each of the substitutions is independently selected from the group consisting of deuterium, alkyl, cycloalkyl, heteroalkyl, arylalkyl, silyl, aryl, heteroaryl, and combinations thereof.

5. The compound of claim 1, wherein R is a deuterated alkyl group.

6. An organic light emitting device (OLED) comprising:

an anode;

a cathode; and an organic layer, disposed between the anode and the cathode, comprising a compound having the formula:

Formula I

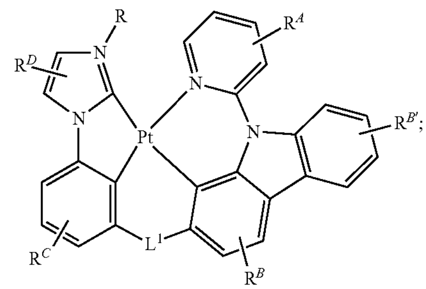

wherein $L^1$ is O;

wherein $R^A$, $R^B$, $R^{B'}$, $R^C$, and $R^D$, each represents mono to a maximum allowable substitutions, or no substitution;

wherein each of $R^A$, $R^C$, and $R^D$ is independently a hydrogen or a substituent selected from the group consisting of deuterium, alkyl, cycloalkyl, aryl, heteroaryl, partially or fully deuterated variants thereof, and partially or fully fluorinated variants thereof, which may be further substituted by one or more alkyl, cycloalkyl, aryl, heteroaryl, partially or fully fluorinated variants thereof, or partially or fully deuterated variants thereof, with the proviso that $R^D$ cannot comprise heteroaryl unless two $R^D$ are joined to form a ring;

wherein each $R^B$ and $R^{B'}$ is independently a hydrogen or a substituent selected from the group consisting of deuterium, alkyl, cycloalkyl, and partially or fully deuterated variants thereof, which may be further substituted by one or more alkyl, cycloalkyl, aryl, or partially or fully deuterated variants thereof;

wherein R is partially or fully deuterated alkyl, or aryl, which may be substituted by one or more substituents selected from the group consisting of deuterium, alkyl, cycloalkyl, heteroalkyl, arylalkyl, silyl, aryl, heteroaryl, and combinations thereof;

wherein any substitutions in $R^A$, $R^B$, $R^{B'}$, $R^C$, and $R^D$ may be joined or fused into a ring;

wherein at least one of $R^A$ and $R^C$ is present and is a 5- or 6-membered aromatic, which may be further substituted.

7. The OLED of claim 6, wherein the organic layer is an emissive layer and the compound is an emissive dopant or a non-emissive dopant.

8. The OLED of claim 6, wherein the organic layer further comprises a host, wherein the host comprises at least one chemical group selected from the group consisting of metal complex, triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

9. The OLED of claim 6, wherein the organic layer further comprises a host, wherein the host is selected from the group consisting of:

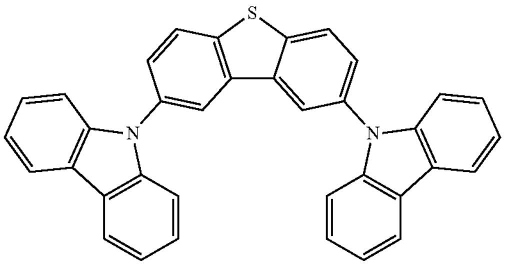
,
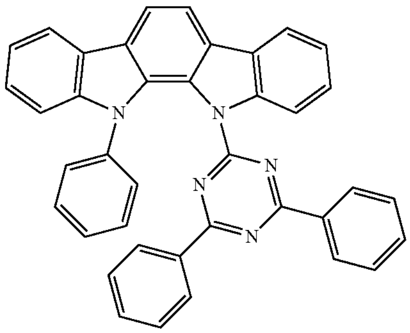
,
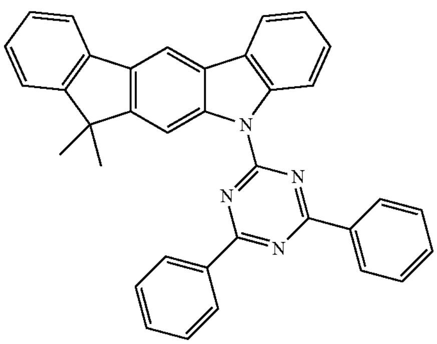
,
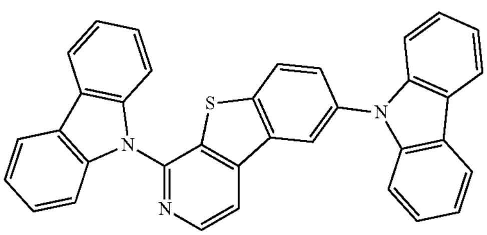
,
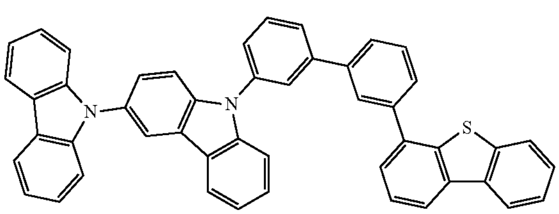
,
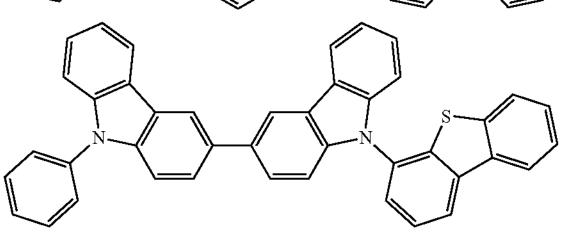
,
-continued
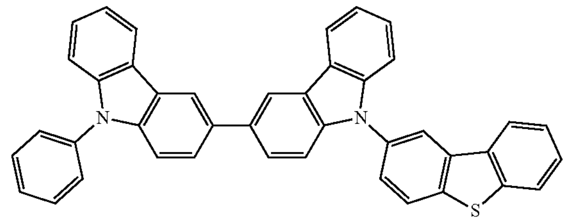
,
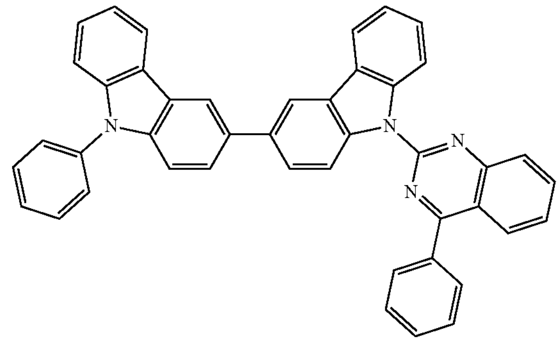
,
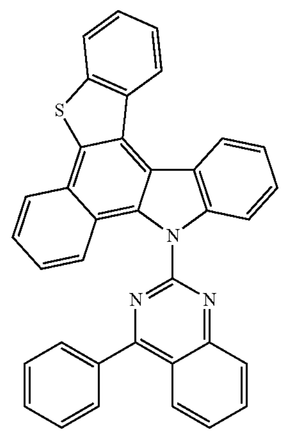
,
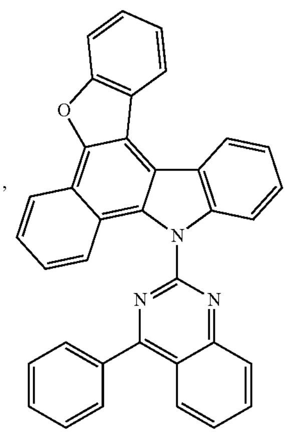
,
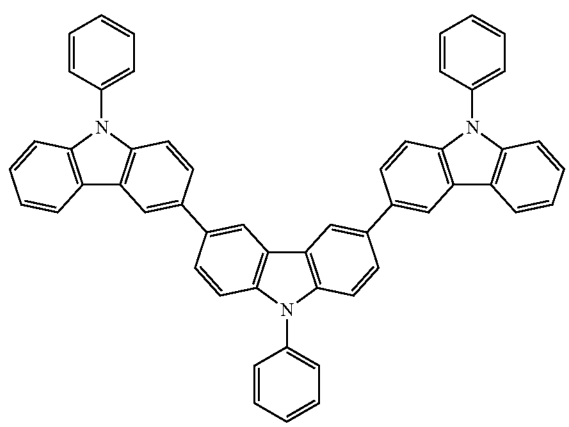
,
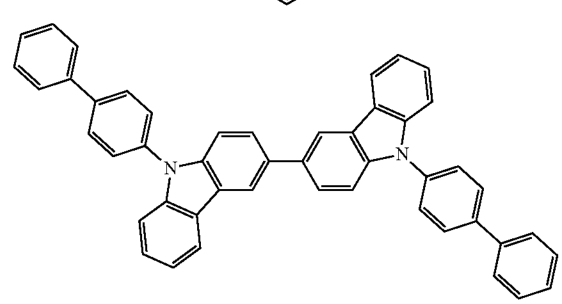
, -continued
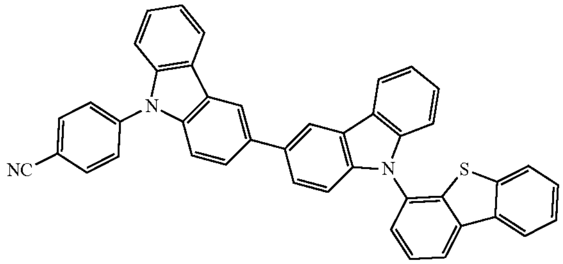
,
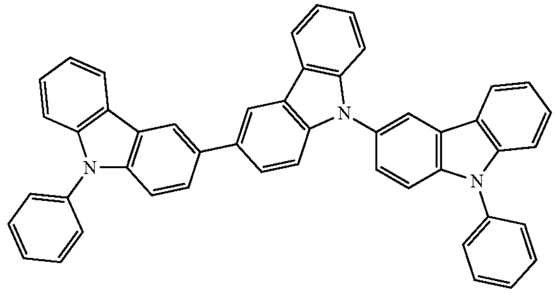
,
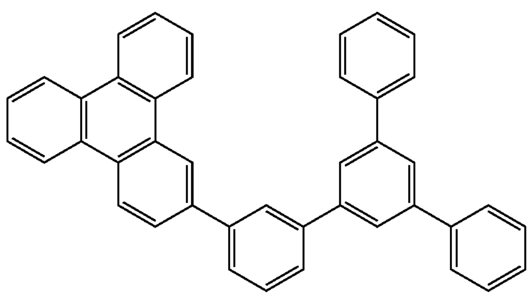
,
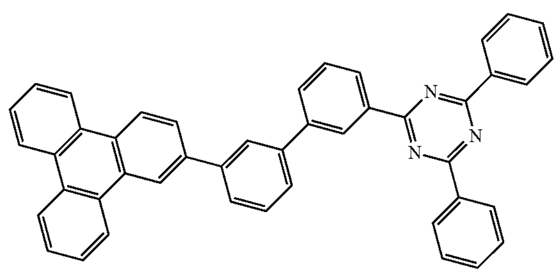
,
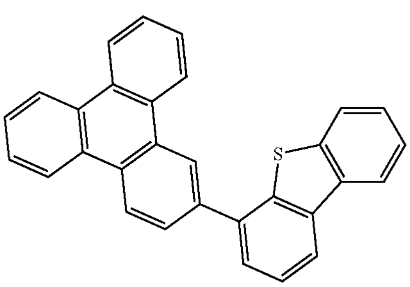
,
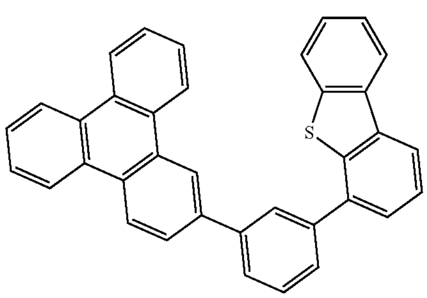
,
-continued
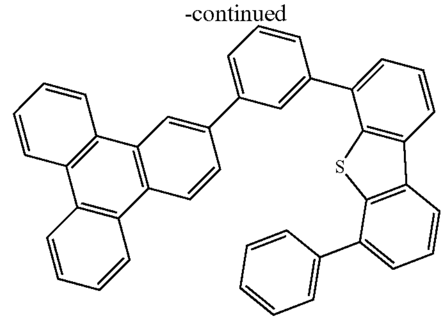
,
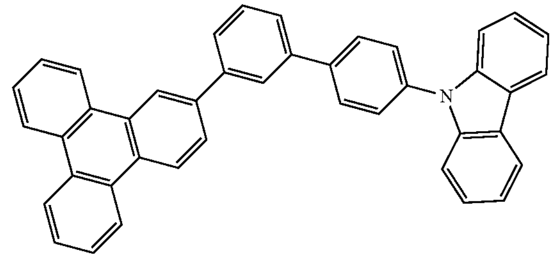
,
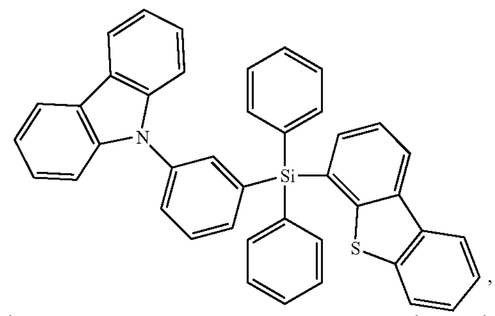
,
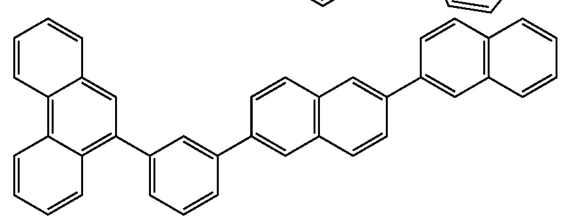
,
and combinations thereof.
10. A consumer product comprising an organic light-emitting device (OLED) comprising:
an anode;
a cathode; and
an organic layer, disposed between the anode and the cathode, comprising a compound having the formula:
Formula I
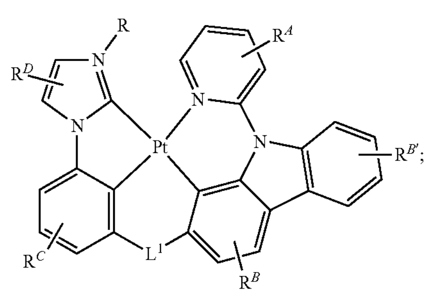

wherein $L^1$ is O;

wherein $R^A$, $R^B$, $R^{B'}$, $R^C$, and $R^D$, each represents mono to a maximum allowable substitutions, or no substitution;

wherein each of $R^A$, $R^C$, and $R^D$ is independently a hydrogen or a substituent selected from the group consisting of deuterium, alkyl, cycloalkyl, aryl, heteroaryl, partially or fully deuterated variants thereof, and partially or fully fluorinated variants thereof, which may be further substituted by one or more alkyl, cycloalkyl, aryl, heteroaryl, partially or fully fluorinated variants thereof, or partially or fully deuterated variants thereof, with the proviso that $R^D$ cannot comprise heteroaryl unless two $R^D$ are joined to form a ring;

wherein each $R^B$ and $R^{B'}$ is independently a hydrogen or a substituent selected from the group consisting of deuterium, alkyl, cycloalkyl, and partially or fully deuterated variants thereof, which may be further substituted by one or more alkyl, cycloalkyl, aryl, or partially or fully deuterated variants thereof;

wherein R is partially or fully deuterated alkyl, or aryl, which may be substituted by one or more substituents selected from the group consisting of deuterium, alkyl, cycloalkyl, heteroalkyl, arylalkyl, silyl, aryl, heteroaryl, and combinations thereof;

wherein any substitutions in $R^A$, $R^B$, $R^{B'}$, $R^C$, and $R^D$ may be joined or fused into a ring;

wherein at least one of $R^A$ and $R^C$ is present and is a 5- or 6-membered aromatic ring, which may be further substituted.

11. A formulation comprising the compound of claim 1.

12. The compound of claim 1, wherein at least one $R^A$ is a 5- or 6-membered aromatic ring, which may be further substituted by one or more alkyl, cycloalkyl, aryl, heteroaryl, partially or fully fluorinated variants thereof, or partially or fully deuterated variants thereof.

13. The compound of claim 1, wherein at least one $R^A$ is a phenyl ring, which may be further substituted by one or more alkyl, cycloalkyl, aryl, heteroaryl, partially or fully fluorinated variants thereof, or partially or fully deuterated variants thereof.

14. The compound of claim 1, wherein exactly one of $R^A$ and $R^C$ is present and is a 5- or 6-membered aromatic ring, which may be further substituted by one or more alkyl, cycloalkyl, aryl, heteroaryl, partially or fully fluorinated variants thereof, or partially or fully deuterated variants thereof.

15. The compound of claim 1, wherein exactly one of $R^A$ and $R^C$ is present and is a phenyl ring, which may be further substituted by one or more alkyl, cycloalkyl, aryl, heteroaryl, partially or fully fluorinated variants thereof, or partially or fully deuterated variants thereof.

16. The compound of claim 1, wherein R is aryl, which may be substituted by one or more substituents selected from the group consisting of deuterium, alkyl, cycloalkyl, heteroalkyl, arylalkyl, silyl, aryl, heteroaryl, and combinations thereof.

17. The compound of claim 16, wherein R is aryl, which is substituted by at least one aryl.

18. The compound of claim 1, wherein the compound is selected from the group consisting of:

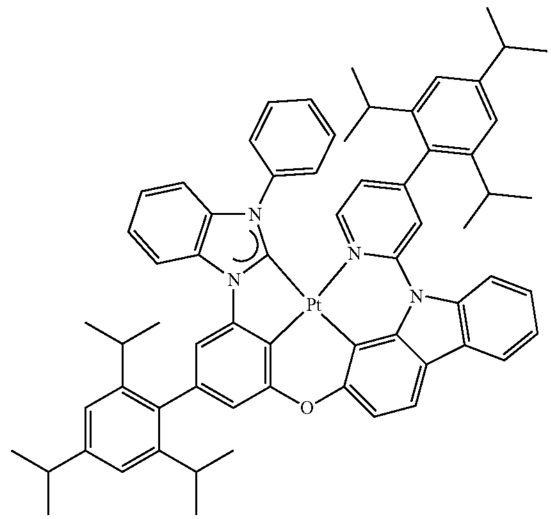

,

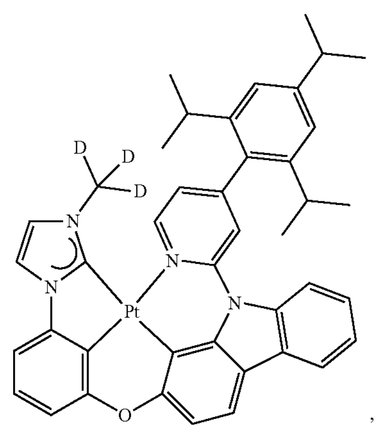

,

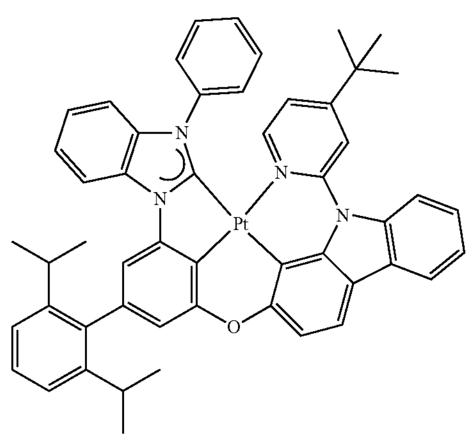

,

-continued
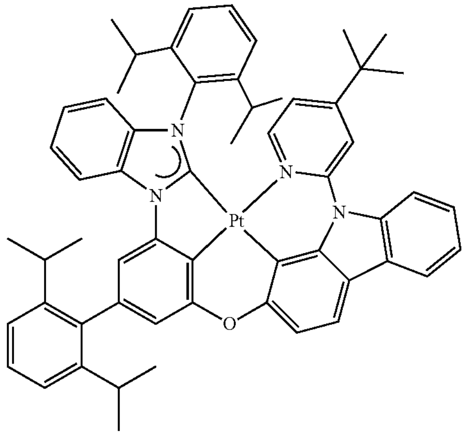
,
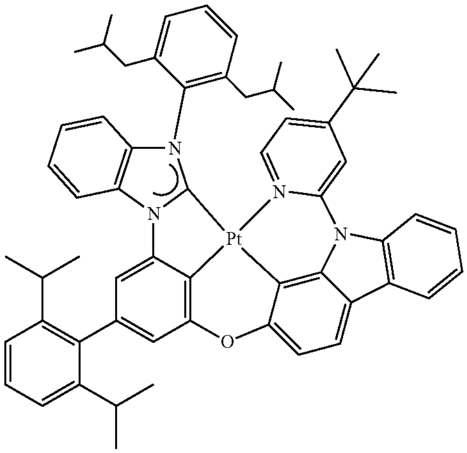
,
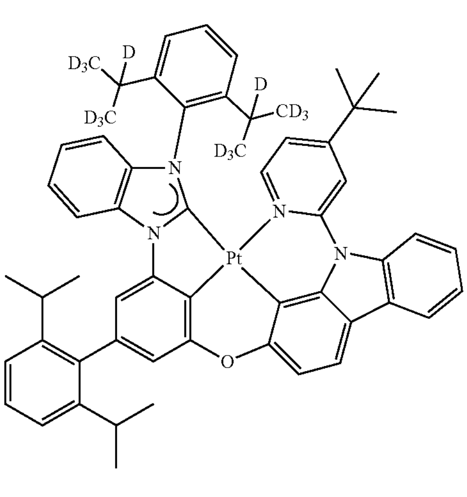
,
-continued
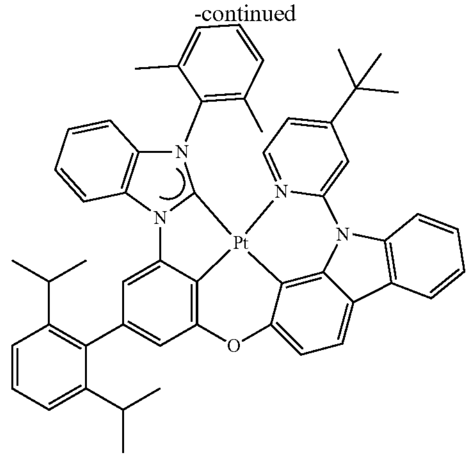
,
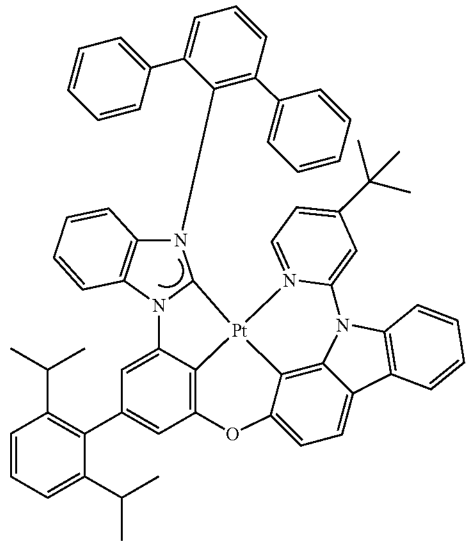
,
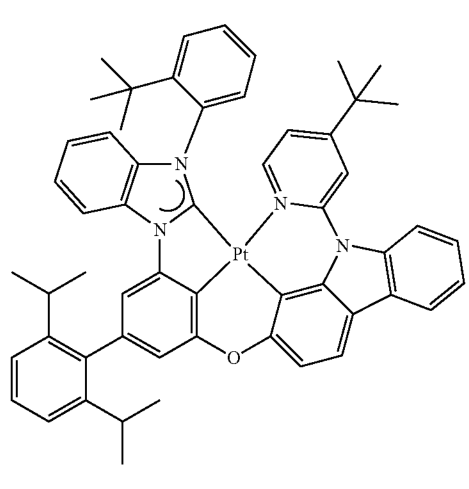
, -continued
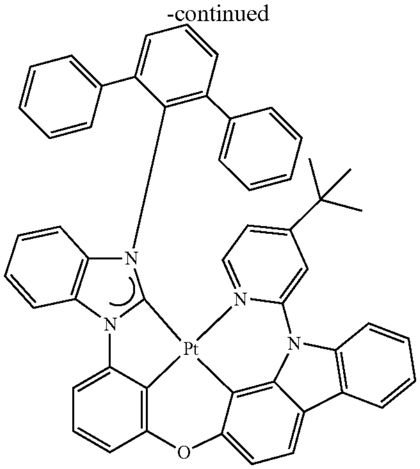
,
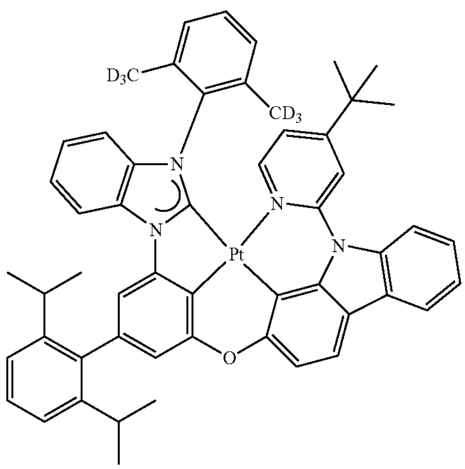
,
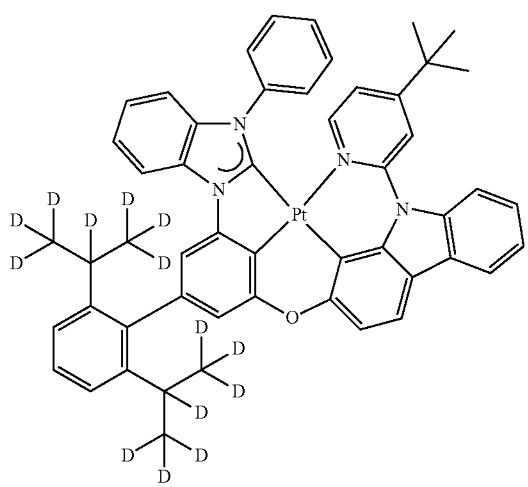
,
-continued
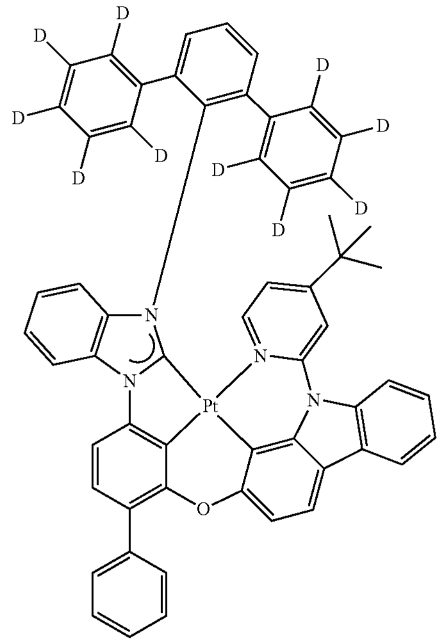
,
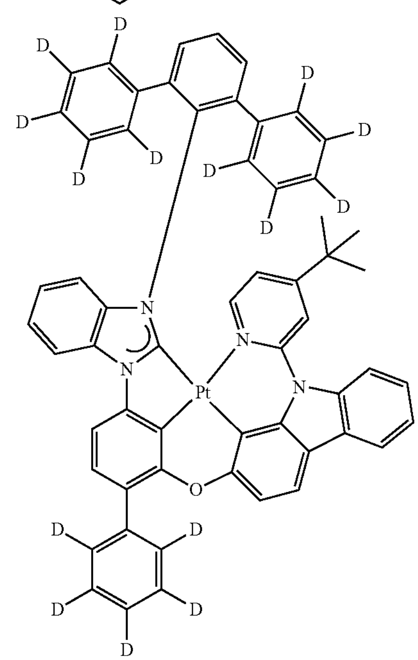
,
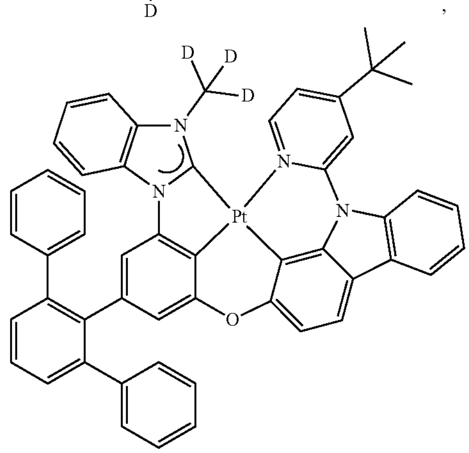
, -continued

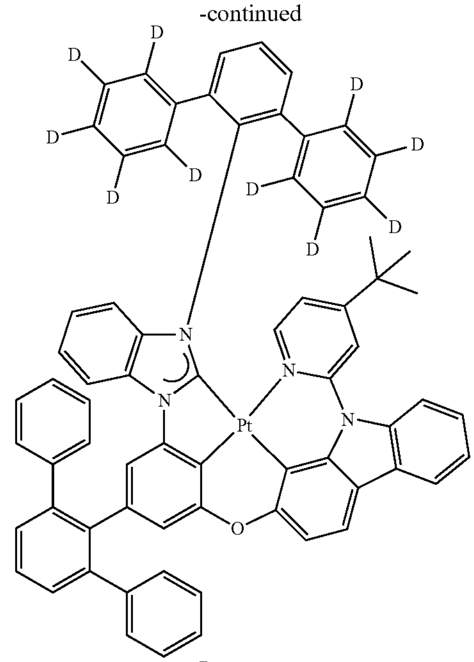

,

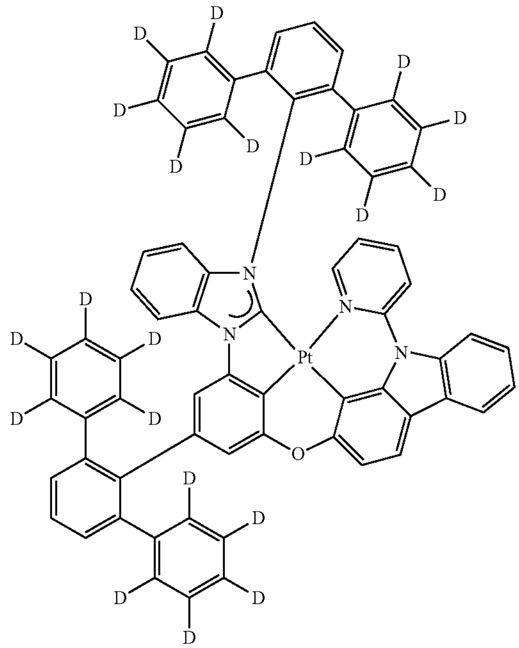

,

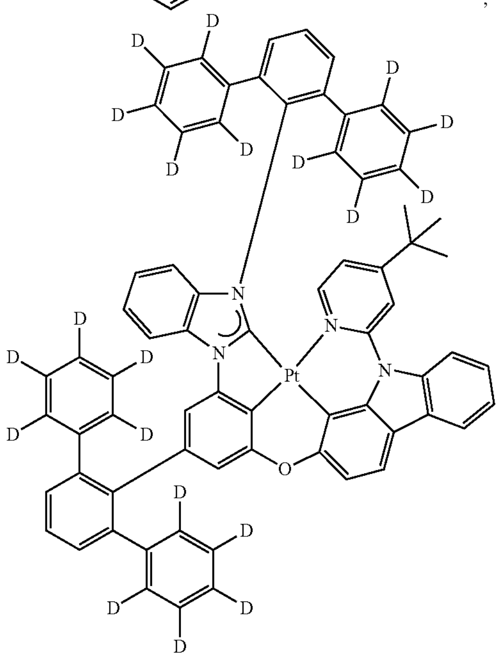

, and

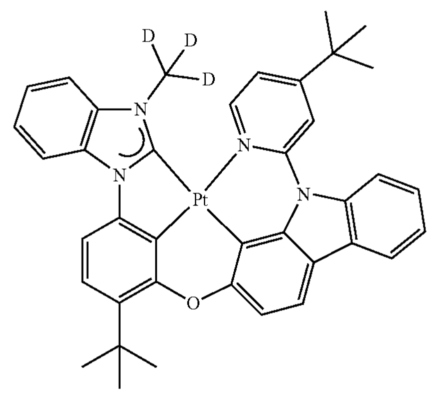

.

19. The compound of claim 1, the compound is selected from the group consisting of Compound y having the formula $Pt(L_{Ay})(L_{Bz})$, wherein each $L_{Ay}$ has the structure defined in the following list:

| $L_{Ay}$ | Structure of $L_{Ay}$ | $Ar^1$, $R^1$ | y |
|---|---|---|---|
| $L_{A1}$ to $L_{A9900}$ have the structure | 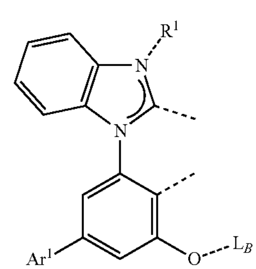 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k |

-continued

| $L_{Ay}$ | Structure of $L_{Ay}$ | $Ar^1$, $R^1$ | y |
|---|---|---|---|
| $L_{A9901}$-$L_{A19800}$ have the structure | 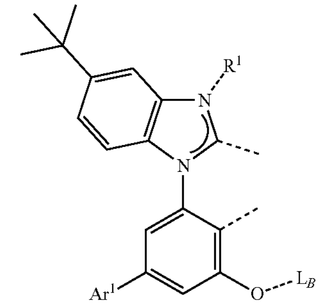 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 9900 |
| $L_{A19801}$-$L_{A29700}$ have the structure | 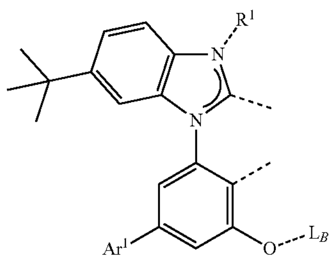 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 19800 |
| $L_{29701}$-$L_{A39600}$ have the structure | 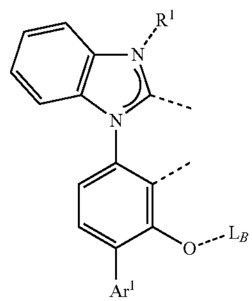 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 29700 |
| $L_{A39601}$-$L_{A49500}$ have the structure | 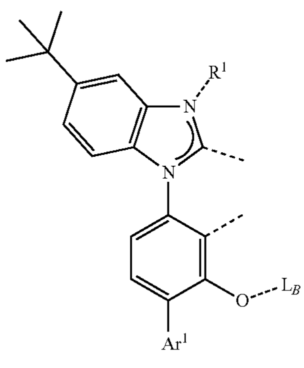 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 39600 |
| $L_{A49501}$-$L_{A59400}$ have the structure | 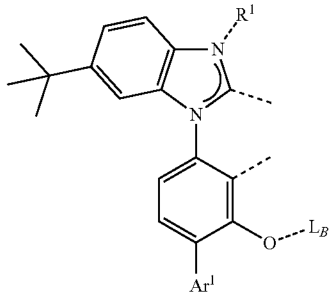 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 49500 |

-continued

| $L_{Ay}$ | Structure of $L_{Ay}$ | $Ar^1$, $R^1$ | y |
|---|---|---|---|
| $L_{A59401}$-$L_{A69300}$ have the structure | 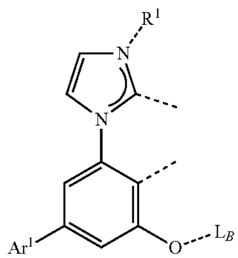 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 59400 |
| $L_{A69301}$-$L_{A79200}$ have the structure | 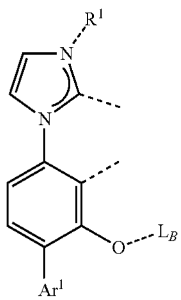 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 69300 |
| $L_{A79201}$ to $L_{A79530}$ have the structure | 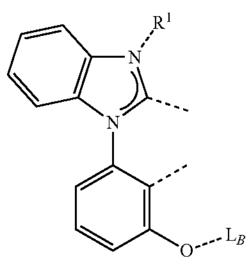 | wherein $R^1$ = Rk, wherein k is an integer from 10 to 15, 18 to 25, 27 to 30, 35 to 49, 52 to 74, 89, 90, and 93 to 330, and | wherein, y = k + 79200 |
| $L_{A79531}$-$L_{A79860}$ have the structure | 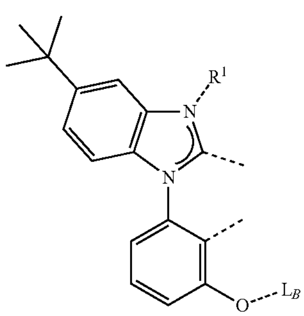 | wherein $R^1$ = Rk, wherein k is an integer from 10 to 15, 18 to 25, 27 to 30, 35 to 49, 52 to 74, 89, 90, and 93 to 330, and | wherein, y = k + 79530 |
| $L_{A79861}$-$L_{A80190}$ have the structure | 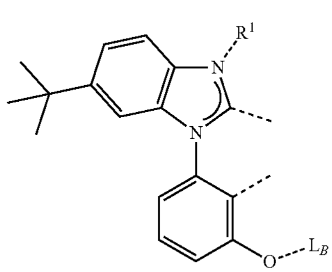 | wherein $R^1$ = Rk, wherein k is an integer from 10 to 15, 18 to 25, 27 to 30, 35 to 49, 52 to 74, 89, 90, and 93 to 330, and | wherein, y = k + 79860 |

-continued

| $L_{Ay}$ | Structure of $L_{Ay}$ | $Ar^1$, $R^1$ | y |
|---|---|---|---|
| $L_{A80191}$-$L_{A80520}$ have the structure | 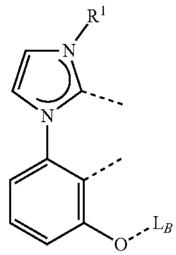 | wherein $R^1$ = Rk, wherein k is an integer from 10 to 15, 18 to 25, 27 to 30, 35 to 49, 52 to 74, 89, 90, and 93 to 330, and | wherein, y = k + 80190 |
| $L_{A80521}$ to $L_{A90420}$ have the structure | 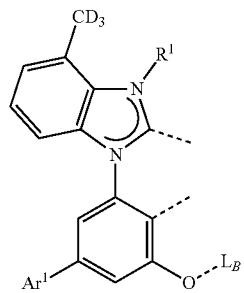 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 80520 |
| $L_{A90421}$ to $L_{A100320}$ have the structure | 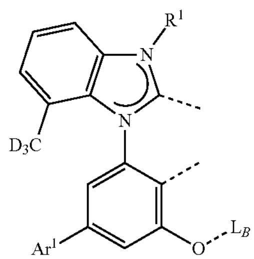 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 90420 |
| $L_{A100321}$ to $L_{A110220}$ have the structure | 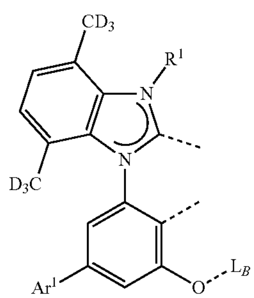 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 100320 |
| $L_{A110221}$ to $L_{A120120}$ have the structure | 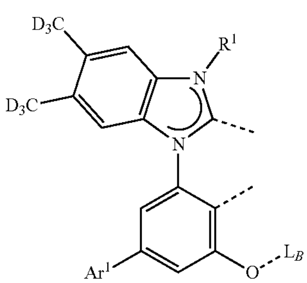 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 110220 |

-continued

| $L_{Ay}$ | Structure of $L_{Ay}$ | $Ar^1$, $R^1$ | y |
|---|---|---|---|
| $L_{A120121}$ to $L_{A130020}$ have the structure | 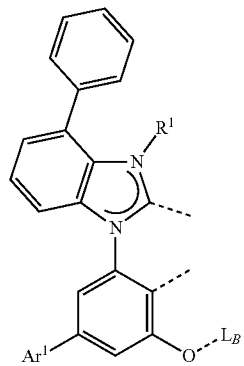 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 120120 |
| $L_{A130021}$ to $L_{A139920}$ have the structure | 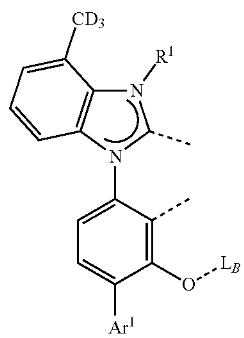 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 130020 |
| $L_{A139921}$ to $L_{A149820}$ have the structure | 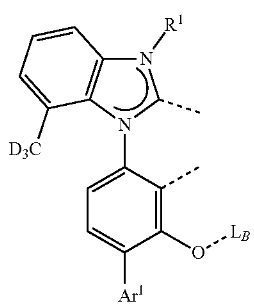 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 139920 |
| $L_{A149821}$ to $L_{A159720}$ have the structure | 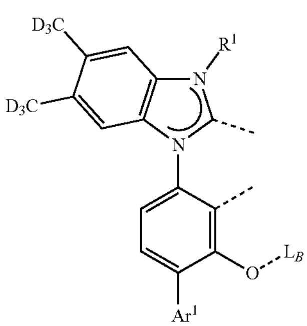 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 149820 |

-continued

| $L_{Ay}$ | Structure of $L_{Ay}$ | $Ar^1$, $R^1$ | y |
|---|---|---|---|
| $L_{A159721}$ to $L_{A169620}$ have the structure | 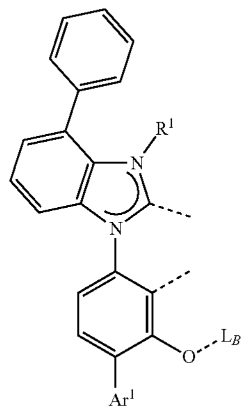 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 159720 |
| $L_{A169621}$ to $L_{A169950}$ have the structure | 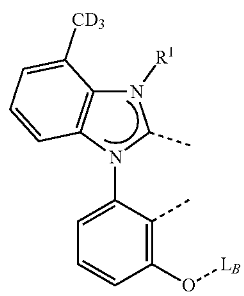 | wherein $R^1$ = Rk, wherein k is an integer from 10 to 15, 18 to 25, 27 to 30, 35 to 49, 52 to 74, 89, 90, and 93 to 330, and | wherein, y = k + 169620 |
| $L_{A169951}$ to $L_{A170280}$ have the structure | 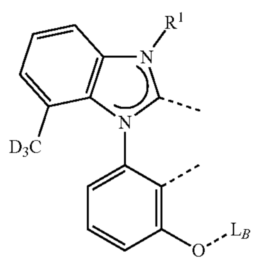 | wherein $R^1$ = Rk, wherein k is an integer from 10 to 15, 18 to 25, 27 to 30, 35 to 49, 52 to 74, 89, 90, and 93 to 330, and | wherein, y = k + 169950 |
| $L_{A170281}$ to $L_{A170610}$ have the structure | 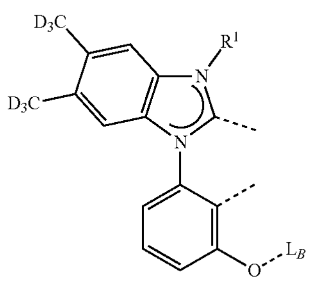 | wherein $R^1$ = Rk, wherein k is an integer from 10 to 15, 18 to 25, 27 to 30, 35 to 49, 52 to 74, 89, 90, and 93 to 330, and | wherein, y = k + 170280 |
| $L_{A170610}$ to $L_{A170940}$ have the structure | 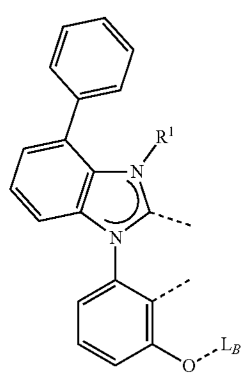 | wherein $R^1$ = Rk, wherein k is an integer from 10 to 15, 18 to 25, 27 to 30, 35 to 49, 52 to 74, 89, 90, and 93 to 330, and | wherein, y = k + 170610 |

-continued

| $L_{Ay}$ | Structure of $L_{Ay}$ | $Ar^1$, $R^1$ | y |
|---|---|---|---|
| $L_{A171271}$ to $L_{A171600}$ have the structure | 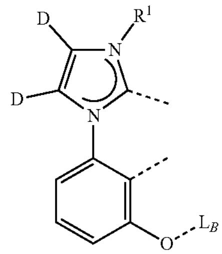 | wherein $R^1$ = Rk, wherein k is an integer from 10 to 15, 18 to 25, 27 to 30, 35 to 49, 52 to 74, 89, 90, and 93 to 330, and | wherein, y = k + 171270 |
| $L_{A171601}$ to $L_{A181500}$ have the structure | 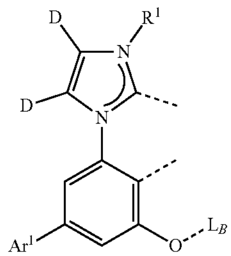 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 171600 |
| $L_{A181501}$ to $L_{A191400}$ have the structure | 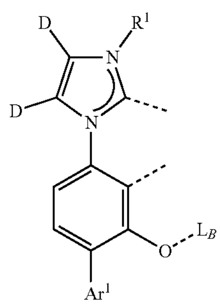 | wherein $Ar^1$ = Ai and $R^1$ = Rk, wherein i is an integer from 1 to 19 and 21 to 30 and k is an integer from 8, 10 to 15, 18 to 78, 89, 90, and 93 to 330, and | wherein, y = 330(i − 1) + k + 181500 |
| $L_{A191731}$ to $L_{A192060}$ have the structure | 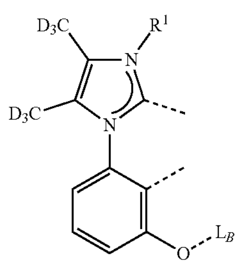 | wherein $R^1$ = Rk, wherein k is an integer from 10 to 15, 18 to 25, 27 to 30, 35 to 49, 52 to 74, 89, 90, and 93 to 330, and | wherein, y = k + 191730 |
| $L_{A192061}$ to $L_{A201960}$ have the structure | 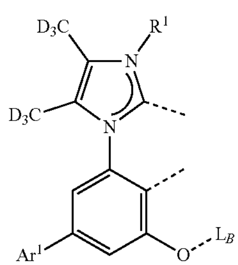 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 192060 |

-continued

| $L_{Ay}$ | Structure of $L_{Ay}$ | $Ar^1$, $R^1$ | y |
|---|---|---|---|
| $L_{A201961}$ to $L_{A211860}$ have the structure | 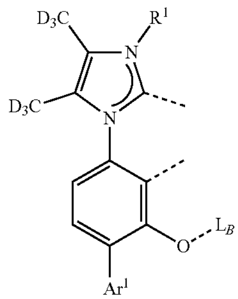 | wherein $Ar^1$ = Ai and $R^1$ = Rk, wherein i is an integer from 1 to 19 and 21 to 30 and k is an integer from 10 to 15, 18 to 25, 27 to 30, 35 to 49, 52 to 74, 89, 90, and 93 to 330, and | wherein, y = 330(i − 1) + k + 201960 |

wherein each $L_{Bz}$ has the structure defined in the following list:

| $L_{Bz}$ | $L_{Bz}$ structure | $Ar^2$, $Ar^3$, $R^2$ | Z |
|---|---|---|---|
| wherein $L_{B1}$-$L_{B30}$ have the structure | 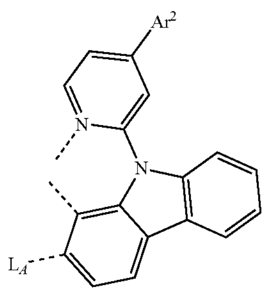 | wherein $Ar^2$ = Aj, wherein j is an integer from 1 to 19 and 21 to 30, and | z = j |
| wherein $L_{B31}$ have the structure | 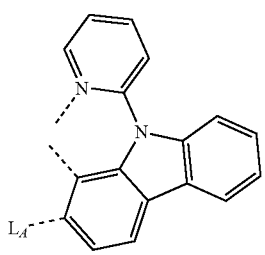 | | z = 31 |
| wherein $L_{B32}$-$L_{B931}$ have the structure | 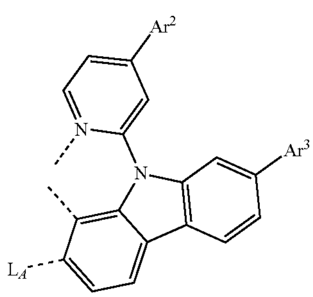 | wherein $Ar^2$ = Aj and $Ar^3$ = Am, wherein j is an integer from 1 to 19 and 21 to 30 and m is an integer from 11 to 17 and 21 to 30, and | z = 30(j − 1) + m + 31 |
| wherein $L_{B932}$-$L_{B961}$ have the structure | 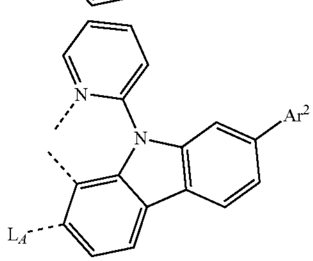 | wherein $Ar^2$ = Aj, wherein j is an integer from 11 to 17 and 21-30, and | z = j + 931 |

-continued

| $L_{Bz}$ | $L_{Bz}$ structure | $Ar^2$, $Ar^3$, $R^2$ | Z |
|---|---|---|---|
| wherein $L_{B962}$-$L_{B1861}$ have the structure | 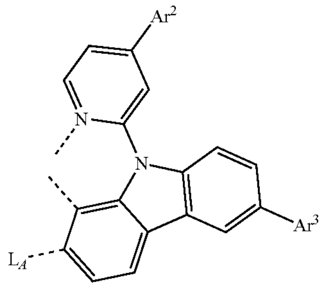 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 961 |
| wherein $L_{B1862}$-$L_{B1891}$ have the structure | 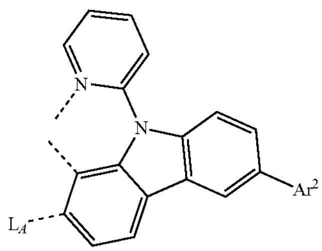 | wherein $Ar^2$ = Aj, wherein j is an integer from 11 to 17 and 21-30, and | z = j + 1861 |
| wherein $L_{B1892}$-$L_{B1921}$ have the structure | 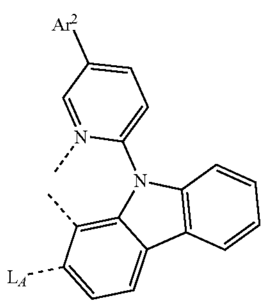 | wherein $Ar^2$ = Aj, wherein j is an integer from 1 to 19 and 21-30, and | z = j + 1891 |
| wherein $L_{B1922}$-$L_{B2821}$ have the structure | 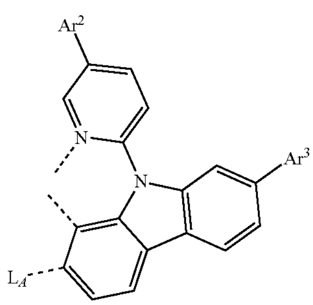 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 1921 |
| wherein $L_{B2822}$-$L_{B3721}$ have the structure | 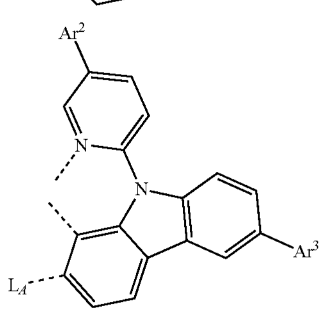 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 2821 |

-continued

| $L_{Bz}$ | $L_{Bz}$ structure | $Ar^2$, $Ar^3$, $R^2$ | Z |
|---|---|---|---|
| wherein $L_{B3722}$-$L_{B4621}$ have the structure | 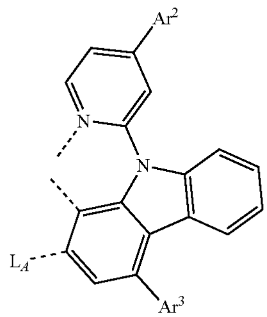 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 3721 |
| wherein $L_{B4622}$-$L_{B4651}$ have the structure | 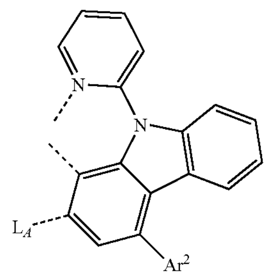 | wherein $Ar^2$ = Aj, wherein j is an integer from 11 to 17 and 21-30, and | z = j + 4621 |
| wherein $L_{B4652}$-$L_{B5551}$ have the structure | 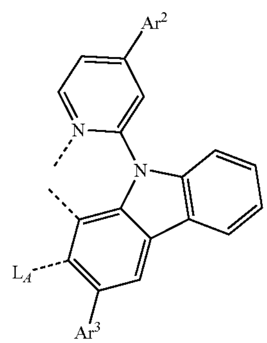 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 4651 |
| wherein $L_{B5552}$-$L_{B5581}$ have the structure | 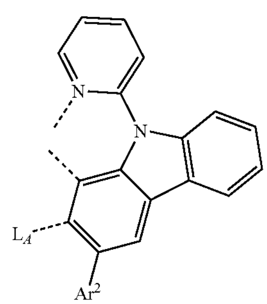 | wherein $Ar^2$ = Aj, wherein j is an integer from 11 to 17 and 21-30, and | z = j + 5551 |
| wherein $L_{B5582}$-$L_{B6481}$ have the structure | 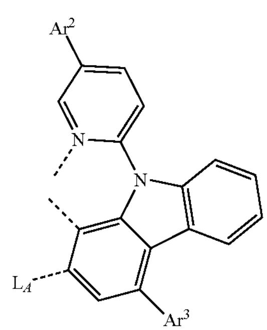 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 5581 |

-continued

| $L_{Bz}$ | $L_{Bz}$ structure | $Ar^2$, $Ar^3$, $R^2$ | Z |
|---|---|---|---|
| wherein $L_{B6482}$-$L_{B7381}$ have the structure | 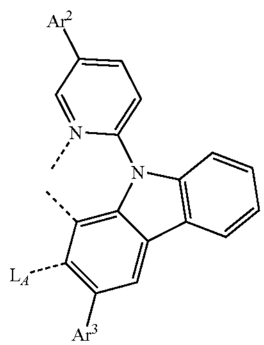 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 6481 |
| wherein $L_{B7382}$ have the structure | 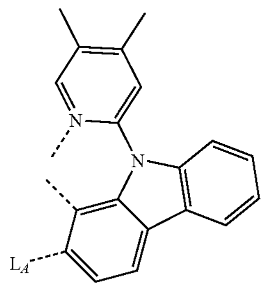 | | z = 7382 |
| wherein $L_{B7383}$-$L_{B7412}$ have the structure | 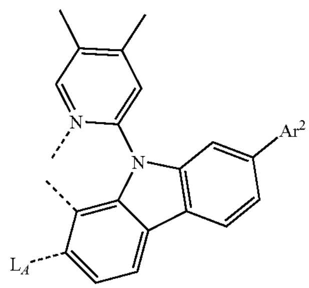 | wherein $Ar^2$ = Aj, wherein j is an integer from 11 to 17 and 21-30, and | z = j + 7382 |
| wherein $L_{B7413}$-$L_{B7442}$ have the structure | 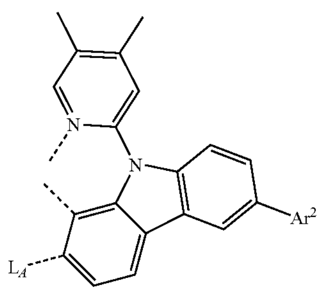 | wherein $Ar^2$ = Aj, wherein j is an integer from 11 to 17 and 21-30, and | z = j + 7412 |
| wherein $L_{B7443}$-$L_{B7472}$ have the structure | 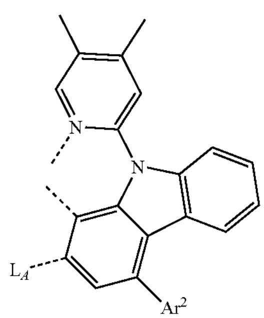 | wherein $Ar^2$ = Aj, wherein j is an integer from 11 to 17 and 21-30, and | z = j + 7442 |

-continued

| $L_{Bz}$ | $L_{Bz}$ structure | $Ar^2$, $Ar^3$, $R^2$ | Z |
|---|---|---|---|
| wherein $L_{B7473}$-$L_{B7502}$ have the structure | 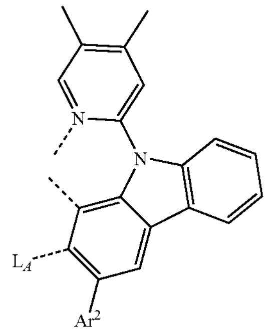 | wherein $Ar^2$ = Aj, wherein j is an integer from 11 to 17 and 21-30, and | z = j +7472 |
| wherein $L_{B17796}$-$L_{B17825}$ have the structure | 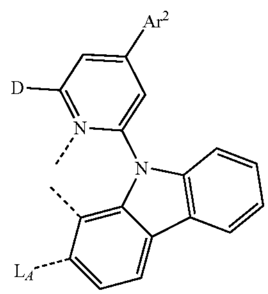 | wherein $Ar^2$ = Aj, wherein j is an integer from 1 to 19 and 21-30, and | z = j + 17795 |
| wherein $L_{B17826}$ have the structure | 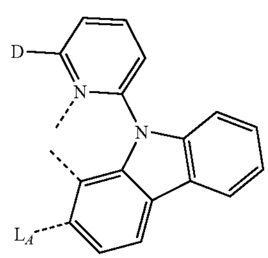 | | z = 17826 |
| wherein $L_{B17827}$-$L_{B18726}$ have the structure | 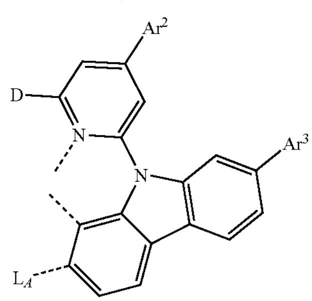 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 17826 |
| wherein $L_{B18727}$-$L_{B18756}$ have the structure | 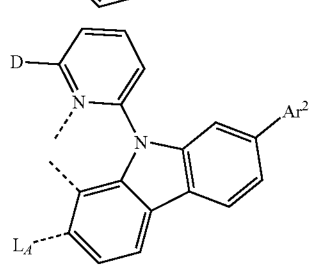 | wherein $Ar^2$ = Aj, wherein j is an integer from 11 to 17 and 21-30, and | z = j + 18726 |

-continued

| $L_{Bz}$ | $L_{Bz}$ structure | $Ar^2$, $Ar^3$, $R^2$ | Z |
|---|---|---|---|
| wherein $L_{B18757}$-$L_{B19656}$ have the structure | 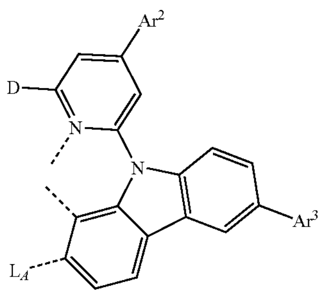 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 18756 |
| wherein $L_{B19657}$-$L_{B19686}$ have the structure | 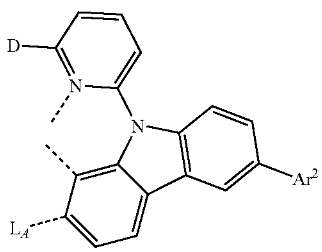 | wherein $Ar^2$ = Aj, wherein j is an integer from 11 to 17 and 21-30, and | z = j + 19656 |
| wherein $L_{B19687}$-$L_{B19716}$ have the structure | 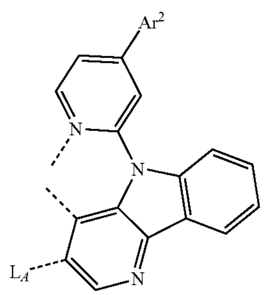 | wherein $Ar^2$ = Aj, wherein j is an integer from 1 to 19 and 21-30, and | z = j + 19686 |
| wherein $L_{B19717}$ have the structure | 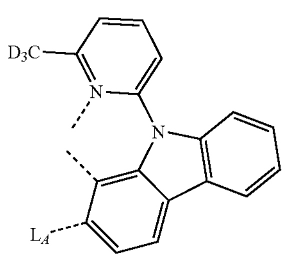 | | z = 19717 |
| wherein $L_{B19718}$-$L_{B20617}$ have the structure | 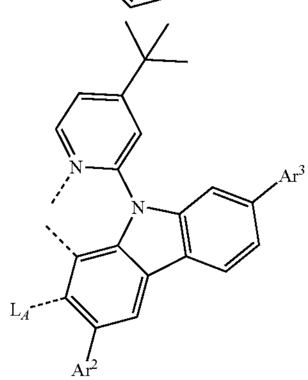 | wherein $Ar^2$ = Aj and $Ar^3$ = Am, wherein j is an integer from 11 to 17 and 21 to 30 and m is an integer from 11 to 17 and 21-30, and | z = 30(j − 1) + m + 19717 |

-continued

| $L_{Bz}$ | $L_{Bz}$ structure | $Ar^2$, $Ar^3$, $R^2$ | Z |
|---|---|---|---|
| wherein $L_{B20618}$-$L_{B20647}$ have the structure | 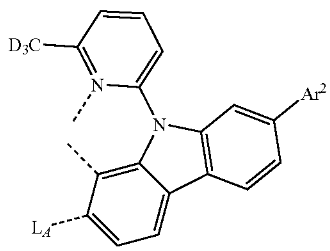 | wherein $Ar^2$ = Aj, wherein j is an integer from 11 to 17 and 21-30, and | z = j + 20617 |
| wherein $L_{B20648}$-$L_{B21547}$ have the structure | 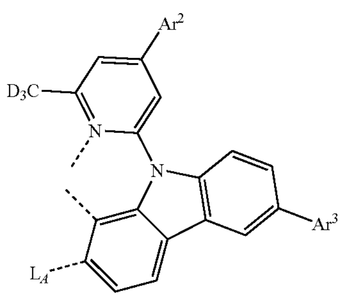 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 20647 |
| wherein $L_{B21548}$-$L_{B21577}$ have the structure | 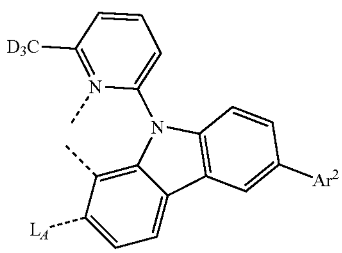 | wherein $Ar^2$ = Aj, wherein j is an integer from 11 to 17 and 21-30, and | z = j + 21547 |
| wherein $L_{B21578}$-$L_{B22477}$ have the structure | 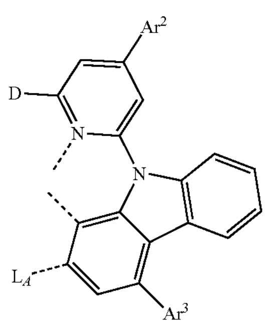 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 21577 |
| wherein $L_{B22478}$-$L_{B22507}$ have the structure | 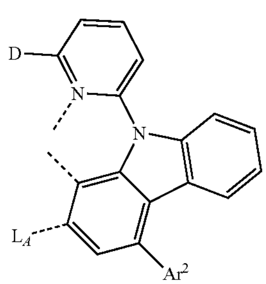 | wherein $Ar^2$ = Aj, wherein j is an integer from 11 to 17 and 21-30, and | z = j + 22477 |

-continued

| $L_{Bz}$ | $L_{Bz}$ structure | $Ar^2$, $Ar^3$, $R^2$ | Z |
|---|---|---|---|
| wherein $L_{B22508}$-$L_{B23407}$ have the structure | 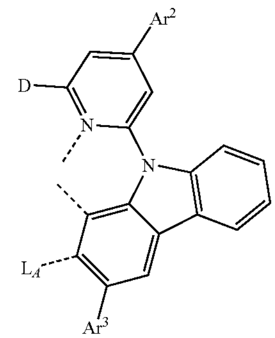 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 22507 |
| wherein $L_{B23408}$-$L_{B23437}$ have the structure | 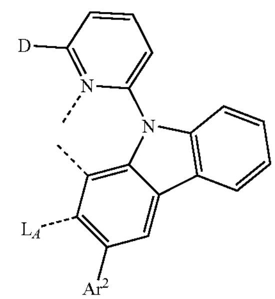 | wherein $Ar^2$ = Aj, wherein j is an integer from 11 to 17 and 21-30, and | z = j + 23407 |
| wherein $L_{B23438}$-$L_{B24337}$ have the structure | 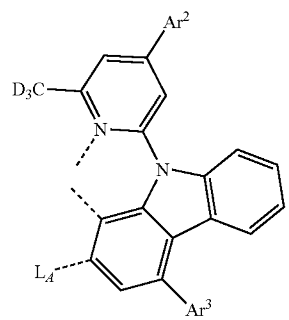 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 23437 |
| wherein $L_{B24338}$-$L_{B24367}$ have the structure | 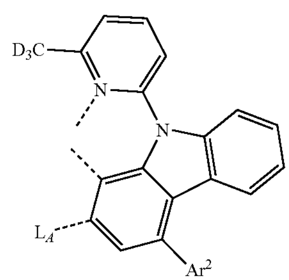 | wherein $Ar^2$ = Aj, wherein j is an integer from 11 to 17 and 21-30, and | z = j + 24337 |
| wherein $L_{B24368}$-$L_{B25267}$ have the structure | 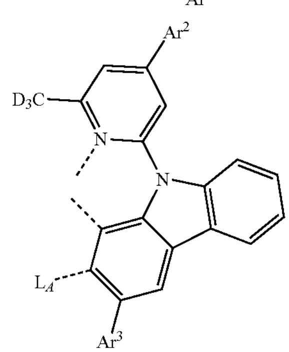 | wherein $Ar^2$ = Aj and $Ar^3$ = Am, wherein j is an integer from 1 to 19 and 21 to 30 and m is an integer from 11 to 17 and 21-30, and | z = 30(j − 1) + m + 24367 |

-continued
| $L_{Bz}$ | $L_{Bz}$ structure | $Ar^2$, $Ar^3$, $R^2$ | Z |
|---|---|---|---|
| wherein $L_{B25268}$-$L_{B25297}$ have the structure | 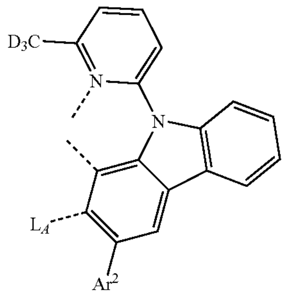 | wherein $Ar^2$ = Aj, wherein j is an integer from 11 to 17 and 21-30, and | z = j + 25267 |
wherein A1 to A30 have the following structures:
A1
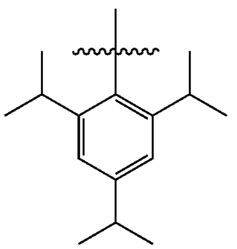
A2
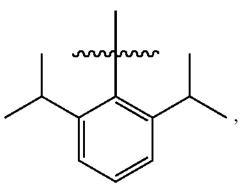
A3
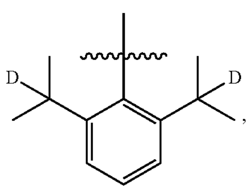
A4
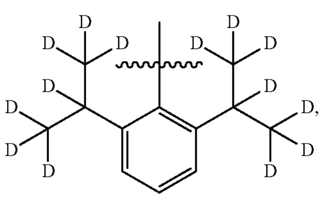
A5
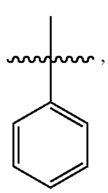
-continued
A6
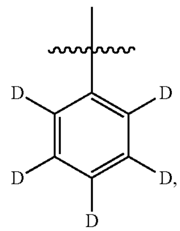
A7
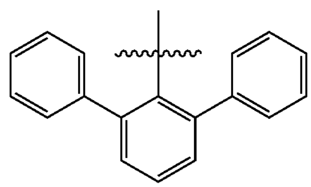
A8
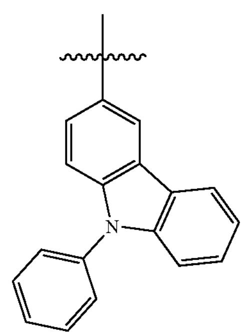
A9
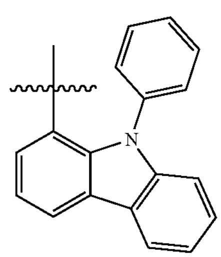

-continued
A10
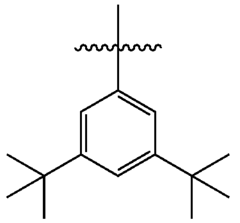
A11
Me,
A12
iPr,
A13
tBu,
A14
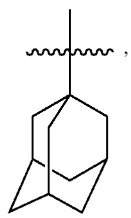
A15
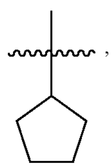
A16
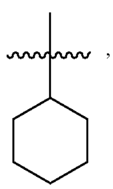
A17
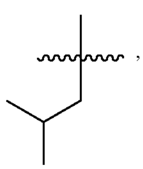
A18
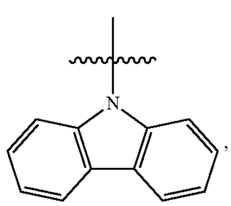
A19
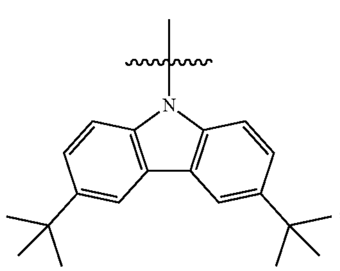
-continued
A20
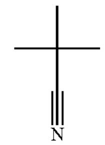
A21
$CD_3$,
A22
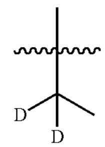
A23
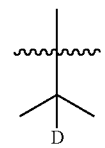
A24
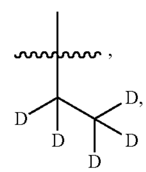
A25
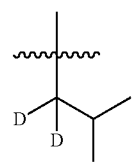
A26
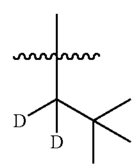
A27
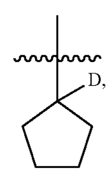
A28
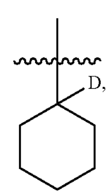
A29
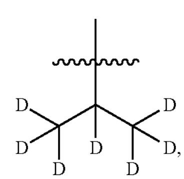

-continued
A30
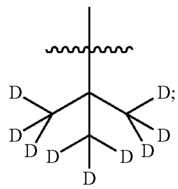
and wherein R1 to R330 have the following structures:
R10
$CD_3$,
R11
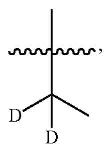
R12
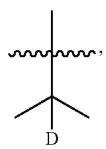
R13
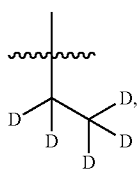
R14
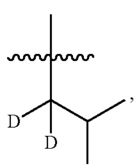
R15
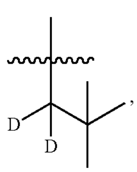
R18
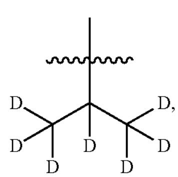
R19
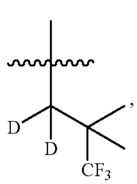
-continued
R20
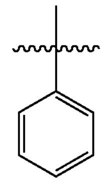
R21
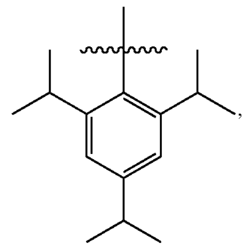
R22
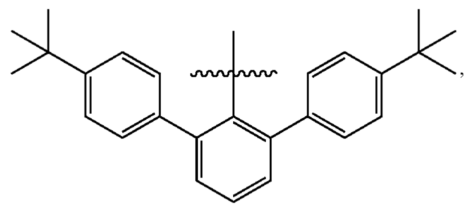
R23
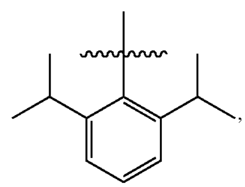
R24
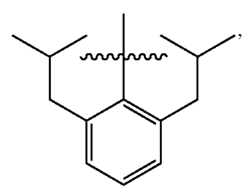
R25
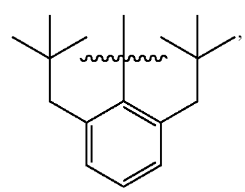
R27
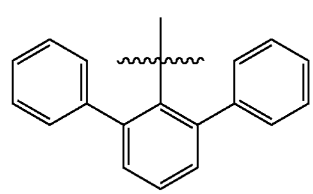
R28
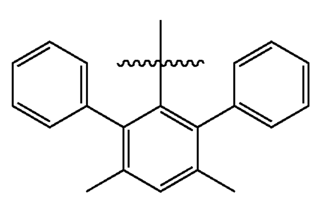

-continued
R29
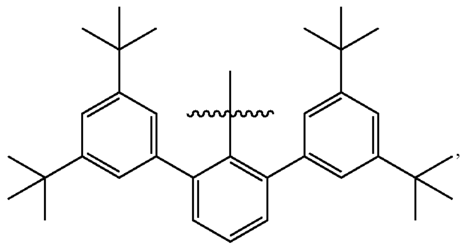
R30
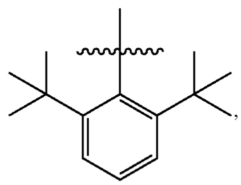
R35
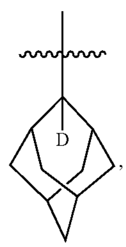
R36
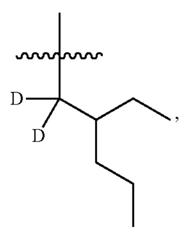
R37
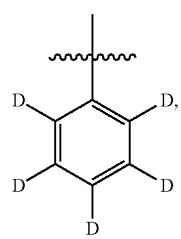
R38
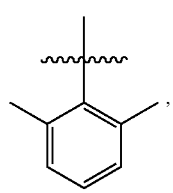
R39
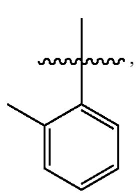
-continued
R40
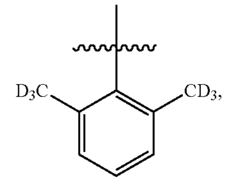
R41
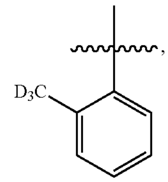
R42
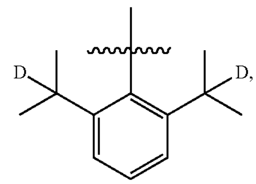
R43
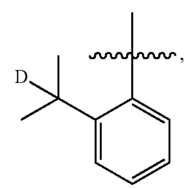
R44
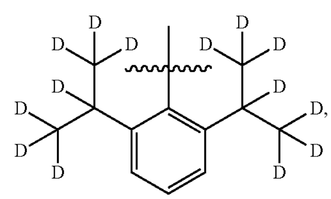
R45
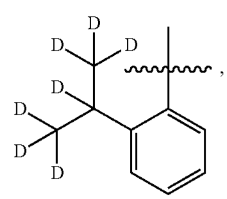
R46
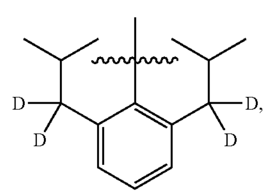
R47
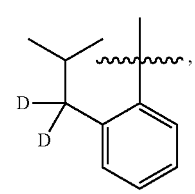

R48
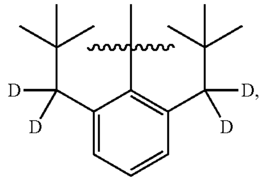
R49
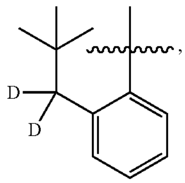
R52
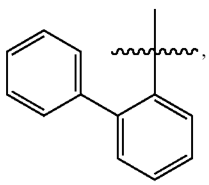
R53
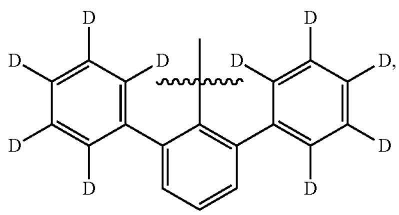
R54
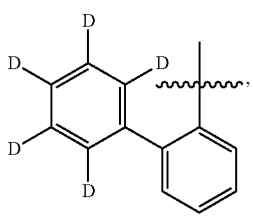
R55
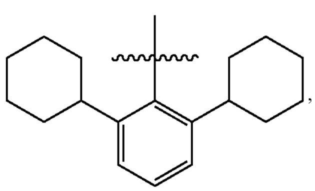
R56
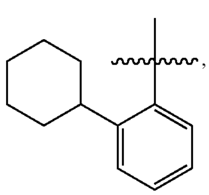
R57
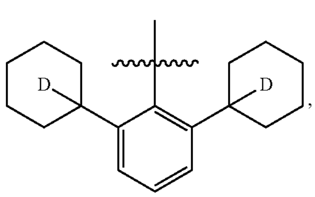
R58
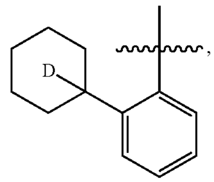
R59
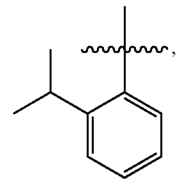
R60
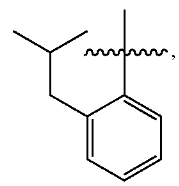
R61
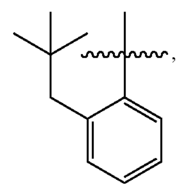
R62
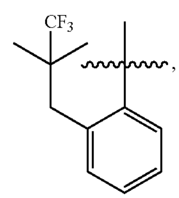
R63
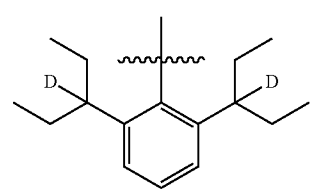
R64
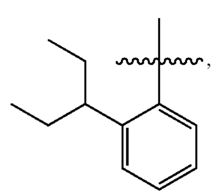
R65
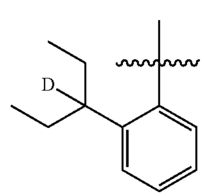

-continued
R66
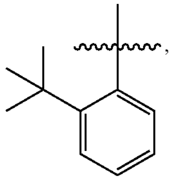
R67
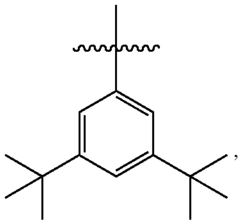
R68
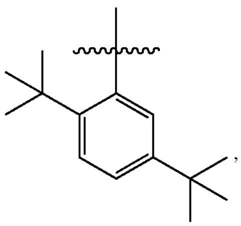
R69
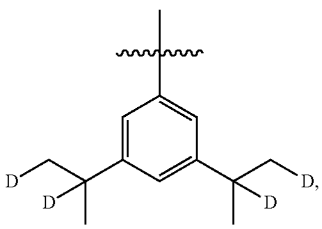
R70
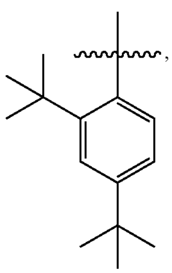
R71
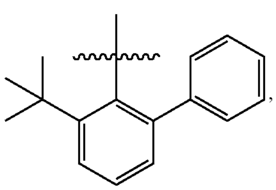
R72
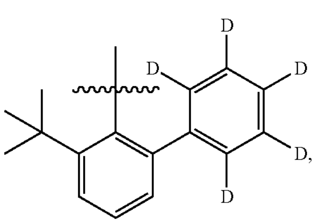
-continued
R73
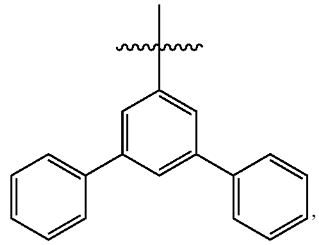
R74
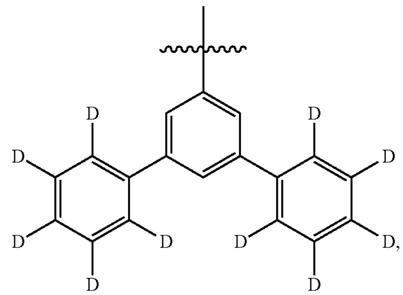
R89
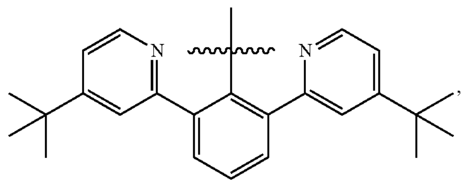
R90
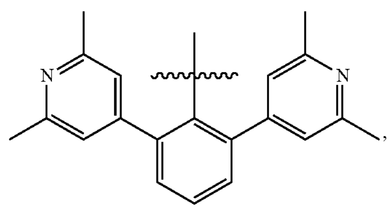
R93
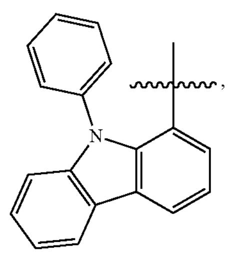
R94
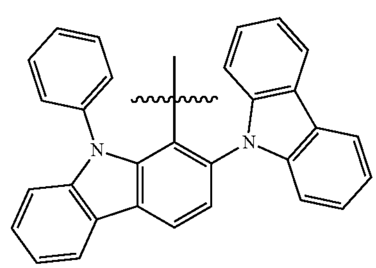

R95
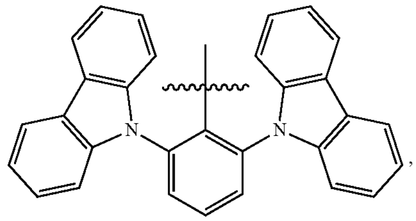
R96
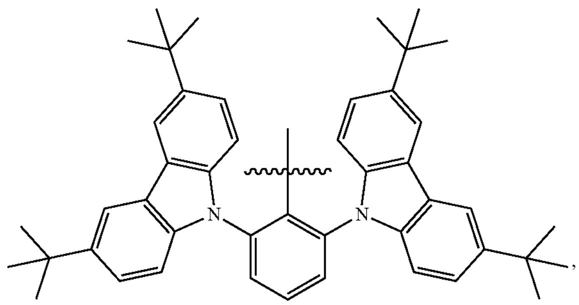
R97
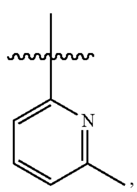
R98
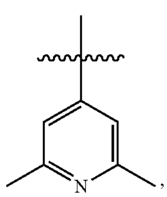
R99
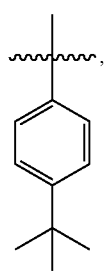
R100
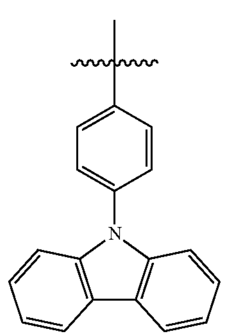
R101
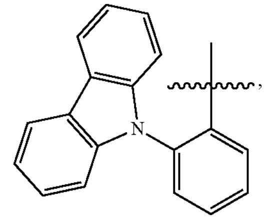
R102
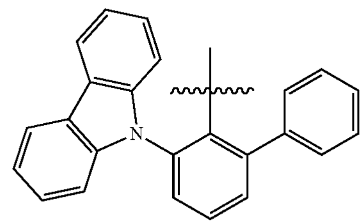
R103
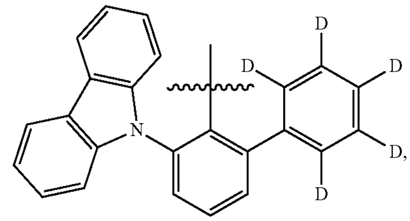
R104
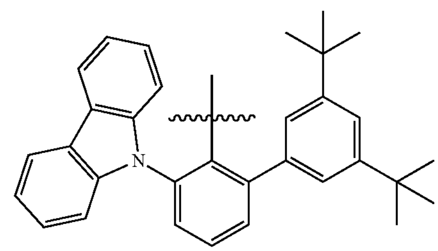
R105
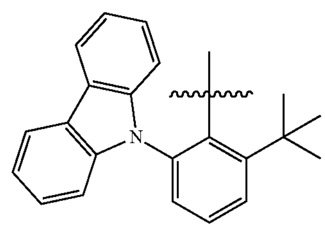
R106
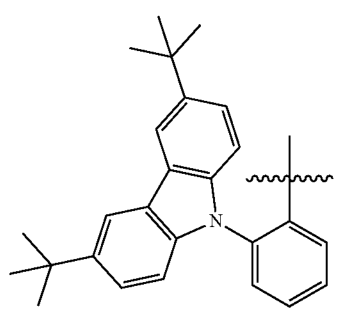

-continued
R107
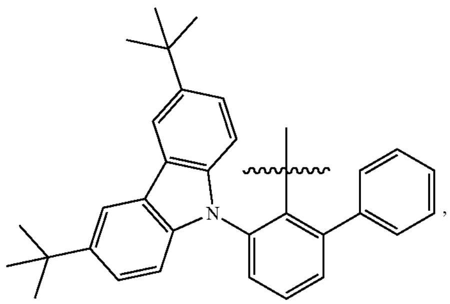
R108
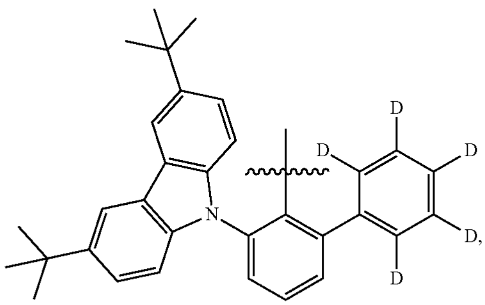
R109
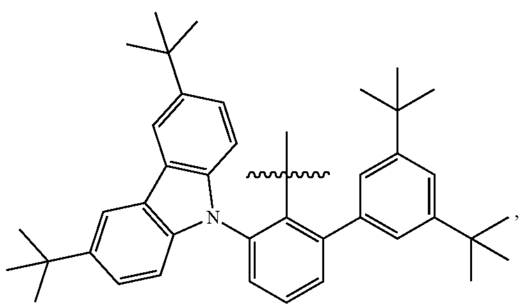
R110
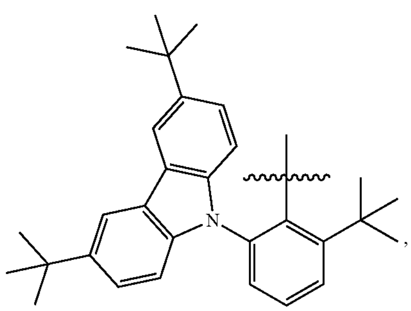
R111
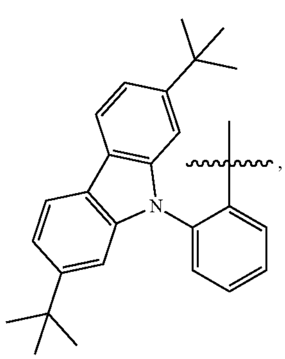
-continued
R112
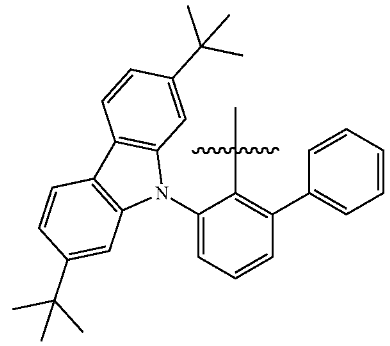
R113
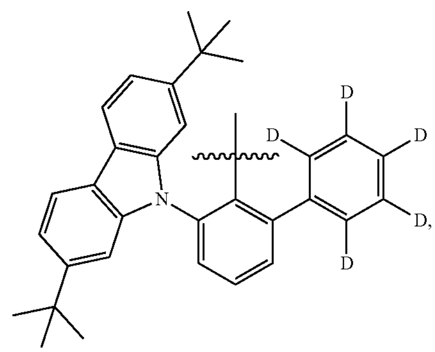
R114
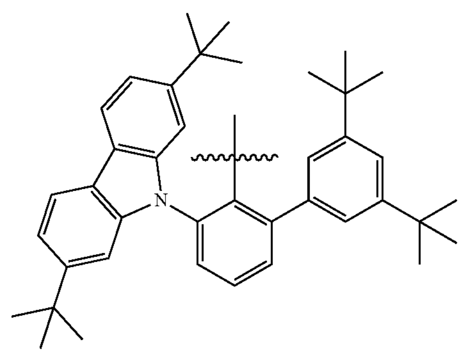
R115
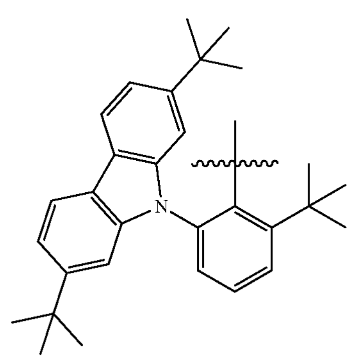

-continued
R116
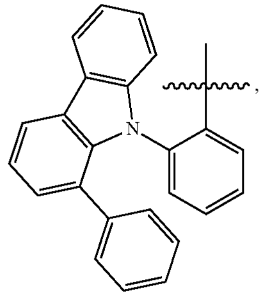
R117
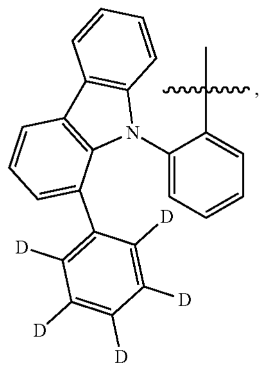
R118
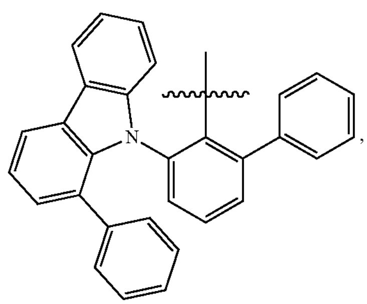
R119
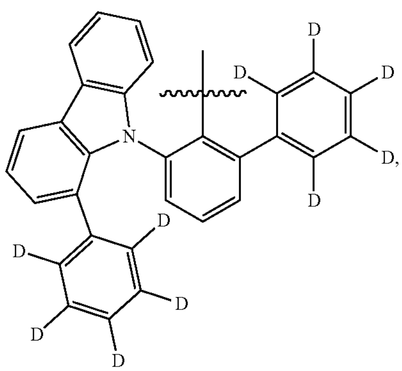
-continued
R120
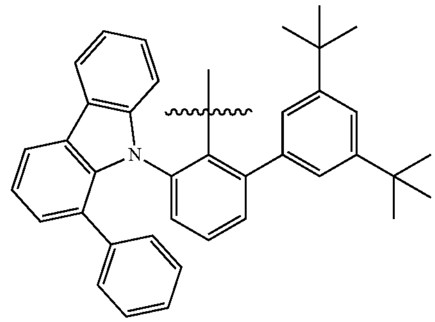
R121
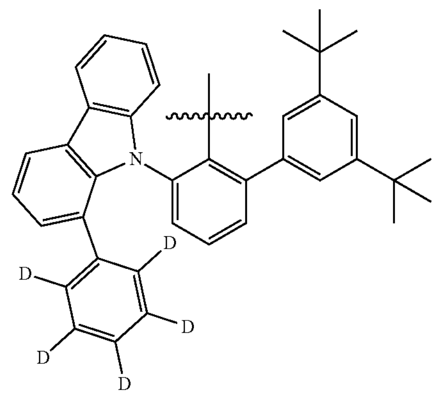
R122
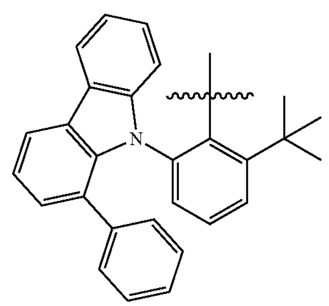
R123
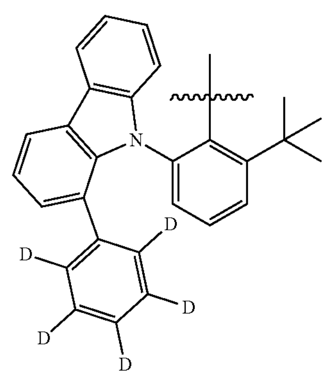

-continued
R124
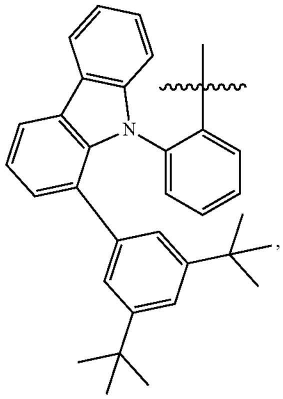
R125
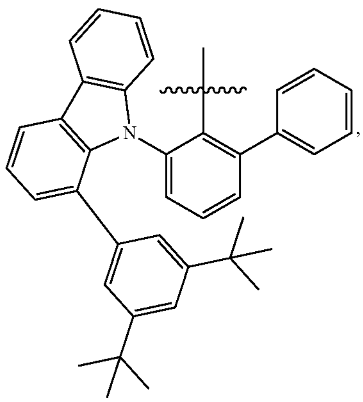
R126
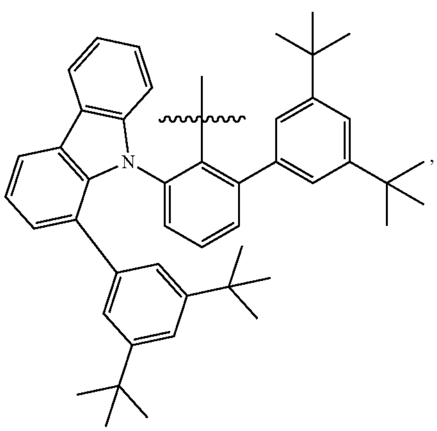
R127
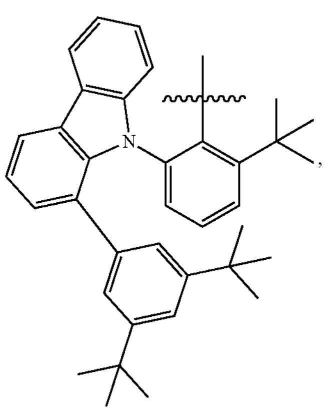
-continued
R128
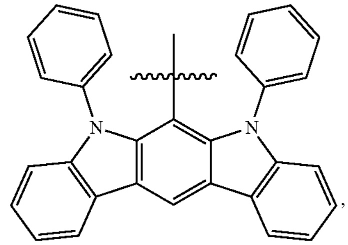
R129
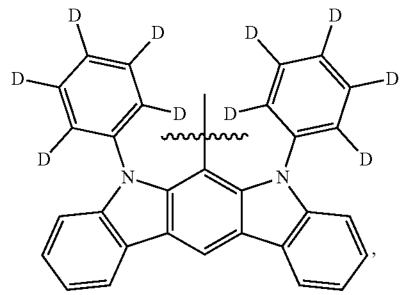
R130
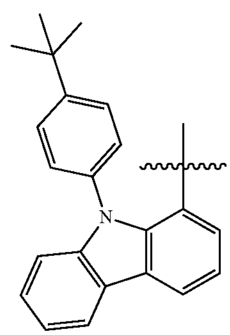
R131
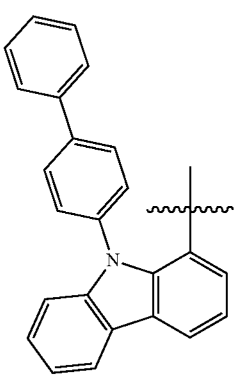

-continued
R132
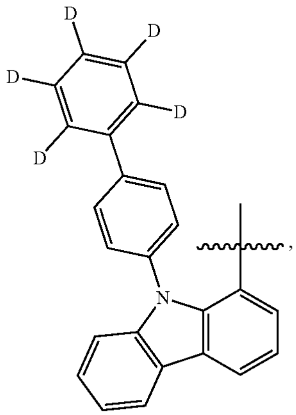
R133
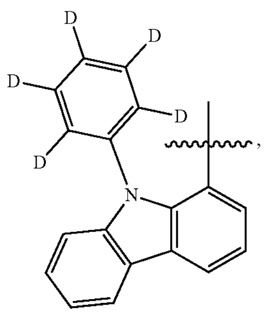
R134
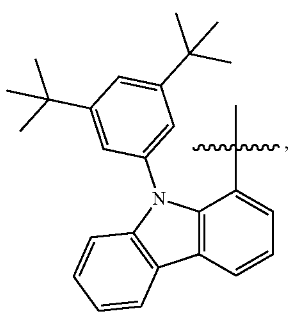
R135
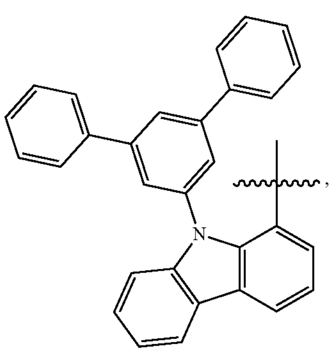
-continued
R136
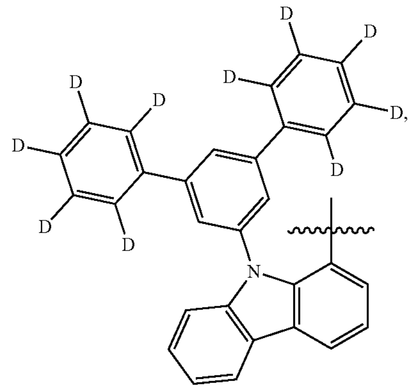
R137
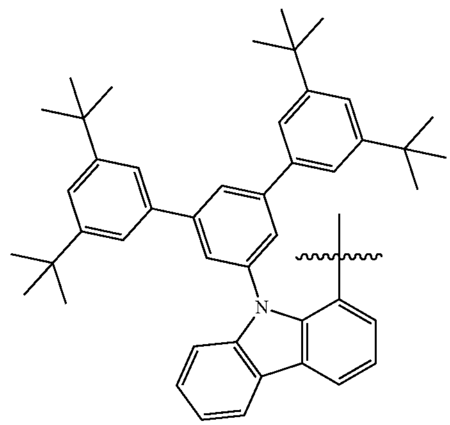
R138
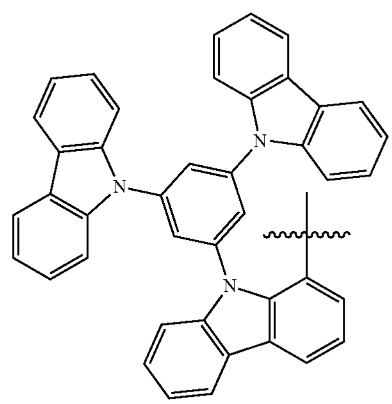
R139
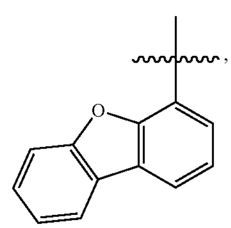
R140
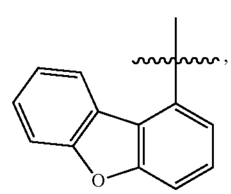

-continued
R141
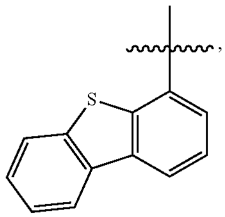
R142
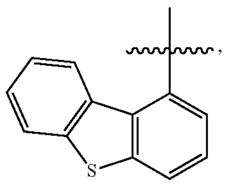
R143
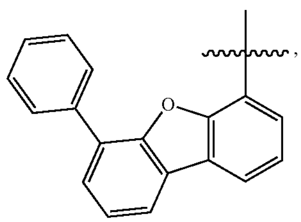
R144
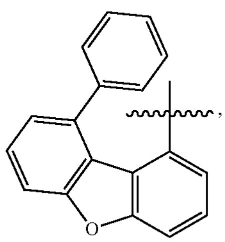
R145
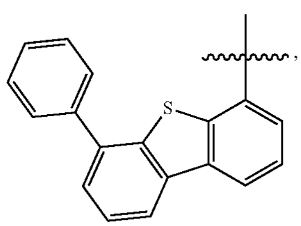
R146
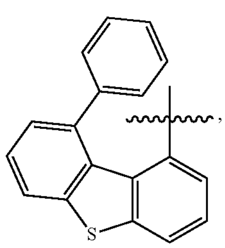
R147
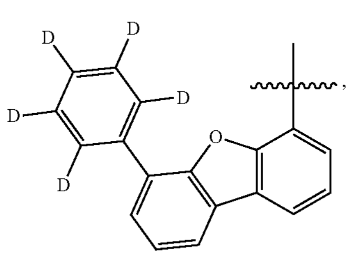
-continued
R148
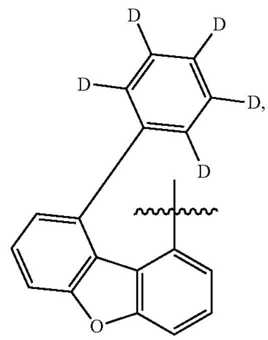
R149
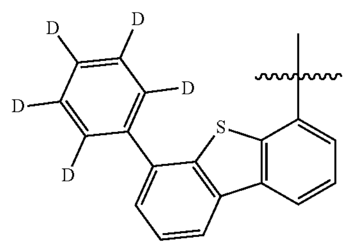
R150
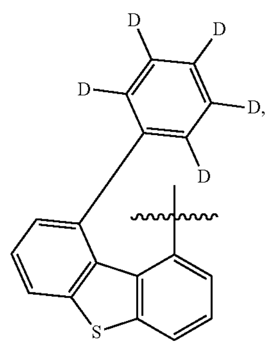
R151
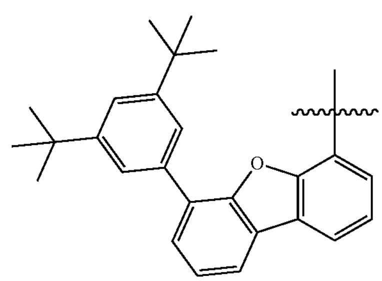
R152
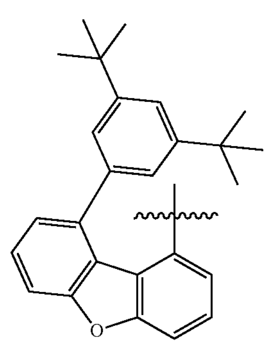

-continued
R153
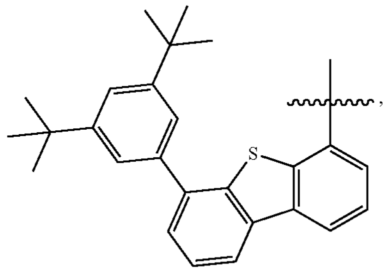
R154
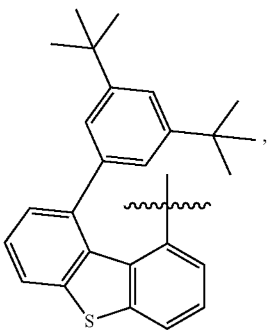
R155
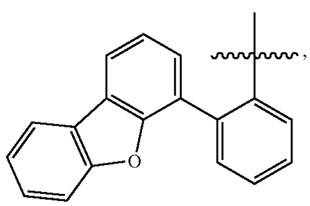
R156
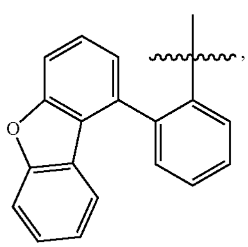
R157
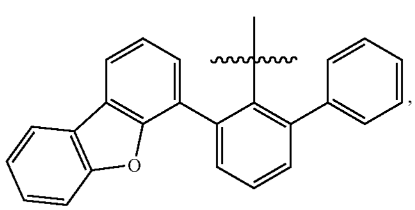
R158
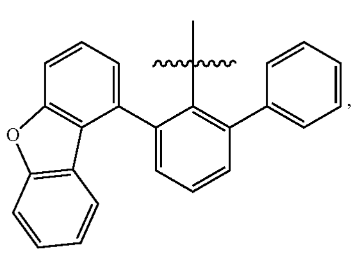
-continued
R159
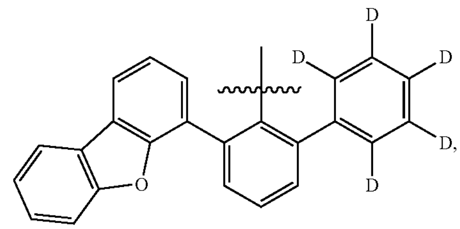
R160
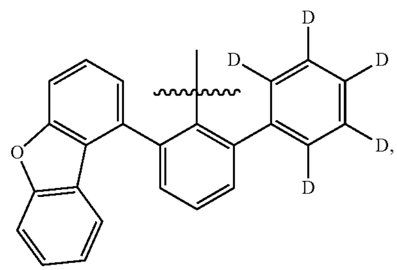
R161
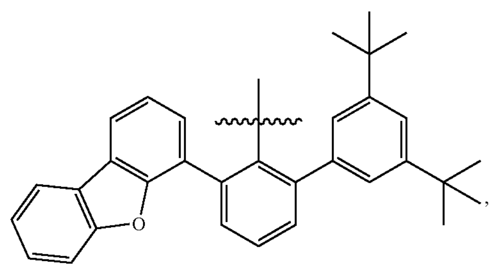
R162
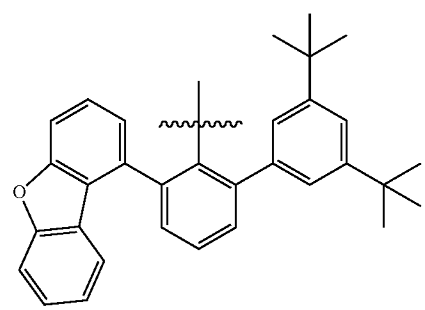
R163
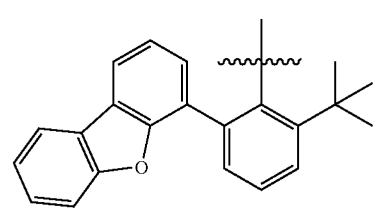
R164
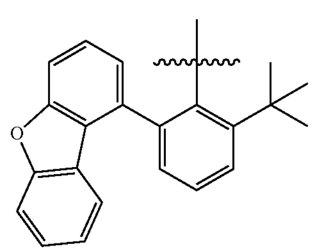

-continued
R165
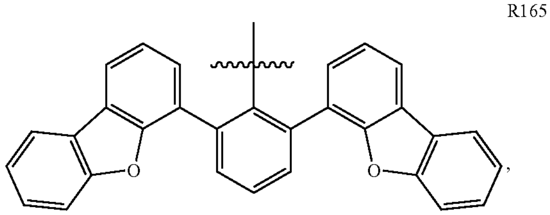
R166
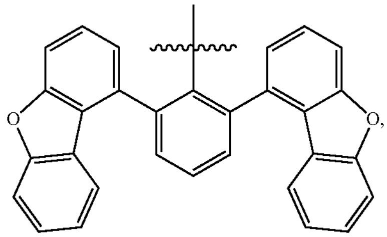
R167
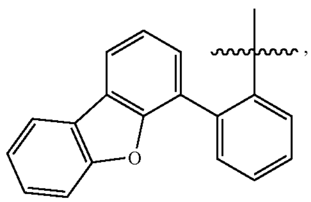
R168
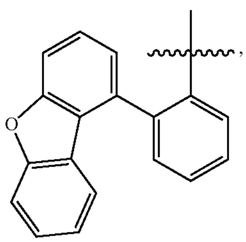
R169
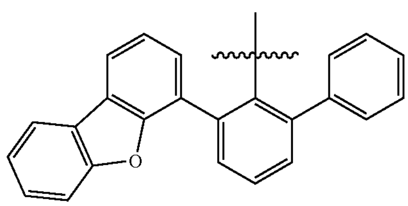
R170
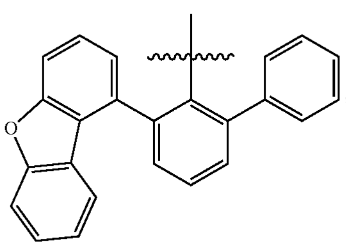
R171
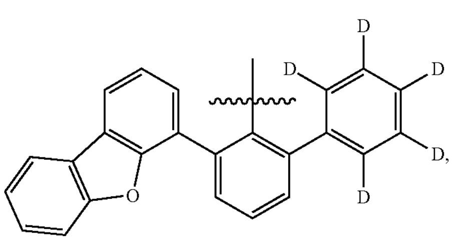
-continued
R172
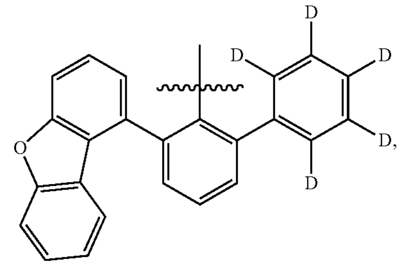
R173
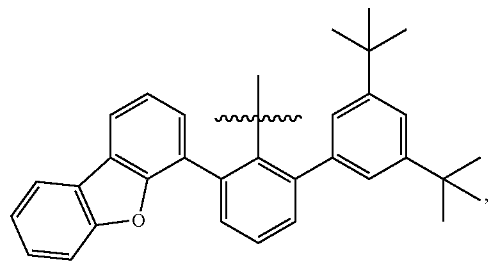
R174
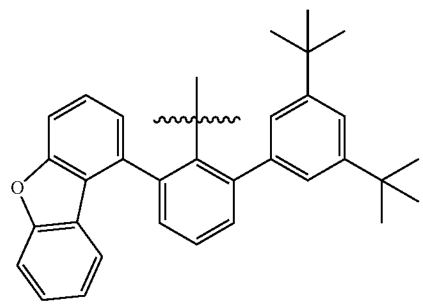
R175
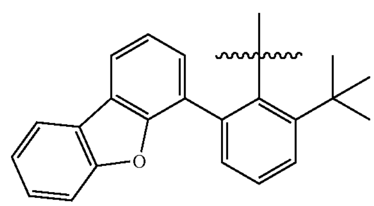
R176
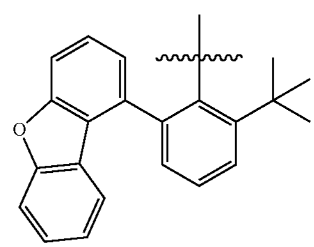
R177
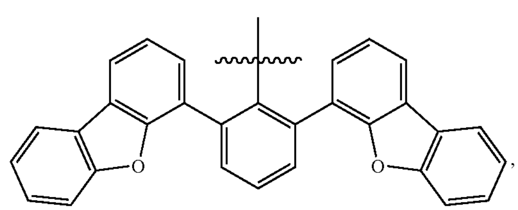

-continued
R178
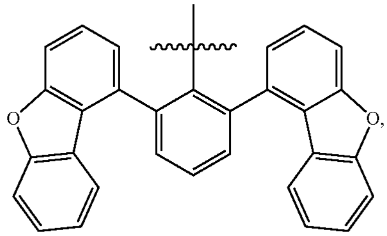
R179
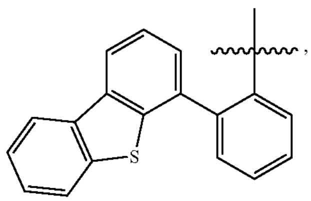
R180
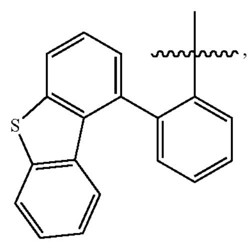
R181
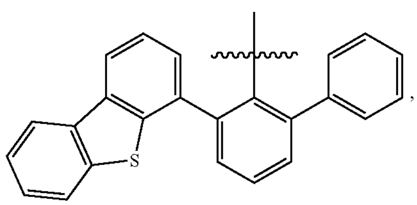
R182
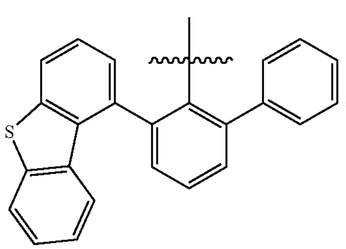
R183
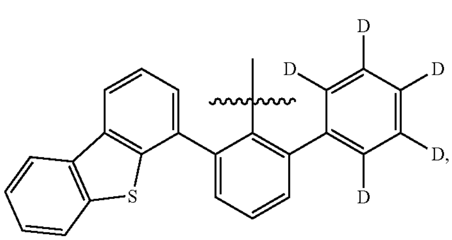
-continued
R184
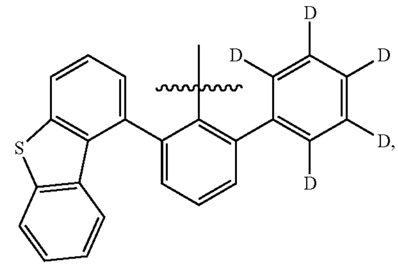
R185
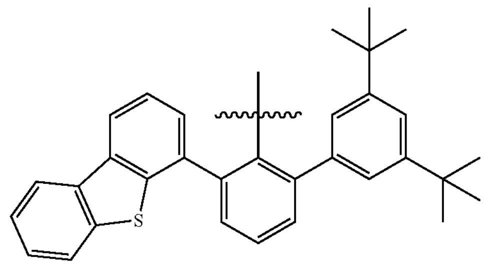
R186
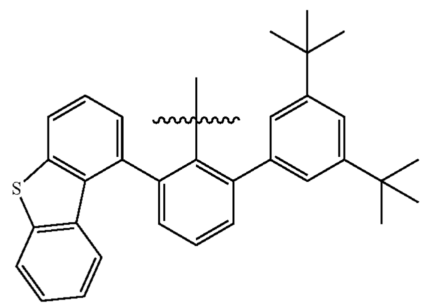
R187
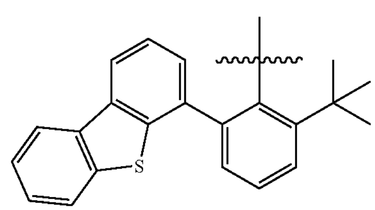
R188
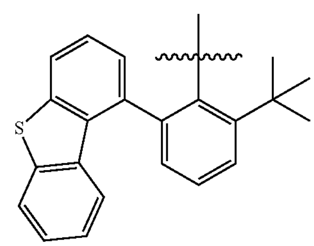
R189
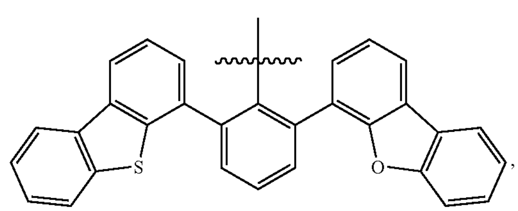

R190
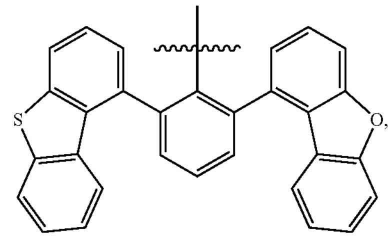
R191
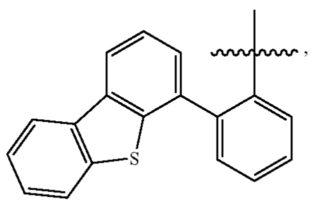
R192
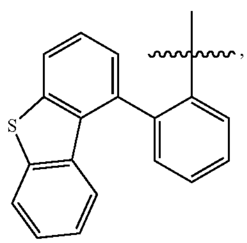
R193
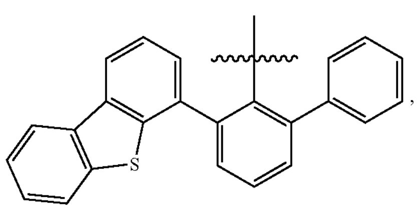
R194
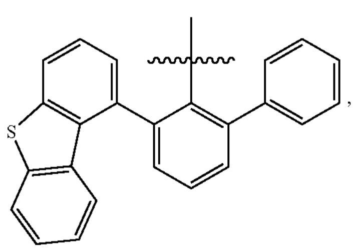
R195
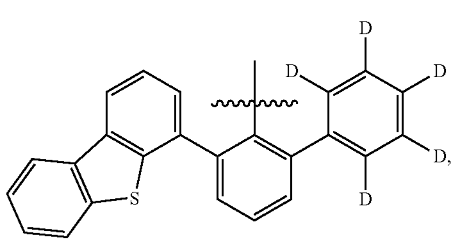
R196
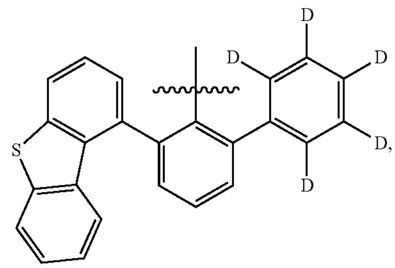
R197
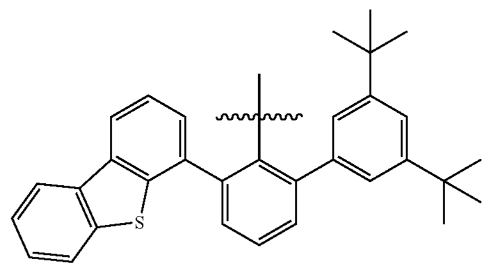
R198
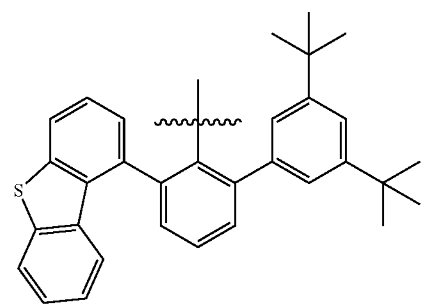
R199
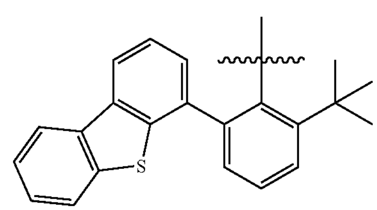
R200
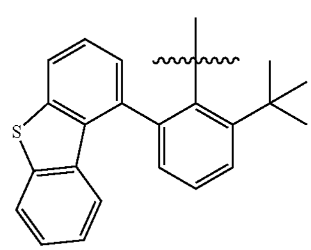
R201
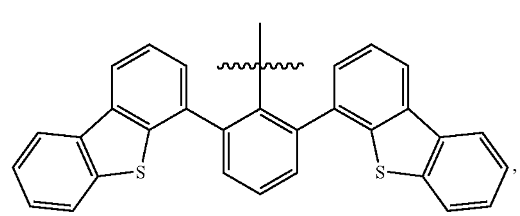

-continued
R202
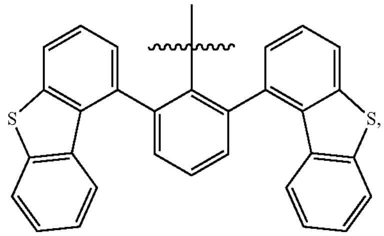
R203
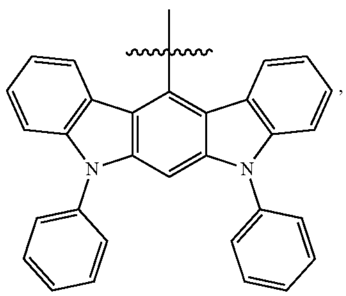
R204
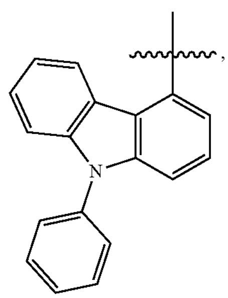
R205
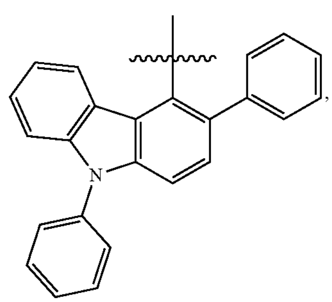
R206
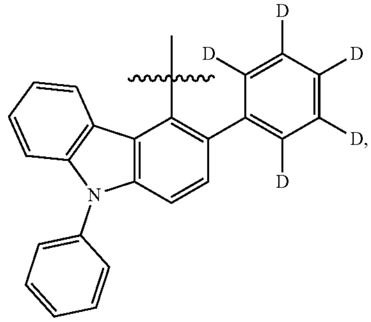
-continued
R207
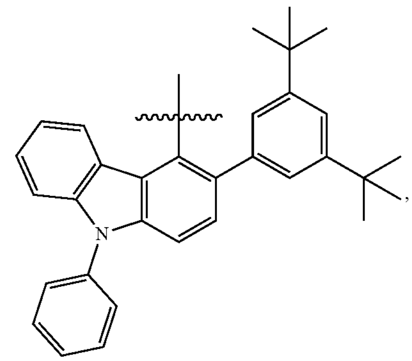
R208
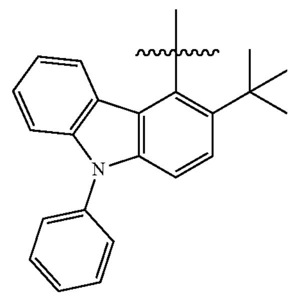
R209
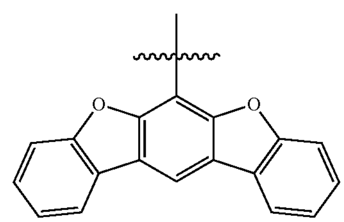
R210
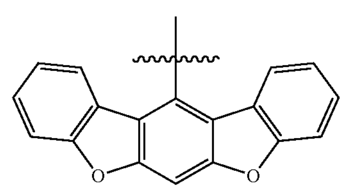
R211
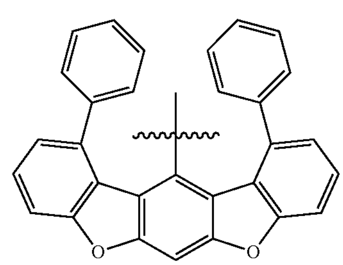
R212
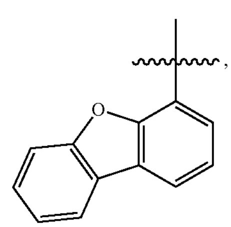

-continued
R213
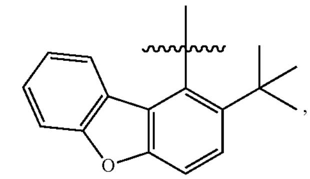
R214
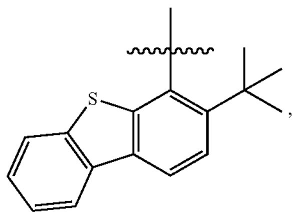
R215
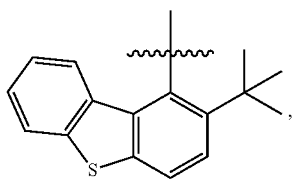
R216
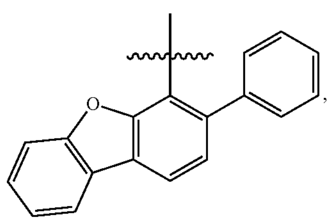
R217
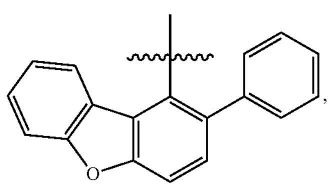
R218
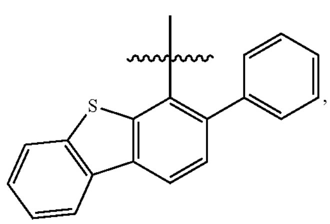
R219
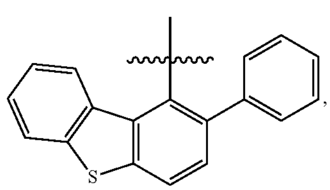
-continued
R220
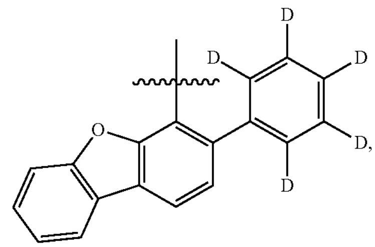
R221
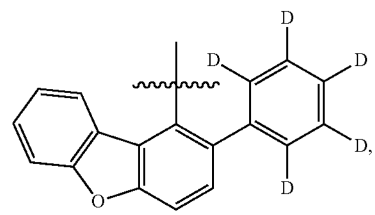
R222
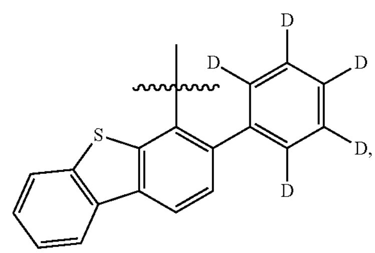
R223
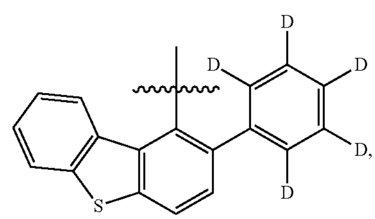
R224
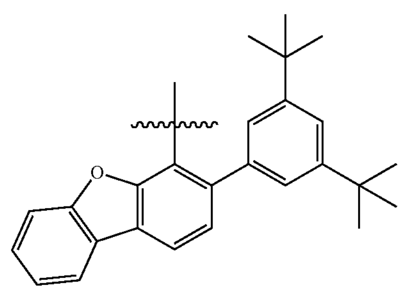
R225
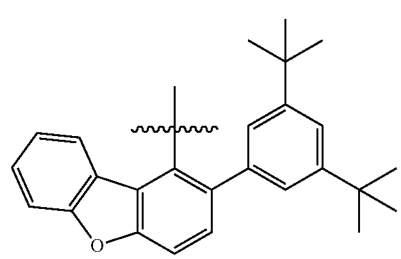

-continued
R226
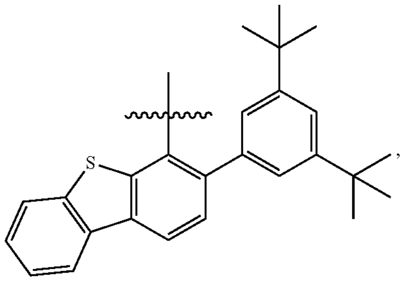
R227
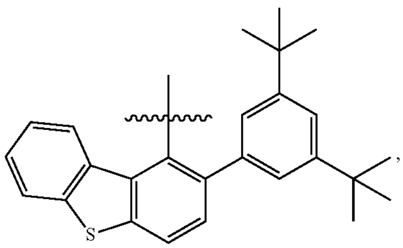
R228
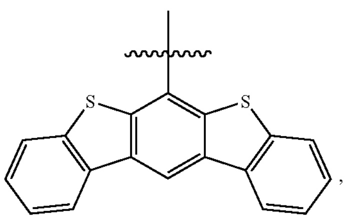
R229
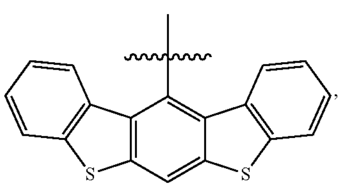
R230
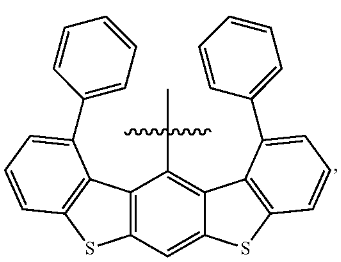
R231
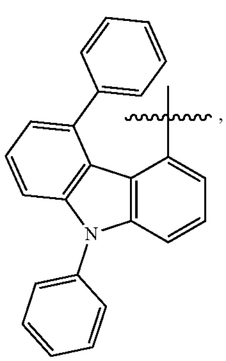
-continued
R232
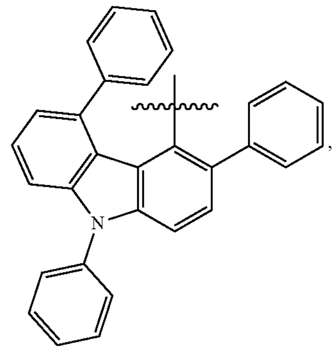
R233
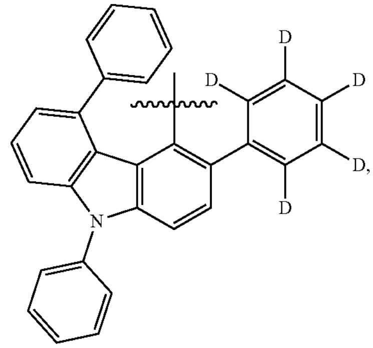
R234
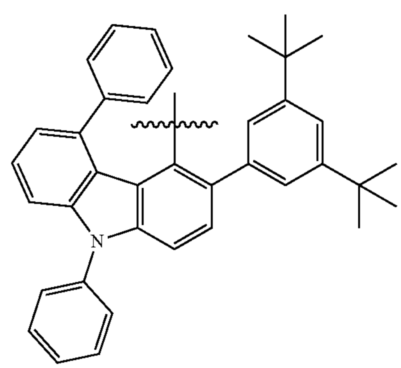
R235
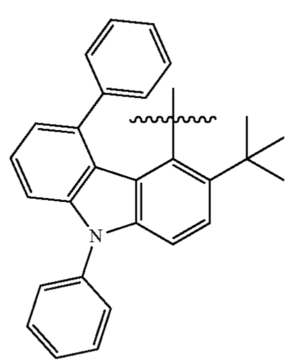

-continued
R236
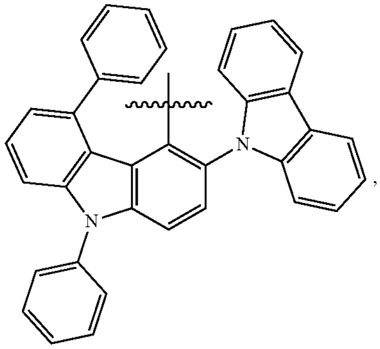
R237
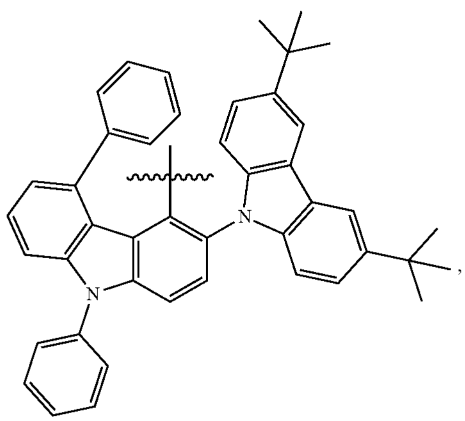
R238
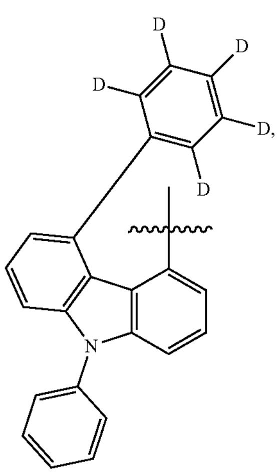
-continued
R239
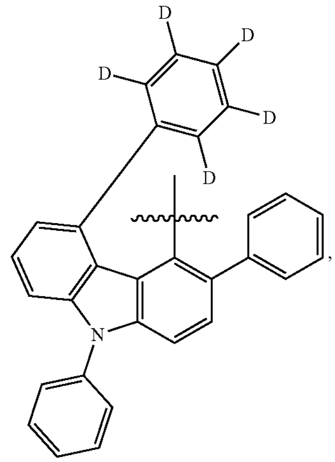
R240
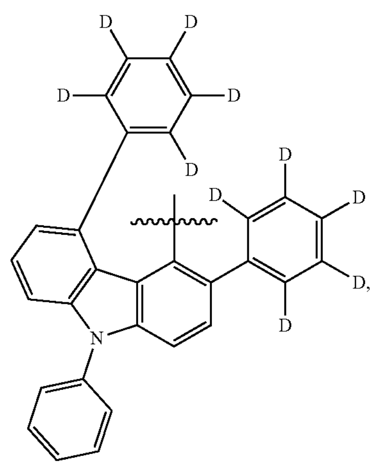
R241
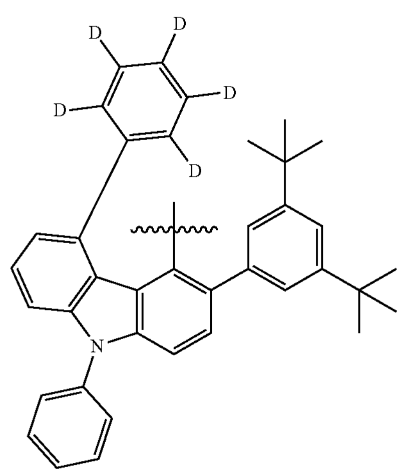

-continued
R242
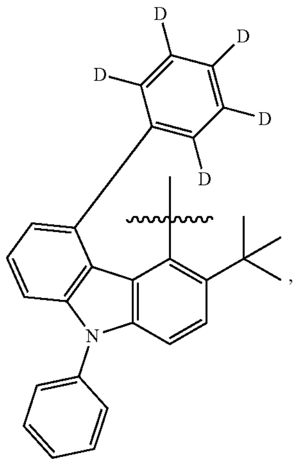
R243
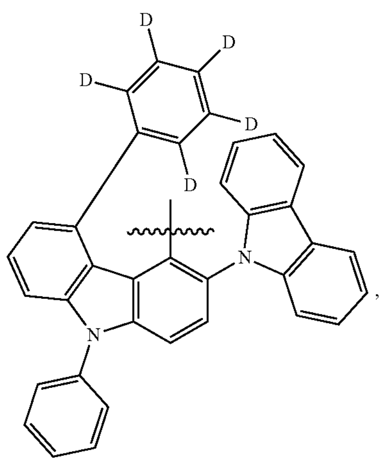
R244
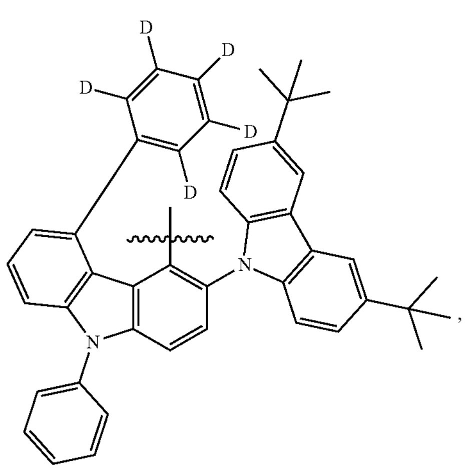
-continued
R245
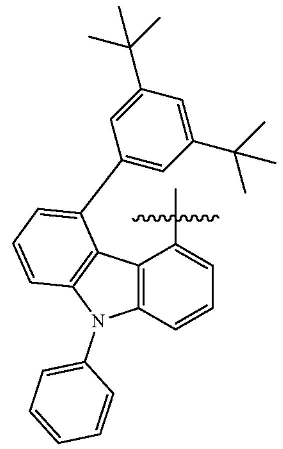
R246
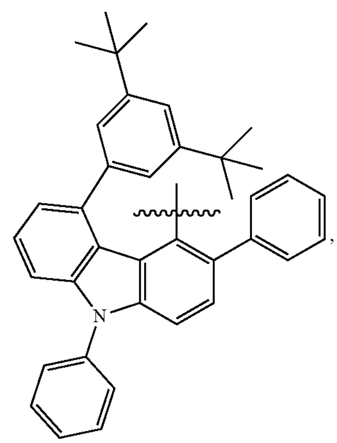
R247
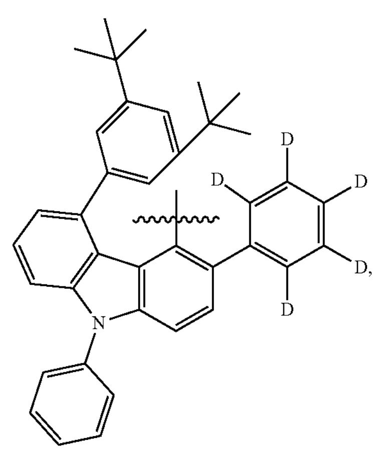

-continued
R248
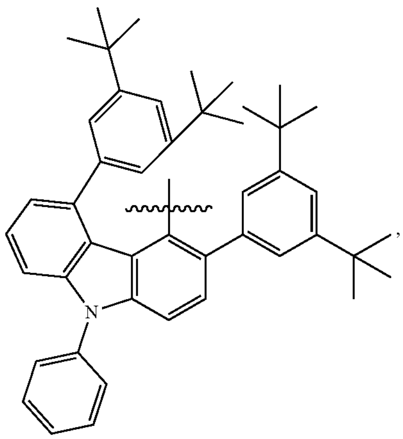
R249
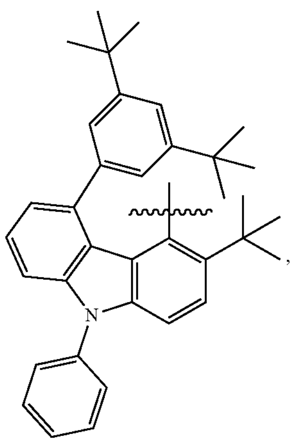
R250
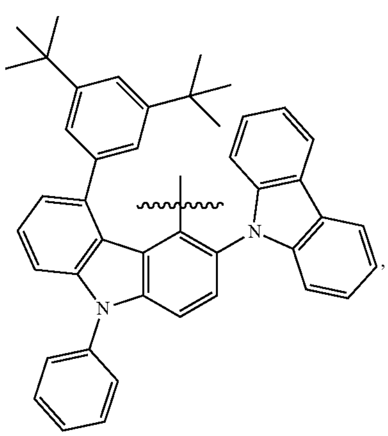
-continued
R251
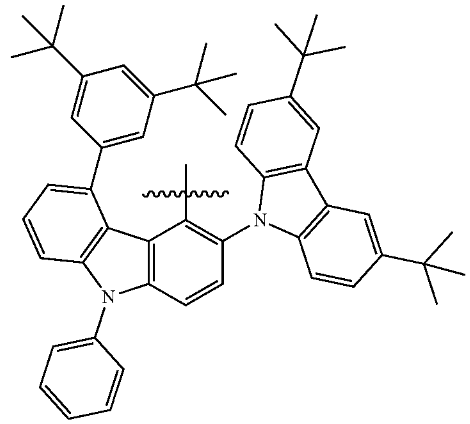
R252
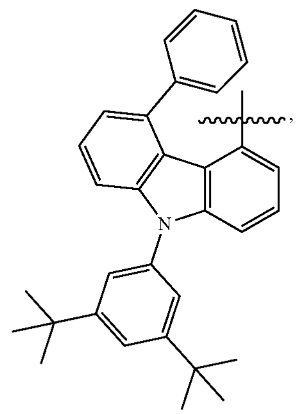
R253
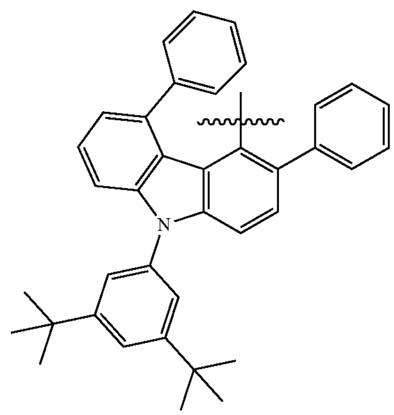
R254
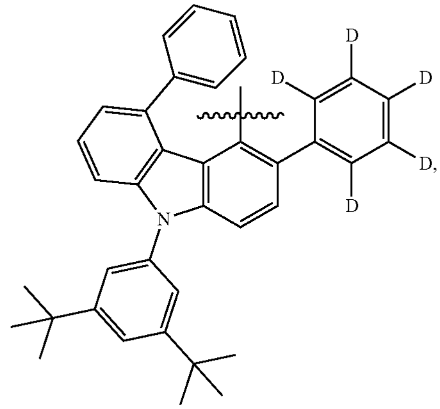

R255
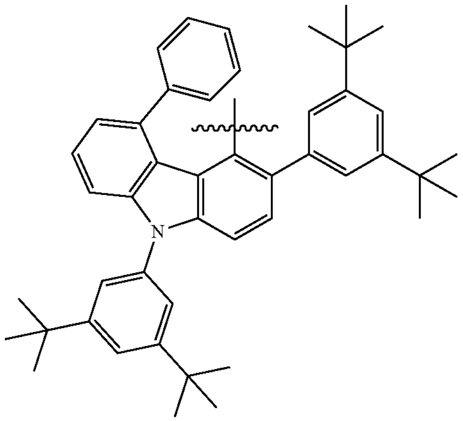
R256
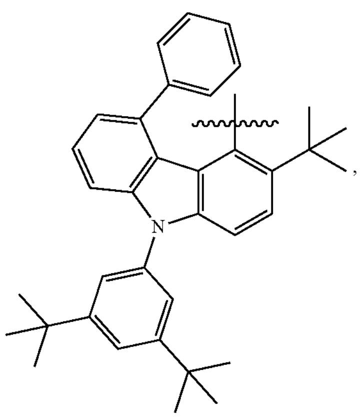
R257
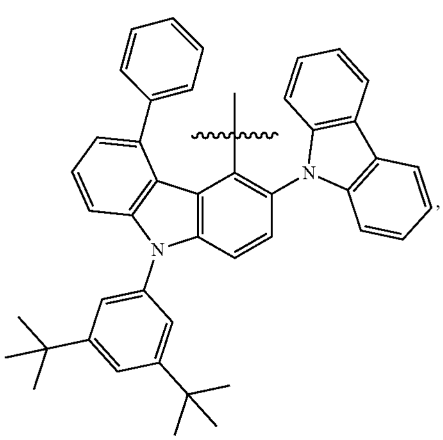
R258
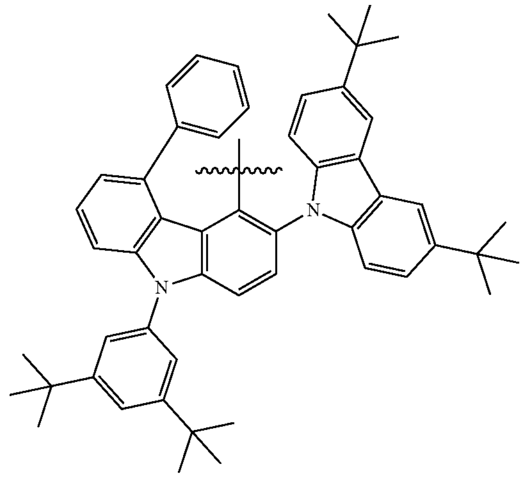
R259
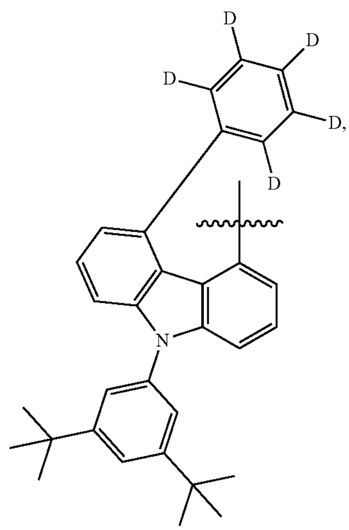
R260
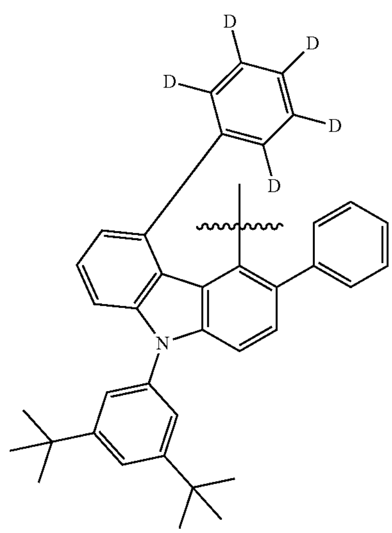

-continued
R261
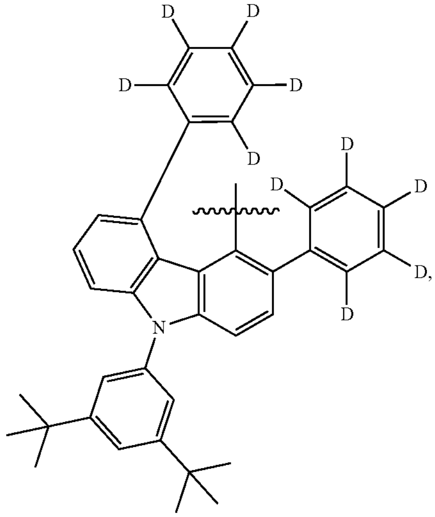
R262
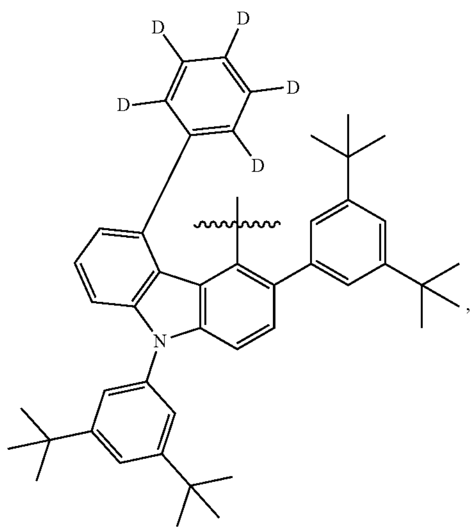
R263
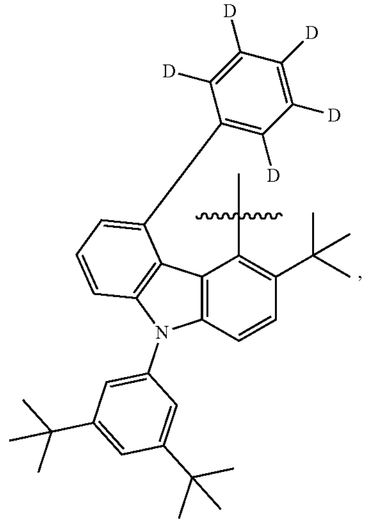
-continued
R264
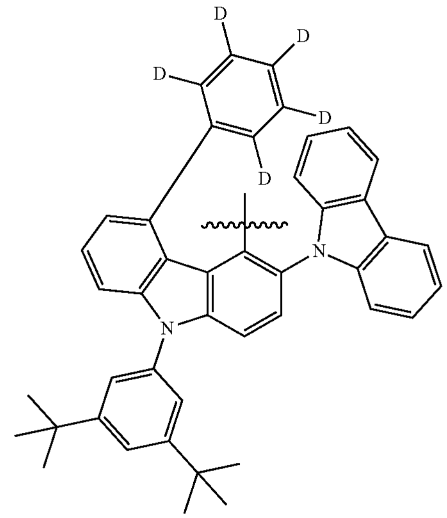
R265
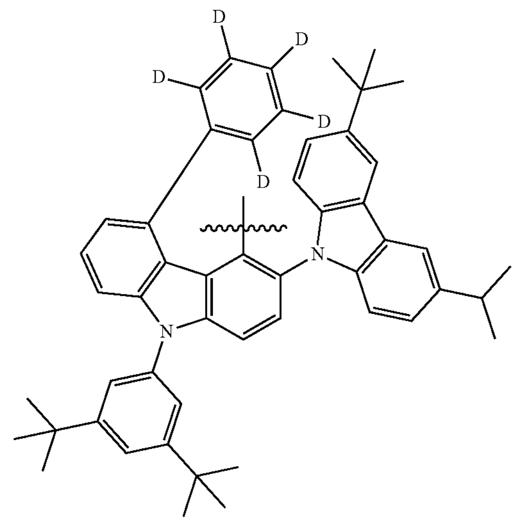
R266
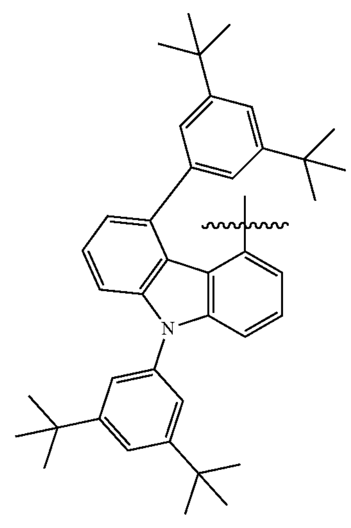

-continued
R267
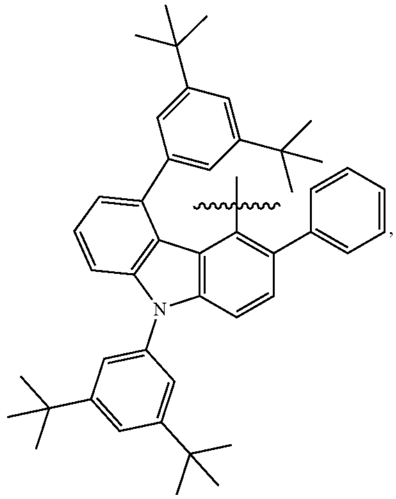
R268
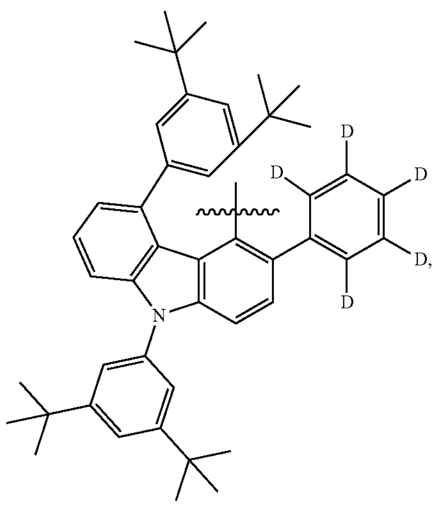
R269
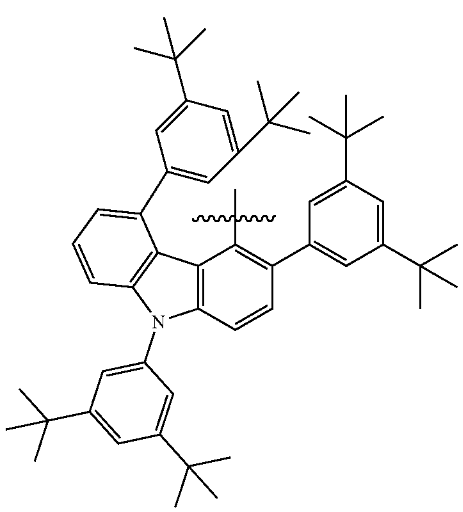
-continued
R270
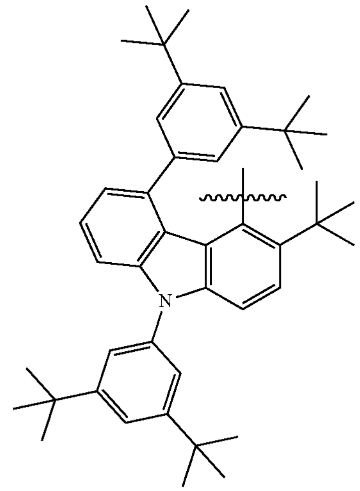
271
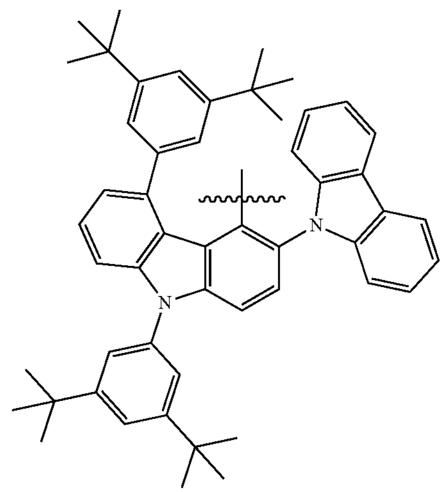
272
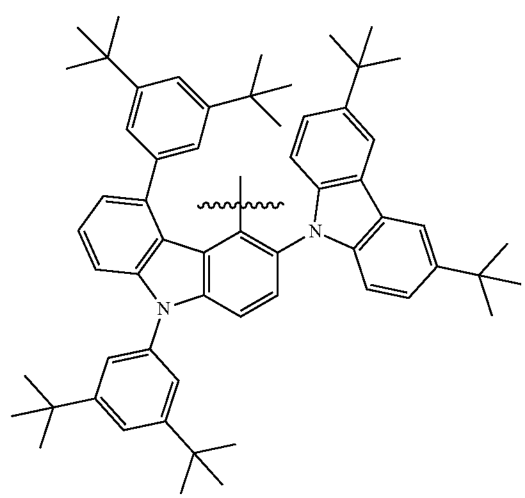

-continued
R273
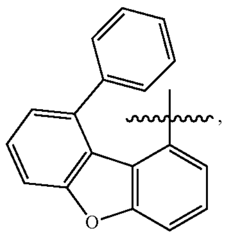
R274
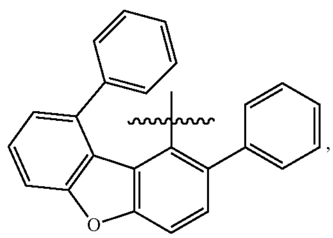
R275
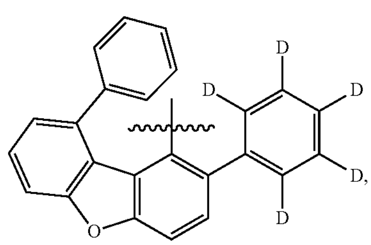
R276
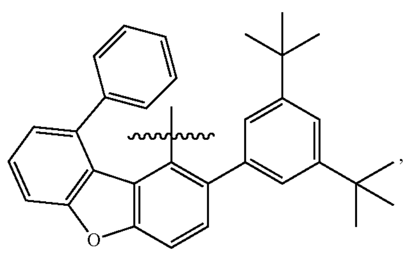
R277
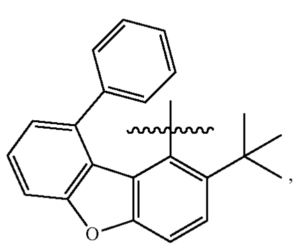
R278
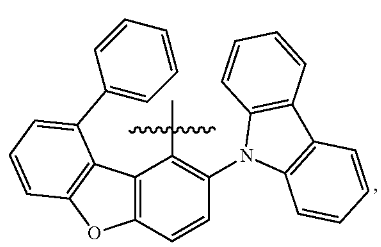
-continued
R279
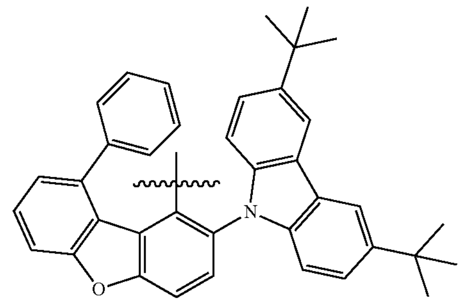
R280
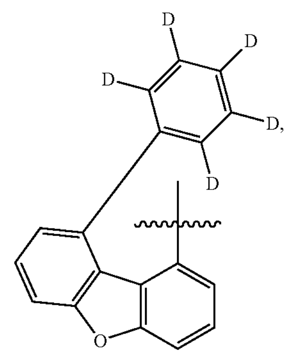
R281
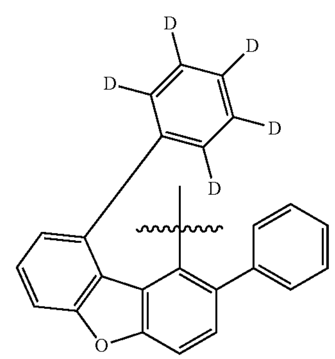
R282
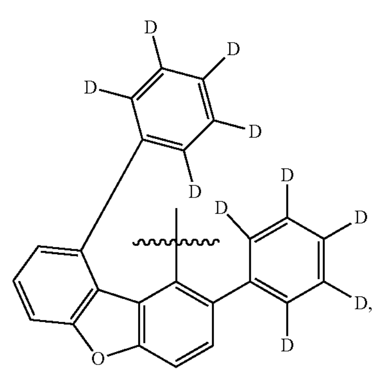

-continued
R283
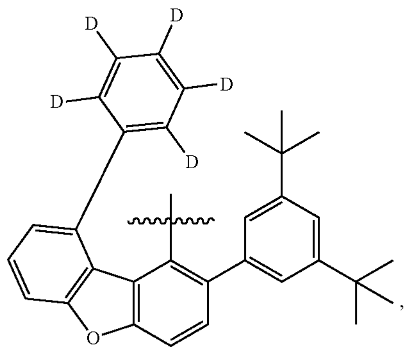
R284
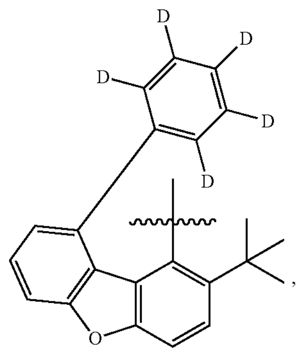
R285
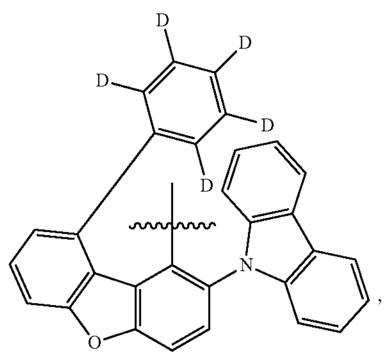
R286
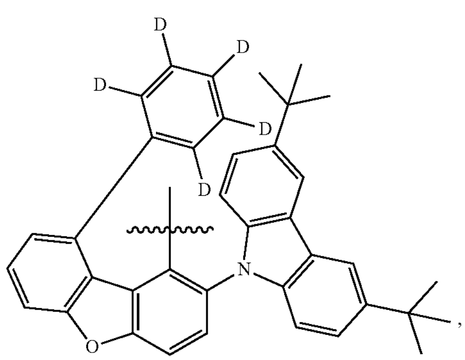
-continued
R287
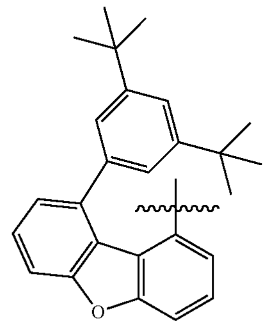
R288
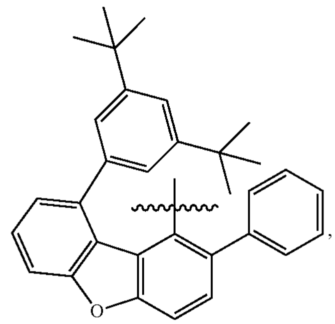
R289
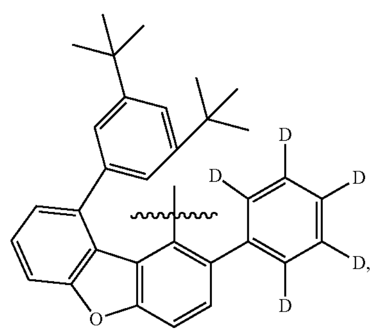
R290
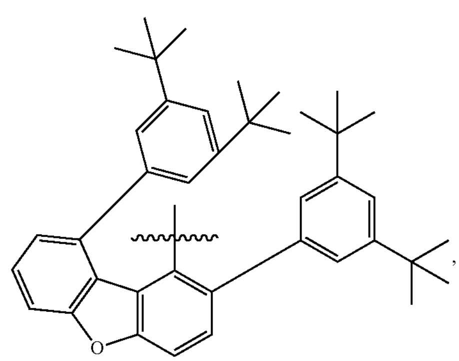

-continued
R291
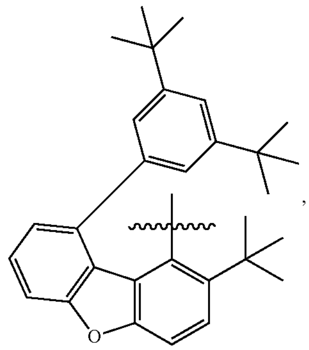
R292
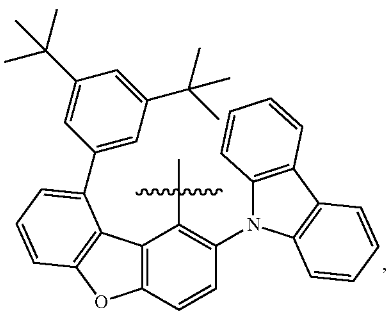
R293
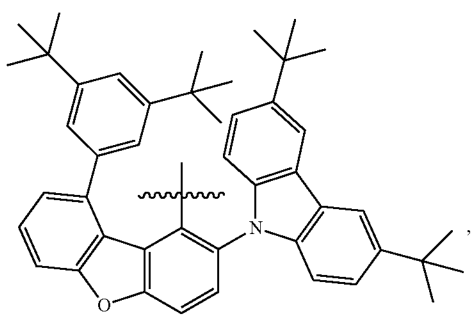
R294
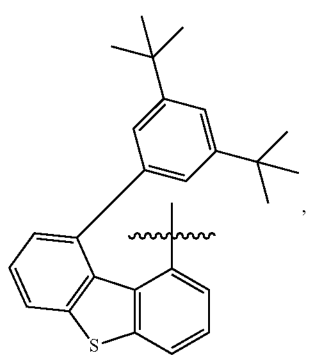
-continued
R295
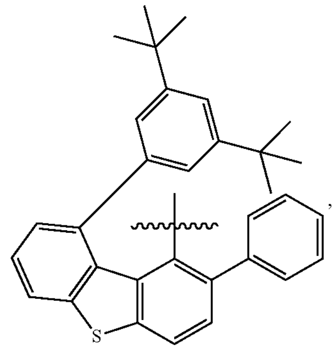
R296
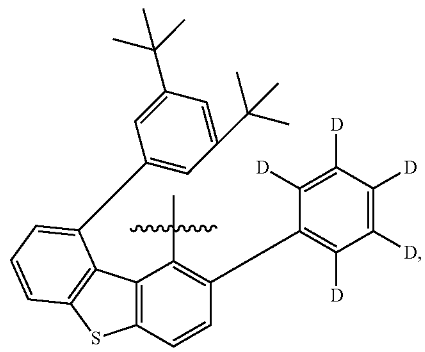
R297
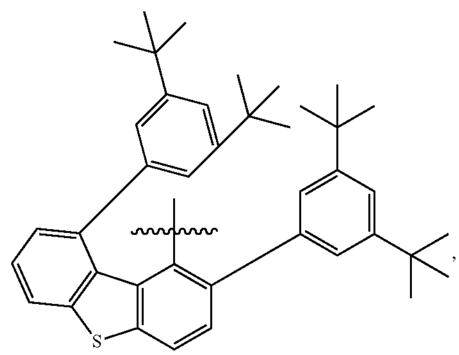
R298
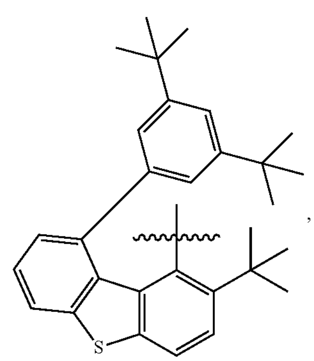

-continued
R299
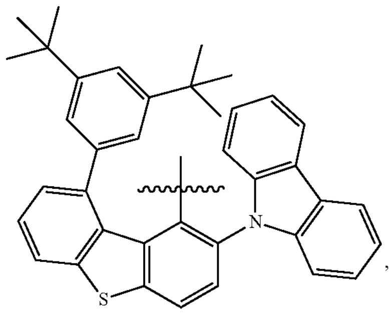
R300
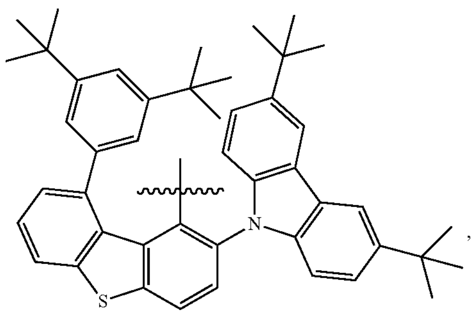
R301
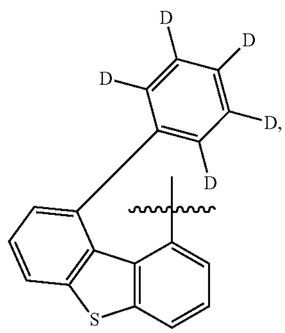
R302
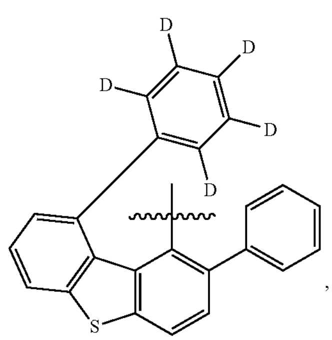
R303
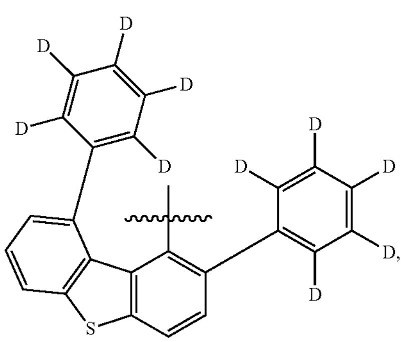
-continued
R304
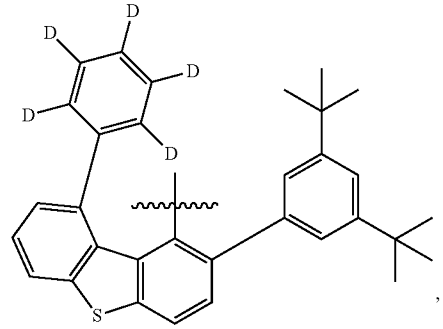
R305
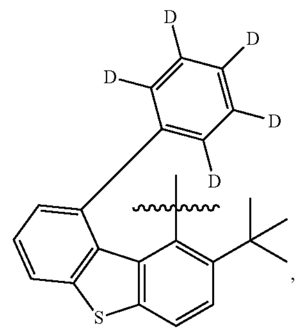
R306
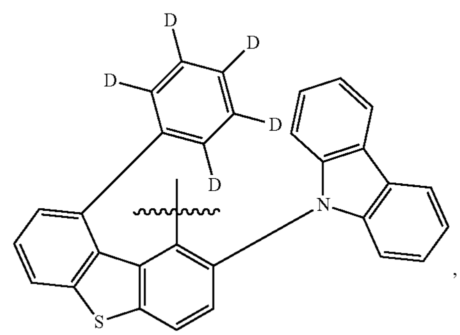
R307
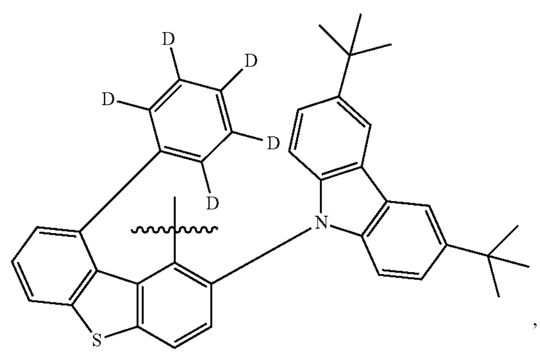

-continued
R308
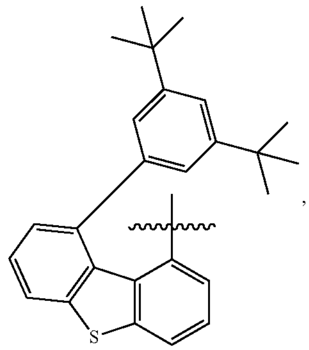
R309
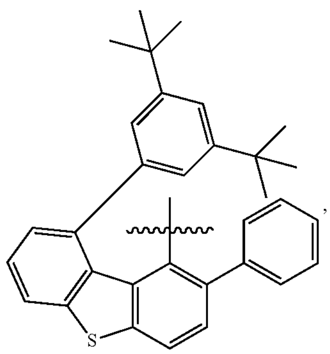
R310
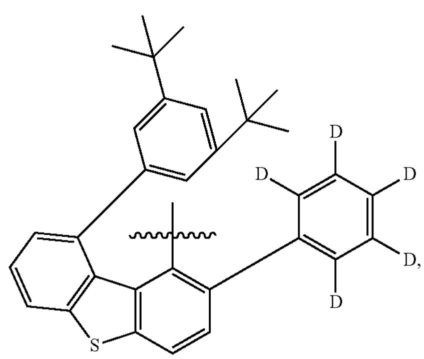
R311
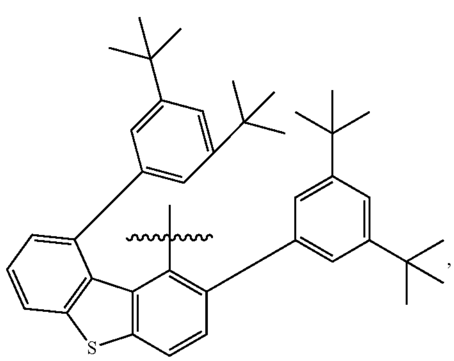
-continued
R312
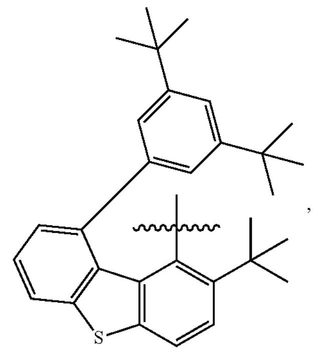
R313
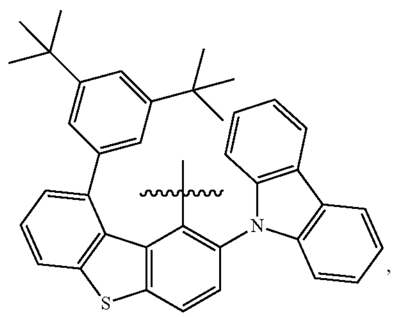
R314
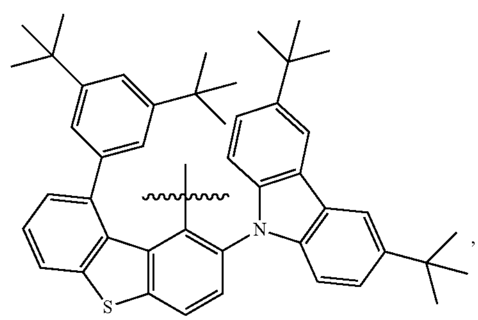
R315
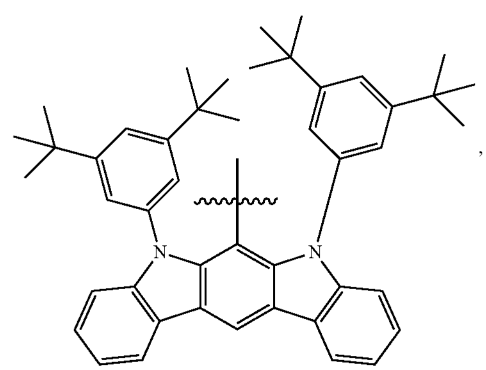

-continued
R316
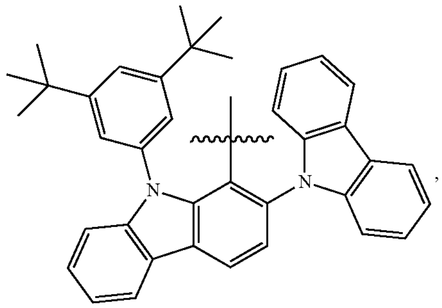
R317
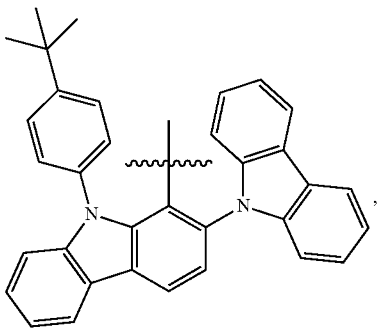
R318
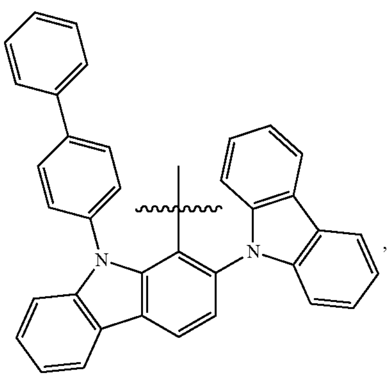
R319
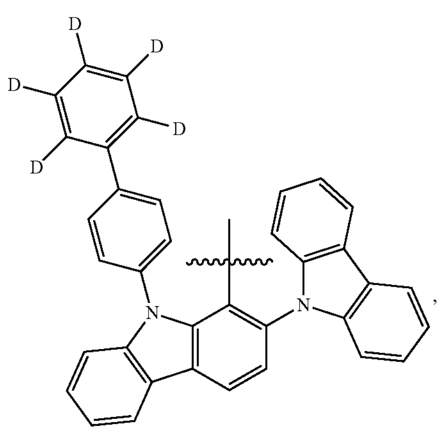
-continued
R320
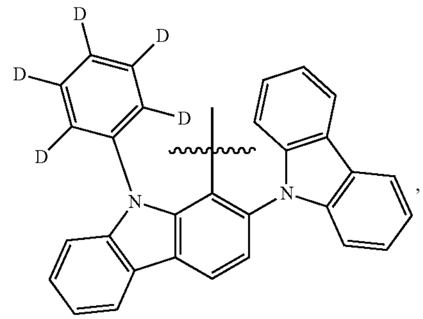
R321
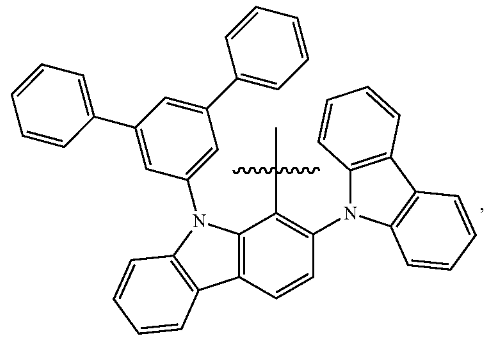
R322
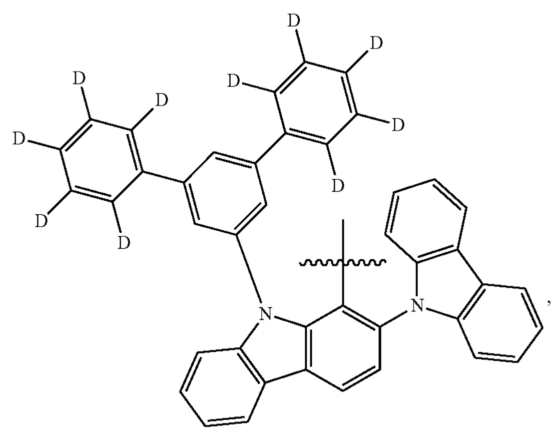
R323
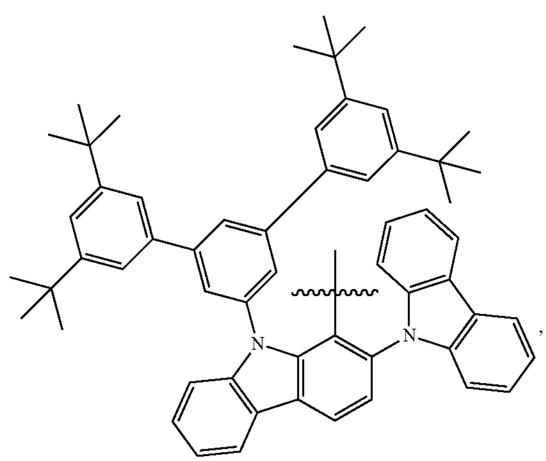

-continued
R324
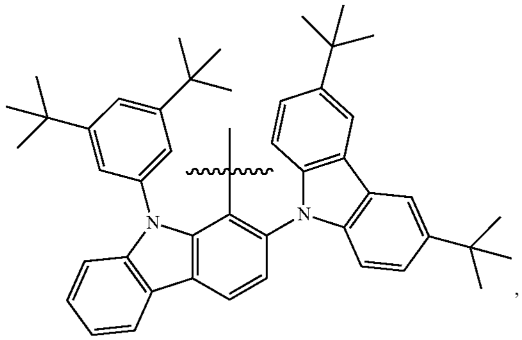
R325
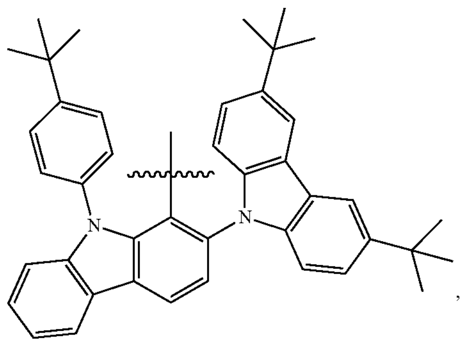
R326
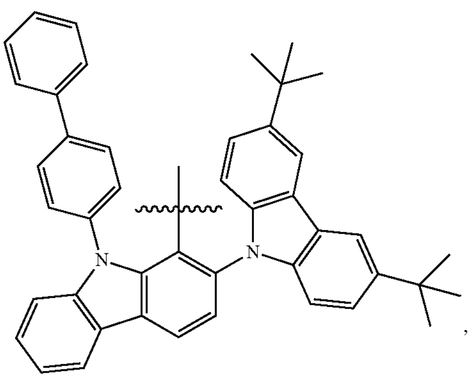
R327
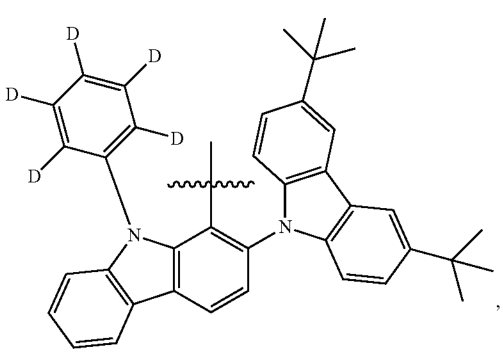
-continued
R328
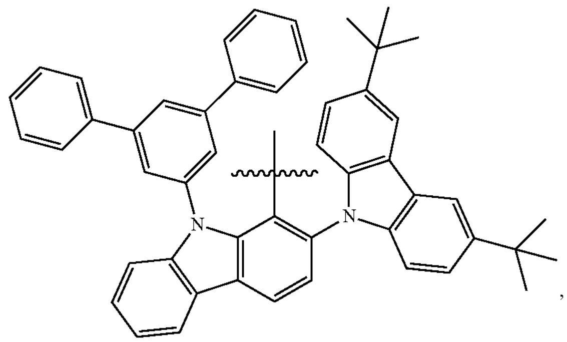
R329
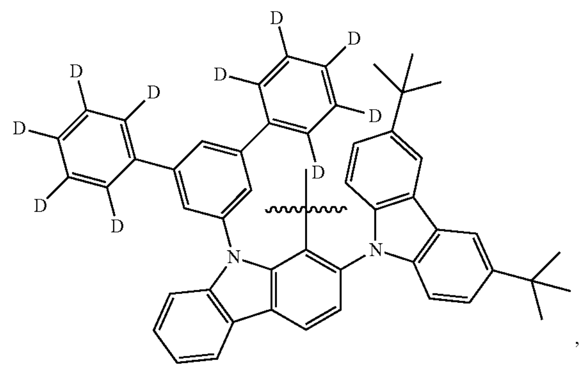
R330
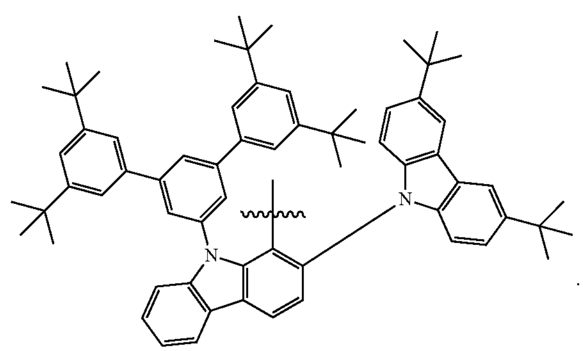
20. The compound of claim 1, wherein R is selected from the group consisting of
R20
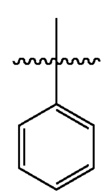

-continued
R21
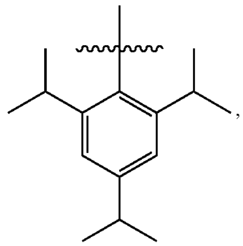
R22
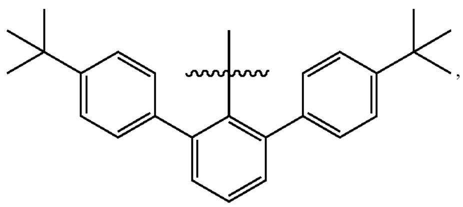
R23
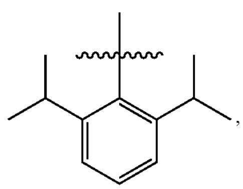
R24
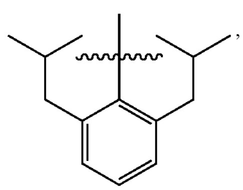
R25
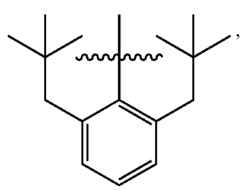
R27
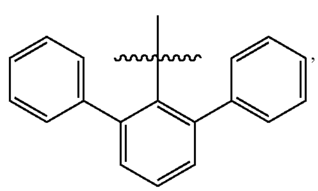
R28
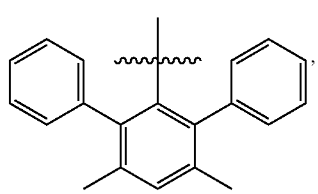
-continued
R29
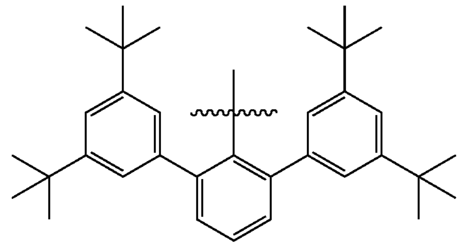
R30
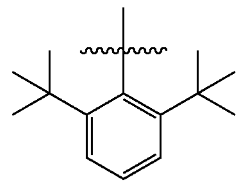
R35
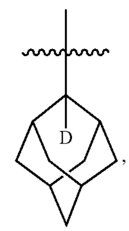
R36
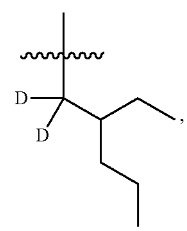
R37
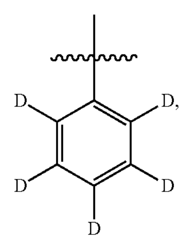
R38
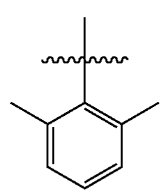
R39
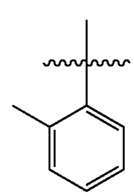

R40
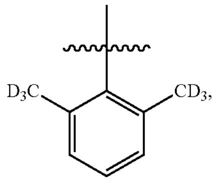
R41
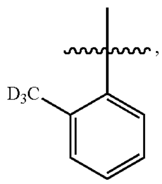
R42
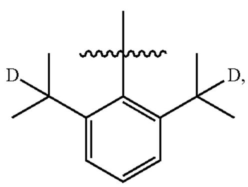
R43
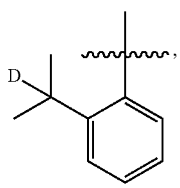
R44
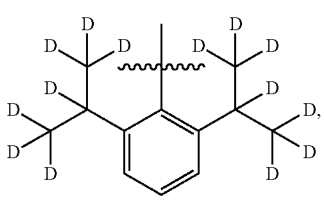
R45
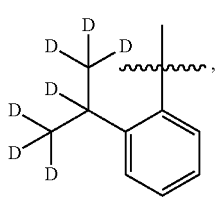
R46
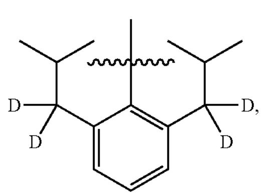
R47
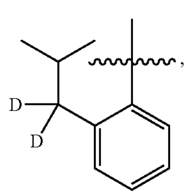
R48
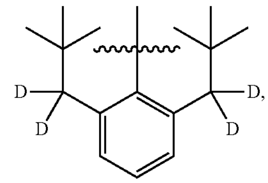
R49
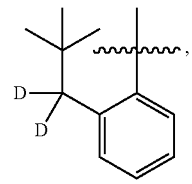
R52
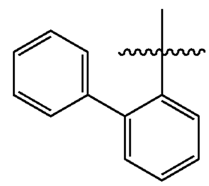
R53
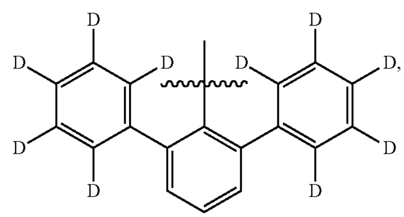
R54
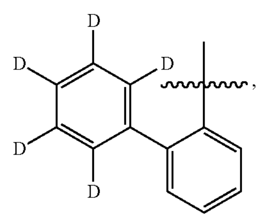
R55
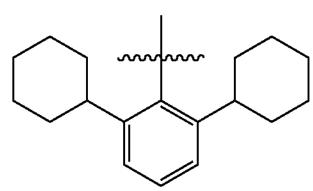
R56
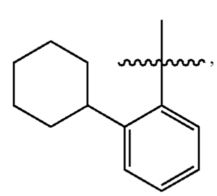
R57
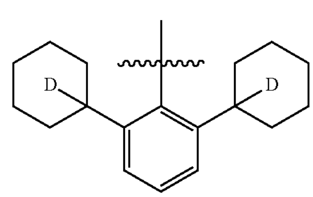

-continued
R58
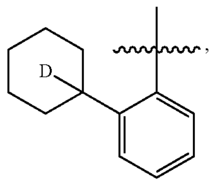
R59
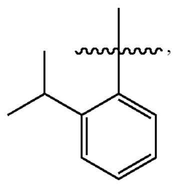
R60
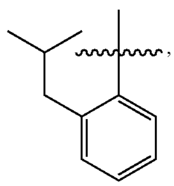
R61
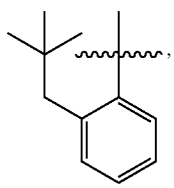
R62
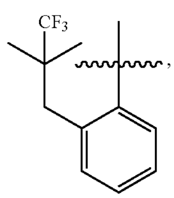
R63
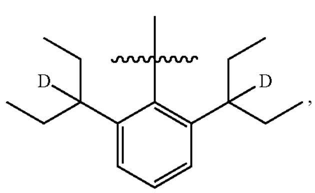
R64
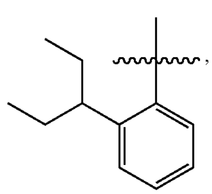
R65
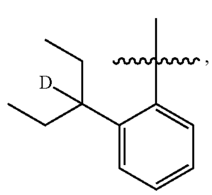
-continued
R66
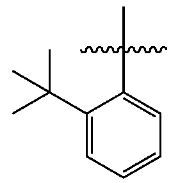
R67
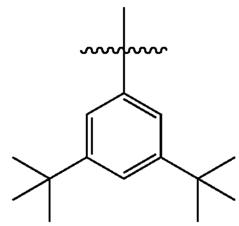
R68
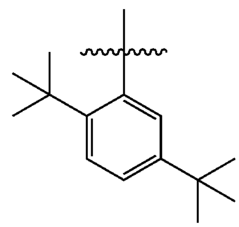
R69
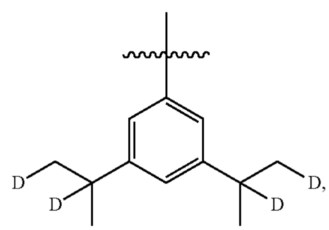
R70
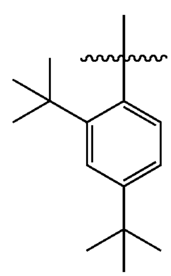
R71
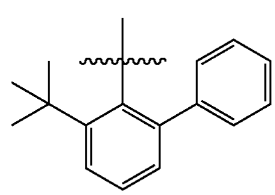
R72
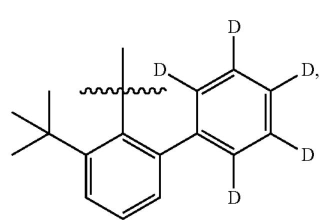

-continued
R73
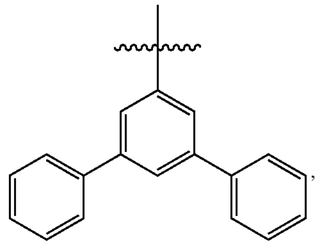
R74
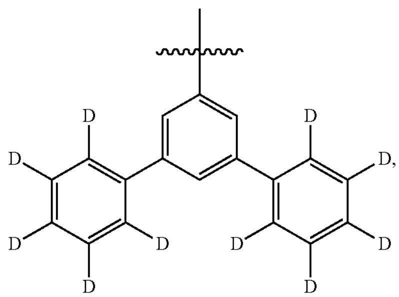
R89
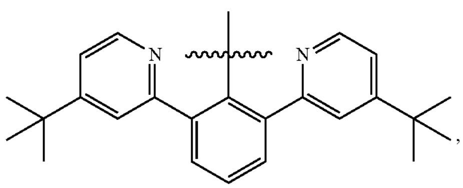
R90
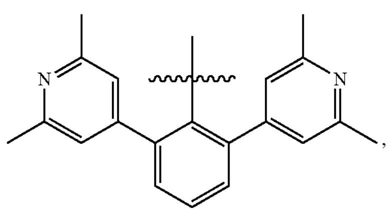
R93
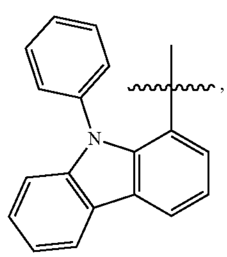
R94
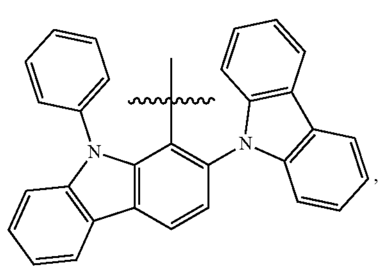
-continued
R95
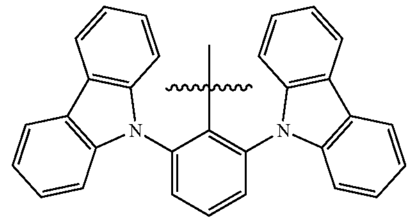
R96
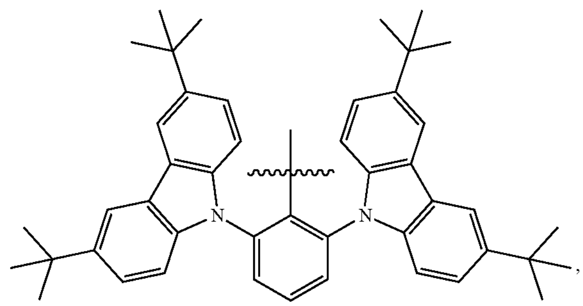
R97
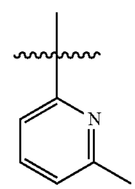
R98
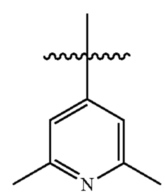
R99
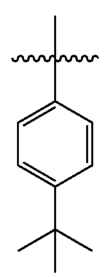
R100
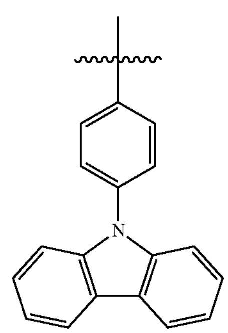

-continued
R101
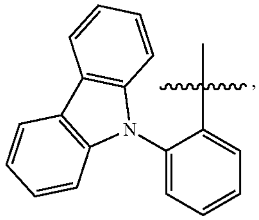
R102
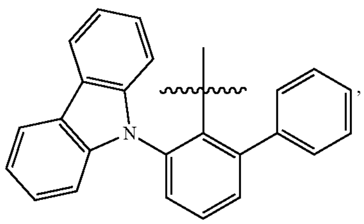
R103
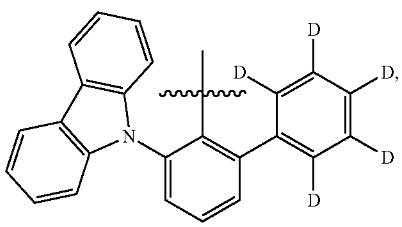
R104
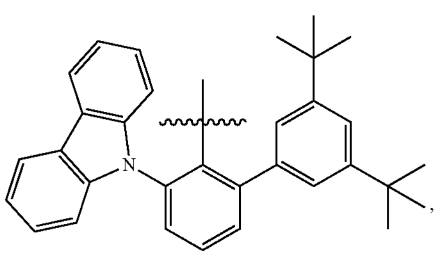
R105
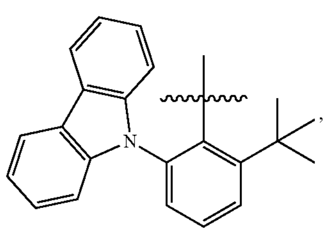
R106
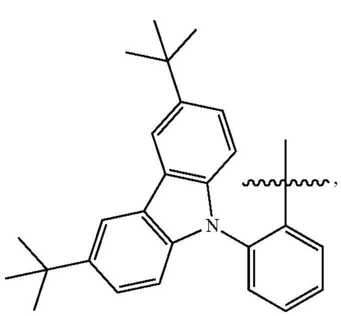
-continued
R107
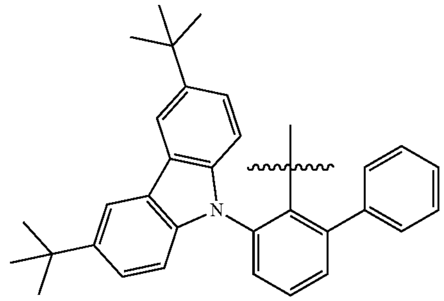
R108
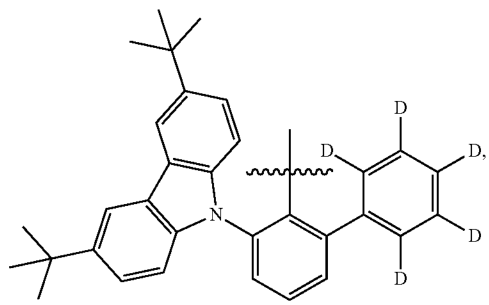
R109
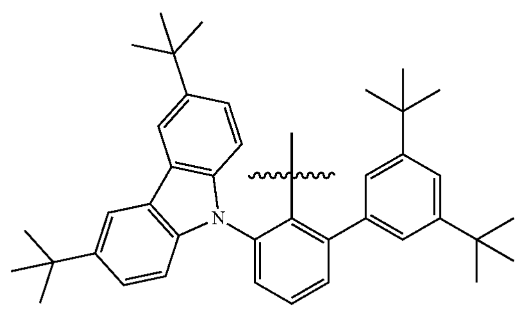
R110
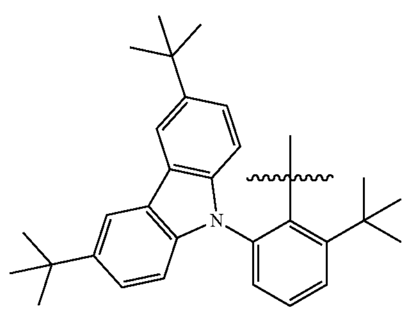
R111
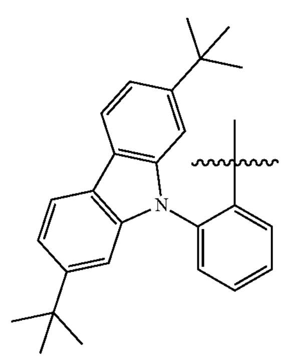

-continued
R112
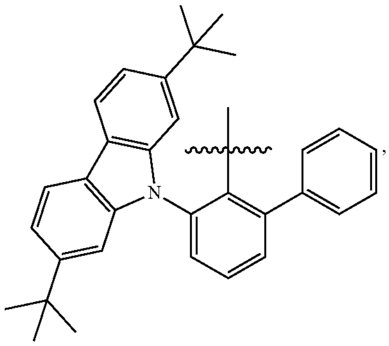
R113
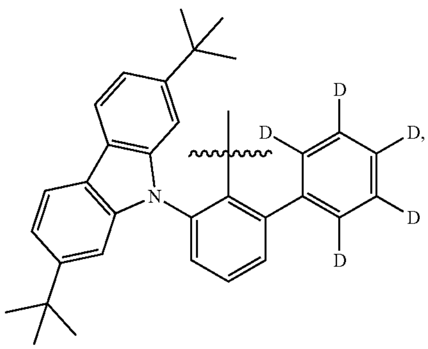
R114
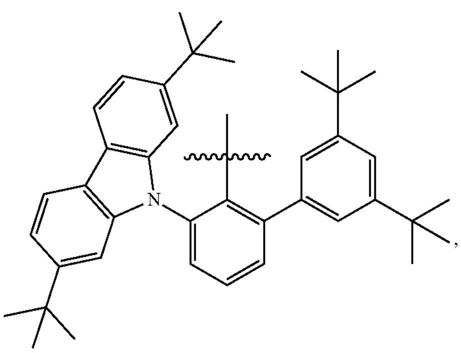
R115
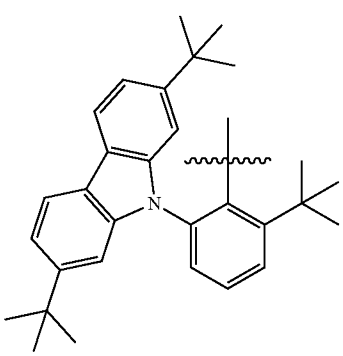
-continued
R116
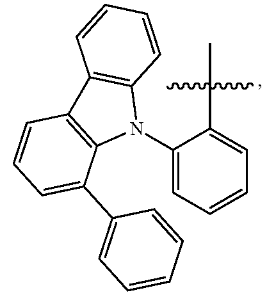
R117
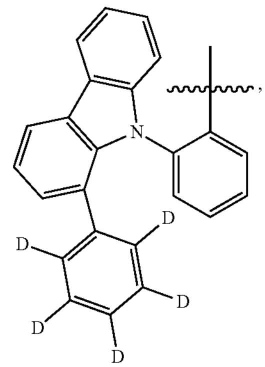
R118
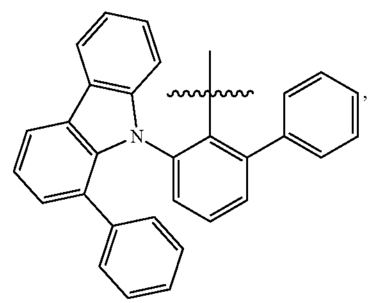
R119
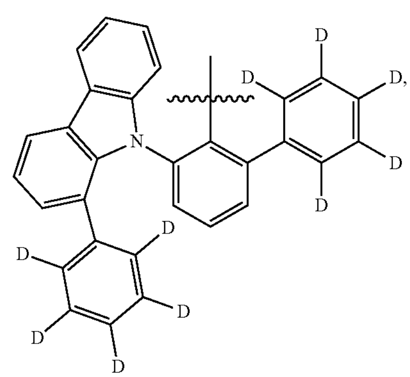

-continued
R120
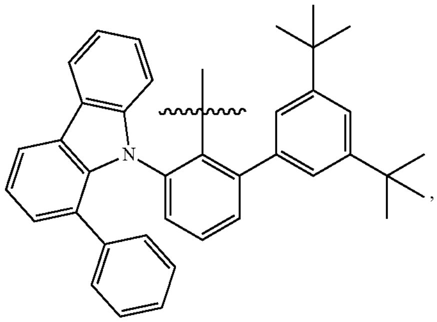
R121
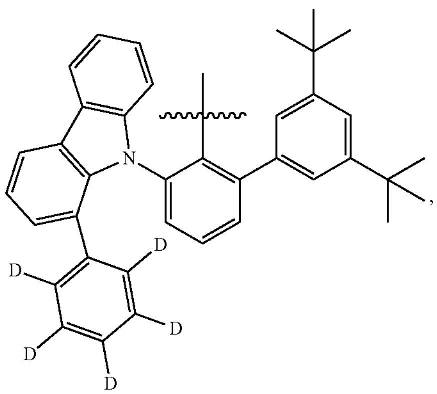
R122
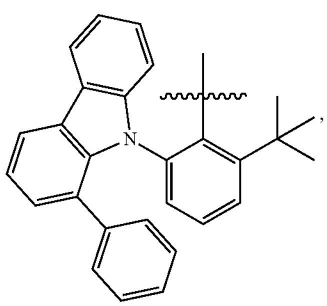
R123
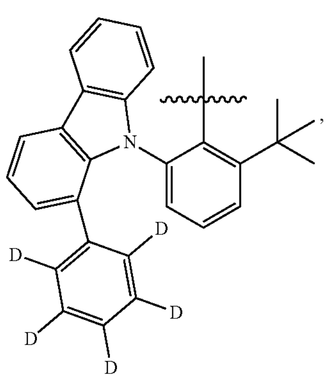
-continued
R124
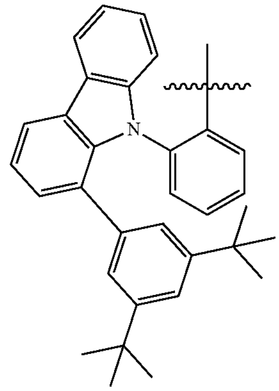
R125
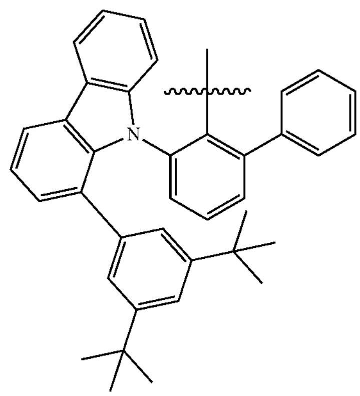
R126
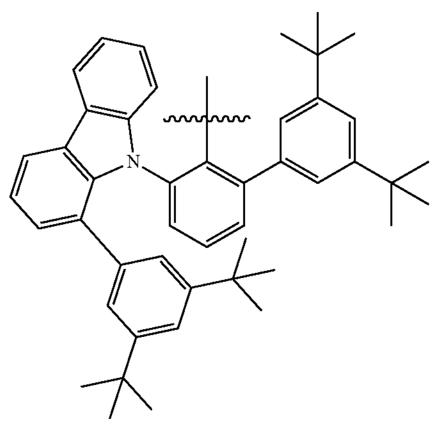
R127
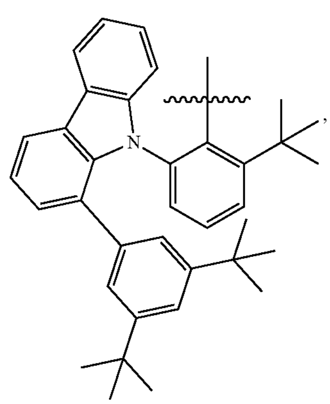

-continued
R128
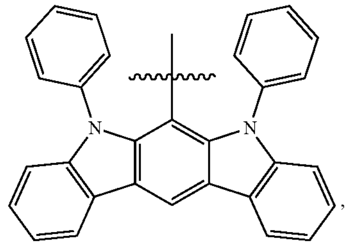
R129
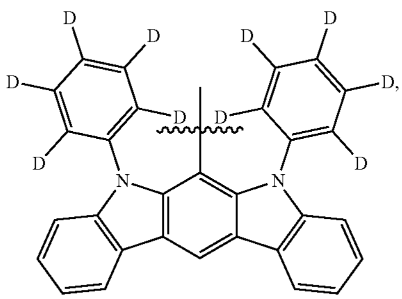
R130
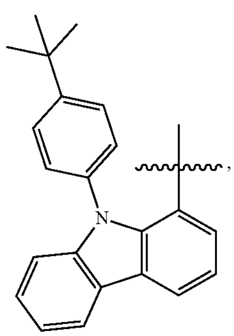
R131
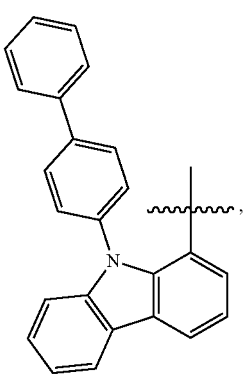
-continued
R132
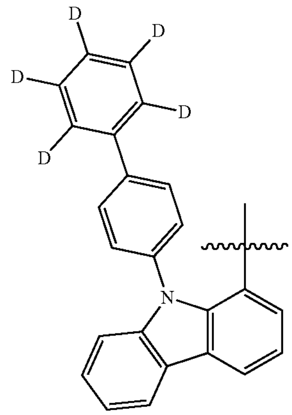
R133
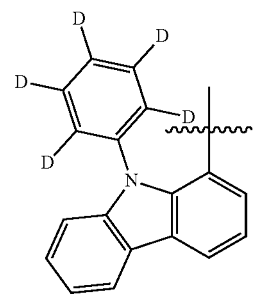
R134
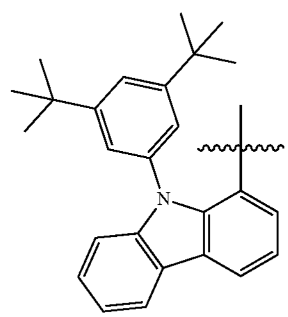
R135
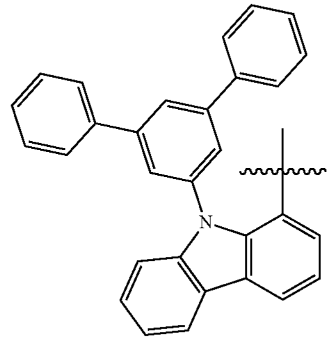

R136
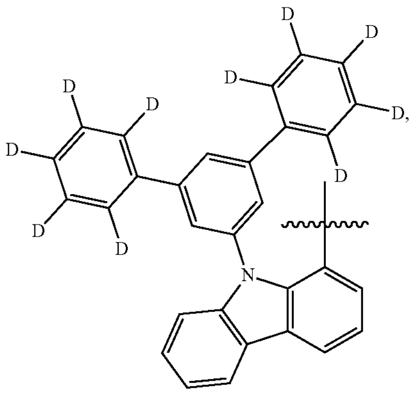
R137
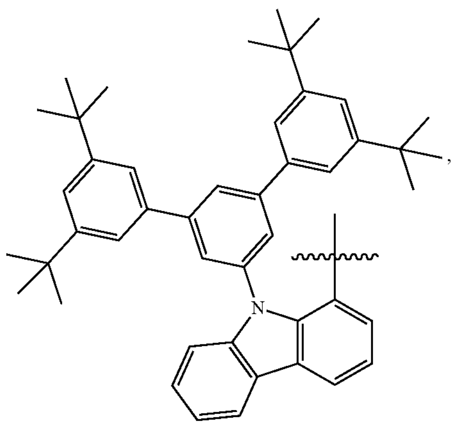
R138
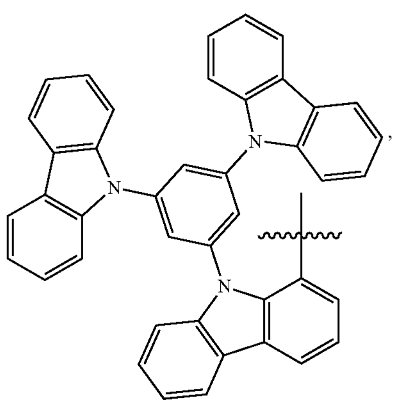
R139
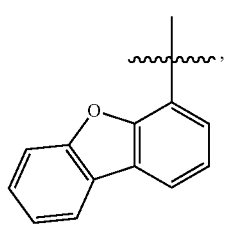
R140
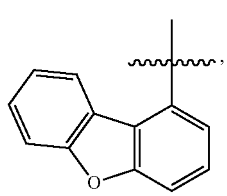
R141
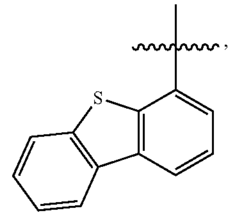
R142
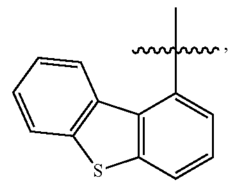
R143
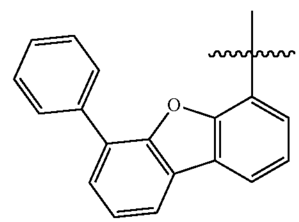
R144
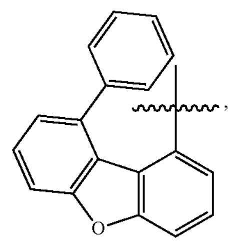
R145
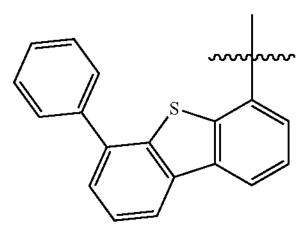
R146
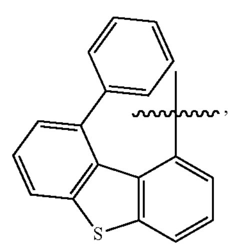
R147
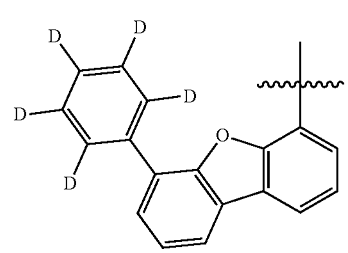

-continued
R148
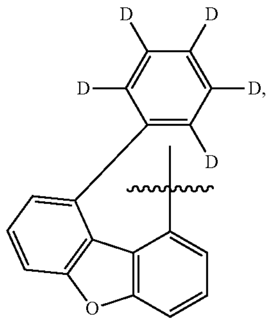
R149
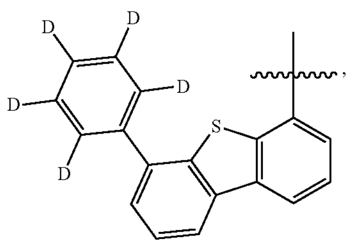
R150
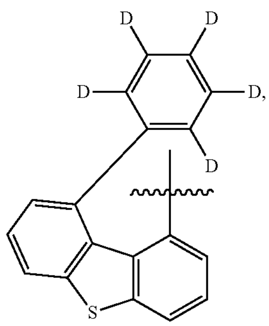
R151
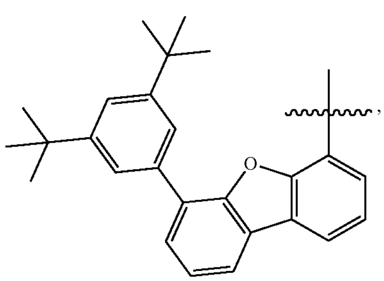
R152
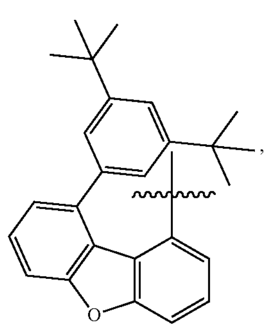
R153
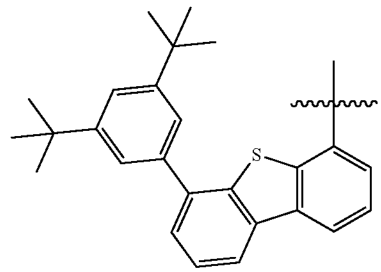
R154
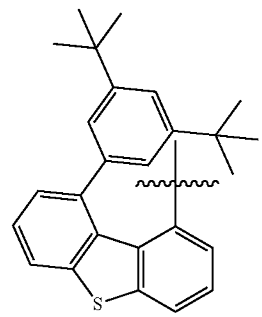
R155
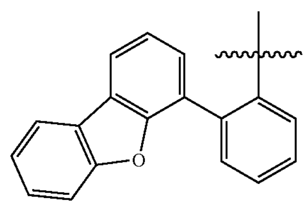
R156
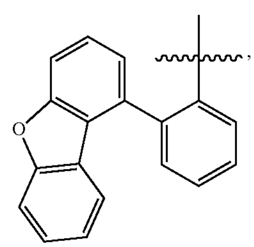
R157
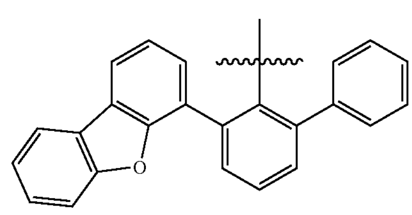
R158
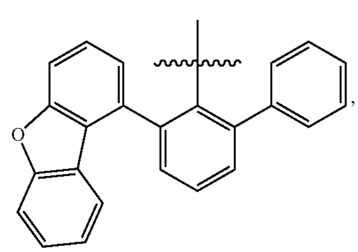

-continued
R159
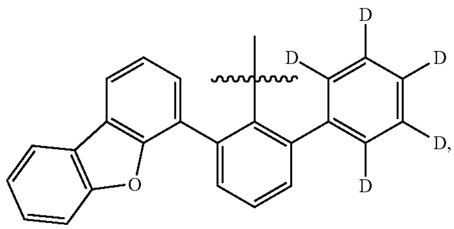
R160
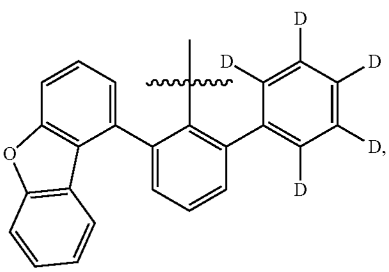
R161
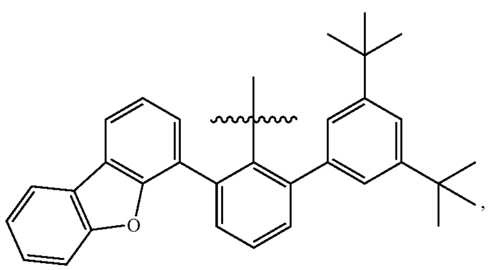
R162
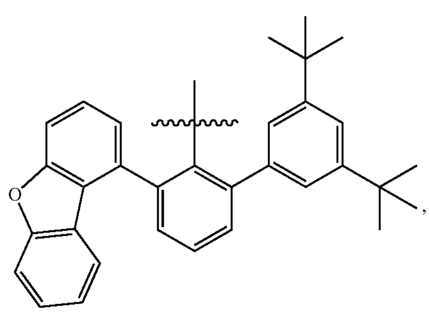
R163
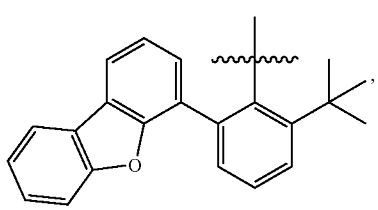
R164
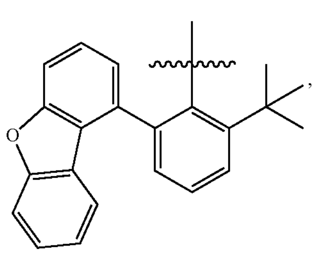
-continued
R165
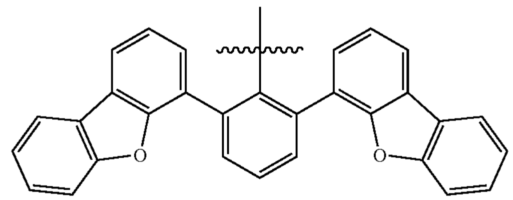
R166
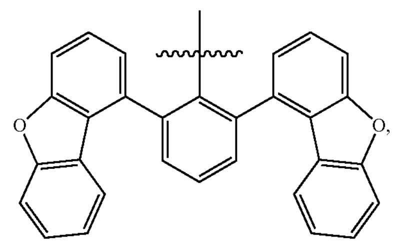
R167
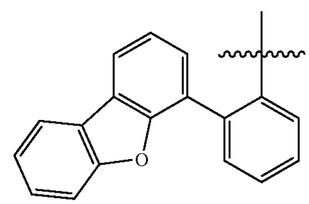
R168
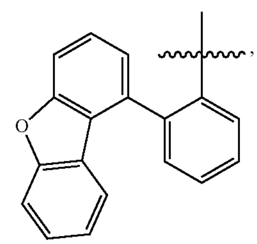
R169
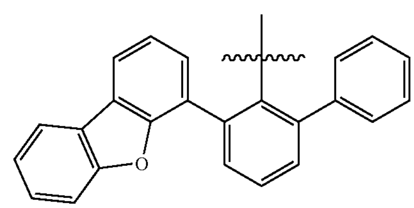
R170
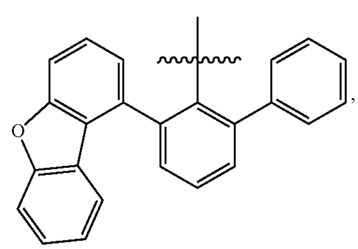
R171
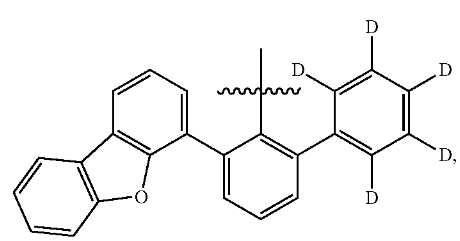

-continued
R172
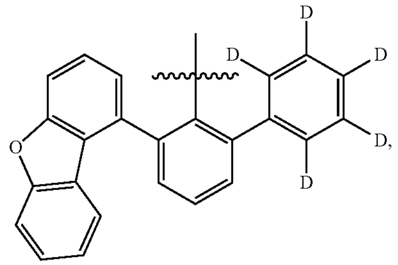
R173
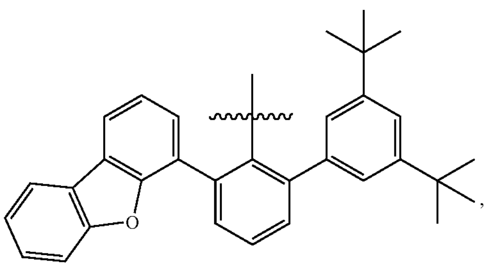
R174
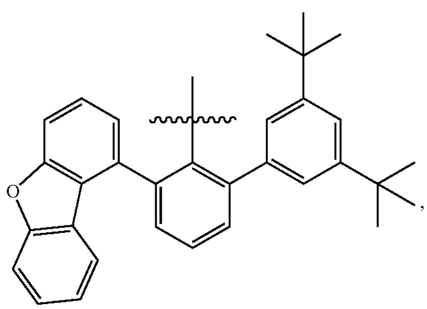
R175
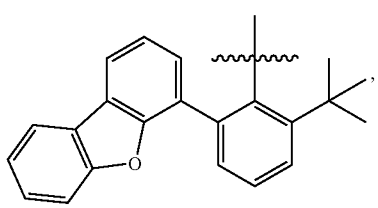
R176
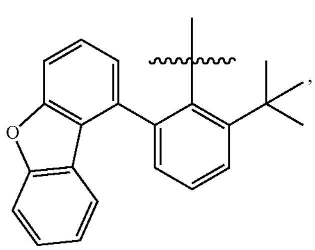
R177
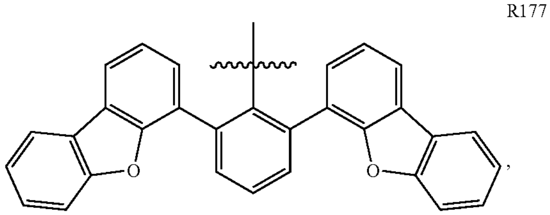
-continued
R178
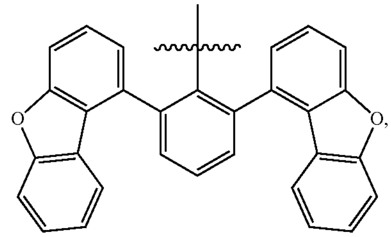
R179
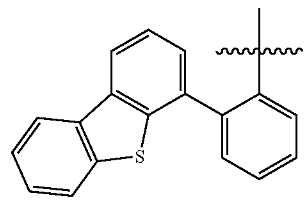
R180
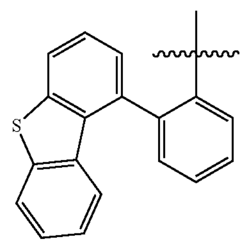
R181
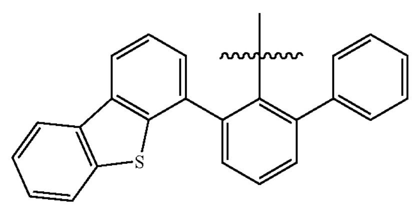
R182
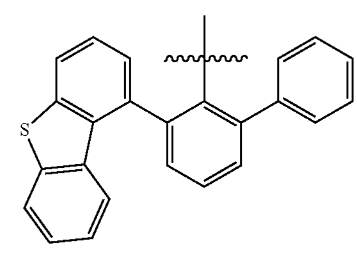
R183
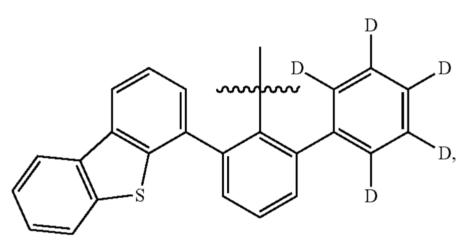

-continued
R184
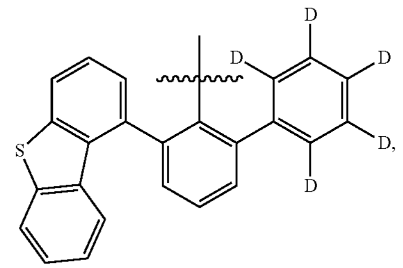
R185
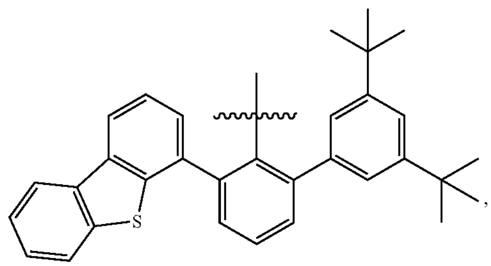
R186
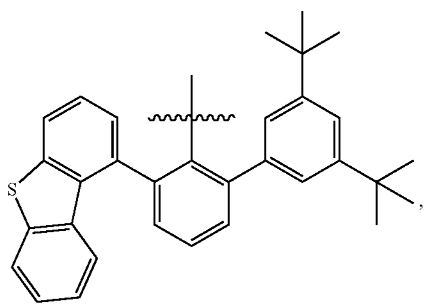
R187
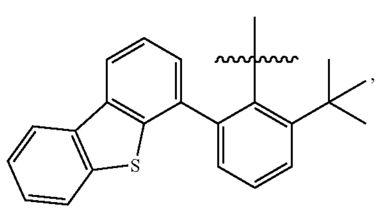
R188
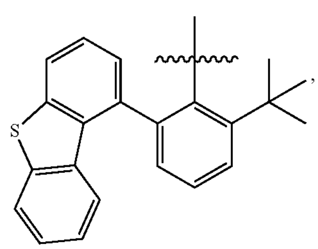
R189
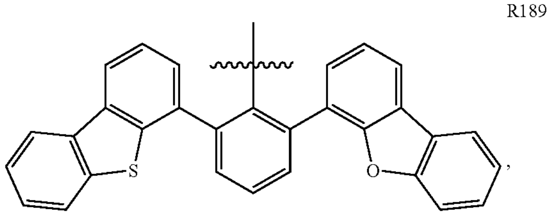
-continued
R190
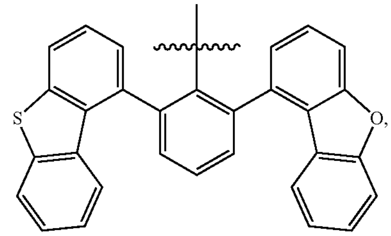
R191
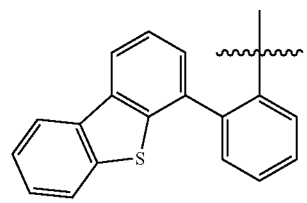
R192
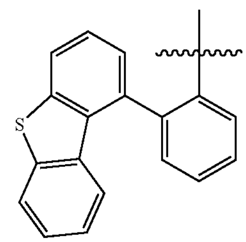
R193
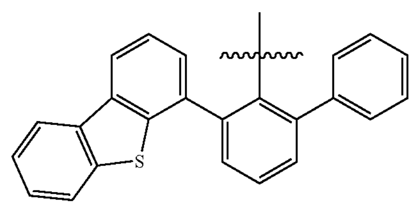
R194
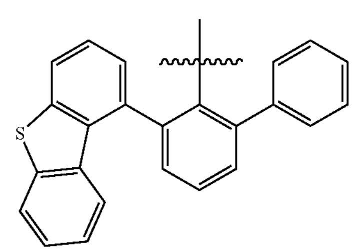
R195
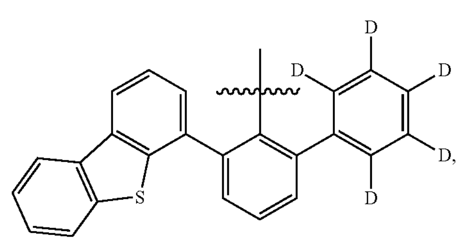

R196
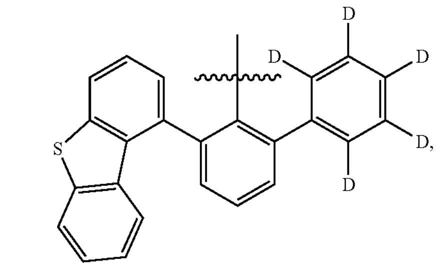
R197
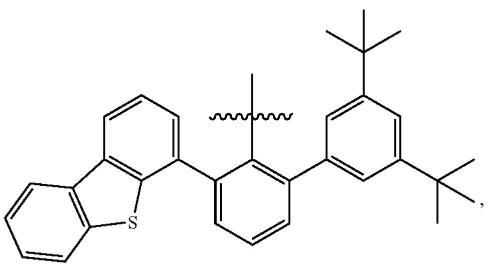
R198
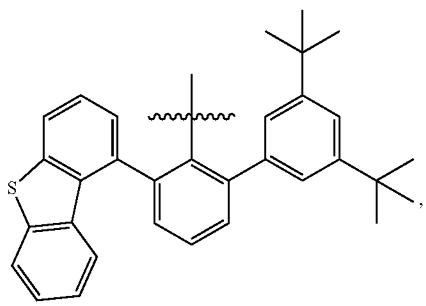
R199
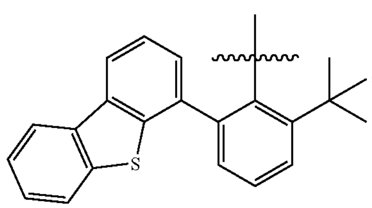
R200
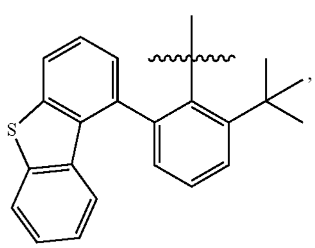
R201
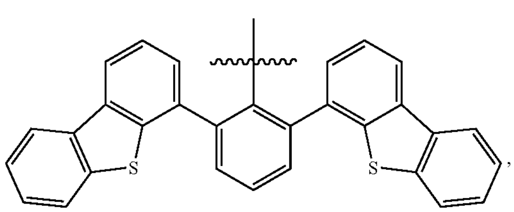
R202
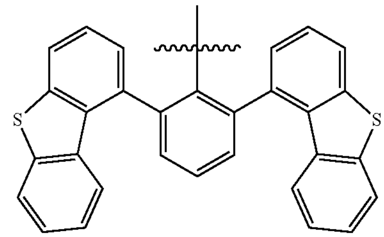
R203
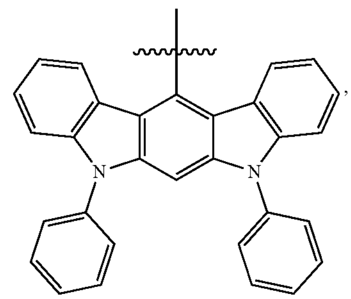
R204
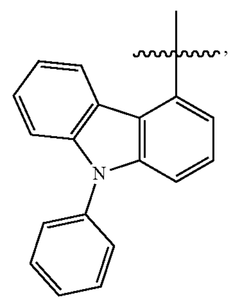
R205
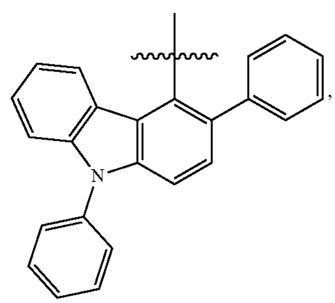
R206
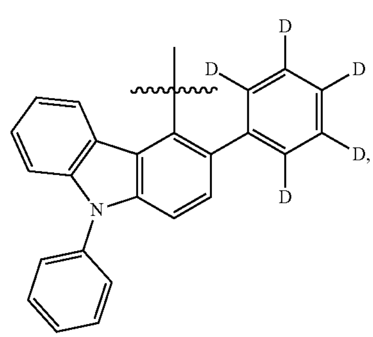

R207
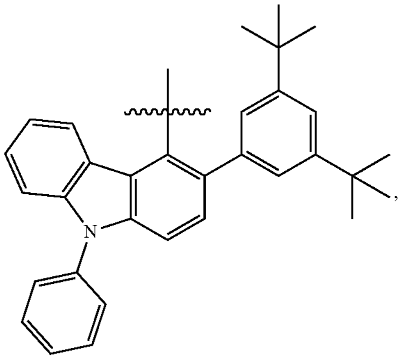
R208
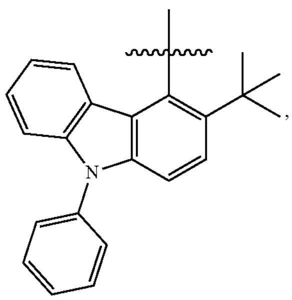
R209
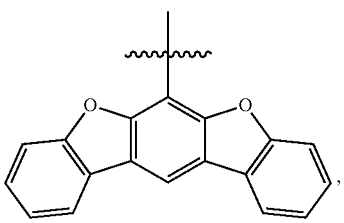
R210
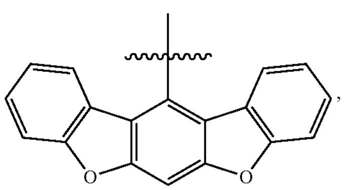
R211
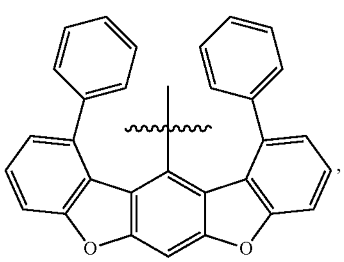
R212
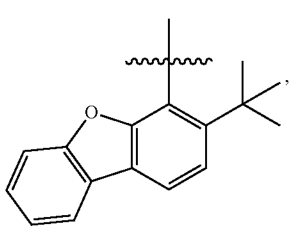
R213
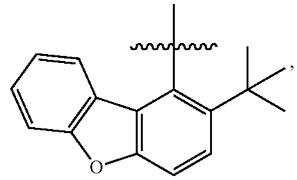
R214
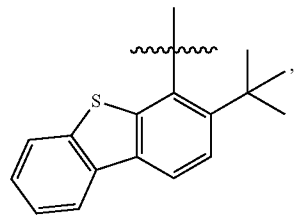
R215
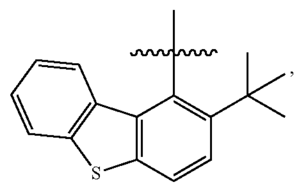
R216
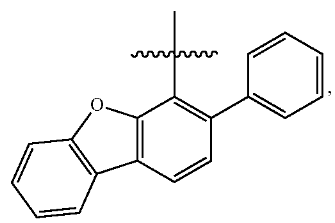
R217
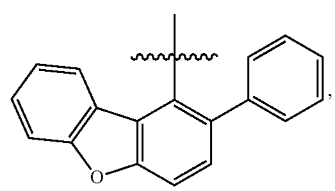
R218
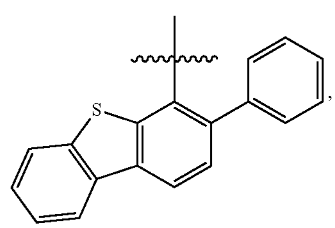
R219
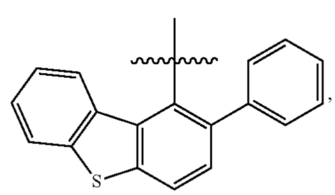

R220
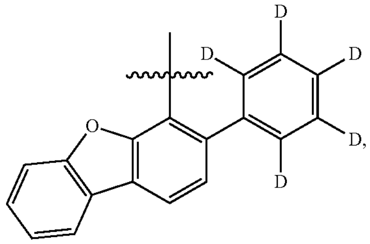
R221
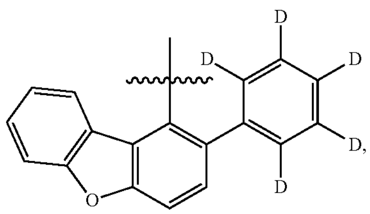
R222
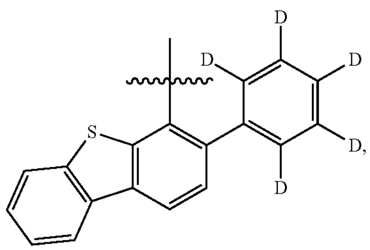
R223
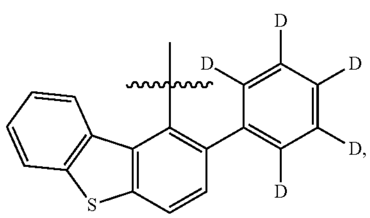
R224
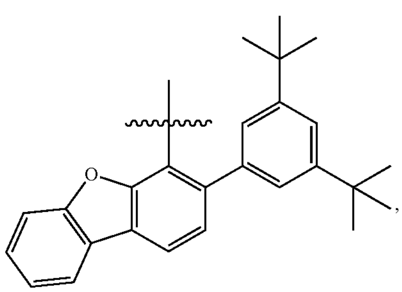
R225
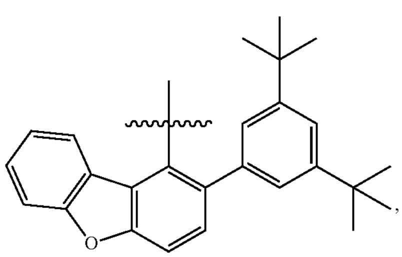
R226
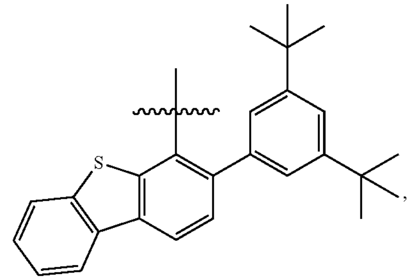
R227
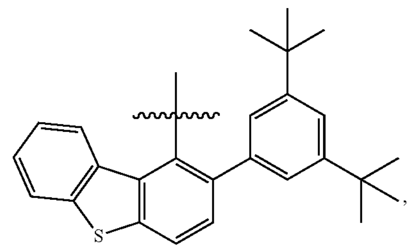
R228
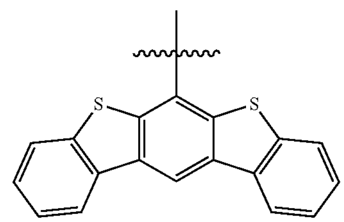
R229
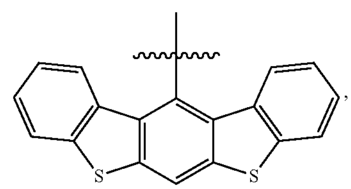
R230
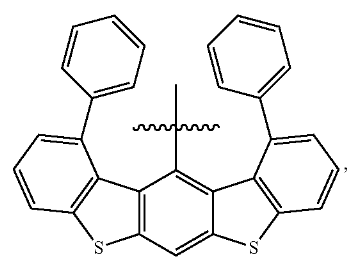
R231
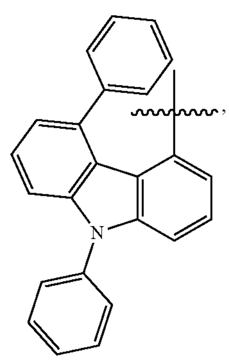

-continued
R232
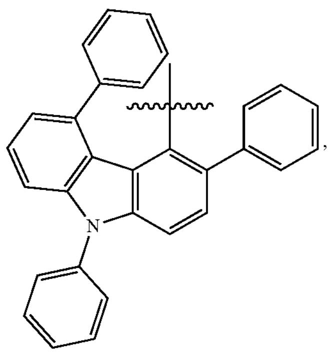
R233
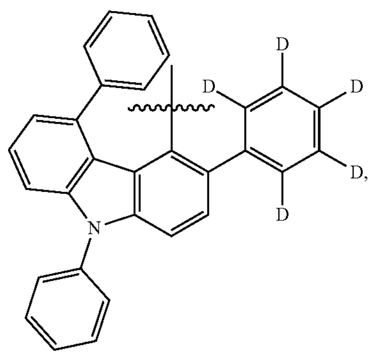
R234
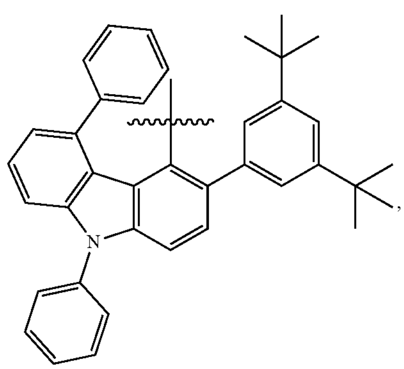
R235
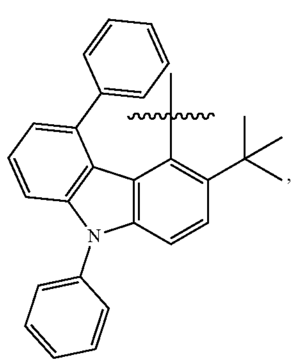
-continued
R236
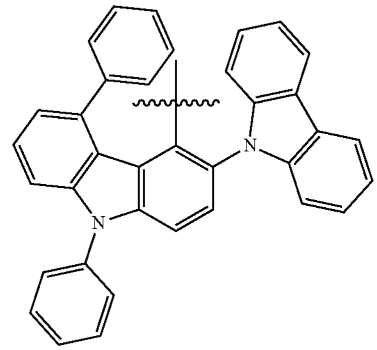
R237
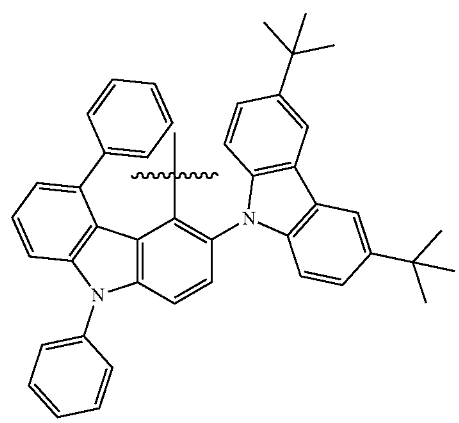
R238
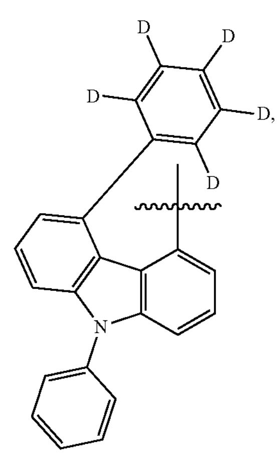

R239
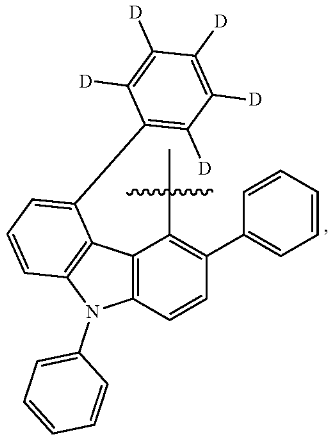
R240
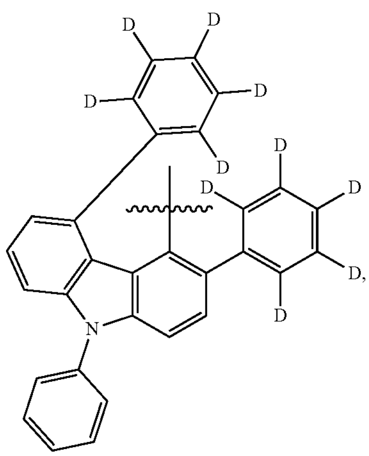
R241
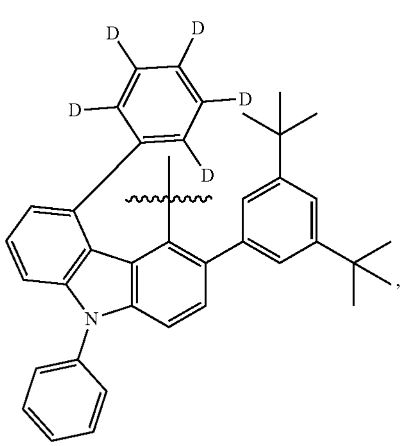
R242
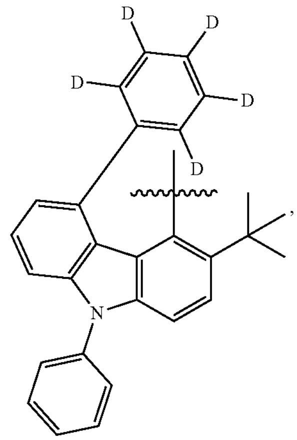
R243
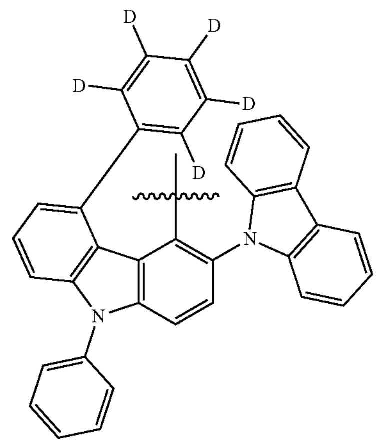
R244
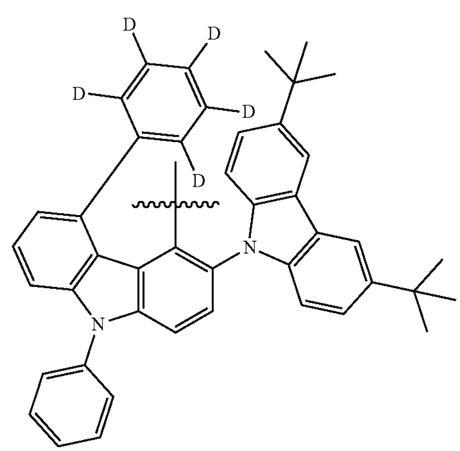

R245
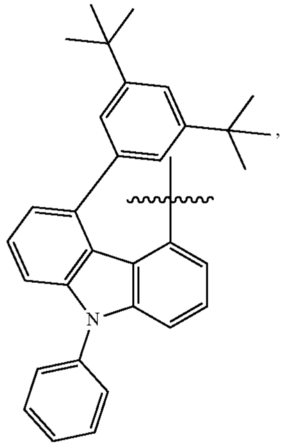
R246
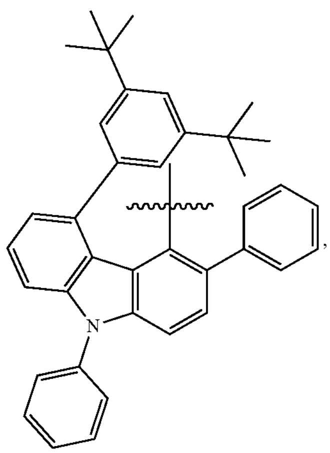
R247
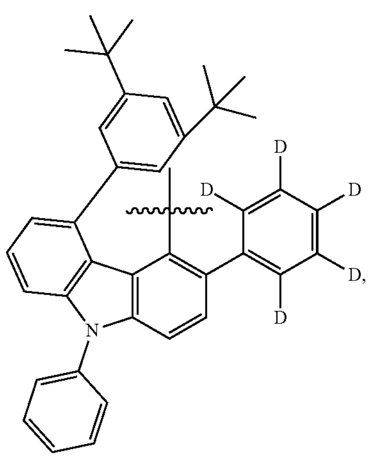
R248
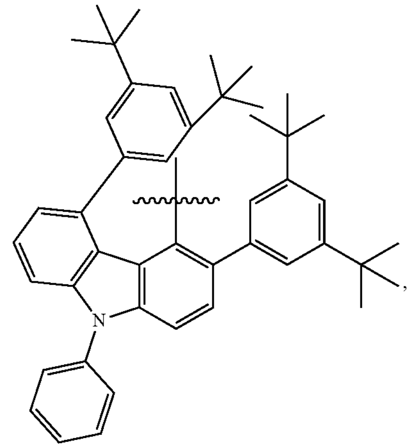
R249
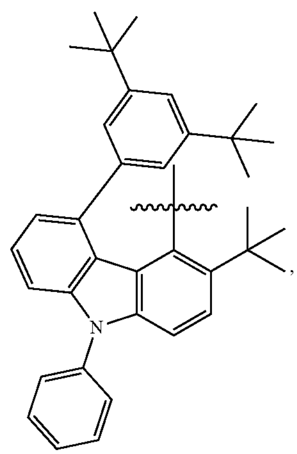
R250
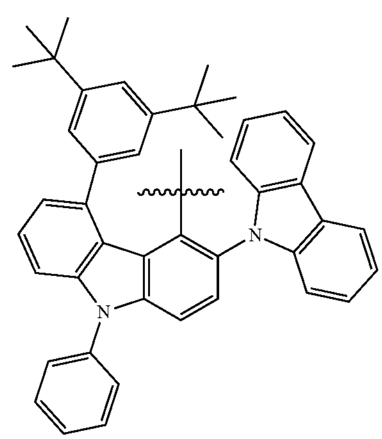

R251
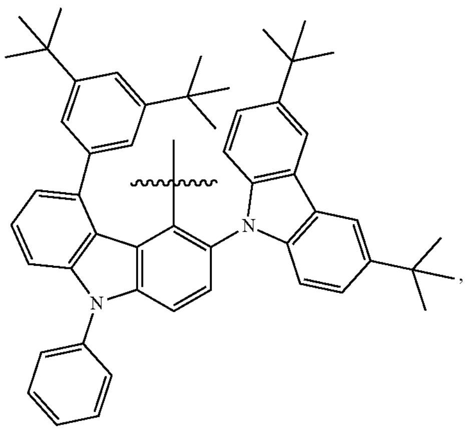
R252
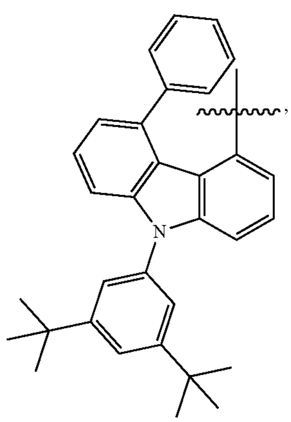
R253
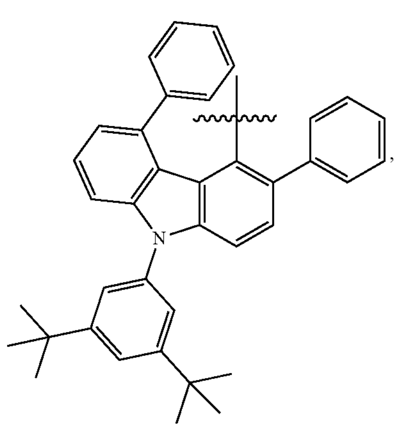
R254
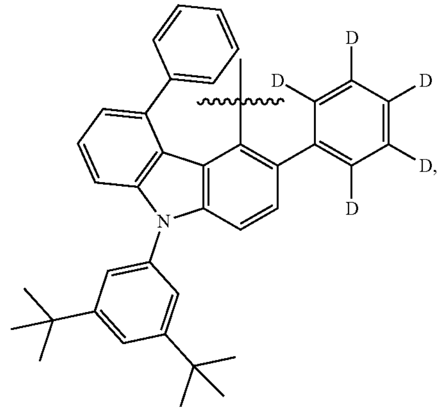
R255
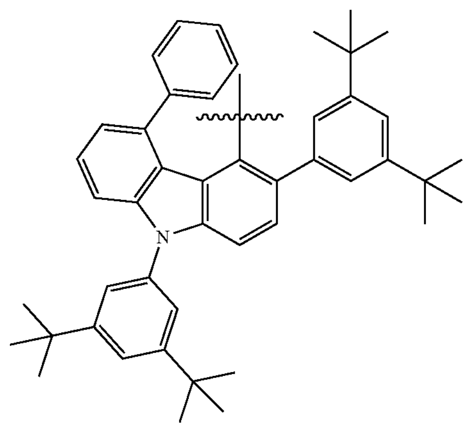
R256
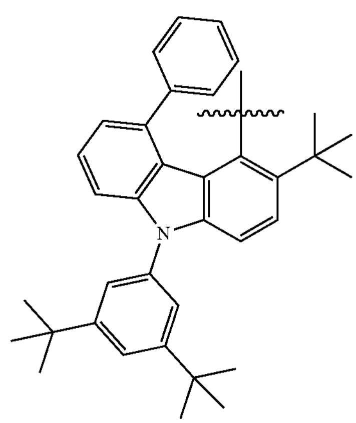

-continued
R257
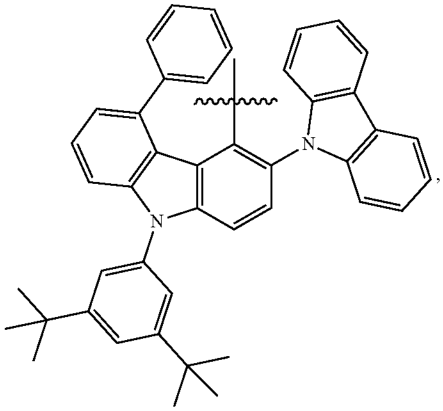
R258
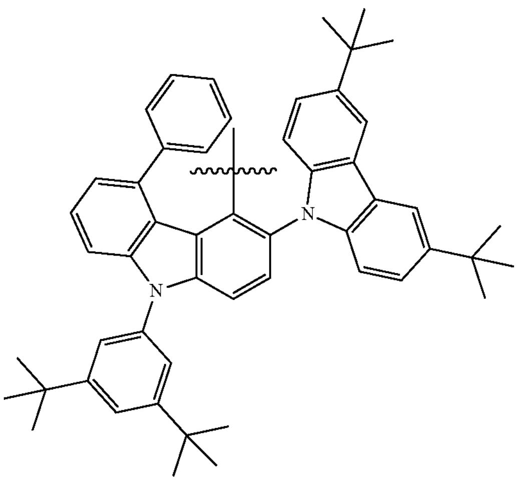
R259
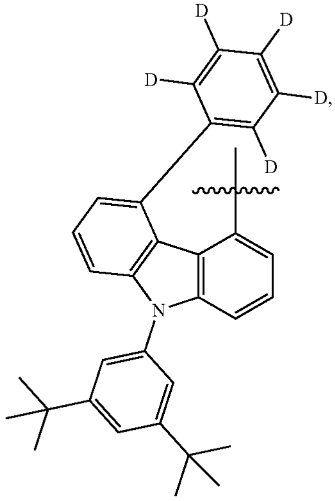
-continued
R260
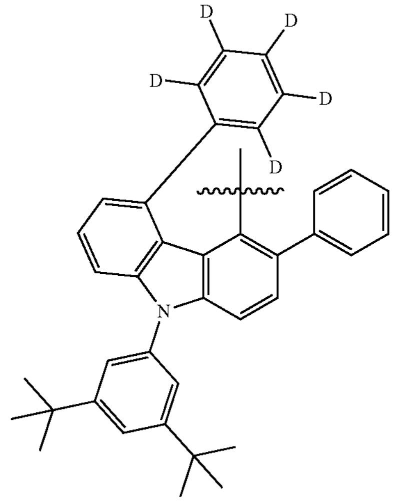
R261
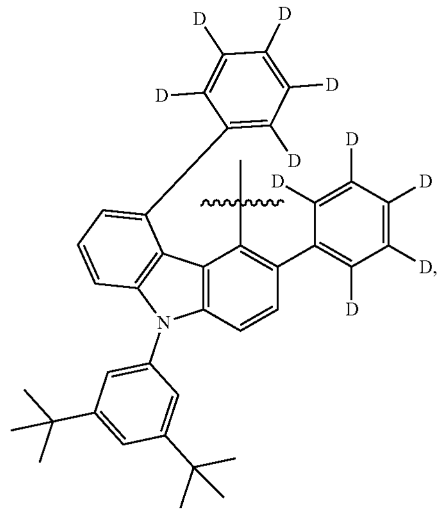
R262
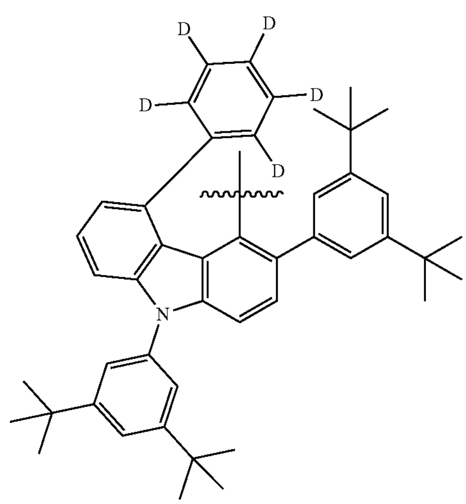

-continued
R263
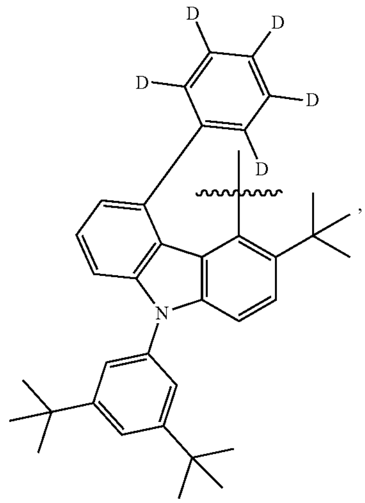
R264
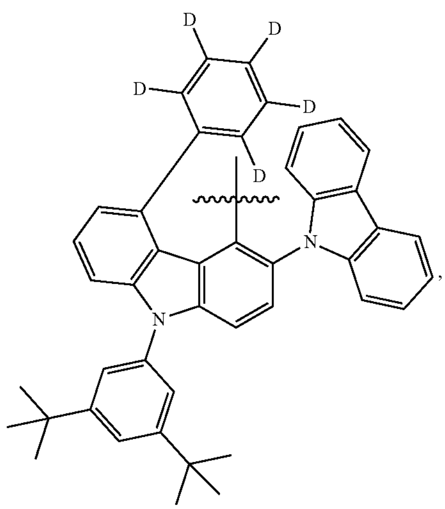
R265
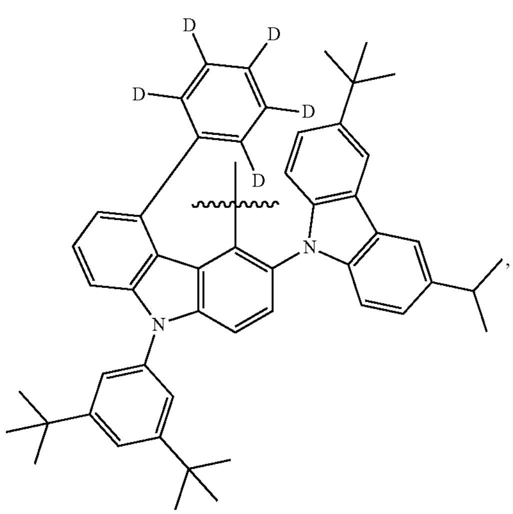
-continued
R266
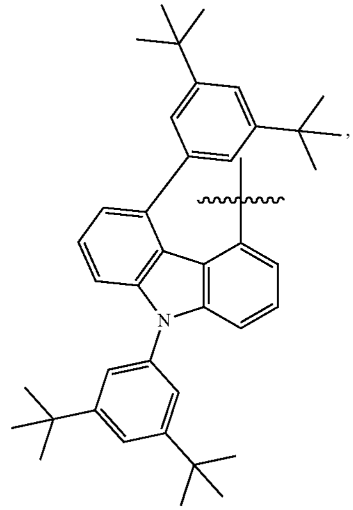
R267
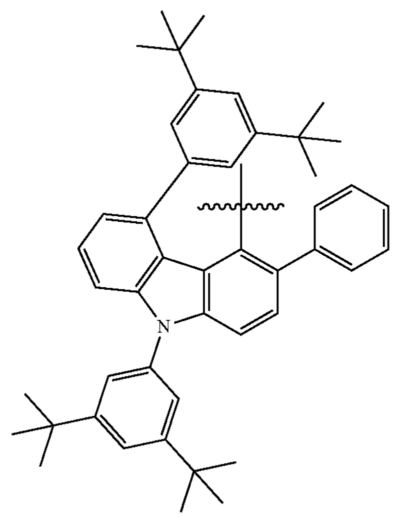
R268
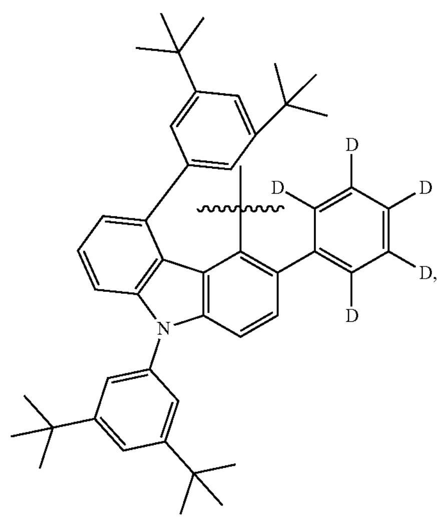

-continued
R269
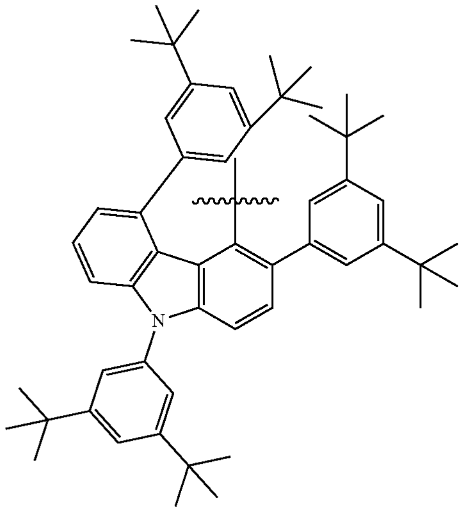
R270
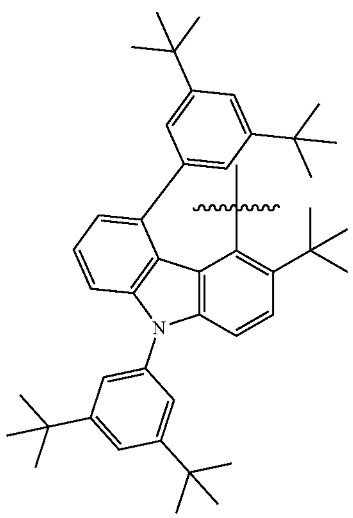
R271
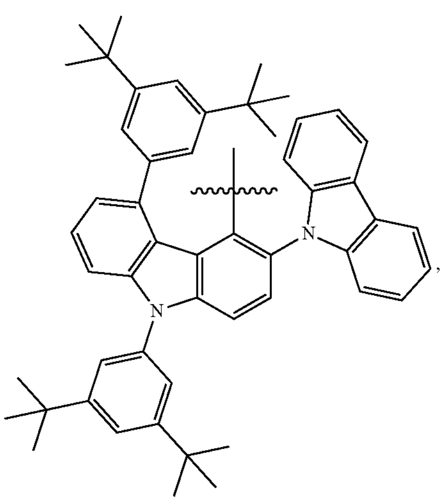
-continued
R272
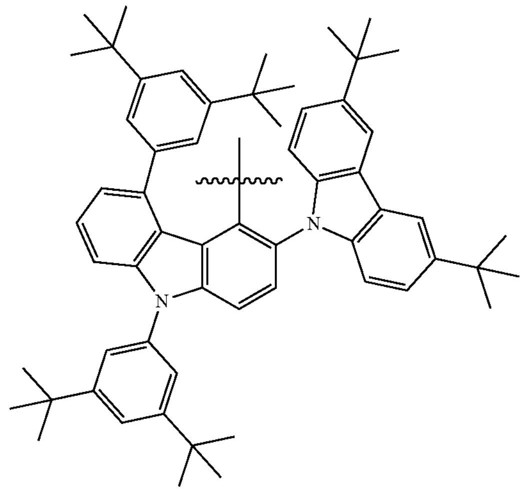
R273
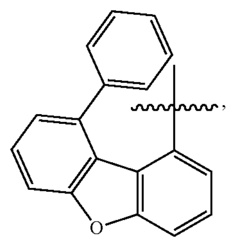
R274
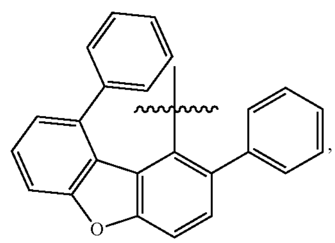
R275
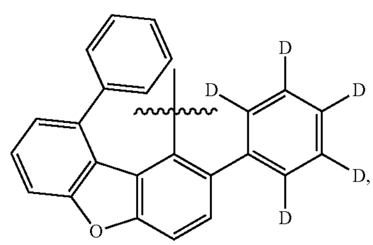
R276
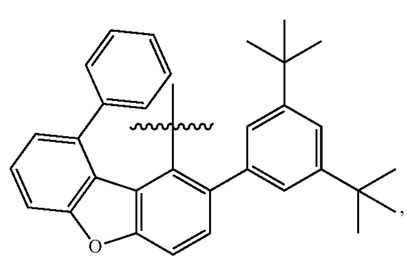

-continued
R277
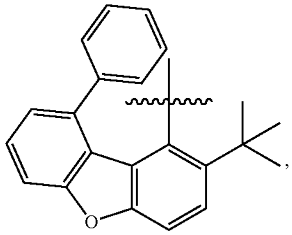
R278
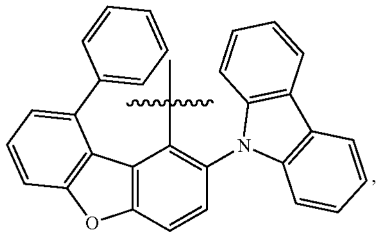
R279
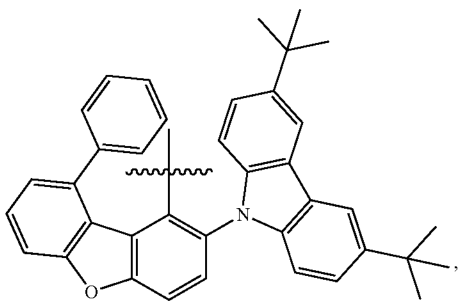
R280
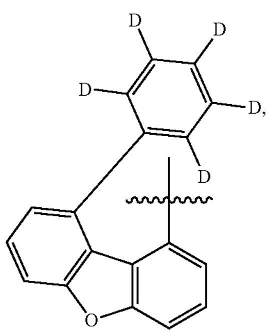
R281
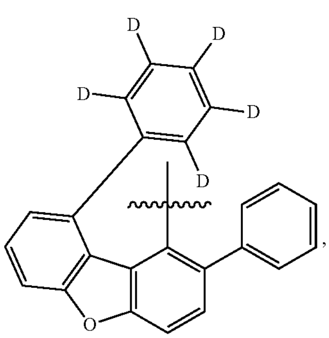
-continued
R282
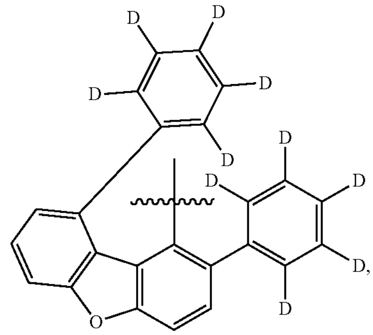
R283
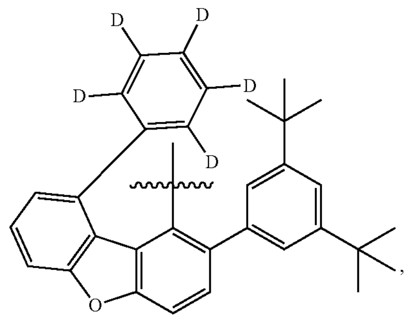
R284
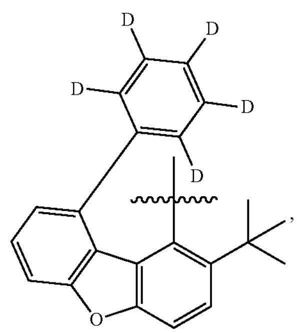
R285
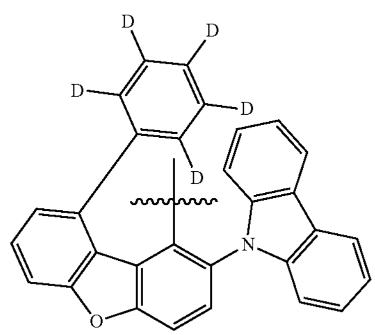
R286
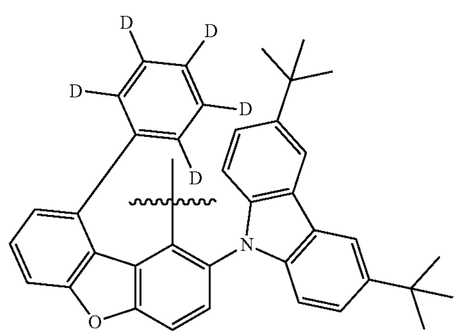

-continued
R287
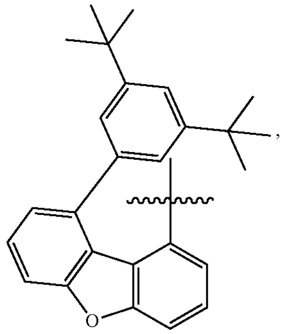
R288
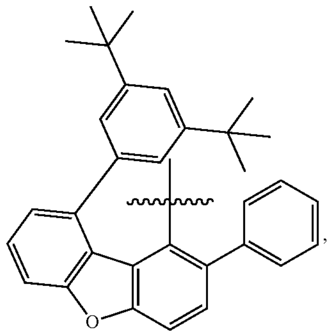
R289
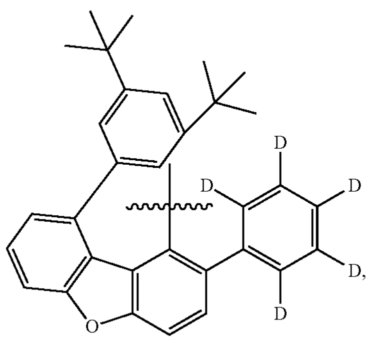
R290
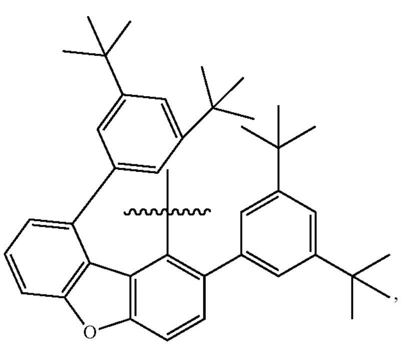
-continued
R291
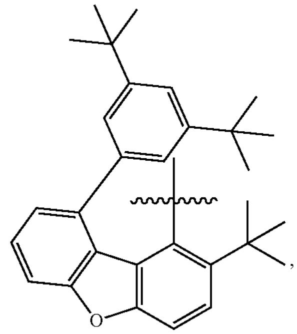
R292
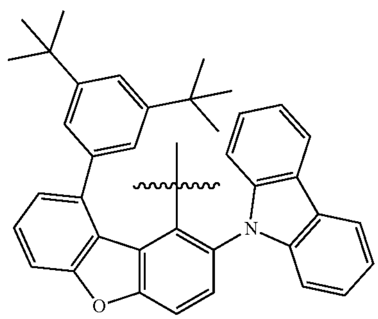
R293
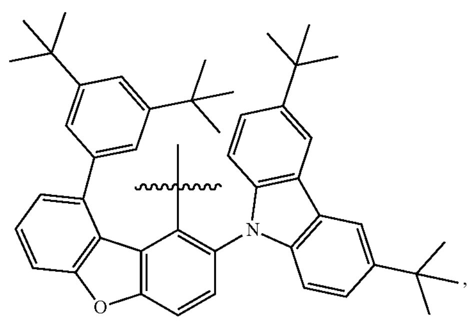
R294
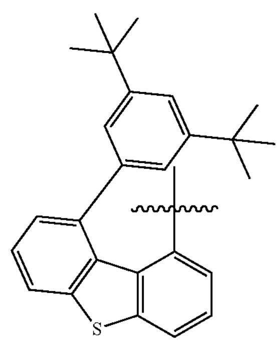

-continued
R295
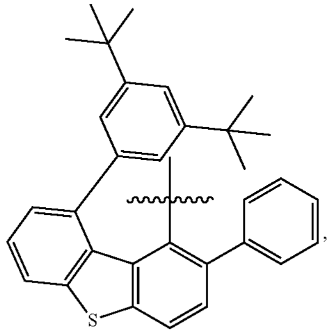
R296
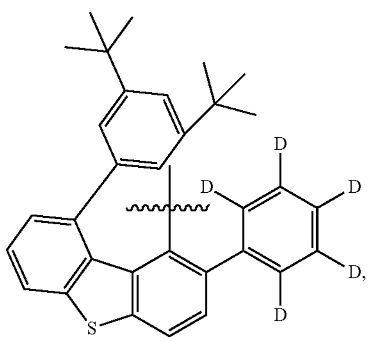
R297
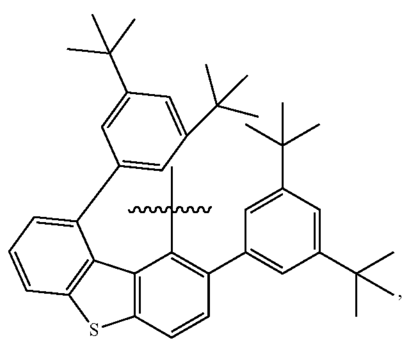
R298
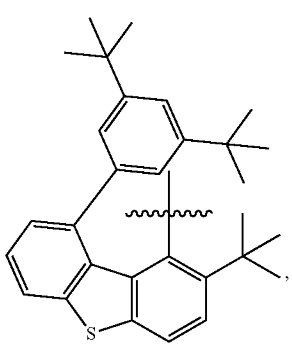
R299
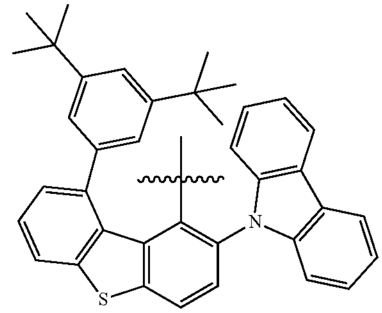
R300
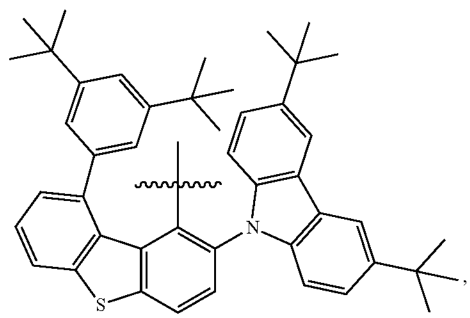
R301
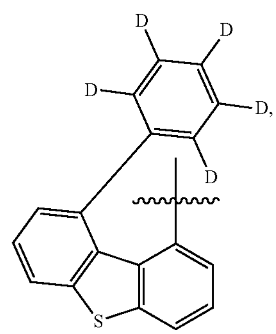
R302
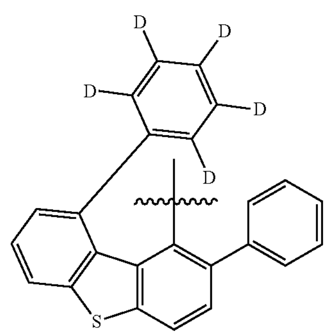
R303
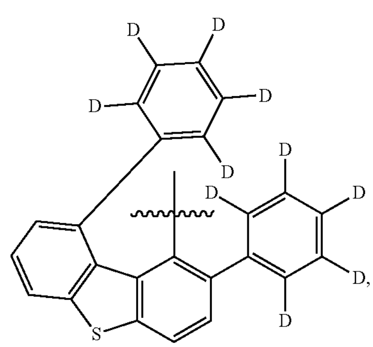

R304
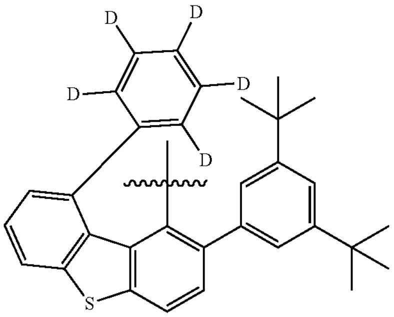
R305
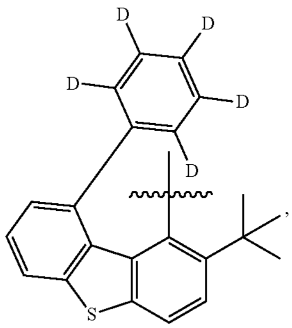
R306
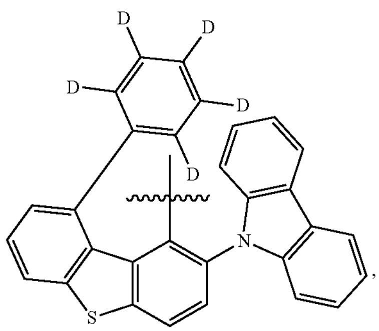
R307
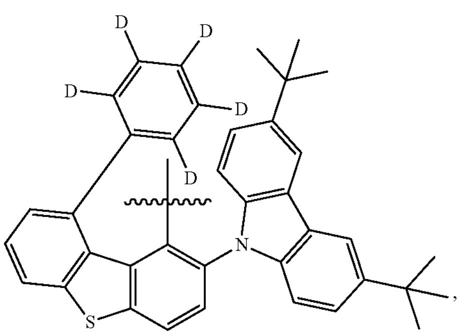
R308
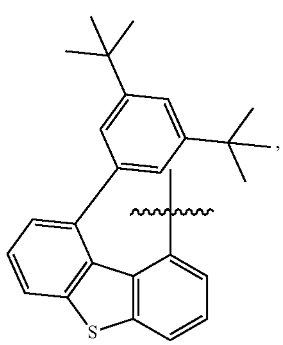
R309
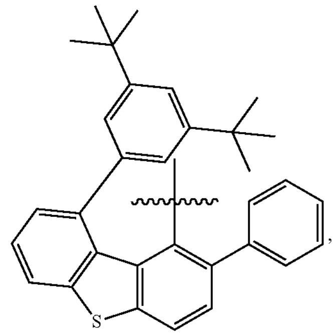
R310
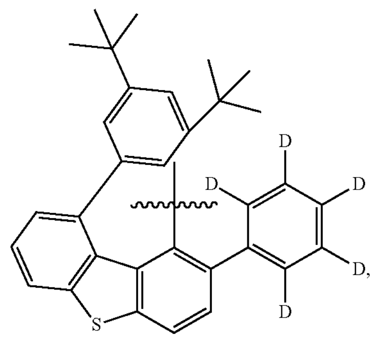
R311
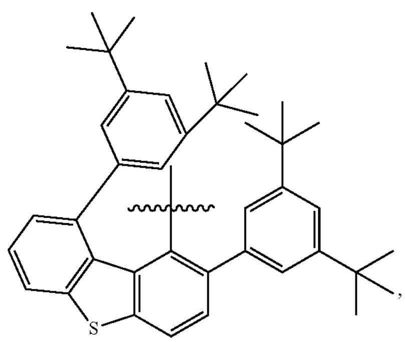
R312
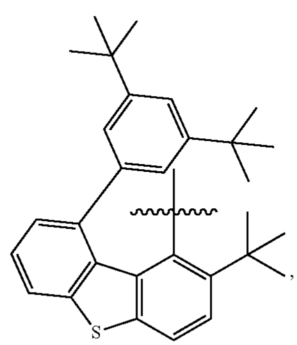

R313
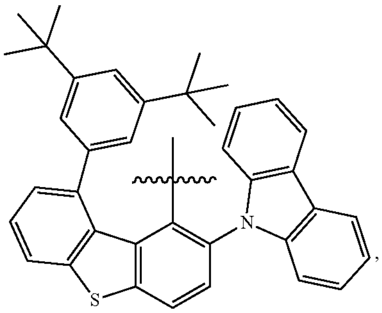
R314
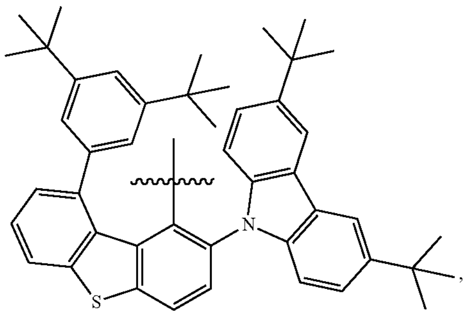
R315
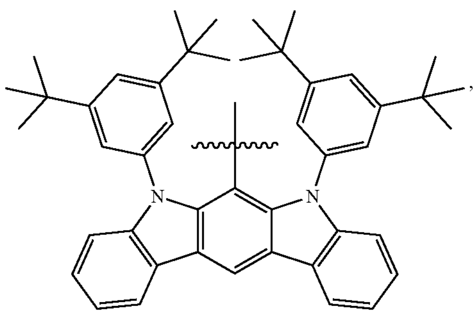
R316
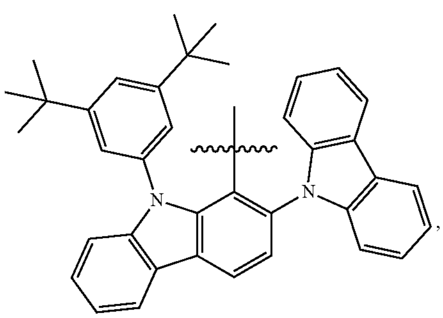
R317
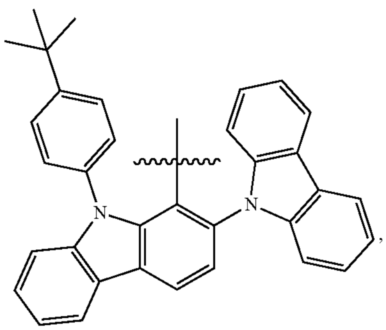
R318
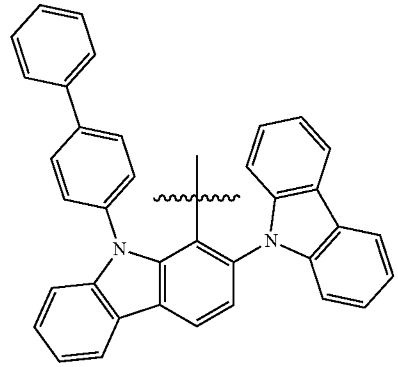
R319
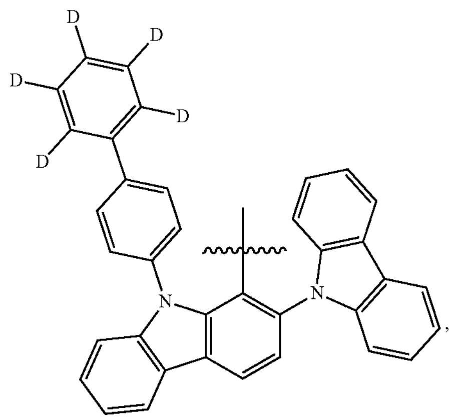
R320
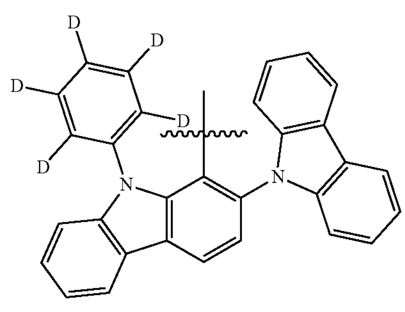
R321
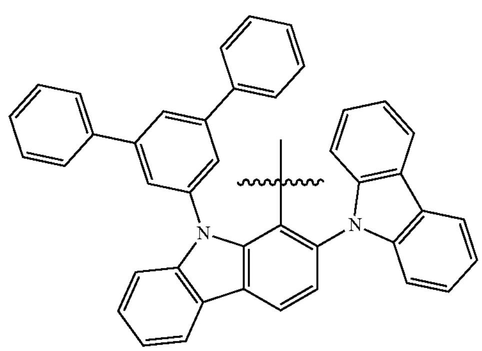

-continued
R322
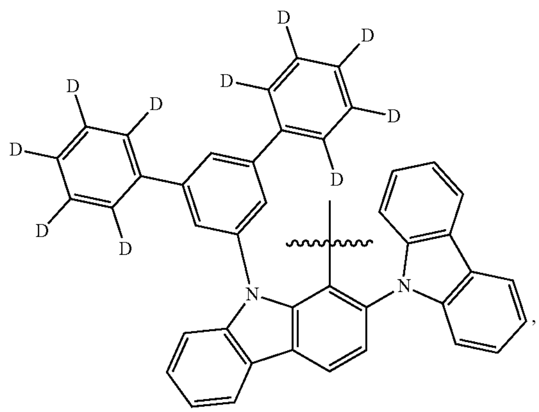
R323
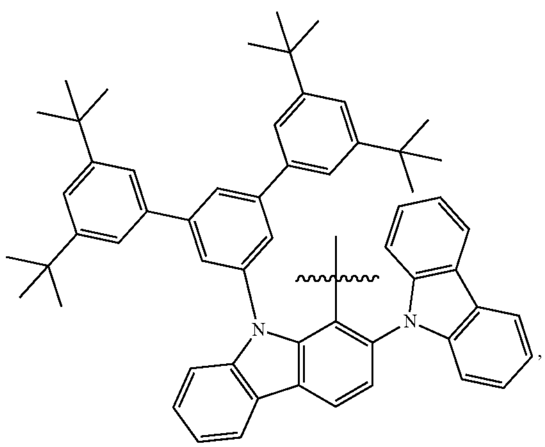
R324
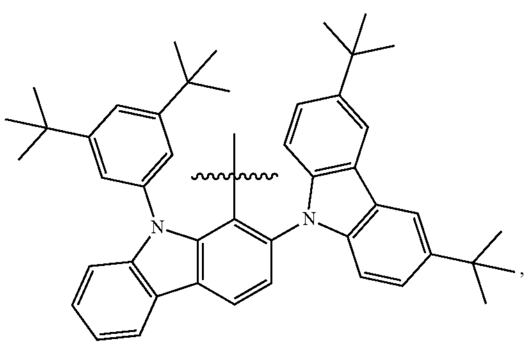
R325
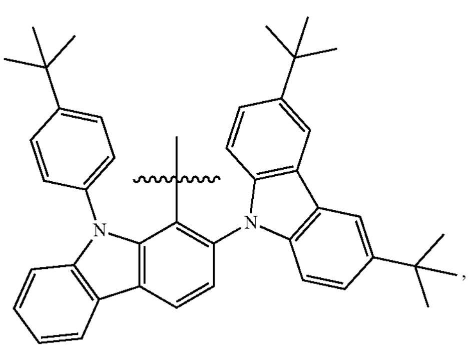
-continued
R326
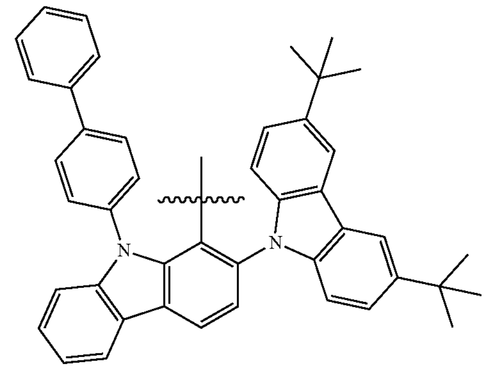
R327
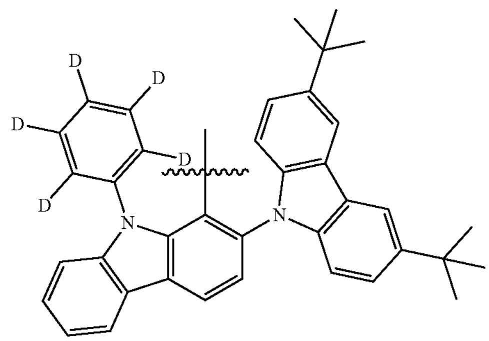
R328
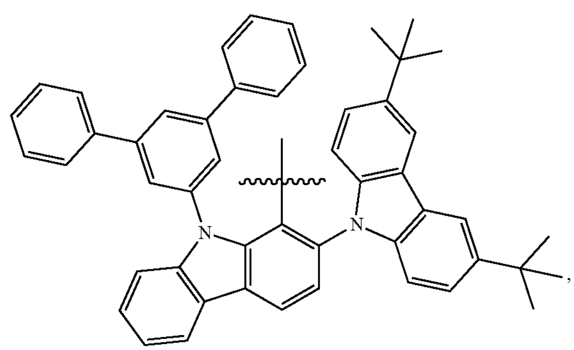
R329
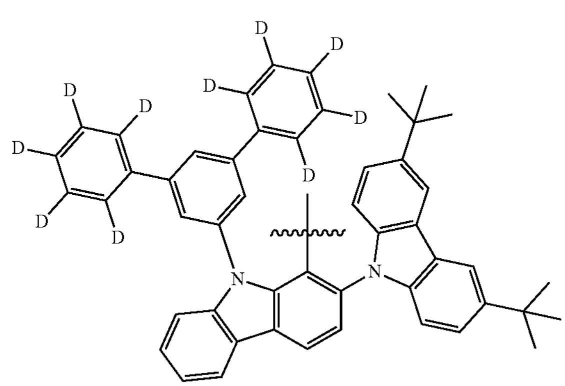

-continued
R330
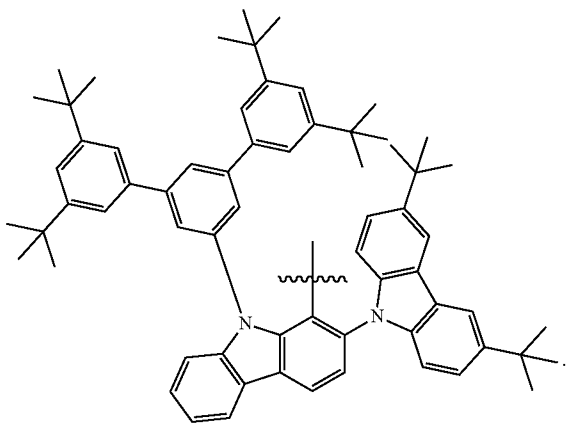
* * * * *